(12) United States Patent
Kamimura et al.

(10) Patent No.: US 12,372,868 B2
(45) Date of Patent: *Jul. 29, 2025

(54) PATTERN FORMING METHOD, KIT, AND RESIST COMPOSITION

(71) Applicant: FUJIFILM Corporation, Tokyo (JP)

(72) Inventors: Tetsuya Kamimura, Shizuoka (JP); Satomi Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/220,825

(22) Filed: Jul. 12, 2023

(65) Prior Publication Data

US 2023/0350290 A1 Nov. 2, 2023

Related U.S. Application Data

(60) Division of application No. 16/390,023, filed on Apr. 22, 2019, now Pat. No. 11,747,727, which is a continuation of application No. PCT/JP2017/040911, filed on Nov. 14, 2017.

(30) Foreign Application Priority Data

| Nov. 18, 2016 | (JP) | 2016-225452 |
| Feb. 22, 2017 | (JP) | 2017-030866 |
| Nov. 13, 2017 | (JP) | 2017-218006 |

(51) Int. Cl.
| G03F 7/16 | (2006.01) |
| B65D 85/00 | (2006.01) |
| G03F 7/00 | (2006.01) |
| G03F 7/004 | (2006.01) |
| G03F 7/039 | (2006.01) |
| G03F 7/075 | (2006.01) |
| G03F 7/20 | (2006.01) |
| G03F 7/26 | (2006.01) |
| H01L 21/027 | (2006.01) |

(52) U.S. Cl.
CPC ........... *G03F 7/0048* (2013.01); *B65D 85/70* (2013.01); *G03F 7/0012* (2013.01); *G03F 7/0392* (2013.01); *G03F 7/0397* (2013.01); *G03F 7/0758* (2013.01); *G03F 7/16* (2013.01); *G03F 7/161* (2013.01); *G03F 7/162* (2013.01); *G03F 7/168* (2013.01); *G03F 7/2002* (2013.01); *G03F 7/26* (2013.01); *H01L 21/027* (2013.01)

(58) Field of Classification Search
CPC ...... G03F 7/0392; G03F 7/0397; G03F 7/325; G03F 7/42; G03F 7/0048
See application file for complete search history.

(56) References Cited

U.S. PATENT DOCUMENTS

| 11,453,734 B2 * | 9/2022 | Kamimura | .......... C08F 220/365 |
| 11,733,611 B2 * | 8/2023 | Kamimura | ............ G03F 7/0397 |
| | | | 430/270.1 |
| 2018/0087010 A1 * | 3/2018 | Takahashi | ................ G03F 7/322 |
| 2019/0025703 A1 * | 1/2019 | Shimizu | ................ B65D 25/14 |

FOREIGN PATENT DOCUMENTS

| CN | 1891863 | 1/2007 | |
| TW | 201640227 | * 11/2016 | ............... G03F 7/16 |

OTHER PUBLICATIONS

"Office Action of Taiwan Counterpart Application", issued on Sep. 20, 2023, with English translation thereof, p. 1-p. 17.

* cited by examiner

*Primary Examiner* — Daborah Chacko-Davis
(74) *Attorney, Agent, or Firm* — JCIPRNET

(57) ABSTRACT

A pattern forming method includes a pre-wetting step of coating a substrate with a chemical liquid so as to obtain a pre-wetted substrate, a resist film forming step of forming a resist film on the pre-wetted substrate by using an actinic ray-sensitive or radiation-sensitive resin composition, an exposure step of exposing the resist film, and a development step of developing the exposed resist film by using a developer. The chemical liquid contains a mixture of two or more kinds of organic solvents and an impurity metal containing one kind of element selected from the group consisting of Fe, Cr, Ni, and Pb, in which a vapor pressure of the mixture is 50 to 1,420 Pa at 25° C.

13 Claims, No Drawings

PATTERN FORMING METHOD, KIT, AND RESIST COMPOSITION

CROSS-REFERENCE TO RELATED APPLICATIONS

This application is a divisional application of and claims the priority benefit of a prior application Ser. No. 16/390,023, filed on Apr. 22, 2019, now allowed. The prior application Ser. No. 16/390,023 is a Continuation of PCT International Application No. PCT/JP2017/040911 filed on Nov. 14, 2017, which claims priority under 35 U.S.C. § 119(a) to Japanese Patent Application No. 2016-225452 filed on Nov. 18, 2016, Japanese Patent Application No. 2017-030866 filed on Feb. 22, 2017 and Japanese Patent Application No. 2017-218006 filed on Nov. 13, 2017. Each of the above applications is hereby expressly incorporated by reference, in its entirety, into the present application.

BACKGROUND OF THE INVENTION

1. Field of the Invention

The present invention relates to a chemical liquid, a chemical liquid storage body, a pattern forming method, and a kit.

2. Description of the Related Art

During the photolithography process in a semiconductor device manufacturing process, a substrate such as a semiconductor wafer (hereinafter, referred to as "wafer" as well) is coated with an actinic ray-sensitive or radiation-sensitive resin composition (hereinafter, referred to as "resist composition" as well) so as to form an actinic ray-sensitive or radiation-sensitive film (hereinafter, referred to as "resist film" as well). Furthermore, steps of exposing the formed resist film, developing the exposed resist film so as to form a predetermined pattern, and the like are sequentially performed, and in this way, a resist pattern is formed on the wafer.

In recent years, as semiconductor devices have been further scaled down, thinning of resist films have been required. Furthermore, there has been a demand for a technique of forming a uniform resist film by using a small amount of resist composition. As such a technique, a method is known in which a substrate is coated with a chemical liquid called prewet agent before the substrate is coated with a resist composition. In JP2007-324393A, as a prewet agent, a solution is described which is obtained by mixing together a solvent having low volatility and a solvent having low surface tension at a predetermined ratio.

SUMMARY OF THE INVENTION

The inventors of the present invention coated a substrate with the prewet agent described in JP2007-324393A and then with a resist composition. As a result, the inventors have found that depending on the combination of organic solvents, it is difficult to form a thinner resist film having a uniform thickness on the substrate by using a small amount of the resist composition, or defect inhibition performance becomes insufficient. Furthermore, the inventors have found that in a case where the prewet agent contains one kind of organic solvent, sometimes it is difficult to form a resist film due to the variation in the components constituting the resist film, or stable defect inhibition performance cannot be obtained.

An object of the present invention is to provide a chemical liquid which makes it possible to form a thinner resist film having a uniform thickness on a substrate by using a small amount of resist composition (hereinafter, the above properties will be described as having excellent "resist saving properties" as well) and demonstrates excellent defect inhibition performance. Another object of the present invention is to provide a chemical liquid storage body, a pattern forming method, and a kit.

In the present specification, the resist saving properties and the defect inhibition performance mean the resist saving properties and the defect inhibition performance measured by the method described in Examples.

In order to achieve the aforementioned objects, the inventors of the present invention carried out an intensive examination. As a result, the inventors have found that the objects can be achieved by the following constitution.

[1] A chemical liquid comprising a mixture of two or more kinds of organic solvents and an impurity metal containing one kind of metal selected from the group consisting of Fe, Cr, Ni, and Pb, in which a vapor pressure of the mixture is 50 to 1,420 Pa at 25° C., in a case where the chemical liquid contains one kind of the impurity metal, a content of the impurity metal in the chemical liquid is 0.001 to 100 mass ppt, and in a case where the chemical liquid contains two or more kinds of the impurity metals, a content of each of the impurity metals in the chemical liquid is 0.001 to 100 mass ppt.

[2] The chemical liquid described in [1], in which the impurity metal contained in the chemical liquid is particles, in a case where the chemical liquid contains one kind of the particles, a content of the particles in the chemical liquid is 0.001 to 30 mass ppt, and in a case where the chemical liquid contains two or more kinds of the particles, a content of each kind of the particles is 0.001 to 30 mass ppt.

[3] A chemical liquid comprising a mixture of two or more kinds of organic solvents and an impurity metal containing one kind of metal selected from the group consisting of Fe, Cr, Ni, and Pb, in which in a case where the chemical liquid contains one kind of the impurity metal, a content of the impurity metal in the chemical liquid is 0.001 to 100 mass ppt, in a case where the chemical liquid contains two or more kinds of the impurity metals, a content of each of the impurity metals in the chemical liquid is 0.001 to 100 mass ppt, and the chemical liquid satisfies at least any one of conditions 1 to 7 which will be described later.

[4] The chemical liquid described in any one of [1] to [3], in which a surface tension of the mixture is 25 to 40 mN/m at 25° C.

[5] The chemical liquid described in any one of [1] to [4], in which the mixture contains an organic solvent having a Hansen solubility parameter higher than 10 (MPa)$^{0.5}$ in terms of a hydrogen bond element or having a Hansen solubility parameter higher than 16.5 (MPa)$^{0.5}$ in terms of a dispersion element.

[6] The chemical liquid described in any one of [1] to [5], in which the number of objects to be counted having a size equal to or greater than 100 nm that are counted by a light scattering-type liquid-borne particle counter is 1 to 100/mL.

[7] The chemical liquid described in any one of [1] to [6], further comprising water, in which a content of the water in the chemical liquid is 0.01 to 1.0% by mass.
[8] The chemical liquid described in any one of [1] to [7], further comprising an organic impurity, in which the organic impurity contains an organic compound which has a boiling point equal to or higher than 250° C. and contains 8 or more carbon atoms.
[9] The chemical liquid described in [8], in which the number of carbon atoms in one molecule of the organic compound is equal to or greater than 12.
[10] The chemical liquid described in any one of [1] to [9], further comprising an organic impurity, in which the organic impurity contains an organic compound having a C Log P value higher than 6.5.
[11] The chemical liquid described in [10], in which in a case where the chemical liquid contains one kind of the organic compound having a C Log P value higher than 6.5, a content of the organic compound having a C Log P value higher than 6.5 is 0.01 mass ppt to 10 mass ppb with respect to a total mass of the chemical liquid, and in a case where the chemical liquid contains two or more kinds of the organic compounds having a C Log P value higher than 6.5, a total content of the organic compounds having a C Log P value higher than 6.5 is 0.01 mass ppt to 10 mass ppb with respect to the total mass of the chemical liquid.
[12] The chemical liquid described in any one of [8] to [11], in which the organic impurity contains a high-boiling-point component having a boiling point equal to or higher than 270° C., and a total content of the high-boiling-point component is 0.01 mass ppt to 60 mass ppm with respect to the total mass of the chemical liquid.
[13] The chemical liquid described in [12], in which the high-boiling-point component contains an ultrahigh-boiling-point component having a boiling point equal to or higher than 300° C., and a total content of the ultrahigh-boiling-point component in the chemical liquid is 0.01 mass ppt to 30 mass ppm with respect to the total mass of the chemical liquid.
[14] The chemical liquid described in [13], in which the total content of the ultrahigh-boiling-point component in the chemical liquid is 0.01 mass ppt to 10 mass ppb with respect to the total mass of the chemical liquid.
[15] The chemical liquid described in any one of [8] to [14], in which in a case where the chemical liquid contains one kind of the organic impurity, a content of the organic impurity is 0.01 mass ppt to 10 mass ppb with respect to the total mass of the chemical liquid, and in a case where the chemical liquid contains two or more kinds of the organic impurities, a content of the organic impurities is 0.01 mass ppt to 10 mass ppb with respect to the total mass of the chemical liquid.
[16] The chemical liquid described in any one of [1] to [15] that is used for pre-wetting.
[17] A chemical liquid storage body comprising a container and the chemical liquid described in any one of [1] to [16] that is stored in the container, in which a liquid contact portion contacting the chemical liquid in the container is formed of a nonmetallic material or stainless steel.
[18] The chemical liquid storage body described in [17], in which the nonmetallic material is at least one kind of material selected from the group consisting of a polyethylene resin, a polypropylene resin, a polyethylene-polypropylene resin, polytetrafluoroethylene, a polytetrafluoroethylene-perfluoroalkyl vinyl ether copolymer, a polytetrafluoroethylene-hexafluoropropylene copolymer resin, a polytetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.
[19] A pattern forming method comprising a pre-wetting step of coating a substrate with the chemical liquid described in any one of [1] to [16] so as to obtain a pre-wetted substrate, a resist film forming step of forming a resist film on the pre-wetted substrate by using an actinic ray-sensitive or radiation-sensitive resin composition, an exposure step of exposing the resist film, and a development step of developing the exposed resist film by using a developer, in which the actinic ray-sensitive or radiation-sensitive resin composition contains a resin including at least one kind of repeating unit selected from the group consisting of a repeating unit represented by Formula (a) which will be described later, a repeating unit represented by Formula (b) which will be described later, a repeating unit represented by Formula (c) which will be described later, a repeating unit represented by Formula (d) which will be described later, and a repeating unit represented by Formula (e) which will be described later.
[20] The pattern forming method described in [19], in which the chemical liquid with which the substrate is coated in the pre-wetting step satisfies conditions 1 and 2 which will be described later at 25° C.
[21] A kit comprising the chemical liquid described in any one of [1] to [16] and an actinic ray-sensitive or radiation-sensitive resin composition, in which the actinic ray-sensitive or radiation-sensitive resin composition contains a resin including at least one kind of repeating unit selected from the group consisting of a repeating unit represented by Formula (a) which will be described later, a repeating unit represented by Formula (b) which will be described later, a repeating unit represented by Formula (c) which will be described later, a repeating unit represented by Formula (d) which will be described later, and a repeating unit represented by Formula (e) which will be described later.
[22] A kit comprising the chemical liquid described in any one of [1] to [16] and an actinic ray-sensitive or radiation-sensitive resin composition, in which the actinic ray-sensitive or radiation-sensitive resin composition contains a resin which has a repeating unit having a phenolic hydroxyl group and has a group generating a polar group by being decomposed by the action of an acid.
[23] A kit comprising the chemical liquid described in any one of [1] to [16] and an actinic ray-sensitive or radiation-sensitive resin composition, in which the actinic ray-sensitive or radiation-sensitive resin composition contains a hydrophobic resin and a resin which has a group generating a polar group by being decomposed by the action of an acid.
[24] A kit comprising the chemical liquid described in any one of [1] to [16] and an actinic ray-sensitive or radiation-sensitive resin composition containing a resin, in which the kit satisfies Condition 1 which will be described later and Condition 2 which will be described later.

According to the present invention, it is possible to provide a chemical liquid which has excellent resist saving properties and excellent defect inhibition performance (hereinafter, described as "having the effects of the present invention" as well). Furthermore, according to the present invention, it is possible to provide a chemical liquid storage body, a pattern forming method, and a kit.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis or mixing but also the preparation of a predetermined substance by means of purchase and the like.

In the present specification, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In the present invention, 1 Å (angstrom) equals 0.1 nm.

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, far ultraviolet rays, extreme ultraviolet (EUV), X-rays, electron beams, and the like. In addition, in the present invention, light means actinic rays or radiation. In the present invention, unless otherwise specified, "exposure" includes not only exposure, far ultraviolet rays, X-rays, and EUV, and the like, but also lithography by particle beams such as Electron beams or ion beams.

Chemical Liquid (First Embodiment)

The chemical liquid according to a first embodiment of the present invention is a chemical liquid containing a mixture of two or more kinds of organic solvents and an impurity metal containing one kind of metal selected from the group consisting of Fe, Cr, Ni, and Pb, in which a vapor pressure of the mixture is 50 to 1,420 Pa, in a case where the chemical liquid contains one kind of the impurity metal, a content of the impurity metal in the chemical liquid is 0.001 to 100 mass ppt, and in a case where the chemical liquid contains two or more kinds of the impurity metals, a content of each of the impurity metals is 0.001 to 100 mass ppt.

Hereinafter, the components contained in the chemical liquid and the physical properties of the chemical liquid will be described.

[Mixture of Two or More Kinds of Organic Solvents]

The chemical liquid contains a mixture of two or more kinds of organic solvents. In a case where the chemical liquid contains the mixture of two or more kinds of organic solvents, unlike a chemical liquid containing only one kind of organic solvent, the chemical liquid can be adjusted according to the components constituting a resist film. Furthermore, regardless of the variation of the components constituting a resist film, a stabilized resist film can be formed and/or defect inhibition performance can be obtained.

The content of the mixture in the chemical liquid is not particularly limited, but is preferably 99.9% to 99.999% by mass with respect to the total mass of the chemical liquid in general.

The vapor pressure of the mixture at 25° C. is 50 to 1,420 Pa and preferably 200 to 1,250 Pa. In a case where the vapor pressure of the mixture is within the above range, the chemical liquid has further improved defect inhibition performance and resist saving properties.

In the present specification, the vapor pressure of the mixture means a vapor pressure calculated by the following method.

First, by using the chemical liquid as a sample, the type and content of each of the organic solvents contained in the chemical liquid are measured using gas chromatography mass spectrometry. In the present specification, an organic solvent means an organic compound whose content in the chemical liquid is greater than 10,000 mass ppm with respect to the total mass of the chemical liquid.

The measurement conditions for the gas chromatography mass spectrometry are as described in Examples.

The mixture is constituted with the organic solvents detected by the aforementioned method. Based on the vapor pressure at 25° C. of each of the organic solvents contained in the mixture and the molar fraction of each of the organic solvents in the mixture, the vapor pressure of the mixture is calculated by the following equation. In the present specification, a sign "Σ" means sum.

(Vapor pressure of mixture)=Σ((vapor pressure of each of organic solvents at 25° C.)×(molar fraction of each of organic solvents))     Equation:

The type of the organic solvents contained in the mixture is not particularly limited, and known organic solvents can be used.

Examples of the organic solvents include alkylene glycol monoalkyl ether carboxylate, alkylene glycol monoalkyl ether, a lactic acid alkyl ester, alkoxyalkyl propionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvents, those described in JP2016-057614A, JP2014-219664A, JP2016-138219A, and JP2015-135379A may be used.

As the organic solvents, among the above, propylene glycol monomethyl ether acetate (PGMEA), cyclohexanone (CyHx), ethyl lactate (EL), 2-hydroxymethyl isobutyrate (HBM), cyclopentanone dimethyl acetal (DBCPN), propylene glycol monomethyl ether (PGME), cyclopentanone (CyPn), butyl acetate (nBA), γ-butyrolactone (GBL), dimethyl sulfoxide (DMSO), ethylene carbonate (EL), propylene carbonate (PC), 1-methyl-2-pyrrolidone (NMP), isoamyl acetate (iAA), methyl isobutyl carbinol (MIBC), diethylene glycol monomethyl ether (DEGME), dimethyl ether (DME), diethyl ether (DEE), diethylene glycol monoisobutyl ether (DEGIME), diglyme (DEGDME), diethylene glycol diethyl ether (DEGDEE), triethylene glycol dimethyl ether (TriEGDME), tetraethylene glycol dimethyl ether (TetraEGDME), triethylene glycol butyl methyl ether (TEGMBE), diethylene glycol monobutyl ether (DE- GMBE), anisole, 1,4-dimethoxybenzene (14-DMB), 1,2-dimethoxybenzene (12-DMB), 1,3-dimethoxybenzene (13-DMB), 1,4-diphenoxybenzene, 4-methoxytoluene, phenetole, 3-methoxymethyl propionate (MMP), and the like are preferable, PGMEA, CyHx, EL, HBM, DBCPN, PGME, CyPn, nBA, GBL, DMSO, PC, NMP, DEGME, DME, DEE, DEGIME, DEGDME, DEGDEE, TriEGDME, TetraEGDME, TEGMBE, DEGMBE, anisole, 14-DMB, 12-DMB, 13-DMB, 1,4-diphenoxybenzene, 4-methoxytoluene, phenetole, and MMP are more preferable.

The combination of the organic solvents contained in the mixture is not particularly limited as long as the vapor pressure of the mixture is within a predetermined range.

Examples of the combination of the organic solvents contained in the mixture include the following combinations.

PGME(30)/PGMEA(70), PGME(30)/CyHx(70), PGME(30)/EL(70), PGME(30)/HBM(70), PGME(30)/DBCPN(70), PGME(30)/GBL(70), PGME(30)/DMSO(70), PGME(30)/EC(70), PGME(30)/PC(70), PGME(30)/NMP(70), CyPn(30)/PGMEA(70), CyPn(30)/CyHx(70), CyPn(30)/EL(70), CyPn(30)/HBM(70), CyPn(30)/DBCPN(70), CyPn(30)/GBL(70), CyPn(30)/DMSO(70), CyPn(30)/EC(70), CyPn(30)/PC(70), CyPn(30)/NMP(70), nBA(30)/PGMEA(70), nBA(30)/CyHx(70), nBA(30)/EL(70), nBA(30)/HBM(70), nBA(30)/DBCPN(70), PGMEA(80)/GBL(20), PGMEA(80)/DMSO(20), PGMEA(80)/EC(20), PGMEA(80)/PC(20), PGMEA(80)/NMP(20), CyHx(80)/GBL(20), CyHx(80)/DMSO(20), CyHx(80)/EC(20), CyHx(80)/PC(20), CyHx(80)/NMP(20), EL(80)/GBL(20), EL(80)/DMSO(20), EL(80)/EC(20), EL(80)/PC(20), EL(80)/NMP(20), HBM(80)/GBL(20), HBM(80)/DMSO(20), HBM(80)/EC(20), HBM(80)/PC(20), HBM(80)/NMP(20), DBCPN(80)/GBL(20), DBCPN(80)/DMSO(20), DBCPN(80)/EC(20), DBCPN(80)/PC(20), DBCPN(80)/NMP(20), PGME(20)/PGMEA(60)/GBL(20), PGME(20)/PGMEA(60)/DMSO(20), PGME(20)/PGMEA(60)/EC(20), PGME(20)/PGMEA(60)/PC(20), PGME(20)/PGMEA(60)/NMP(20), PGME(20)/CyHx(60)/GBL(20), PGME(20)/CyHx(60)/DMSO(20), PGME(20)/CyHx(60)/EC(20), PGME(20)/CyHx(60)/PC(20), PGME(20)/CyHx(60)/NMP(20), PGME(20)/EL(60)/GBL(20), PGME(20)/EL(60)/DMSO(20), PGME(20)/EL(60)/EC(20), PGME(20)/EL(60)/PC(20), PGME(20)/EL(60)/NMP(20), PGME(20)/HBM(60)/GBL(20), PGME(20)/HBM(60)/DMSO(20), PGME(20)/HBM(60)/EC(20), PGME(20)/HBM(60)/PC(20), PGME(20)/HBM(60)/NMP(20), PGME(20)/DBCPN(60)/GBL(20), PGME(20)/DBCPN(60)/DMSO(20), PGME(20)/DBCPN(60)/EC(20), PGME(20)/DBCPN(60)/PC(20), PGME(20)/DBCPN(60)/NMP(20), CyPn(20)/PGMEA(60)/GBL(20), CyPn(20)/PGMEA(60)/DMSO(20), CyPn(20)/PGMEA(60)/EC(20), CyPn(20)/PGMEA(60)/PC(20), CyPn(20)/PGMEA(60)/NMP(20), CyPn(20)/CyHx(60)/GBL(20), CyPn(20)/CyHx(60)/DMSO(20), CyPn(20)/CyHx(60)/EC(20), CyPn(20)/CyHx(60)/PC(20), CyPn(20)/CyHx(60)/NMP(20), CyPn(20)/EL(60)/GBL(20), CyPn(20)/EL(60)/DMSO(20), CyPn(20)/EL(60)/EC(20), CyPn(20)/EL(60)/PC(20), CyPn(20)/EL(60)/NMP(20), CyPn(20)/HBM(60)/GBL(20), CyPn(20)/HBM(60)/DMSO(20), CyPn(20)/HBM(60)/EC(20), CyPn(20)/HBM(60)/PC(20), CyPn(20)/HBM(60)/NMP(20), CyPn(20)/DBCPN(60)/GBL(20), CyPn(20)/DBCPN(60)/DMSO(20), CyPn(20)/DBCPN(60)/EC(20), CyPn(20)/DBCPN(60)/PC(20), CyPn(20)/DBCPN(60)/NMP(20), nBA(20)/PGMEA(60)/GBL(20), nBA(20)/PGMEA(60)/DMSO(20), nBA(20)/PGMEA(60)/EC(20), nBA(20)/PGMEA(60)/PC(20), nBA(20)/PGMEA(60)/NMP(20), nBA(20)/CyHx(60)/GBL(20), nBA(20)/CyHx(60)/DMSO(20), nBA(20)/CyHx(60)/EC(20), nBA(20)/CyHx(60)/PC(20), nBA(20)/CyHx(60)/NMP(20), nBA(20)/EL(60)/GBL(20), nBA(20)/EL(60)/DMSO(20), nBA(20)/EL(60)/EC(20), nBA(20)/EL(60)/PC(20), nBA(20)/EL(60)/NMP(20), nBA(20)/HBM(60)/GBL(20), nBA(20)/HBM(60)/DMSO(20), nBA(20)/HBM(60)/EC(20), nBA(20)/HBM(60)/PC(20), nBA(20)/HBM(60)/NMP(20), nBA(20)/DBCPN(60)/GBL(20), nBA(20)/DBCPN(60)/DMSO(20), nBA(20)/DBCPN(60)/EC(20), nBA(20)/DBCPN(60)/PC(20), nBA(20)/DBCPN(60)/NMP(20), PGME(80)/PGMEA(20), and CyHx(20)/NMP(80).

As the combination of the organic solvents contained in the mixture, for example, the following combinations may be adopted. (PGME/PGMEA), (PGME/CyHx), (PGME/EL), (PGME/HBM), (PGME/DBCPN), (PGME/GBL), (PGME/DMSO), (PGME/EC), (PGME/PC), (PGME/NMP), (CyPn/PGMEA), (CyPn/CyHx), (CyPn/EL), (CyPn/HBM), (CyPn/DBCPN), (CyPn/GBL), (CyPn/DMSO), (CyPn/EC), (CyPn/PC), (CyPn/NMP), (nBA/PGMEA), (nBA/CyHx), (nBA/EL), (nBA/HBM), (nBA/DBCPN), (nBA/GBL), (nBA/DMSO), (nBA/EC), (nBA/PC), (nBA/NMP), (PGMEA/GBL), (PGMEA/DMSO), (PGMEA/EC), (PGMEA/PC), (PGMEA/NMP), (CyHx/GBL), (CyHx/DMSO), (CyHx/EC), (CyHx/PC), (CyHx/NMP), (EL/GBL), (EL/DMSO), (EL/EC), (EL/PC), (EL/NMP), (HBM/GBL), (HBM/DMSO), (HBM/EC), (HBM/PC), (HBM/NMP), (DBCPN/GBL), (DBCPN/DMSO), (DBCPN/EC), (DBCPN/PC), (DBCPN/NMP), (PGME/PGMEA/GBL), (PGME/PGMEA/DMSO), (PGME/PGMEA/EC), (PGME/PGMEA/PC), (PGME/PGMEA/NMP), (PGME/CyHx/GBL), (PGME/CyHx/DMSO), (PGME/CyHx/EC), (PGME/CyHx/PC), (PGME/CyHx/NMP), (PGME/EL/GBL), (PGME/EL/DMSO), (PGME/EL/EC), (PGME/EL/PC), (PGME/EL/NMP), (PGME/HBM/GBL), (PGME/HBM/DMSO), (PGME/HBM/EC), (PGME/HBM/PC), (PGME/HBM/NMP), (PGME/DBCPN/GBL), (PGME/DBCPN/DMSO), (PGME/DBCPN/EC), (PGME/DBCPN/PC), (PGME/DBCPN/NMP), (CyPn/PGMEA/GBL), (CyPn/PGMEA/DMSO), (CyPn/PGMEA/EC), (CyPn/PGMEA/PC), (CyPn/PGMEA/NMP), (CyPn/CyHx/GBL), (CyPn/CyHx/DMSO), (CyPn/CyHx/EC), (CyPn/CyHx/PC), (CyPn/CyHx/NMP), (CyPn/EL/GBL), (CyPn/EL/DMSO), (CyPn/EL/EC), (CyPn/EL/PC), (CyPn/EL/NMP), (CyPn/HBM/GBL), (CyPn/HBM/DMSO), (CyPn/HBM/EC), (CyPn/HBM/PC), (CyPn/HBM/NMP), (CyPn/DBCPN/GBL), (CyPn/DBCPN/DMSO), (CyPn/DBCPN/EC), (CyPn/DBCPN/PC), (CyPn/DBCPN/NMP), (nBA/PGMEA/GBL), (nBA/PGMEA/DMSO), (nBA/PGMEA/EC), (nBA/PGMEA/PC), (nBA/PGMEA/NMP), (nBA/CyHx/GBL), (nBA/CyHx/DMSO), (nBA/CyHx/EC), (nBA/CyHx/PC), (nBA/CyHx/NMP), (nBA/EL/GBL), (nBA/EL/DMSO), (nBA/EL/EC), (nBA/EL/PC), (nBA/EL/NMP), (nBA/HBM/GBL), (nBA/HBM/DMSO), (nBA/HBM/EC), (nBA/HBM/PC), (nBA/HBM/NMP), (nBA/DBCPN/GBL), (nBA/DBCPN/DMSO), (nBA/DBCPN/EC), (nBA/DBCPN/PC), (nBA/DBCPN/NMP), (nBA/iAA), (nBA/MIBC), (PGME/DEGME), (PGME/DME), (PGME/DEE), (PGME/DEGIME), (PGME/DEGDME), (PGME/DEGDEE), (PGME/TriEGDME), (PGME/TetraEGDME), (PGME/TEGMBE), (PGME/DEGMBE), (PGME/Anisole), (PGME/14-DMB), (PGME/12-DMB), (PGME/13-DMB), (PGME/14-diphenoxybenzene), (PGME/4-methoxytoluene), (PGME/Phenetole), (CyPn/DEGME), (CyPn/DME), (CyPn/DEE), (CyPn/DEGIME), (CyPn/DEGDME), (CyPn/DEGDEE), (CyPn/TriEGDME), (CyPn/TetraEGDME), (CyPn/TEGMBE), (CyPn/DEGMBE), (CyPn/Anisole), (CyPn/14-DMB), (CyPn/12-

DMB), (CyPn/13-DMB), (CyPn/14-diphenoxybenzene), (CyPn/4-methoxytoluene), (CyPn/Phenetole), (nBA/DEGME), (nBA/DME), (nBA/DEE), (nBA/DEGIME), (nBA/DEGDME), (nBA/DEGDEE), (nBA/TriEGDME), (nBA/TetraEGDME), (nBA/TEGMBE), (nBA/DEGMBE), (nBA/Anisole), (nBA/14-DMB), (nBA/12-DMB), (nBA/13-DMB), (nBA/14-diphenoxybenzene), (nBA/4-methoxytoluene), (nBA/Phenetole), (PGMEA/DEGME), (PGMEA/DME), (PGMEA/DEE), (PGMEA/DEGIME), (PGMEA/DEGDME), (PGMEA/DEGDEE), (PGMEA/TriEGDME), (PGMEA/TetraEGDME), (PGMEA/TEGMBE), (PGMEA/DEGMBE), (PGMEA/Anisole), (PGMEA/14-DMB), (PGMEA/12-DMB), (PGMEA/13-DMB), (PGMEA/14-diphenoxybenzene), (PGMEA/4-methoxytoluene), (PGMEA/Phenetole), (CyHx/DEGME), (CyHx/DME), (CyHx/DEE), (CyHx/DEGIME), (CyHx/DEGDME), (CyHx/DEGDEE), (CyHx/TriEGDME), (CyHx/TetraEGDME), (CyHx/TEGMBE), (CyHx/DEGMBE), (CyHx/Anisole), (CyHx/14-DMB), (CyHx/12-DMB), (CyHx/13-DMB), (CyHx/14-diphenoxybenzene), (CyHx/4-methoxytoluene), (CyHx/Phenetole), (EL/DEGME), (EL/DME), (EL/DEE), (EL/DEGIME), (EL/DEGDME), (EL/DEGDEE), (EL/TriEGDME), (EL/TetraEGDME), (EL/TEGMBE), (EL/DEGMBE), (EL/Anisole), (EL/14-DMB), (EL/12-DMB), (EL/13-DMB), (EL/14-diphenoxybenzene), (EL/4-methoxytoluene), (EL/Phenetole), (HBM/DEGME), (HBM/DME), (HBM/DEE), (HBM/DEGIME), (HBM/DEGDME), (HBM/DEGDEE), (HBM/TriEGDME), (HBM/TetraEGDME), (HBM/TEGMBE), (HBM/DEGMBE), (HBM/Anisole), (HBM/14-DMB), (HBM/12-DMB), (HBM/13-DMB), (HBM/14-diphenoxybenzene), (HBM/4-methoxytoluene), (HBM/Phenetole), (DBCPN/DEGME), (DBCPN/DME), (DBCPN/DEE), (DBCPN/DEGIME), (DBCPN/DEGDME), (DBCPN/DEGDEE), (DBCPN/TriEGDME), (DBCPN/TetraEGDME), (DBCPN/TEGMBE), (DBCPN/DEGMBE), (DBCPN/Anisole), (DBCPN/14-DMB), (DBCPN/12-DMB), (DBCPN/13-DMB), (DBCPN/14-diphenoxybenzene), (DBCPN/4-methoxytoluene), (DBCPN/Phenetole), (PGMEA/GBL/DEGME), (PGMEA/GBL/DME), (PGMEA/GBL/DEE), (PGMEA/GBL/DEGIME), (PGMEA/GBL/DEGDME), (PGMEA/GBL/DEGDEE), (PGMEA/GBL/TriEGDME), (PGMEA/GBL/TetraEGDME), (PGMEA/GBL/TEGMBE), (PGMEA/GBL/DEGMBE), (PGMEA/GBL/Anisole), (PGMEA/GBL/14-DMB), (PGMEA/GBL/12-DMB), (PGMEA/GBL/13-DMB), (PGMEA/GBL/14-diphenoxybenzene), (PGMEA/GBL/4-methoxytoluene), (PGMEA/GBL/Phenetole), (PGMEA/DMSO/DEGME), (PGMEA/DMSO/DME), (PGMEA/DMSO/DEE), (PGMEA/DMSO/DEGIME), (PGMEA/DMSO/DEGDME), (PGMEA/DMSO/DEGDEE), (PGMEA/DMSO/TriEGDME), (PGMEA/DMSO/TetraEGDME), (PGMEA/DMSO/TEGMBE), (PGMEA/DMSO/DEGMBE), (PGMEA/DMSO/Anisole), (PGMEA/DMSO/14-DMB), (PGMEA/DMSO/12-DMB), (PGMEA/DMSO/13-DMB), (PGMEA/DMSO/14-diphenoxybenzene), (PGMEA/DMSO/4-methoxytoluene), (PGMEA/DMSO/Phenetole), (PGMEA/EC/DEGIME), (PGMEA/EC/DEGDME), (PGMEA/EC/DEGDEE), (PGMEA/EC/TriEGDME), (PGMEA/EC/TetraEGDME), (PGMEA/EC/TEGMBE), (PGMEA/EC/DEGMBE), (PGMEA/EC/Anisole), (PGMEA/EC/14-DMB), (PGMEA/EC/12-DMB), (PGMEA/EC/13-DMB), (PGMEA/EC/14-diphenoxybenzene), (PGMEA/EC/4-methoxytoluene), (PGMEA/EC/Phenetole), (PGMEA/PC/DEGME), (PGMEA/PC/DME), (PGMEA/PC/DEE), (PGMEA/PC/DEGIME), (PGMEA/PC/DEGDME), (PGMEA/PC/DEGDEE), (PGMEA/PC/TriEGDME), (PGMEA/PC/TetraEGDME), (PGMEA/PC/TEGMBE), (PGMEA/PC/DEGMBE), (PGMEA/PC/Anisole), (PGMEA/PC/14-DMB), (PGMEA/PC/12-DMB), (PGMEA/PC/13-DMB), (PGMEA/PC/14-diphenoxybenzene), (PGMEA/PC/4-methoxytoluene), (PGMEA/PC/Phenetole), (PGMEA/NMP/DEGME), (PGMEA/NMP/DME), (PGMEA/NMP/DEE), (PGMEA/NMP/DEGIME), (PGMEA/NMP/DEGDME), (PGMEA/NMP/DEGDEE), (PGMEA/NMP/TriEGDME), (PGMEA/NMP/TetraEGDME), (PGMEA/NMP/TEGMBE), (PGMEA/NMP/DEGMBE), (PGMEA/NMP/Anisole), (PGMEA/NMP/14-DMB), (PGMEA/NMP/12-DMB), (PGMEA/NMP/13-DMB), (PGMEA/NMP/14-diphenoxybenzene), (PGMEA/NMP/4-methoxytoluene), (PGMEA/NMP/Phenetole), (nBA/DEGME/Anisole), (nBA/DME/Anisole), (nBA/DEE/Anisole), (nBA/DEGIME/Anisole), (nBA/DEGDME/Anisole), (nBA/DEGDEE/Anisole), (nBA/TriEGDME/Anisole), (nBA/TetraEGDME/Anisole), (nBA/TEGMBE/Anisole), (nBA/DEGMBE/Anisole), (nBA/DEGME/14-DMB), (nBA/DME/14-DMB), (nBA/DEE/14-DMB), (nBA/DEGIME/14-DMB), (nBA/DEGDME/14-DMB), (nBA/DEGDEE/14-DMB), (nBA/TriEGDME/14-DMB), (nBA/TetraEGDME/14-DMB), (nBA/TEGMBE/14-DMB), (nBA/DEGMBE/14-DMB), (nBA/DEGME/12-DMB), (nBA/DME/12-DMB), (nBA/DEE/12-DMB), (nBA/DEGIME/12-DMB), (nBA/DEGDME/12-DMB), (nBA/DEGDEE/12-DMB), (nBA/TriEGDME/12-DMB), (nBA/TetraEGDME/12-DMB), (nBA/TEGMBE/12-DMB), (nBA/DEGMBE/12-DMB), (nBA/DEGME/13-DMB), (nBA/DME/13-DMB), (nBA/DEE/13-DMB), (nBA/DEGIME/13-DMB), (nBA/DEGDME/13-DMB), (nBA/DEGDEE/13-DMB), (nBA/TriEGDME/13-DMB), (nBA/TetraEGDME/13-DMB), (nBA/TEGMBE/13-DMB), (nBA/DEGMBE/13-DMB), (nBA/DEGME/14-diphenoxybenzene), (nBA/DME/14-diphenoxybenzene), (nBA/DEE/14-diphenoxybenzene), (nBA/DEGIME/14-diphenoxybenzene), (nBA/DEGDME/14-diphenoxybenzene), (nBA/DEGDEE/14-diphenoxybenzene), (nBA/TriEGDME/14-diphenoxybenzene), (nBA/TetraEGDME/14-diphenoxybenzene), (nBA/TEGMBE/14-diphenoxybenzene), (nBA/DEGMBE/14-diphenoxybenzene), (nBA/DEGME/4-methoxytoluene), (nBA/DME/4-methoxytoluene), (nBA/DEE/4-methoxytoluene), (nBA/DEGIME/4-methoxytoluene), (nBA/DEGDME/4-methoxytoluene), (nBA/DEGDEE/4-methoxytoluene), (nBA/TriEGDME/4-methoxytoluene), (nBA/TetraEGDME/4-methoxytoluene), (nBA/TEGMBE/4-methoxytoluene), (nBA/DEGMBE/4-methoxytoluene), (nBA/DEGME/Phenetole), (nBA/DME/Phenetole), (nBA/DEE/Phenetole), (nBA/DEGIME/Phenetole), (nBA/DEGDME/Phenetole), (nBA/DEGDEE/Phenetole), (nBA/TriEGDME/Phenetole), (nBA/TetraEGDME/Phenetole), (nBA/TEGMBE/Phenetole), (nBA/DEGMBE/Phenetole), (PGME/MMP), (nBA/MMP), (PGMEA/MMP), (EL/MMP), (GBL/MMP), (DMSO/MMP), and (PC/MMP)

[Impurity Metal]

The chemical liquid contains an impurity metal containing one kind of metal selected from the group consisting of Fe, Cr, Ni, and Pb.

In a case where the chemical liquid contains one kind of impurity metal, the content of the impurity metal in the chemical liquid is 0.001 to 100 mass ppt. In a case where the chemical liquid contains two or more kinds of impurity metals, the content of each of the impurity metals is 0.001 to 100 mass ppt.

In a case where the content of the impurity metal is within the above range, the chemical liquid has further improved defect inhibition performance. Particularly, it is considered that in a case where the content of the impurity metal is equal to or greater than 0.001 mass ppt, and a substrate is coated with the chemical liquid, the impurity metal atoms may be easily aggregated, and accordingly, the number of defects may be reduced.

The state of the impurity metal in the chemical liquid is not particularly limited.

In the present specification, the impurity metal means a metal component in the chemical liquid that can be measured using a single particle inductively coupled plasma emission mass spectrometer. With this device, it is possible to measure the content and the total content of an impurity metal as particles (particle-like impurity metal) and an impurity metal other than that (for example, ions and the like). In the present specification, "the content of an impurity metal" simply means the total content. The chemical liquid may contain both the impurity metal as particles and impurity metal other than that (for example, ions and the like).

In the present specification, the impurity metal as particles means a particle-like metal component in the chemical liquid that can be measured using a single particle inductively coupled plasma emission mass spectrometer. In the present specification, the impurity metal can be measured, by the method described in Examples by using Agilent 8800 triple quadrupole inductively coupled plasma mass spectrometry (ICP-MS, for semiconductor analysis, option #200) manufactured by Agilent Technologies, Inc.

The size of the impurity metal as particles is not particularly limited. Generally, the average primary particle diameter thereof is preferably equal to or smaller than 20 nm. The lower limit thereof is not particularly limited, but is preferably equal to or greater than 5 nm in general. In the present specification, the average primary particle diameter means an average primary particle diameter obtained by evaluating diameters, expressed as diameters of circles, of 400 metal nitride-containing particles by using a transmission electron microscope (TEM) and calculating the arithmetic mean thereof.

Particularly, in view of obtaining a chemical liquid having further improved effects of the present invention, the chemical liquid contains an impurity metal containing Fe, Cr, Ni, and Pb, and the content of the each of the impurity metals is preferably 0.001 to 100 mass ppt and more preferably 0.001 to 30 mass ppt.

Furthermore, in view of obtaining a chemical liquid having further improved effects of the present invention, the chemical liquid preferably contains an impurity metal as particles. In a case where the chemical liquid contains one kind of particles, the content of the particles in the chemical liquid is preferably 0.001 to 30 mass ppt. In a case where the chemical liquid contains two or more kinds of particles, the content of each kind of the particles in the chemical liquid is preferably 0.001 to 30 mass ppt.

In view of obtaining a chemical liquid having particularly improved effects of the present invention, it is particularly preferable that the chemical liquid contains impurity metals as particles containing Fe, Cr, Ni, and Pb, and the content of particles of each of the above metals is 0.001 to 30 mass ppt.

The impurity metal may be added to the chemical liquid or may be unintentionally mixed into the chemical liquid in the manufacturing process of the chemical liquid. Examples of the case where the impurity metal is unintentionally mixed into the chemical liquid in the manufacturing process of the chemical liquid include a case where the impurity metal is contained in a raw material (for example, an organic solvent) used for manufacturing the chemical liquid, a case where the impurity metal is mixed into the chemical liquid in the manufacturing process of the chemical liquid (for example, contamination), and the like. However, the present invention is not limited to these.

Chemical Liquid (Second Embodiment)

The chemical liquid according to a second embodiment of the present invention contains a mixture of two or more kinds of organic solvents and an impurity metal containing one kind of metal selected from the group consisting of Fe, Cr, Ni, and Pb, in which in a case where the chemical liquid contains one kind of impurity metal, the content of the impurity metal in the chemical liquid is 0.001 to 100 mass ppt, in a case where the chemical liquid contains two or more kinds of impurity metals, the content of each of the impurity metals in the chemical liquid is 0.001 to 100 mass ppt, and the chemical liquid satisfies at least any one of the following conditions 1 to 4.

Condition 1: the mixture contains at least one kind of organic solvent selected from the following first organic solvents and at least one kind of organic solvent selected from the following second organic solvents.

Condition 2: the mixture contains at least one kind of organic solvent selected from the following first organic solvents and at least one kind of organic solvent selected from the following third organic solvents.

Condition 3: the mixture contains at least one kind of organic solvent selected from the following second organic solvents and at least one kind of organic solvent selected from the following third organic solvents.

Condition 4: the mixture contains at least one kind of organic solvent selected from the following first organic solvents, at least one kind of organic solvent selected from the following second organic solvents, and at least one kind of organic solvent selected from the following third organic solvents.

Condition 5: the mixture contains at least one kind of organic solvent selected from the following first organic solvents, the following second organic solvents, and the following third organic solvents and at least one kind of organic solvent selected from the following fourth organic solvents.

Condition 6: the mixture contains two or more kinds of organic solvents selected from the following fourth organic solvents.

Condition 7: the mixture contains at least one kind of organic solvent selected from the following first organic solvents, the following second organic solvents, and the following third organic solvents and the following fifth organic solvent.

First organic solvents: propylene glycol monomethyl ether, cyclopentanone, and butyl acetate Second organic solvents: propylene glycol monomethyl ether acetate, cyclohexanone, ethyl lactate, 2-hydroxymethyl isobutyrate, and cyclopentanone dimethyl acetal Third organic solvents: γ-butyrolactone, dimethyl sulfoxide, ethylene carbonate, propylene carbonate, and 1-methyl-2-pyrrolidone Fourth organic solvents: isoamyl acetate, methyl isobutyl carbinol, diethylene glycol monomethyl ether, dimethyl ether, diethyl ether, diethylene glycol monoisobutyl ether, diglyme, diethylene glycol diethyl ether, triethylene glycol dimethyl ether, tetraethylene glycol dimethyl ether, triethylene glycol butyl methyl ether, diethylene glycol monobutyl ether, anisole, 1,4- dimethoxybenzene, 1,2-dimethoxybenzene, 1,3-dimethoxybenzene, 1,4-diphenoxybenzene, 4-methoxytoluene, and phenetole Fifth organic solvent: 3-methoxymethyl propionate Hereinafter, the components contained in the chemical liquid will be specifically described.

[Mixture of Two or More Kinds of Organic Solvents]

The chemical liquid contains a mixture of two or more kinds of organic solvents.

The content of the mixture in the chemical liquid is not particularly limited, but is preferably 99.9% to 99.999% by mass with respect to the total mass of the chemical liquid in general.

The vapor pressure of the mixture at 25° C. is not particularly limited, but is preferably 50 to 1,420 Pa and more preferably 200 to 1,250 Pa in general.

The vapor pressure of the mixture is calculated by the method described above.

The chemical liquid satisfies at least any one of the following conditions 1 to 7 which will be described later. In other words, the mixture contained in the chemical liquid contains at least any of the following combinations.

The first organic solvent and second organic solvent
The first organic solvent and the third organic solvent
The second organic solvent and the third organic solvent
The first organic solvent, the second organic solvent, and the third organic solvent
The first organic solvent and the fourth organic solvent
The second organic solvent and the fourth organic solvent
The third organic solvent and the fourth organic solvent
The fourth organic solvent and the fourth organic solvent
The first organic solvent and the fifth organic solvent
The second organic solvent and the fifth organic solvent
The third organic solvent and the fifth organic solvent In view of obtaining a chemical liquid having further improved effects of the present invention, it is preferable that the mixture contained in the chemical liquid contains any of the following combinations.

The first organic solvent and the fourth organic solvent
The second organic solvent and the fourth organic solvent
The third organic solvent and the fourth organic solvent
The fourth organic solvent and the fourth organic solvent <First Organic Solvent>

The first organic solvent is at least one kind of organic solvent selected from the group consisting of propylene glycol monomethyl ether, cyclopentanone, and butyl acetate.

In a case where the mixture contains the first organic solvent, the content of the first organic solvent is not particularly limited but is preferably 1% to 95% by mass in general with respect to the total mass of the mixture.

Particularly, in a case where the mixture is constituted with the first organic solvent and the second organic solvent, the content of the first organic solvent in the mixture with respect to the total mass of the mixture is preferably 5% to 95% by mass, more preferably 20% to 80% by mass, and even more preferably 25% to 40% by mass.

In a case where the mixture is constituted with the first organic solvent and the third organic solvent, the content of the first organic solvent in the mixture with respect to the total mass of the mixture is preferably 10% to 90% by mass, more preferably 15% to 80% by mass, and even more preferably 15% to 50% by mass.

In a case where the mixture is constituted with the first organic solvent, the second organic solvent, and the third organic solvent, the content of the first organic solvent in the mixture with respect to the total mass of the mixture is preferably 5% to 90% by mass, more preferably 10% to 70% by mass, and even more preferably 15% to 35% by mass.

One kind of the first organic solvent may be used singly, or two or more kinds of the first organic solvents may be used in combination. In a case where two or more kinds of the first organic solvents are used in combination in the mixture, the total content of the first organic solvents is preferably within the above range.

<Second Organic Solvent>

The second organic solvent is at least one kind of organic solvent selected from the group consisting of propylene glycol monomethyl ether acetate, cyclohexanone, ethyl lactate, 2-hydroxymethyl isobutyrate, and cyclopentanone dimethyl acetal.

In a case where the mixture contains the second organic solvent, the content of the second organic solvent is not particularly limited but is preferably 10% to 95% by mass in general with respect to the total mass of the mixture.

Particularly, in a case where the mixture is constituted with the first organic solvent and the second organic solvent, the content of the second organic solvent in the mixture with respect to the total mass of the mixture is preferably 5% to 95% by mass, more preferably 20% to 80% by mass, and even more preferably 60% to 75% by mass.

In a case where the mixture is constituted with the second organic solvent and the third organic solvent, the content of the second organic solvent in the mixture with respect to the total mass of the mixture is preferably 5% to 95% by mass, more preferably 20% to 80% by mass, and even more preferably 60% to 80% by mass.

In a case where the mixture is constituted with the first organic solvent, the second organic solvent, and the third organic solvent, the content of the second organic solvent in the mixture with respect to the total mass of the mixture is preferably 5% to 90% by mass, more preferably 20% to 80% by mass, and even more preferably 30% to 70% by mass.

One kind of the second organic solvent may be used singly, or two or more kinds of the second organic solvents may be used in combination. In a case where two or more kinds of the second organic solvents are used in combination in the mixture, the total content of the second organic solvents is preferably within the above range.

<Third Organic Solvent>

The third organic solvent is at least one kind of organic solvent selected from the group consisting of γ-butyrolactone, dimethyl sulfoxide, ethylene carbonate, propylene carbonate, and 1-methyl-2-pyrrolidone.

In a case where the mixed solution contains the third organic solvent, the content of the third organic solvent is not particularly limited. Generally, the content of the third organic solvent with respect to the total mass of the mixture is preferably 1% to 95% by mass, more preferably 10% to 80% by mass, and even more preferably 20% to 70% by mass.

Particularly, in a case where the mixture is constituted with the first organic solvent and the third organic solvent, the content of the third organic solvent in the mixture with respect to the total mass of the mixture is preferably 10% to 90% by mass, more preferably 20% to 85% by mass, and even more preferably 60% to 85% by mass.

In a case where the mixture is constituted with the second organic solvent and the third organic solvent, the content of the third organic solvent in the mixture with respect to the total mass of the mixture is preferably 5% to 95% by mass, more preferably 20% to 80% by mass, and even more preferably 20% to 40% by mass.

In a case where the mixture is constituted with the first organic solvent, the second organic solvent, and the third organic solvent, the content of the third organic solvent in the mixture with respect to the total mass of the mixture is preferably 5% to 90% by mass, more preferably 10% to 70% by mass, and even more preferably 15% to 35% by mass.

One kind of the third organic solvent may be used singly, or two or more kinds of the third organic solvents may be used in combination. In a case where two or more kinds of the third organic solvents are used in combination in the mixture, the total content of the third organic solvents is preferably within the above range.

<Fourth Organic Solvent>

The fourth organic solvent is at least one kind of organic solvent selected from the group consisting of isoamyl acetate, methyl isobutyl carbinol, diethylene glycol monomethyl ether, dimethyl ether, diethyl ether, diethylene glycol monoisobutyl ether, diglyme, diethylene glycol diethyl ether, triethylene glycol dimethyl ether, tetraethylene glycol dimethyl ether, triethylene glycol butyl methyl ether, diethylene glycol monobutyl ether, anisole, 1,4-dimethoxybenzene, 1,2-dimethoxybenzene, 1,3-dimethoxybenzene, 1,4-diphenoxybenzene, 4-methoxytoluene, and phenetole.

In a case where the mixture contains the fourth organic solvent, the content of the fourth organic solvent is not particularly limited. Generally, the content of the fourth organic solvent with respect to the total mass of the mixture is preferably 5% to 80% by mass, more preferably 10% to 70% by mass, and even more preferably 20% to 60% by mass.

Particularly, in a case where the mixture contains two or more kinds of the fourth organic solvents, the content of the fourth organic solvents is preferably 20% to 50% by mass.

One kind of the fourth organic solvent may be used singly, or two or more kinds of the fourth organic solvents may be used in combination. In a case where two or more kinds of the fourth organic solvents are used in combination in the mixture, the total content of the fourth organic solvents is preferably within the above range.

<Fifth Organic Solvent>

The fifth organic solvent is 3-methoxymethyl propionate.

In a case where the mixture contains the fifth organic solvent, the content of the fifth organic solvent in the mixture is not particularly limited but is preferably 10% to 90% by mass in general.

[Impurity Metal]

The chemical liquid contains an impurity metal containing one kind of metal selected from the group consisting of Fe, Cr, Ni, and Pb.

In a case where the chemical liquid contains one kind of impurity metal, the content of the impurity metal in the chemical liquid is 0.001 to 100 mass ppt. In a case where the chemical liquid contains two or more kinds of impurity metals, the content of each of the impurity metals is 0.001 to 100 mass ppt.

In a case where the content of the impurity metal is within the above range, the chemical liquid has further improved defect inhibition performance. Particularly, it is considered that in a case where the content of the impurity metal is equal to or greater than 0.1 mass ppt, and a substrate is coated with the chemical liquid, the impurity metal atoms may be easily aggregated, and accordingly, the number of defects may be reduced.

The state of the impurity metal in the chemical liquid is not particularly limited.

The definition of the impurity metal in the present specification is as described above.

The impurity metal may be added to the chemical liquid or may be unintentionally mixed into the chemical liquid in the manufacturing process of the chemical liquid. Examples of the case where the impurity metal is unintentionally mixed into the chemical liquid in the manufacturing process of the chemical liquid include a case where the impurity metal is contained in a raw material (for example, an organic solvent) used for manufacturing the chemical liquid, a case where the impurity metal is mixed into the chemical liquid in the manufacturing process of the chemical liquid (for example, contamination), and the like. However, the present invention is not limited to these.

[Components and Physical Properties Common to Chemical Liquids of First Embodiment and Second Embodiment]

Hitherto, the first embodiment and the second embodiment of the chemical liquid of the present invention have been described. Hereinafter, the physical properties of the chemical liquid common to the first embodiment and the second embodiment and the like will be described.

[Hansen Parameters of Organic Solvent]

In view of making the chemical liquid have further improved effects of the present invention, it is preferable that the mixture contains an organic solvent having a Hansen solubility parameter higher than 10 $(MPa)^{0.5}$ in terms of a hydrogen bond element (hereinafter, referred to as "$\delta h$" as well in the present specification) or having a Hansen solubility parameter higher than 17 $(MPa)^{0.5}$ in terms of a dispersion element (hereinafter, referred to as "$\delta d$" as well in the present specification).

In the present specification, Hansen solubility parameters mean those described in "Hansen Solubility Parameters: A Users Handbook" (Second Edition, pp. 1-310, CRC Press, 2007), and the like. That is, Hansen solubility parameters describe solubility by using multi-dimensional vectors (a dispersion element ($\delta d$), a dipole-dipole force element ($\delta p$), and a hydrogen bond element ($\delta h$)). These three parameters can be considered as coordinates of points in a three-dimensional space called Hansen space.

$\delta h$ of the organic solvent is preferably higher than 10 $(MPa)^{0.5}$, and more preferably equal to or higher than 11 $(MPa)^{0.5}$. The upper limit of $\delta h$ is not particularly limited, but is preferably equal to or lower than 15 $(MPa)^{0.5}$ in general.

$\delta d$ of the organic solvent is preferably higher than 16.5 $(MPa)^{0.5}$, and more preferably equal to or higher than 17 $(MPa)^{0.5}$. The upper limit of $\delta d$ is not particularly limited, but is preferably equal to or lower than 20 $(MPa)^{0.5}$.

Examples of the organic solvent include DBCPN (4.2, 16.6), HBM (12.2, 16.5), EL (12.5, 16.0), CyHx (5.1, 17.8), PGMEA (9.8, 15.6), CyPN (4.8, 17.8), GBL (7.0, 17.4), DMSO (10.2, 18.4), PC (6.5, 17.3), EC (8.0, 18.1), NMP (7.2, 18.0), and the like. The numbers in the bracket represent Hansen solubility parameters ($\delta h$ and $\delta d$), and the unit thereof is $(MPa)^{0.5}$.

[Optional Component]

As long as the effects of the present invention are exhibited, the chemical liquid may contain optional components other than the above components. Examples of the optional components include an organic impurity and water.

<Organic Impurity>

It is preferable that the chemical liquid contains an organic impurity.

In the present specification, the organic impurity means an organic compound which is different from the organic solvent as a main component contained in the chemical liquid and is contained in the chemical liquid in an amount equal to or smaller than 10,000 mass ppm with respect to the total mass of the chemical liquid. That is, in the present specification, an organic compound which is contained in the chemical liquid in an amount equal to or smaller than 10,000 mass ppm with respect to the total mass of the chemical liquid corresponds to an organic impurity but does not correspond to an organic solvent.

In a case where the chemical liquid contains a plurality of kinds of organic compounds, and each of the organic compounds is contained in the chemical liquid in an amount equal to or smaller than 10,000 mass ppm as described above, each of the organic compounds corresponds to the organic impurity.

The organic impurity may be added to the chemical liquid or may be unintentionally mixed into the chemical liquid in the manufacturing process of the chemical liquid. Examples of the case where the organic impurity is unintentionally mixed into the chemical liquid in the manufacturing process of the chemical liquid include a case where the organic impurity is contained in a raw material (for example, an organic solvent) used for manufacturing the chemical liquid, a case where the organic impurity is mixed into the chemical liquid in the manufacturing process of the chemical liquid (for example, contamination), and the like. However, the present invention is not limited to these.

The total content of the organic impurity in the chemical liquid (in a case where the chemical liquid contains only one kind of organic impurity, the content of the organic impurity) is not particularly limited. Generally, the upper limit of the total content of the organic impurity with respect to the total mass of the chemical liquid is preferably equal to or smaller than 100 mass ppm, more preferably equal to or smaller than 60 mass ppm, even more preferably equal to or smaller than 30 mass ppm, particularly preferably equal to or smaller than 100 mass ppb, and most preferably equal to or smaller than 10 mass ppb. Furthermore, generally, the lower limit of the total content of the organic impurity with respect to the total mass of the chemical liquid is preferably equal to or greater than 0.005 mass ppt, and more preferably equal to or greater than 0.01 mass ppt. In a case where the total content of the organic impurity is 0.01 mass ppt to 10 mass ppb, the chemical liquid has further improved defect inhibition performance.

One kind of organic impurity may be used singly, or two or more kinds of organic impurities may be used in combination. In a case where two or more kinds of organic impurities are used in combination, the total content thereof is preferably within the above range.

The total content of the organic impurity in the chemical liquid can be measured using gas chromatography mass spectrometry (GCMS). The measurement conditions and the like are as described in Examples.

As the organic impurity, known organic compounds can be used without particular limitation.

The number of carbon atoms in the organic compound is not particularly limited. However, in view of making the chemical liquid have further improved effects of the present invention, the number of carbon atoms in the organic compound is preferably equal to or greater than 8, and more preferably equal to or greater than 12. The upper limit of the number of carbon atoms is not particularly limited, but is preferably equal to or smaller than 30 in general.

The boiling point of the organic compound is not particularly limited. However, in view of making the chemical liquid have further improved effects of the present invention, the boiling point of the organic compound is preferably equal to or higher than 250° C., more preferably equal to or higher than 270° C., and even more preferably equal to or higher than 300° C.

Particularly, in view of making the chemical liquid have further improved effects of the present invention, the organic impurity preferably contains an organic compound having a boiling point equal to or higher than 250° C. and containing 8 or more carbon atoms (hereinafter, in the present specification, this compound will be referred to as "specific organic compound (1)" as well). The number of carbon atoms in one molecule of the specific organic compound (1) is more preferably equal to or greater than 12.

The content of the specific organic compound (1) in the chemical liquid is not particularly limited. Generally, the content of the specific organic compound (1) with respect to the total mass of the chemical liquid is preferably 0.005 mass ppt to 100 mass ppb, and more preferably 0.01 mass ppt to 10 mass ppb.

Examples of the organic impurity include byproducts generated at the time of synthesizing the organic solvent and/or unreacted raw materials (hereinafter, referred to as "byproduct and the like" as well), and the like.

Examples of the byproduct and the like include compounds represented by Formulae I to V, and the like.

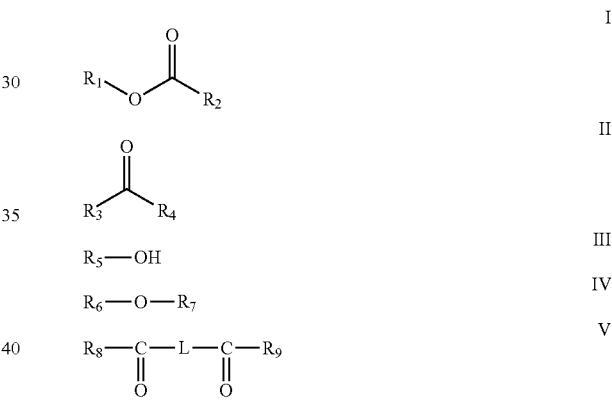

In Formula I, $R_1$ and $R_2$ each independently represent an alkyl group or a cycloalkyl group. Alternatively, $R_1$ and $R_2$ form a ring by being bonded to each other.

As the alkyl group or the cycloalkyl group represented by $R_1$ and $R_2$, an alkyl group having 1 to 12 carbon atoms or a cycloalkyl group having 6 to 12 carbon atoms is preferable, and an alkyl group having 1 to 8 carbon atoms or a cycloalkyl group having 6 to 8 carbon atoms is more preferable.

The ring formed of $R_1$ and $R_2$ bonded to each other is a lactone ring, preferably a 4- to 9-membered lactone ring, and more preferably a 4- to 6-membered lactone ring.

It is preferable that $R_1$ and $R_2$ satisfy a relationship in which the number of carbon atoms in the compound represented by Formula I becomes equal to or greater than 8.

In Formula II, $R_3$ and $R_4$ each independently represent a hydrogen atom, an alkyl group, an alkenyl group, a cycloalkyl group, or a cycloalkenyl group. Alternatively, $R_3$ and $R_4$ form a ring by being bonded to each other. Here, $R_3$ and $R_4$ do not simultaneously represent a hydrogen atom.

As the alkyl group represented by $R_3$ and $R_4$, for example, an alkyl group having 1 to 12 carbon atoms is preferable, and an alkyl group having 1 to 8 carbon atoms is more preferable.

As the alkenyl group represented by $R_3$ and $R_4$, for example, an alkenyl group having 2 to 12 carbon atoms is preferable, and an alkenyl group having 2 to 8 carbon atoms is more preferable.

As the cycloalkyl group represented by $R_3$ and $R_4$, for example, a cycloalkyl group having 6 to 12 carbon atoms is preferable, and a cycloalkyl group having 6 to 8 carbon atoms is more preferable.

As the cycloalkenyl group represented by $R_3$ and $R_4$, for example, a cycloalkenyl group having 3 to 12 carbon atoms is preferable, and a cycloalkenyl group having 6 to 8 carbon atoms is more preferable.

The ring formed of $R_3$ and $R_4$ bonded to each other is a cyclic ketone structure which may be a saturated cyclic ketone or an unsaturated cyclic ketone. The cyclic ketone is preferably a 6- to 10-membered ring, and more preferably a 6- to 8-membered ring.

It is preferable that $R_3$ and $R_4$ satisfy a relationship in which the number of carbon atoms in the compound represented by Formula II becomes equal to or greater than 8.

In Formula III, $R_5$ represents an alkyl group or a cycloalkyl group.

As the alkyl group represented by $R_5$, an alkyl group having 6 or more carbon atoms is preferable, an alkyl group having 6 to 12 carbon atoms is more preferable, and an alkyl group having 6 to 10 carbon atoms is even more preferable The alkyl group may have an ether bond in the chain thereof or may have a substituent such as a hydroxy group.

As the cycloalkyl group represented by $R_5$, a cycloalkyl group having 6 or more carbon atoms is preferable, a cycloalkyl group having 6 to 12 carbon atoms is more preferable, and a cycloalkyl group having 6 to 10 carbon atoms is even more preferable.

In Formula IV, $R_6$ and $R_7$ each independently represent an alkyl group or a cycloalkyl group. Alternatively, $R_6$ and $R_7$ form a ring by being bonded to each other.

As the alkyl group represented by $R_6$ and $R_7$, an alkyl group having 1 to 12 carbon atoms is preferable, and an alkyl group having 1 to 8 carbon atoms is more preferable.

As the cycloalkyl group represented by $R_6$ and $R_7$, a cycloalkyl group having 6 to 12 carbon atoms is preferable, and a cycloalkyl group having 6 to 8 carbon atoms is more preferable.

The ring formed of $R_6$ and $R_7$ bonded to each other is a cyclic ether structure. The cyclic ether structure is preferably a 4- to 8-membered ring, and more preferably a 5- to 7-membered ring.

It is preferable that $R_6$ and $R_7$ satisfy a relationship in which the number of carbon atoms in the compound represented by Formula IV becomes equal to or greater than 8.

In Formula V, $R_8$ and $R_9$ each independently represent an alkyl group or a cycloalkyl group. Alternatively, $R_8$ and $R_9$ form a ring by being bonded to each other. L represents a single bond or an alkylene group.

As the alkyl group represented by $R_8$ and $R_9$, an alkyl group having 6 to 12 carbon atoms is preferable, and an alkyl group having 6 to 10 carbon atoms is more preferable.

As the cycloalkyl group represented by $R_8$ and $R_9$, a cycloalkyl group having 6 to 12 carbon atoms is preferable, and a cycloalkyl group having 6 to 10 carbon atoms is more preferable.

The ring formed of $R_8$ and $R_9$ bonded to each other is a cyclic diketone structure. The cyclic diketone structure is preferably a 6- to 12-membered ring, and more preferably a 6- to 10-membered ring.

As the alkylene group represented by L, for example, an alkylene group having 1 to 12 carbon atoms is preferable, and an alkylene group having 1 to 10 carbon atoms is more preferable.

$R_8$, $R_9$, and L satisfy a relationship in which the number of carbon atoms in the compound represented by Formula V becomes equal to or greater than 8.

The organic impurity is not particularly limited. However, in a case where the organic solvents are an amide compound, an imide compound, and a sulfoxide compound, in an aspect, examples of the organic impurity include an amide compound, an imide compound, and a sulfoxide compound having 6 or more carbon atoms. Examples of the organic impurity also include the following compounds.

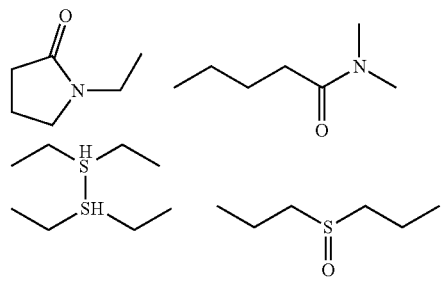

Examples of the organic impurity also include antioxidants such as dibutylhydroxytoluene (BHT), distearylthiodipropionate (DSTP), 4,4'-butylidenebis-(6-t-butyl-3-methylphenol), 2,2'-methylenebis-(4-ethyl-6-t-butylphenol), and the antioxidants described in JP2015-200775A; unreacted raw materials; structural isomers and byproducts produced at the time of manufacturing the organic solvent; substances eluted from members constituting an organic solvent manufacturing device and the like (for example, a plasticizer eluted from a rubber member such as an O-ring); and the like.

Examples of the organic impurity include dioctyl phthalate (DOP), bis(2-ethylhexyl) phthalate (DEHP), bis(2-propylheptyl) phthalate (DPHP), dibutyl phthalate (DBP), benzyl butyl phthalate (BBzP), diisodecyl phthalate (DIDP), diisooctyl phthalate (DIOP), diethyl phthalate (DEP), diisobutyl phthalate (DIBP), dihexyl phthalate, diisononyl phthalate (DINP), tris(2-ethylhexyl) trimellitate (TEHTM), tris(n-octyl-n-decyl) trimellitate (ATM), bis(2-ethylhexyl) adipate (DEHA), monomethyl adipate (MMAD), dioctyl adipate (DOA), dibutyl sebacate (DBS), dibutyl maleate (DBM), diisobutyl maleate (DIBM), an azelaic acid ester, a benzoic acid ester, terephthalate (example: dioctyl terephthalate (DEHT)), a 1,2-cyclohexanedicarboxylic acid diisononyl ester (DINCH), epoxidized vegetable oil, sulfonamide (example: N-(2-hydroxypropyl)benzene sulfonamide (HP BSA), and N-(n-butyl)benzene sulfonamide (BBSA-NBBS)), an organic phosphoric acid ester (example: tricresyl phosphate (TCP), and tributyl phosphate (TBP)), acetylated monoglyceride, triethyl citrate (TEC), acetyl triethyl citrate (ATEC), tributyl citrate (TBC), acetyl tributyl citrate (ATBC), trioctyl citrate (TOC), acetyl trioctyl citrate (ATOC), trihexyl citrate (THC), acetyl trihexyl citrate (ATHC), epoxidized soybean oil, ethylene propylene rubber, polybutene, an addition polymer of 5-ethylidene-2-norbornene, and polymer plasticizers exemplified below.

Presumably, these organic impurities may be mixed into the substance to be purified or the chemical liquid from a filter, piping, a tank, an O-ring, a container, and the like that the substance to be purified or the chemical liquid contacts in a purification step. Particularly, compounds other than alkyl olefin are involved in the occurrence of a bridge defect.

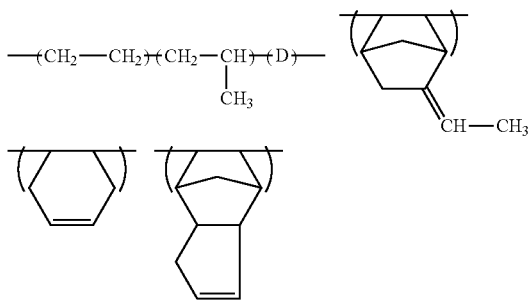

It is preferable that the organic impurity contains an organic compound having a C Log P value higher than 6.5 (hereinafter, this compound will be referred to as "specific organic compound (2)" as well). The definition of the C Log P value in the present specification is as below.

First, A log P value is a common logarithm of a partition coefficient P. This is a physical property value showing how a certain compound is partitioned in equilibrium of two phase system consisting of n-octanol and water by using a quantitative numerical value. The greater the log P value, the more the compound is hydrophobic, and the smaller the log P value, the more the compound is hydrophilic.

log $P$=log($C$oil/$C$water)

Coil=molar concentration of target compound in n-octanol phase

Cwater=molar concentration of target compound in water phase

The log P value in the present specification means a calculated value determined using a log P value estimation program. Specifically, the log P value means a C log P value determined using "ChemBioDraw ultra ver. 12".

The content of the specific organic compound (2) in the chemical liquid is not particularly limited. However, in view of obtaining a chemical liquid having further improved defect inhibition performance, in a case where the chemical liquid contains one kind of specific organic compound (2), the content of the specific organic compound (2) in the chemical liquid is preferably 0.01 mass ppt to 10 mass ppb. In a case where the chemical liquid contains two or more kinds of specific organic compounds (2), the total content of the specific organic compounds (2) in the chemical liquid is preferably 0.01 mass ppt to 10 mass ppb.

In a case where the total content of the specific organic compound (2) in the chemical liquid is equal to or greater than 0.01 mass ppt, the impurity metal and the specific organic compound (2) contained in the chemical liquid are bonded to each other. Accordingly, in a case where the chemical liquid is used as a prewet solution, and a substrate is coated with the prewet solution, the impurity metal on the substrate is easily washed off. As a result, the occurrence of a defect is more easily inhibited, and hence further improved resist saving properties are obtained. In contrast, in a case where the content of the specific organic compound (2) in the chemical liquid is equal to or smaller than 10 mass ppb, the specific organic compound (2) is inhibited from becoming the cause of a defect, and hence further improved resist saving properties are obtained.

The specific organic compound (2) is not particularly limited, and examples thereof include dioctyl phthalate (DOP), bis(2-ethylhexyl) phthalate (DEHP), bis(2-propylheptyl) phthalate (DPHP), benzyl butyl phthalate (BBzP), diisodecyl phthalate (DIDP), diisooctyl phthalate (DIOP), a 1,2-cyclohexanedicarboxylic acid diisononyl ester (DINCH), epoxidized vegetable oil, sulfonamide (example: N-(2-hydroxypropyl)benzene sulfonamide (HP BSA), and N-(n-butyl)benzene sulfonamide (BBSA-NBBS)), acetyl trihexyl citrate (ATHC), epoxidized soybean oil, ethylene propylene rubber, polybutene, an addition polymer of 5-ethylidene-2-norbornene, and the like.

(High-Boiling-Point Component)

It is preferable that the organic impurity contains a high-boiling-point component having a boiling point equal to or higher than 270° C. The total content of the high-boiling-point component with respect to the total mass of the chemical liquid is preferably 0.005 mass ppt to 60 mass ppm, and more preferably 0.01 mass ppt to 10 mass ppb. In a case where the content of the high-boiling-point component in the chemical liquid is within the above range, the chemical liquid has further improved effects of the present invention.

(Ultrahigh-Boiling-Point Component)

It is preferable that the high-boiling-point component contains an ultrahigh-boiling-point component having a boiling point equal to or higher than 300° C. The content of the ultrahigh-boiling-point component with respect to the total mass of the chemical liquid is preferably 0.005 mass ppt to 30 mass ppm, and more preferably 0.01 mass ppt to 10 mass ppb. In a case where the content of the ultrahigh-boiling-point component in the chemical liquid is within the above range, the chemical liquid has further improved effects of the present invention.

<Water>

It is preferable that the chemical liquid contains water. As the water, for example, distilled water, deionized water, pure water, and the like can be used without particular limitation. The water is not included in the aforementioned organic impurity.

Water may be added to the chemical liquid or may be unintentionally mixed into the chemical liquid in the manufacturing process of the chemical liquid. Examples of the case where water is unintentionally mixed into the chemical liquid in the manufacturing process of the chemical liquid include a case where water is contained in a raw material (for example, an organic solvent) used for manufacturing the chemical liquid, a case where water is mixed into the chemical liquid in the manufacturing process of the chemical liquid (for example, contamination), and the like. However, the present invention is not limited to these.

The content of water in the chemical liquid is not particularly limited. Generally, the content of water with respect to the total mass of the chemical liquid is preferably 0.05% to 2.0% by mass, and more preferably 0.10% to 1.5% by mass.

In a case where the content of water in the chemical liquid is 0.1% to 1.5% by mass, the chemical liquid has further improved defect inhibition performance.

In a case where the content of water is equal to or greater than 0.10% by mass, the impurity metal is not easily eluted. In a case where the content of water is equal to or smaller than 1.5% by mass, water is inhibited from becoming the cause of a defect.

In the present specification, the content of water in the chemical liquid means a moisture content measured using a device which adopts the Karl Fischer moisture measurement method as the principle of measurement. The measurement method performed by the device is as described in Examples which will be described later.

[Physical Properties of Chemical Liquid or Mixture]

In view of making the chemical liquid have further improved effects of the present invention, the surface tension of the mixture and the number of objects to be counted having a size equal to or greater than 100 nm that are counted by a light scattering-type liquid-borne particle counter are preferably within a predetermined range. Hereinafter, each of the physical properties will be described.

<Surface Tension of Mixture>

The surface tension at 25° C. of the mixture of two or more kinds of organic solvents contained in the chemical liquid is not particularly limited. Generally, the surface tension at 25° C. of the mixture is preferably 25 to 42 mN/m. In view of making the chemical liquid have further improved effects of the present invention, the surface tension is more preferably 25 to 40 mN/m, even more preferably 25 to 38 mN/m, particularly preferably 28 to 35 mN/m, and most preferably 29 to 34 mN/m.

In a case where the surface tension of the chemical liquid at 25° C. is 28 to 40 mN/m, the chemical liquid has further improved resist saving properties.

In the present specification, the surface tension means a surface tension calculated by the following method.

First, by using the chemical liquid as a sample, the type and content of each of the organic solvents contained in the chemical liquid are measured using gas chromatography mass spectrometry.

The measurement conditions for the gas chromatography mass spectrometry are as described in Examples.

The mixture is constituted with the organic solvents detected by the aforementioned method. Based on the surface tension at 25° C. of each of the organic solvents contained in the mixture and a molar fraction of each of the organic solvents in the mixture, the surface tension of the mixture is calculated by the following equation.

Equation: (Surface tension of mixture)=Σ((surface tension of each of organic solvents at 25° C.)×(molar fraction of each of organic solvents))

<Number of Objects to be Counted Having Size Equal to or Greater than 100 nm in Chemical Liquid that are Counted by Light Scattering-Type Liquid-Borne Particle Counter>

In view of making the chemical liquid have further improved effects of the present invention, in the chemical liquid, the number of objects to be counted having a size equal to or greater than 100 nm (0.1 μm) that are counted by a light scattering-type liquid-borne particle counter is preferably equal to or smaller than 100/mL.

In the present specification, the objects to be counted having a size equal to or greater than 100 nm that are counted by a light scattering-type liquid-borne particle counter are referred to as "coarse particles" as well.

Examples of the coarse particles include particles of dirt, dust, organic solids, inorganic solids, and the like contained in a raw material (for example, an organic solvent) used for manufacturing the chemical liquid, dirt, dust, solids (formed of organic substances, inorganic substances, and/or metals) incorporated as contaminants into the chemical liquid while the chemical liquid is being prepared, and the like. However, the present invention is not limited to these.

The coarse particles also include a collodized impurity containing metal atoms. The metal atoms are not particularly limited. However, in a case where the content of at least one kind of metal atom selected from the group consisting of Na, K, Ca, Fe, Cu, Mg, Mn, Li, Al, Cr, Ni, Zn, and Pb (preferably Fe, Cr, Ni, and Pb) is particularly small (for example, in a case where the content of each of the aforementioned metal atoms in the organic solvent is equal to or smaller than 1,000 mass ppt), the impurity containing these metal atoms is easily colloidized.

[Manufacturing Method of Chemical Liquid]

As the manufacturing method of the chemical liquid, known manufacturing methods can be used without particular limitation. Particularly, in view of more simply obtaining the chemical liquid, a manufacturing method of a chemical liquid having the following steps performed in the following order is preferable. Hereinafter, each of the steps will be specifically described.

(1) Organic solvent preparation step of preparing substance to be purified containing two or more kinds of organic solvents or substance to be purified containing mixture of two or more kinds of organic solvents (2) Purification step of purifying substance to be purified In a case where two or more kinds of substances to be purified containing different organic solvents respectively are prepared in the organic solvent preparation step, the manufacturing method may additionally have the following step.

(3) Mixing step of mixing together two or more kinds of substances to be purified containing organic solvents so as to obtain mixture The manufacturing method of the chemical liquid may have the above steps in the aforementioned order or have the purification step after the mixing step. In the manufacturing method of the chemical liquid, each of the above steps may be performed once or performed plural times. In this case, each of the steps (1) to (3) performed plural times may be consecutively or intermittently carried out. For example, the manufacturing method of the chemical liquid, in which each of the steps (1) to (3) performed plural times is intermittently carried out, may adopt an aspect in which other steps are performed between the steps (1) to (3) performed plural times. Examples thereof include a manufacturing method of a chemical liquid in which the steps (1), (2), (3), (2) are performed in this order.

<(1) Organic Solvent Preparation Step>

The organic solvent preparation step is a step of preparing a substance to be purified containing two or more kinds of organic solvents or a substance to be purified containing a mixture thereof. The method for preparing the substance to be purified containing two or more kinds of organic solvents or a substance to be purified containing a mixture thereof is not particularly limited. Examples of the method include methods such as preparing a commercial substance to be purified containing two or more kinds of organic solvents or preparing a commercial substance to be purified containing a mixture thereof by means of purchase or the like, and obtaining the substance to be purified containing two or more kinds of organic solvents by repeating a method for obtaining the substance to be purified containing organic solvents by means of reacting raw materials. As the substance to be purified containing two or more kinds of organic solvents, it is preferable to prepare a substance in which the content of the aforementioned impurity metal and/or the aforementioned organic impurity is small (for example, a substance in which the content of an organic solvent is equal to or greater than 99% by mass). Examples of commercial products of such a substance to be purified include those called "high-purity grade products".

As the method for obtaining the substance to be purified containing organic solvents by reacting raw materials, known methods can be used without particular limitation. Examples thereof include a method for obtaining the substance to be purified containing organic solvents by reacting a single raw material or a plurality of raw materials in the presence of a catalyst.

More specifically, examples of the method include a method for obtaining butyl acetate by reacting acetic acid and n-butanol in the presence of sulfuric acid; a method for obtaining propylene glycol 1-monomethyl ether 2-acetate (PGMEA) by reacting propylene oxide, methanol, and acetic acid in the presence of sulfuric acid; a method for obtaining ethyl lactate by reacting lactic acid and ethanol; and the like.

<(2) Purification Step of Purifying Substance to be Purified>

The purification step is a step of purifying the substance to be purified obtained by the step (1). According to the manufacturing method of the chemical liquid having the purification step, it is easy to obtain a chemical liquid having desired physical properties.

As the purification method of the substance to be purified, known methods can be used without particular limitation. It is preferable that the purification method of the substance to be purified includes at least one kind of step selected from the group consisting of the steps described below. Hereinafter, each of the steps will be specifically described.

In the purification step, each of the following steps may be performed once or plural times. Furthermore, the order of the following steps is not particularly limited.

Distillation step

Component adjustment step (Distillation Step)

It is preferable that (2) purification step includes a distillation step. The distillation step means a step of distilling the substance to be purified so as to obtain a substance to be purified having undergone distillation (hereinafter, referred to as "purified substance" as well). As the distillation method, known methods can be used without particular limitation.

Particularly, in view of more simply obtaining a substance to be purified having undergone distillation and making it more difficult for impurities to be unintentionally mixed into the substance to be purified in the distillation step, it is preferable to distill the substance to be purified by using the following purification device.

Purification Device

As an aspect of the purification device which can be used in the distillation step, for example, a purification device can be exemplified which has a distillation column, in which a liquid contact portion (for example, an interior wall, a pipe line, or the like) of the distillation column is formed of at least one kind of material selected from the group consisting of a nonmetallic material and an electropolished metallic material.

As the nonmetallic material, known materials can be used without particular limitation.

Examples of the nonmetallic material include at least one kind of material selected from the group consisting of a polyethylene resin, a polypropylene resin, a polyethylene-polypropylene resin, polytetrafluoroethylene, a polytetrafluoroethylene-perfluoroalkyl vinyl ether copolymer, a polytetrafluoroethylene-hexafluoropropylene copolymer resin, a polytetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin. However, the present invention is not limited to these.

As the metallic material, known materials can be used without particular limitation.

Examples of the metallic material include a metallic material in which the total content of chromium and nickel with respect to the total mass of the metallic material is greater than 25% by mass. The total content of chromium and nickel is more preferably equal to or greater than 30% by mass. The upper limit of the total content of chromium and nickel in the metallic material is not particularly limited, but is preferably equal to or smaller than 90% by mass in general.

Examples of the metallic material include stainless steel, a nickel-chromium alloy, and the like.

As the stainless steel, known stainless steel can be used without particular limitation. Among these, an alloy with a nickel content equal to or higher than 8% by mass is preferable, and austenite-based stainless steel with a nickel content equal to or higher than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the nickel-chromium alloy, known nickel-chromium alloys can be used without particular limitation. Among these, a nickel-chromium alloy is preferable in which the nickel content is 40% to 75% by mass and the chromium content is 1% to 30% by mass with respect to the total mass of the metallic material.

Examples of the nickel-chromium alloy include HASTELLOY (tradename, the same is true for the following description), MONEL (tradename, the same is true for the following description), INCONEL (tradename, the same is true for the following description), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, if necessary, the nickel-chromium alloy may further contain boron, silicon, tungsten, molybdenum, copper, cobalt, and the like in addition to the aforementioned alloy.

As the method for electropolishing the metallic material, known methods can be used without particular limitation. For example, it is possible to use the methods described in paragraphs [0011] to [0014] in JP2015-227501A, paragraphs [0036] to [0042] in JP2008-264929A, and the like.

Presumably, in a case where the metallic material is electropolished, the chromium content in a passive layer on the surface thereof may become higher than the chromium content in the parent phase. Presumably, for this reason, from the distillation column in which the liquid contact portion is formed of an electropolished metallic material, the metal impurity containing metal atoms may not easily flow into the organic solvent, and hence a purified substance having undergone distillation with a reduced impurity content can be obtained.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

Purification Device (Another Aspect)

As another aspect of the purification device which can be used in the distillation step, a purification device can be exemplified which comprises a reaction portion for obtaining a reactant by reacting raw materials, the distillation column described above, and a transfer pipe line which connects the reaction portion and the distillation column to each other so as to transfer the reactant to the distillation column from the reaction portion.

The reaction portion has a function of obtaining a reactant, which is an organic solvent, by reacting the supplied raw materials (if necessary, in the presence of a catalyst). As the reaction portion, known reaction portions can be used without particular limitation.

Examples of the reaction portion include an aspect comprising a reactor to which raw materials are supplied and in which a reaction proceeds, a stirring portion provided in the interior of the reactor, a lid portion joined to the reactor, an injection portion for injecting the raw materials into the reactor, and a reactant outlet portion for taking the reactant out of the reactor. By continuously or non-continuously injecting the raw materials into the reaction portion and reacting the injected raw materials (in the presence of a catalyst), a reactant which is an organic solvent can be obtained.

If desired, the reaction portion may also include a reactant isolation portion, a temperature adjustment portion, a sensor portion including a level gauge, a manometer, and a thermometer, and the like.

It is preferable that the liquid contact portion (for example, the interior wall of the liquid contact portion of the reactor, or the like) of the reaction portion is formed of at least one kind of material selected from the group consisting of a nonmetallic material and an electropolished metallic material. The aspect of each of the aforementioned materials is as described above.

In a case where the purification device including the reaction portion is used, a purified substance with a further reduced impurity content can be obtained.

In the purification device according to the above aspect, the reaction portion and the distillation column are connected to each other through the transfer pipe line. Because the reaction portion and the distillation column are connected to each other through the transfer pipe line, the transfer of the reactant to the distillation column from the reaction portion is carried out in a closed system, and impurities including a metal impurity are inhibited from being mixed into the reactant from the environment. Accordingly, a purified substance having undergone distillation with a further reduced impurity content can be obtained.

As the transfer pipe line, known transfer pipe lines can be used without particular limitation. As the transfer pipe line, an aspect comprising a pipe, a pump, a valve, and the like can be exemplified.

It is preferable that the liquid contact portion of the transfer pipe line is formed of at least one kind of material selected from the group consisting of a nonmetallic material and an electropolished metallic material. The aspect of each of the aforementioned materials is as described above.

In a case where the purification device comprising the transfer pipe line is used, it is possible to more simply obtain a purified substance having undergone distillation with a further reduced impurity content.

(Component Adjustment Step)

It is preferable that (2) purification step described above includes a component adjustment step.

The component adjustment step is a step of adjusting the content of the impurity metal, the organic impurity, water, and the like contained in the substance to be purified.

As the method for adjusting the content of the impurity metal, the organic impurity, water, and the like contained in the substance to be purified, known methods can be used without particular limitation.

Examples of the method for adjusting the content of the impurity metal, the organic impurity, water, and the like contained in the substance to be purified include a method for adding an impurity metal, an organic impurity, water, and the like in a predetermined amount to the substance to be purified, a method for removing an impurity metal, an organic impurity, water, and the like from the substance to be purified, and the like.

As the method for removing an impurity metal, an organic impurity, and water, and the like from the substance to be purified, known methods can be used without particular limitation.

As the method for removing an impurity metal, an organic impurity, water, and the lie from the substance to be purified, for example, a method for filtering the substance to be purified through a filter (hereinafter, a step of performing the filtering will be referred to as "filtering step") is preferable. The method for filtering the substance to be purified through a filter is not particularly limited, and examples thereof include a method for disposing a filter unit comprising a filter housing and a filter cartridge stored in the filter housing in the middle of a transfer pipe line transferring the substance to be purified and passing the substance to be purified through the filter unit with or without applying pressure thereto.

As the filter, known filters can be used without particular limitation.

Filtering Step

It is preferable that the component adjustment step includes a filtering step.

As the filter used in the filtering step, known filters can be used without particular limitation.

Examples of the material of the filter used in the filtering step include a fluororesin such as polytetrafluoroethylene (PTFE), a polyamide resin such as nylon, a polyolefin resin (including a polyolefin resin with high density and ultra-high molecular weight) such as polyethylene and polypropylene (PP), and the like. Among these, a polyamide resin, PTFE, and a polyolefin resin are preferable. In a case where filters formed of these materials are used, foreign substances with high polarity, which readily become the cause of a particle defect, can be efficiently removed, and the content of the metal component (impurity metal) can be efficiently reduced.

The lower limit of the critical surface tension of the filter is preferably equal to or higher than 70 mN/m. The upper limit thereof is preferably equal to or lower than 95 mN/m. The critical surface tension of the filter is more preferably 75 to 85 mN/m.

The value of the critical surface tension is the nominal value from manufacturers. In a case where a filter having critical surface tension within the above range is used, foreign substances with high polarity, which readily become the cause of a particle defect, can be effectively removed, and the amount of the metal component (metal impurity) can be efficiently reduced.

The pore size of the filter is preferably about 0.001 to 1.0 μm, more preferably about 0.01 to 0.5 μm, and even more preferably about 0.01 to 0.1 μm. In a case where the pore size of the filter is within the above range, it is possible to inhibit the clogging of the filter and to reliably remove minute foreign substances contained in the substance to be purified.

At the time of using the filter, different filters may be combined. At this time, filtering carried out using a first filter may be performed once or performed two or more times. In a case where filtering is performed two or more times by using different filters in combination, the filters may be of the same type or different types, but it is preferable that the filters are of different types. Typically, it is preferable that at least one of the pore size or the material varies between the first filter (primary side) and the second filter (secondary side).

It is preferable that the pore size for the second filtering and the next filtering is the same as or smaller than the pore size for the first filtering. Furthermore, first filters having different pore sizes within the above range may be combined. As the pore size mentioned herein, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like. In addition, it is possible to use "P-NYLON FILTER (pore size: 0.02 μm, critical surface tension: 77 mN/m)" made of polyamide; (manufactured by Pall Corporation Japan), "PE•CLEAN FILTER (pore size: 0.02 μm)" made of high-density polyethylene; (manufactured by Pall Corporation Japan), and "PE•CLEAN FILTER (pore size: 0.01 μm)" made of high-density polyethylene; (manufactured by Pall Corporation Japan).

For example, from the viewpoint of allowing the chemical liquid to bring about desired effects and from the viewpoint of inhibiting the increase of the impurity metal (particularly, an impurity metal as particles) during the storage of the purified chemical liquid, provided that an interaction radius in the Hansen solubility parameter space (HSP) derived from the material of the filter used for filtering is R0, and that a radius of a sphere in the Hansen space derived from the mixture of two or more kinds of organic solvents contained in the substance to be purified is Ra, it is preferable that the substance to be purified and the material of the filter used for filtering are combined such that the substance to be purified and the filter have a relationship satisfying a relational expression of (Ra/R0)≤1, and the substance to be purified is preferably filtered through a filter material satisfying the relational expression, although the combination of the substance to be purified and the filter is not particularly limited. Ra/R0 is preferably equal to or smaller than 0.98, and more preferably equal to or smaller than 0.95. The lower limit of Ra/R0 is preferably equal to or greater than 0.5, more preferably equal to or greater than 0.6, and even more preferably 0.7. In a case where Ra/R0 is within the above range, the increase in the content of the impurity metal in the chemical liquid during long-term storage is inhibited, although the mechanism is unclear.

The combination of the filter and the substance to be purified is not particularly limited, and examples thereof include those described in US2016/0089622.

As a second filter, a filter formed of the same material as the aforementioned first filter can be used. Furthermore, a filter having the same pore size as the aforementioned first filter can be used. In a case where a filter having a pore size smaller than that of the first filter is used as the second filter, a ratio between the pore size of the second filter and the pore size of the first filter (pore size of second filter/pore size of first filter) is preferably 0.01 to 0.99, more preferably 0.1 to 0.9, and even more preferably 0.2 to 0.9. In a case where the pore size of the second filter is within the above range, fine foreign substances mixed into the substance to be purified are more reliably removed.

The filtering pressure affects the filtering accuracy. Therefore, it is preferable that the pulsation of pressure at the time of filtering is as low as possible.

In the manufacturing method of a chemical liquid, the filtering speed is not particularly limited. However, in view of obtaining a chemical liquid having further improved effects of the present invention, the filtering speed is preferably equal to or higher than 1.0 L/min/m$^2$, more preferably equal to or higher than 0.75 L/min/m$^2$, and even more preferably equal to or higher than 0.6 L/min/m$^2$.

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than 10.0 L/min/m$^2$ although the upper limit usually depends on the endurable differential pressure of the filter.

In the manufacturing method of a chemical liquid, in view of obtaining a chemical liquid having further improved effects of the present invention, the filtering pressure is preferably 0.001 to 1.0 MPa, more preferably 0.003 to 0.5 MPa, and even more preferably 0.005 to 0.3 MPa. Particularly, in a case where a filter having a small pore size is used, by increasing the filtering pressure, it is possible to efficiently reduce the amount of particle-like foreign substances or impurities dissolved in the substance to be purified. In a case where a filter having a pore size smaller than 20 nm is used, the filtering pressure is particularly preferably 0.005 to 0.3 MPa.

The smaller the pore size of the filtration filter, the lower the filtering speed. However, for example, in a case where a plurality of filtration filters of the same type are connected to each other in parallel, the filtering area is enlarged, and the filtering pressure is reduced. Therefore, in this way, the reduction in the filtering speed can be compensated.

It is more preferable that the filtering step includes the following steps. In the filtering step, each of the following steps may be performed once or plural times. Furthermore, the order of the following steps is not particularly limited.

1. Particle removing step
2. Metal ion removing step
3. Organic impurity removing step
4. Ion exchange step Hereinafter, each of the steps will be described.

Particle Removing Step

The particle removing step is a step of removing the coarse particles and/or the impurity metal (particularly, the impurity metal as particles) in the substance to be purified by using a particle removing filter. As the particle removing filter, known particle removing filters can be used without particular limitation.

Examples of the particle removing filter include a filter having a pore size equal to or smaller than 20 nm. In a case where the substance to be purified is filtered using the above filter, the coarse particles can be removed from the substance to be purified (the aspect of the coarse particles is as described above).

The pore size of the filter is preferably 1 to 15 nm, and more preferably 1 to 12 nm. In a case where the pore size is equal to or smaller than 15 nm, finer coarse particles can be removed. In a case where the pore size is equal to or greater than 1 nm, the filtering efficiency is improved.

The pore size relates to the minimum size of particles that can be removed by the filter. For example, in a case where the pore size of the filter is 20 nm, particles having a diameter equal to or greater than 20 nm can be removed by sifting action.

Examples of the material of the filter include nylon such as 6-nylon and 6,6-nylon; polyolefin such as polyethylene and polypropylene; polystyrene; polyimide; polyamide imide; a fluororesin; and the like.

The polyimide and/or polyamide imide may contain at least one group selected from the group consisting of a carboxy group, a salt-type carboxy group, and a —NH— bond. A fluororesin, polyimide, or polyamide imide have excellent solvent resistance. Furthermore, from the viewpoint of adsorbing metal ions, nylon such as 6-nylon and 6,6-nylon are particularly preferable.

A filter unit may be constituted with a plurality of filters described above. That is, the filter unit may further comprise a filter having a pore size equal to or greater than 50 nm (for example, a microfiltration membrane for removing fine particles having a pore size equal to or greater than 50 nm). In a case where fine particles are present in the substance to be purified in addition to the colloidized impurity, particularly, the colloidized impurity containing metal atoms such as iron or aluminum, by filtering the substance to be purified by using a filter having a pore size equal to or greater than 50 nm (for example, a microfiltration membrane for removing fine particles having a pore size equal to or greater than 50 nm) before filtering the substance to be purified by using a filter having a pore size equal to or smaller than 20 nm (for example, a microfiltration membrane having a pore size equal to or smaller than 20 nm), the filtering efficiency of the filter having a pore size equal to or smaller than 20 nm (for example, a microfiltration membrane having a pore size equal to or smaller than 20 nm) is improved, and the coarse particle removing performance is further improved.

Metal Ion Removing Step

It is preferable that the filtering step further includes a metal ion removing step.

As the metal ion removing step, a step of passing the substance to be purified through a metal ion adsorption filter is preferable. The method for passing the substance to be purified through the metal ion adsorption filter is not particularly limited, and examples thereof include a method for disposing a metal ion adsorption filter unit comprising a metal ion adsorption filter and a filter housing in the middle of a transfer pipe line transferring the substance to be purified and passing the substance to be purified through the metal ion adsorption filter unit with or without applying pressure thereto.

The metal ion adsorption filter is not particularly limited, and examples thereof include known metal ion adsorption filters.

The metal ion adsorption filter is preferably a filter which can perform ion exchange. Herein, the metal ions to be adsorbed are not particularly limited. However, a metal ion containing one kind of element selected from the group consisting of Fe, Cr, Ni, and Pb is preferable, and metal ions containing Fe, Cr, Ni, and Pb are preferable, because these readily become the cause of a defect in a semiconductor device.

From the viewpoint of improving the metal ion adsorption performance, it is preferable that the metal ion adsorption filter has an acid group on the surface thereof. Examples of the acid group include a sulfo group, a carboxy group, and the like.

Examples of the base material (material) constituting the metal ion adsorption filter include cellulose, diatomite, nylon, polyethylene, polypropylene, polystyrene, a fluororesin, and the like. From the viewpoint of the metal ion adsorption efficiency, polyamide (particularly, nylon) is preferable.

The metal ion adsorption filter may be constituted with material including polyimide and/or polyamide imide. Examples of the metal ion adsorption filter include the polyimide and/or polyamide imide porous membrane described in JP2016-155121A.

The polyimide and/or polyamide imide porous membrane may contain at least one group selected from the group consisting of a carboxy group, a salt-type carboxy group, and a —NH— bond. In a case where the metal ion adsorption filter is formed of a fluororesin, polyimide, and/or polyamide imide, the filter has further improved solvent resistance.

Organic Impurity Removing Step

It is preferable that the filtering step includes an organic impurity removing step. As the organic impurity removing step, a step of passing the substance to be purified through an organic impurity adsorption filter is preferable. The method for passing the substance to be purified through the organic impurity adsorption filter is not particularly limited, and examples thereof include a method for disposing a filter unit comprising a filter housing and an organic impurity adsorption filter stored in the filter housing in the middle of a transfer pipe line transferring the substance to be purified and passing the organic solvent through the filter unit with or without applying pressure thereto.

The organic impurity adsorption filter is not particularly limited, and examples thereof include known organic impurity adsorption filters.

In view of improving the organic impurity adsorption performance, it is preferable that the organic impurity adsorption filter has the skeleton of an organic substance, which can interact with the organic impurity, on the surface thereof (in other words, it is preferable that the surface of the organic impurity adsorption filter is modified with the skeleton of an organic substance which can interact with the organic impurity). Examples of the skeleton of an organic substance which can interact with the organic impurity include a chemical structure which can react with the organic impurity so as to make the organic impurity trapped in the organic impurity adsorption filter. More specifically, in a case where the organic impurity contains long-chain n-alkyl alcohol (structural isomer in a case where long-chain 1-alkyl alcohol is used as an organic solvent), examples of the skeleton of an organic substance include an alkyl group. Furthermore, in a case where the organic impurity includes dibutylhydroxytoluene (BHT), examples of the skeleton of an organic substance include a phenyl group.

Examples of the base material (material) constituting the organic impurity adsorption filter include cellulose supporting active carbon, diatomite, nylon, polyethylene, polypropylene, polystyrene, a fluororesin, and the like.

Furthermore, as the organic impurity adsorption filter, it is possible to use the filters obtained by fixing active carbon to non-woven cloth that are described in JP2002-273123A and JP2013-150979A.

For the organic impurity adsorption filter, in addition to the chemical adsorption described above (adsorption using the organic impurity adsorption filter having the skeleton of an organic substance, which can interact with the organic impurity, on the surface thereof), a physical adsorption method can be used.

For example, in a case where the organic impurity contains BHT, the structure of BHT is larger than 10 angstroms (=1 nm). Accordingly, in a case where an organic impurity adsorption filter having a pore size of 1 nm is used, BHT cannot pass through the pore of the filter. That is, by being physically trapped by the filter, BHT is removed from the substance to be purified. In this way, for removing an organic impurity, not only a chemical interaction but also a physical removing method can be used. Here, in this case, a filter having a pore size equal to or greater than 3 nm is used as "particle removing filter", and a filter having a pore size less than 3 nm is used as "organic impurity adsorption filter".

Ion Exchange Step

The filtering step may further include an ion exchange step.

As the ion exchange step, a step of passing the substance to be purified through an ion exchange unit is preferable. The method for passing the substance to be purified through the ion exchange unit is not particularly limited, and examples thereof include a method for disposing an ion exchange unit in the middle of a transfer pipe line transferring the substance to be purified and passing the organic solvent through the ion exchange unit with or without applying pressure thereto.

As the ion exchange unit, known ion exchange units can be used without particular limitation. Examples of the ion exchange unit include an ion exchange unit including a tower-like container storing an ion exchange resin (resin tower), an ion adsorption membrane, and the like.

Examples of an aspect of the ion exchange step include a step in which a cation exchange resin or an anion exchange resin provided as a single bed is used as an ion exchange resin, a step in which a cation exchange resin and an anion exchange resin provided as a dual bed are used as an ion exchange resin, and a step in which a cation exchange resin and an anion exchange resin provided as a mixed bed are used as an ion exchange resin.

In order to reduce the amount of moisture eluted from the ion exchange resin, as the ion exchange resin, it is preferable to use a dry resin which does not contain moisture as far as possible. As the dry resin, commercial products can be used, and examples thereof include 15JS-HG•DRY (trade name, dry cation exchange resin, moisture: equal to or smaller than 2%) and MSPS2-1•DRY (trade name, mixed bed resin, moisture: equal to or smaller than 10%) manufactured by ORGANO CORPORATION, and the like.

It is preferable that the ion exchange step is performed before the distillation step described above or before a moisture adjustment step which will be described later.

As another aspect of the ion exchange step, a step of using an ion adsorption membrane can be exemplified.

In a case where the ion adsorption membrane is used, a treatment can be performed at a high flow rate. The ion adsorption membrane is not particularly limited, and examples thereof include NEOSEPTA (trade name, manufactured by ASTOM Corporation), and the like.

It is preferable that the ion exchange step is performed after the distillation step described above. In a case where the ion exchange step is performed, it is possible to remove the impurities accumulated in the purification device in a case where the impurities leak or to remove substances eluted from a pipe made of stainless steel (SUS) or the like used as a transfer pipe line.

Moisture Adjustment Step

The moisture adjustment step is a step of adjusting the content of water contained in the substance to be purified. The method for adjusting the content of water is not particularly limited, and examples thereof include method for adding water to the substance to be purified and a method for removing water from the substance to be purified.

As the method for removing water, known dehydration methods can be used without particular limitation.

Examples of the method for removing water include a dehydration membrane, a water adsorbent insoluble in an organic solvent, an aeration purging device using dried inert gas, a heating device, a vacuum heating device, and the like.

In a case where the dehydration membrane is used, membrane dehydration by pervaporation (PV) or vapor permeation (VP) is performed. The dehydration membrane is constituted as a permeable membrane module, for example. As the dehydration membrane, it is possible to use a membrane formed of a polymeric material such as a polyimide-based material, a cellulose-based material, and a polyvinyl alcohol-based material or an inorganic material such as zeolite.

The water adsorbent is used by being added to the substance to be purified. Examples of the water adsorbent include zeolite, diphosphorus pentoxide, silica gel, calcium chloride, sodium sulfate, magnesium sulfate, anhydrous zinc chloride, fuming sulfuric acid, soda lime, and the like.

In a case where zeolite (particularly, MOLECULAR SIEVE (trade name) manufactured by Union Showa K. K.) is used in the dehydration treatment, olefins can also be removed.

The component adjustment step described above is preferably performed under a sealed condition in an inert gas atmosphere in which water is less likely to be mixed into the substance to be purified.

Furthermore, in order to inhibit the mixing of moisture as much as possible, each of the treatments is preferably performed in an inert gas atmosphere in which a dew-point temperature is equal to or lower than −70° C. This is because in the inert gas atmosphere at a temperature equal to or lower than −70° C., the concentration of moisture in a gas phase is equal to or lower than 2 mass ppm, and hence the likelihood that moisture will be mixed into the organic solvent is reduced.

The manufacturing method of a chemical liquid may include, in addition to the above steps, the adsorptive purification treatment step for metal components using silicon carbide described in WO2012/043496A.

It is preferable that the filtering step described above is performed before each of the above steps, although the present invention is not particularly limited to this aspect. In a case where the filtering step is performed as above, the obtained effects of the present invention become more apparent. The filtering step is referred to as pre-filtering in some cases.

<(3) Mixing Step>

The mixing step is a step of mixing together two or more kinds of substances to be purified containing organic solvents so as to obtain a mixture. As the mixing method, known mixing methods can be used without particular limitation. In the mixing step, components other than the aforementioned organic solvents may also be mixed together. The order of mixing the components is not particularly limited. In the chemical liquid manufacturing process, (3) mixing step may be performed before or after (2) purification step.

<Other Steps>

As long as the effects of the present invention are exhibited, the manufacturing method of a chemical liquid may include other steps in addition to the organic solvent preparation step and the purification step. Those other steps are not particularly limited, and examples thereof include an electricity removing step.

(Electricity Removing Step)

The electricity removing step is a step of removing electricity from the substance to be purified such that the charge potential of the substance to be purified is reduced.

As the electricity removing method, known electricity removing methods can be used without particular limitation. Examples of the electricity removing method include a method for bringing the substance to be purified into contact with a conductive material.

The contact time for which the substance to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method for bringing the substance to be purified into contact with a conductive material include a method for disposing a grounded mesh formed of a conductive material in the interior of a pipe line and passing the substance to be purified through the mesh, and the like.

It is preferable that the electricity removing step is performed before at least one step selected from the group consisting of the organic solvent preparation step and the purification step.

It is preferable that in the device and members (filter and the like) relating to manufacturing, the liquid contact portion contacting the chemical liquid is washed before the manufacturing of the chemical liquid. As a washing solution, an organic solvent with few impurities is preferable. For example, a high-grade washing solution for semiconductors, an organic solvent obtained by further purifying the high-grade washing solution, the aforementioned chemical liquid, a solution obtained by diluting the chemical liquid, and the like are preferable. It is preferable that the manufacturing of the chemical liquid is started after the washing solution or impurities, which may be incorporated into the chemical liquid to be manufactured, are washed until the amount thereof becomes equal to or smaller than a desired amount.

<Container>

The chemical liquid may be temporarily stored in a container until the chemical liquid is used. As the container for storing the chemical liquid, known containers can be used without particular limitation.

As the container storing the chemical liquid, a container for a semiconductor is preferable which has a high internal cleanliness and hardly causes elution of impurities.

Examples of the usable container specifically include a "CLEAN BOTTLE" series manufactured by AICELLO CORPORATION, "PURE BOTTLE" manufactured by KODAMA PLASTICS Co., Ltd., and the like, but the container is not limited to these.

As the container, for the purpose of preventing mixing of impurities into the raw materials and the chemical liquid (contamination), it is preferable to use a multilayer bottle in which the inner wall of the container has a 6-layer structure formed of 6 kinds of resins or a multilayer bottle in which the inner wall of the container has a 7-layer structure formed of 6 kinds of resins. Examples of these containers include the containers described in JP2015-123351A.

It is preferable that the liquid contact portion of the container is formed of a nonmetallic material or stainless steel.

Examples of the nonmetallic material include the materials exemplified above as nonmetallic materials used in the liquid contact portion of the distillation column.

Particularly, in a case where a container in which the liquid contact portion is formed of a fluororesin among the above materials is used, the occurrence of a problem such as elution of an ethylene or propylene oligomer can be further inhibited than in a case where a container in which the liquid contact portion is formed of a polyethylene resin, a polypropylene resin, or a polyethylene-polypropylene resin is used.

Specific examples of the container in which the liquid contact portion is formed of a fluororesin include FluoroPure PFA composite drum manufactured by Entegris, Inc., and the like. Furthermore, it is possible to use the containers described on p. 4 in JP1991-502677A (JP-H03-502677A), p. 3 in WO2004/016526A, p. 9 and p. 16 in WO99/046309A, and the like. In a case where the nonmetallic material is used for the liquid contact portion, it is preferable to inhibit the elution of the nonmetallic material into the chemical liquid.

For the container, the liquid contact portion contacting the chemical liquid is preferably formed of stainless steel, and more preferably formed of electropolished stainless steel.

In a case where the chemical liquid is stored in such a container, it is more difficult for the impurity metal and/or the organic impurity to be eluted into the chemical liquid stored in the container.

The aspect of the stainless steel is as described above as the material of the liquid contact portion of the distillation column. The aspect of the electropolished stainless steel is as described above as well.

The content mass ratio of a content of Cr atoms to a content of Fe atoms (hereinafter, referred to as "Cr/Fe" as well) in the stainless steel forming the liquid contact portion of the container is not particularly limited. However, generally, Cr/Fe is preferably 0.5 to 4. Particularly, in view of making it more difficult for the impurity metal and/or the organic impurity to be eluted into the chemical liquid stored in the container, Cr/Fe is more preferably higher than 0.5 and lower than 3.5. In a case where Cr/Fe is higher than 0.5, the elution of a metal from the interior of the container can be inhibited. In a case where Cr/Fe is lower than 3.5, the exfoliation of an inner container causing particles and the like hardly occurs.

The method for adjusting Cr/Fe in the stainless steel is not particularly limited, and examples thereof include a method of adjusting the content of Cr atoms in the stainless steel, a method of performing electropolishing such that the chromium content in a passive layer on a polished surface becomes higher than the chromium content in the parent phase, and the like.

It is preferable that the interior of the aforementioned container is washed before the solution is stored into the container. As a liquid used for washing, the chemical liquid itself or a liquid obtained by diluting the chemical liquid is preferable. After being manufactured, the chemical liquid may be bottled using a container such as a gallon bottle or a quart bottle, transported, and stored. The gallon bottle may be formed of a glass material or other materials.

In order to prevent the change of the components in the solution during storage, purging may be performed in the interior of the container by using an inert gas (nitrogen, argon, or the like) having a purity equal to or higher than 99.99995% by volume. Particularly, a gas with small moisture content is preferable. The temperature at the time of transport and storage may be room temperature. However, in order to prevent alteration, the temperature may be controlled within a range of −20° C. to 30° C.

(Clean Room)

It is preferable that all of the manufacturing of the chemical liquid, the opening and/or washing of the container, the handling including storage of the solution, the treatment and analysis, and the measurement are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

[Use of Chemical Liquid]

The chemical liquid according to the above embodiment is preferably used for manufacturing semiconductors. Specifically, in a semiconductor device manufacturing process including a lithography step, an etching step, an ion implantation step, a peeling step, and the like, the chemical liquid is used for treating an organic substance after each step is finished or before the next step is started. Specifically, the chemical liquid is suitably used as a prewet solution, a developer, a rinsing solution, a peeling solution, and the like. For example, the chemical liquid can also be used for rinsing at the time of edge line of semiconductor substrates having been coated with resist.

Furthermore, the chemical liquid can also be used as a diluent of a resin contained in a resist solution (which will be described later). In addition, the chemical liquid may be diluted with another organic solvent and/or water, and the like.

The chemical liquid can also be suitably used for other uses in addition to the manufacturing of semiconductors. The chemical liquid can be used as a developer or a rinsing solution of polyimide, a resist for a sensor, a resist for a lens, and the like.

In addition, the chemical liquid can also be used as a solvent for medical uses or for washing. Particularly, the chemical liquid can be suitably used for washing containers, piping, substrates (for example, a wafer and glass), and the like.

Particularly, the chemical liquid according to the above embodiment is more preferably used for pre-wetting. That is, it is preferable that the chemical liquid according to the above embodiment is used as a prewet solution.

[Chemical Liquid Storage Body]

The chemical liquid storage body according to an embodiment of the present invention comprises a container and the chemical liquid stored in the container, in which a liquid contact portion contacting the chemical liquid in the container is formed of a nonmetallic material or stainless steel.

The nonmetallic material is not particularly limited, but is preferably at least one kind of nonmetallic material selected from the group consisting of a polyethylene resin, a polypropylene resin, a polyethylene-polypropylene resin, a polytetrafluoroethylene resin, a polytetrafluoroethylene-perfluoroalkyl vinyl ether copolymer, a polytetrafluoroethylene-hexafluoropropylene copolymer resin, a polytetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin. In a case where the chemical liquid storage body formed of the above nonmetallic material is stored for a long period of time, it is more difficult for the impurity metal and/or the organic impurity and the like to be eluted into the chemical liquid.

As the stainless steel, known stainless steel can be used without particular limitation. The aspect of the stainless steel is as described above regarding the liquid contact portion of the purification device.

[Pattern Forming Method]

It is preferable that the chemical liquid is used for forming a resist pattern (hereinafter, simply referred to as "pattern") used for manufacturing semiconductors. The pattern forming method in which the chemical liquid is used is not particularly limited, and examples thereof include known pattern forming methods.

Particularly, it is preferable that the pattern forming method includes the following steps.

(A) Pre-wetting step of coating substrate with chemical liquid so as to obtained pre-wetted substrate
(B) Resist film forming step of forming resist film on pre-wetted substrate by using actinic ray-sensitive or radiation-sensitive resin composition
(C) Exposure step of exposing resist film
(D) Development step of developing exposed resist film by using developer Hereinafter, the aspect of each of the steps will be described.

[(A) Pre-Wetting Step]

The pre-wetting step is a step of coating a substrate with the chemical liquid.

As the substrate, know substrates used for manufacturing semiconductors can be used without particular limitation. Examples of the substrate include an inorganic substrate such as silicon, $SiO_2$, or SiN, a coating-type inorganic substrate such as Spin On Glass (SOG), and the like, but the substrate is not limited to these.

Furthermore, the substrate may be a substrate with an antireflection film comprising an antireflection film. As the antireflection film, known organic or inorganic antireflection films can be used without particular limitation.

As the method for coating the substrate with the chemical liquid, known coating methods can be used without particular limitation. Particularly, as the coating method, spin coating is preferable because this method makes it possible to form a uniform resist film by using smaller amounts of the actinic ray-sensitive or radiation-sensitive resin composition in the resist film forming step which will be described later.

The thickness of a chemical liquid layer formed on the substrate by using the chemical liquid is not particularly limited. Generally, the thickness of the chemical liquid layer is preferably 0.001 to 10 μm, and more preferably 0.005 to 5 μm.

Provided that a resist solution, with which the substrate is to be coated, is a resist for ArF immersion exposure, and that the surface tension of the resist solution is 28.8 mN/m, although the surface tension of the mixture in the chemical liquid is not particularly limited, it is preferable to supply the chemical liquid to the wafer as a prewet solution by making the surface tension of the chemical liquid become higher than the surface tension of the resist solution.

Generally, the chemical liquid is supplied to the wafer by a method of moving a prewet nozzle to a position above the central portion of the wafer. Then, by opening or closing a valve, the chemical liquid is supplied to the wafer.

In a state where the wafer stands still, a predetermined amount of the chemical liquid is supplied to the central portion of the wafer from the prewet nozzle. Then, the wafer is rotated at a first speed V1 which is, for example, about 500 rotation per minute (rpm) such that the chemical liquid on the wafer spreads over the entire surface of the wafer. As a result, the entire surface of the wafer is wet with the chemical liquid.

Thereafter, the valve of a line connected to a resist solution is opened. As a result, the resist solution starts to be jetted from a resist nozzle, and the resist solution starts to be supplied to the central portion of the wafer. In this way, (B) resist film forming step (which will be described later) is started. In the resist film forming step, from the first speed V1, the rotation speed of the wafer is increased to a high speed which is a second speed V2 of about 2,000 to 4,000 rpm for example. The wafer rotating at the first speed V1 before the start of the resist film forming step is then gradually accelerated such that the speed continuously and smoothly changes. At this time, the acceleration of the rotation of the wafer is gradually increased from zero, for example. At the time when the resist film forming step ends, the acceleration of the rotation of the wafer is reduced such that the rotation speed of the wafer W smoothly reaches the second speed V2. In this way, during the resist film forming step, the rotation speed of the wafer changes such that the transition from the first speed V1 to the second speed V2 is represented by an S-shaped curve. In the resist film forming step, due to the centrifugal force, the resist solution supplied to the central portion of the wafer spreads over the entire surface of the wafer, whereby the surface of the wafer is coated with the resist solution.

The technique for saving resist by changing the rotation speed of a wafer at the time of resist coating is specifically described in JP2009-279476A.

The chemical liquid may be recycled. That is, the chemical liquid used in the pre-wetting step can be recovered and reused in the pre-wetting step for other wafers.

In a case where the chemical liquid is recycled, it is preferable to adjust the content of the impurity metal, the organic impurity, water, and the like contained in the recovered chemical liquid. The adjustment method is as described above regarding the manufacturing method of the chemical liquid.

<Affinity Between Chemical Liquid and Resin>

Regarding the affinity between the chemical liquid used in the pre-wetting step and the resin contained in the actinic ray-sensitive or radiation-sensitive resin composition which will be described later, there is no particular limitation. However, in view of making it possible to form a more uniform resist film by using smaller amounts of the actinic ray-sensitive or radiation-sensitive resin composition, it is preferable that the chemical liquid and the resin contained in the actinic ray-sensitive or radiation-sensitive resin composition satisfy the following relationship.

The chemical liquid and the resin (in a case where the actinic ray-sensitive or radiation-sensitive resin composition contains two or more kinds of resins, "mixture" of the resins is regarded as the resin; the content mass ratio of each of the resins in the mixture is the same as the content mass ratio of each of the resins in the actinic ray-sensitive or radiation-sensitive resin composition with respect to the total mass of the resins; the above resins do not include a hydrophobic resin which will be described later) preferably satisfy the following condition 1 and condition 2 at 25° C. In a case where the chemical liquid satisfies the following condition 1 and condition 2 at 25° C., it is possible to form a more uniform resist film by using smaller amounts of the actinic ray-sensitive or radiation-sensitive resin composition.

(Condition 1)

Rsq1 calculated by Equation 1 based on a proton spin-spin relaxation time measured for a chemical liquid and a first test solution formed of a resin and the chemical liquid by using a pulsed nuclear magnetic resonance-type particle interface characteristic evaluator is higher than 0.5.

$$Rsq1=(\tau 0/\tau 1)-1 \quad \text{(Equation 1)}$$

In Equation 1, $\tau 0$ represents a spin-spin relaxation time of the chemical liquid, and $\tau 1$ represents a spin-spin relaxation time of the first test solution. The resin contained in the first test solution is regarded as being dissolved in the chemical liquid.

Details of Condition 1 will be described.

First, the pulsed nuclear magnetic resonance-type particle interface characteristic evaluator is an evaluator adopting a method of observing the state of spin (magnetism) of a target. Examples of the pulsed nuclear magnetic resonance-type particle interface characteristic evaluator include "Acorn Area" manufactured by Xigo Nanotools, and the like.

The aforementioned evaluator measures a time (spin-spin relaxation time) taken for a measurement target to return to the normal state immediately after the application of energy thereto (excitation state). In the test solution (first test solution) in which the resin is dissolved in the chemical liquid, the spin-spin relaxation time changes by being affected by the type of organic solvent in the chemical liquid contacting the resin and the like.

It is unclear why the above change occurs. Presumably, this is because the amount of molecules of the organic solvent contacting the resin affects the spin-spin relaxation time.

It is considered that the amount of molecules of the organic solvent contacting the resin may change by being affected by the surface area of the resin, the wettability between the organic solvent and the resin, and the like. That is, presumably, the amount of the organic solvent molecules may reflect the strength of the interaction between the resin and the chemical liquid.

Rsq1 calculated by Equation 1 based on a proton spin-spin relaxation time is a parameter showing the compatibility between a resin and a chemical liquid.

$$Rsq1=(\tau 0/\tau 1)-1 \quad \text{(Equation 1)}$$

In a case where Rsq1 is higher than 0.5, the chemical liquid and the resin exhibit higher compatibility. The upper limit of Rsq1 is not particularly limited, but is preferably equal to or lower than 10.0 in general.

(Condition 2)

SRsq calculated by Equation 2 based on a proton spin-spin relaxation time measured for a second test solution, which is formed of the resin and the chemical liquid and in which the content of the resin is different from the content of the resin in the first test solution, and the first test solution by using a pulsed nuclear magnetic resonance-type particle interface characteristic evaluator is higher than −1.

$$SRsq=(Rsq2-Rsq1)/(c2-c1) \quad \text{(Equation 2)}$$

In Equation 2, Rsq1 represents a value calculated by Equation 1, and Rsq2 represents a value calculated by Equation 3. c1 and c2 represent the mass-based content of the resin in the first test solution and the second test solution respectively. The unit of the mass-based content is % by mass. The resin contained in the first test solution and the second test solution is regarded as being dissolved in the chemical liquid.

$$Rsq2=(\tau 0/\tau 2)-1 \quad \text{(Equation 3)}$$

41

In Equation 3, τ0 has the same definition as τ0 in Equation 1, and τ2 represents a spin-spin relaxation time of the second test solution.

Details of Condition 2 will be described.

In Equation 2, c1 and c2 represent the content of the resin (% by mass) in the first test solution and the second test solution respectively. As long as the resin is thoroughly dissolved in the first test solution and the second test solution, c1 and c2 are not particularly limited. For example, el may be 0.5% by mass, and c2 may be 3.0% by mass.

SRsq represents a rate of change of Rsq in a predetermined concentration range (c2-c1). SRsq is preferably higher than −1, and more preferably equal to or higher than 0. The upper limit of SRsq is not particularly limited, but is preferably equal to or lower than 10 in general. In a case where SRsq is higher than −1, the resin tends to remain more homogeneously dispersed in the chemical liquid, and it becomes more difficult for the resin to be aggregated.

[(B) Resist Film Forming Step]

The resist film forming step is a step of forming a resist film on the pre-wetted substrate (substrate comprising a chemical liquid layer) by using an actinic ray-sensitive or radiation-sensitive resin composition. Hereinafter, first, aspects of the actinic ray-sensitive or radiation-sensitive resin composition will be described.

<Actinic Ray-Sensitive or Radiation-Sensitive Resin Composition>

As the actinic ray-sensitive or radiation-sensitive resin composition which can be used in the resist film forming step, known actinic ray-sensitive or radiation-sensitive resin compositions can be used without particular limitation.

It is preferable that the actinic ray-sensitive or radiation-sensitive resin composition (hereinafter, referred to as "resist composition" as well) contains a resin (hereinafter, referred to as "acid-decomposable resin" as well in the present specification), which contains a repeating unit containing a group generating a polar group (a carboxy group, a phenolic hydroxyl group, or the like) by being decomposed by the action of an acid, and a compound (hereinafter, referred to as "photoacid generator" as well in the present specification) which generates an acid by the irradiation of actinic rays or radiation.

Particularly, in view of obtaining further improved effects of the present invention, the following resist compositions are preferable.

Resist composition containing resin represented by Formula (I) which will be described later Resist composition containing acid-decomposable resin having phenolic hydroxyl group which will be described later Resist composition containing hydrophobic resin, which will be described later, and acid-decomposable resin Hereinafter, each of the components of the resist compositions will be described.

(Acid-Decomposable Resin)

In an acid-decomposable group, a polar group is protected with a group dissociated by an acid (acid-dissociable group). Examples of the acid-dissociable group include —C($R_{36}$)($R_{37}$)($R_{38}$), —C($R_{36}$)($R_{37}$)(O$R_{39}$), —C($R_{01}$)($R_{02}$)(O$R_{39}$), and the like.

In the formulae, $R_{36}$ to $R_{39}$ each independently represent an alkyl group, a cycloalkyl group, an aryl group, an aralkyl group, or an alkenyl group. $R_{36}$ and $R_{37}$ may form a ring by being bonded to each other.

$R_{01}$ and $R_{02}$ each independently represent a hydrogen atom, an alkyl group, a cycloalkyl group, an aryl group, an aralkyl group, or an alkenyl group.

42

Examples of the acid-decomposable resin include a resin P having an acid-decomposable group represented by Formula (AI).

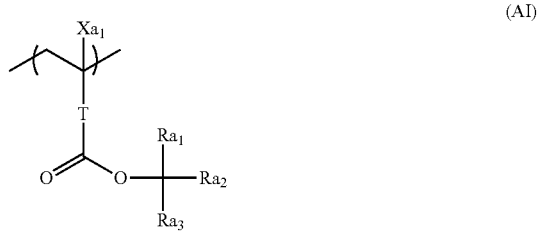

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may form a cycloalkyl group (monocyclic or polycyclic) by being bonded to each other.

Examples of the alkyl group represented by $Xa_1$ which may have a substituent include a methyl group and a group represented by —$CH_2$—$R_{11}$. $R_{11}$ represents a halogen atom (a fluorine atom or the like), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formula, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group represented by $Ra_1$ to $Ra_3$ preferably has 1 to 4 carbon atoms.

The cycloalkyl group represented by $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The cycloalkyl group formed by bonding of two groups out of $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group, and more preferably a monocyclic cycloalkyl group having 5 or 6 carbon atoms.

In the cycloalkyl group formed by bonding of two groups out of $Ra_1$ to $Ra_3$, for example, one methylene group constituting the ring may be substituted with a heteroatom such as an oxygen atom or a group having a heteroatom such as a carbonyl group.

As the repeating unit represented by Formula (AI), for example, an aspect is preferable in which $Ra_1$ is a methyl group or an ethyl group, and $Ra_2$ and $Ra_3$ form the aforementioned cycloalkyl group by being bonded to each other.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The total content of the repeating unit represented by Formula (AI) with respect to all the repeating units in the resin P is preferably 20 to 90 mol %, more preferably 25 to 85 mol %, and even more preferably 30 to 80 mol %.

Specific examples of the repeating unit represented by Formula (AI) will be shown below, but the present invention is not limited thereto.

In the specific examples, $R_X$ and $Xa_1$ each independently represent a hydrogen atom, $CH_3$, $CF_3$, or $CH_2OH$. Rxa and Rxb each represent an alkyl group having 1 to 4 carbon atoms. Z represents a substituent containing a polar group. In a case where there is a plurality of Z's, Z's are independent from each other. p represents 0 or a positive integer. Examples of the substituent represented by Z containing a polar group include a hydroxyl group, a cyano group, an amino group, an alkyl amide group, a sulfonamide group, and a linear or branched alkyl group or cycloalkyl group having these groups.

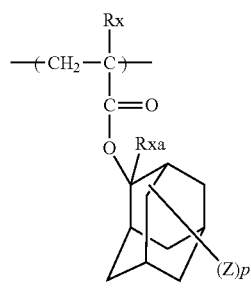

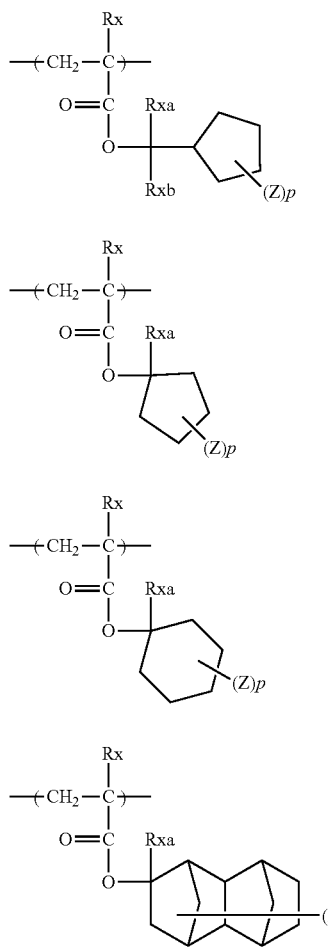

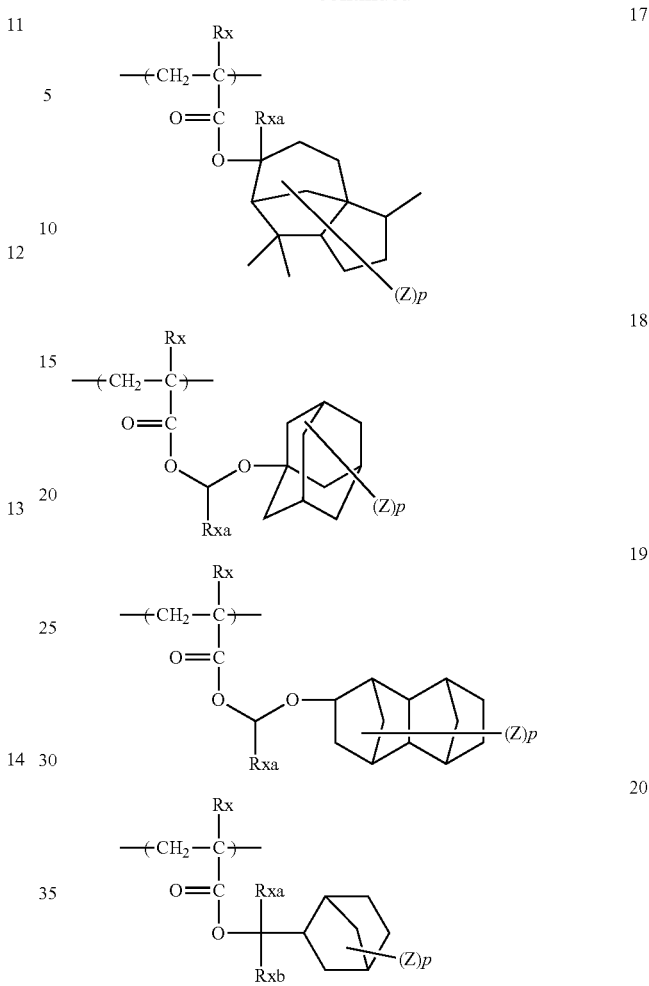

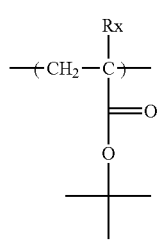

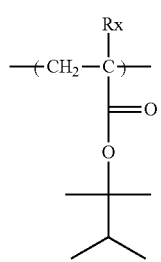

(Repeating Unit Having Lactone Structure)

It is preferable that the resin P contains a repeating unit Q having a lactone structure.

The repeating unit Q having a lactone structure preferably has a lactone structure on a side chain. For example, the repeating unit Q is more preferably a repeating unit derived from a (meth)acrylic acid derivative monomer.

One kind of repeating unit Q having a lactone structure may be used singly, or two or more kinds of repeating units Q may be used in combination. It is preferable to use one kind of repeating unit Q.

The content of the repeating unit Q having a lactone structure with respect to all the repeating units in the resin P is, for example, 3 to 80 mol %, and preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure has a repeating unit having a lactone structure represented by any of Formulae (LC1-1) to (LC1-17). As the lactone structure, a lactone structure represented by Formula (LC1-1), Formula (LC1-4), Formula (LC1-5), or Formula (LC1-8) is preferable, and a lactone structure represented by Formula (LC1-4) is more preferable.

-continued
| | |
|---|---|
| 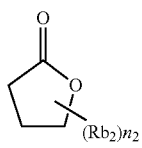 LC1-1 | 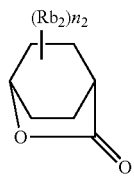 LC1-9 |
| 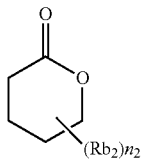 LC1-2 | 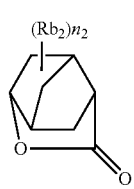 LC1-10 |
| 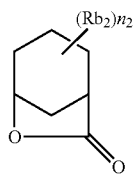 LC1-3 | 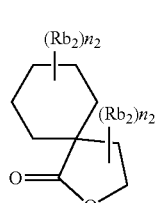 LC1-11 |
| 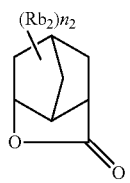 LC1-4 | 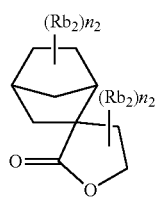 LC1-12 |
| 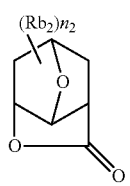 LC1-5 | LC1-13 |
| 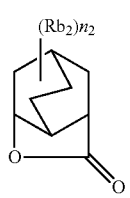 LC1-6 | 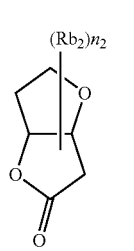 LC1-14 |
| 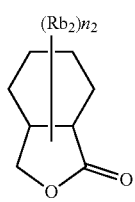 LC1-7 | 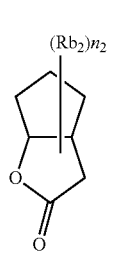 LC1-15 |
| 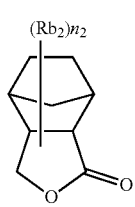 LC1-8 | 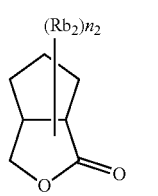 LC1-16 |
| | 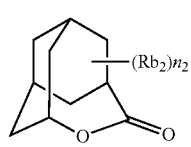 |

LC1-17

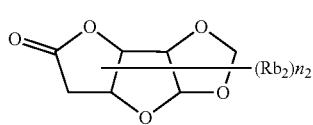

The lactone structure portion may have a substituent (Rb$_2$). As the substituent (Rb$_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. n$_2$ represents an integer of 0 to 4. In a case where n$_2$ is equal to or greater than 2, a plurality of substituents (Rb$_2$) may be the same as or different from each other, and a plurality of substituents (Rb$_2$) may form a ring by being bonded to each other.

The resin P is preferably a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e) (hereinafter, this resin will be referred to as "resin represented by Formula (I)" as well).

The resin represented by Formula (I) is a resin whose solubility in a developer (chemical liquid which will be described later), which contains an organic solvent as a main component is reduced, by the action of an acid. The resin contains an acid-decomposable group. In the chemical liquid, the resin represented by Formula (I) is excellently dissolved. Therefore, the chemical liquid makes it easy to obtain a uniform resist film by using smaller amounts of the resist composition. Hereinafter, the resin represented by Formula (I) will be described.

Resin Represented by Formula (I)

(a)
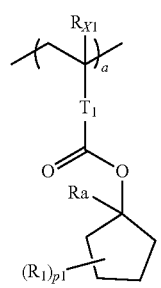

(b)
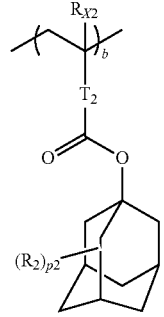

(c)
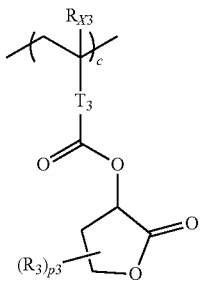

(d)
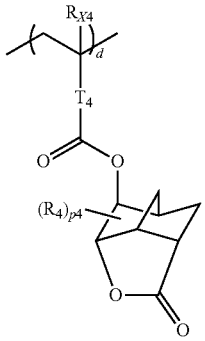

(e)
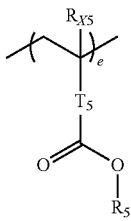

Formula (I) is constituted with a repeating unit (a) (repeating unit represented by Formula (a)), a repeating unit (b) (repeating unit represented by Formula (b)), a repeating unit (c) (repeating unit represented by Formula (c)), a repeating unit (d) (repeating unit represented by Formula (d)), and a repeating unit (e) (repeating unit represented by Formula (e)).

In Formula (I), $R_{x1}$ to $R_{x5}$ each independently represent a hydrogen atom or an alkyl group which may have a substituent.

$R_1$ to $R_4$ each independently represent a monovalent substituent, and p1 to p4 each independently represent 0 or a positive integer.

Ra represents a linear or branched alkyl group.

$T_1$ to $T_5$ each independently represent a single bond or a divalent linking group.

$R_5$ represents a monovalent organic group.

a to e each represent mol %. a to e each independently represent a number included in a range of 0≤a≤100, 0≤b≤100, 0≤c<100, 0≤d<100, and 0≤e<100. Here, a+b+c+d+e=100, and a+b≠0.

In Formula (I), the repeating unit (e) has a structure different from all of the repeating units (a) to (d).

Examples of the alkyl group represented by $R_{x1}$ to $R_{x5}$ that may have a substituent include a methyl group and a group represented by —CH$_2$—R$_{11}$. R$_{11}$ represents a halogen atom (a fluorine atom or the like), a hydroxyl group, or a monovalent organic group.

$R_{x1}$ to $R_{x5}$ preferably each independently represent a hydrogen atom, a methyl group, a trifluoromethyl group, or a hydroxymethyl group.

Examples of the divalent linking group represented by $T_1$ to $T_5$ in Formula (I) include an alkylene group, a —COO-Rt- group, a —O-Rt- group, and the like. In the formula, Rt represents an alkylene group or a cycloalkylene group.

$T_1$ to $T_5$ preferably each independently represent a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

In Formula (I), Ra represents a linear or branched alkyl group. Examples thereof include a methyl group, an ethyl group, a t-butyl group, and the like. Among these, a linear or branched alkyl group having 1 to 4 carbon atoms is preferable.

In Formula (I), $R_1$ to $R_4$ each independently represent a monovalent substituent. $R_1$ to $R_4$ are not particularly limited, and examples thereof include a hydroxyl group, a cyano group, and a linear or branched alkyl or cycloalkyl group having a hydroxyl group, a cyano group, and the like.

In Formula (I), p1 to p4 each independently represent 0 or a positive integer. The upper limit of p1 to p4 equals the number of hydrogen atoms which can be substituted in each repeating unit.

In Formula (I), $R_5$ represents a monovalent organic group. $R_5$ is not particularly limited, and examples thereof include a monovalent organic group having a sultone structure, a monovalent organic group having a cyclic ether such as tetrahydrofuran, dioxane, 1,4-thioxane, dioxolane, and 2,4,6-trioxabicyclo[3.3.0]octane, and an acid-decomposable group (for example, an adamantyl group quaternized by the substitution of carbon in a position bonded to a —COO group with an alkyl group).

The repeating unit (b) in Formula (I) is preferably formed of the monomer described in paragraphs [0014] to [0018] in JP2016-138219A.

In Formula (I), a to e each represent mol %. a to e each independently represent a number included in a range of $0 \le a \le 100$, $0 \le b \le 100$, $0 \le c < 100$, $0 \le d < 100$, and $0 \le e < 100$. Here, $a+b+c+d+e=100$, and $a+b \ne 0$.

In Formula (I), a+b (the content of the repeating unit having an acid-decomposable group with respect to all the repeating units) is preferably 20 to 90 mol %, more preferably 25 to 85 mol %, and even more preferably 30 to 80 mol %.

Furthermore, in Formula (I), c+d (the content of the repeating unit having a lactone structure with respect to all the repeating units) is preferably 3 to 80 mol %, and more preferably 3 to 60 mol %.

One kind of each of the repeating unit (a) to repeating unit (e) may be used singly, or two or more kinds of each of the repeating unit (a) to repeating unit (e) may be used in combination. In a case where two or more kinds of repeating units are used in combination, the total content of each repeating unit is preferably within the above range.

The weight-average molecular weight (Mw) of the resin represented by Formula (I) is preferably 1,000 to 200,000 in general, more preferably 2,000 to 20,000, and even more preferably 3,000 to 15,000. The weight-average molecular weight is determined by Gel Permeation Chromatography (GPC) by using tetrahydrofuran (THF) as a developing solvent, and expressed in terms of polystyrene.

In the actinic ray-sensitive or radiation-sensitive resin composition, the content of the resin represented by Formula (I) based on the total solid content of the actinic ray-sensitive or radiation-sensitive resin composition is preferably 30% to 99% by mass in general, and more preferably 50% to 95% by mass.

(Repeating Unit Having Phenolic Hydroxyl Group)

The resin P may contain a repeating unit having a phenolic hydroxyl group.

Examples of the repeating unit having a phenolic hydroxyl group include a repeating unit represented by General Formula (I).

In the formula, $R_{41}$, $R_{42}$, and $R_{43}$ each independently represent a hydrogen atom, an alkyl group, a halogen atom, a cyano group, or an alkoxycarbonyl group. Here, $R_{42}$ and $Ar_4$ may form a ring by being bonded to each other. In this case, $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or an alkylene group.

$Ar_4$ represents an (n+1)-valent aromatic ring group. In a case where $Ar_4$ forms a ring by being bonded to $R_{42}$, $Ar_4$ represents an (n+2)-valent aromatic ring group.

n represents an integer of 1 to 5.

The alkyl group represented by $R_{41}$, $R_{42}$, and $R_{43}$ in General Formula (I) is preferably an alkyl group having 20 or less carbon atoms such as a methyl group, an ethyl group, a propyl group, an isopropyl group, a n-butyl group, a sec-butyl group, a hexyl group, a 2-ethylhexyl group, an octyl group, or a dodecyl group which may have a substituent, more preferably an alkyl group having 8 or less carbon atoms, and even more preferably an alkyl group having 3 or less carbon atoms.

The cycloalkyl group represented by $R_{41}$, $R_{42}$, and $R_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group which may have a substituent.

Examples of the halogen atom represented by $R_{41}$, $R_{42}$, and $R_{43}$ in General Formula (I) include a fluorine atom, a chlorine atom, a bromine atom, and an iodine atom. Among these, a fluorine atom is preferable.

As the alkyl group contained in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

Examples of the substituent in each of the above groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, and the like. The number of carbon atoms in the substituent is preferably equal to or smaller than 8.

$Ar_4$ represents an (n+1)-valent aromatic ring group. Examples of a divalent aromatic ring group obtained in a case where n is 1 include an arylene group having 6 to 18 carbon atoms such as a phenylene group, a tolylene group, a naphthylene group, or an anthracenylene group which may have a substituent and an aromatic ring group containing a hetero ring such as thiophene, furan, pyrrole, benzothiophene, benzofuran, benzopyrrole, triazine, imidazole, benzimidazole, triazole, thiadiazole, or thiazole.

Specific examples of the (n+1)-valent aromatic ring group obtained in a case where n is an integer equal to or greater than 2 include groups obtained by removing (n−1) pieces of any hydrogen atoms from the specific examples of the divalent aromatic ring group described above.

The (n+1)-valent aromatic ring group may further have a substituent.

Examples of the substituent that the alkyl group, the cycloalkyl group, the alkoxycarbonyl group, the alkylene group, and the (n+1)-valent aromatic ring group described above can include the alkyl group exemplified as $R_{41}$, $R_{42}$, and $R_{43}$ in General Formula (I); an alkoxy group such as a methoxy group, an ethoxy group, a hydroxyethoxy group, a propoxy group, a hydroxypropoxy group, or a butoxy group; and an aryl group such as a phenyl group.

Examples of the alkyl group represented by $R_{64}$ in —$CONR_{64}$— ($R_{64}$ represents a hydrogen atom or an alkyl group) represented by $X_4$ include an alkyl group having 20 or less carbon atoms such as a methyl group, an ethyl group, a propyl group, an isopropyl group, a n-butyl group, a sec-butyl group, a hexyl group, a 2-ethylhexyl group, an octyl group, or a dodecyl group which may have a substituent. Among these, an alkyl group having 8 or less carbon atoms is more preferable.

$X_4$ is preferably a single bond, —COO—, or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, or an octylene group which may have a substituent.

$Ar_4$ is preferably an aromatic ring group having 6 to 18 carbon atoms that may have a substituent, and more preferably a benzene ring group, a naphthalene ring group, or a biphenylene ring group.

It is preferable that the repeating unit represented by General Formula (I) comprises a hydroxystyrene structure. That is, $Ar_4$ is preferably a benzene ring group.

The repeating unit having a phenolic hydroxyl group is preferably a repeating unit represented by General Formula (p1).

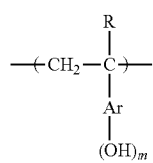

(p1)

R in General Formula (p1) represents a hydrogen atom, a halogen atom, or a linear or branched alkyl group having 1 to 4 carbon atoms. A plurality of R's may be the same as or different from each other. As R in General Formula (p1), a hydrogen atom is preferable.

Ar in General Formula (p1) represents an aromatic ring, and examples thereof include an aromatic hydrocarbon ring having 6 to 18 carbon atoms that may have a substituent, such as a benzene ring, a naphthalene ring, an anthracene ring, a fluorene ring, or a phenanthrene ring, and an aromatic hetero ring containing a hetero ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring. Among these, a benzene ring is more preferable.

m in General Formula (p1) represents an integer of 1 to 5. m is preferably 1.

Specific examples of the repeating unit having a phenolic hydroxyl group will be shown below, but the present invention is not limited thereto. In the formulae, a represents 1 or 2.

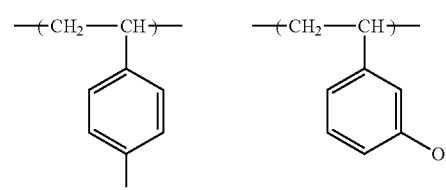

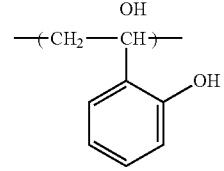

(B-1)

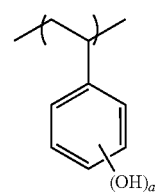

(B-2)

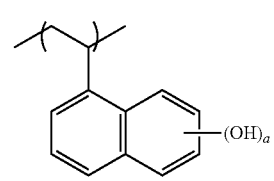

(B-3)

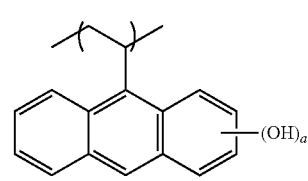

(B-4)

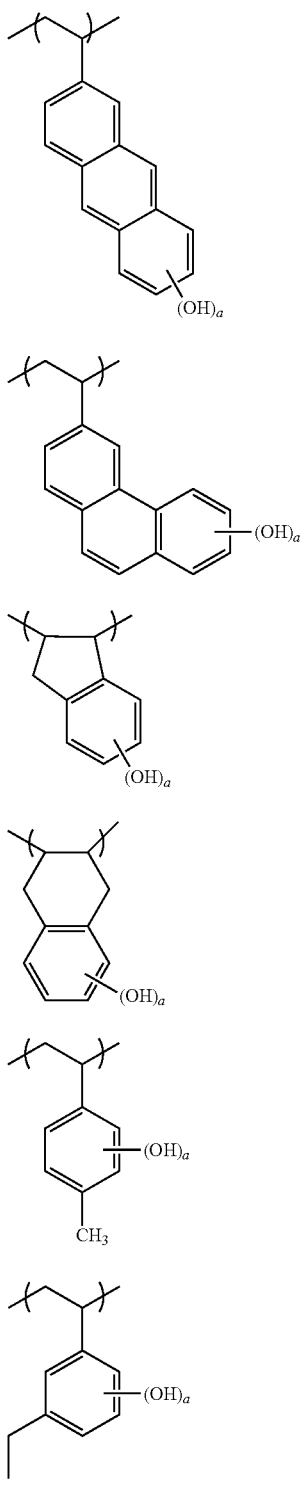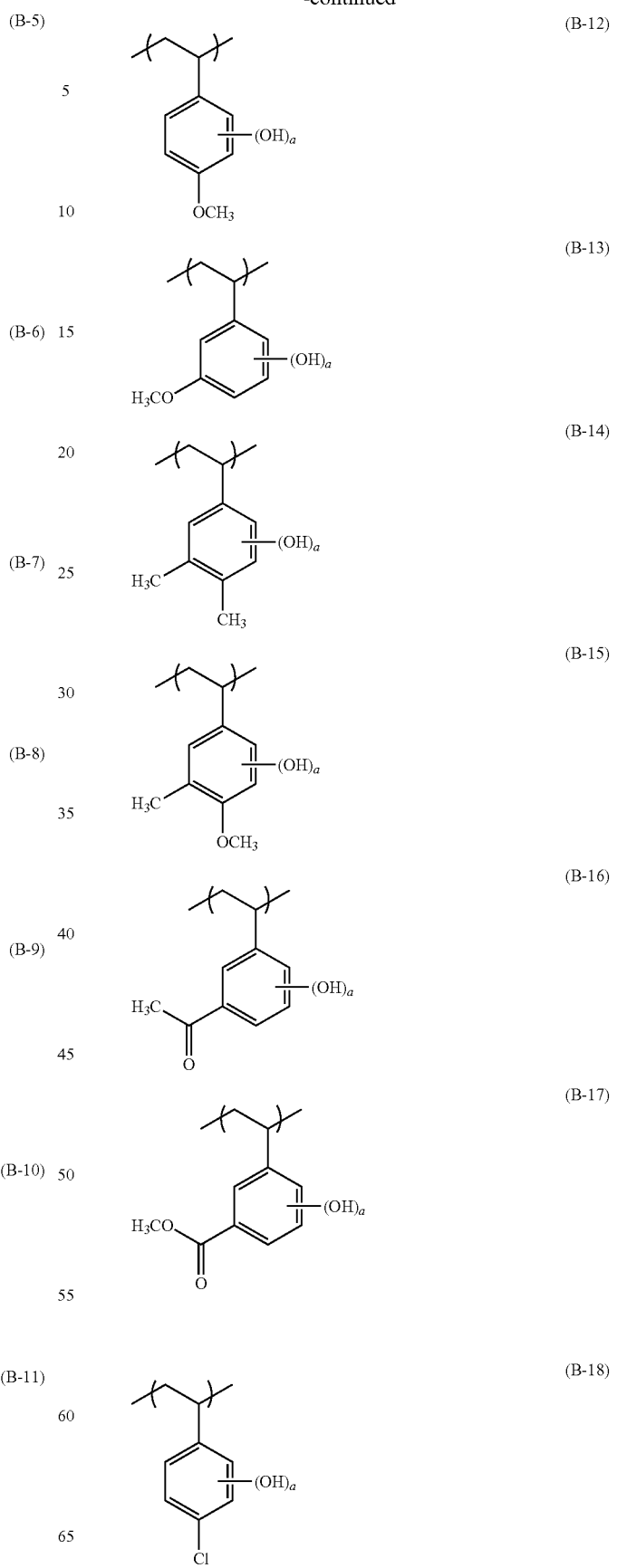

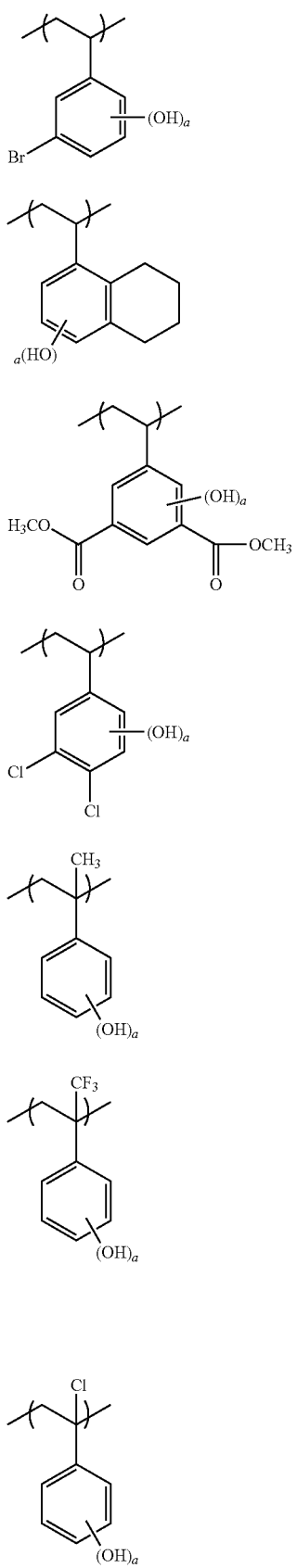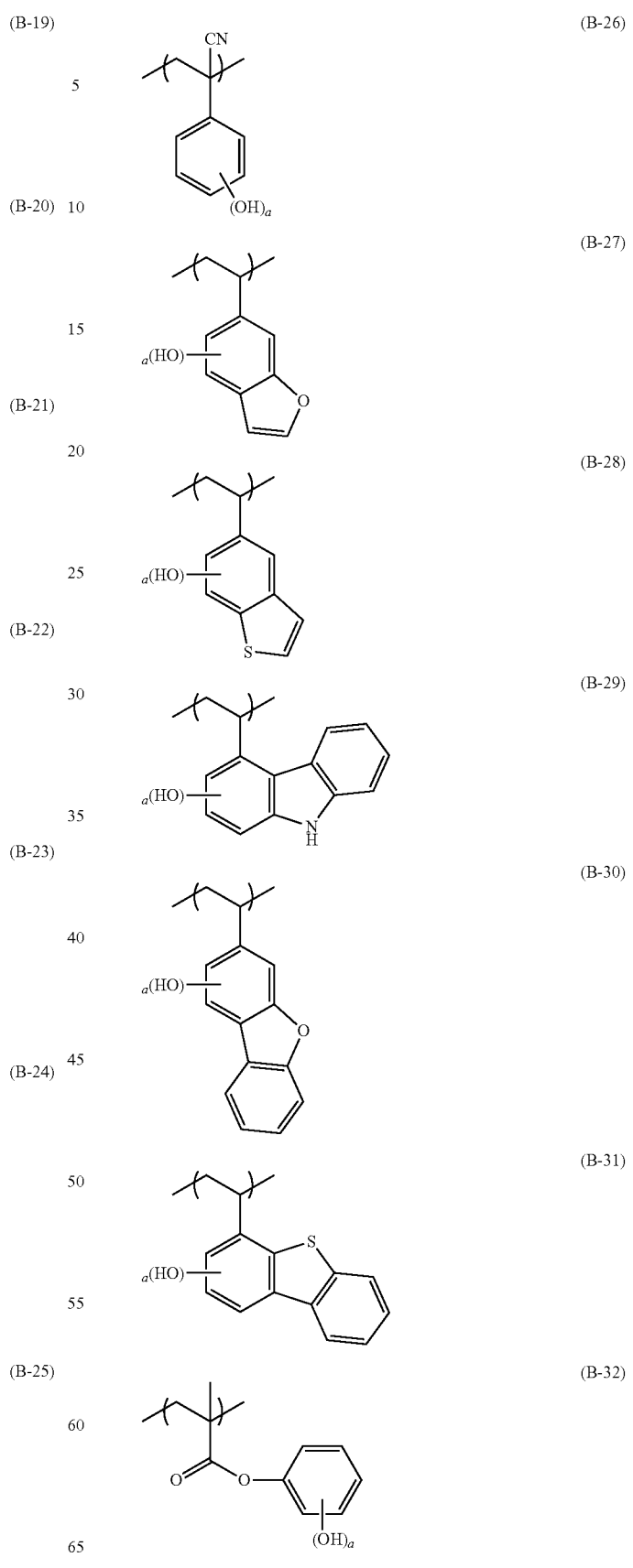

-continued

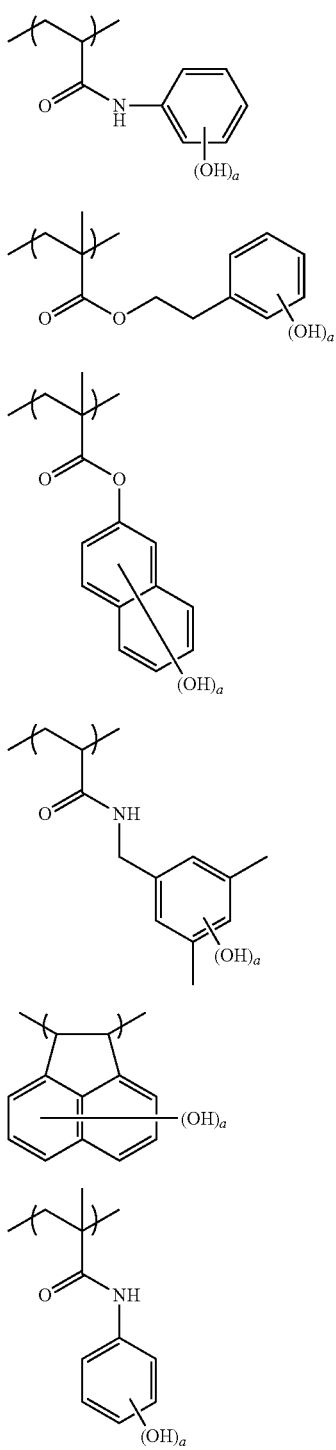

(B-33)
(B-34)
(B-35)
(B-36)
(B-37)
(B-38)

The content of the repeating unit having a phenolic hydroxyl group with respect to all the repeating units in the resin P is preferably 0 to 50 mol %, more preferably 0 to 45 mol %, and even more preferably 0 to 40 mol %.

(Repeating Unit Containing Organic Group Having Polar Group)

The resin P may further contain a repeating unit containing an organic group having a polar group, particularly, a repeating unit having an alicyclic hydrocarbon structure substituted with a polar group.

In a case where the resin P further contains such a repeating unit, the substrate adhesiveness and the affinity with a developer are improved. As the alicyclic hydrocarbon structure of the alicyclic hydrocarbon structure substituted with a polar group, an adamantyl group, a diamantyl group, or a norbornane group is preferable. As the polar group, a hydroxyl group or a cyano group is preferable.

Specific examples of the repeating unit having a polar group will be shown below, but the present invention is not limited thereto.

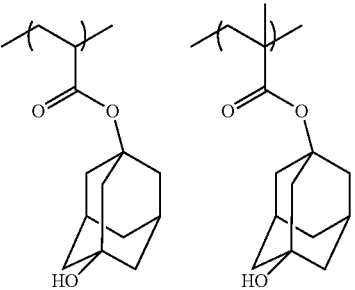

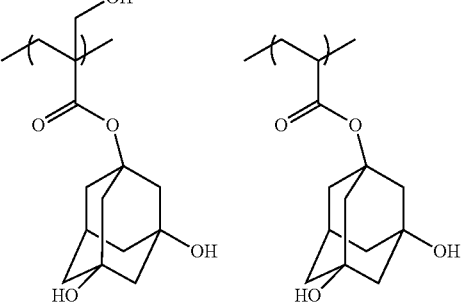

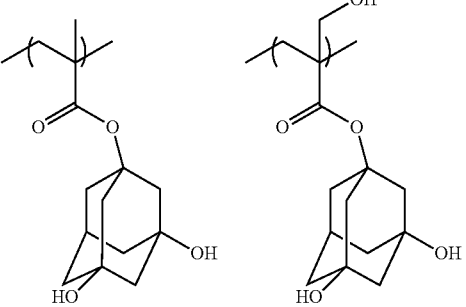

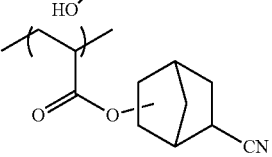

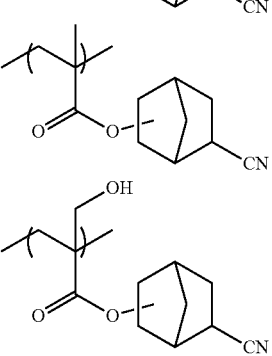

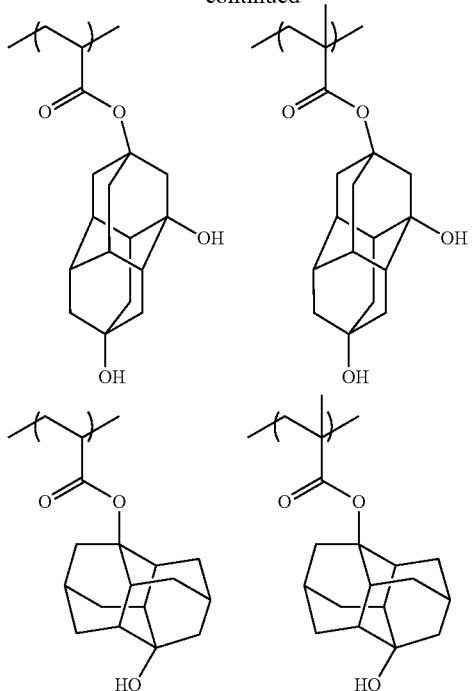

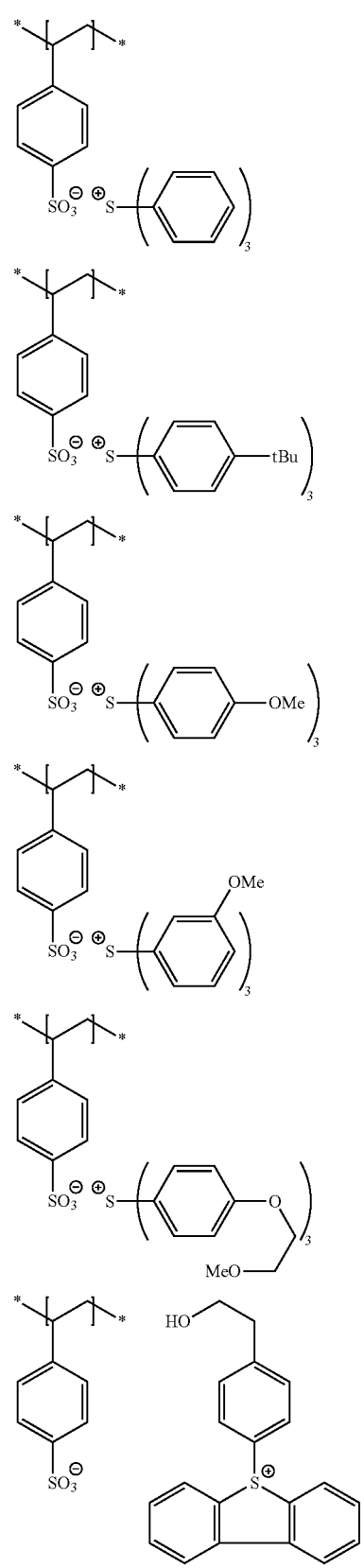

In a case where the resin P contains the repeating unit containing an organic group having a polar group, the content of the repeating unit with respect to all the repeating units in the resin P is preferably 1 to 50 mol %, more preferably 1 to 30 mol %, even more preferably 5 to 25 mol %, and particularly preferably 5 to 20 mol %.

(Repeating Unit Having Group (Photoacid Generating Group) Generating Acid by Irradiation of Actinic Rays or Radiation)

The resin P may contain a repeating unit having a group (photoacid generating group) generating an acid by the irradiation of actinic rays or radiation.

Examples of the repeating unit having a group (photoacid generating group) generating an acid by the irradiation of actinic rays or radiation include a repeating unit represented by Formula (4).

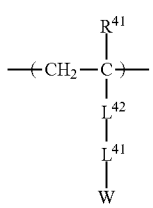
(4)

$R^{41}$ represents a hydrogen atom or a methyl group. $L^{41}$ represents a single bond or a divalent linking group. $L^{42}$ represents a divalent linking group. W represents a structural moiety generating an acid on a side chain by being decomposed by the irradiation of actinic rays or radiation.

Specific examples of the repeating unit represented by Formula (4) will be shown below, but the present invention is not limited thereto.

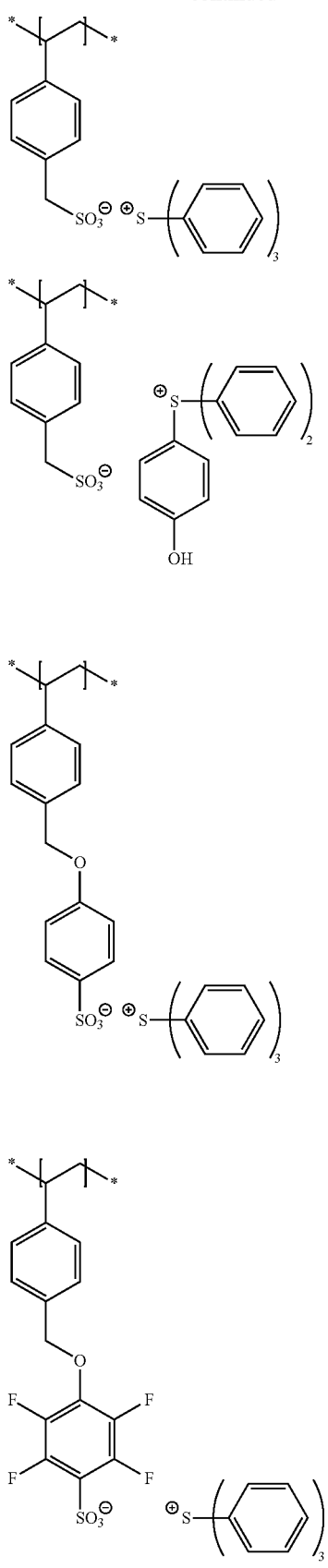
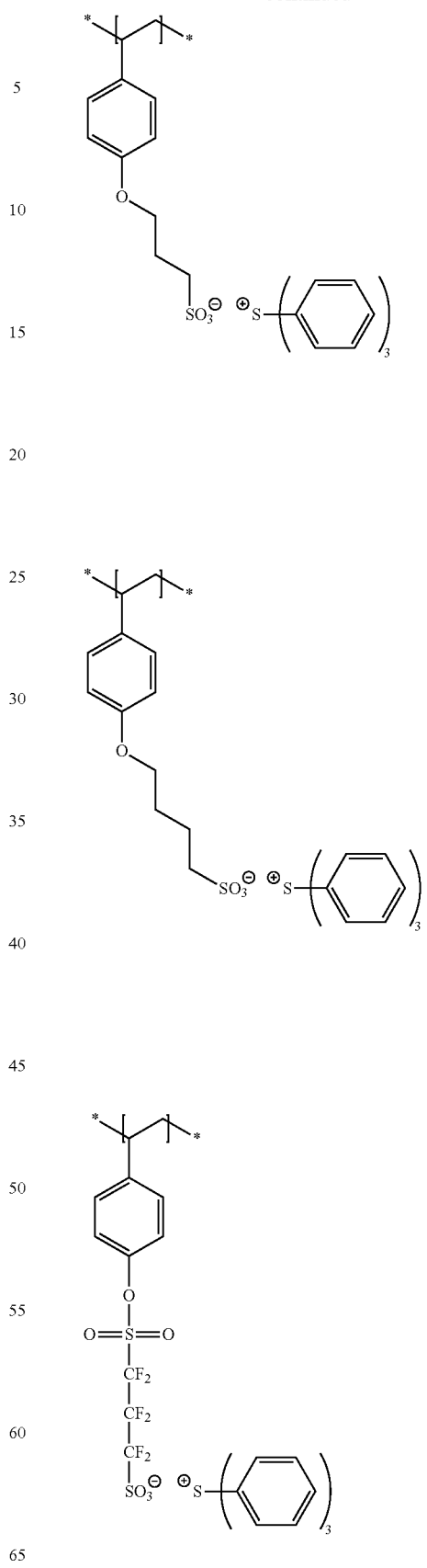

-continued

[Chemical structure showing polymer with phenyl, sulfonyl, CF2 groups and triphenylsulfonium counterion]

Examples of the repeating unit represented by Formula (4) also include the repeating units described in paragraphs [0094] to [0105] in JP2014-041327A.

In a case where the resin P contains the repeating unit having a photoacid generating group, the content of the repeating unit having a photoacid generating group with respect to all the repeating units in the resin P is preferably 1 to 40 mol %, more preferably 5 to 35 mol %, and even more preferably 5 to 30 mol %.

The resin P may contain a repeating unit represented by Formula (VI).

$$\begin{array}{c} R_{61} \quad R_{63} \\ | \quad\quad | \\ -(C-C)- \\ | \quad\quad | \\ R_{62} \quad X_6 \\ \quad\quad | \\ \quad\quad L_6 \\ \quad\quad | \\ \quad\quad Ar_6 \\ \quad\quad | \\ \quad\quad (O-Y_2)_n \end{array} \quad (VI)$$

In Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may form a ring by being bonded to $Ar_6$, and in this case, $R_{62}$ represents a single bond or an alkylene group.

$X_6$ represents a single bond, —COO—, or —CONR$_{64}$—.

$R_{64}$ represents a hydrogen atom or an alkyl group.

$L_6$ represents a single bond or an alkylene group.

$Ar_6$ represents an (n+1)-valent aromatic ring group. In a case where $Ar_6$ forms a ring by being bonded to $R_{62}$, $Ar_6$ represents an (n+2)-valent aromatic ring group.

In a case where n≥2, $Y_2$ each independently represents a hydrogen atom or a group which is dissociated by the action of an acid. Here, at least one of $Y_2$'s represents a group which is dissociated by the action of an acid.

n represents an integer of 1 to 4.

As the group $Y_2$ which is dissociated by the action of an acid, a structure represented by Formula (VI-A) is preferable.

$$\begin{array}{c} L_1 \\ | \\ -C-O-M-Q \\ | \\ L_2 \end{array} \quad (VI\text{-}A)$$

$L_1$ and $L_2$ each independently represent a hydrogen atom, an alkyl group, a cycloalkyl group, an aryl group, or a group obtained by combining an alkylene group and an aryl group.

M represents a single bond or a divalent linking group.

Q represents an alkyl group, a cycloalkyl group which may contain a heteroatom, an aryl group which may contain a heteroatom, an amino group, an ammonium group, a mercapto group, a cyano group, or an aldehyde group.

At least two out of Q, M, and $L_1$ may form a ring (preferably a 5- or 6-membered ring) by being bonded to each other.

The repeating unit represented by Formula (VI) is preferably a repeating unit represented by Formula (3).

$$*-(CH_2-\overset{H}{\underset{|}{C}})-* \quad\quad \overset{H}{\underset{R_3}{|}} \\ Ar_3-O-\overset{|}{\underset{}{}}-O-M_3-Q_3 \quad (3)$$

In Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two out of $Q_3$, $M_3$, and $R_3$ may form a ring by being bonded to each other.

The aromatic ring group represented by $Ar_3$ is the same as $Ar_6$ in Formula (VI) in a case where n in Formula (VI) is 1. $Ar_3$ is more preferably a phenylene group or a naphthylene group, and even more preferably a phenylene group.

Specific examples of the repeating unit represented by Formula (VI) will be shown below, but the present invention is not limited thereto.

[Chemical structure VI-1: polymer with phenyl group bearing O-tert-butyl substituent]

(VI-1)

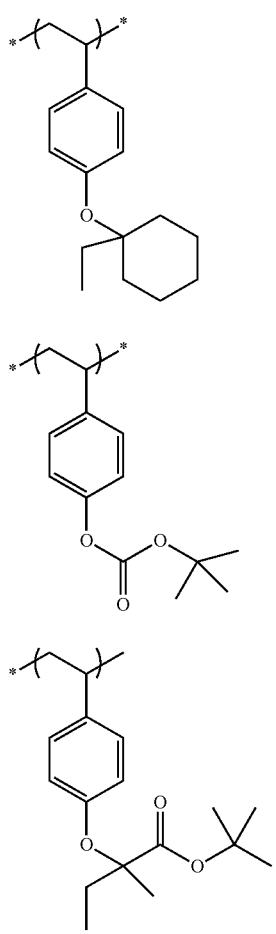
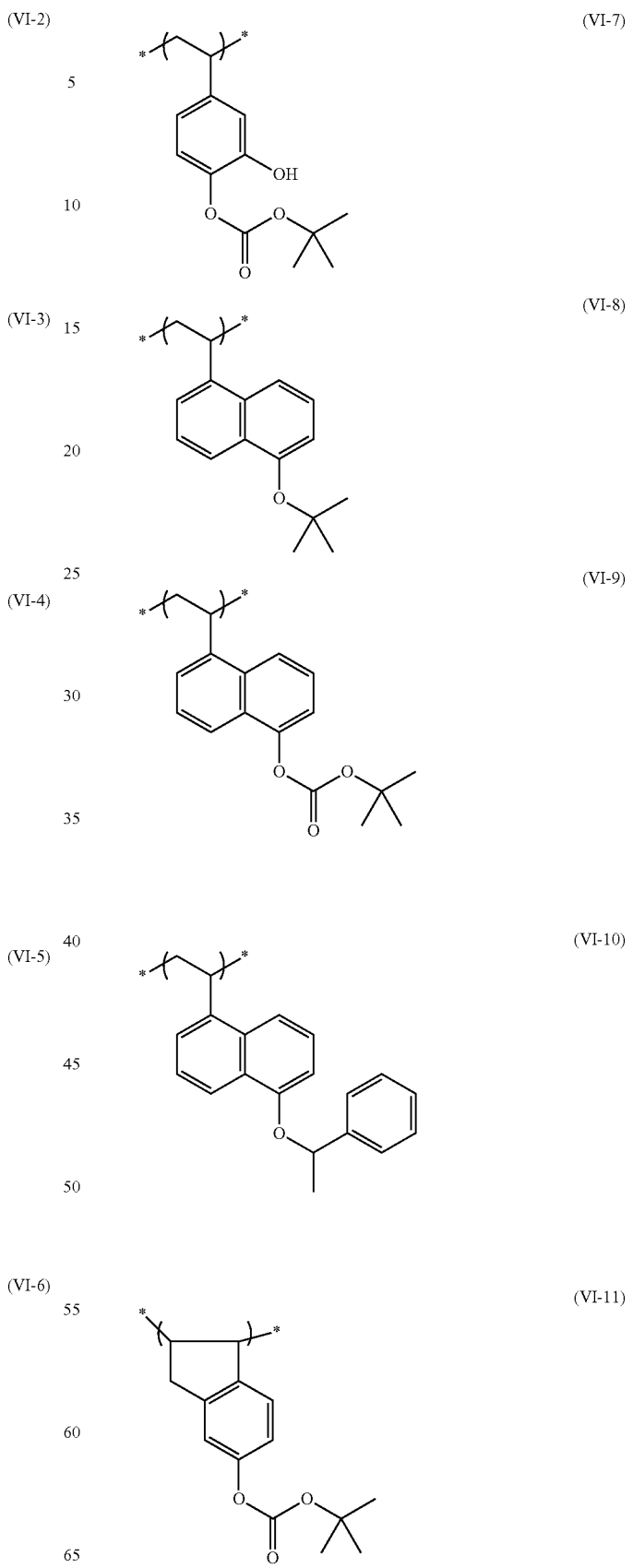

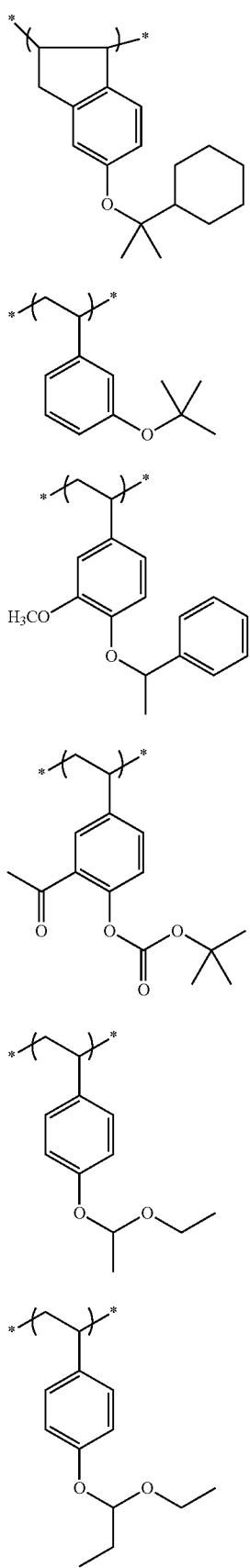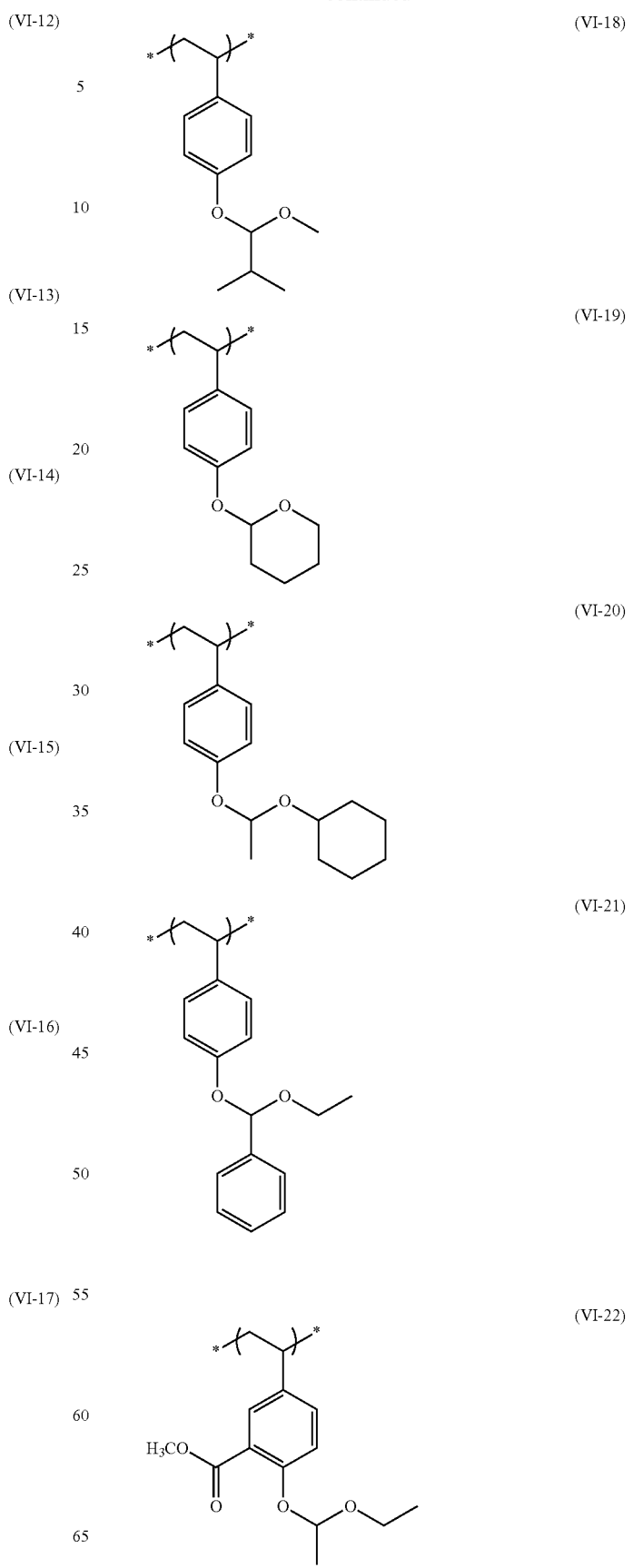

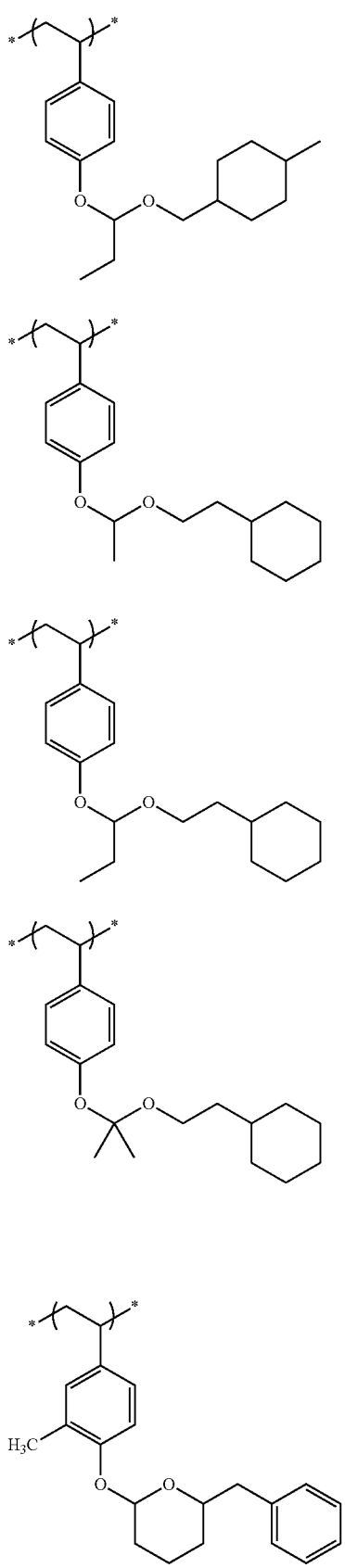
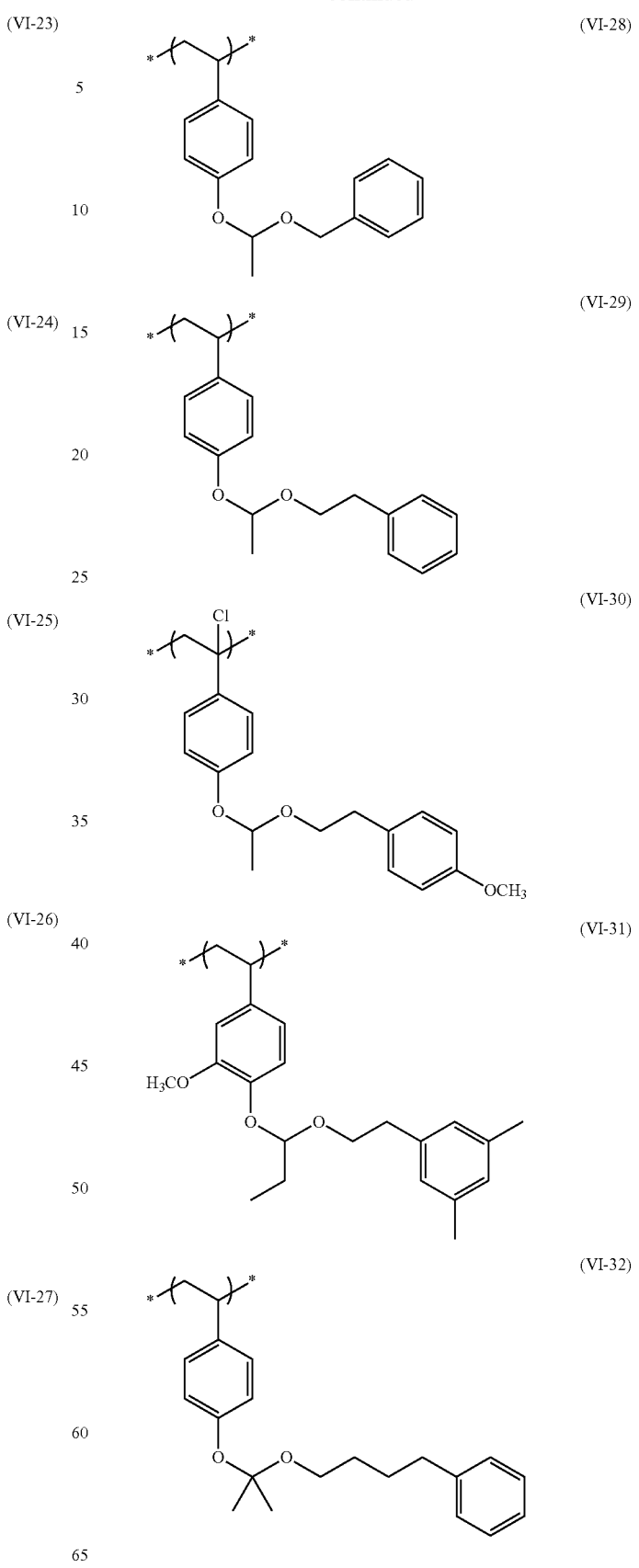

-continued (VI-33)
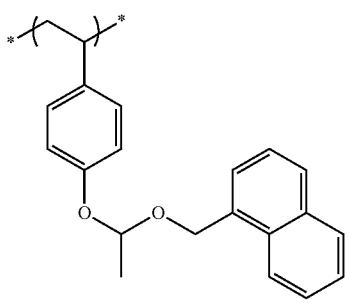

(VI-34)
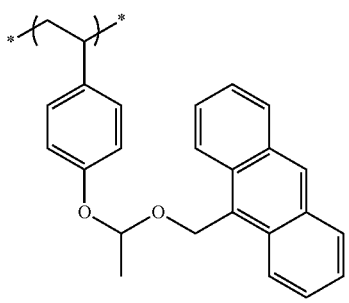

(VI-35)
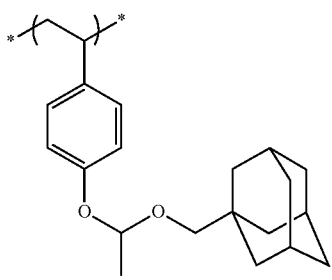

(VI-36)
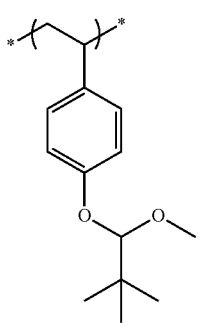

The resin P may contain a repeating unit represented by Formula (4).

(4)
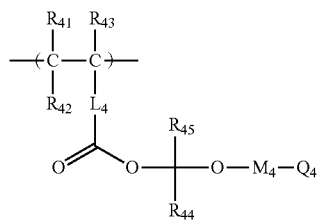

In Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ and $L_4$ may form a ring by being bonded to each other, and in this case, $R_{42}$ represents an alkylene group.

$L_4$ represents a single bond or a divalent linking group. In a case where $L_4$ forms a ring together with $R_{42}$, $L_4$ represents a trivalent linking group.

$R_{44}$ and $R_{45}$ each represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two out of $Q_4$, $M_4$, and $R_{44}$ may form a ring by being bonded to each other.

$R_{41}$, $R_{42}$, and $R_{43}$ have the same definition as $R_{41}$, $R_{42}$, and $R_{43}$ in Formula (IA), and the preferable range thereof is also the same.

$L_4$ has the same definition as T in Formula (AI), and the preferable range thereof is also the same.

$R_{44}$ and $R_{45}$ have the same definition as $R_3$ in Formula (3), and the preferable range thereof is also the same.

$M_4$ has the same definition as $M_3$ in Formula (3), and the preferable range thereof is also the same.

$Q_4$ has the same definition as $Q_3$ in Formula (3), and the preferable range thereof is also the same.

Examples of the ring formed by bonding of at least two out of $Q_4$, $M_4$, and $R_{44}$ include a ring formed by bonding of at least two out of $Q_3$, $M_3$, and $R_3$, and the preferable range thereof is also the same.

Specific examples of the repeating unit represented by Formula (4) will be shown below, but the present invention is not limited thereto.

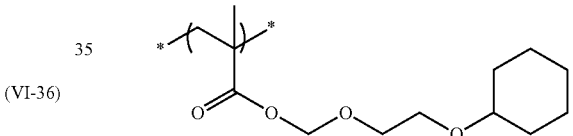

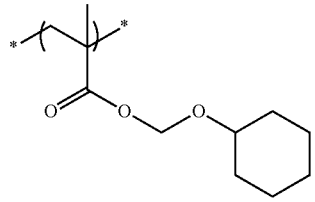

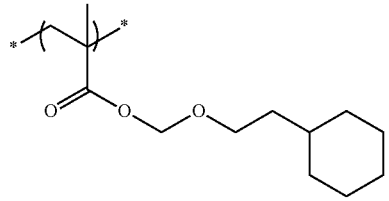

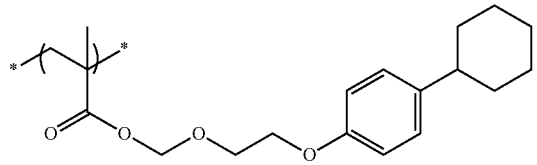

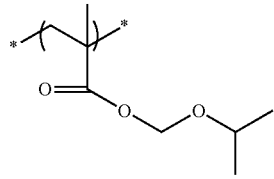

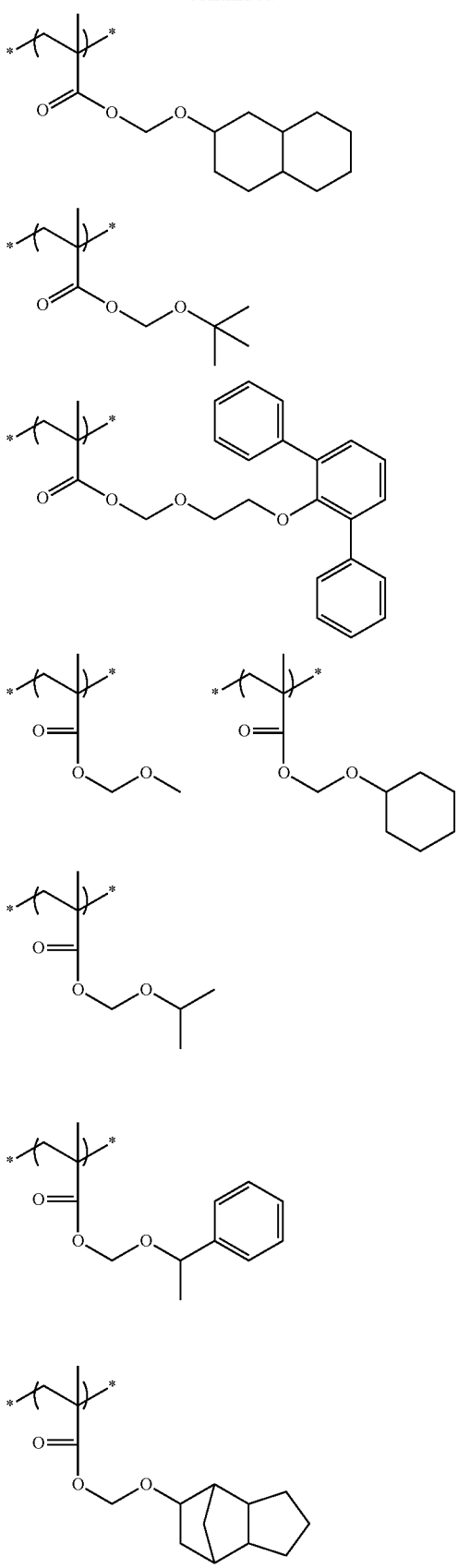

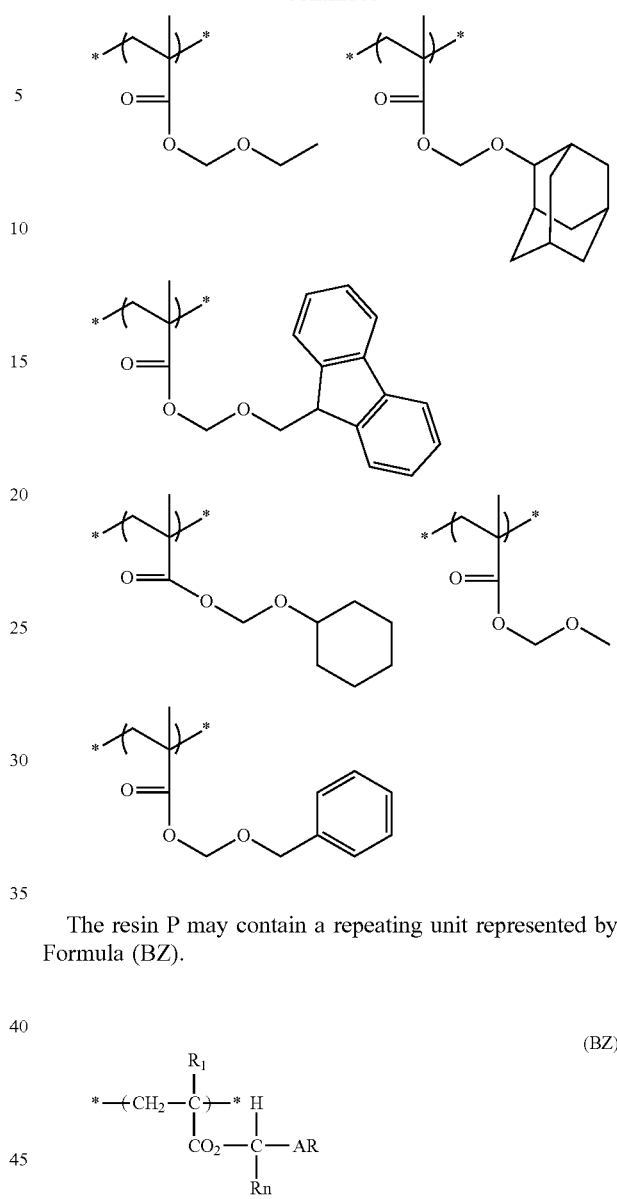

The resin P may contain a repeating unit represented by Formula (BZ).

$$*-(CH_2-\underset{\underset{CO_2-\underset{Rn}{C}-AR}{|}}{\overset{R_1}{C}})-* \; H$$
(BZ)

In Formula (BZ), AR represents an aryl group. Rn represents an alkyl group, a cycloalkyl group, or an aryl group. Rn and AR may form a nonaromatic ring by being bonded to each other.

R₁ represents a hydrogen atom, an alkyl group, a cycloalkyl group, a halogen atom, a cyano group, or an alkyloxycarbonyl group.

Specific examples of the repeating unit represented by Formula (BZ) will be shown below, but the present invention is not limited thereto.

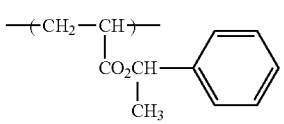

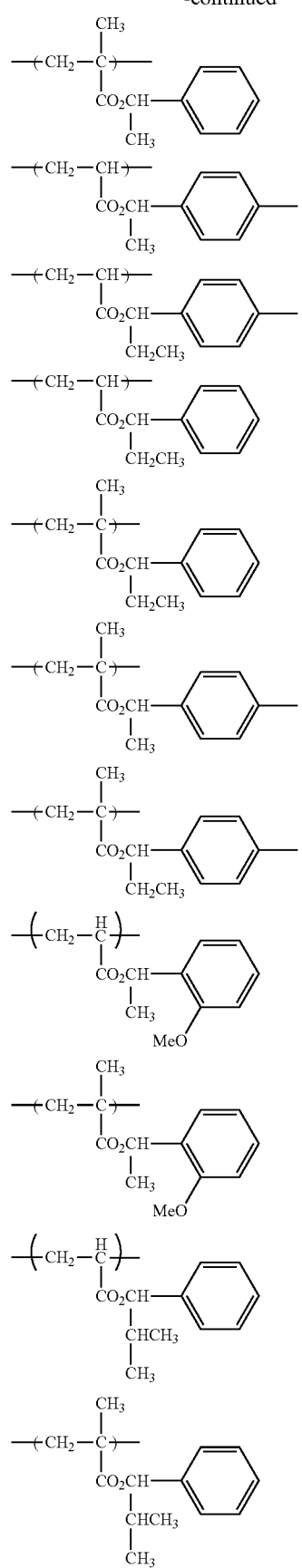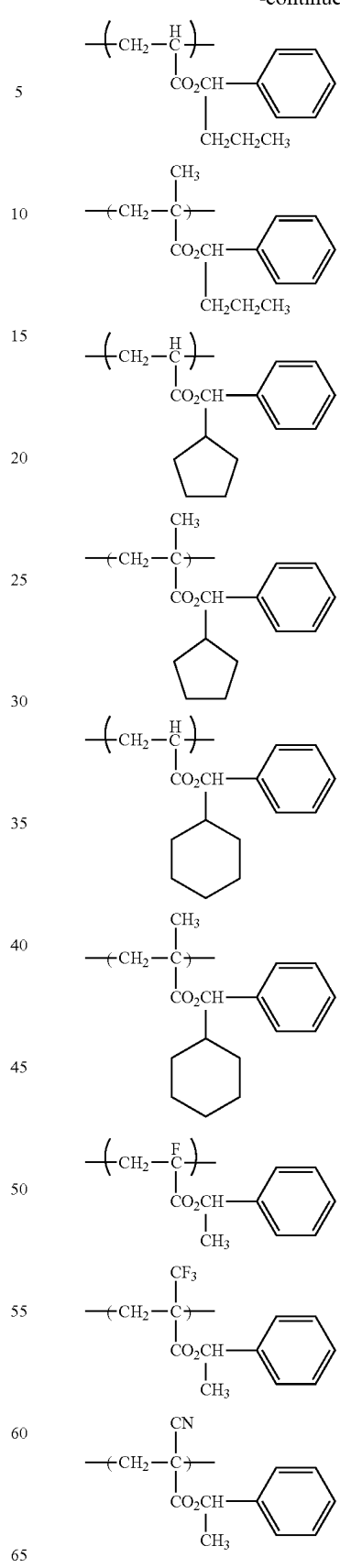

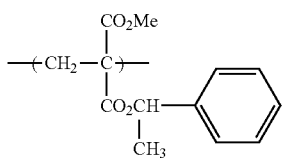

In the resin P, the content of the repeating unit having an acid-decomposable group (total content in a case where the resin P contains a plurality of kinds of the repeating units) with respect to all the repeating units in the resin P is preferably 5 to 80 mol %, more preferably 5 to 75 mol %, and even more preferably 10 to 65 mol %.

The resin P may contain a repeating unit represented by Formula (V) or Formula (VI).

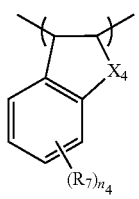

(V)

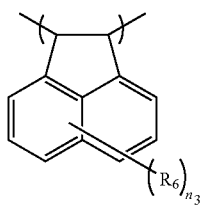

(VI)

In the formulae, $R_6$ and $R_7$ each independently represent a hydrogen atom, a hydroxy group, a linear, branched, and cyclic alkyl group having 1 to 10 carbon atoms, an alkoxy group, an acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X_4$ represents a methylene group, an oxygen atom, or a sulfur atom.

Specific examples of the repeating unit represented by Formula (V) or Formula (VI) will be shown below, but the present invention is not limited thereto.

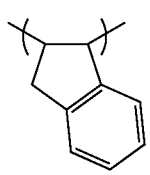 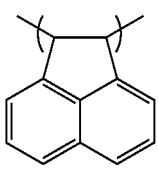 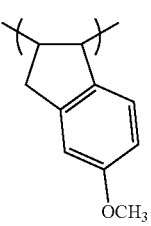

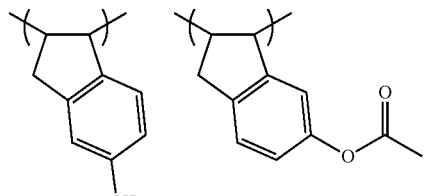

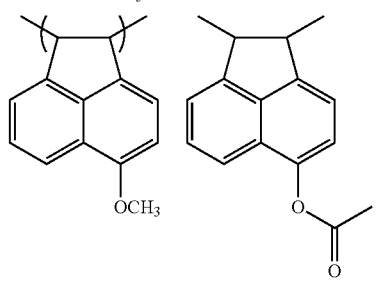

The resin P may further contain a repeating unit having a silicon atom on a side chain. Examples of the repeating unit having a silicon atom on a side chain include a (meth)acrylic repeating unit having a silicon atom, a vinyl-based repeating unit having a silicon atom, and the like. Typically, the repeating unit having a silicon atom on a side chain is a repeating unit having a group having a silicon atom on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, cyclic or linear polysiloxane shown below, a cage-like, ladder-like, or random silsesquioxane structure, and the like. In the formulae, R and $R^1$ each independently represent a monovalent substituent. * represents a bond.

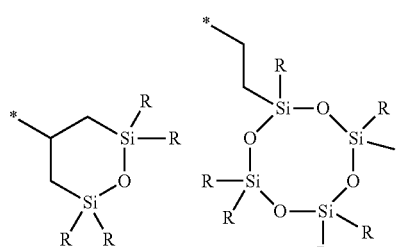

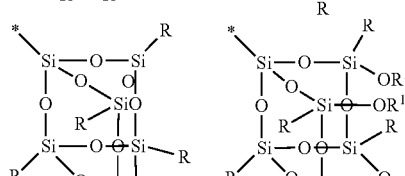

-continued

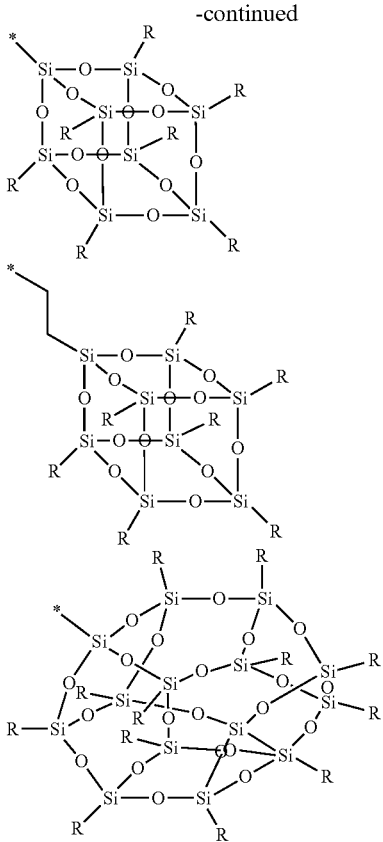

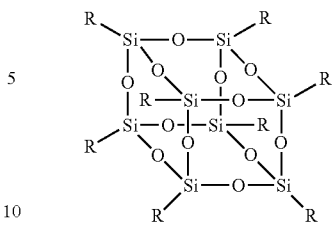

(S)

As the repeating unit having the aforementioned group, for example, a repeating unit derived from an acrylate or methacrylate compound having the aforementioned group or a repeating unit derived from a compound having the aforementioned group and a vinyl group is preferable.

It is preferable that the repeating unit having a silicon atom is preferably a repeating unit having a silsesquioxane structure. In a case where the repeating unit has a silsesquioxane structure, in forming an ultrafine pattern (for example, a line width equal to or smaller than 50 nm) having a cross-sectional shape with a high aspect ratio (for example, film thickness/line width is equal to or greater than 3), an extremely excellent collapse performance can be demonstrated.

Examples of the silsesquioxane structure include a cage-like silsesquioxane structure, a ladder-like silsesquioxane structure, and a random silsesquioxane structure. Among these, a cage-like silsesquioxane structure is preferable.

The cage-like silsesquioxane structure is a silsesquioxane structure having a cage-like skeleton. The cage-like silsesquioxane structure may be a complete cage-like silsesquioxane structure or an incomplete cage-like silsesquioxane structure, but is preferably a complete cage-like silsesquioxane structure.

The ladder-like silsesquioxane structure is a silsesquioxane structure having a ladder-like skeleton.

The random silsesquioxane structure is a silsesquioxane structure having a random skeleton.

The cage-like silsesquioxane structure is preferably a siloxane structure represented by Formula (S).

In Formula (S), R represents a monovalent organic group. A plurality of R's may be the same as or different from each other.

The organic group is not particularly limited, and specific examples thereof include a hydroxy group, a nitro group, a carboxy group, an alkoxy group, an amino group, a mercapto group, a blocked mercapto group (for example, a mercapto group blocked (protected) by an acyl group), an acyl group, an imide group, a phosphino group, a phosphinyl group, a silyl group, a vinyl group, a hydrocarbon group which may have a heteroatom, a (meth)acryl group-containing group, an epoxy group-containing group, and the like.

Examples of the heteroatom in the hydrocarbon group which may have a heteroatom include an oxygen atom, a nitrogen atom, a sulfur atom, a phosphorus atom, and the like.

Examples of the hydrocarbon group which may have a heteroatom include an aliphatic hydrocarbon group, an aromatic hydrocarbon group, a group obtained by combining these, and the like.

The aliphatic hydrocarbon group may be any of a linear, branched, or cyclic aliphatic hydrocarbon group. Specific examples of the aliphatic hydrocarbon group include a linear or branched alkyl group (particularly having 1 to 30 carbon atoms), a linear or branched alkenyl group (particularly having 2 to 30 carbon atoms), a linear or branched alkynyl group (particularly having 2 to 30 carbon atoms), and the like.

Examples of the aromatic hydrocarbon group include an aromatic hydrocarbon group having 6 to 18 carbon atoms such as a phenyl group, a tolyl group, a xylyl group, or a naphthyl group.

In a case where the resin P has the repeating unit having a silicon atom on a side chain, the content of the repeating unit with respect to all the repeating units in the resin P is preferably 1 to 30 mol %, more preferably 5 to 25 mol %, and even more preferably 5 to 20 mol %.

The weight-average molecular weight of the resin P that is measured by a Gel permeation chromatography (GPC) method and expressed in terms of polystyrene is preferably 1,000 to 200,000, more preferably 3,000 to 20,000, and even more preferably 5,000 to 15,000. In a case where the weight-average molecular weight is 1,000 to 200,000, it is possible to prevent the deterioration of heat resistance and dry etching resistance, to prevent the deterioration of developability, and to prevent film forming properties from deteriorating due to the increase in viscosity.

The dispersity (molecular weight distribution) is generally 1 to 5, preferably 1 to 3, more preferably 1.2 to 3.0, and even more preferably 1.2 to 2.0.

In the actinic ray-sensitive or radiation-sensitive resin composition, the content of the resin P in the total solid content is preferably 50% to 99.9% by mass, and more preferably 60% to 99.0% by mass.

In the actinic ray-sensitive or radiation-sensitive resin composition, one kind of resin P may be used, or a plurality of resins P may be used in combination.
(Photoacid Generator)

It is preferable that the actinic ray-sensitive or radiation-sensitive resin composition contains a photoacid generator. As the photoacid generator, known photoacid generators can be used without particular limitation.

The content of the photoacid generator in the actinic ray-sensitive or radiation-sensitive resin composition is not particularly limited. However, generally, the content of the photoacid generator with respect to the total solid content of the actinic ray-sensitive or radiation-sensitive resin composition is preferably 0.1% to 20% by mass, and more preferably 0.5% to 20% by mass. One kind of photoacid generator may be used singly, or two or more kinds of photoacid generators may be used in combination. In a case where two or more kinds of photoacid generators are used in combination, the total content thereof is preferably within the above range.

Examples of the photoacid generator include the compounds described in JP2016-057614A, JP2014-219664A, JP2016-138219A, and JP2015-135379A.
(Quencher)

The actinic ray-sensitive or radiation-sensitive resin composition may contain a quencher. As the quencher, known quenchers can be used without particular limitation.

The quencher is a basic compound and has a function of inhibiting the acid-decomposable resin from being unintentionally decomposed in an unexposed area by the acid spread from an exposed area.

The content of the quencher in the actinic ray-sensitive or radiation-sensitive resin composition is not particularly limited. However, generally, the content of the quencher with respect to the total solid content of the actinic ray-sensitive or radiation-sensitive resin composition is preferably 0.1% to 15% by mass, and more preferably 0.5% to 8% by mass. One kind of quencher may be used singly, or two or more kinds of quenchers may be used in combination. In a case where two or more kinds of quenchers are used in combination, the total content thereof is preferably within the above range.

Examples of the quencher include the compounds described in JP2016-057614A, JP2014-219664A, JP2016-138219A, and JP2015-135379A.
(Hydrophobic Resin)

The actinic ray-sensitive or radiation-sensitive resin composition may contain a hydrophobic resin.

It is preferable to design the hydrophobic resin such that the resin is localized within the surface of a resist film. However, unlike a surfactant, the hydrophobic resin does not need to have a hydrophilic group in a molecule and may not make a contribution to the homogeneous mixing of a polar substance with a nonpolar substance.

The addition of the hydrophobic resin brings about effects such as the control of static and dynamic contact angle formed between water and the resist film surface and the inhibition of outgas.

From the viewpoint of localization within the surface layer of a film, the hydrophobic resin preferably has any one or more kinds of groups among "fluorine atom", "silicon atom", and "$CH_3$ partial structure included in a side chain portion of the resin", and more preferably has two or more kinds of groups among the above. Furthermore, it is preferable that the hydrophobic resin has a hydrocarbon group having 5 or more carbon atoms. These groups may be positioned in the main chain of the resin or may substitute a side chain of the resin.

In a case where the hydrophobic resin contains a fluorine atom and/or a silicon atom, the fluorine atom and/or the silicon atom in the hydrophobic resin may be contained in the main chain or the side chain of the resin.

In a case where the hydrophobic resin contains a fluorine atom, as a partial structure having the fluorine atom, a fluorine atom-containing alkyl group, a fluorine atom-containing cycloalkyl group, or a fluorine atom-containing aryl group is preferable.

The fluorine atom-containing alkyl group (preferably having 1 to 10 carbon atoms and more preferably having 1 to 4 carbon atoms) is a linear or branched alkyl group in which at least one hydrogen atom is substituted with a fluorine atom and which may further have a substituent other than a fluorine atom.

The fluorine atom-containing cycloalkyl group is a monocyclic or polycyclic cycloalkyl group in which at least one hydrogen atom is substituted with a fluorine atom and which may further have a substituent other than a fluorine atom.

Examples of the fluorine atom-containing aryl group include an aryl group in which at least one hydrogen atom is substituted with a fluorine atom, such as a phenyl group or a naphthyl group. The fluorine atom-containing aryl group may further have a substituent other than a fluorine atom.

Examples of the repeating unit having a fluorine atom or a silicon atom include the repeating units exemplified in paragraph [0519] in US2012/0251948A1.

As described above, it is also preferable that the hydrophobic resin contains a $CH_3$ partial structure in a side chain portion.

Herein, the $CH_3$ partial structure that the side chain portion of the hydrophobic resin has includes a $CH_3$ partial structure that an ethyl group, a propyl group, or the like has.

A methyl group directly bonded to the main chain of the hydrophobic resin (for example, an α-methyl group of a repeating unit having a methacrylic acid structure) makes a small contribution to the surface localization of the hydrophobic resin due to the influence of the main chain. Accordingly, such a methyl group is not included in the $CH_3$ partial structure in the present invention.

Regarding the hydrophobic resin, the description in paragraphs [0348] to [0415] in JP2014-010245A can be referred to, and the entire contents thereof are incorporated into the present specification.

As the hydrophobic resin, in addition to the above resins, the resins described in JP2011-248019A, JP2010-175859A, and JP2012-032544A can also be preferably used.

As the hydrophobic resin, for example, resins represented by Formula (1b) to Formula (5b) are preferable.

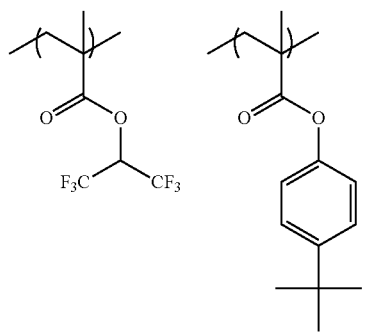

(1b)

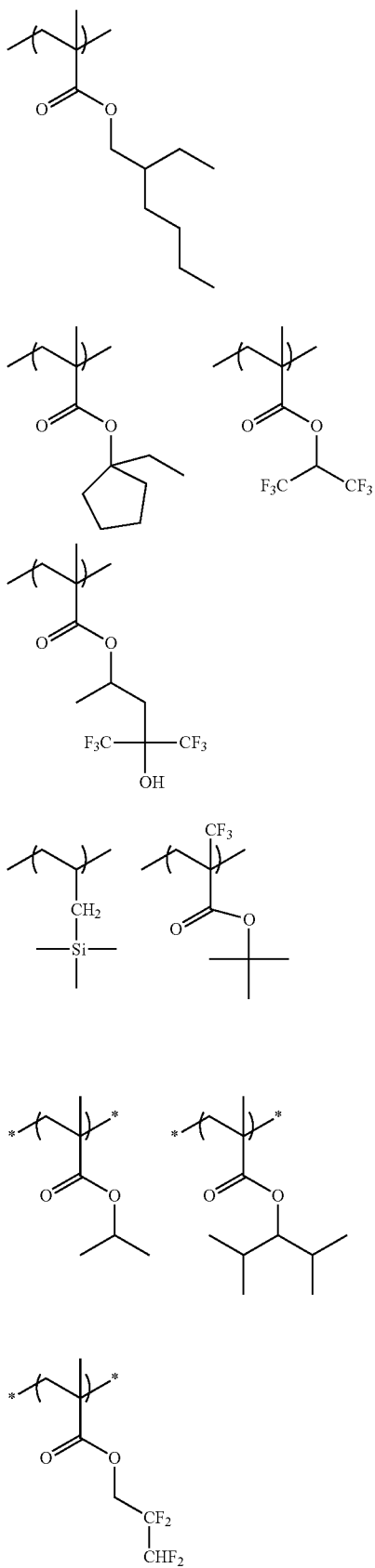

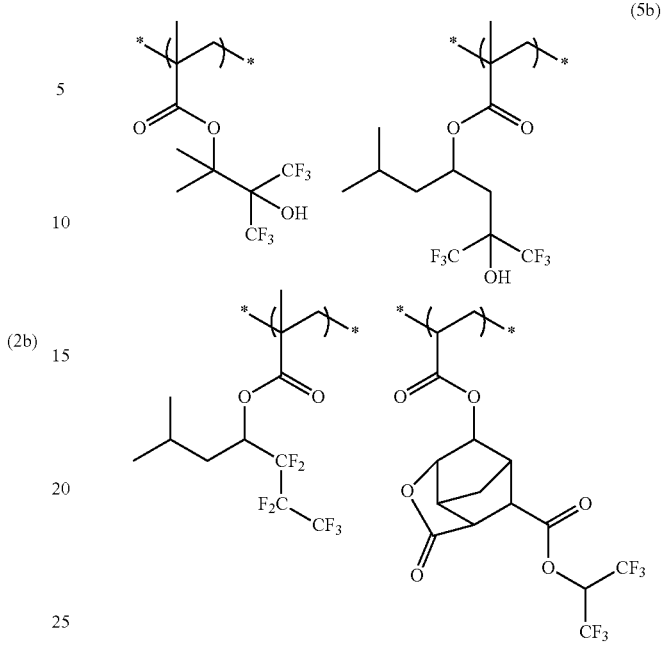

In a case where the resist composition contains the hydrophobic resin, the content of the hydrophobic resin with respect to the total solid content of the composition is preferably 0.01% to 20% by mass, and more preferably 0.1% to 15% by mass.

(Solvent)

The actinic ray-sensitive or radiation-sensitive resin composition may contain a solvent. As the solvent, known solvents can be used without particular limitation.

The solvent to be incorporated into the actinic ray-sensitive or radiation-sensitive resin composition may be the same as or different from the organic solvent to be incorporated into the mixture in the chemical liquid described above.

The content of the solvent in the actinic ray-sensitive or radiation-sensitive resin composition is not particularly limited. However, generally, it is preferable that the solvent is incorporated into the composition such that the total solid content of the actinic ray-sensitive or radiation-sensitive resin composition is adjusted to be 0.5% to 10% by mass. One kind of solvent may be used singly, or two or more kinds of solvents may be used in combination. In a case where two or more kinds of solvents are used in combination, the total content thereof is preferably within the above range.

Examples of the solvent include the solvents described in JP2016-057614A, JP2014-219664A, JP2016-138219A, and JP2015-135379A.

(Other Additives)

If necessary, the actinic ray-sensitive or radiation-sensitive resin composition may additionally contain a surfactant, an acid proliferation agent, a dye, a plasticizer, a photosensitizer, a light absorber, an alkali-soluble resin other than the above resins, and/or a dissolution inhibitor.

[(C) Exposure Step]

The exposure step is a step of exposing the resist film. As the method for exposing the resist film, known methods can be used without particular limitation.

Examples of the method for exposing the resist film include a method of irradiating the resist film with actinic rays or radiation through a predetermined mask. In a case where the method of irradiating the resist film with electron beams is used, the resist film may be irradiated without the intervention of a mask (this is referred to as "direct imaging" as well in some cases).

The actinic rays or the radiation used for exposure is not particularly limited, and examples thereof include a KrF excimer laser, an ArF excimer laser, Extreme Ultra Violet (EUV), Electron Beam (EB), and the like. Among these, EUV or EB is preferable. The exposure may be immersion exposure.

<Post Exposure Bake (PEB) Step>

It is preferable that the aforementioned pattern forming method additionally includes a Post Exposure Bake (PEB) step of baking the exposed resist film between the exposure step and the development step. By the baking, the reaction in the exposed portion is accelerated, and either or both of sensitivity and pattern shape are further improved.

The heating temperature is preferably 80° C. to 150° C., more preferably 80° C. to 140° C., and even more preferably 80° C. to 130° C.

The heating time is preferably 30 to 1,000 seconds, more preferably 60 to 800 seconds, and even more preferably 60 to 600 seconds.

The heating can be performed by means comprising a general exposure-development machine, or may be performed using a hot plate or the like.

[(D) Development Step]

The development step is a step of developing the exposed resist film (hereinafter, referred to as "resist film obtained after exposure" as well) by using a developer.

As the development method, known development methods can be used without particular limitation. Examples of the development method include dipping method, a puddle method, a spray method, a dynamic dispense method, and the like.

Furthermore, the aforementioned pattern forming method may additionally include a step of substituting the developer with another solvent so as to stop the development after the development step.

The development time is not particularly limited, but is preferably 10 to 300 seconds in general and more preferably 10 to 120 seconds. The temperature of the developer is preferably 0° C. to 50° C., and more preferably 15° C. to 35° C. In the pattern forming method, the development step may be performed at least once or plural times.

<Developer>

As the developer, known developers can be used without particular limitation. Examples of the developer include an alkaline developer and a developer containing an organic solvent (organic developer).

In the development step, both the development using a developer containing an organic solvent and development using an alkaline developer may be performed (so-called double development may be performed).

<Rinsing Step>

It is preferable that the aforementioned pattern forming method additionally includes a rinsing step after the development step. The rinsing step is a step of washing the wafer, which comprises the resist film obtained after development, by using a rinsing solution.

As the washing method, known washing methods can be used without particular limitation. Examples thereof include a rotation jetting method, a dipping method, a spray method, and the like.

Among these, it is preferable to use the rotation jetting method in which the wafer is washed and then rotated at a rotation speed of 2,000 to 4,000 rpm such that the rinsing solution is removed from the substrate.

The rinsing time is preferably 10 to 300 seconds in general, more preferably 10 to 180 seconds, and even more preferably 20 to 120 seconds. The temperature of the rinsing solution is preferably 0° C. to 50° C., and more preferably 15° C. to 35° C.

(Rinsing Solution)

In a case where the wafer comprising the resist film is rinsed after the development using an alkaline developer, as the rinsing solution, pure water is preferable. The rinsing solution may be pure water containing a surfactant.

In a case where the wafer comprising the resist film is rinsed after the development using an organic developer, as the rinsing solution, a rinsing solution containing an organic solvent is preferable. As the organic solvent contained in the rinsing solution, for example, at least one kind of organic solvent selected from the group consisting of a hydrocarbon-based solvent, a ketone-based solvent, an ester-based solvent, an alcohol-based solvent, an amide-based solvent, and an ether-based solvent is preferable, at least one kind of organic solvent selected from the group consisting of a hydrocarbon-based solvent, an ether-based solvent, and a ketone-based solvent is more preferable, and at least one kind of organic solvent selected from the group consisting of a hydrocarbon-based solvent and an ether-based solvent is even more preferable.

In a case where the developer containing an organic solvent is used in the development step, the aforementioned pattern forming method may include the rinsing step after the development step. However, from the viewpoint of throughput (productivity), the pattern forming method may not include the rinsing step.

As the pattern forming method that does not include a rinsing step, for example, the description in paragraphs [0014] to [0086] in JP2015-216403A can be cited, and the contents thereof are incorporated into the present specification.

As the rinsing solution, methyl isobutyl carbinol (MIBC) or the same liquid (particularly, butyl acetate) as the developer is also preferable.

<Other Steps>

The aforementioned pattern forming method may include other steps in addition to the steps described above. Examples of those other steps include a washing step using a supercritical fluid, a heating step, and the like.

(Removing Step Using Supercritical Fluid)

A removing step using a supercritical fluid is a step of removing the developer and/or the rinsing solution having adhered to the pattern surface by using a supercritical fluid after the development treatment and/or the rinsing treatment.

(Heating Step)

The heating step is a step of heating the resist film so as to remove the solvent remaining in the pattern after the development step, the rinsing step, or the removing step using a supercritical fluid.

The heating temperature is not particularly limited, but is preferably 40° C. to 160° C. in general, more preferably 50° C. to 150° C., and even more preferably 50° C. to 110° C.

The heating time is not particularly limited, but is preferably 15 to 300 seconds in general and more preferably 15 to 180 seconds.

(BARC Composition Coating Step)

The aforementioned pattern forming method may include a step of coating the wafer with a Bottom of Anti-Reflection Coating (BARC) composition before (B) resist film forming step. Furthermore, the BARC composition coating step may additionally include a step of removing the BARC composition, with which the edge portions of the wafer are unintentionally coated, by using the chemical liquid according to the embodiment described above.

[Kit]

The kit according to an embodiment of the present invention is a kit comprising the chemical liquid and an actinic ray-sensitive or radiation-sensitive resin composition.

The kit according to an embodiment of the present invention is a kit comprising the chemical liquid described above and an actinic ray-sensitive or radiation-sensitive resin composition. The aspect of the kit is not particularly limited, and examples thereof include an aspect having a chemical liquid storage body which has a first container and a chemical liquid stored in the first container and an actinic ray-sensitive or radiation-sensitive resin composition storage body which has a second container and an actinic ray-sensitive or radiation-sensitive resin composition stored in the second container. The chemical liquid and the actinic ray-sensitive or radiation-sensitive resin composition are as described above. Furthermore, as the first container and the second container, those described above as containers of the chemical liquid storage body can be used.

In the kit, the chemical liquid can be used as a prewet solution, a washing solution, or the like. It is preferable that the chemical liquid is used as a prewet solution. That is, the chemical liquid in the kit can be used as a prewet solution, and the kit can be used for forming a resist film on a substrate, which has been pre-wetted by the chemical liquid, by the method described above by using the actinic ray-sensitive or radiation-sensitive resin composition in the kit. In a case where the kit is used, the occurrence of a defect is further inhibited.

The kit according to another embodiment of the present invention is a kit comprising the chemical liquid and an actinic ray-sensitive or radiation-sensitive resin composition containing a resin. The kit satisfies the following conditions 1 and 2.

Condition 1: Rsq1 calculated by Equation 1 based on a proton spin-spin relaxation time measured at 25° C. for a chemical liquid and a first test solution formed of a resin and the chemical liquid by using a pulsed nuclear magnetic resonance-type particle interface characteristic evaluator is higher than 0.5.

$$Rsq1=(\tau 0/\tau 1)-1 \quad \text{(Equation 1)}$$

In Equation 1, τ0 represents the spin-spin relaxation time of the chemical liquid, and τ1 represents the spin-spin relaxation time of the first test solution.

Condition 2: SRsq calculated by Equation 2 based on the proton spin-spin relaxation time measured at 25° C. for a second test solution, which is formed of the resin and the chemical liquid and in which the content of the resin is different from the content of the resin in the first test solution, and the first test solution by using a pulsed nuclear magnetic resonance-type particle interface characteristic evaluator is higher than −1.

$$SRsq=(Rsq2-Rsq1)/(c2-c1) \quad \text{(Equation 2)}$$

In Equation 2, Rsq1 represents a value calculated by Equation 1, and Rsq2 represents a value calculated by Equation 3. c1 and c2 represent a mass-based content of the resin in the first test solution and the second test solution respectively. The unit of the mass-based content is % by mass, and c2>c1.

$$Rsq2=(\tau 0/\tau 2)-1 \quad \text{(Equation 3)}$$

In Equation 3, τ0 has the same definition as τ0 in Equation 1, and τ2 represents a spin-spin relaxation time of the second test solution.

The above testing method is the same as what is explained in "Affinity between chemical liquid and resin" in the description of the pattern forming method. In the kit according to the above embodiment, the chemical liquid and the resin exhibit further improved affinity. Therefore, in a case where the chemical liquid in the kit is used as a prewet solution, and a resist film is formed on a substrate, which has been pre-wetted by the chemical liquid, by using the actinic ray-sensitive or radiation-sensitive resin composition, the occurrence of a defect resulting from solvent shock or the like is further inhibited.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

[Preparation of Organic Solvent]

In order to manufacture chemical liquids of examples and comparative examples, the following organic solvents were prepared. As each of the organic solvents, a high-purity grade with purity equal to or higher than 99% by mass was used. The abbreviation for each organic solvent is shown in the bracket.

Propylene glycol monomethyl ether (PGME)
Cyclopentanone (CyPn)
Butyl acetate (nBA)
Propylene glycol monomethyl ether acetate (PGMEA)
Cyclohexanone (CyHx)
Ethyl lactate (EL)
2-Hydroxymethyl isobutyrate (HBM)
Cyclopentanone dimethyl acetal (DBCPN)
Propylene carbonate (PC)
γ-Butyrolactone (GBL)
Dimethyl sulfoxide (DMSO)
Ethylene carbonate (EC)
1-Methyl-2-pyrrolidone (NMP)
Isoamyl acetate (iAA)
Methyl isobutyl carbinol (MIBC)
Diethylene glycol monomethyl ether (DEGME)
Dimethyl ether (DME)
Diethyl ether (DEE)
Diethylene glycol monoisobutyl ether (DEGIME)
Diglyme (DEGDME)
Diethylene glycol diethyl ether (DEGDEE)
Triethylene glycol dimethyl ether (TriEGDME)
Tetraethylene glycol dimethyl ether (TetraEGDME)
Triethylene glycol butyl methyl ether (TEGMBE)
Diethylene glycol monobutyl ether (DEGMBE)
Anisole
1,4-Dimethoxybenzene (14-DMB)
1,2-Dimethoxybenzene (12-DMB)
1,3-Dimethoxybenzene (13-DMB)
1,4-Diphenoxybenzene
4-Methoxytoluene
Phenetole
3-Methoxymethyl propionate (MMP)

[Preparation of Chemical Liquid]

Organic solvents of the types described in Table 1 were mixed together at the mass ratio described in Table 1, thereby obtaining a mixture. The obtained mixture was purified by the following method, thereby preparing a chemical liquid. For the purification, a device was used in which a stainless steel tank having a coating layer formed of polytetrafluoroethylene (PTFE) in a liquid contact portion was connected to a plurality of filter units through a circulation pipe line. Furthermore, a pump was disposed in the middle of the circulation pipe line. The liquid contact portion of each of the circulation pipe line and the pump was formed of polytetrafluoroethylene. Furthermore, filters disposed in the following order from the tank side were used.

First metal ion adsorption filter (15 nm IEX PTFE manufactured by Entegris, Inc. (filter made of PTFE having a pore size of 15 nm including a base material having a sulfo group on the surface thereof))

Particle removing filter (12 nm PTFE manufactured by Entegris, Inc. (filter made of PTFE for removing particles having a size of 12 nm))

Second metal ion adsorption filter (15 nm IEX PTFE manufactured by Entegris, Inc. (filter made of PTFE having a pore size of 15 nm including a base material having a sulfo group on the surface thereof))

Organic impurity adsorption filter (special filter A (filter described in JP2013-150979A obtained by fixing active carbon to non-woven cloth))

The downstream side of the organic impurity adsorption filter was provided with moisture adjustment means containing MOLECULAR SIEVE 3A (manufactured by Union Showa K. K., dehydrating agent).

A tank was filled with the mixed solution obtained by mixing together the solvents of the types described in Table 1, and the mixed solution was circulated plural times in a pipe line including the filter and the moisture adjustment means described above, thereby obtaining each of the chemical liquids described in Table 1.

[Measurement of Content of Each Component Contained in Chemical Liquid, and the Like]

For measuring the content of each component contained in the chemical liquid, the following method was used. All of the following measurements were performed in a clean room that met the level equal to or lower than International Organization for Standardization (ISO) Class 2. In order to improve the measurement accuracy, at the time of measuring each component, in a case where the content of the component was found to be equal to or smaller than a detection limit by general measurement, the organic solvent was concentrated by $1/100$ in terms of volume for performing the measurement, and the content was calculated by converting the concentration into the content of the organic solvent not yet being concentrated. The results are summarized in Table 1.

<Organic Solvent and Organic Impurity>

The content of the organic solvent and the organic impurity in each of the chemical liquids was measured using a gas chromatography mass spectrometry (tradename "GCMS-2020", manufactured by Shimadzu Corporation, the measurement conditions were as described below). Based on the obtained measurement results, whether or not the chemical liquid contains specific compounds (in Table 1, the specific compounds are classified into a specific compound (having 8 or more carbon atoms) and a specific compound (having 12 or more carbon atoms); chemical liquids containing the specific compounds are denoted with "A", and chemical liquids that do not contain the specific compounds are denoted with "B") was determined, the components in the organic impurity were sorted into a high-boiling-point component and an ultrahigh-boiling-point component, and the content thereof was also determined. Furthermore, the content of an organic compound (from which DOP was detected) having a C Log P value higher than 6.5 in the organic impurity was also determined.

(Measurement Condition)

Capillary column: InertCap 5 MS/NP 0.25 mmI.D.×30 m df=0.25 μm

Sample introduction method: slit 75 kPa constant pressure

Vaporizing chamber temperature: 230° C.

Column oven temperature: 80° C. (2 min)-500° C. (13 min) heating rate 15° C./min Carrier gas: helium Septum purge flow rate: 5 mL/min Split ratio: 25:1

Interface temperature: 250° C.

Ion source temperature: 200° C.

Measurement mode: Scan m/z=85~500

Amount of sample introduced: 1 μL

<Water>

The content of water contained in each of the chemical liquids was measured using a Karl Fischer moisture meter (trade name "MKC-710M", manufactured by KYOTO ELECTRONICS MANUFACTURING CO., LTD., Karl Fischer coulometric titration method).

<Impurity Metal>

The content of the impurity metal contained in each of the chemical liquids was measured using Agilent 8800 triple quadrupole ICP-MS (for semiconductor analysis, option #200). According to this measurement method, the impurity metal in each of the chemical liquids can be classified into an impurity metal as particles and an impurity metal other than that (for example, ions and the like), and the content of each of the impurity metals can be measured.

Measurement Condition

As a sample introduction system, a quartz torch, a coaxial perfluoroalkoxyalkane (PFA) nebulizer (for self-suction), and a platinum interface cone were used. The measurement parameters of cool plasma conditions are as below.

Output of Radio Frequency (RF) (W): 600

Flow rate of carrier gas (L/min): 0.7

Flow rate of makeup gas (L/min): 1

Sampling depth (mm): 18

[Physical Properties of Chemical Liquid or Mixture]

The physical properties of each of the chemical liquids or the mixtures were measured or calculated by the following method.

<Surface Tension of Mixture>

Based on a surface tension at 25° C. of each of the organic solvents contained in the mixture and a molar fraction of each of the organic solvents in the mixture, the surface tension of the mixture was calculated.

The surface tension at 25° C. of the organic solvents contained in each of the mixtures was measured using a surface tensiometer (trade name "CBVP-Z" manufactured by Kyowa Interface Science Co., LTD.). The calculated values of the surface tension of the mixtures are shown in Table 1.

<Hansen Solubility Parameter>

The hydrogen bond element and the dispersion element as Hansen solubility parameters of each of the organic solvents were calculated using Hansen Solubility Parameter in Practice (HSPiP). The calculated values are shown in Table 1.

<Vapor Pressure>

The vapor pressure of the mixture of the organic solvents was calculated by summing up the product of a vapor pressure (Pa) of each of the organic solvents at 25° C. and the molar fraction of each of the organic solvents in the mixture. The calculated values are shown in Table 1.

<Number of Coarse Particles>

The number of coarse particles contained in each of the chemical liquids was measured by the following method.

For the prepared chemical liquid, by using a light scattering-type liquid-borne particle counter (manufactured by RION Co., Ltd., model number: KS-18F, light source: semiconductor laser-excited solid-state laser (wavelength: 532 nm, rated power: 500 mW), flow rate: 10 mL/min, the measurement principle is based on a dynamic light scattering method), the number of particles having a size equal to or greater than 100 nm contained in 1 mL of the chemical liquid was counted 5 times, and the average thereof was adopted as the number of coarse particles.

The light scattering-type liquid-borne particle counter was used after being calibrated using a Polystyrene Latex (PSL) standard particle solution. The measurement results are shown in Table 1.

[Evaluation of Defect Inhibition Performance of Chemical Liquid]

The defect inhibition performance of the chemical liquid was evaluated by the following method.

First, a silicon oxide film substrate having a diameter of 300 mm was prepared.

Then, by using a wafer surface inspection device (SP-5; manufactured by KLA-Tencor Corporation.), the number of particles (hereinafter, referred to as "defects") having a diameter equal to or greater than 32 nm that were present on the substrate was counted (the counted number was adopted as an initial value). Then, the substrate was set in a spin jetting device, and while the substrate was being rotated, each of the chemical liquids was jetted to the surface of the substrate at a flow rate of 1.5 L/min. Thereafter, the substrate was spin-dried.

Then, by using the aforementioned device (SP-5), the number of defects present on the substrate having been coated with the chemical liquid was counted again (the counted number was adopted as a counted value). Thereafter, a difference between the initial value and the counted value (initial value−counted value) was calculated. Based on the following standards, the obtained result was evaluated. The results are shown in Table 1.

In a case where the evaluation result is "D" or better, the chemical liquid is regarded as having a defect inhibition performance required for a chemical liquid.

"AAA": The difference between the initial value and the counted value of the number of defects was less than 150.

"AA": The difference between the initial value and the counted value of the number of defects was greater than 150 and equal to or smaller than 300.

"A": The difference between the initial value and the counted value of the number of defects was greater than 300 and equal to or smaller than 500.

"B": The difference between the initial value and the counted value of the number of defects was greater than 500 and equal to or smaller than 1,000.

"C": The difference between the initial value and the counted value of the number of defects was greater than 1,000 and equal to or smaller than 1,500.

"D": The difference between the initial value and the counted value of the number of defects was greater than 1,500 and equal to or smaller than 2,000.

"E": The difference between the initial value and the counted value of the number of defects was greater than 2,000.

[Preparation of Actinic Ray-Sensitive or Radiation-Sensitive Resin Composition]

By the following method, actinic ray-sensitive or radiation-sensitive resin (resist) compositions were prepared. By mixing together components and then filtering the mixture through a filter having a pore size of 0.03 μm, the resist compositions were prepared. Hereinafter, each of the actinic ray-sensitive or radiation-sensitive resin compositions 1 to 7 will be described.

<Resist Composition 1>

Acid-decomposable resin (resin represented by the following formula (weight-average molecular weight (Mw): 7,500): the numerical value described for each repeating unit means mol %.): 100 parts by mass

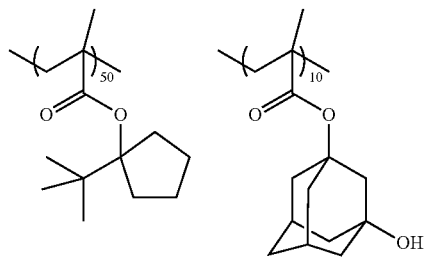

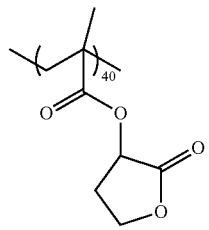

Photoacid generator shown below: 8 parts by mass

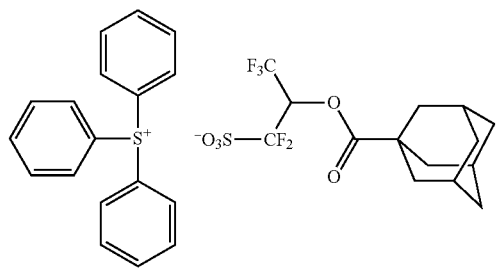

Quenchers shown below: 5 parts by mass (the mass ratio is 0.1:0.3:0.3:0.2 from left to right).

Among the following quenchers, a polymer-type quencher has a weight-average molecular weight (Mw) of 5,000. The numerical value described for each repeating unit means molar ratio.

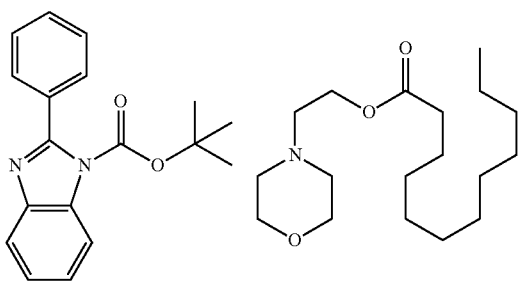

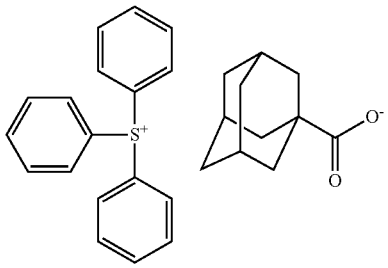

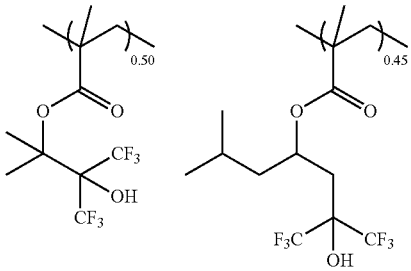

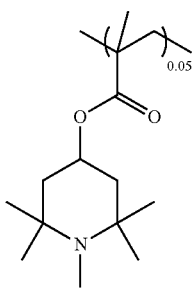

Hydrophobic resins shown below: 4 parts by mass (the mass ratio is 0.5:0.5 from left to right).

Between the following hydrophobic resins, the hydrophobic resin on the left side has a weight-average molecular weight (Mw) of 7,000, and the hydrophobic resin on the right side has a weight-average molecular weight (Mw) of 8,000. In each of the hydrophobic resins, the numerical value described for each repeating unit means molar ratio.

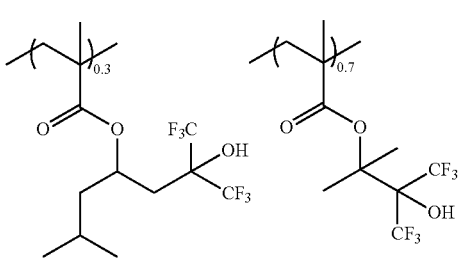

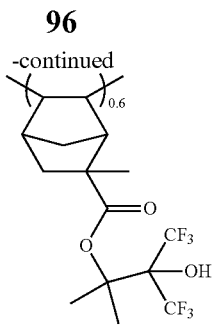

Solvent:
  PGMEA: 3 parts by mass
  CyHx: 600 parts by mass
  γ-Butyrolactone (GBL): 100 parts by mass
<Resist Composition 2>
  Acid-decomposable resin (resin represented by the following formula (weight-average molecular weight (Mw): 8,000): the numerical value described for each repeating unit means mol %.): 100 parts by mass Photoacid generators shown below: 12 parts by mass (the mass ratio is 0.5:0.5 from left to right)

Quenchers shown below: 5 parts by mass (mass ratio is 0.3:0.7 from left to right.)

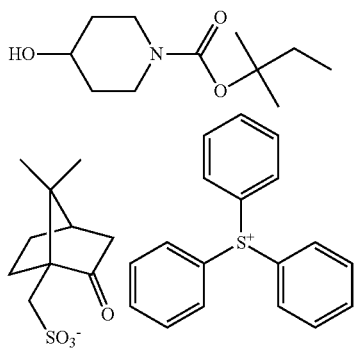

Hydrophobic resins shown below: 5 parts by mass (the mass ratio is 0.8:0.2 from top to bottom).

Between the following hydrophobic resins, the upper hydrophobic resin has a weight-average molecular weight (Mw) of 8,000, and the lower hydrophobic resin has a weight-average molecular weight (Mw) of 6,000. In each of the hydrophobic resins, the numerical value described for each repeating unit means molar ratio.

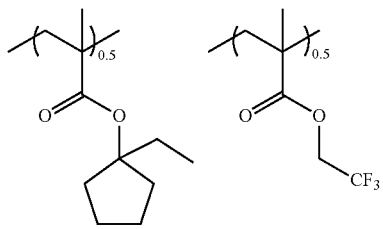

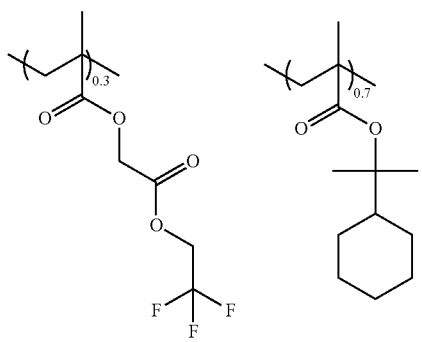

Solvent:
  PGMEA: 3 parts by mass
  CyHx: 600 parts by mass
  γ-Butyrolactone (GBL): 100 parts by mass
<Resist Composition 3>
Acid-decomposable resin (resin represented by the following formula (weight-average molecular weight (Mw): 8,000): the numerical value described for each repeating unit means mol %.): 100 parts by mass

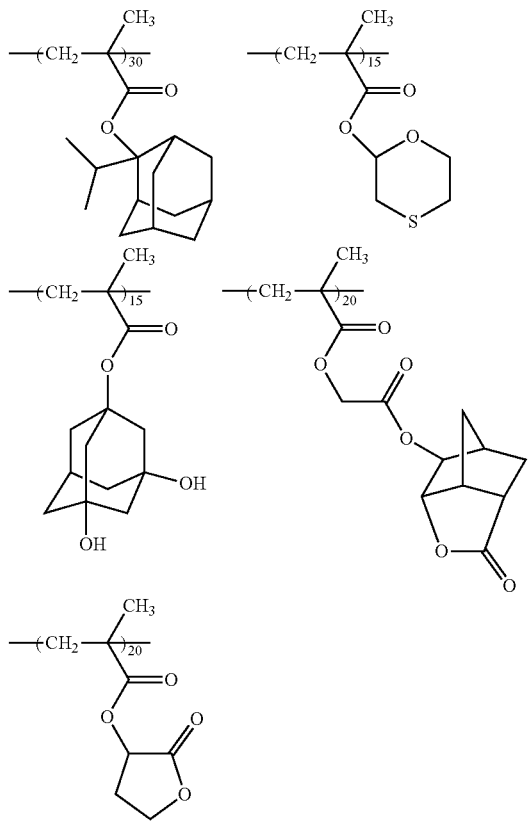

Photoacid generator shown below: 15 parts by mass

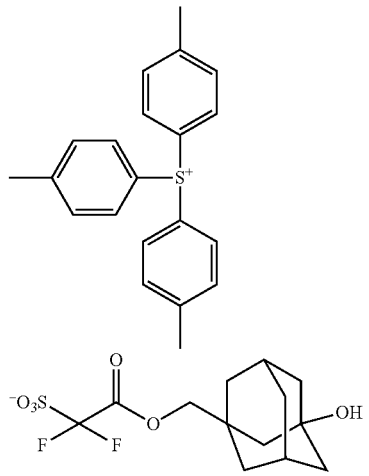

Quenchers shown below: 7 parts by mass (the mass ratio is 1:1 from left to right.)

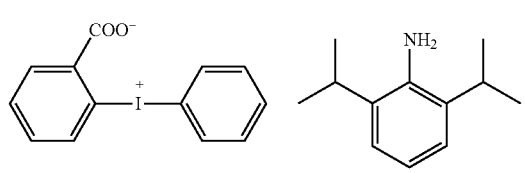

Hydrophobic resins shown below: 20 parts by mass (the mass ratio is 3:7 from top to bottom).

Between the following hydrophobic resins, the upper hydrophobic resin has a weight-average molecular weight (Mw) of 10,000, and the lower hydrophobic resin has a weight-average molecular weight (Mw) of 7,000. In the lower hydrophobic resin, the molar ratio of each of the repeating units is 0.67:0.33 from left to right.

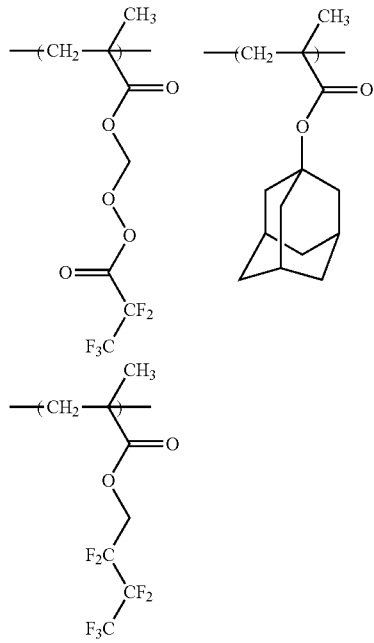

Solvent:
PGMEA: 50 parts by mass
PGME: 100 parts by mass
2-Heptanone: 100 parts by mass
γ-Butyrolactone (GBL): 500 parts by mass <Resist Composition 4>

Acid-decomposable resin (resin represented by the following formula (weight-average molecular weight (Mw): 6,500): the numerical value described for each repeating unit means mol %.): 80 parts by mass

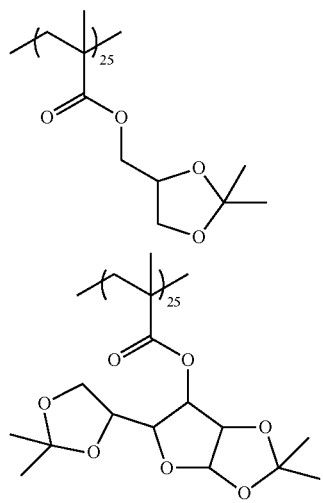

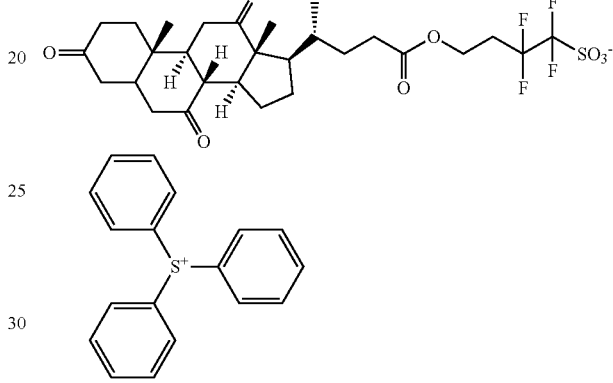

Photoacid generator shown below: 15 parts by mass

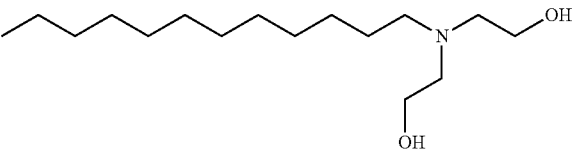 [SMILES: CCCCCCCCCCCCN(CCO)CCO]

Quencher shown below: 5 parts by mass

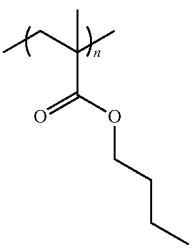

Hydrophobic resin shown below (weight-average molecular weight (Mw): 5,000): 60 parts by mass Solvent:
PGMEA: 70 parts by mass
HBM: 100 parts by mass
CyHx: 700 parts by mass <Resist Composition 5>

Resin having repeating unit represented by the following formula: 2.9% by mass with respect to total mass of resist composition

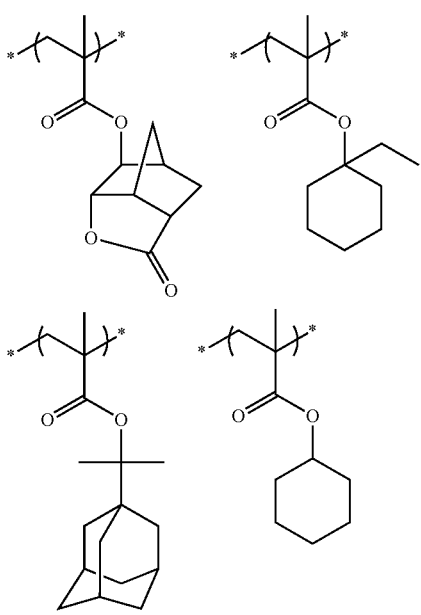

Photoacid generator shown below: 0.2% by mass with respect to total mass of resist composition

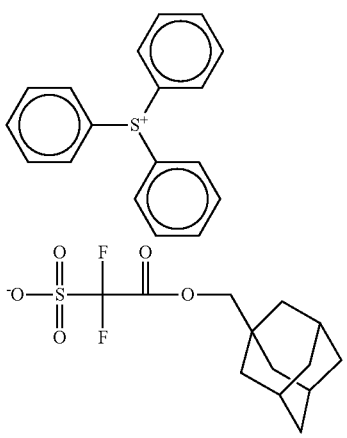

Photoacid generator shown below: 0.1% by mass with respect to total mass of resist composition

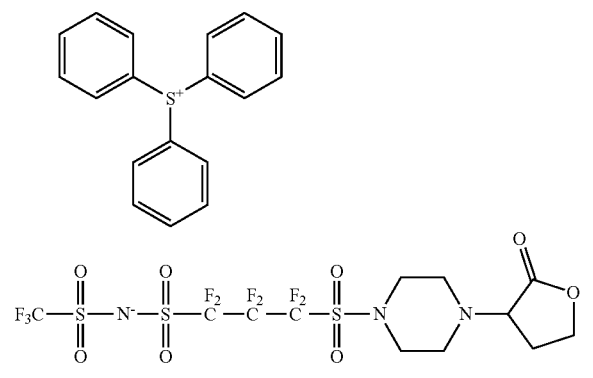

Hydrophobic resin having repeating units shown below: 0.02% by mass with respect to total mass of resist composition

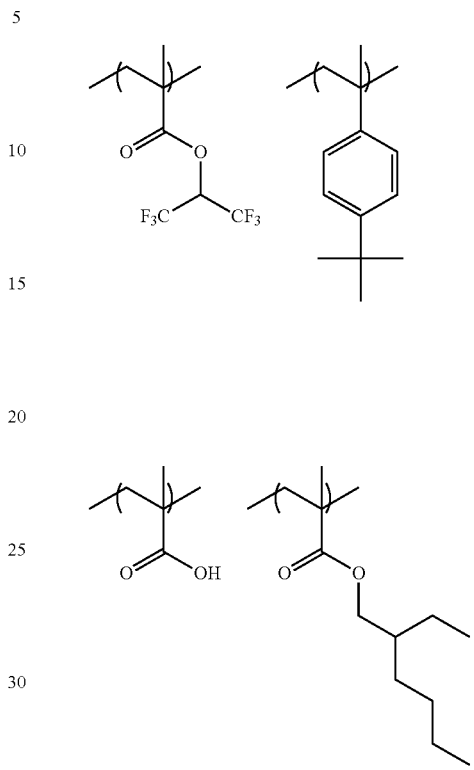

Quencher shown below: 0.25% by mass with respect to total mass of resist composition

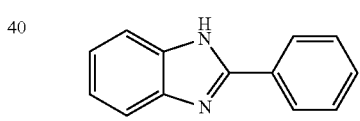

PGMEA: 67.7% by mass with respect to total mass of resist composition CyHx: balance with respect to total mass of resist composition <Resist Composition 6>

Resin having repeating units shown below (molar ratio of each of the repeating units is 10/30/10/35/15 from left): 2.8% by mass with respect to total mass of resist composition

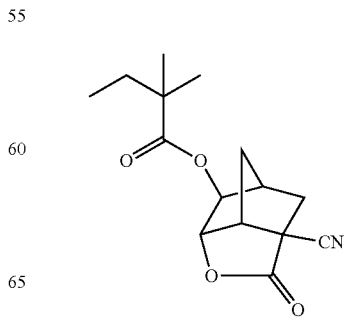

-continued

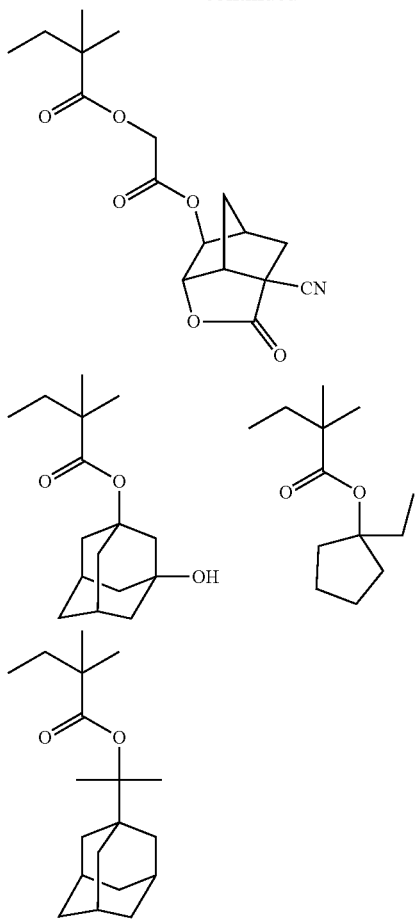

Hydrophobic resin having repeating units represented by the following formulae (molar ratio of each of the repeating units is 90/8/2 from left): 0.14% by mass with respect to total mass of resist composition

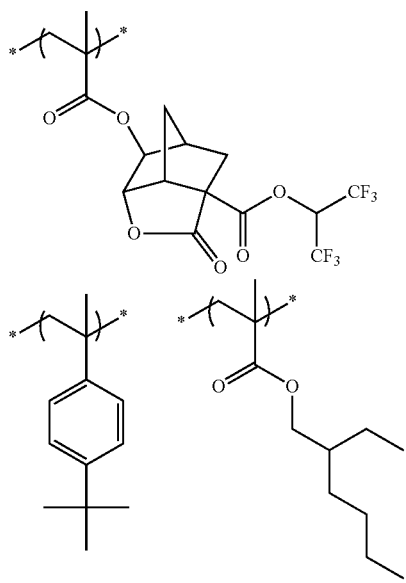

Photoacid generator shown below: 0.37% by mass with respect to total mass of resist composition

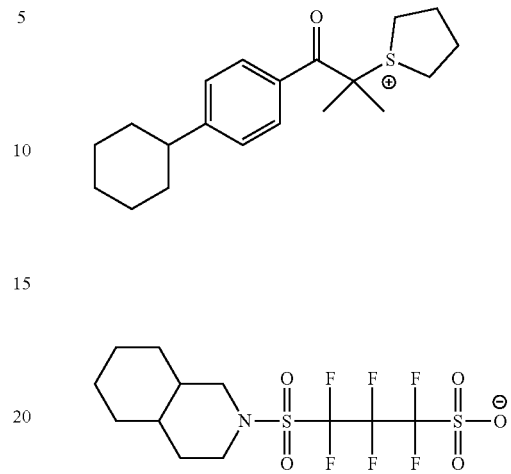

Photoacid generator shown below: 0.21% by mass with respect to total mass of resist composition

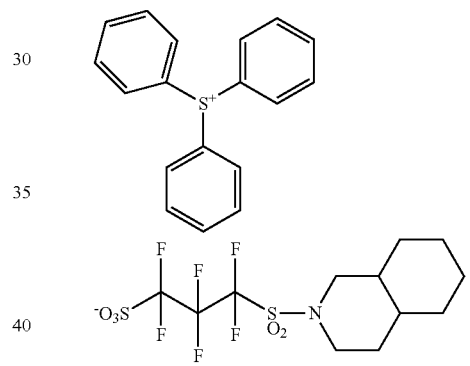

Quencher shown below: 0.026% by mass with respect to total mass of resist composition

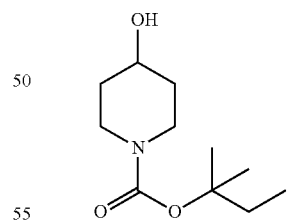

PGMEA: 93% by mass with respect to total mass of resist composition

GBL: balance with respect to total mass resist composition

<Resist Composition 7>

Resin having repeating units represented by the following formulae (a molar ratio of each of the repeating units is 63.33/25.25/11.49 from left, Mw is about 21,000): 13% by mass with respect to total mass of resist composition

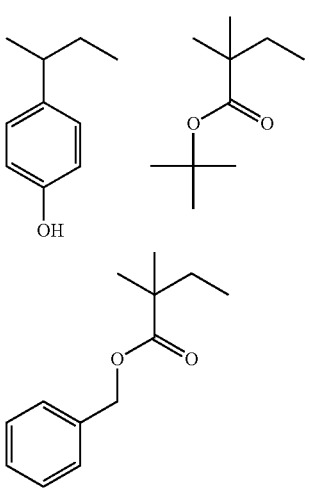

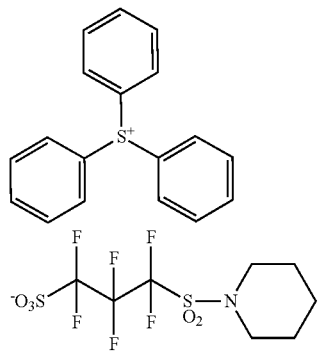

Photoacid generator shown below: 0.32% by mass with respect to total mass of resist composition

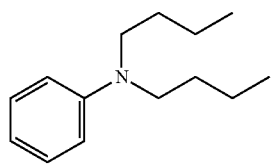

Quencher shown below: 0.018% by mass with respect to total mass of resist composition

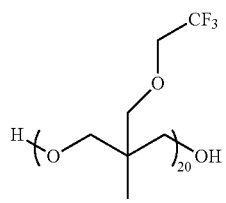

Compound shown below: 0.005% by mass with respect to total mass of resist composition

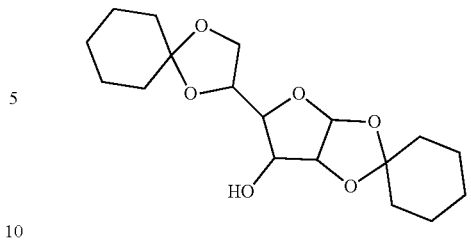

Compound shown below: 0.57% by mass with respect to total mass of resist composition PGMEA: 68% by mass with respect to total mass of resist composition 3-Ethoxyethyl propionate: balance with respect to total mass of resist composition Each of the above resist compositions was used after the above components were mixed together and then filtered through a filter made of UPE (ultra-high-molecular-weight polyethylene) having a pore size of 0.1 µm and a filter made of nylon having a pore size of 0.04 µm.

The weight-average molecular weight (Mw) of each of the various resins contained in the above actinic ray-sensitive or radiation-sensitive resin compositions is a value determined by a GPC method by using tetrahydrofuran (THF) as a developing solvent and expressed in terms of polystyrene.

Specifically, the following device was used.
Device: HLC-8120 manufactured by Tosoh Corporation
Column: TSK gel Multipore HXL-M manufactured by Tosoh Corporation

[Affinity Between Chemical Liquid and Resin]

The affinity between each of the chemical liquids and the resin was measured using a pulsed nuclear magnetic resonance-type particle interface characteristic evaluator (trade name: include "Acorn Area", manufactured by Xigo Nanotools).

As a first test solution, a solution was used which was obtained by dissolving the resin contained in each of the actinic ray-sensitive or radiation-sensitive resin compositions in each of the chemical liquids at 0.5%.

As a second test solution, a solution was used which was obtained by dissolving the resin contained in each of the actinic ray-sensitive or radiation-sensitive resin compositions in each of the chemical liquids at 3.0%.

For each of the solutions, τ0, τ1, and τ2 were determined under the condition of 25° C., and Rsq1 and SRsq were calculated. The results were classified based on the following standards, and shown in Table 1.

Rsq1
A: Rsq1 was higher than 0.5.
B: Rsq1 was equal to or lower than 0.5.

SRsq
A: SRsq was higher than −1.
B: SRsq was equal to or lower than −1.

[Resist Saving Properties of Resist Composition]

The resist saving properties of the resist composition after the coating of the chemical liquid were evaluated by the following method. In the present specification, having excellent resist saving properties means that the uniformity and the film thickness controllability are excellent.

<Uniformity>

First, as a control, a silicon wafer comprising an antireflection film and having a diameter of about 30 cm (12 inches) was directly coated with the resist composition. The coating was performed using a spin coater (trade name: "LITHIUS", manufactured by Tokyo Electron Limited.). The obtained resist film was baked at 90° C. For the baked resist film, a 59-point map was measured using a film thickness measurement apparatus Lambda Ace manufactured by SCREEN Holdings Co., Ltd. so as to confirm that no coating mottle occurred. For checking the coating mottle, 59 circular measurement spots were extracted from the resist film to be measured, the thickness of the resist film was measured at each of the measurement spots, and the measured thicknesses were two-dimensionally arranged for the respective measurement spots and observed. At this time, in a case where no unevenness was found in the resist film thickness, it was considered that there was no coating mottle.

Then, another silicon wafer comprising an antireflection film and having a diameter of about 30 cm (12 inches) was prepared, and each of the chemical liquids was added dropwise thereto. Thereafter, the wafer was coated with the same amount of the resist composition used for the control, and baked at 90° C. The obtained resist film was observed by the same method as described above so as to confirm that no coating mottle occurred. Subsequently, the same test as above was performed by reducing the amount of the used resist composition such that the amount of the resist composition became 50% by mass and 30% by mass of the amount of the resist composition used for the control, and whether the coating mottle occurred was investigated.

The results were evaluated based on the following standards, and shown in Table 1.

AA: Even though the amount of the used resist composition was reduced and became 30% by mass and 50% by mass of the amount of the resist composition used for the control, no coating mottle occurred.

A: Even though the amount of the used resist composition was reduced and became 50% by mass of the amount of the resist composition used for the control, no coating mottle occurred. However, in a case where the amount of the used resist composition was reduced and became 30% by mass of the amount of the resist composition used for the control, a coating mottle occurred.

B: In a case where the amount of the used resist composition was reduced and became 30% by mass and 50% by mass of the amount of the resist composition used for the control, a coating mottle occurred.

<Film Thickness Controllability>

Each of the chemical liquids was added dropwise to a silicon wafer comprising an antireflection film and having a diameter of about 30 cm (12 inches). Then, the wafer was directly coated with the aforementioned resist composition such that the thickness of the obtained resist film became 8.5 nm. The coating was performed using a spin coater (trade name: "LITHIUS", manufactured by Tokyo Electron Limited.). The obtained resist film was baked at 90° C. For the baked resist film, a 59-point map was measured using a film thickness measurement apparatus Lambda Ace manufactured by SCREEN Holdings Co., Ltd., and a standard deviation (hereinafter, referred to as "σ" as well) of the thickness of the resist film was determined. Subsequently, from the standard deviation, 3σ was determined. The results were evaluated based on the following standards, and shown in Table 1.

AA: 3σ was less than 0.10 nm.

A: 3σ was equal to or greater than 0.10 nm and less than 0.15 nm.

B: 3σ was equal to or greater than 0.15 nm and less than 0.2 nm.

C: 3σ was equal to or greater than 0.2 nm.

TABLE 1

| | | Components of chemical liquid for pre-wetting Mixture of organic solvents First organic solvent | | | | | |
|---|---|---|---|---|---|---|---|
| Table 1-1-1 | Type | Content (% by mass) | Molar mass (g/mol) | Vapor pressure (Pa) | Surface tension (mN/m) | δh $(MPa)^{0.5}$ | δd $(MPa)^{0.5}$ |
| Example 1 | PGME | 30 | 90.1 | 1,453 | 27.6 | 5.8 | 15.8 |
| Example 2 | PGME | 30 | 90.1 | 1,453 | 27.6 | 5.8 | 15.8 |
| Example 3 | PGME | 30 | 90.1 | 1,453 | 27.6 | 5.8 | 15.8 |
| Example 4 | PGME | 30 | 90.1 | 1,453 | 27.6 | 5.8 | 15.8 |
| Example 5 | PGME | 30 | 90.1 | 1,453 | 27.6 | 5.8 | 15.8 |
| Example 6 | PGME | 50 | 90.1 | 1,453 | 27.6 | 5.8 | 15.8 |
| Example 7 | PGME | 50 | 90.1 | 1,453 | 27.6 | 5.8 | 15.8 |
| Example 8 | PGME | 50 | 90.1 | 1,453 | 27.6 | 5.8 | 15.8 |
| Example 9 | PGME | 50 | 90.1 | 1,453 | 27.6 | 5.8 | 15.8 |
| Example 10 | PGME | 50 | 90.1 | 1,453 | 27.6 | 5.8 | 15.8 |
| Example 11 | CyPn | 30 | 84.1 | 1,520 | 33.8 | 5.2 | 17.1 |
| Example 12 | CyPn | 30 | 84.1 | 1,520 | 33.8 | 5.2 | 17.1 |
| Example 13 | CyPn | 30 | 84.1 | 1,520 | 33.8 | 5.2 | 17.1 |
| Example 14 | CyPn | 30 | 84.1 | 1,520 | 33.8 | 5.2 | 17.1 |
| Example 15 | CyPn | 30 | 84.1 | 1,520 | 33.8 | 5.2 | 17.1 |
| Example 16 | CyPn | 50 | 84.1 | 1,520 | 33.8 | 5.2 | 17.1 |
| Example 17 | CyPn | 50 | 84.1 | 1,520 | 33.8 | 5.2 | 17.1 |
| Example 18 | CyPn | 50 | 84.1 | 1,520 | 33.8 | 5.2 | 17.1 |
| Example 19 | CyPn | 50 | 84.1 | 1,520 | 33.8 | 5.2 | 17.1 |
| Example 20 | CyPn | 50 | 84.1 | 1,520 | 33.8 | 5.2 | 17.1 |
| Example 21 | nBA | 30 | 116.2 | 1,200 | 24.8 | 6.3 | 16.0 |
| Example 22 | nBA | 30 | 116.2 | 1,200 | 24.8 | 6.3 | 16.0 |
| Example 23 | nBA | 30 | 116.2 | 1,200 | 24.8 | 6.3 | 16.0 |
| Example 24 | nBA | 30 | 116.2 | 1,200 | 24.8 | 6.3 | 16.0 |
| Example 25 | nBA | 30 | 116.2 | 1,200 | 24.8 | 6.3 | 16.0 |
| Example 26 | nBA | 30 | 116.2 | 1,200 | 24.8 | 6.3 | 16.0 |
| Example 27 | nBA | 30 | 116.2 | 1,200 | 24.8 | 6.3 | 16.0 |
| Example 28 | nBA | 30 | 116.2 | 1,200 | 24.8 | 6.3 | 16.0 |
| Example 29 | nBA | 30 | 116.2 | 1,200 | 24.8 | 6.3 | 16.0 |
| Example 30 | nBA | 30 | 116.2 | 1,200 | 24.8 | 6.3 | 16.0 |

TABLE 1-continued

Components of chemical liquid for pre-wetting
Mixture of organic solvents
First organic solvent

| Table 1-1-1 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 31 | | | | | | | |
| Example 32 | | | | | | | |
| Example 33 | | | | | | | |
| Example 34 | | | | | | | |
| Example 35 | | | | | | | |
| Example 36 | | | | | | | |
| Example 37 | | | | | | | |
| Example 38 | | | | | | | |
| Example 39 | | | | | | | |
| Example 40 | | | | | | | |

TABLE 2

Components of chemical liquid for pre-wetting
Mixture of organic solvents
Second organic solvent

| Table 1-1-2 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 1 | PGMEA | 70 | 132.16 | 493 | 27.9 | 9.8 | 15.6 |
| Example 2 | CyHx | 70 | 98.14 | 507 | 34.1 | 5.1 | 17.8 |
| Example 3 | EL | 70 | 118.13 | 187 | 29.8 | 12.5 | 16.0 |
| Example 4 | HBM | 70 | 118.13 | 267 | 29.1 | 12.2 | 16.5 |
| Example 5 | DBCPN | 70 | 130.18 | 400 | 30.2 | 3.4 | 16.1 |
| Example 6 | | | | | | | |
| Example 7 | | | | | | | |
| Example 8 | | | | | | | |
| Example 9 | | | | | | | |
| Example 10 | | | | | | | |
| Example 11 | PGMEA | 70 | 132.16 | 493 | 27.9 | 9.8 | 15.6 |
| Example 12 | CyHx | 70 | 98.14 | 507 | 34.1 | 5.1 | 17.8 |
| Example 13 | EL | 70 | 118.13 | 187 | 29.8 | 12.5 | 16.0 |
| Example 14 | HBM | 70 | 118.13 | 267 | 29.1 | 12.2 | 16.5 |
| Example 15 | DBCPN | 70 | 130.18 | 400 | 30.2 | 3.4 | 16.1 |
| Example 16 | | | | | | | |
| Example 17 | | | | | | | |
| Example 18 | | | | | | | |
| Example 19 | | | | | | | |
| Example 20 | | | | | | | |
| Example 21 | PGMEA | 70 | 132.16 | 493 | 27.9 | 9.8 | 15.6 |
| Example 22 | CyHx | 70 | 98.14 | 507 | 34.1 | 5.1 | 17.8 |
| Example 23 | EL | 70 | 118.13 | 187 | 29.8 | 12.5 | 16.0 |
| Example 24 | HBM | 70 | 118.13 | 267 | 29.1 | 12.2 | 16.5 |
| Example 25 | DBCPN | 70 | 130.18 | 400 | 30.2 | 3.4 | 16.1 |
| Example 26 | | | | | | | |
| Example 27 | | | | | | | |
| Example 28 | | | | | | | |
| Example 29 | | | | | | | |
| Example 30 | | | | | | | |
| Example 31 | PGMEA | 80 | 132.16 | 493 | 27.9 | 9.8 | 15.6 |
| Example 32 | PGMEA | 80 | 132.16 | 493 | 27.9 | 9.8 | 15.6 |
| Example 33 | PGMEA | 80 | 132.16 | 493 | 27.9 | 9.8 | 15.6 |
| Example 34 | PGMEA | 80 | 132.16 | 493 | 27.9 | 9.8 | 15.6 |
| Example 35 | PGMEA | 80 | 132.16 | 493 | 27.9 | 9.8 | 15.6 |
| Example 36 | CyHx | 95 | 98.14 | 507 | 34.1 | 5.1 | 17.8 |
| Example 37 | CyHx | 95 | 98.14 | 507 | 34.1 | 5.1 | 17.8 |
| Example 38 | CyHx | 95 | 98.14 | 507 | 34.1 | 5.1 | 17.8 |
| Example 39 | CyHx | 95 | 98.14 | 507 | 34.1 | 5.1 | 17.8 |
| Example 40 | CyHx | 95 | 98.14 | 507 | 34.1 | 5.1 | 17.8 |

TABLE 3

Components of chemical liquid for pre-wetting
Mixture of organic solvents
Third organic solvent

| Table 1-1-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 1 | | | | | | | |
| Example 2 | | | | | | | |
| Example 3 | | | | | | | |
| Example 4 | | | | | | | |
| Example 5 | | | | | | | |
| Example 6 | GBL | 50 | 86.08 | 147 | 44.1 | 7.4 | 18.0 |
| Example 7 | DMSO | 50 | 78.13 | 13 | 43.6 | 10.2 | 18.4 |
| Example 8 | EC | 50 | 88.06 | 67 | 41.5 | 5.1 | 19.4 |
| Example 9 | PC | 50 | 102.09 | 53 | 40.9 | 4.1 | 20.0 |
| Example 10 | NMP | 50 | 99.13 | 40 | 41.3 | 7.2 | 18.0 |
| Example 11 | | | | | | | |
| Example 12 | | | | | | | |
| Example 13 | | | | | | | |
| Example 14 | | | | | | | |
| Example 15 | | | | | | | |
| Example 16 | GBL | 50 | 86.08 | 147 | 44.1 | 7.4 | 18.0 |
| Example 17 | DMSO | 50 | 78.13 | 13 | 43.6 | 10.2 | 18.4 |
| Example 18 | EC | 50 | 88.06 | 67 | 41.5 | 5.1 | 19.4 |
| Example 19 | PC | 50 | 102.09 | 53 | 40.9 | 4.1 | 20.0 |
| Example 20 | NMP | 50 | 99.13 | 40 | 41.3 | 7.2 | 18.0 |
| Example 21 | | | | | | | |
| Example 22 | | | | | | | |
| Example 23 | | | | | | | |
| Example 24 | | | | | | | |
| Example 25 | | | | | | | |
| Example 26 | GBL | 70 | 86.08 | 147 | 44.1 | 7.4 | 18.0 |
| Example 27 | DMSO | 70 | 78.13 | 13 | 43.6 | 10.2 | 18.4 |
| Example 28 | EC | 70 | 88.06 | 67 | 41.5 | 5.1 | 19.4 |
| Example 29 | PC | 70 | 102.09 | 53 | 40.9 | 4.1 | 20.0 |
| Example 30 | NMP | 70 | 99.13 | 40 | 41.3 | 7.2 | 18.0 |
| Example 31 | GBL | 20 | 86.08 | 147 | 44.1 | 7.4 | 18.0 |
| Example 32 | DMSO | 20 | 78.13 | 13 | 43.6 | 10.2 | 18.4 |
| Example 33 | EC | 20 | 88.06 | 67 | 41.5 | 5.1 | 19.4 |
| Example 34 | PC | 20 | 102.09 | 53 | 40.9 | 4.1 | 20.0 |
| Example 35 | NMP | 20 | 99.13 | 40 | 41.3 | 7.2 | 18.0 |
| Example 36 | GBL | 5 | 86.08 | 147 | 44.1 | 7.4 | 18.0 |
| Example 37 | DMSO | 5 | 78.13 | 13 | 43.6 | 10.2 | 18.4 |
| Example 38 | EC | 5 | 88.06 | 67 | 41.5 | 5.1 | 19.4 |
| Example 39 | PC | 5 | 102.09 | 53 | 40.9 | 4.1 | 20.0 |
| Example 40 | NMP | 5 | 99.13 | 40 | 41.3 | 7.2 | 18.0 |

TABLE 4

Components of chemical liquid for pre-wetting
Mixture of organic solvents
Fourth organic solvent

| Table 1-1-4 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 1 | | | | | | | |
| Example 2 | | | | | | | |
| Example 3 | | | | | | | |
| Example 4 | | | | | | | |
| Example 5 | | | | | | | |
| Example 6 | | | | | | | |
| Example 7 | | | | | | | |
| Example 8 | | | | | | | |
| Example 9 | | | | | | | |
| Example 10 | | | | | | | |
| Example 11 | | | | | | | |
| Example 12 | | | | | | | |
| Example 13 | | | | | | | |
| Example 14 | | | | | | | |
| Example 15 | | | | | | | |
| Example 16 | | | | | | | |
| Example 17 | | | | | | | |

TABLE 4-continued

| Table 1-1-4 | Components of chemical liquid for pre-wetting Mixture of organic solvents Fourth organic solvent | | | | | | |
|---|---|---|---|---|---|---|---|
| | Type | Content (% by mass) | Molar mass (g/mol) | Vapor pressure (Pa) | Surface tension (mN/m) | δh $(MPa)^{0.5}$ | δd $(MPa)^{0.5}$ |
| Example 18 | | | | | | | |
| Example 19 | | | | | | | |
| Example 20 | | | | | | | |
| Example 21 | | | | | | | |
| Example 22 | | | | | | | |
| Example 23 | | | | | | | |
| Example 24 | | | | | | | |
| Example 25 | | | | | | | |
| Example 26 | | | | | | | |
| Example 27 | | | | | | | |
| Example 28 | | | | | | | |
| Example 29 | | | | | | | |
| Example 30 | | | | | | | |
| Example 31 | | | | | | | |
| Example 32 | | | | | | | |
| Example 33 | | | | | | | |
| Example 34 | | | | | | | |
| Example 35 | | | | | | | |
| Example 36 | | | | | | | |
| Example 37 | | | | | | | |
| Example 38 | | | | | | | |
| Example 39 | | | | | | | |
| Example 40 | | | | | | | |

TABLE 5

| Table 1-1-5 | Components of chemical liquid for pre-wetting Mixture of organic solvents Fourth organic solvent | | | | | | |
|---|---|---|---|---|---|---|---|
| | Type | Content (% by mass) | Molar mass (g/mol) | Vapor pressure (Pa) | Surface tension (mN/m) | δh $(MPa)^{0.5}$ | δd $(MPa)^{0.5}$ |
| Example 1 | | | | | | | |
| Example 2 | | | | | | | |
| Example 3 | | | | | | | |
| Example 4 | | | | | | | |
| Example 5 | | | | | | | |
| Example 6 | | | | | | | |
| Example 7 | | | | | | | |
| Example 8 | | | | | | | |
| Example 9 | | | | | | | |
| Example 10 | | | | | | | |
| Example 11 | | | | | | | |
| Example 12 | | | | | | | |
| Example 13 | | | | | | | |
| Example 14 | | | | | | | |
| Example 15 | | | | | | | |
| Example 16 | | | | | | | |
| Example 17 | | | | | | | |
| Example 18 | | | | | | | |
| Example 19 | | | | | | | |
| Example 20 | | | | | | | |
| Example 21 | | | | | | | |
| Example 22 | | | | | | | |
| Example 23 | | | | | | | |
| Example 24 | | | | | | | |
| Example 25 | | | | | | | |
| Example 26 | | | | | | | |
| Example 27 | | | | | | | |
| Example 28 | | | | | | | |
| Example 29 | | | | | | | |
| Example 30 | | | | | | | |
| Example 31 | | | | | | | |
| Example 32 | | | | | | | |
| Example 33 | | | | | | | |
| Example 34 | | | | | | | |

TABLE 5-continued

| Table 1-1-5 | Type | Content (% by mass) | Molar mass (g/mol) | Vapor pressure (Pa) | Surface tension (mN/m) | δh (MPa)^0.5 | δd (MPa)^0.5 |
|---|---|---|---|---|---|---|---|
| Example 35 | | | | | | | |
| Example 36 | | | | | | | |
| Example 37 | | | | | | | |
| Example 38 | | | | | | | |
| Example 39 | | | | | | | |
| Example 40 | | | | | | | |

TABLE 6

Components of chemical liquid for pre-wetting
Mixture of organic solvents

| Table 1-1-6 | Type | Content (% by mass) | Molar mass (g/mol) | Vapor pressure (Pa) | Surface tension (mN/m) | δh (MPa)^0.5 | δd (MPa)^0.5 | Vapor pressure (Pa) | Surface tension (mN/m) |
|---|---|---|---|---|---|---|---|---|---|
| Example 1 | | | | | | | | 864 | 27.8 |
| Example 2 | | | | | | | | 808 | 32.0 |
| Example 3 | | | | | | | | 642 | 29.0 |
| Example 4 | | | | | | | | 693 | 28.6 |
| Example 5 | | | | | | | | 803 | 29.2 |
| Example 6 | | | | | | | | 785 | 36.0 |
| Example 7 | | | | | | | | 682 | 36.2 |
| Example 8 | | | | | | | | 752 | 34.6 |
| Example 9 | | | | | | | | 797 | 33.8 |
| Example 10 | | | | | | | | 780 | 34.1 |
| Example 11 | | | | | | | | 906 | 30.3 |
| Example 12 | | | | | | | | 844 | 34.0 |
| Example 13 | | | | | | | | 688 | 31.3 |
| Example 14 | | | | | | | | 738 | 30.9 |
| Example 15 | | | | | | | | 847 | 31.6 |
| Example 16 | | | | | | | | 841 | 38.9 |
| Example 17 | | | | | | | | 739 | 38.9 |
| Example 18 | | | | | | | | 810 | 37.6 |
| Example 19 | | | | | | | | 857 | 37.0 |
| Example 20 | | | | | | | | 841 | 37.2 |
| Example 21 | | | | | | | | 725 | 26.9 |
| Example 22 | | | | | | | | 691 | 31.6 |
| Example 23 | | | | | | | | 494 | 28.3 |
| Example 24 | | | | | | | | 550 | 27.8 |
| Example 25 | | | | | | | | 660 | 28.4 |
| Example 26 | | | | | | | | 401 | 39.4 |
| Example 27 | | | | | | | | 279 | 39.4 |
| Example 28 | | | | | | | | 345 | 37.4 |
| Example 29 | | | | | | | | 367 | 36.5 |
| Example 30 | | | | | | | | 351 | 36.9 |
| Example 31 | | | | | | | | 397 | 32.4 |
| Example 32 | | | | | | | | 351 | 32.6 |
| Example 33 | | | | | | | | 377 | 31.6 |
| Example 34 | | | | | | | | 386 | 31.1 |
| Example 35 | | | | | | | | 380 | 31.2 |
| Example 36 | | | | | | | | 486 | 34.7 |
| Example 37 | | | | | | | | 476 | 34.7 |
| Example 38 | | | | | | | | 482 | 34.5 |
| Example 39 | | | | | | | | 485 | 34.4 |
| Example 40 | | | | | | | | 484 | 34.5 |

TABLE 7

Components of chemical liquid for pre-wetting

| Table 1-1-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 1 | Balance | 0.004 | 0.002 | 0.006 | 0.002 | 0.030 | 0.044 |
| Example 2 | Balance | 0.004 | 0.004 | 0.006 | 0.002 | 0.032 | 0.048 |
| Example 3 | Balance | 0.004 | 0.002 | 0.004 | 0.004 | 0.034 | 0.048 |
| Example 4 | Balance | 0.002 | 0.002 | 0.006 | 0.002 | 0.038 | 0.050 |
| Example 5 | Balance | 0.006 | 0.002 | 0.008 | 0.002 | 0.036 | 0.054 |
| Example 6 | Balance | 0.006 | 0.002 | 0.004 | 0.002 | 0.034 | 0.048 |
| Example 7 | Balance | 0.004 | 0.002 | 0.006 | 0.002 | 0.030 | 0.044 |
| Example 8 | Balance | 0.006 | 0.002 | 0.004 | 0.004 | 0.032 | 0.048 |
| Example 9 | Balance | 0.004 | 0.004 | 0.008 | 0.002 | 0.036 | 0.054 |
| Example 10 | Balance | 0.004 | 0.006 | 0.006 | 0.004 | 0.042 | 0.062 |
| Example 11 | Balance | 0.008 | 0.002 | 0.008 | 0.002 | 0.038 | 0.058 |
| Example 12 | Balance | 0.004 | 0.004 | 0.004 | 0.004 | 0.040 | 0.056 |
| Example 13 | Balance | 0.004 | 0.002 | 0.006 | 0.004 | 0.032 | 0.048 |
| Example 14 | Balance | 0.004 | 0.004 | 0.004 | 0.002 | 0.030 | 0.044 |
| Example 15 | Balance | 0.004 | 0.004 | 0.006 | 0.004 | 0.032 | 0.050 |
| Example 16 | Balance | 0.004 | 0.004 | 0.006 | 0.004 | 0.034 | 0.052 |
| Example 17 | Balance | 0.004 | 0.002 | 0.006 | 0.004 | 0.032 | 0.048 |
| Example 18 | Balance | 0.004 | 0.004 | 0.006 | 0.002 | 0.034 | 0.050 |
| Example 19 | Balance | 0.006 | 0.004 | 0.004 | 0.004 | 0.030 | 0.048 |
| Example 20 | Balance | 0.004 | 0.002 | 0.006 | 0.002 | 0.032 | 0.046 |
| Example 21 | Balance | 0.008 | 0.006 | 0.004 | 0.002 | 0.032 | 0.052 |
| Example 22 | Balance | 0.006 | 0.004 | 0.004 | 0.004 | 0.026 | 0.044 |
| Example 23 | Balance | 0.004 | 0.002 | 0.008 | 0.002 | 0.028 | 0.044 |
| Example 24 | Balance | 0.006 | 0.004 | 0.006 | 0.004 | 0.030 | 0.050 |
| Example 25 | Balance | 0.004 | 0.002 | 0.004 | 0.004 | 0.032 | 0.046 |
| Example 26 | Balance | 0.006 | 0.002 | 0.006 | 0.002 | 0.036 | 0.052 |
| Example 27 | Balance | 0.004 | 0.004 | 0.006 | 0.004 | 0.036 | 0.054 |
| Example 28 | Balance | 0.006 | 0.002 | 0.006 | 0.002 | 0.04 | 0.056 |
| Example 29 | Balance | 0.004 | 0.004 | 0.004 | 0.002 | 0.042 | 0.056 |
| Example 30 | Balance | 0.006 | 0.002 | 0.006 | 0.004 | 0.032 | 0.05 |
| Example 31 | Balance | 0.004 | 0.004 | 0.006 | 0.004 | 0.026 | 0.044 |
| Example 32 | Balance | 0.006 | 0.004 | 0.006 | 0.002 | 0.028 | 0.046 |
| Example 33 | Balance | 0.008 | 0.006 | 0.004 | 0.002 | 0.03 | 0.05 |
| Example 34 | Balance | 0.004 | 0.004 | 0.006 | 0.006 | 0.032 | 0.052 |
| Example 35 | Balance | 0.004 | 0.002 | 0.006 | 0.002 | 0.036 | 0.05 |
| Example 36 | Balance | 0.006 | 0.004 | 0.004 | 0.002 | 0.036 | 0.052 |
| Example 37 | Balance | 0.004 | 0.002 | 0.006 | 0.004 | 0.032 | 0.048 |
| Example 38 | Balance | 0.006 | 0.004 | 0.004 | 0.002 | 0.038 | 0.054 |
| Example 39 | Balance | 0.004 | 0.002 | 0.006 | 0.002 | 0.032 | 0.046 |
| Example 40 | Balance | 0.006 | 0.004 | 0.006 | 0.004 | 0.032 | 0.052 |

TABLE 8

Components of chemical liquid for pre-wetting

| Table 1-1-8 | Impurity metal Content of impurity metal as particles (mass ppt) | | | | | | Organic impurity Specific organic compound | |
|---|---|---|---|---|---|---|---|---|
| | Fe | Cr | Ni | Pb | Others | Total | Boiling point: equal to or higher than 250° C. Number of carbon atoms: equal to or greater than 8 | Boiling point: equal to or higher than 250° C. Number of carbon atoms: equal to or greater than 12 |
| Example 1 | 0.002 | 0.001 | 0.003 | 0.001 | 0.015 | 0.022 | A | A |
| Example 2 | 0.002 | 0.002 | 0.003 | 0.001 | 0.016 | 0.024 | A | A |
| Example 3 | 0.002 | 0.001 | 0.002 | 0.002 | 0.017 | 0.024 | A | A |
| Example 4 | 0.001 | 0.001 | 0.003 | 0.001 | 0.019 | 0.025 | A | A |
| Example 5 | 0.003 | 0.001 | 0.004 | 0.001 | 0.018 | 0.027 | A | A |
| Example 6 | 0.003 | 0.001 | 0.002 | 0.001 | 0.017 | 0.024 | A | A |
| Example 7 | 0.002 | 0.001 | 0.003 | 0.001 | 0.015 | 0.022 | A | A |
| Example 8 | 0.003 | 0.001 | 0.002 | 0.002 | 0.016 | 0.024 | A | A |
| Example 9 | 0.002 | 0.002 | 0.004 | 0.001 | 0.018 | 0.027 | A | A |
| Example 10 | 0.002 | 0.003 | 0.003 | 0.002 | 0.021 | 0.031 | A | A |
| Example 11 | 0.004 | 0.001 | 0.004 | 0.001 | 0.019 | 0.029 | A | A |

TABLE 8-continued

Components of chemical liquid for pre-wetting

| Table 1-1-8 | Impurity metal Content of impurity metal as particles (mass ppt) | | | | | | Organic impurity Specific organic compound | |
|---|---|---|---|---|---|---|---|---|
| | Fe | Cr | Ni | Pb | Others | Total | Boiling point: equal to or higher than 250° C. Number of carbon atoms: equal to or greater than 8 | Boiling point: equal to or higher than 250° C. Number of carbon atoms: equal to or greater than 12 |
| Example 12 | 0.002 | 0.002 | 0.002 | 0.002 | 0.020 | 0.028 | A | A |
| Example 13 | 0.002 | 0.001 | 0.003 | 0.002 | 0.016 | 0.024 | A | A |
| Example 14 | 0.002 | 0.002 | 0.002 | 0.001 | 0.015 | 0.022 | A | A |
| Example 15 | 0.002 | 0.002 | 0.003 | 0.002 | 0.016 | 0.025 | A | A |
| Example 16 | 0.002 | 0.002 | 0.003 | 0.002 | 0.017 | 0.026 | A | A |
| Example 17 | 0.002 | 0.001 | 0.003 | 0.002 | 0.016 | 0.024 | A | A |
| Example 18 | 0.002 | 0.002 | 0.003 | 0.001 | 0.017 | 0.025 | A | A |
| Example 19 | 0.003 | 0.002 | 0.002 | 0.002 | 0.015 | 0.024 | A | A |
| Example 20 | 0.002 | 0.001 | 0.003 | 0.001 | 0.016 | 0.023 | A | A |
| Example 21 | 0.004 | 0.003 | 0.002 | 0.001 | 0.016 | 0.026 | A | A |
| Example 22 | 0.003 | 0.002 | 0.002 | 0.002 | 0.013 | 0.022 | A | A |
| Example 23 | 0.002 | 0.001 | 0.004 | 0.001 | 0.014 | 0.022 | A | A |
| Example 24 | 0.003 | 0.002 | 0.003 | 0.002 | 0.015 | 0.025 | A | A |
| Example 25 | 0.002 | 0.001 | 0.002 | 0.002 | 0.016 | 0.023 | A | A |
| Example 26 | 0.002 | 0.001 | 0.003 | 0.001 | 0.015 | 0.022 | A | A |
| Example 27 | 0.002 | 0.002 | 0.003 | 0.001 | 0.016 | 0.024 | A | A |
| Example 28 | 0.002 | 0.001 | 0.002 | 0.002 | 0.017 | 0.024 | A | A |
| Example 29 | 0.001 | 0.001 | 0.003 | 0.001 | 0.019 | 0.025 | A | A |
| Example 30 | 0.003 | 0.001 | 0.004 | 0.001 | 0.018 | 0.027 | A | A |
| Example 31 | 0.004 | 0.001 | 0.004 | 0.001 | 0.019 | 0.029 | A | A |
| Example 32 | 0.002 | 0.002 | 0.002 | 0.002 | 0.020 | 0.028 | A | A |
| Example 33 | 0.002 | 0.001 | 0.003 | 0.002 | 0.016 | 0.024 | A | A |
| Example 34 | 0.002 | 0.002 | 0.002 | 0.001 | 0.015 | 0.022 | A | A |
| Example 35 | 0.002 | 0.002 | 0.003 | 0.002 | 0.016 | 0.025 | A | A |
| Example 36 | 0.002 | 0.002 | 0.003 | 0.002 | 0.017 | 0.026 | A | A |
| Example 37 | 0.002 | 0.001 | 0.003 | 0.002 | 0.016 | 0.024 | A | A |
| Example 38 | 0.002 | 0.002 | 0.003 | 0.001 | 0.017 | 0.025 | A | A |
| Example 39 | 0.003 | 0.002 | 0.002 | 0.002 | 0.015 | 0.024 | A | A |
| Example 40 | 0.002 | 0.001 | 0.003 | 0.001 | 0.016 | 0.023 | A | A |

TABLE 9

Components of chemical liquid for pre-wetting

| Table 1-1-9 | Organic impurity Content of organic impurity | | | | | Physical properties of chemical liquid | |
|---|---|---|---|---|---|---|---|
| | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | for pre-wetting Number of coarse particles (Number of objects to be counted) (Number/mL) | Evaluation Defect inhibition performance |
| Example 1 | 250 | 1 | 0.5 | 500 | 0.10% | 6 | AA |
| Example 2 | 250 | 1 | 0.5 | 500 | 0.10% | 6 | AA |
| Example 3 | 250 | 1 | 0.5 | 500 | 0.10% | 6 | AA |
| Example 4 | 250 | 1 | 0.5 | 500 | 0.10% | 6 | AA |
| Example 5 | 250 | 1 | 0.5 | 500 | 0.10% | 6 | AA |
| Example 6 | 250 | 1 | 0.5 | 500 | 0.10% | 6 | AA |
| Example 7 | 250 | 1 | 0.5 | 500 | 0.10% | 6 | AA |
| Example 8 | 250 | 1 | 0.5 | 500 | 0.10% | 6 | AA |
| Example 9 | 250 | 1 | 0.5 | 500 | 0.10% | 6 | AA |
| Example 10 | 250 | 1 | 0.5 | 500 | 0.10% | 6 | AA |
| Example 11 | 250 | 1 | 0.5 | 500 | 0.10% | 6 | AA |
| Example 12 | 250 | 1 | 0.5 | 500 | 0.10% | 6 | AA |
| Example 13 | 250 | 1 | 0.5 | 500 | 0.10% | 6 | AA |
| Example 14 | 250 | 1 | 0.5 | 500 | 0.10% | 6 | AA |
| Example 15 | 250 | 1 | 0.5 | 500 | 0.10% | 6 | AA |
| Example 16 | 250 | 1 | 0.5 | 500 | 0.10% | 6 | A |
| Example 17 | 250 | 1 | 0.5 | 500 | 0.10% | 6 | A |
| Example 18 | 250 | 1 | 0.5 | 500 | 0.10% | 6 | AA |
| Example 19 | 250 | 1 | 0.5 | 500 | 0.10% | 6 | AA |
| Example 20 | 250 | 1 | 0.5 | 500 | 0.10% | 6 | AA |

TABLE 9-continued

| | Components of chemical liquid for pre-wetting | | | | | Physical properties of chemical liquid | |
|---|---|---|---|---|---|---|---|
| | | Organic impurity Content of organic impurity | | | | | |
| Table 1-1-9 | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | for pre-wetting Number of coarse particles (Number of objects to be counted) (Number/mL) | Evaluation Defect inhibition performance |
| Example 21 | 250 | 1 | 0.5 | 500 | 0.10% | 6 | B |
| Example 22 | 250 | 1 | 0.5 | 500 | 0.10% | 6 | AA |
| Example 23 | 250 | 1 | 0.5 | 500 | 0.10% | 6 | AA |
| Example 24 | 250 | 1 | 0.5 | 500 | 0.10% | 6 | AA |
| Example 25 | 250 | 1 | 0.5 | 500 | 0.10% | 6 | AA |
| Example 26 | 250 | 1 | 0.5 | 500 | 0.10% | 6 | B |
| Example 27 | 250 | 1 | 0.5 | 500 | 0.10% | 6 | A |
| Example 28 | 250 | 1 | 0.5 | 500 | 0.10% | 6 | AA |
| Example 29 | 250 | 1 | 0.5 | 500 | 0.10% | 6 | AA |
| Example 30 | 250 | 1 | 0.5 | 500 | 0.10% | 6 | AA |
| Example 31 | 250 | 1 | 0.5 | 500 | 0.10% | 6 | AA |
| Example 32 | 250 | 1 | 0.5 | 500 | 0.10% | 6 | AA |
| Example 33 | 250 | 1 | 0.5 | 500 | 0.10% | 6 | AA |
| Example 34 | 250 | 1 | 0.5 | 500 | 0.10% | 6 | AA |
| Example 35 | 250 | 1 | 0.5 | 500 | 0.10% | 6 | AA |
| Example 36 | 250 | 1 | 0.5 | 500 | 0.10% | 6 | AA |
| Example 37 | 250 | 1 | 0.5 | 500 | 0.10% | 6 | AA |
| Example 38 | 250 | 1 | 0.5 | 500 | 0.10% | 6 | AA |
| Example 39 | 250 | 1 | 0.5 | 500 | 0.10% | 6 | AA |
| Example 40 | 250 | 1 | 0.5 | 500 | 0.10% | 6 | AA |

TABLE 10

| | Evaluation | | | | | | | | | |
|---|---|---|---|---|---|---|---|---|---|---|
| | Type of resist composition | | | | | Type of resist composition | | | | |
| | | | | Resist saving properties | | | | | Resist saving properties | |
| | | Affinity | | | Film thickness | | Affinity | | | Film thickness |
| Table 1-1-10 | | Rsq1 | SRsq | Uniformity | controllability | | Rsq1 | SRsq | Uniformity | controllability |
| Example 1 | 1 | A | A | A | A | 2 | A | A | A | A |
| Example 2 | 1 | A | A | AA | A | 2 | A | A | AA | A |
| Example 3 | 1 | A | A | AA | A | 2 | A | A | AA | A |
| Example 4 | 1 | A | A | AA | A | 2 | A | A | AA | A |
| Example 5 | 1 | A | A | A | A | 2 | A | A | A | A |
| Example 6 | 1 | A | A | AA | A | 2 | A | A | AA | A |
| Example 7 | 1 | A | A | AA | A | 2 | A | A | AA | A |
| Example 8 | 1 | A | A | AA | A | 2 | A | A | AA | A |
| Example 9 | 1 | A | A | AA | A | 2 | A | A | AA | A |
| Example 10 | 1 | A | A | AA | A | 2 | A | A | AA | A |
| Example 11 | 1 | A | A | AA | A | 2 | A | A | AA | A |
| Example 12 | 1 | A | A | AA | A | 2 | A | A | AA | A |
| Example 13 | 1 | A | A | AA | A | 2 | A | A | AA | A |
| Example 14 | 1 | A | A | AA | A | 2 | A | A | AA | A |
| Example 15 | 1 | A | A | AA | A | 2 | A | A | AA | A |
| Example 16 | 1 | A | A | A | B | 2 | A | A | A | B |
| Example 17 | 1 | A | A | A | B | 2 | A | A | A | B |
| Example 18 | 1 | A | A | A | A | 2 | A | A | A | A |
| Example 19 | 1 | A | A | A | A | 2 | A | A | A | A |
| Example 20 | 1 | A | A | A | A | 2 | A | A | A | A |
| Example 21 | 1 | A | A | A | A | 2 | A | A | A | A |
| Example 22 | 1 | A | A | AA | A | 2 | A | A | AA | A |
| Example 23 | 1 | A | A | AA | A | 2 | A | A | AA | A |
| Example 24 | 1 | A | A | A | A | 2 | A | A | A | A |
| Example 25 | 1 | A | A | A | A | 2 | A | A | A | A |
| Example 26 | 1 | A | A | A | B | 2 | A | A | A | B |
| Example 27 | 1 | A | A | A | B | 2 | A | A | A | B |
| Example 28 | 1 | A | A | A | A | 2 | A | A | A | A |
| Example 29 | 1 | A | A | A | A | 2 | A | A | A | A |
| Example 30 | 1 | A | A | A | A | 2 | A | A | A | A |
| Example 31 | 1 | A | A | AA | A | 2 | A | A | AA | A |

TABLE 10-continued

| Table 1-1-10 | | Type of resist composition | | | | | Type of resist composition | | | |
|---|---|---|---|---|---|---|---|---|---|---|
| | | Evaluation | | | | | | | | |
| | | Resist saving properties | | | | | Resist saving properties | | | |
| | | Affinity | | | Film thickness | | Affinity | | | Film thickness |
| | | Rsq1 | SRsq | Uniformity | controllability | | Rsq1 | SRsq | Uniformity | controllability |
| Example 32 | 1 | A | A | AA | A | 2 | A | A | AA | A |
| Example 33 | 1 | A | A | AA | A | 2 | A | A | AA | A |
| Example 34 | 1 | A | A | AA | A | 2 | A | A | AA | A |
| Example 35 | 1 | A | A | AA | A | 2 | A | A | AA | A |
| Example 36 | 1 | A | A | AA | A | 2 | A | A | A | A |
| Example 37 | 1 | A | A | AA | A | 2 | A | A | A | A |
| Example 38 | 1 | A | A | AA | A | 2 | A | A | A | A |
| Example 39 | 1 | A | A | AA | A | 2 | A | A | A | A |
| Example 40 | 1 | A | A | AA | A | 2 | A | A | A | A |

TABLE 11

| Table 1-1-11 | | Type of resist composition | | | | | Type of resist composition | | | |
|---|---|---|---|---|---|---|---|---|---|---|
| | | Evaluation | | | | | | | | |
| | | Resist saving properties | | | | | Resist saving properties | | | |
| | | Affinity | | | Film thickness | | Affinity | | | Film thickness |
| | | Rsq1 | SRsq | Uniformity | controllability | | Rsq1 | SRsq | Uniformity | controllability |
| Example 1 | 3 | A | A | AA | A | 4 | A | A | A | A |
| Example 2 | 3 | A | A | AA | A | 4 | A | A | AA | A |
| Example 3 | 3 | A | A | AA | A | 4 | A | A | AA | A |
| Example 4 | 3 | A | A | AA | A | 4 | A | A | AA | A |
| Example 5 | 3 | A | A | AA | A | 4 | A | A | A | A |
| Example 6 | 3 | A | A | AA | A | 4 | A | A | AA | A |
| Example 7 | 3 | A | A | AA | A | 4 | A | A | AA | A |
| Example 8 | 3 | A | A | AA | A | 4 | A | A | AA | A |
| Example 9 | 3 | A | A | AA | A | 4 | A | A | AA | A |
| Example 10 | 3 | A | A | AA | A | 4 | A | A | AA | A |
| Example 11 | 3 | A | A | AA | A | 4 | A | A | AA | A |
| Example 12 | 3 | A | A | AA | A | 4 | A | A | AA | A |
| Example 13 | 3 | A | A | AA | A | 4 | A | A | AA | A |
| Example 14 | 3 | A | A | AA | A | 4 | A | A | AA | A |
| Example 15 | 3 | A | A | AA | A | 4 | A | A | AA | A |
| Example 16 | 3 | A | A | AA | B | 4 | A | A | A | B |
| Example 17 | 3 | A | A | AA | B | 4 | A | A | A | B |
| Example 18 | 3 | A | A | AA | A | 4 | A | A | A | A |
| Example 19 | 3 | A | A | AA | A | 4 | A | A | A | A |
| Example 20 | 3 | A | A | AA | A | 4 | A | A | A | A |
| Example 21 | 3 | A | A | AA | A | 4 | A | A | A | A |
| Example 22 | 3 | A | A | AA | A | 4 | A | A | AA | A |
| Example 23 | 3 | A | A | AA | A | 4 | A | A | AA | A |
| Example 24 | 3 | A | A | AA | A | 4 | A | A | A | A |
| Example 25 | 3 | A | A | AA | A | 4 | A | A | A | A |
| Example 26 | 3 | A | A | AA | B | 4 | A | A | A | B |
| Example 27 | 3 | A | A | AA | B | 4 | A | A | A | B |
| Example 28 | 3 | A | A | AA | A | 4 | A | A | A | A |
| Example 29 | 3 | A | A | AA | A | 4 | A | A | A | A |
| Example 30 | 3 | A | A | AA | A | 4 | A | A | A | A |
| Example 31 | 3 | A | A | AA | A | 4 | A | A | AA | A |
| Example 32 | 3 | A | A | AA | A | 4 | A | A | AA | A |
| Example 33 | 3 | A | A | AA | A | 4 | A | A | AA | A |
| Example 34 | 3 | A | A | AA | A | 4 | A | A | AA | A |
| Example 35 | 3 | A | A | AA | A | 4 | A | A | AA | A |
| Example 36 | 3 | A | A | AA | A | 4 | A | A | A | A |
| Example 37 | 3 | A | A | AA | A | 4 | A | A | A | A |
| Example 38 | 3 | A | A | AA | A | 4 | A | A | A | A |
| Example 39 | 3 | A | A | AA | A | 4 | A | A | A | A |
| Example 40 | 3 | A | A | AA | A | 4 | A | A | A | A |

TABLE 12

| Table 1-1-12 | Rsq1 | Affinity SRsq | Uniformity | Film thickness controllability | | Rsq1 | Affinity SRsq | Uniformity | Film thickness controllability |
|---|---|---|---|---|---|---|---|---|---|
| Example 1 | 5 | A | A | A | A | 6 | A | A | A | A |
| Example 2 | 5 | A | A | AA | A | 6 | A | A | AA | A |
| Example 3 | 5 | A | A | AA | A | 6 | A | A | AA | A |
| Example 4 | 5 | A | A | AA | A | 6 | A | A | AA | A |
| Example 5 | 5 | A | A | A | A | 6 | A | A | A | A |
| Example 6 | 5 | A | A | AA | A | 6 | A | A | AA | A |
| Example 7 | 5 | A | A | AA | A | 6 | A | A | AA | A |
| Example 8 | 5 | A | A | AA | A | 6 | A | A | AA | A |
| Example 9 | 5 | A | A | AA | A | 6 | A | A | AA | A |
| Example 10 | 5 | A | A | AA | A | 6 | A | A | AA | A |
| Example 11 | 5 | A | A | AA | A | 6 | A | A | AA | A |
| Example 12 | 5 | A | A | AA | A | 6 | A | A | AA | A |
| Example 13 | 5 | A | A | AA | A | 6 | A | A | AA | A |
| Example 14 | 5 | A | A | AA | A | 6 | A | A | AA | A |
| Example 15 | 5 | A | A | AA | A | 6 | A | A | AA | A |
| Example 16 | 5 | A | A | A | B | 6 | A | A | A | B |
| Example 17 | 5 | A | A | A | B | 6 | A | A | A | B |
| Example 18 | 5 | A | A | A | A | 6 | A | A | A | A |
| Example 19 | 5 | A | A | A | A | 6 | A | A | A | A |
| Example 20 | 5 | A | A | A | A | 6 | A | A | A | A |
| Example 21 | 5 | A | A | A | A | 6 | A | A | A | A |
| Example 22 | 5 | A | A | AA | A | 6 | A | A | AA | A |
| Example 23 | 5 | A | A | AA | A | 6 | A | A | AA | A |
| Example 24 | 5 | A | A | A | A | 6 | A | A | A | A |
| Example 25 | 5 | A | A | A | A | 6 | A | A | A | A |
| Example 26 | 5 | A | A | A | B | 6 | A | A | A | B |
| Example 27 | 5 | A | A | A | B | 6 | A | A | A | B |
| Example 28 | 5 | A | A | A | A | 6 | A | A | A | A |
| Example 29 | 5 | A | A | A | A | 6 | A | A | A | A |
| Example 30 | 5 | A | A | A | A | 6 | A | A | A | A |
| Example 31 | 5 | A | A | AA | A | 6 | A | A | AA | A |
| Example 32 | 5 | A | A | AA | A | 6 | A | A | AA | A |
| Example 33 | 5 | A | A | AA | A | 6 | A | A | AA | A |
| Example 34 | 5 | A | A | AA | A | 6 | A | A | AA | A |
| Example 35 | 5 | A | A | AA | A | 6 | A | A | AA | A |
| Example 36 | 5 | A | A | A | A | 6 | A | A | A | A |
| Example 37 | 5 | A | A | A | A | 6 | A | A | A | A |
| Example 38 | 5 | A | A | A | A | 6 | A | A | A | A |
| Example 39 | 5 | A | A | A | A | 6 | A | A | A | A |
| Example 40 | 5 | A | A | A | A | 6 | A | A | A | A |

TABLE 13

| Table 1-1-13 | Rsq1 | Affinity SRsq | Uniformity | Film thickness controllability | Table 1-1-13 | Rsq1 | Affinity SRsq | Uniformity | Film thickness controllability |
|---|---|---|---|---|---|---|---|---|---|
| Example 1 | 7 | A | A | A | A | Example 14 | 7 | A | A | AA | A |
| Example 2 | 7 | A | A | AA | A | Example 15 | 7 | A | A | AA | A |
| Example 3 | 7 | A | A | AA | A | Example 16 | 7 | A | A | A | B |
| Example 4 | 7 | A | A | AA | A | Example 17 | 7 | A | A | A | B |
| Example 5 | 7 | A | A | A | A | Example 18 | 7 | A | A | A | A |
| Example 6 | 7 | A | A | AA | A | Example 19 | 7 | A | A | A | A |
| Example 7 | 7 | A | A | AA | A | Example 20 | 7 | A | A | A | A |
| Example 8 | 7 | A | A | AA | A | Example 21 | 7 | A | A | A | A |
| Example 9 | 7 | A | A | AA | A | Example 22 | 7 | A | A | AA | A |
| Example 10 | 7 | A | A | AA | A | Example 23 | 7 | A | A | AA | A |
| Example 11 | 7 | A | A | AA | A | Example 24 | 7 | A | A | A | A |
| Example 12 | 7 | A | A | AA | A | Example 25 | 7 | A | A | A | A |
| Example 13 | 7 | A | A | AA | A | Example 26 | 7 | A | A | A | B |

TABLE 13-continued

| | | Evaluation Type of resist composition | | | |
|---|---|---|---|---|---|
| | | Affinity | | Resist saving properties | |
| Table 1-1-13 | | Rsq1 | SRsq | Uniformity | Film thickness controllability |
| Example 27 | 7 | A | A | A | B |
| Example 28 | 7 | A | A | A | A |
| Example 29 | 7 | A | A | A | A |
| Example 30 | 7 | A | A | A | A |
| Example 31 | 7 | A | A | AA | A |
| Example 32 | 7 | A | A | AA | A |
| Example 33 | 7 | A | A | AA | A |
| Example 34 | 7 | A | A | AA | A |
| Example 35 | 7 | A | A | AA | A |
| Example 36 | 7 | A | A | A | A |
| Example 37 | 7 | A | A | A | A |
| Example 38 | 7 | A | A | A | A |
| Example 39 | 7 | A | A | A | A |
| Example 40 | 7 | A | A | A | A |

TABLE 14

| | Components of chemical liquid for pre-wetting Mixture of organic solvents First organic solvent | | | | | | |
|---|---|---|---|---|---|---|---|
| Table 1-2-1 | Type | Content (% by mass) | Molar mass (g/mol) | Vapor pressure (Pa) | Surface tension (mN/m) | δh $(MPa)^{0.5}$ | δd $(MPa)^{0.5}$ |
| Example 41 | | | | | | | |
| Example 42 | | | | | | | |
| Example 43 | | | | | | | |
| Example 44 | | | | | | | |
| Example 45 | | | | | | | |
| Example 46 | | | | | | | |
| Example 47 | | | | | | | |
| Example 48 | | | | | | | |
| Example 49 | | | | | | | |
| Example 50 | | | | | | | |
| Example 51 | | | | | | | |
| Example 52 | | | | | | | |
| Example 53 | | | | | | | |
| Example 54 | | | | | | | |
| Example 55 | | | | | | | |
| Example 56 | PGME | 20 | 90.1 | 1,453 | 27.6 | 5.8 | 15.8 |
| Example 57 | PGME | 20 | 90.1 | 1,453 | 27.6 | 5.8 | 15.8 |
| Example 58 | PGME | 20 | 90.1 | 1,453 | 27.6 | 5.8 | 15.8 |
| Example 59 | PGME | 20 | 90.1 | 1,453 | 27.6 | 5.8 | 15.8 |
| Example 60 | PGME | 20 | 90.1 | 1,453 | 27.6 | 5.8 | 15.8 |
| Example 61 | PGME | 20 | 90.1 | 1,453 | 27.6 | 5.8 | 15.8 |
| Example 62 | PGME | 20 | 90.1 | 1,453 | 27.6 | 5.8 | 15.8 |
| Example 63 | PGME | 20 | 90.1 | 1,453 | 27.6 | 5.8 | 15.8 |
| Example 64 | PGME | 20 | 90.1 | 1,453 | 27.6 | 5.8 | 15.8 |
| Example 65 | PGME | 20 | 90.1 | 1,453 | 27.6 | 5.8 | 15.8 |
| Example 66 | PGME | 20 | 90.1 | 1,453 | 27.6 | 5.8 | 15.8 |
| Example 67 | PGME | 20 | 90.1 | 1,453 | 27.6 | 5.8 | 15.8 |
| Example 68 | PGME | 20 | 90.1 | 1,453 | 27.6 | 5.8 | 15.8 |
| Example 69 | PGME | 20 | 90.1 | 1,453 | 27.6 | 5.8 | 15.8 |
| Example 70 | PGME | 20 | 90.1 | 1,453 | 27.6 | 5.8 | 15.8 |
| Example 71 | PGME | 20 | 90.1 | 1,453 | 27.6 | 5.8 | 15.8 |
| Example 72 | PGME | 20 | 90.1 | 1,453 | 27.6 | 5.8 | 15.8 |
| Example 73 | PGME | 20 | 90.1 | 1,453 | 27.6 | 5.8 | 15.8 |
| Example 74 | PGME | 20 | 90.1 | 1,453 | 27.6 | 5.8 | 15.8 |
| Example 75 | PGME | 20 | 90.1 | 1,453 | 27.6 | 5.8 | 15.8 |
| Example 76 | PGME | 20 | 90.1 | 1,453 | 27.6 | 5.8 | 15.8 |
| Example 77 | PGME | 20 | 90.1 | 1,453 | 27.6 | 5.8 | 15.8 |
| Example 78 | PGME | 20 | 90.1 | 1,453 | 27.6 | 5.8 | 15.8 |
| Example 79 | PGME | 20 | 90.1 | 1,453 | 27.6 | 5.8 | 15.8 |
| Example 80 | PGME | 20 | 90.1 | 1,453 | 27.6 | 5.8 | 15.8 |

TABLE 15

Components of chemical liquid for pre-wetting
Mixture of organic solvents
Second organic solvent

| Table 1-2-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 41 | EL | 80 | 118.13 | 187 | 29.8 | 12.5 | 16.0 |
| Example 42 | EL | 80 | 118.13 | 187 | 29.8 | 12.5 | 16.0 |
| Example 43 | EL | 80 | 118.13 | 187 | 29.8 | 12.5 | 16.0 |
| Example 44 | EL | 80 | 118.13 | 187 | 29.8 | 12.5 | 16.0 |
| Example 45 | EL | 80 | 118.13 | 187 | 29.8 | 12.5 | 16.0 |
| Example 46 | HBM | 80 | 118.13 | 267 | 29.1 | 12.2 | 16.5 |
| Example 47 | HBM | 80 | 118.13 | 267 | 29.1 | 12.2 | 16.5 |
| Example 48 | HBM | 80 | 118.13 | 267 | 29.1 | 12.2 | 16.5 |
| Example 49 | HBM | 80 | 118.13 | 267 | 29.1 | 12.2 | 16.5 |
| Example 50 | HBM | 80 | 118.13 | 267 | 29.1 | 12.2 | 16.5 |
| Example 51 | DBCPN | 80 | 130.18 | 400 | 30.2 | 3.4 | 16.1 |
| Example 52 | DBCPN | 80 | 130.18 | 400 | 30.2 | 3.4 | 16.1 |
| Example 53 | DBCPN | 80 | 130.18 | 400 | 30.2 | 3.4 | 16.1 |
| Example 54 | DBCPN | 80 | 130.18 | 400 | 30.2 | 3.4 | 16.1 |
| Example 55 | DBCPN | 80 | 130.18 | 400 | 30.2 | 3.4 | 16.1 |
| Example 56 | PGMEA | 60 | 132.16 | 493 | 27.9 | 9.8 | 15.6 |
| Example 57 | PGMEA | 60 | 132.16 | 493 | 27.9 | 9.8 | 15.6 |
| Example 58 | PGMEA | 60 | 132.16 | 493 | 27.9 | 9.8 | 15.6 |
| Example 59 | PGMEA | 60 | 132.16 | 493 | 27.9 | 9.8 | 15.6 |
| Example 60 | PGMEA | 60 | 132.16 | 493 | 27.9 | 9.8 | 15.6 |
| Example 61 | CyHx | 60 | 98.14 | 507 | 34.1 | 5.1 | 17.8 |
| Example 62 | CyHx | 60 | 98.14 | 507 | 34.1 | 5.1 | 17.8 |
| Example 63 | CyHx | 60 | 98.14 | 507 | 34.1 | 5.1 | 17.8 |
| Example 64 | CyHx | 60 | 98.14 | 507 | 34.1 | 5.1 | 17.8 |
| Example 65 | CyHx | 60 | 98.14 | 507 | 34.1 | 5.1 | 17.8 |
| Example 66 | EL | 60 | 118.13 | 187 | 29.8 | 12.5 | 16.0 |
| Example 67 | EL | 60 | 118.13 | 187 | 29.8 | 12.5 | 16.0 |
| Example 68 | EL | 60 | 118.13 | 187 | 29.8 | 12.5 | 16.0 |
| Example 69 | EL | 60 | 118.13 | 187 | 29.8 | 12.5 | 16.0 |
| Example 70 | EL | 60 | 118.13 | 187 | 29.8 | 12.5 | 16.0 |
| Example 71 | HBM | 60 | 118.13 | 267 | 29.1 | 12.2 | 16.5 |
| Example 72 | HBM | 60 | 118.13 | 267 | 29.1 | 12.2 | 16.5 |
| Example 73 | HBM | 60 | 118.13 | 267 | 29.1 | 12.2 | 16.5 |
| Example 74 | HBM | 60 | 118.13 | 267 | 29.1 | 12.2 | 16.5 |
| Example 75 | HBM | 60 | 118.13 | 267 | 29.1 | 12.2 | 16.5 |
| Example 76 | DBCPN | 60 | 130.18 | 400 | 30.2 | 3.4 | 16.1 |
| Example 77 | DBCPN | 60 | 130.18 | 400 | 30.2 | 3.4 | 16.1 |
| Example 78 | DBCPN | 60 | 130.18 | 400 | 30.2 | 3.4 | 16.1 |
| Example 79 | DBCPN | 60 | 130.18 | 400 | 30.2 | 3.4 | 16.1 |
| Example 80 | DBCPN | 60 | 130.18 | 400 | 30.2 | 3.4 | 16.1 |

TABLE 16

Components of chemical liquid for pre-wetting
Mixture of organic solvents
Third organic solvent

| Table 1-2-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 41 | GBL | 20 | 86.08 | 147 | 44.1 | 7.4 | 18.0 |
| Example 42 | DMSO | 20 | 78.13 | 13 | 43.6 | 10.2 | 18.4 |
| Example 43 | EC | 20 | 88.06 | 67 | 41.5 | 5.1 | 19.4 |
| Example 44 | PC | 20 | 102.09 | 53 | 40.9 | 4.1 | 20.0 |
| Example 45 | NMP | 20 | 99.13 | 40 | 41.3 | 7.2 | 18.0 |
| Example 46 | GBL | 20 | 86.08 | 147 | 44.1 | 7.4 | 18.0 |
| Example 47 | DMSO | 20 | 78.13 | 13 | 43.6 | 10.2 | 18.4 |
| Example 48 | EC | 20 | 88.06 | 67 | 41.5 | 5.1 | 19.4 |
| Example 49 | PC | 20 | 102.09 | 53 | 40.9 | 4.1 | 20.0 |
| Example 50 | NMP | 20 | 99.13 | 40 | 41.3 | 7.2 | 18.0 |
| Example 51 | GBL | 20 | 86.08 | 147 | 44.1 | 7.4 | 18.0 |
| Example 52 | DMSO | 20 | 78.13 | 13 | 43.6 | 10.2 | 18.4 |
| Example 53 | EC | 20 | 88.06 | 67 | 41.5 | 5.1 | 19.4 |
| Example 54 | PC | 20 | 102.09 | 53 | 40.9 | 4.1 | 20.0 |
| Example 55 | NMP | 20 | 99.13 | 40 | 41.3 | 7.2 | 18.0 |
| Example 56 | GBL | 20 | 86.08 | 147 | 44.1 | 7.4 | 18.0 |
| Example 57 | DMSO | 20 | 78.13 | 13 | 43.6 | 10.2 | 18.4 |

TABLE 16-continued

Components of chemical liquid for pre-wetting
Mixture of organic solvents
Third organic solvent

| Table 1-2-3 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 58 | EC | 20 | 88.06 | 67 | 41.5 | 5.1 | 19.4 |
| Example 59 | PC | 20 | 102.09 | 53 | 40.9 | 4.1 | 20.0 |
| Example 60 | NMP | 20 | 99.13 | 40 | 41.3 | 7.2 | 18.0 |
| Example 61 | GBL | 20 | 86.08 | 147 | 44.1 | 7.4 | 18.0 |
| Example 62 | DMSO | 20 | 78.13 | 13 | 43.6 | 10.2 | 18.4 |
| Example 63 | EC | 20 | 88.06 | 67 | 41.5 | 5.1 | 19.4 |
| Example 64 | PC | 20 | 102.09 | 53 | 40.9 | 4.1 | 20.0 |
| Example 65 | NMP | 20 | 99.13 | 40 | 41.3 | 7.2 | 18.0 |
| Example 66 | GBL | 20 | 86.08 | 147 | 44.1 | 7.4 | 18.0 |
| Example 67 | DMSO | 20 | 78.13 | 13 | 43.6 | 10.2 | 18.4 |
| Example 68 | EC | 20 | 88.06 | 67 | 41.5 | 5.1 | 19.4 |
| Example 69 | PC | 20 | 102.09 | 53 | 40.9 | 4.1 | 20.0 |
| Example 70 | NMP | 20 | 99.13 | 40 | 41.3 | 7.2 | 18.0 |
| Example 71 | GBL | 20 | 86.08 | 147 | 44.1 | 7.4 | 18.0 |
| Example 72 | DMSO | 20 | 78.13 | 13 | 43.6 | 10.2 | 18.4 |
| Example 73 | EC | 20 | 88.06 | 67 | 41.5 | 5.1 | 19.4 |
| Example 74 | PC | 20 | 102.09 | 53 | 40.9 | 4.1 | 20.0 |
| Example 75 | NMP | 20 | 99.13 | 40 | 41.3 | 7.2 | 18.0 |
| Example 76 | GBL | 20 | 86.08 | 147 | 44.1 | 7.4 | 18.0 |
| Example 77 | DMSO | 20 | 78.13 | 13 | 43.6 | 10.2 | 18.4 |
| Example 78 | EC | 20 | 88.06 | 67 | 41.5 | 5.1 | 19.4 |
| Example 79 | PC | 20 | 102.09 | 53 | 40.9 | 4.1 | 20.0 |
| Example 80 | NMP | 20 | 99.13 | 40 | 41.3 | 7.2 | 18.0 |

TABLE 17

Components of chemical liquid for pre-wetting
Mixture of organic solvents
Fourth organic solvent

| Table 1-2-4 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 41 | | | | | | | |
| Example 42 | | | | | | | |
| Example 43 | | | | | | | |
| Example 44 | | | | | | | |
| Example 45 | | | | | | | |
| Example 46 | | | | | | | |
| Example 47 | | | | | | | |
| Example 48 | | | | | | | |
| Example 49 | | | | | | | |
| Example 50 | | | | | | | |
| Example 51 | | | | | | | |
| Example 52 | | | | | | | |
| Example 53 | | | | | | | |
| Example 54 | | | | | | | |
| Example 55 | | | | | | | |
| Example 56 | | | | | | | |
| Example 57 | | | | | | | |
| Example 58 | | | | | | | |
| Example 59 | | | | | | | |
| Example 60 | | | | | | | |
| Example 61 | | | | | | | |
| Example 62 | | | | | | | |
| Example 63 | | | | | | | |
| Example 64 | | | | | | | |
| Example 65 | | | | | | | |
| Example 66 | | | | | | | |
| Example 67 | | | | | | | |
| Example 68 | | | | | | | |
| Example 69 | | | | | | | |
| Example 70 | | | | | | | |
| Example 71 | | | | | | | |
| Example 72 | | | | | | | |
| Example 73 | | | | | | | |
| Example 74 | | | | | | | |

TABLE 17-continued

| | | Components of chemical liquid for pre-wetting Mixture of organic solvents Fourth organic solvent | | | | | |
|---|---|---|---|---|---|---|---|
| Table 1-2-4 | Type | Content (% by mass) | Molar mass (g/mol) | Vapor pressure (Pa) | Surface tension (mN/m) | δh (MPa)$^{0.5}$ | δd (MPa)$^{0.5}$ |
| Example 75 | | | | | | | |
| Example 76 | | | | | | | |
| Example 77 | | | | | | | |
| Example 78 | | | | | | | |
| Example 79 | | | | | | | |
| Example 80 | | | | | | | |

TABLE 18

| | | Components of chemical liquid for pre-wetting Mixture of organic solvents Fourth organic solvent | | | | | |
|---|---|---|---|---|---|---|---|
| Table 1-2-5 | Type | Content (% by mass) | Molar mass (g/mol) | Vapor pressure (Pa) | Surface tension (mN/m) | δh (MPa)$^{0.5}$ | δd (MPa)$^{0.5}$ |
| Example 41 | | | | | | | |
| Example 42 | | | | | | | |
| Example 43 | | | | | | | |
| Example 44 | | | | | | | |
| Example 45 | | | | | | | |
| Example 46 | | | | | | | |
| Example 47 | | | | | | | |
| Example 48 | | | | | | | |
| Example 49 | | | | | | | |
| Example 50 | | | | | | | |
| Example 51 | | | | | | | |
| Example 52 | | | | | | | |
| Example 53 | | | | | | | |
| Example 54 | | | | | | | |
| Example 55 | | | | | | | |
| Example 56 | | | | | | | |
| Example 57 | | | | | | | |
| Example 58 | | | | | | | |
| Example 59 | | | | | | | |
| Example 60 | | | | | | | |
| Example 61 | | | | | | | |
| Example 62 | | | | | | | |
| Example 63 | | | | | | | |
| Example 64 | | | | | | | |
| Example 65 | | | | | | | |
| Example 66 | | | | | | | |
| Example 67 | | | | | | | |
| Example 68 | | | | | | | |
| Example 69 | | | | | | | |
| Example 70 | | | | | | | |
| Example 71 | | | | | | | |
| Example 72 | | | | | | | |
| Example 73 | | | | | | | |
| Example 74 | | | | | | | |
| Example 75 | | | | | | | |
| Example 76 | | | | | | | |
| Example 77 | | | | | | | |
| Example 78 | | | | | | | |
| Example 79 | | | | | | | |
| Example 80 | | | | | | | |

TABLE 19

Components of chemical liquid for pre-wetting
Mixture of organic solvents

| | | Fifth organic solvent | | | | | | |
|---|---|---|---|---|---|---|---|---|
| Table 1-2-6 | Type | Content (% by mass) | Molar mass (g/mol) | Vapor pressure (Pa) | Surface tension (mN/m) | δh (MPa)$^{0.5}$ | δd (MPa)$^{0.5}$ | Vapor pressure (Pa) | Surface tension (mN/m) |
| Example 41 | | | | | | | | 176 | 33.5 |
| Example 42 | | | | | | | | 139 | 33.6 |
| Example 43 | | | | | | | | 157 | 32.7 |
| Example 44 | | | | | | | | 157 | 32.3 |
| Example 45 | | | | | | | | 153 | 32.4 |
| Example 46 | | | | | | | | 236 | 32.9 |
| Example 47 | | | | | | | | 197 | 33.1 |
| Example 48 | | | | | | | | 216 | 32.2 |
| Example 49 | | | | | | | | 219 | 31.7 |
| Example 50 | | | | | | | | 215 | 31.9 |
| Example 51 | | | | | | | | 330 | 34.0 |
| Example 52 | | | | | | | | 286 | 34.1 |
| Example 53 | | | | | | | | 310 | 33.2 |
| Example 54 | | | | | | | | 316 | 32.8 |
| Example 55 | | | | | | | | 311 | 32.9 |
| Example 56 | | | | | | | | 639 | 32.0 |
| Example 57 | | | | | | | | 590 | 32.1 |
| Example 58 | | | | | | | | 622 | 31.2 |
| Example 59 | | | | | | | | 639 | 30.7 |
| Example 60 | | | | | | | | 632 | 30.9 |
| Example 61 | | | | | | | | 625 | 34.9 |
| Example 62 | | | | | | | | 584 | 35.0 |
| Example 63 | | | | | | | | 610 | 34.3 |
| Example 64 | | | | | | | | 624 | 34.0 |
| Example 65 | | | | | | | | 619 | 34.1 |
| Example 66 | | | | | | | | 469 | 32.7 |
| Example 67 | | | | | | | | 427 | 32.9 |
| Example 68 | | | | | | | | 452 | 32.1 |
| Example 69 | | | | | | | | 462 | 31.6 |
| Example 70 | | | | | | | | 457 | 31.8 |
| Example 71 | | | | | | | | 511 | 32.4 |
| Example 72 | | | | | | | | 468 | 32.5 |
| Example 73 | | | | | | | | 494 | 31.7 |
| Example 74 | | | | | | | | 506 | 31.2 |
| Example 75 | | | | | | | | 500 | 31.4 |
| Example 76 | | | | | | | | 591 | 33.1 |
| Example 77 | | | | | | | | 544 | 33.2 |
| Example 78 | | | | | | | | 574 | 32.4 |
| Example 79 | | | | | | | | 589 | 31.9 |
| Example 80 | | | | | | | | 582 | 32.1 |

TABLE 20

Components of chemical liquid for pre-wetting

| | Mixture of organic solvents Content of mixture in chemical liquid (% by | Impurity metal Total content of impurity metal (mass ppt) | | | | | |
|---|---|---|---|---|---|---|---|
| Table 1-2-7 | mass) | Fe | Cr | Ni | Pb | Others | Total |
| Example 41 | Balance | 0.004 | 0.004 | 0.004 | 0.002 | 0.036 | 0.05 |
| Example 42 | Balance | 0.006 | 0.004 | 0.006 | 0.002 | 0.038 | 0.056 |
| Example 43 | Balance | 0.006 | 0.002 | 0.006 | 0.006 | 0.032 | 0.052 |
| Example 44 | Balance | 0.004 | 0.002 | 0.004 | 0.002 | 0.032 | 0.044 |
| Example 45 | Balance | 0.006 | 0.004 | 0.006 | 0.002 | 0.026 | 0.044 |
| Example 46 | Balance | 0.004 | 0.002 | 0.006 | 0.004 | 0.026 | 0.042 |
| Example 47 | Balance | 0.004 | 0.004 | 0.004 | 0.002 | 0.028 | 0.042 |
| Example 48 | Balance | 0.006 | 0.002 | 0.006 | 0.002 | 0.03 | 0.046 |
| Example 49 | Balance | 0.004 | 0.004 | 0.006 | 0.006 | 0.032 | 0.052 |
| Example 50 | Balance | 0.004 | 0.002 | 0.004 | 0.002 | 0.034 | 0.046 |
| Example 51 | Balance | 0.004 | 0.004 | 0.004 | 0.002 | 0.036 | 0.050 |
| Example 52 | Balance | 0.006 | 0.002 | 0.006 | 0.004 | 0.032 | 0.050 |
| Example 53 | Balance | 0.004 | 0.004 | 0.004 | 0.002 | 0.03 | 0.044 |
| Example 54 | Balance | 0.008 | 0.002 | 0.006 | 0.002 | 0.032 | 0.050 |
| Example 55 | Balance | 0.004 | 0.004 | 0.004 | 0.004 | 0.032 | 0.048 |
| Example 56 | Balance | 0.006 | 0.002 | 0.006 | 0.002 | 0.032 | 0.048 |

TABLE 20-continued

Components of chemical liquid for pre-wetting

| Table 1-2-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 57 | Balance | 0.006 | 0.002 | 0.006 | 0.004 | 0.032 | 0.050 |
| Example 58 | Balance | 0.008 | 0.004 | 0.004 | 0.002 | 0.034 | 0.052 |
| Example 59 | Balance | 0.004 | 0.002 | 0.006 | 0.002 | 0.038 | 0.052 |
| Example 60 | Balance | 0.004 | 0.002 | 0.006 | 0.004 | 0.032 | 0.048 |
| Example 61 | Balance | 0.006 | 0.002 | 0.004 | 0.002 | 0.032 | 0.046 |
| Example 62 | Balance | 0.004 | 0.006 | 0.004 | 0.002 | 0.036 | 0.052 |
| Example 63 | Balance | 0.006 | 0.002 | 0.006 | 0.002 | 0.032 | 0.048 |
| Example 64 | Balance | 0.004 | 0.004 | 0.004 | 0.002 | 0.034 | 0.048 |
| Example 65 | Balance | 0.006 | 0.004 | 0.004 | 0.006 | 0.042 | 0.062 |
| Example 66 | Balance | 0.004 | 0.002 | 0.006 | 0.002 | 0.036 | 0.050 |
| Example 67 | Balance | 0.004 | 0.002 | 0.004 | 0.002 | 0.04 | 0.052 |
| Example 68 | Balance | 0.006 | 0.004 | 0.006 | 0.002 | 0.036 | 0.054 |
| Example 69 | Balance | 0.004 | 0.002 | 0.004 | 0.004 | 0.04 | 0.054 |
| Example 70 | Balance | 0.004 | 0.004 | 0.006 | 0.002 | 0.038 | 0.054 |
| Example 71 | Balance | 0.006 | 0.002 | 0.008 | 0.002 | 0.032 | 0.050 |
| Example 72 | Balance | 0.004 | 0.004 | 0.006 | 0.002 | 0.032 | 0.048 |
| Example 73 | Balance | 0.004 | 0.002 | 0.01 | 0.004 | 0.034 | 0.054 |
| Example 74 | Balance | 0.006 | 0.004 | 0.006 | 0.002 | 0.038 | 0.056 |
| Example 75 | Balance | 0.004 | 0.004 | 0.008 | 0.002 | 0.032 | 0.050 |
| Example 76 | Balance | 0.004 | 0.002 | 0.006 | 0.006 | 0.032 | 0.050 |
| Example 77 | Balance | 0.006 | 0.002 | 0.008 | 0.002 | 0.026 | 0.044 |
| Example 78 | Balance | 0.006 | 0.006 | 0.006 | 0.004 | 0.028 | 0.050 |
| Example 79 | Balance | 0.004 | 0.004 | 0.008 | 0.002 | 0.03 | 0.048 |
| Example 80 | Balance | 0.004 | 0.006 | 0.006 | 0.002 | 0.032 | 0.050 |

TABLE 21

Components of chemical liquid for pre-wetting

| Table 1-2-8 | Impurity metal Content of impurity metal as particles (mass ppt) | | | | | | Organic impurity Specific organic compound | |
|---|---|---|---|---|---|---|---|---|
| | | | | | | | Boiling point: equal to or higher than 250° C. Number of carbon atoms: equal to or greater than 8 | Boiling point: equal to or higher than 250° C. Number of carbon atoms: equal to or greater than 12 |
| | Fe | Cr | Ni | Pb | Others | Total | | |
| Example 41 | 0.004 | 0.003 | 0.002 | 0.001 | 0.016 | 0.026 | A | A |
| Example 42 | 0.003 | 0.002 | 0.002 | 0.002 | 0.013 | 0.022 | A | A |
| Example 43 | 0.002 | 0.001 | 0.004 | 0.001 | 0.014 | 0.022 | A | A |
| Example 44 | 0.003 | 0.002 | 0.003 | 0.002 | 0.015 | 0.025 | A | A |
| Example 45 | 0.002 | 0.001 | 0.002 | 0.002 | 0.016 | 0.023 | A | A |
| Example 46 | 0.002 | 0.001 | 0.003 | 0.002 | 0.013 | 0.021 | A | A |
| Example 47 | 0.002 | 0.002 | 0.002 | 0.001 | 0.014 | 0.021 | A | A |
| Example 48 | 0.003 | 0.001 | 0.003 | 0.001 | 0.015 | 0.023 | A | A |
| Example 49 | 0.002 | 0.002 | 0.003 | 0.003 | 0.016 | 0.026 | A | A |
| Example 50 | 0.002 | 0.001 | 0.002 | 0.001 | 0.017 | 0.023 | A | A |
| Example 51 | 0.002 | 0.002 | 0.002 | 0.001 | 0.018 | 0.025 | A | A |
| Example 52 | 0.003 | 0.001 | 0.003 | 0.002 | 0.016 | 0.025 | A | A |
| Example 53 | 0.002 | 0.002 | 0.002 | 0.001 | 0.015 | 0.022 | A | A |
| Example 54 | 0.004 | 0.001 | 0.003 | 0.001 | 0.016 | 0.025 | A | A |
| Example 55 | 0.002 | 0.002 | 0.002 | 0.002 | 0.016 | 0.024 | A | A |
| Example 56 | 0.003 | 0.001 | 0.003 | 0.001 | 0.016 | 0.024 | A | A |
| Example 57 | 0.003 | 0.001 | 0.003 | 0.002 | 0.016 | 0.025 | A | A |
| Example 58 | 0.004 | 0.002 | 0.002 | 0.001 | 0.017 | 0.026 | A | A |
| Example 59 | 0.002 | 0.001 | 0.003 | 0.001 | 0.019 | 0.026 | A | A |
| Example 60 | 0.002 | 0.001 | 0.003 | 0.002 | 0.016 | 0.024 | A | A |
| Example 61 | 0.003 | 0.001 | 0.002 | 0.001 | 0.016 | 0.023 | A | A |
| Example 62 | 0.002 | 0.003 | 0.002 | 0.001 | 0.018 | 0.026 | A | A |
| Example 63 | 0.003 | 0.001 | 0.003 | 0.001 | 0.016 | 0.024 | A | A |
| Example 64 | 0.002 | 0.002 | 0.002 | 0.001 | 0.017 | 0.024 | A | A |
| Example 65 | 0.003 | 0.002 | 0.002 | 0.003 | 0.021 | 0.031 | A | A |
| Example 66 | 0.002 | 0.001 | 0.003 | 0.001 | 0.018 | 0.025 | A | A |
| Example 67 | 0.002 | 0.001 | 0.002 | 0.001 | 0.020 | 0.026 | A | A |
| Example 68 | 0.003 | 0.002 | 0.003 | 0.001 | 0.018 | 0.027 | A | A |

TABLE 21-continued

Components of chemical liquid for pre-wetting

| | Impurity metal Content of impurity metal as particles (mass ppt) | | | | | | Organic impurity Specific organic compound | |
|---|---|---|---|---|---|---|---|---|
| | | | | | | | Boiling point: equal to or higher than 250° C. Number of carbon atoms: equal to or greater than 8 | Boiling point: equal to or higher than 250° C. Number of carbon atoms: equal to or greater than 12 |
| Table 1-2-8 | Fe | Cr | Ni | Pb | Others | Total | | |
| Example 69 | 0.002 | 0.001 | 0.002 | 0.002 | 0.020 | 0.027 | A | A |
| Example 70 | 0.002 | 0.002 | 0.003 | 0.001 | 0.019 | 0.027 | A | A |
| Example 71 | 0.003 | 0.001 | 0.004 | 0.001 | 0.016 | 0.025 | A | A |
| Example 72 | 0.002 | 0.002 | 0.003 | 0.001 | 0.016 | 0.024 | A | A |
| Example 73 | 0.002 | 0.001 | 0.005 | 0.002 | 0.017 | 0.027 | A | A |
| Example 74 | 0.003 | 0.002 | 0.003 | 0.001 | 0.019 | 0.028 | A | A |
| Example 75 | 0.002 | 0.002 | 0.004 | 0.001 | 0.016 | 0.025 | A | A |
| Example 76 | 0.002 | 0.001 | 0.003 | 0.003 | 0.016 | 0.025 | A | A |
| Example 77 | 0.003 | 0.001 | 0.004 | 0.001 | 0.013 | 0.022 | A | A |
| Example 78 | 0.003 | 0.003 | 0.003 | 0.002 | 0.014 | 0.025 | A | A |
| Example 79 | 0.002 | 0.002 | 0.004 | 0.001 | 0.015 | 0.024 | A | A |
| Example 80 | 0.002 | 0.003 | 0.003 | 0.001 | 0.016 | 0.025 | A | A |

TABLE 22

| | Components of chemical liquid for pre-wetting | | | | | Physical properties of chemical liquid for pre-wetting Number of coarse particles (Number of objects to be counted) (Number/mL) | Evaluation Defect inhibition performance |
|---|---|---|---|---|---|---|---|
| | Organic impurity Content of organic impurity | | | | | | |
| Table 1-2-9 | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | | |
| Example 41 | 250 | 1 | 0.5 | 500 | 0.10% | 6 | AA |
| Example 42 | 250 | 1 | 0.5 | 500 | 0.10% | 6 | AA |
| Example 43 | 250 | 1 | 0.5 | 500 | 0.10% | 6 | AA |
| Example 44 | 250 | 1 | 0.5 | 500 | 0.10% | 6 | AA |
| Example 45 | 250 | 1 | 0.5 | 500 | 0.10% | 6 | AA |
| Example 46 | 2,500 | 1 | 0.5 | 500 | 0.10% | 6 | AA |
| Example 47 | 2,500 | 1 | 0.5 | 500 | 0.10% | 6 | AA |
| Example 48 | 2,500 | 1 | 0.5 | 500 | 0.10% | 6 | AA |
| Example 49 | 2,500 | 1 | 0.5 | 500 | 0.10% | 6 | AA |
| Example 50 | 2,500 | 1 | 0.5 | 500 | 0.10% | 6 | AA |
| Example 51 | 2,500 | 1 | 0.5 | 500 | 0.10% | 6 | AA |
| Example 52 | 2,500 | 1 | 0.5 | 500 | 0.10% | 6 | AA |
| Example 53 | 2,500 | 1 | 0.5 | 500 | 0.10% | 6 | AA |
| Example 54 | 2,500 | 1 | 0.5 | 500 | 0.10% | 6 | AA |
| Example 55 | 2,500 | 1 | 0.5 | 500 | 0.10% | 6 | AA |
| Example 56 | 2,500 | 1 | 0.5 | 500 | 0.10% | 6 | AA |
| Example 57 | 2,500 | 1 | 0.5 | 500 | 0.10% | 6 | AA |
| Example 58 | 2,500 | 1 | 0.5 | 500 | 0.10% | 6 | AA |
| Example 59 | 2,500 | 1 | 0.5 | 500 | 0.10% | 6 | AA |
| Example 60 | 2,500 | 1 | 0.5 | 500 | 0.10% | 6 | AA |
| Example 61 | 2,500 | 1 | 0.5 | 500 | 0.10% | 6 | AA |
| Example 62 | 2,500 | 1 | 0.5 | 500 | 0.10% | 6 | AA |
| Example 63 | 2,500 | 1 | 0.5 | 500 | 0.10% | 6 | AA |
| Example 64 | 2,500 | 1 | 0.5 | 500 | 0.10% | 6 | AA |
| Example 65 | 2,500 | 1 | 0.5 | 500 | 0.10% | 6 | AA |
| Example 66 | 2,500 | 1 | 0.5 | 500 | 0.10% | 6 | AA |
| Example 67 | 2,500 | 1 | 0.5 | 500 | 0.10% | 6 | AA |
| Example 68 | 2,500 | 1 | 0.5 | 500 | 0.10% | 6 | AA |
| Example 69 | 2,500 | 1 | 0.5 | 500 | 0.10% | 6 | AA |
| Example 70 | 2,500 | 1 | 0.5 | 500 | 0.10% | 6 | AA |
| Example 71 | 2,500 | 1 | 0.5 | 500 | 0.10% | 6 | AA |
| Example 72 | 2,500 | 1 | 0.5 | 500 | 0.10% | 6 | AA |
| Example 73 | 2,500 | 1 | 0.5 | 500 | 0.10% | 6 | AA |
| Example 74 | 2,500 | 1 | 0.5 | 500 | 0.10% | 6 | AA |
| Example 75 | 2,500 | 1 | 0.5 | 500 | 0.10% | 6 | AA |
| Example 76 | 2,500 | 1 | 0.5 | 500 | 0.10% | 6 | AA |

TABLE 22-continued

| Table 1-2-9 | Components of chemical liquid for pre-wetting | | | | | Physical properties of chemical liquid for pre-wetting | |
|---|---|---|---|---|---|---|---|
| | | Organic impurity Content of organic impurity | | | | | |
| | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | Number of coarse particles (Number of objects to be counted) (Number/mL) | Evaluation Defect inhibition performance |
| Example 77 | 2,500 | 1 | 0.5 | 500 | 0.10% | 6 | AA |
| Example 78 | 2,500 | 1 | 0.5 | 500 | 0.10% | 6 | AA |
| Example 79 | 2,500 | 1 | 0.5 | 500 | 0.10% | 6 | AA |
| Example 80 | 2,500 | 1 | 0.5 | 500 | 0.10% | 6 | AA |

TABLE 23

| Table 1-2-10 | Evaluation | | | | | | | | |
|---|---|---|---|---|---|---|---|---|---|
| | Type of resist composition | | | | Type of resist composition | | | | |
| | | Affinity | | Resist saving properties | | | Affinity | | Resist saving properties |
| | | Rsq1 | SRsq | Uniformity | Film thickness controllability | | Rsq1 | SRsq | Uniformity | Film thickness controllability |
| Example 41 | 1 | A | A | AA | A | 2 | A | A | AA | A |
| Example 42 | 1 | A | A | AA | A | 2 | A | A | AA | A |
| Example 43 | 1 | A | A | AA | A | 2 | A | A | AA | A |
| Example 44 | 1 | A | A | AA | A | 2 | A | A | AA | A |
| Example 45 | 1 | A | A | AA | A | 2 | A | A | AA | A |
| Example 46 | 1 | A | A | AA | A | 2 | A | A | AA | A |
| Example 47 | 1 | A | A | AA | A | 2 | A | A | AA | A |
| Example 48 | 1 | A | A | AA | A | 2 | A | A | AA | A |
| Example 49 | 1 | A | A | AA | A | 2 | A | A | AA | A |
| Example 50 | 1 | A | A | AA | A | 2 | A | A | AA | A |
| Example 51 | 1 | A | A | AA | A | 2 | A | A | AA | A |
| Example 52 | 1 | A | A | AA | A | 2 | A | A | AA | A |
| Example 53 | 1 | A | A | AA | A | 2 | A | A | AA | A |
| Example 54 | 1 | A | A | AA | A | 2 | A | A | AA | A |
| Example 55 | 1 | A | A | AA | A | 2 | A | A | AA | A |
| Example 56 | 1 | A | A | AA | A | 2 | A | A | AA | A |
| Example 57 | 1 | A | A | AA | A | 2 | A | A | AA | A |
| Example 58 | 1 | A | A | AA | A | 2 | A | A | AA | A |
| Example 59 | 1 | A | A | AA | A | 2 | A | A | AA | A |
| Example 60 | 1 | A | A | AA | A | 2 | A | A | AA | A |
| Example 61 | 1 | A | A | AA | A | 2 | A | A | AA | A |
| Example 62 | 1 | A | A | A | A | 2 | A | A | A | A |
| Example 63 | 1 | A | A | AA | A | 2 | A | A | AA | A |
| Example 64 | 1 | A | A | AA | A | 2 | A | A | AA | A |
| Example 65 | 1 | A | A | AA | A | 2 | A | A | AA | A |
| Example 66 | 1 | A | A | AA | A | 2 | A | A | AA | A |
| Example 67 | 1 | A | A | AA | A | 2 | A | A | AA | A |
| Example 68 | 1 | A | A | AA | A | 2 | A | A | AA | A |
| Example 69 | 1 | A | A | AA | A | 2 | A | A | AA | A |
| Example 70 | 1 | A | A | AA | A | 2 | A | A | AA | A |
| Example 71 | 1 | A | A | AA | A | 2 | A | A | AA | A |
| Example 72 | 1 | A | A | AA | A | 2 | A | A | AA | A |
| Example 73 | 1 | A | A | AA | A | 2 | A | A | AA | A |
| Example 74 | 1 | A | A | AA | A | 2 | A | A | AA | A |
| Example 75 | 1 | A | A | AA | A | 2 | A | A | AA | A |
| Example 76 | 1 | A | A | AA | A | 2 | A | A | AA | A |
| Example 77 | 1 | A | A | AA | A | 2 | A | A | AA | A |
| Example 78 | 1 | A | A | AA | A | 2 | A | A | AA | A |
| Example 79 | 1 | A | A | AA | A | 2 | A | A | AA | A |
| Example 80 | 1 | A | A | AA | A | 2 | A | A | AA | A |

TABLE 24

| Table 1-2-11 | Evaluation | | | | | | | | | |
|---|---|---|---|---|---|---|---|---|---|---|
| | Type of resist composition | | | | | Type of resist composition | | | | |
| | | Resist saving properties | | | | | Resist saving properties | | | |
| | | Affinity | | | Film thickness | | Affinity | | | Film thickness |
| | | Rsq1 | SRsq | Uniformity | controllability | | Rsq1 | SRsq | Uniformity | controllability |
| Example 41 | 3 | A | A | AA | A | 4 | A | A | AA | A |
| Example 42 | 3 | A | A | AA | A | 4 | A | A | AA | A |
| Example 43 | 3 | A | A | AA | A | 4 | A | A | AA | A |
| Example 44 | 3 | A | A | AA | A | 4 | A | A | AA | A |
| Example 45 | 3 | A | A | AA | A | 4 | A | A | AA | A |
| Example 46 | 3 | A | A | AA | A | 4 | A | A | AA | A |
| Example 47 | 3 | A | A | AA | A | 4 | A | A | AA | A |
| Example 48 | 3 | A | A | AA | A | 4 | A | A | AA | A |
| Example 49 | 3 | A | A | AA | A | 4 | A | A | AA | A |
| Example 50 | 3 | A | A | AA | A | 4 | A | A | AA | A |
| Example 51 | 3 | A | A | AA | A | 4 | A | A | AA | A |
| Example 52 | 3 | A | A | AA | A | 4 | A | A | AA | A |
| Example 53 | 3 | A | A | AA | A | 4 | A | A | AA | A |
| Example 54 | 3 | A | A | AA | A | 4 | A | A | AA | A |
| Example 55 | 3 | A | A | AA | A | 4 | A | A | AA | A |
| Example 56 | 3 | A | A | AA | A | 4 | A | A | AA | A |
| Example 57 | 3 | A | A | AA | A | 4 | A | A | AA | A |
| Example 58 | 3 | A | A | AA | A | 4 | A | A | AA | A |
| Example 59 | 3 | A | A | AA | A | 4 | A | A | AA | A |
| Example 60 | 3 | A | A | AA | A | 4 | A | A | AA | A |
| Example 61 | 3 | A | A | AA | A | 4 | A | A | AA | A |
| Example 62 | 3 | A | A | AA | A | 4 | A | A | A | A |
| Example 63 | 3 | A | A | AA | A | 4 | A | A | AA | A |
| Example 64 | 3 | A | A | AA | A | 4 | A | A | AA | A |
| Example 65 | 3 | A | A | AA | A | 4 | A | A | AA | A |
| Example 66 | 3 | A | A | AA | A | 4 | A | A | AA | A |
| Example 67 | 3 | A | A | AA | A | 4 | A | A | AA | A |
| Example 68 | 3 | A | A | AA | A | 4 | A | A | AA | A |
| Example 69 | 3 | A | A | AA | A | 4 | A | A | AA | A |
| Example 70 | 3 | A | A | AA | A | 4 | A | A | AA | A |
| Example 71 | 3 | A | A | AA | A | 4 | A | A | AA | A |
| Example 72 | 3 | A | A | AA | A | 4 | A | A | AA | A |
| Example 73 | 3 | A | A | AA | A | 4 | A | A | AA | A |
| Example 74 | 3 | A | A | AA | A | 4 | A | A | AA | A |
| Example 75 | 3 | A | A | AA | A | 4 | A | A | AA | A |
| Example 76 | 3 | A | A | AA | A | 4 | A | A | AA | A |
| Example 77 | 3 | A | A | AA | A | 4 | A | A | AA | A |
| Example 78 | 3 | A | A | AA | A | 4 | A | A | AA | A |
| Example 79 | 3 | A | A | AA | A | 4 | A | A | AA | A |
| Example 80 | 3 | A | A | AA | A | 4 | A | A | AA | A |

TABLE 25

| Table 1-2-12 | Evaluation | | | | | | | | | |
|---|---|---|---|---|---|---|---|---|---|---|
| | Type of resist composition | | | | | Type of resist composition | | | | |
| | | Resist saving properties | | | | | Resist saving properties | | | |
| | | Affinity | | | Film thickness | | Affinity | | | Film thickness |
| | | Rsq1 | SRsq | Uniformity | controllability | | Rsq1 | SRsq | Uniformity | controllability |
| Example 41 | 5 | A | A | AA | A | 6 | A | A | AA | A |
| Example 42 | 5 | A | A | AA | A | 6 | A | A | AA | A |
| Example 43 | 5 | A | A | AA | A | 6 | A | A | AA | A |
| Example 44 | 5 | A | A | AA | A | 6 | A | A | AA | A |
| Example 45 | 5 | A | A | AA | A | 6 | A | A | AA | A |
| Example 46 | 5 | A | A | AA | A | 6 | A | A | AA | A |
| Example 47 | 5 | A | A | AA | A | 6 | A | A | AA | A |
| Example 48 | 5 | A | A | AA | A | 6 | A | A | AA | A |
| Example 49 | 5 | A | A | AA | A | 6 | A | A | AA | A |
| Example 50 | 5 | A | A | AA | A | 6 | A | A | AA | A |
| Example 51 | 5 | A | A | AA | A | 6 | A | A | AA | A |

TABLE 25-continued

| Table 1-2-12 | | Affinity | | Resist saving properties | | | Affinity | | Resist saving properties | |
|---|---|---|---|---|---|---|---|---|---|---|
| | Rsq1 | | SRsq | Uniformity | Film thickness controllability | Rsq1 | | SRsq | Uniformity | Film thickness controllability |
| Example 52 | 5 | A | A | AA | A | 6 | A | A | AA | A |
| Example 53 | 5 | A | A | AA | A | 6 | A | A | AA | A |
| Example 54 | 5 | A | A | AA | A | 6 | A | A | AA | A |
| Example 55 | 5 | A | A | AA | A | 6 | A | A | AA | A |
| Example 56 | 5 | A | A | AA | A | 6 | A | A | AA | A |
| Example 57 | 5 | A | A | AA | A | 6 | A | A | AA | A |
| Example 58 | 5 | A | A | AA | A | 6 | A | A | AA | A |
| Example 59 | 5 | A | A | AA | A | 6 | A | A | AA | A |
| Example 60 | 5 | A | A | AA | A | 6 | A | A | AA | A |
| Example 61 | 5 | A | A | AA | A | 6 | A | A | AA | A |
| Example 62 | 5 | A | A | A | A | 6 | A | A | A | A |
| Example 63 | 5 | A | A | AA | A | 6 | A | A | AA | A |
| Example 64 | 5 | A | A | AA | A | 6 | A | A | AA | A |
| Example 65 | 5 | A | A | AA | A | 6 | A | A | AA | A |
| Example 66 | 5 | A | A | AA | A | 6 | A | A | AA | A |
| Example 67 | 5 | A | A | AA | A | 6 | A | A | AA | A |
| Example 68 | 5 | A | A | AA | A | 6 | A | A | AA | A |
| Example 69 | 5 | A | A | AA | A | 6 | A | A | AA | A |
| Example 70 | 5 | A | A | AA | A | 6 | A | A | AA | A |
| Example 71 | 5 | A | A | AA | A | 6 | A | A | AA | A |
| Example 72 | 5 | A | A | AA | A | 6 | A | A | AA | A |
| Example 73 | 5 | A | A | AA | A | 6 | A | A | AA | A |
| Example 74 | 5 | A | A | AA | A | 6 | A | A | AA | A |
| Example 75 | 5 | A | A | AA | A | 6 | A | A | AA | A |
| Example 76 | 5 | A | A | AA | A | 6 | A | A | AA | A |
| Example 77 | 5 | A | A | AA | A | 6 | A | A | AA | A |
| Example 78 | 5 | A | A | AA | A | 6 | A | A | AA | A |
| Example 79 | 5 | A | A | AA | A | 6 | A | A | AA | A |
| Example 80 | 5 | A | A | AA | A | 6 | A | A | AA | A |

TABLE 26

| Table 1-2-13 | | Affinity | | Resist saving properties | |
|---|---|---|---|---|---|
| | Rsq1 | | SRsq | Uniformity | Film thickness controllability |
| Example 41 | 7 | A | A | AA | A |
| Example 42 | 7 | A | A | AA | A |
| Example 43 | 7 | A | A | AA | A |
| Example 44 | 7 | A | A | AA | A |
| Example 45 | 7 | A | A | AA | A |
| Example 46 | 7 | A | A | AA | A |
| Example 47 | 7 | A | A | AA | A |
| Example 48 | 7 | A | A | AA | A |
| Example 49 | 7 | A | A | AA | A |
| Example 50 | 7 | A | A | AA | A |
| Example 51 | 7 | A | A | AA | A |
| Example 52 | 7 | A | A | AA | A |
| Example 53 | 7 | A | A | AA | A |
| Example 54 | 7 | A | A | AA | A |
| Example 55 | 7 | A | A | AA | A |
| Example 56 | 7 | A | A | AA | A |
| Example 57 | 7 | A | A | AA | A |
| Example 58 | 7 | A | A | AA | A |
| Example 59 | 7 | A | A | AA | A |
| Example 60 | 7 | A | A | AA | A |
| Example 61 | 7 | A | A | AA | A |
| Example 62 | 7 | A | A | A | A |
| Example 63 | 7 | A | A | AA | A |
| Example 64 | 7 | A | A | AA | A |
| Example 65 | 7 | A | A | AA | A |
| Example 66 | 7 | A | A | AA | A |
| Example 67 | 7 | A | A | AA | A |
| Example 68 | 7 | A | A | AA | A |
| Example 69 | 7 | A | A | AA | A |
| Example 70 | 7 | A | A | AA | A |
| Example 71 | 7 | A | A | AA | A |
| Example 72 | 7 | A | A | AA | A |
| Example 73 | 7 | A | A | AA | A |
| Example 74 | 7 | A | A | AA | A |
| Example 75 | 7 | A | A | AA | A |
| Example 76 | 7 | A | A | AA | A |
| Example 77 | 7 | A | A | AA | A |
| Example 78 | 7 | A | A | AA | A |
| Example 79 | 7 | A | A | AA | A |
| Example 80 | 7 | A | A | AA | A |

TABLE 27

Components of chemical liquid for pre-wetting
Mixture of organic solvents
First organic solvent

| Table 1-3-1 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 81 | CyPn | 20 | 84.1 | 1,520 | 33.8 | 5.2 | 17.1 |
| Example 82 | CyPn | 20 | 84.1 | 1,520 | 33.8 | 5.2 | 17.1 |
| Example 83 | CyPn | 20 | 84.1 | 1,520 | 33.8 | 5.2 | 17.1 |
| Example 84 | CyPn | 20 | 84.1 | 1,520 | 33.8 | 5.2 | 17.1 |
| Example 85 | CyPn | 20 | 84.1 | 1,520 | 33.8 | 5.2 | 17.1 |
| Example 86 | CyPn | 20 | 84.1 | 1,520 | 33.8 | 5.2 | 17.1 |
| Example 87 | CyPn | 20 | 84.1 | 1,520 | 33.8 | 5.2 | 17.1 |
| Example 88 | CyPn | 20 | 84.1 | 1,520 | 33.8 | 5.2 | 17.1 |
| Example 89 | CyPn | 20 | 84.1 | 1,520 | 33.8 | 5.2 | 17.1 |
| Example 90 | CyPn | 20 | 84.1 | 1,520 | 33.8 | 5.2 | 17.1 |
| Example 91 | CyPn | 20 | 84.1 | 1,520 | 33.8 | 5.2 | 17.1 |
| Example 92 | CyPn | 20 | 84.1 | 1,520 | 33.8 | 5.2 | 17.1 |
| Example 93 | CyPn | 20 | 84.1 | 1,520 | 33.8 | 5.2 | 17.1 |
| Example 94 | CyPn | 20 | 84.1 | 1,520 | 33.8 | 5.2 | 17.1 |
| Example 95 | CyPn | 20 | 84.1 | 1,520 | 33.8 | 5.2 | 17.1 |
| Example 96 | CyPn | 20 | 84.1 | 1,520 | 33.8 | 5.2 | 17.1 |
| Example 97 | CyPn | 20 | 84.1 | 1,520 | 33.8 | 5.2 | 17.1 |
| Example 98 | CyPn | 20 | 84.1 | 1,520 | 33.8 | 5.2 | 17.1 |
| Example 99 | CyPn | 20 | 84.1 | 1,520 | 33.8 | 5.2 | 17.1 |
| Example 100 | CyPn | 20 | 84.1 | 1,520 | 33.8 | 5.2 | 17.1 |
| Example 101 | CyPn | 20 | 84.1 | 1,520 | 33.8 | 5.2 | 17.1 |
| Example 102 | CyPn | 20 | 84.1 | 1,520 | 33.8 | 5.2 | 17.1 |
| Example 103 | CyPn | 20 | 84.1 | 1,520 | 33.8 | 5.2 | 17.1 |
| Example 104 | CyPn | 20 | 84.1 | 1,520 | 33.8 | 5.2 | 17.1 |
| Example 105 | CyPn | 20 | 84.1 | 1,520 | 33.8 | 5.2 | 17.1 |
| Example 106 | nBA | 20 | 116.2 | 1,200 | 24.8 | 6.3 | 16.0 |
| Example 107 | nBA | 20 | 116.2 | 1,200 | 24.8 | 6.3 | 16.0 |
| Example 108 | nBA | 20 | 116.2 | 1,200 | 24.8 | 6.3 | 16.0 |
| Example 109 | nBA | 20 | 116.2 | 1,200 | 24.8 | 6.3 | 16.0 |
| Example 110 | nBA | 20 | 116.2 | 1,200 | 24.8 | 6.3 | 16.0 |
| Example 111 | nBA | 20 | 116.2 | 1,200 | 24.8 | 6.3 | 16.0 |
| Example 112 | nBA | 20 | 116.2 | 1,200 | 24.8 | 6.3 | 16.0 |
| Example 113 | nBA | 20 | 116.2 | 1,200 | 24.8 | 6.3 | 16.0 |
| Example 114 | nBA | 20 | 116.2 | 1,200 | 24.8 | 6.3 | 16.0 |
| Example 115 | nBA | 20 | 116.2 | 1,200 | 24.8 | 6.3 | 16.0 |
| Example 116 | nBA | 20 | 116.2 | 1,200 | 24.8 | 6.3 | 16.0 |
| Example 117 | nBA | 20 | 116.2 | 1,200 | 24.8 | 6.3 | 16.0 |
| Example 118 | nBA | 20 | 116.2 | 1,200 | 24.8 | 6.3 | 16.0 |
| Example 119 | nBA | 20 | 116.2 | 1,200 | 24.8 | 6.3 | 16.0 |
| Example 120 | nBA | 20 | 116.2 | 1,200 | 24.8 | 6.3 | 16.0 |

TABLE 28

Components of chemical liquid for pre-wetting
Mixture of organic solvents
Second organic solvent

| Table 1-3-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 81 | PGMEA | 60 | 132.16 | 493 | 27.9 | 9.8 | 15.6 |
| Example 82 | PGMEA | 60 | 132.16 | 493 | 27.9 | 9.8 | 15.6 |
| Example 83 | PGMEA | 60 | 132.16 | 493 | 27.9 | 9.8 | 15.6 |
| Example 84 | PGMEA | 60 | 132.16 | 493 | 27.9 | 9.8 | 15.6 |
| Example 85 | PGMEA | 60 | 132.16 | 493 | 27.9 | 9.8 | 15.6 |
| Example 86 | CyHx | 60 | 98.14 | 507 | 34.1 | 5.1 | 17.8 |
| Example 87 | CyHx | 60 | 98.14 | 507 | 34.1 | 5.1 | 17.8 |
| Example 88 | CyHx | 60 | 98.14 | 507 | 34.1 | 5.1 | 17.8 |
| Example 89 | CyHx | 60 | 98.14 | 507 | 34.1 | 5.1 | 17.8 |
| Example 90 | CyHx | 60 | 98.14 | 507 | 34.1 | 5.1 | 17.8 |
| Example 91 | EL | 60 | 118.13 | 187 | 29.8 | 12.5 | 16.0 |
| Example 92 | EL | 60 | 118.13 | 187 | 29.8 | 12.5 | 16.0 |
| Example 93 | EL | 60 | 118.13 | 187 | 29.8 | 12.5 | 16.0 |
| Example 94 | EL | 60 | 118.13 | 187 | 29.8 | 12.5 | 16.0 |
| Example 95 | EL | 60 | 118.13 | 187 | 29.8 | 12.5 | 16.0 |
| Example 96 | HBM | 60 | 118.13 | 267 | 29.1 | 12.2 | 16.5 |
| Example 97 | HBM | 60 | 118.13 | 267 | 29.1 | 12.2 | 16.5 |

TABLE 28-continued

Components of chemical liquid for pre-wetting
Mixture of organic solvents
Second organic solvent

| Table 1-3-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 98 | HBM | 60 | 118.13 | 267 | 29.1 | 12.2 | 16.5 |
| Example 99 | HBM | 60 | 118.13 | 267 | 29.1 | 12.2 | 16.5 |
| Example 100 | HBM | 60 | 118.13 | 267 | 29.1 | 12.2 | 16.5 |
| Example 101 | DBCPN | 60 | 130.18 | 400 | 30.2 | 3.4 | 16.1 |
| Example 102 | DBCPN | 60 | 130.18 | 400 | 30.2 | 3.4 | 16.1 |
| Example 103 | DBCPN | 60 | 130.18 | 400 | 30.2 | 3.4 | 16.1 |
| Example 104 | DBCPN | 60 | 130.18 | 400 | 30.2 | 3.4 | 16.1 |
| Example 105 | DBCPN | 60 | 130.18 | 400 | 30.2 | 3.4 | 16.1 |
| Example 106 | PGMEA | 60 | 132.16 | 493 | 27.9 | 9.8 | 15.6 |
| Example 107 | PGMEA | 60 | 132.16 | 493 | 27.9 | 9.8 | 15.6 |
| Example 108 | PGMEA | 60 | 132.16 | 493 | 27.9 | 9.8 | 15.6 |
| Example 109 | PGMEA | 60 | 132.16 | 493 | 27.9 | 9.8 | 15.6 |
| Example 110 | PGMEA | 60 | 132.16 | 493 | 27.9 | 9.8 | 15.6 |
| Example 111 | CyHx | 60 | 98.14 | 507 | 34.1 | 5.1 | 17.8 |
| Example 112 | CyHx | 60 | 98.14 | 507 | 34.1 | 5.1 | 17.8 |
| Example 113 | CyHx | 60 | 98.14 | 507 | 34.1 | 5.1 | 17.8 |
| Example 114 | CyHx | 60 | 98.14 | 507 | 34.1 | 5.1 | 17.8 |
| Example 115 | CyHx | 60 | 98.14 | 507 | 34.1 | 5.1 | 17.8 |
| Example 116 | EL | 60 | 118.13 | 187 | 29.8 | 12.5 | 16.0 |
| Example 117 | EL | 60 | 118.13 | 187 | 29.8 | 12.5 | 16.0 |
| Example 118 | EL | 60 | 118.13 | 187 | 29.8 | 12.5 | 16.0 |
| Example 119 | EL | 60 | 118.13 | 187 | 29.8 | 12.5 | 16.0 |
| Example 120 | EL | 60 | 118.13 | 187 | 29.8 | 12.5 | 16.0 |

TABLE 29

Components of chemical liquid for pre-wetting
Mixture of organic solvents
Third organic solvent

| Table 1-3-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 81 | GBL | 20 | 86.08 | 147 | 44.1 | 7.4 | 18.0 |
| Example 82 | DMSO | 20 | 78.13 | 13 | 43.6 | 10.2 | 18.4 |
| Example 83 | EC | 20 | 88.06 | 67 | 41.5 | 5.1 | 19.4 |
| Example 84 | PC | 20 | 102.09 | 53 | 40.9 | 4.1 | 20.0 |
| Example 85 | NMP | 20 | 99.13 | 40 | 41.3 | 7.2 | 18.0 |
| Example 86 | GBL | 20 | 86.08 | 147 | 44.1 | 7.4 | 18.0 |
| Example 87 | DMSO | 20 | 78.13 | 13 | 43.6 | 10.2 | 18.4 |
| Example 88 | EC | 20 | 88.06 | 67 | 41.5 | 5.1 | 19.4 |
| Example 89 | PC | 20 | 102.09 | 53 | 40.9 | 4.1 | 20.0 |
| Example 90 | NMP | 20 | 99.13 | 40 | 41.3 | 7.2 | 18.0 |
| Example 91 | GBL | 20 | 86.08 | 147 | 44.1 | 7.4 | 18.0 |
| Example 92 | DMSO | 20 | 78.13 | 13 | 43.6 | 10.2 | 18.4 |
| Example 93 | EC | 20 | 88.06 | 67 | 41.5 | 5.1 | 19.4 |
| Example 94 | PC | 20 | 102.09 | 53 | 40.9 | 4.1 | 20.0 |
| Example 95 | NMP | 20 | 99.13 | 40 | 41.3 | 7.2 | 18.0 |
| Example 96 | GBL | 20 | 86.08 | 147 | 44.1 | 7.4 | 18.0 |
| Example 97 | DMSO | 20 | 78.13 | 13 | 43.6 | 10.2 | 18.4 |
| Example 98 | EC | 20 | 88.06 | 67 | 41.5 | 5.1 | 19.4 |
| Example 99 | PC | 20 | 102.09 | 53 | 40.9 | 4.1 | 20.0 |
| Example 100 | NMP | 20 | 99.13 | 40 | 41.3 | 7.2 | 18.0 |
| Example 101 | GBL | 20 | 86.08 | 147 | 44.1 | 7.4 | 18.0 |
| Example 102 | DMSO | 20 | 78.13 | 13 | 43.6 | 10.2 | 18.4 |
| Example 103 | EC | 20 | 88.06 | 67 | 41.5 | 5.1 | 19.4 |
| Example 104 | PC | 20 | 102.09 | 53 | 40.9 | 4.1 | 20.0 |
| Example 105 | NMP | 20 | 99.13 | 40 | 41.3 | 7.2 | 18.0 |
| Example 106 | GBL | 20 | 86.08 | 147 | 44.1 | 7.4 | 18.0 |
| Example 107 | DMSO | 20 | 78.13 | 13 | 43.6 | 10.2 | 18.4 |
| Example 108 | EC | 20 | 88.06 | 67 | 41.5 | 5.1 | 19.4 |
| Example 109 | PC | 20 | 102.09 | 53 | 40.9 | 4.1 | 20.0 |
| Example 110 | NMP | 20 | 99.13 | 40 | 41.3 | 7.2 | 18.0 |
| Example 111 | GBL | 20 | 86.08 | 147 | 44.1 | 7.4 | 18.0 |
| Example 112 | DMSO | 20 | 78.13 | 13 | 43.6 | 10.2 | 18.4 |
| Example 113 | EC | 20 | 88.06 | 67 | 41.5 | 5.1 | 19.4 |
| Example 114 | PC | 20 | 102.09 | 53 | 40.9 | 4.1 | 20.0 |

TABLE 29-continued

| | | Components of chemical liquid for pre-wetting Mixture of organic solvents Third organic solvent | | | | | |
|---|---|---|---|---|---|---|---|
| Table 1-3-3 | Type | Content (% by mass) | Molar mass (g/mol) | Vapor pressure (Pa) | Surface tension (mN/m) | δh (MPa)$^{0.5}$ | δd (MPa)$^{0.5}$ |
| Example 115 | NMP | 20 | 99.13 | 40 | 41.3 | 7.2 | 18.0 |
| Example 116 | GBL | 20 | 86.08 | 147 | 44.1 | 7.4 | 18.0 |
| Example 117 | DMSO | 20 | 78.13 | 13 | 43.6 | 10.2 | 18.4 |
| Example 118 | EC | 20 | 88.06 | 67 | 41.5 | 5.1 | 19.4 |
| Example 119 | PC | 20 | 102.09 | 53 | 40.9 | 4.1 | 20.0 |
| Example 120 | NMP | 20 | 99.13 | 40 | 41.3 | 7.2 | 18.0 |

TABLE 30

| | | Components of chemical liquid for pre-wetting Mixture of organic solvents Fourth organic solvent | | | | | |
|---|---|---|---|---|---|---|---|
| Table 1-3-4 | Type | Content (% by mass) | Molar mass (g/mol) | Vapor pressure (Pa) | Surface tension (mN/m) | δh (MPa)$^{0.5}$ | δd (MPa)$^{0.5}$ |
| Example 81 | | | | | | | |
| Example 82 | | | | | | | |
| Example 83 | | | | | | | |
| Example 84 | | | | | | | |
| Example 85 | | | | | | | |
| Example 86 | | | | | | | |
| Example 87 | | | | | | | |
| Example 88 | | | | | | | |
| Example 89 | | | | | | | |
| Example 90 | | | | | | | |
| Example 91 | | | | | | | |
| Example 92 | | | | | | | |
| Example 93 | | | | | | | |
| Example 94 | | | | | | | |
| Example 95 | | | | | | | |
| Example 96 | | | | | | | |
| Example 97 | | | | | | | |
| Example 98 | | | | | | | |
| Example 99 | | | | | | | |
| Example 100 | | | | | | | |
| Example 101 | | | | | | | |
| Example 102 | | | | | | | |
| Example 103 | | | | | | | |
| Example 104 | | | | | | | |
| Example 105 | | | | | | | |
| Example 106 | | | | | | | |
| Example 107 | | | | | | | |
| Example 108 | | | | | | | |
| Example 109 | | | | | | | |
| Example 110 | | | | | | | |
| Example 111 | | | | | | | |
| Example 112 | | | | | | | |
| Example 113 | | | | | | | |
| Example 114 | | | | | | | |
| Example 115 | | | | | | | |
| Example 116 | | | | | | | |
| Example 117 | | | | | | | |
| Example 118 | | | | | | | |
| Example 119 | | | | | | | |
| Example 120 | | | | | | | |

TABLE 31

Components of chemical liquid for pre-wetting
Mixture of organic solvents
Fourth organic solvent

| Table 1-3-5 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 81 | | | | | | | |
| Example 82 | | | | | | | |
| Example 83 | | | | | | | |
| Example 84 | | | | | | | |
| Example 85 | | | | | | | |
| Example 86 | | | | | | | |
| Example 87 | | | | | | | |
| Example 88 | | | | | | | |
| Example 89 | | | | | | | |
| Example 90 | | | | | | | |
| Example 91 | | | | | | | |
| Example 92 | | | | | | | |
| Example 93 | | | | | | | |
| Example 94 | | | | | | | |
| Example 95 | | | | | | | |
| Example 96 | | | | | | | |
| Example 97 | | | | | | | |
| Example 98 | | | | | | | |
| Example 99 | | | | | | | |
| Example 100 | | | | | | | |
| Example 101 | | | | | | | |
| Example 102 | | | | | | | |
| Example 103 | | | | | | | |
| Example 104 | | | | | | | |
| Example 105 | | | | | | | |
| Example 106 | | | | | | | |
| Example 107 | | | | | | | |
| Example 108 | | | | | | | |
| Example 109 | | | | | | | |
| Example 110 | | | | | | | |
| Example 111 | | | | | | | |
| Example 112 | | | | | | | |
| Example 113 | | | | | | | |
| Example 114 | | | | | | | |
| Example 115 | | | | | | | |
| Example 116 | | | | | | | |
| Example 117 | | | | | | | |
| Example 118 | | | | | | | |
| Example 119 | | | | | | | |
| Example 120 | | | | | | | |

TABLE 32

Components of chemical liquid for pre-wetting
Mixture of organic solvents
Fifth organic solvent

| Table 1-3-6 | Type | Content (% by mass) | Molar mass (g/mol) | Vapor pressure (Pa) | Surface tension (mN/m) | δh (MPa)$^{0.5}$ | δd (MPa)$^{0.5}$ | Vapor pressure (Pa) | Surface tension (mN/m) |
|---|---|---|---|---|---|---|---|---|---|
| Example 81 | | | | | | | | 670 | 33.5 |
| Example 82 | | | | | | | | 621 | 33.6 |
| Example 83 | | | | | | | | 653 | 32.8 |
| Example 84 | | | | | | | | 671 | 32.3 |
| Example 85 | | | | | | | | 664 | 32.5 |
| Example 86 | | | | | | | | 652 | 36.2 |
| Example 87 | | | | | | | | 610 | 36.2 |
| Example 88 | | | | | | | | 638 | 35.6 |
| Example 89 | | | | | | | | 652 | 35.3 |
| Example 90 | | | | | | | | 646 | 35.4 |
| Example 91 | | | | | | | | 501 | 34.2 |
| Example 92 | | | | | | | | 459 | 34.3 |
| Example 93 | | | | | | | | 484 | 33.5 |
| Example 94 | | | | | | | | 496 | 33.1 |
| Example 95 | | | | | | | | 490 | 33.3 |
| Example 96 | | | | | | | | 543 | 33.8 |

TABLE 32-continued

| | | Components of chemical liquid for pre-wetting Mixture of organic solvents | | | | | | | |
|---|---|---|---|---|---|---|---|---|---|
| | | Fifth organic solvent | | | | | | | |
| Table 1-3-6 | Type | Content (% by mass) | Molar mass (g/mol) | Vapor pressure (Pa) | Surface tension (mN/m) | δh $(MPa)^{0.5}$ | δd $(MPa)^{0.5}$ | Vapor pressure (Pa) | Surface tension (mN/m) |
| Example 97 | | | | | | | | 499 | 33.9 |
| Example 98 | | | | | | | | 526 | 33.1 |
| Example 99 | | | | | | | | 539 | 32.7 |
| Example 100 | | | | | | | | 533 | 32.9 |
| Example 101 | | | | | | | | 623 | 34.6 |
| Example 102 | | | | | | | | 575 | 34.7 |
| Example 103 | | | | | | | | 606 | 33.9 |
| Example 104 | | | | | | | | 622 | 33.5 |
| Example 105 | | | | | | | | 615 | 33.6 |
| Example 106 | | | | | | | | 541 | 31.7 |
| Example 107 | | | | | | | | 492 | 31.9 |
| Example 108 | | | | | | | | 522 | 30.9 |
| Example 109 | | | | | | | | 536 | 30.3 |
| Example 110 | | | | | | | | 530 | 30.5 |
| Example 111 | | | | | | | | 542 | 34.8 |
| Example 112 | | | | | | | | 500 | 34.9 |
| Example 113 | | | | | | | | 526 | 34.2 |
| Example 114 | | | | | | | | 538 | 33.8 |
| Example 115 | | | | | | | | 532 | 33.9 |
| Example 116 | | | | | | | | 368 | 32.5 |
| Example 117 | | | | | | | | 326 | 32.7 |
| Example 118 | | | | | | | | 349 | 31.8 |
| Example 119 | | | | | | | | 356 | 31.3 |
| Example 120 | | | | | | | | 351 | 31.5 |

TABLE 33

| | Components of chemical liquid for pre-wetting | | | | | | |
|---|---|---|---|---|---|---|---|
| | Mixture of organic solvents Content of mixture in chemical liquid (% by | Impurity metal Total content of impurity metal (mass ppt) | | | | | |
| Table 1-3-7 | mass) | Fe | Cr | Ni | Pb | Others | Total |
| Example 81 | Balance | 0.006 | 0.004 | 0.004 | 0.002 | 0.034 | 0.050 |
| Example 82 | Balance | 0.004 | 0.002 | 0.004 | 0.004 | 0.036 | 0.050 |
| Example 83 | Balance | 0.004 | 0.004 | 0.006 | 0.002 | 0.042 | 0.058 |
| Example 84 | Balance | 0.006 | 0.006 | 0.004 | 0.002 | 0.034 | 0.052 |
| Example 85 | Balance | 0.008 | 0.004 | 0.006 | 0.004 | 0.032 | 0.054 |
| Example 86 | Balance | 0.004 | 0.004 | 0.006 | 0.002 | 0.038 | 0.054 |
| Example 87 | Balance | 0.006 | 0.004 | 0.004 | 0.002 | 0.034 | 0.050 |
| Example 88 | Balance | 0.004 | 0.002 | 0.006 | 0.004 | 0.032 | 0.048 |
| Example 89 | Balance | 0.006 | 0.002 | 0.008 | 0.002 | 0.038 | 0.056 |
| Example 90 | Balance | 0.004 | 0.006 | 0.006 | 0.002 | 0.032 | 0.050 |
| Example 91 | Balance | 0.004 | 0.004 | 0.006 | 0.004 | 0.034 | 0.052 |
| Example 92 | Balance | 0.004 | 0.004 | 0.004 | 0.002 | 0.036 | 0.050 |
| Example 93 | Balance | 0.006 | 0.004 | 0.006 | 0.004 | 0.032 | 0.052 |
| Example 94 | Balance | 0.004 | 0.002 | 0.004 | 0.002 | 0.032 | 0.044 |
| Example 95 | Balance | 0.006 | 0.002 | 0.006 | 0.002 | 0.026 | 0.042 |
| Example 96 | Balance | 0.004 | 0.002 | 0.004 | 0.002 | 0.028 | 0.040 |
| Example 97 | Balance | 0.006 | 0.002 | 0.006 | 0.004 | 0.030 | 0.048 |
| Example 98 | Balance | 0.004 | 0.002 | 0.008 | 0.002 | 0.032 | 0.048 |
| Example 99 | Balance | 0.006 | 0.002 | 0.006 | 0.004 | 0.038 | 0.056 |
| Example 100 | Balance | 0.004 | 0.002 | 0.006 | 0.002 | 0.036 | 0.050 |
| Example 101 | Balance | 0.006 | 0.006 | 0.006 | 0.004 | 0.032 | 0.054 |
| Example 102 | Balance | 0.004 | 0.002 | 0.004 | 0.002 | 0.032 | 0.044 |
| Example 103 | Balance | 0.006 | 0.004 | 0.006 | 0.004 | 0.034 | 0.054 |
| Example 104 | Balance | 0.004 | 0.002 | 0.004 | 0.002 | 0.036 | 0.048 |
| Example 105 | Balance | 0.004 | 0.002 | 0.006 | 0.004 | 0.032 | 0.048 |
| Example 106 | Balance | 0.006 | 0.004 | 0.006 | 0.002 | 0.032 | 0.050 |
| Example 107 | Balance | 0.004 | 0.002 | 0.008 | 0.004 | 0.038 | 0.056 |
| Example 108 | Balance | 0.006 | 0.002 | 0.006 | 0.002 | 0.034 | 0.050 |
| Example 109 | Balance | 0.004 | 0.002 | 0.004 | 0.004 | 0.032 | 0.046 |
| Example 110 | Balance | 0.004 | 0.002 | 0.006 | 0.002 | 0.032 | 0.046 |
| Example 111 | Balance | 0.006 | 0.004 | 0.004 | 0.002 | 0.026 | 0.042 |
| Example 112 | Balance | 0.004 | 0.002 | 0.006 | 0.004 | 0.028 | 0.044 |

TABLE 33-continued

Components of chemical liquid for pre-wetting

| Table 1-3-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 113 | Balance | 0.006 | 0.002 | 0.006 | 0.002 | 0.030 | 0.046 |
| Example 114 | Balance | 0.004 | 0.004 | 0.008 | 0.002 | 0.032 | 0.050 |
| Example 115 | Balance | 0.004 | 0.002 | 0.006 | 0.004 | 0.038 | 0.054 |
| Example 116 | Balance | 0.006 | 0.002 | 0.010 | 0.002 | 0.040 | 0.060 |
| Example 117 | Balance | 0.004 | 0.002 | 0.006 | 0.002 | 0.032 | 0.046 |
| Example 118 | Balance | 0.006 | 0.004 | 0.004 | 0.004 | 0.032 | 0.050 |
| Example 119 | Balance | 0.004 | 0.002 | 0.008 | 0.002 | 0.042 | 0.058 |
| Example 120 | Balance | 0.006 | 0.002 | 0.006 | 0.002 | 0.032 | 0.048 |

TABLE 34

Components of chemical liquid for pre-wetting

| Table 1-3-8 | Impurity metal Content of impurity metal as particles (mass ppt) | | | | | | Organic impurity Specific organic compound | |
|---|---|---|---|---|---|---|---|---|
| | Fe | Cr | Ni | Pb | Others | Total | Boiling point: equal to or higher than 250° C. Number of carbon atoms: equal to or greater than 8 | Boiling point: equal to or higher than 250° C. Number of carbon atoms: equal to or greater than 12 |
| Example 81 | 0.003 | 0.002 | 0.002 | 0.001 | 0.017 | 0.025 | A | A |
| Example 82 | 0.002 | 0.001 | 0.002 | 0.002 | 0.018 | 0.025 | A | A |
| Example 83 | 0.002 | 0.002 | 0.003 | 0.001 | 0.021 | 0.029 | A | A |
| Example 84 | 0.003 | 0.003 | 0.002 | 0.001 | 0.017 | 0.026 | A | A |
| Example 85 | 0.004 | 0.002 | 0.003 | 0.002 | 0.016 | 0.027 | A | A |
| Example 86 | 0.002 | 0.002 | 0.003 | 0.001 | 0.019 | 0.027 | A | A |
| Example 87 | 0.003 | 0.002 | 0.002 | 0.001 | 0.017 | 0.025 | A | A |
| Example 88 | 0.002 | 0.001 | 0.003 | 0.002 | 0.016 | 0.024 | A | A |
| Example 89 | 0.003 | 0.001 | 0.004 | 0.001 | 0.019 | 0.028 | A | A |
| Example 90 | 0.002 | 0.003 | 0.003 | 0.001 | 0.016 | 0.025 | A | A |
| Example 91 | 0.002 | 0.002 | 0.003 | 0.002 | 0.017 | 0.026 | A | A |
| Example 92 | 0.002 | 0.002 | 0.002 | 0.001 | 0.018 | 0.025 | A | A |
| Example 93 | 0.003 | 0.002 | 0.003 | 0.002 | 0.016 | 0.026 | A | A |
| Example 94 | 0.002 | 0.001 | 0.002 | 0.001 | 0.016 | 0.022 | A | A |
| Example 95 | 0.003 | 0.001 | 0.003 | 0.001 | 0.013 | 0.021 | A | A |
| Example 96 | 0.002 | 0.001 | 0.002 | 0.001 | 0.014 | 0.020 | A | A |
| Example 97 | 0.003 | 0.001 | 0.003 | 0.002 | 0.015 | 0.024 | A | A |
| Example 98 | 0.002 | 0.001 | 0.004 | 0.001 | 0.016 | 0.024 | A | A |
| Example 99 | 0.003 | 0.001 | 0.003 | 0.002 | 0.019 | 0.028 | A | A |
| Example 100 | 0.002 | 0.001 | 0.003 | 0.001 | 0.018 | 0.025 | A | A |
| Example 101 | 0.003 | 0.003 | 0.003 | 0.002 | 0.016 | 0.027 | A | A |
| Example 102 | 0.002 | 0.001 | 0.002 | 0.001 | 0.016 | 0.022 | A | A |
| Example 103 | 0.003 | 0.002 | 0.003 | 0.002 | 0.017 | 0.027 | A | A |
| Example 104 | 0.002 | 0.001 | 0.002 | 0.001 | 0.018 | 0.024 | A | A |
| Example 105 | 0.002 | 0.001 | 0.003 | 0.002 | 0.016 | 0.024 | A | A |
| Example 106 | 0.003 | 0.002 | 0.003 | 0.001 | 0.016 | 0.025 | A | A |
| Example 107 | 0.002 | 0.001 | 0.004 | 0.002 | 0.019 | 0.028 | A | A |
| Example 108 | 0.003 | 0.001 | 0.003 | 0.001 | 0.017 | 0.025 | A | A |
| Example 109 | 0.002 | 0.001 | 0.002 | 0.002 | 0.016 | 0.023 | A | A |
| Example 110 | 0.002 | 0.001 | 0.003 | 0.001 | 0.016 | 0.023 | A | A |
| Example 111 | 0.003 | 0.002 | 0.002 | 0.001 | 0.013 | 0.021 | A | A |
| Example 112 | 0.002 | 0.001 | 0.003 | 0.002 | 0.014 | 0.022 | A | A |
| Example 113 | 0.003 | 0.001 | 0.003 | 0.001 | 0.015 | 0.023 | A | A |
| Example 114 | 0.002 | 0.002 | 0.004 | 0.001 | 0.016 | 0.025 | A | A |
| Example 115 | 0.002 | 0.001 | 0.003 | 0.002 | 0.019 | 0.027 | A | A |
| Example 116 | 0.003 | 0.001 | 0.005 | 0.001 | 0.020 | 0.030 | A | A |
| Example 117 | 0.002 | 0.001 | 0.003 | 0.001 | 0.016 | 0.023 | A | A |
| Example 118 | 0.003 | 0.002 | 0.002 | 0.002 | 0.016 | 0.025 | A | A |
| Example 119 | 0.002 | 0.001 | 0.004 | 0.001 | 0.021 | 0.029 | A | A |
| Example 120 | 0.003 | 0.001 | 0.003 | 0.001 | 0.016 | 0.024 | A | A |

TABLE 35

| Table 1-3-9 | Components of chemical liquid for pre-wetting | | | | | Physical properties of chemical liquid for pre-wetting | |
|---|---|---|---|---|---|---|---|
| | | Organic impurity Content of organic impurity | | | | Number of coarse particles | |
| | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | (Number of objects to be counted) (Number/mL) | Evaluation Defect inhibition performance |
| Example 81 | 2,500 | 1 | 0.5 | 500 | 0.10% | 6 | AA |
| Example 82 | 2,500 | 1 | 0.5 | 500 | 0.10% | 6 | AA |
| Example 83 | 2,500 | 1 | 0.5 | 500 | 0.10% | 6 | AA |
| Example 84 | 2,500 | 1 | 0.5 | 500 | 0.10% | 6 | AA |
| Example 85 | 2,500 | 1 | 0.5 | 500 | 0.10% | 6 | AA |
| Example 86 | 2,500 | 1 | 0.5 | 500 | 0.10% | 6 | AA |
| Example 87 | 2,500 | 1 | 0.5 | 500 | 0.10% | 6 | AA |
| Example 88 | 2,500 | 1 | 0.5 | 500 | 0.10% | 6 | AA |
| Example 89 | 2,500 | 1 | 0.5 | 500 | 0.10% | 6 | AA |
| Example 90 | 2,500 | 1 | 0.5 | 500 | 0.10% | 6 | AA |
| Example 91 | 2,500 | 1 | 0.5 | 500 | 0.10% | 6 | AA |
| Example 92 | 2,500 | 1 | 0.5 | 500 | 0.10% | 6 | AA |
| Example 93 | 2,500 | 1 | 0.5 | 500 | 0.10% | 6 | AA |
| Example 94 | 2,500 | 1 | 0.5 | 500 | 0.10% | 6 | AA |
| Example 95 | 2,500 | 1 | 0.5 | 500 | 0.10% | 6 | AA |
| Example 96 | 2,500 | 1 | 0.5 | 500 | 0.10% | 6 | AA |
| Example 97 | 2,500 | 1 | 0.5 | 500 | 0.10% | 6 | AA |
| Example 98 | 2,500 | 1 | 0.5 | 500 | 0.10% | 6 | AA |
| Example 99 | 2,500 | 1 | 0.5 | 500 | 0.10% | 6 | AA |
| Example 100 | 2,500 | 1 | 0.5 | 500 | 0.10% | 6 | AA |
| Example 101 | 2,500 | 1 | 0.5 | 500 | 0.10% | 6 | AA |
| Example 102 | 2,500 | 1 | 0.5 | 500 | 0.10% | 6 | AA |
| Example 103 | 2,500 | 1 | 0.5 | 500 | 0.10% | 6 | AA |
| Example 104 | 2,500 | 1 | 0.5 | 500 | 0.10% | 6 | AA |
| Example 105 | 2,500 | 1 | 0.5 | 500 | 0.10% | 6 | AA |
| Example 106 | 2,500 | 1 | 0.5 | 500 | 0.10% | 6 | AA |
| Example 107 | 2,500 | 1 | 0.5 | 500 | 0.10% | 6 | AA |
| Example 108 | 2,500 | 1 | 0.5 | 500 | 0.10% | 6 | AA |
| Example 109 | 2,500 | 1 | 0.5 | 500 | 0.10% | 6 | AA |
| Example 110 | 2,500 | 1 | 0.5 | 500 | 0.10% | 6 | AA |
| Example 111 | 2,500 | 1 | 0.5 | 500 | 0.10% | 6 | AA |
| Example 112 | 2,500 | 1 | 0.5 | 500 | 0.10% | 6 | AA |
| Example 113 | 2,500 | 1 | 0.5 | 500 | 0.10% | 6 | AA |
| Example 114 | 2,500 | 1 | 0.5 | 500 | 0.10% | 6 | AA |
| Example 115 | 2,500 | 1 | 0.5 | 500 | 0.10% | 6 | AA |
| Example 116 | 2,500 | 1 | 0.5 | 500 | 0.10% | 6 | AA |
| Example 117 | 2,500 | 1 | 0.5 | 500 | 0.10% | 6 | AA |
| Example 118 | 2,500 | 1 | 0.5 | 500 | 0.10% | 6 | AA |
| Example 119 | 2,500 | 1 | 0.5 | 500 | 0.10% | 6 | AA |
| Example 120 | 2,500 | 1 | 0.5 | 500 | 0.10% | 6 | AA |

TABLE 36

| Table 1-3-10 | | Evaluation | | | | | | | | |
|---|---|---|---|---|---|---|---|---|---|---|
| | | Type of resist composition | | | | Type of resist composition | | | | |
| | | | Resist saving properties | | | | | Resist saving properties | | |
| | | Affinity | | | Film thickness | | Affinity | | | Film thickness |
| | | Rsq1 | SRsq | Uniformity | controllability | | Rsq1 | SRsq | Uniformity | controllability |
| Example 81 | 1 | A | A | AA | A | 2 | A | A | AA | A |
| Example 82 | 1 | A | A | AA | A | 2 | A | A | AA | A |
| Example 83 | 1 | A | A | AA | A | 2 | A | A | AA | A |
| Example 84 | 1 | A | A | AA | A | 2 | A | A | AA | A |
| Example 85 | 1 | A | A | AA | A | 2 | A | A | AA | A |
| Example 86 | 1 | A | A | A | A | 2 | A | A | A | A |
| Example 87 | 1 | A | A | A | A | 2 | A | A | A | A |
| Example 88 | 1 | A | A | A | A | 2 | A | A | A | A |
| Example 89 | 1 | A | A | A | A | 2 | A | A | A | A |
| Example 90 | 1 | A | A | A | A | 2 | A | A | A | A |
| Example 91 | 1 | A | A | AA | A | 2 | A | A | AA | A |
| Example 92 | 1 | A | A | AA | A | 2 | A | A | AA | A |
| Example 93 | 1 | A | A | AA | A | 2 | A | A | AA | A |
| Example 94 | 1 | A | A | AA | A | 2 | A | A | AA | A |
| Example 95 | 1 | A | A | AA | A | 2 | A | A | AA | A |
| Example 96 | 1 | A | A | AA | A | 2 | A | A | AA | A |
| Example 97 | 1 | A | A | AA | A | 2 | A | A | AA | A |
| Example 98 | 1 | A | A | AA | A | 2 | A | A | AA | A |
| Example 99 | 1 | A | A | AA | A | 2 | A | A | AA | A |
| Example 100 | 1 | A | A | AA | A | 2 | A | A | AA | A |
| Example 101 | 1 | A | A | AA | A | 2 | A | A | AA | A |
| Example 102 | 1 | A | A | AA | A | 2 | A | A | AA | A |
| Example 103 | 1 | A | A | AA | A | 2 | A | A | AA | A |
| Example 104 | 1 | A | A | AA | A | 2 | A | A | AA | A |
| Example 105 | 1 | A | A | AA | A | 2 | A | A | AA | A |
| Example 106 | 1 | A | A | AA | A | 2 | A | A | AA | A |
| Example 107 | 1 | A | A | AA | A | 2 | A | A | AA | A |
| Example 108 | 1 | A | A | AA | A | 2 | A | A | AA | A |
| Example 109 | 1 | A | A | AA | A | 2 | A | A | AA | A |
| Example 110 | 1 | A | A | AA | A | 2 | A | A | AA | A |
| Example 111 | 1 | A | A | AA | A | 2 | A | A | AA | A |
| Example 112 | 1 | A | A | AA | A | 2 | A | A | AA | A |
| Example 113 | 1 | A | A | AA | A | 2 | A | A | AA | A |
| Example 114 | 1 | A | A | AA | A | 2 | A | A | AA | A |
| Example 115 | 1 | A | A | AA | A | 2 | A | A | AA | A |
| Example 116 | 1 | A | A | AA | A | 2 | A | A | AA | A |
| Example 117 | 1 | A | A | AA | A | 2 | A | A | AA | A |
| Example 118 | 1 | A | A | AA | A | 2 | A | A | AA | A |
| Example 119 | 1 | A | A | AA | A | 2 | A | A | AA | A |
| Example 120 | 1 | A | A | AA | A | 2 | A | A | AA | A |

TABLE 37

| Table 1-3-11 | | Evaluation | | | | | | | | |
|---|---|---|---|---|---|---|---|---|---|---|
| | | Type of resist composition | | | | Type of resist composition | | | | |
| | | | Resist saving properties | | | | | Resist saving properties | | |
| | | Affinity | | | Film thickness | | Affinity | | | Film thickness |
| | | Rsq1 | SRsq | Uniformity | controllability | | Rsq1 | SRsq | Uniformity | controllability |
| Example 81 | 3 | A | A | AA | A | 4 | A | A | AA | A |
| Example 82 | 3 | A | A | AA | A | 4 | A | A | AA | A |
| Example 83 | 3 | A | A | AA | A | 4 | A | A | AA | A |
| Example 84 | 3 | A | A | AA | A | 4 | A | A | AA | A |
| Example 85 | 3 | A | A | AA | A | 4 | A | A | AA | A |
| Example 86 | 3 | A | A | AA | A | 4 | A | A | A | A |
| Example 87 | 3 | A | A | AA | A | 4 | A | A | A | A |
| Example 88 | 3 | A | A | AA | A | 4 | A | A | A | A |
| Example 89 | 3 | A | A | AA | A | 4 | A | A | A | A |
| Example 90 | 3 | A | A | AA | A | 4 | A | A | A | A |
| Example 91 | 3 | A | A | AA | A | 4 | A | A | AA | A |

TABLE 37-continued

<table>
<tr><td colspan="11">Evaluation</td></tr>
<tr><td></td><td></td><td colspan="4">Type of resist composition</td><td></td><td colspan="4">Type of resist composition</td></tr>
<tr><td></td><td></td><td colspan="4">Resist saving properties</td><td></td><td colspan="4">Resist saving properties</td></tr>
<tr><td></td><td></td><td colspan="2">Affinity</td><td></td><td>Film thickness</td><td></td><td colspan="2">Affinity</td><td></td><td>Film thickness</td></tr>
<tr><td>Table 1-3-11</td><td></td><td>Rsq1</td><td>SRsq</td><td>Uniformity</td><td>controllability</td><td></td><td>Rsq1</td><td>SRsq</td><td>Uniformity</td><td>controllability</td></tr>
<tr><td>Example 92</td><td>3</td><td>A</td><td>A</td><td>AA</td><td>A</td><td>4</td><td>A</td><td>A</td><td>AA</td><td>A</td></tr>
<tr><td>Example 93</td><td>3</td><td>A</td><td>A</td><td>AA</td><td>A</td><td>4</td><td>A</td><td>A</td><td>AA</td><td>A</td></tr>
<tr><td>Example 94</td><td>3</td><td>A</td><td>A</td><td>AA</td><td>A</td><td>4</td><td>A</td><td>A</td><td>AA</td><td>A</td></tr>
<tr><td>Example 95</td><td>3</td><td>A</td><td>A</td><td>AA</td><td>A</td><td>4</td><td>A</td><td>A</td><td>AA</td><td>A</td></tr>
<tr><td>Example 96</td><td>3</td><td>A</td><td>A</td><td>AA</td><td>A</td><td>4</td><td>A</td><td>A</td><td>AA</td><td>A</td></tr>
<tr><td>Example 97</td><td>3</td><td>A</td><td>A</td><td>AA</td><td>A</td><td>4</td><td>A</td><td>A</td><td>AA</td><td>A</td></tr>
<tr><td>Example 98</td><td>3</td><td>A</td><td>A</td><td>AA</td><td>A</td><td>4</td><td>A</td><td>A</td><td>AA</td><td>A</td></tr>
<tr><td>Example 99</td><td>3</td><td>A</td><td>A</td><td>AA</td><td>A</td><td>4</td><td>A</td><td>A</td><td>AA</td><td>A</td></tr>
<tr><td>Example 100</td><td>3</td><td>A</td><td>A</td><td>AA</td><td>A</td><td>4</td><td>A</td><td>A</td><td>AA</td><td>A</td></tr>
<tr><td>Example 101</td><td>3</td><td>A</td><td>A</td><td>AA</td><td>A</td><td>4</td><td>A</td><td>A</td><td>AA</td><td>A</td></tr>
<tr><td>Example 102</td><td>3</td><td>A</td><td>A</td><td>AA</td><td>A</td><td>4</td><td>A</td><td>A</td><td>AA</td><td>A</td></tr>
<tr><td>Example 103</td><td>3</td><td>A</td><td>A</td><td>AA</td><td>A</td><td>4</td><td>A</td><td>A</td><td>AA</td><td>A</td></tr>
<tr><td>Example 104</td><td>3</td><td>A</td><td>A</td><td>AA</td><td>A</td><td>4</td><td>A</td><td>A</td><td>AA</td><td>A</td></tr>
<tr><td>Example 105</td><td>3</td><td>A</td><td>A</td><td>AA</td><td>A</td><td>4</td><td>A</td><td>A</td><td>AA</td><td>A</td></tr>
<tr><td>Example 106</td><td>3</td><td>A</td><td>A</td><td>AA</td><td>A</td><td>4</td><td>A</td><td>A</td><td>AA</td><td>A</td></tr>
<tr><td>Example 107</td><td>3</td><td>A</td><td>A</td><td>AA</td><td>A</td><td>4</td><td>A</td><td>A</td><td>AA</td><td>A</td></tr>
<tr><td>Example 108</td><td>3</td><td>A</td><td>A</td><td>AA</td><td>A</td><td>4</td><td>A</td><td>A</td><td>AA</td><td>A</td></tr>
<tr><td>Example 109</td><td>3</td><td>A</td><td>A</td><td>AA</td><td>A</td><td>4</td><td>A</td><td>A</td><td>AA</td><td>A</td></tr>
<tr><td>Example 110</td><td>3</td><td>A</td><td>A</td><td>AA</td><td>A</td><td>4</td><td>A</td><td>A</td><td>AA</td><td>A</td></tr>
<tr><td>Example 111</td><td>3</td><td>A</td><td>A</td><td>AA</td><td>A</td><td>4</td><td>A</td><td>A</td><td>AA</td><td>A</td></tr>
<tr><td>Example 112</td><td>3</td><td>A</td><td>A</td><td>AA</td><td>A</td><td>4</td><td>A</td><td>A</td><td>AA</td><td>A</td></tr>
<tr><td>Example 113</td><td>3</td><td>A</td><td>A</td><td>AA</td><td>A</td><td>4</td><td>A</td><td>A</td><td>AA</td><td>A</td></tr>
<tr><td>Example 114</td><td>3</td><td>A</td><td>A</td><td>AA</td><td>A</td><td>4</td><td>A</td><td>A</td><td>AA</td><td>A</td></tr>
<tr><td>Example 115</td><td>3</td><td>A</td><td>A</td><td>AA</td><td>A</td><td>4</td><td>A</td><td>A</td><td>AA</td><td>A</td></tr>
<tr><td>Example 116</td><td>3</td><td>A</td><td>A</td><td>AA</td><td>A</td><td>4</td><td>A</td><td>A</td><td>AA</td><td>A</td></tr>
<tr><td>Example 117</td><td>3</td><td>A</td><td>A</td><td>AA</td><td>A</td><td>4</td><td>A</td><td>A</td><td>AA</td><td>A</td></tr>
<tr><td>Example 118</td><td>3</td><td>A</td><td>A</td><td>AA</td><td>A</td><td>4</td><td>A</td><td>A</td><td>AA</td><td>A</td></tr>
<tr><td>Example 119</td><td>3</td><td>A</td><td>A</td><td>AA</td><td>A</td><td>4</td><td>A</td><td>A</td><td>AA</td><td>A</td></tr>
<tr><td>Example 120</td><td>3</td><td>A</td><td>A</td><td>AA</td><td>A</td><td>4</td><td>A</td><td>A</td><td>AA</td><td>A</td></tr>
</table>

TABLE 38

<table>
<tr><td colspan="11">Evaluation</td></tr>
<tr><td></td><td></td><td colspan="4">Type of resist composition</td><td></td><td colspan="4">Type of resist composition</td></tr>
<tr><td></td><td></td><td colspan="4">Resist saving properties</td><td></td><td colspan="4">Resist saving properties</td></tr>
<tr><td></td><td></td><td colspan="2">Affinity</td><td></td><td>Film thickness</td><td></td><td colspan="2">Affinity</td><td></td><td>Film thickness</td></tr>
<tr><td>Table 1-3-12</td><td></td><td>Rsq1</td><td>SRsq</td><td>Uniformity</td><td>controllability</td><td></td><td>Rsq1</td><td>SRsq</td><td>Uniformity</td><td>controllability</td></tr>
<tr><td>Example 81</td><td>5</td><td>A</td><td>A</td><td>AA</td><td>A</td><td>6</td><td>A</td><td>A</td><td>AA</td><td>A</td></tr>
<tr><td>Example 82</td><td>5</td><td>A</td><td>A</td><td>AA</td><td>A</td><td>6</td><td>A</td><td>A</td><td>AA</td><td>A</td></tr>
<tr><td>Example 83</td><td>5</td><td>A</td><td>A</td><td>AA</td><td>A</td><td>6</td><td>A</td><td>A</td><td>AA</td><td>A</td></tr>
<tr><td>Example 84</td><td>5</td><td>A</td><td>A</td><td>AA</td><td>A</td><td>6</td><td>A</td><td>A</td><td>AA</td><td>A</td></tr>
<tr><td>Example 85</td><td>5</td><td>A</td><td>A</td><td>AA</td><td>A</td><td>6</td><td>A</td><td>A</td><td>AA</td><td>A</td></tr>
<tr><td>Example 86</td><td>5</td><td>A</td><td>A</td><td>A</td><td>A</td><td>6</td><td>A</td><td>A</td><td>A</td><td>A</td></tr>
<tr><td>Example 87</td><td>5</td><td>A</td><td>A</td><td>A</td><td>A</td><td>6</td><td>A</td><td>A</td><td>A</td><td>A</td></tr>
<tr><td>Example 88</td><td>5</td><td>A</td><td>A</td><td>A</td><td>A</td><td>6</td><td>A</td><td>A</td><td>A</td><td>A</td></tr>
<tr><td>Example 89</td><td>5</td><td>A</td><td>A</td><td>A</td><td>A</td><td>6</td><td>A</td><td>A</td><td>A</td><td>A</td></tr>
<tr><td>Example 90</td><td>5</td><td>A</td><td>A</td><td>A</td><td>A</td><td>6</td><td>A</td><td>A</td><td>A</td><td>A</td></tr>
<tr><td>Example 91</td><td>5</td><td>A</td><td>A</td><td>AA</td><td>A</td><td>6</td><td>A</td><td>A</td><td>AA</td><td>A</td></tr>
<tr><td>Example 92</td><td>5</td><td>A</td><td>A</td><td>AA</td><td>A</td><td>6</td><td>A</td><td>A</td><td>AA</td><td>A</td></tr>
<tr><td>Example 93</td><td>5</td><td>A</td><td>A</td><td>AA</td><td>A</td><td>6</td><td>A</td><td>A</td><td>AA</td><td>A</td></tr>
<tr><td>Example 94</td><td>5</td><td>A</td><td>A</td><td>AA</td><td>A</td><td>6</td><td>A</td><td>A</td><td>AA</td><td>A</td></tr>
<tr><td>Example 95</td><td>5</td><td>A</td><td>A</td><td>AA</td><td>A</td><td>6</td><td>A</td><td>A</td><td>AA</td><td>A</td></tr>
<tr><td>Example 96</td><td>5</td><td>A</td><td>A</td><td>AA</td><td>A</td><td>6</td><td>A</td><td>A</td><td>AA</td><td>A</td></tr>
<tr><td>Example 97</td><td>5</td><td>A</td><td>A</td><td>AA</td><td>A</td><td>6</td><td>A</td><td>A</td><td>AA</td><td>A</td></tr>
<tr><td>Example 98</td><td>5</td><td>A</td><td>A</td><td>AA</td><td>A</td><td>6</td><td>A</td><td>A</td><td>AA</td><td>A</td></tr>
<tr><td>Example 99</td><td>5</td><td>A</td><td>A</td><td>AA</td><td>A</td><td>6</td><td>A</td><td>A</td><td>AA</td><td>A</td></tr>
<tr><td>Example 100</td><td>5</td><td>A</td><td>A</td><td>AA</td><td>A</td><td>6</td><td>A</td><td>A</td><td>AA</td><td>A</td></tr>
<tr><td>Example 101</td><td>5</td><td>A</td><td>A</td><td>AA</td><td>A</td><td>6</td><td>A</td><td>A</td><td>AA</td><td>A</td></tr>
<tr><td>Example 102</td><td>5</td><td>A</td><td>A</td><td>AA</td><td>A</td><td>6</td><td>A</td><td>A</td><td>AA</td><td>A</td></tr>
</table>

TABLE 38-continued

| Table 1-3-12 | Evaluation Type of resist composition | | | | | Evaluation Type of resist composition | | | | |
|---|---|---|---|---|---|---|---|---|---|---|
| | | Affinity | | Resist saving properties | | | Affinity | | Resist saving properties | |
| | Rsq1 | SRsq | Uniformity | Film thickness controllability | | Rsq1 | SRsq | Uniformity | Film thickness controllability | |
| Example 103 | 5 | A | A | AA | A | 6 | A | A | AA | A |
| Example 104 | 5 | A | A | AA | A | 6 | A | A | AA | A |
| Example 105 | 5 | A | A | AA | A | 6 | A | A | AA | A |
| Example 106 | 5 | A | A | AA | A | 6 | A | A | AA | A |
| Example 107 | 5 | A | A | AA | A | 6 | A | A | AA | A |
| Example 108 | 5 | A | A | AA | A | 6 | A | A | AA | A |
| Example 109 | 5 | A | A | AA | A | 6 | A | A | AA | A |
| Example 110 | 5 | A | A | AA | A | 6 | A | A | AA | A |
| Example 111 | 5 | A | A | AA | A | 6 | A | A | AA | A |
| Example 112 | 5 | A | A | AA | A | 6 | A | A | AA | A |
| Example 113 | 5 | A | A | AA | A | 6 | A | A | AA | A |
| Example 114 | 5 | A | A | AA | A | 6 | A | A | AA | A |
| Example 115 | 5 | A | A | AA | A | 6 | A | A | AA | A |
| Example 116 | 5 | A | A | AA | A | 6 | A | A | AA | A |
| Example 117 | 5 | A | A | AA | A | 6 | A | A | AA | A |
| Example 118 | 5 | A | A | AA | A | 6 | A | A | AA | A |
| Example 119 | 5 | A | A | AA | A | 6 | A | A | AA | A |
| Example 120 | 5 | A | A | AA | A | 6 | A | A | AA | A |

TABLE 39

| Table 1-3-13 | Evaluation Type of resist composition | | | | | Evaluation Type of resist composition | | | | |
|---|---|---|---|---|---|---|---|---|---|---|
| | | Affinity | | Resist saving properties | | | Affinity | | Resist saving properties | |
| | Rsq1 | SRsq | Uniformity | Film thickness controllability | | Rsq1 | SRsq | Uniformity | Film thickness controllability | |
| Example 81 | 7 | A | A | AA | A | | | | | |
| Example 82 | 7 | A | A | AA | A | | | | | |
| Example 83 | 7 | A | A | AA | A | | | | | |
| Example 84 | 7 | A | A | AA | A | | | | | |
| Example 85 | 7 | A | A | AA | A | | | | | |
| Example 86 | 7 | A | A | A | A | | | | | |
| Example 87 | 7 | A | A | A | A | | | | | |
| Example 88 | 7 | A | A | A | A | | | | | |
| Example 89 | 7 | A | A | A | A | | | | | |
| Example 90 | 7 | A | A | A | A | | | | | |
| Example 91 | 7 | A | A | AA | A | | | | | |
| Example 92 | 7 | A | A | AA | A | | | | | |
| Example 93 | 7 | A | A | AA | A | | | | | |
| Example 94 | 7 | A | A | AA | A | | | | | |
| Example 95 | 7 | A | A | AA | A | | | | | |
| Example 96 | 7 | A | A | AA | A | | | | | |
| Example 97 | 7 | A | A | AA | A | | | | | |
| Example 98 | 7 | A | A | AA | A | | | | | |
| Example 99 | 7 | A | A | AA | A | | | | | |
| Example 100 | 7 | A | A | AA | A | | | | | |
| Example 101 | 7 | A | A | AA | A | | | | | |
| Example 102 | 7 | A | A | AA | A | | | | | |
| Example 103 | 7 | A | A | AA | A | | | | | |
| Example 104 | 7 | A | A | AA | A | | | | | |
| Example 105 | 7 | A | A | AA | A | | | | | |
| Example 106 | 7 | A | A | AA | A | | | | | |
| Example 107 | 7 | A | A | AA | A | | | | | |
| Example 108 | 7 | A | A | AA | A | | | | | |
| Example 109 | 7 | A | A | AA | A | | | | | |
| Example 110 | 7 | A | A | AA | A | | | | | |
| Example 111 | 7 | A | A | AA | A | | | | | |
| Example 112 | 7 | A | A | AA | A | | | | | |
| Example 113 | 7 | A | A | AA | A | | | | | |
| Example 114 | 7 | A | A | AA | A | | | | | |
| Example 115 | 7 | A | A | AA | A | | | | | |
| Example 116 | 7 | A | A | AA | A | | | | | |
| Example 117 | 7 | A | A | AA | A | | | | | |
| Example 118 | 7 | A | A | AA | A | | | | | |
| Example 119 | 7 | A | A | AA | A | | | | | |
| Example 120 | 7 | A | A | AA | A | | | | | |

TABLE 40

Components of chemical liquid for pre-wetting
Mixture of organic solvents
First organic solvent

| Table 1-4-1 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 121 | nBA | 20 | 116.2 | 1,200 | 24.8 | 6.3 | 16.0 |
| Example 122 | nBA | 20 | 116.2 | 1,200 | 24.8 | 6.3 | 16.0 |

TABLE 40-continued

Components of chemical liquid for pre-wetting
Mixture of organic solvents
First organic solvent

| Table 1-4-1 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 123 | nBA | 20 | 116.2 | 1,200 | 24.8 | 6.3 | 16.0 |
| Example 124 | nBA | 20 | 116.2 | 1,200 | 24.8 | 6.3 | 16.0 |
| Example 125 | nBA | 20 | 116.2 | 1,200 | 24.8 | 6.3 | 16.0 |
| Example 126 | nBA | 20 | 116.2 | 1,200 | 24.8 | 6.3 | 16.0 |
| Example 127 | nBA | 20 | 116.2 | 1,200 | 24.8 | 6.3 | 16.0 |
| Example 128 | nBA | 20 | 116.2 | 1,200 | 24.8 | 6.3 | 16.0 |
| Example 129 | nBA | 20 | 116.2 | 1,200 | 24.8 | 6.3 | 16.0 |
| Example 130 | nBA | 20 | 116.2 | 1,200 | 24.8 | 6.3 | 16.0 |
| Example 131 | PGME | 30 | 90.1 | 1,453 | 27.6 | 5.2 | 17.1 |
| Example 132 | PGME | 30 | 90.1 | 1,453 | 27.6 | 5.2 | 17.1 |
| Example 134 | PGME | 30 | 90.1 | 1,453 | 27.6 | 5.2 | 17.1 |
| Example 135 | PGME | 30 | 90.1 | 1,453 | 27.6 | 5.2 | 17.1 |
| Example 136 | PGME | 30 | 90.1 | 1,453 | 27.6 | 5.2 | 17.1 |
| Example 137 | PGME | 30 | 90.1 | 1,453 | 27.6 | 5.2 | 17.1 |
| Example 138 | PGME | 30 | 90.1 | 1,453 | 27.6 | 5.2 | 17.1 |
| Example 139 | PGME | 60 | 90.1 | 1,453 | 27.6 | 5.2 | 17.1 |
| Example 140 | PGME | 80 | 90.1 | 1,453 | 27.6 | 5.2 | 17.1 |
| Example 141 | | | | | | | |
| Example 142 | | | | | | | |
| Example 144 | | | | | | | |
| Example 145 | | | | | | | |
| Example 146 | | | | | | | |
| Example 147 | | | | | | | |
| Example 148 | | | | | | | |
| Example 149 | | | | | | | |
| Example 150 | | | | | | | |
| Comparative Example 1 | PGME | 100 | 90.1 | 1,453 | 27.6 | 5.2 | 17.1 |
| Comparative Example 2 | | | | | | | |
| Comparative Example 3 | | | | | | | |
| Comparative Example 4 | PGME | 30 | 90.1 | 1,453 | 27.6 | 5.2 | 17.1 |
| Comparative Example 5 | PGME | 30 | 90.1 | 1,453 | 27.6 | 5.2 | 17.1 |
| Example 151 | | | | | | | |
| Example 152 | | | | | | | |
| Example 153 | | | | | | | |
| Example 154 | | | | | | | |
| Example 155 | | | | | | | |

TABLE 41

Components of chemical liquid for pre-wetting
Mixture of organic solvents
Second organic solvent

| Table 1-4-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 121 | HBM | 60 | 118.13 | 267 | 29.1 | 12.2 | 16.5 |
| Example 122 | HBM | 60 | 118.13 | 267 | 29.1 | 12.2 | 16.5 |
| Example 123 | HBM | 60 | 118.13 | 267 | 29.1 | 12.2 | 16.5 |
| Example 124 | HBM | 60 | 118.13 | 267 | 29.1 | 12.2 | 16.5 |
| Example 125 | HBM | 60 | 118.13 | 267 | 29.1 | 12.2 | 16.5 |
| Example 126 | DBCPN | 60 | 130.18 | 400 | 30.2 | 3.4 | 16.1 |
| Example 127 | DBCPN | 60 | 130.18 | 400 | 30.2 | 3.4 | 16.1 |
| Example 128 | DBCPN | 60 | 130.18 | 400 | 30.2 | 3.4 | 16.1 |
| Example 129 | DBCPN | 60 | 130.18 | 400 | 30.2 | 3.4 | 16.1 |
| Example 130 | DBCPN | 60 | 130.18 | 400 | 30.2 | 3.4 | 16.1 |
| Example 131 | PGMEA | 70 | 132.16 | 493 | 27.9 | 9.8 | 15.6 |
| Example 132 | PGMEA | 70 | 132.16 | 493 | 27.9 | 9.8 | 15.6 |
| Example 134 | PGMEA | 70 | 132.16 | 493 | 27.9 | 9.8 | 15.6 |
| Example 135 | PGMEA | 70 | 132.16 | 493 | 27.9 | 9.8 | 15.6 |
| Example 136 | PGMEA | 70 | 132.16 | 493 | 27.9 | 9.8 | 15.6 |
| Example 137 | PGMEA | 70 | 132.16 | 493 | 27.9 | 9.8 | 15.6 |
| Example 138 | PGMEA | 70 | 132.16 | 493 | 27.9 | 9.8 | 15.6 |

TABLE 41-continued

Components of chemical liquid for pre-wetting
Mixture of organic solvents
Second organic solvent

| Table 1-4-2 | Type | Content (% by mass) | Molar mass (g/mol) | Vapor pressure (Pa) | Surface tension (mN/m) | δh (MPa)^0.5 | δd (MPa)^0.5 |
|---|---|---|---|---|---|---|---|
| Example 139 | PGMEA | 40 | 132.16 | 493 | 27.9 | 9.8 | 15.6 |
| Example 140 | PGMEA | 20 | 132.16 | 493 | 27.9 | 9.8 | 15.6 |
| Example 141 | CyHx | 95 | 98.14 | 507 | 34.1 | 5.1 | 17.8 |
| Example 142 | CyHx | 95 | 98.14 | 507 | 34.1 | 5.1 | 17.8 |
| Example 144 | CyHx | 95 | 98.14 | 507 | 34.1 | 5.1 | 17.8 |
| Example 145 | CyHx | 95 | 98.14 | 507 | 34.1 | 5.1 | 17.8 |
| Example 146 | CyHx | 95 | 98.14 | 507 | 34.1 | 5.1 | 17.8 |
| Example 147 | CyHx | 95 | 98.14 | 507 | 34.1 | 5.1 | 17.8 |
| Example 148 | CyHx | 95 | 98.14 | 507 | 34.1 | 5.1 | 17.8 |
| Example 149 | CyHx | 20 | 98.14 | 507 | 34.1 | 5.1 | 17.8 |
| Example 150 | CyHx | 5 | 98.14 | 507 | 34.1 | 5.1 | 17.8 |
| Comparative Example 1 | | | | | | | |
| Comparative Example 2 | CyHx | 100 | 98.14 | 507 | 34.1 | 5.1 | 17.8 |
| Comparative Example 3 | | | | | | | |
| Comparative Example 4 | PGMEA | 70 | 132.16 | 493 | 27.9 | 9.8 | 15.6 |
| Comparative Example 5 | PGMEA | 70 | 132.16 | 493 | 27.9 | 9.8 | 15.6 |
| Example 151 | CyHx | 95 | 98.14 | 507 | 34.1 | 5.1 | 17.8 |
| Example 152 | CyHx | 95 | 98.14 | 507 | 34.1 | 5.1 | 17.8 |
| Example 153 | CyHx | 95 | 98.14 | 507 | 34.1 | 5.1 | 17.8 |
| Example 154 | CyHx | 95 | 98.14 | 507 | 34.1 | 5.1 | 17.8 |
| Example 155 | CyHx | 95 | 98.14 | 507 | 34.1 | 5.1 | 17.8 |

TABLE 42

Components of chemical liquid for pre-wetting
Mixture of organic solvents
Third organic solvent

| Table 1-4-3 | Type | Content (% by mass) | Molar mass (g/mol) | Vapor pressure (Pa) | Surface tension (mN/m) | δh (MPa)^0.5 | δd (MPa)^0.5 |
|---|---|---|---|---|---|---|---|
| Example 121 | GBL | 20 | 86.08 | 147 | 44.1 | 7.4 | 18.0 |
| Example 122 | DMSO | 20 | 78.13 | 13 | 43.6 | 10.2 | 18.4 |
| Example 123 | EC | 20 | 88.06 | 67 | 41.5 | 5.1 | 19.4 |
| Example 124 | PC | 20 | 102.09 | 53 | 40.9 | 4.1 | 20.0 |
| Example 125 | NMP | 20 | 99.13 | 40 | 41.3 | 7.2 | 18.0 |
| Example 126 | GBL | 20 | 86.08 | 147 | 44.1 | 7.4 | 18.0 |
| Example 127 | DMSO | 20 | 78.13 | 13 | 43.6 | 10.2 | 18.4 |
| Example 128 | EC | 20 | 88.06 | 67 | 41.5 | 5.1 | 19.4 |
| Example 129 | PC | 20 | 102.09 | 53 | 40.9 | 4.1 | 20.0 |
| Example 130 | NMP | 20 | 99.13 | 40 | 41.3 | 7.2 | 18.0 |
| Example 131 | | | | | | | |
| Example 132 | | | | | | | |
| Example 134 | | | | | | | |
| Example 135 | | | | | | | |
| Example 136 | | | | | | | |
| Example 137 | | | | | | | |
| Example 138 | | | | | | | |
| Example 139 | | | | | | | |
| Example 140 | | | | | | | |
| Example 141 | NMP | 5 | 99.13 | 40 | 41.3 | 7.2 | 18.0 |
| Example 142 | NMP | 5 | 99.13 | 40 | 41.3 | 7.2 | 18.0 |
| Example 144 | NMP | 5 | 99.13 | 40 | 41.3 | 7.2 | 18.0 |
| Example 145 | NMP | 5 | 99.13 | 40 | 41.3 | 7.2 | 18.0 |
| Example 146 | NMP | 5 | 99.13 | 40 | 41.3 | 7.2 | 18.0 |
| Example 147 | NMP | 5 | 99.13 | 40 | 41.3 | 7.2 | 18.0 |
| Example 148 | NMP | 5 | 99.13 | 40 | 41.3 | 7.2 | 18.0 |
| Example 149 | NMP | 80 | 99.13 | 40 | 41.3 | 7.2 | 18.0 |
| Example 150 | NMP | 95 | 99.13 | 40 | 41.3 | 7.2 | 18.0 |
| Comparative Example 1 | | | | | | | |
| Comparative Example 2 | | | | | | | |

TABLE 42-continued

Components of chemical liquid for pre-wetting
Mixture of organic solvents
Third organic solvent

| Table 1-4-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Comparative Example 3 | PC | 100 | 102.09 | 53 | 40.9 | 7.2 | 18.0 |
| Comparative Example 4 | | | | | | | |
| Comparative Example 5 | | | | | | | |
| Example 151 | NMP | 5 | 99.13 | 40 | 41.3 | 7.2 | 18.0 |
| Example 152 | NMP | 5 | 99.13 | 40 | 41.3 | 7.2 | 18.0 |
| Example 153 | NMP | 5 | 99.13 | 40 | 41.3 | 7.2 | 18.0 |
| Example 154 | NMP | 5 | 99.13 | 40 | 41.3 | 7.2 | 18.0 |
| Example 155 | NMP | 5 | 99.13 | 40 | 41.3 | 7.2 | 18.0 |

TABLE 43

Components of chemical liquid for pre-wetting
Mixture of organic solvents
Fourth organic solvent

| Table 1-4-4 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 121 | | | | | | | |
| Example 122 | | | | | | | |
| Example 123 | | | | | | | |
| Example 124 | | | | | | | |
| Example 125 | | | | | | | |
| Example 126 | | | | | | | |
| Example 127 | | | | | | | |
| Example 128 | | | | | | | |
| Example 129 | | | | | | | |
| Example 130 | | | | | | | |
| Example 131 | | | | | | | |
| Example 132 | | | | | | | |
| Example 134 | | | | | | | |
| Example 135 | | | | | | | |
| Example 136 | | | | | | | |
| Example 137 | | | | | | | |
| Example 138 | | | | | | | |
| Example 139 | | | | | | | |
| Example 140 | | | | | | | |
| Example 141 | | | | | | | |
| Example 142 | | | | | | | |
| Example 144 | | | | | | | |
| Example 145 | | | | | | | |
| Example 146 | | | | | | | |
| Example 147 | | | | | | | |
| Example 148 | | | | | | | |
| Example 149 | | | | | | | |
| Example 150 | | | | | | | |
| Comparative Example 1 | | | | | | | |
| Comparative Example 2 | | | | | | | |
| Comparative Example 3 | | | | | | | |
| Comparative Example 4 | | | | | | | |
| Comparative Example 5 | | | | | | | |
| Example 151 | | | | | | | |
| Example 152 | | | | | | | |
| Example 153 | | | | | | | |
| Example 154 | | | | | | | |
| Example 155 | | | | | | | |

TABLE 44

Components of chemical liquid for pre-wetting
Mixture of organic solvents
Fourth organic solvent

| Table 1-4-5 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 121 | | | | | | | |
| Example 122 | | | | | | | |
| Example 123 | | | | | | | |
| Example 124 | | | | | | | |
| Example 125 | | | | | | | |
| Example 126 | | | | | | | |
| Example 127 | | | | | | | |
| Example 128 | | | | | | | |
| Example 129 | | | | | | | |
| Example 130 | | | | | | | |
| Example 131 | | | | | | | |
| Example 132 | | | | | | | |
| Example 134 | | | | | | | |
| Example 135 | | | | | | | |
| Example 136 | | | | | | | |
| Example 137 | | | | | | | |
| Example 138 | | | | | | | |
| Example 139 | | | | | | | |
| Example 140 | | | | | | | |
| Example 141 | | | | | | | |
| Example 142 | | | | | | | |
| Example 144 | | | | | | | |
| Example 145 | | | | | | | |
| Example 146 | | | | | | | |
| Example 147 | | | | | | | |
| Example 148 | | | | | | | |
| Example 149 | | | | | | | |
| Example 150 | | | | | | | |
| Comparative Example 1 | | | | | | | |
| Comparative Example 2 | | | | | | | |
| Comparative Example 3 | | | | | | | |
| Comparative Example 4 | | | | | | | |
| Comparative Example 5 | | | | | | | |
| Example 151 | | | | | | | |
| Example 152 | | | | | | | |
| Example 153 | | | | | | | |
| Example 154 | | | | | | | |
| Example 155 | | | | | | | |

TABLE 45

Components of chemical liquid for pre-wetting
Mixture of organic solvents

Fifth organic solvent

| Table 1-4-6 | Type | Content (% by mass) | Molar mass (g/mol) | Vapor pressure (Pa) | Surface tension (mN/m) | δh $(MPa)^{0.5}$ | δd $(MPa)^{0.5}$ | Vapor pressure (Pa) | Surface tension (mN/m) |
|---|---|---|---|---|---|---|---|---|---|
| Example 121 | | | | | | | | 412 | 32.1 |
| Example 122 | | | | | | | | 369 | 32.3 |
| Example 123 | | | | | | | | 394 | 31.4 |
| Example 124 | | | | | | | | 402 | 30.9 |
| Example 125 | | | | | | | | 397 | 31.1 |
| Example 126 | | | | | | | | 491 | 32.9 |
| Example 127 | | | | | | | | 444 | 33.0 |
| Example 128 | | | | | | | | 472 | 32.1 |
| Example 129 | | | | | | | | 484 | 31.6 |
| Example 130 | | | | | | | | 478 | 31.8 |
| Example 131 | | | | | | | | 864 | 27.8 |
| Example 132 | | | | | | | | 864 | 27.8 |
| Example 134 | | | | | | | | 864 | 27.8 |

TABLE 45-continued

Components of chemical liquid for pre-wetting
Mixture of organic solvents

Fifth organic solvent

| Table 1-4-6 | Type | Content (% by mass) | Molar mass (g/mol) | Vapor pressure (Pa) | Surface tension (mN/m) | δh $(MPa)^{0.5}$ | δd $(MPa)^{0.5}$ | Vapor pressure (Pa) | Surface tension (mN/m) |
|---|---|---|---|---|---|---|---|---|---|
| Example 135 | | | | | | | | 864 | 27.8 |
| Example 136 | | | | | | | | 864 | 27.8 |
| Example 137 | | | | | | | | 864 | 27.8 |
| Example 138 | | | | | | | | 864 | 27.8 |
| Example 139 | | | | | | | | 1,153 | 27.7 |
| Example 140 | | | | | | | | 1,313 | 27.6 |
| Example 141 | | | | | | | | 484 | 34.5 |
| Example 142 | | | | | | | | 484 | 34.5 |
| Example 144 | | | | | | | | 484 | 34.5 |
| Example 145 | | | | | | | | 484 | 34.5 |
| Example 146 | | | | | | | | 484 | 34.5 |
| Example 147 | | | | | | | | 484 | 34.5 |
| Example 148 | | | | | | | | 484 | 34.5 |
| Example 149 | | | | | | | | 134 | 39.8 |
| Example 150 | | | | | | | | 64 | 40.9 |
| Comparative Example 1 | | | | | | | | 1,453 | 27.6 |
| Comparative Example 2 | | | | | | | | 507 | 34.1 |
| Comparative Example 3 | | | | | | | | 53 | 40.9 |
| Comparative Example 4 | | | | | | | | 864 | 27.8 |
| Comparative Example 5 | | | | | | | | 864 | 27.8 |
| Example 151 | | | | | | | | 484 | 34.5 |
| Example 152 | | | | | | | | 484 | 34.5 |
| Example 153 | | | | | | | | 484 | 34.5 |
| Example 154 | | | | | | | | 484 | 34.5 |
| Example 155 | | | | | | | | 484 | 34.5 |

TABLE 46

Components of chemical liquid for pre-wetting

| | Mixture of organic solvents Content of mixture in chemical liquid (% by | Impurity metal Total content of impurity metal (mass ppt) | | | | | |
|---|---|---|---|---|---|---|---|
| Table 1-4-7 | mass) | Fe | Cr | Ni | Pb | Others | Total |
| Example 121 | Balance | 0.006 | 0.004 | 0.004 | 0.002 | 0.032 | 0.048 |
| Example 122 | Balance | 0.004 | 0.002 | 0.008 | 0.002 | 0.032 | 0.048 |
| Example 123 | Balance | 0.006 | 0.002 | 0.006 | 0.004 | 0.040 | 0.058 |
| Example 124 | Balance | 0.004 | 0.002 | 0.008 | 0.002 | 0.042 | 0.058 |
| Example 125 | Balance | 0.006 | 0.004 | 0.006 | 0.002 | 0.032 | 0.050 |
| Example 126 | Balance | 0.006 | 0.002 | 0.008 | 0.004 | 0.032 | 0.052 |
| Example 127 | Balance | 0.006 | 0.002 | 0.006 | 0.002 | 0.026 | 0.042 |
| Example 128 | Balance | 0.004 | 0.002 | 0.006 | 0.002 | 0.028 | 0.042 |
| Example 129 | Balance | 0.008 | 0.004 | 0.008 | 0.004 | 0.030 | 0.054 |
| Example 130 | Balance | 0.004 | 0.002 | 0.006 | 0.002 | 0.032 | 0.046 |
| Example 131 | Balance | 0.032 | 0.030 | 0.028 | 0.026 | 0.130 | 0.246 |
| Example 132 | Balance | 0.104 | 0.064 | 0.090 | 0.052 | 0.330 | 0.640 |
| Example 134 | Balance | 0.008 | 0.002 | 0.006 | 0.002 | 0.032 | 0.050 |
| Example 135 | Balance | 0.004 | 0.002 | 0.006 | 0.004 | 0.034 | 0.050 |
| Example 136 | Balance | 0.006 | 0.002 | 0.006 | 0.002 | 0.038 | 0.054 |
| Example 137 | Balance | 0.008 | 0.002 | 0.006 | 0.002 | 0.032 | 0.050 |
| Example 138 | Balance | 0.004 | 0.002 | 0.006 | 0.004 | 0.032 | 0.048 |
| Example 139 | Balance | 0.004 | 0.002 | 0.006 | 0.004 | 0.032 | 0.048 |
| Example 140 | Balance | 0.004 | 0.002 | 0.006 | 0.004 | 0.032 | 0.048 |
| Example 141 | Balance | 32 | 16 | 45 | 12 | 65 | 170 |
| Example 142 | Balance | 52 | 64 | 90 | 52 | 330 | 588 |
| Example 144 | Balance | 0.008 | 0.002 | 0.006 | 0.002 | 0.032 | 0.050 |
| Example 145 | Balance | 0.004 | 0.002 | 0.006 | 0.004 | 0.034 | 0.050 |
| Example 146 | Balance | 0.006 | 0.002 | 0.006 | 0.002 | 0.038 | 0.054 |
| Example 147 | Balance | 0.008 | 0.002 | 0.006 | 0.002 | 0.032 | 0.050 |
| Example 148 | Balance | 0.004 | 0.002 | 0.006 | 0.004 | 0.032 | 0.048 |

TABLE 46-continued

Components of chemical liquid for pre-wetting

| Table 1-4-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 149 | Balance | 52 | 64 | 90 | 52 | 330 | 588 |
| Example 150 | Balance | 0.004 | 0.002 | 0.006 | 0.004 | 0.032 | 0.048 |
| Comparative Example 1 | Balance | 0.004 | 0.006 | 0.004 | 0.002 | 0.03 | 0.046 |
| Comparative Example 2 | Balance | 0.004 | 0.004 | 0.006 | 0.004 | 0.032 | 0.050 |
| Comparative Example 3 | Balance | 0.004 | 0.002 | 0.006 | 0.002 | 0.032 | 0.046 |
| Comparative Example 4 | Balance | 206 | 168 | 197 | 145 | 789 | 1,505 |
| Comparative Example 5 | Balance | <0.0005 | <0.0005 | <0.0005 | <0.0005 | <0.0005 | <0.0005 |
| Example 151 | Balance | 65 | 45 | 69 | 45 | 89 | 313 |
| Example 152 | Balance | 0.004 | 0.002 | 0.006 | 0.004 | 0.034 | 0.050 |
| Example 153 | Balance | 0.006 | 0.004 | 0.006 | 0.004 | 0.032 | 0.052 |
| Example 154 | Balance | 0.006 | 0.004 | 0.006 | 0.004 | 0.032 | 0.052 |
| Example 155 | Balance | 0.006 | 0.004 | 0.006 | 0.004 | 0.032 | 0.052 |

TABLE 47

Components of chemical liquid for pre-wetting

| Table 1-4-8 | Impurity metal Content of impurity metal as particles (mass ppt) | | | | | | Organic impurity Specific organic compound | |
|---|---|---|---|---|---|---|---|---|
| | Fe | Cr | Ni | Pb | Others | Total | Boiling-point: equal to or higher than 250° C. Number of carbon atoms: equal to or greater than 8 | Boiling-point: equal to or higher than 250° C. Number of carbon atoms: equal to or greater than 12 |
| Example 121 | 0.003 | 0.002 | 0.002 | 0.001 | 0.016 | 0.024 | A | A |
| Example 122 | 0.002 | 0.001 | 0.004 | 0.001 | 0.016 | 0.024 | A | A |
| Example 123 | 0.003 | 0.001 | 0.003 | 0.002 | 0.020 | 0.029 | A | A |
| Example 124 | 0.002 | 0.001 | 0.004 | 0.001 | 0.021 | 0.029 | A | A |
| Example 125 | 0.003 | 0.002 | 0.003 | 0.001 | 0.016 | 0.025 | A | A |
| Example 126 | 0.003 | 0.001 | 0.004 | 0.002 | 0.016 | 0.026 | A | A |
| Example 127 | 0.003 | 0.001 | 0.003 | 0.001 | 0.013 | 0.021 | A | A |
| Example 128 | 0.002 | 0.001 | 0.003 | 0.001 | 0.014 | 0.021 | A | A |
| Example 129 | 0.004 | 0.002 | 0.004 | 0.002 | 0.015 | 0.027 | A | A |
| Example 130 | 0.002 | 0.001 | 0.003 | 0.001 | 0.016 | 0.023 | A | A |
| Example 131 | 0.016 | 0.015 | 0.014 | 0.013 | 0.065 | 0.123 | A | A |
| Example 132 | 0.052 | 0.032 | 0.045 | 0.026 | 0.165 | 0.320 | A | A |
| Example 134 | 0.004 | 0.001 | 0.003 | 0.001 | 0.016 | 0.025 | A | A |
| Example 135 | 0.002 | 0.001 | 0.003 | 0.002 | 0.017 | 0.025 | A | A |
| Example 136 | 0.003 | 0.001 | 0.003 | 0.001 | 0.019 | 0.027 | A | A |
| Example 137 | 0.004 | 0.001 | 0.003 | 0.001 | 0.016 | 0.025 | A | A |
| Example 138 | 0.002 | 0.001 | 0.003 | 0.002 | 0.016 | 0.024 | A | A |
| Example 139 | 0.002 | 0.001 | 0.003 | 0.002 | 0.016 | 0.024 | A | A |
| Example 140 | 0.002 | 0.001 | 0.003 | 0.002 | 0.016 | 0.024 | A | A |
| Example 141 | 16 | 15 | 14 | 13 | 65 | 123 | A | A |
| Example 142 | 49 | 32 | 45 | 26 | 165 | 317 | A | A |
| Example 144 | 0.004 | 0.001 | 0.003 | 0.001 | 0.016 | 0.025 | A | A |
| Example 145 | 0.002 | 0.001 | 0.003 | 0.002 | 0.017 | 0.025 | A | A |
| Example 146 | 0.003 | 0.001 | 0.003 | 0.001 | 0.019 | 0.027 | A | A |
| Example 147 | 0.004 | 0.001 | 0.003 | 0.001 | 0.016 | 0.025 | A | A |
| Example 148 | 0.002 | 0.001 | 0.003 | 0.002 | 0.016 | 0.024 | A | A |
| Example 149 | 49 | 32 | 45 | 26 | 165 | 317 | A | A |
| Example 150 | <0.0005 | <0.0005 | <0.0005 | <0.0005 | <0.0005 | <0.0005 | A | A |
| Comparative Example 1 | 0.002 | 0.003 | 0.002 | 0.001 | 0.015 | 0.023 | A | A |
| Comparative Example 2 | 0.002 | 0.002 | 0.003 | 0.002 | 0.016 | 0.025 | A | A |
| Comparative Example 3 | 0.002 | 0.001 | 0.003 | 0.001 | 0.016 | 0.023 | A | A |
| Comparative Example 4 | 126 | 108 | 123 | 106 | 512 | 975 | A | A |

TABLE 47-continued

Components of chemical liquid for pre-wetting

| Table 1-4-8 | Impurity metal Content of impurity metal as particles (mass ppt) | | | | | | Organic impurity Specific organic compound | |
|---|---|---|---|---|---|---|---|---|
| | Fe | Cr | Ni | Pb | Others | Total | Boiling-point: equal to or higher than 250° C. Number of carbon atoms: equal to or greater than 8 | Boiling-point: equal to or higher than 250° C. Number of carbon atoms: equal to or greater than 12 |
| Comparative Example 5 | <0.0005 | <0.0005 | <0.0005 | <0.0005 | <0.0005 | <0.0005 | A | A |
| Example 151 | 47 | 30 | 51 | 35 | 65 | 228 | A | A |
| Example 152 | <0.0005 | <0.0005 | <0.0005 | <0.0005 | <0.0005 | <0.0005 | A | A |
| Example 153 | 0.002 | 0.001 | 0.003 | 0.001 | 0.016 | 0.023 | A | A |
| Example 154 | 0.002 | 0.001 | 0.003 | 0.001 | 0.016 | 0.023 | A | A |
| Example 155 | 0.002 | 0.001 | 0.003 | 0.001 | 0.016 | 0.023 | A | A |

TABLE 48

| Table 1-4-9 | Components of chemical liquid for pre-wetting | | | | | Physical properties of chemical liquid for pre-wetting | Evaluation Defect inhibition performance |
|---|---|---|---|---|---|---|---|
| | Organic impurity Content of organic impurity | | | | | Number of coarse particles (Number of objects to be counted) (Number/mL) | |
| | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | | |
| Example 121 | 2,500 | 1 | 0.5 | 500 | 0.10% | 6 | AA |
| Example 122 | 2,500 | 1 | 0.5 | 500 | 0.10% | 6 | AA |
| Example 123 | 2,500 | 1 | 0.5 | 500 | 0.10% | 6 | AA |
| Example 124 | 2,500 | 1 | 0.5 | 500 | 0.10% | 6 | AA |
| Example 125 | 2,500 | 1 | 0.5 | 500 | 0.10% | 6 | AA |
| Example 126 | 2,500 | 1 | 0.5 | 500 | 0.10% | 6 | AA |
| Example 127 | 2,500 | 1 | 0.5 | 500 | 0.10% | 6 | AA |
| Example 128 | 2,500 | 1 | 0.5 | 500 | 0.10% | 6 | AA |
| Example 129 | 2,500 | 1 | 0.5 | 500 | 0.10% | 6 | AA |
| Example 130 | 2,500 | 1 | 0.5 | 500 | 0.10% | 6 | AA |
| Example 131 | 2,500 | 1 | 0.5 | 500 | 0.10% | 6 | AA |
| Example 132 | 2,500 | 1 | 0.5 | 500 | 0.10% | 6 | A |
| Example 134 | 2,500 | 30 | 15 | 15,000 | 0.10% | 6 | B |
| Example 135 | 2,500 | 100 | 50 | 50,000 | 0.10% | 6 | C |
| Example 136 | 2,500 | 1 | 0.5 | 500 | <0.10% | 6 | B |
| Example 137 | 2,500 | 1 | 0.5 | 500 | 0.10% | 21 | AA |
| Example 138 | 2,500 | 1 | 0.5 | 500 | 0.10% | 150 | C |
| Example 139 | 2,500 | 1 | 0.5 | 500 | 0.10% | 6 | A |
| Example 140 | 2,500 | 1 | 0.5 | 500 | 0.10% | 6 | A |
| Example 141 | 2,500 | 1 | 0.5 | 500 | 0.10% | 6 | A |
| Example 142 | 2,500 | 1 | 0.5 | 500 | 0.10% | 6 | B |
| Example 144 | 2,500 | 30 | 15 | 15,000 | 0.10% | 6 | A |
| Example 145 | 2,500 | 100 | 50 | 50,000 | 0.10% | 6 | C |
| Example 146 | 2,500 | 1 | 0.5 | 500 | 0.10% | 6 | A |
| Example 147 | 2,500 | 1 | 0.5 | 500 | 0.10% | 21 | A |
| Example 148 | 2,500 | 1 | 0.5 | 500 | 0.10% | 150 | C |
| Example 149 | 2,500 | 1 | 0.5 | 500 | 0.10% | 6 | C |
| Example 150 | 2,500 | 1 | 0.5 | 500 | 0.10% | 6 | C |
| Comparative Example 1 | 2,500 | 1 | 0.5 | 500 | 0.10% | 6 | E |
| Comparative Example 2 | 2,500 | 1 | 0.5 | 500 | 0.10% | 5 | E |
| Comparative Example 3 | 2,500 | 1 | 0.5 | 500 | 0.10% | 6 | E |
| Comparative Example 4 | 2,500 | 1 | 0.5 | 500 | 0.10% | 6 | E |
| Comparative Example 5 | 2,500 | 1 | 0.5 | 500 | 0.10% | 6 | E |

TABLE 48-continued

| Table 1-4-9 | Components of chemical liquid for pre-wetting | | | | | Physical properties of chemical liquid for pre-wetting | |
|---|---|---|---|---|---|---|---|
| | Organic impurity Content of organic impurity | | | | | Number of coarse particles (Number of objects to be counted) (Number/mL) | Evaluation Defect inhibition performance |
| | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | | |
| Example 151 | 2,500 | 1 | 0.5 | 500 | 0.10% | 6 | C |
| Example 152 | 2,500 | 1 | 0.5 | 500 | 0.10% | 6 | B |
| Example 153 | 2,500 | 1 | 0.5 | 500 | 0.10% | 0 | B |
| Example 154 | 8 | 1 | 0.5 | 500 | 0.10% | 6 | AA |
| Example 155 | 15,000 | 1 | 0.5 | 500 | 0.10% | 6 | C |

TABLE 49

| | Evaluation | | | | | | | | |
|---|---|---|---|---|---|---|---|---|---|
| | Type of resist composition | | | | Type of resist composition | | | | |
| | | Resist saving properties | | | | | Resist saving properties | | |
| | | | Affinity | | Film thickness | | | Affinity | Film thickness |
| Table 1-4-10 | | Rsq1 | SRsq | Uniformity | controllability | | Rsq1 | SRsq | Uniformity | controllability |
| Example 121 | 1 | A | A | AA | A | 2 | A | A | AA | A |
| Example 122 | 1 | A | A | AA | A | 2 | A | A | AA | A |
| Example 123 | 1 | A | A | AA | A | 2 | A | A | AA | A |
| Example 124 | 1 | A | A | AA | A | 2 | A | A | AA | A |
| Example 125 | 1 | A | A | AA | A | 2 | A | A | AA | A |
| Example 126 | 1 | A | A | AA | A | 2 | A | A | AA | A |
| Example 127 | 1 | A | A | AA | A | 2 | A | A | AA | A |
| Example 128 | 1 | A | A | AA | A | 2 | A | A | AA | A |
| Example 129 | 1 | A | A | AA | A | 2 | A | A | AA | A |
| Example 130 | 1 | A | A | AA | A | 2 | A | A | AA | A |
| Example 131 | 1 | A | A | A | A | 2 | A | A | A | A |
| Example 132 | 1 | A | A | A | A | 2 | A | A | A | A |
| Example 134 | 1 | A | A | A | A | 2 | A | A | A | A |
| Example 135 | 1 | A | A | A | A | 2 | A | A | A | A |
| Example 136 | 1 | A | A | A | A | 2 | A | A | A | A |
| Example 137 | 1 | A | A | A | A | 2 | A | A | A | A |
| Example 138 | 1 | A | A | A | A | 2 | A | A | A | A |
| Example 139 | 1 | A | A | A | A | 2 | A | A | A | A |
| Example 140 | 1 | A | A | A | A | 2 | A | A | A | A |
| Example 141 | 1 | A | A | AA | A | 2 | A | A | A | A |
| Example 142 | 1 | A | A | AA | A | 2 | A | A | A | A |
| Example 144 | 1 | A | A | AA | A | 2 | A | A | A | A |
| Example 145 | 1 | A | A | AA | A | 2 | A | A | A | A |
| Example 146 | 1 | A | A | AA | A | 2 | A | A | A | A |
| Example 147 | 1 | A | A | AA | A | 2 | A | A | A | A |
| Example 148 | 1 | A | A | AA | A | 2 | A | A | A | A |
| Example 149 | 1 | A | A | A | B | 2 | A | A | A | B |
| Example 150 | 1 | A | A | A | B | 2 | A | A | A | B |
| Comparative Example 1 | 1 | B | B | A | A | 2 | B | B | A | A |
| Comparative Example 2 | 1 | B | B | AA | A | 2 | B | B | AA | A |
| Comparative Example 3 | 1 | B | B | A | B | 2 | B | B | A | B |
| Comparative Example 4 | 1 | B | B | A | A | 2 | B | B | A | A |
| Comparative Example 5 | 1 | B | B | A | A | 2 | B | B | A | A |
| Example 151 | 1 | A | A | A | A | 2 | A | A | A | A |
| Example 152 | 1 | A | A | A | A | 2 | A | A | A | A |
| Example 153 | 1 | A | A | AA | A | 2 | A | A | AA | A |

TABLE 49-continued

| | | Evaluation | | | | | | | | |
|---|---|---|---|---|---|---|---|---|---|---|
| | | Type of resist composition | | | | Type of resist composition | | | | |
| | | | Resist saving properties | | | | Resist saving properties | | | |
| | | Affinity | | | Film thickness | | Affinity | | | Film thickness |
| Table 1-4-10 | | Rsq1 | SRsq | Uniformity | controllability | | Rsq1 | SRsq | Uniformity | controllability |
| Example 154 | 1 | A | A | AA | A | 2 | A | A | AA | A |
| Example 155 | 1 | A | A | AA | A | 2 | A | A | AA | A |

TABLE 50

| | | Evaluation | | | | | | | | |
|---|---|---|---|---|---|---|---|---|---|---|
| | | Type of resist composition | | | | Type of resist composition | | | | |
| | | | Resist saving properties | | | | Resist saving properties | | | |
| | | Affinity | | | Film thickness | | Affinity | | | Film thickness |
| Table 1-4-11 | | Rsq1 | SRsq | Uniformity | controllability | | Rsq1 | SRsq | Uniformity | controllability |
| Example 121 | 3 | A | A | AA | A | 4 | A | A | AA | A |
| Example 122 | 3 | A | A | AA | A | 4 | A | A | AA | A |
| Example 123 | 3 | A | A | AA | A | 4 | A | A | AA | A |
| Example 124 | 3 | A | A | AA | A | 4 | A | A | AA | A |
| Example 125 | 3 | A | A | AA | A | 4 | A | A | AA | A |
| Example 126 | 3 | A | A | AA | A | 4 | A | A | AA | A |
| Example 127 | 3 | A | A | AA | A | 4 | A | A | AA | A |
| Example 128 | 3 | A | A | AA | A | 4 | A | A | AA | A |
| Example 129 | 3 | A | A | AA | A | 4 | A | A | AA | A |
| Example 130 | 3 | A | A | AA | A | 4 | A | A | AA | A |
| Example 131 | 3 | A | A | AA | A | 4 | A | A | A | A |
| Example 132 | 3 | A | A | AA | A | 4 | A | A | A | A |
| Example 134 | 3 | A | A | AA | A | 4 | A | A | A | A |
| Example 135 | 3 | A | A | AA | A | 4 | A | A | A | A |
| Example 136 | 3 | A | A | AA | A | 4 | A | A | A | A |
| Example 137 | 3 | A | A | AA | A | 4 | A | A | A | A |
| Example 138 | 3 | A | A | AA | A | 4 | A | A | A | A |
| Example 139 | 3 | A | A | AA | A | 4 | A | A | A | A |
| Example 140 | 3 | A | A | AA | A | 4 | A | A | A | A |
| Example 141 | 3 | A | A | AA | A | 4 | A | A | A | A |
| Example 142 | 3 | A | A | AA | A | 4 | A | A | A | A |
| Example 144 | 3 | A | A | AA | A | 4 | A | A | A | A |
| Example 145 | 3 | A | A | AA | A | 4 | A | A | A | A |
| Example 146 | 3 | A | A | AA | A | 4 | A | A | A | A |
| Example 147 | 3 | A | A | AA | A | 4 | A | A | A | A |
| Example 148 | 3 | A | A | AA | A | 4 | A | A | A | A |
| Example 149 | 3 | A | A | AA | B | 4 | A | A | A | B |
| Example 150 | 3 | A | A | AA | B | 4 | A | A | A | B |
| Comparative Example 1 | 3 | B | B | AA | A | 4 | B | B | A | A |
| Comparative Example 2 | 3 | B | B | AA | A | 4 | B | B | AA | A |
| Comparative Example 3 | 3 | B | B | AA | B | 4 | B | B | A | B |
| Comparative Example 4 | 3 | B | B | AA | A | 4 | B | B | A | A |
| Comparative Example 5 | 3 | B | B | AA | A | 4 | B | B | A | A |
| Example 151 | 3 | A | A | AA | A | 4 | A | A | A | A |
| Example 152 | 3 | A | A | AA | A | 4 | A | A | A | A |
| Example 153 | 3 | A | A | AA | A | 4 | A | A | AA | A |
| Example 154 | 3 | A | A | AA | A | 4 | A | A | AA | A |
| Example 155 | 3 | A | A | AA | A | 4 | A | A | AA | A |

TABLE 51

| Table 1-4-12 | Rsq1 | Affinity SRsq | Uniformity | Film thickness controllability | | Rsq1 | Affinity SRsq | Uniformity | Film thickness controllability |
|---|---|---|---|---|---|---|---|---|---|
| Example 121 | 5 | A A | AA | A | 6 | A | A | AA | A |
| Example 122 | 5 | A A | AA | A | 6 | A | A | AA | A |
| Example 123 | 5 | A A | AA | A | 6 | A | A | AA | A |
| Example 124 | 5 | A A | AA | A | 6 | A | A | AA | A |
| Example 125 | 5 | A A | AA | A | 6 | A | A | AA | A |
| Example 126 | 5 | A A | AA | A | 6 | A | A | AA | A |
| Example 127 | 5 | A A | AA | A | 6 | A | A | AA | A |
| Example 128 | 5 | A A | AA | A | 6 | A | A | AA | A |
| Example 129 | 5 | A A | AA | A | 6 | A | A | AA | A |
| Example 130 | 5 | A A | AA | A | 6 | A | A | AA | A |
| Example 131 | 5 | A A | A | A | 6 | A | A | A | A |
| Example 132 | 5 | A A | A | A | 6 | A | A | A | A |
| Example 134 | 5 | A A | A | A | 6 | A | A | A | A |
| Example 135 | 5 | A A | A | A | 6 | A | A | A | A |
| Example 136 | 5 | A A | A | A | 6 | A | A | A | A |
| Example 137 | 5 | A A | A | A | 6 | A | A | A | A |
| Example 138 | 5 | A A | A | A | 6 | A | A | A | A |
| Example 139 | 5 | A A | A | A | 6 | A | A | A | A |
| Example 140 | 5 | A A | A | A | 6 | A | A | A | A |
| Example 141 | 5 | A A | A | A | 6 | A | A | A | A |
| Example 142 | 5 | A A | A | A | 6 | A | A | A | A |
| Example 144 | 5 | A A | A | A | 6 | A | A | A | A |
| Example 145 | 5 | A A | A | A | 6 | A | A | A | A |
| Example 146 | 5 | A A | A | A | 6 | A | A | A | A |
| Example 147 | 5 | A A | A | A | 6 | A | A | A | A |
| Example 148 | 5 | A A | A | A | 6 | A | A | A | A |
| Example 149 | 5 | A A | A | B | 6 | A | A | A | B |
| Example 150 | 5 | A A | A | B | 6 | A | A | A | B |
| Comparative Example 1 | 5 | B B | A | A | 6 | B | B | A | A |
| Comparative Example 2 | 5 | B B | AA | A | 6 | B | B | AA | A |
| Comparative Example 3 | 5 | B B | A | B | 6 | B | B | A | B |
| Comparative Example 4 | 5 | B B | A | A | 6 | B | B | A | A |
| Comparative Example 5 | 5 | B B | A | A | 6 | B | B | A | A |
| Example 151 | 5 | A A | A | A | 6 | A | A | A | A |
| Example 152 | 5 | A A | A | A | 6 | A | A | A | A |
| Example 153 | 5 | A A | AA | A | 6 | A | A | AA | A |
| Example 154 | 5 | A A | AA | A | 6 | A | A | AA | A |
| Example 155 | 5 | A A | AA | A | 6 | A | A | AA | A |

TABLE 52

| Table 1-4-13 | Rsq1 | Affinity SRsq | Uniformity | Film thickness controllability | Table 1-4-13 | Rsq1 | Affinity SRsq | Uniformity | Film thickness controllability |
|---|---|---|---|---|---|---|---|---|---|
| Example 121 | 7 | A A | AA | A | Example 131 | 7 | A A | A | A |
| Example 122 | 7 | A A | AA | A | Example 132 | 7 | A A | A | A |
| Example 123 | 7 | A A | AA | A | Example 134 | 7 | A A | A | A |
| Example 124 | 7 | A A | AA | A | Example 135 | 7 | A A | A | A |
| Example 125 | 7 | A A | AA | A | Example 136 | 7 | A A | A | A |
| Example 126 | 7 | A A | AA | A | Example 137 | 7 | A A | A | A |
| Example 127 | 7 | A A | AA | A | Example 138 | 7 | A A | A | A |
| Example 128 | 7 | A A | AA | A | Example 139 | 7 | A A | A | A |
| Example 129 | 7 | A A | AA | A | Example 140 | 7 | A A | A | A |
| Example 130 | 7 | A A | AA | A | Example 141 | 7 | A A | A | A |

TABLE 52-continued

Evaluation
Type of resist composition

| Table 1-4-13 | | Resist saving properties | | | Film thickness controllability |
|---|---|---|---|---|---|
| | | Affinity | | | |
| | | Rsq1 | SRsq | Uniformity | |
| Example 142 | 7 | A | A | A | A |
| Example 144 | 7 | A | A | A | A |
| Example 145 | 7 | A | A | A | A |
| Example 146 | 7 | A | A | A | A |
| Example 147 | 7 | A | A | A | A |
| Example 148 | 7 | A | A | A | A |
| Example 149 | 7 | A | A | A | B |
| Example 150 | 7 | A | A | A | B |
| Comparative Example 1 | 7 | B | B | A | A |
| Comparative Example 2 | 7 | B | B | AA | A |
| Comparative Example 3 | 7 | B | B | A | B |
| Comparative Example 4 | 7 | B | B | A | A |
| Comparative Example 5 | 7 | B | B | A | A |
| Example 151 | 7 | A | A | A | A |
| Example 152 | 7 | A | A | A | A |
| Example 153 | 7 | A | A | AA | A |
| Example 154 | 7 | A | A | AA | A |
| Example 155 | 7 | A | A | AA | A |

TABLE 53

Components of chemical liquid for pre-wetting
Mixture of organic solvents
First organic solvent

| Table 1-5-1 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 156 | | | | | | | |
| Example 160 | | | | | | | |
| Example 161 | nBA | 30 | 116.2 | 1,200 | 24.8 | 60.5 | 17.2 |
| Example 162 | nBA | 30 | 116.2 | 1,200 | 24.8 | 60.5 | 17.2 |
| Example 163 | PGME | 80 | 90.12 | 1,453 | 27.6 | 43.2 | 28.8 |
| Example 164 | PGME | 80 | 90.12 | 1,453 | 27.6 | 43.2 | 28.8 |
| Example 165 | PGME | 80 | 90.12 | 1,453 | 27.6 | 43.2 | 28.8 |
| Example 166 | PGME | 80 | 90.12 | 1,453 | 27.6 | 43.2 | 28.8 |
| Example 167 | PGME | 80 | 90.12 | 1,453 | 27.6 | 43.2 | 28.8 |
| Example 168 | PGME | 80 | 90.12 | 1,453 | 27.6 | 43.2 | 28.8 |
| Example 169 | PGME | 80 | 90.12 | 1,453 | 27.6 | 43.2 | 28.8 |
| Example 170 | PGME | 80 | 90.12 | 1,453 | 27.6 | 43.2 | 28.8 |
| Example 171 | PGME | 80 | 90.12 | 1,453 | 27.6 | 43.2 | 28.8 |
| Example 172 | PGME | 80 | 90.12 | 1,453 | 27.6 | 43.2 | 28.8 |
| Example 173 | PGME | 80 | 90.12 | 1,453 | 27.6 | 43.2 | 28.8 |
| Example 174 | PGME | 80 | 90.12 | 1,453 | 27.6 | 43.2 | 28.8 |
| Example 175 | PGME | 80 | 90.12 | 1,453 | 27.6 | 43.2 | 28.8 |
| Example 176 | PGME | 80 | 90.12 | 1,453 | 27.6 | 43.2 | 28.8 |
| Example 177 | PGME | 80 | 90.12 | 1,453 | 27.6 | 43.2 | 28.8 |
| Example 178 | PGME | 80 | 90.12 | 1,453 | 27.6 | 43.2 | 28.8 |
| Example 179 | PGME | 80 | 90.12 | 1,453 | 27.6 | 43.2 | 28.8 |
| Example 180 | CyPn | 80 | 84.1 | 1,520 | 33.8 | 60.0 | 21.8 |
| Example 181 | CyPn | 80 | 84.1 | 1,520 | 33.8 | 60.0 | 21.8 |
| Example 182 | CyPn | 80 | 84.1 | 1,520 | 33.8 | 60.0 | 21.8 |
| Example 183 | CyPn | 80 | 84.1 | 1,520 | 33.8 | 60.0 | 21.8 |
| Example 184 | CyPn | 80 | 84.1 | 1,520 | 33.8 | 60.0 | 21.8 |
| Example 185 | CyPn | 80 | 84.1 | 1,520 | 33.8 | 60.0 | 21.8 |
| Example 186 | CyPn | 80 | 84.1 | 1,520 | 33.8 | 60.0 | 21.8 |
| Example 187 | CyPn | 80 | 84.1 | 1,520 | 33.8 | 60.0 | 21.8 |
| Example 188 | CyPn | 80 | 84.1 | 1,520 | 33.8 | 60.0 | 21.8 |
| Example 189 | CyPn | 80 | 84.1 | 1,520 | 33.8 | 60.0 | 21.8 |
| Example 190 | CyPn | 80 | 84.1 | 1,520 | 33.8 | 60.0 | 21.8 |
| Example 191 | CyPn | 80 | 84.1 | 1,520 | 33.8 | 60.0 | 21.8 |
| Example 192 | CyPn | 80 | 84.1 | 1,520 | 33.8 | 60.0 | 21.8 |
| Example 193 | CyPn | 80 | 84.1 | 1,520 | 33.8 | 60.0 | 21.8 |
| Example 194 | CyPn | 80 | 84.1 | 1,520 | 33.8 | 60.0 | 21.8 |
| Example 195 | CyPn | 80 | 84.1 | 1,520 | 33.8 | 60.0 | 21.8 |

TABLE 54

Components of chemical liquid for pre-wetting
Mixture of organic solvents
Second organic solvent

| Table 1-5-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 156 | CyHx | 95 | 98.14 | 507 | 34.1 | 5.1 | 17.8 |
| Example 160 | CyHx | 95 | 98.14 | 507 | 34.1 | 5.1 | 17.8 |
| Example 161 | | | | | | | |
| Example 162 | | | | | | | |
| Example 163 | | | | | | | |
| Example 164 | | | | | | | |
| Example 165 | | | | | | | |
| Example 166 | | | | | | | |
| Example 167 | | | | | | | |
| Example 168 | | | | | | | |
| Example 169 | | | | | | | |
| Example 170 | | | | | | | |
| Example 171 | | | | | | | |
| Example 172 | | | | | | | |
| Example 173 | | | | | | | |
| Example 174 | | | | | | | |
| Example 175 | | | | | | | |
| Example 176 | | | | | | | |
| Example 177 | | | | | | | |
| Example 178 | | | | | | | |
| Example 179 | | | | | | | |
| Example 180 | | | | | | | |
| Example 181 | | | | | | | |
| Example 182 | | | | | | | |
| Example 183 | | | | | | | |
| Example 184 | | | | | | | |
| Example 185 | | | | | | | |
| Example 186 | | | | | | | |
| Example 187 | | | | | | | |
| Example 188 | | | | | | | |
| Example 189 | | | | | | | |
| Example 190 | | | | | | | |
| Example 191 | | | | | | | |
| Example 192 | | | | | | | |
| Example 193 | | | | | | | |
| Example 194 | | | | | | | |
| Example 195 | | | | | | | |

TABLE 55

Components of chemical liquid for pre-wetting
Mixture of organic solvents
Third organic solvent

| Table 1-5-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 156 | NMP | 5 | 99.13 | 40 | 41.3 | 7.2 | 18.0 |
| Example 160 | NMP | 5 | 99.13 | 40 | 41.3 | 7.2 | 18.0 |
| Example 161 | | | | | | | |
| Example 162 | | | | | | | |
| Example 163 | | | | | | | |
| Example 164 | | | | | | | |
| Example 165 | | | | | | | |
| Example 166 | | | | | | | |
| Example 167 | | | | | | | |
| Example 168 | | | | | | | |
| Example 169 | | | | | | | |
| Example 170 | | | | | | | |
| Example 171 | | | | | | | |
| Example 172 | | | | | | | |
| Example 173 | | | | | | | |
| Example 174 | | | | | | | |
| Example 175 | | | | | | | |
| Example 176 | | | | | | | |
| Example 177 | | | | | | | |
| Example 178 | | | | | | | |

TABLE 55-continued

Components of chemical liquid for pre-wetting
Mixture of organic solvents
Third organic solvent

| Table 1-5-3 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 179 | | | | | | | |
| Example 180 | | | | | | | |
| Example 181 | | | | | | | |
| Example 182 | | | | | | | |
| Example 183 | | | | | | | |
| Example 184 | | | | | | | |
| Example 185 | | | | | | | |
| Example 186 | | | | | | | |
| Example 187 | | | | | | | |
| Example 188 | | | | | | | |
| Example 189 | | | | | | | |
| Example 190 | | | | | | | |
| Example 191 | | | | | | | |
| Example 192 | | | | | | | |
| Example 193 | | | | | | | |
| Example 194 | | | | | | | |
| Example 195 | | | | | | | |

TABLE 56

Components of chemical liquid for pre-wetting
Mixture of organic solvents
Fourth organic solvent

| Table 1-5-4 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 156 | | | | | | | |
| Example 160 | | | | | | | |
| Example 161 | iAA | 70 | 130.19 | 67 | 25.9 | 63.2 | 15.8 |
| Example 162 | MIBC | 70 | 102.17 | 84 | 28.3 | 51.5 | 14.5 |
| Example 163 | DEGME | 20 | 120.15 | 13 | 28.0 | 44.3 | 20.8 |
| Example 164 | DME | 20 | 90.12 | 693 | 29.0 | 55.9 | 22.8 |
| Example 165 | DEE | 20 | 118.18 | 627 | 29.0 | 62.2 | 19.9 |
| Example 166 | DEGIBE | 20 | 162.23 | 133 | 29.0 | 61.9 | 18.7 |
| Example 167 | DEGDME | 20 | 134.18 | 520 | 28.0 | 56.9 | 21.0 |
| Example 168 | DEGDEE | 20 | 162.23 | 253 | 29.0 | 60.4 | 19.6 |
| Example 169 | TriEGDME | 20 | 178.23 | 13 | 28.0 | 56.4 | 20.9 |
| Example 170 | TetraEGDME | 20 | 222.28 | 13 | 27.0 | 55.6 | 21.1 |
| Example 171 | TEGMBE | 20 | 220.31 | 13 | 28.0 | 48.5 | 18.7 |
| Example 172 | DEGMBE | 20 | 162.23 | 117 | 29.0 | 59.4 | 18.1 |
| Example 173 | Anisole | 20 | 108.14 | 63 | 30.0 | 64.3 | 17.0 |
| Example 174 | 14-DMB | 20 | 138.17 | 1 | 30.0 | 59.0 | 20.6 |
| Example 175 | 12-DMB | 20 | 138.17 | 1 | 30.0 | 60.6 | 20.2 |
| Example 176 | 13-DMB | 20 | 138.17 | 1 | 30.0 | 61.6 | 19.9 |
| Example 177 | 14-Diphenoxybenzene | 20 | 262.31 | 1 | 33.0 | 63.3 | 18.5 |
| Example 178 | 4-Methoxytoluene | 20 | 122.17 | 1 | 32.0 | 64.8 | 17.4 |
| Example 179 | Phenetole | 20 | 122.17 | 1 | 31.0 | 66.3 | 16.3 |
| Example 180 | DEGME | 20 | 120.15 | 13 | 28.0 | 44.3 | 20.8 |
| Example 181 | DME | 20 | 90.12 | 693 | 29.0 | 55.9 | 22.8 |
| Example 182 | DEE | 20 | 118.18 | 627 | 29.0 | 62.2 | 19.9 |
| Example 183 | DEGIBE | 20 | 162.23 | 133 | 29.0 | 61.9 | 18.7 |
| Example 184 | DEGDME | 20 | 134.18 | 520 | 28.0 | 56.9 | 21.0 |
| Example 185 | DEGDEE | 20 | 162.23 | 253 | 29.0 | 60.4 | 19.6 |
| Example 186 | TriEGDME | 20 | 178.23 | 13 | 28.0 | 56.4 | 20.9 |
| Example 187 | TetraEGDME | 20 | 222.28 | 13 | 27.0 | 55.6 | 21.1 |
| Example 188 | TEGMBE | 20 | 220.31 | 13 | 28.0 | 48.5 | 18.7 |
| Example 189 | DEGMBE | 20 | 162.23 | 117 | 29.0 | 59.4 | 18.1 |
| Example 190 | Anisole | 20 | 108.14 | 63 | 30.0 | 64.3 | 17.0 |
| Example 191 | 14-DMB | 20 | 138.17 | 1 | 30.0 | 59.0 | 20.6 |
| Example 192 | 12-DMB | 20 | 138.17 | 1 | 30.0 | 60.6 | 20.2 |
| Example 193 | 13-DMB | 20 | 138.17 | 1 | 30.0 | 61.6 | 19.9 |
| Example 194 | 14-Diphenoxybenzene | 20 | 262.31 | 1 | 33.0 | 63.3 | 18.5 |
| Example 195 | 4-Methoxytoluene | 20 | 122.17 | 1 | 32.0 | 64.8 | 17.4 |

TABLE 57

Components of chemical liquid for pre-wetting
Mixture of organic solvents
Fourth organic solvent

| Table 1-5-5 | Type | Content (% by mass) | Molar mass (g/mol) | Vapor pressure (Pa) | Surface tension (mN/m) | δh (MPa)^0.5 | δd (MPa)^0.5 |
|---|---|---|---|---|---|---|---|
| Example 156 | | | | | | | |
| Example 160 | | | | | | | |
| Example 161 | | | | | | | |
| Example 162 | | | | | | | |
| Example 163 | | | | | | | |
| Example 164 | | | | | | | |
| Example 165 | | | | | | | |
| Example 166 | | | | | | | |
| Example 167 | | | | | | | |
| Example 168 | | | | | | | |
| Example 169 | | | | | | | |
| Example 170 | | | | | | | |
| Example 171 | | | | | | | |
| Example 172 | | | | | | | |
| Example 173 | | | | | | | |
| Example 174 | | | | | | | |
| Example 175 | | | | | | | |
| Example 176 | | | | | | | |
| Example 177 | | | | | | | |
| Example 178 | | | | | | | |
| Example 179 | | | | | | | |
| Example 180 | | | | | | | |
| Example 181 | | | | | | | |
| Example 182 | | | | | | | |
| Example 183 | | | | | | | |
| Example 184 | | | | | | | |
| Example 185 | | | | | | | |
| Example 186 | | | | | | | |
| Example 187 | | | | | | | |
| Example 188 | | | | | | | |
| Example 189 | | | | | | | |
| Example 190 | | | | | | | |
| Example 191 | | | | | | | |
| Example 192 | | | | | | | |
| Example 193 | | | | | | | |
| Example 194 | | | | | | | |
| Example 195 | | | | | | | |

TABLE 58

Components of chemical liquid for pre-wetting
Mixture of organic solvents
Fifth organic solvent

| Table 1-5-6 | Type | Content (% by mass) | Molar mass (g/mol) | Vapor pressure (Pa) | Surface tension (mN/m) | δh (MPa)^0.5 | δd (MPa)^0.5 | Vapor pressure (Pa) | Surface tension (mN/m) |
|---|---|---|---|---|---|---|---|---|---|
| Example 156 | | | | | | | | 484 | 34.5 |
| Example 160 | | | | | | | | 484 | 34.5 |
| Example 161 | | | | | | | | 434 | 25.5 |
| Example 162 | | | | | | | | 389 | 27.3 |
| Example 163 | | | | | | | | 1,226 | 27.7 |
| Example 164 | | | | | | | | 1,301 | 27.9 |
| Example 165 | | | | | | | | 1,321 | 27.8 |
| Example 166 | | | | | | | | 1,292 | 27.8 |
| Example 167 | | | | | | | | 1,319 | 27.7 |
| Example 168 | | | | | | | | 1,307 | 27.8 |
| Example 169 | | | | | | | | 1,292 | 27.6 |
| Example 170 | | | | | | | | 1,321 | 27.5 |
| Example 171 | | | | | | | | 1,320 | 27.6 |
| Example 172 | | | | | | | | 1,290 | 27.8 |
| Example 173 | | | | | | | | 1,213 | 28.0 |
| Example 174 | | | | | | | | 1,250 | 27.9 |
| Example 175 | | | | | | | | 1,250 | 27.9 |

TABLE 58-continued

| | | | | | | | Components of chemical liquid for pre-wetting Mixture of organic solvents | |
|---|---|---|---|---|---|---|---|---|
| | | | Fifth organic solvent | | | | | |
| Table 1-5-6 | Type | Content (% by mass) | Molar mass (g/mol) | Vapor pressure (Pa) | Surface tension (mN/m) | δh (MPa)$^{0.5}$ | δd (MPa)$^{0.5}$ | Vapor pressure (Pa) | Surface tension (mN/m) |
| Example 176 | | | | | | | | 1,250 | 27.9 |
| Example 177 | | | | | | | | 1,338 | 28.0 |
| Example 178 | | | | | | | | 1,227 | 28.3 |
| Example 179 | | | | | | | | 1,227 | 28.1 |
| Example 180 | | | | | | | | 1,295 | 32.9 |
| Example 181 | | | | | | | | 1,363 | 32.9 |
| Example 182 | | | | | | | | 1,385 | 33.1 |
| Example 183 | | | | | | | | 1,381 | 33.2 |
| Example 184 | | | | | | | | 1,384 | 33.0 |
| Example 185 | | | | | | | | 1,375 | 33.2 |
| Example 186 | | | | | | | | 1,361 | 33.2 |
| Example 187 | | | | | | | | 1,390 | 33.2 |
| Example 188 | | | | | | | | 1,389 | 33.3 |
| Example 189 | | | | | | | | 1,359 | 33.2 |
| Example 190 | | | | | | | | 1,283 | 33.2 |
| Example 191 | | | | | | | | 1,319 | 33.3 |
| Example 192 | | | | | | | | 1,319 | 33.3 |
| Example 193 | | | | | | | | 1,319 | 33.3 |
| Example 194 | | | | | | | | 1,407 | 33.7 |
| Example 195 | | | | | | | | 1,297 | 33.5 |

TABLE 59

| | Components of chemical liquid for pre-wetting | | | | | | |
|---|---|---|---|---|---|---|---|
| | Mixture of organic solvents Content of mixture in chemical liquid | Impurity metal Total content of impurity metal (mass ppt) | | | | | |
| Table 1-5-7 | (% by mass) | Fe | Cr | Ni | Pb | Others | Total |
| Example 156 | Balance | 0.006 | 0.004 | 0.006 | 0.004 | 0.032 | 0.052 |
| Example 160 | Balance | 0.006 | 0.004 | 0.006 | 0.004 | 0.032 | 0.052 |
| Example 161 | Balance | 0.004 | 0.004 | 0.004 | 0.002 | 0.042 | 0.056 |
| Example 162 | Balance | 0.006 | 0.002 | 0.006 | 0.004 | 0.032 | 0.05 |
| Example 163 | Balance | 0.002 | 0.006 | 0.002 | 0.030 | 0.030 | 0.070 |
| Example 164 | Balance | 0.002 | 0.006 | 0.002 | 0.030 | 0.030 | 0.070 |
| Example 165 | Balance | 0.002 | 0.006 | 0.002 | 0.030 | 0.030 | 0.070 |
| Example 166 | Balance | 0.002 | 0.006 | 0.002 | 0.030 | 0.030 | 0.070 |
| Example 167 | Balance | 0.002 | 0.006 | 0.002 | 0.030 | 0.030 | 0.070 |
| Example 168 | Balance | 0.002 | 0.006 | 0.002 | 0.030 | 0.030 | 0.070 |
| Example 169 | Balance | 0.002 | 0.006 | 0.002 | 0.030 | 0.030 | 0.070 |
| Example 170 | Balance | 0.002 | 0.006 | 0.002 | 0.030 | 0.030 | 0.070 |
| Example 171 | Balance | 0.002 | 0.006 | 0.002 | 0.030 | 0.030 | 0.070 |
| Example 172 | Balance | 0.002 | 0.006 | 0.002 | 0.030 | 0.030 | 0.070 |
| Example 173 | Balance | 0.002 | 0.006 | 0.002 | 0.030 | 0.030 | 0.070 |
| Example 174 | Balance | 0.002 | 0.006 | 0.002 | 0.030 | 0.030 | 0.070 |
| Example 175 | Balance | 0.002 | 0.006 | 0.002 | 0.030 | 0.030 | 0.070 |
| Example 176 | Balance | 0.002 | 0.006 | 0.002 | 0.030 | 0.030 | 0.070 |
| Example 177 | Balance | 0.002 | 0.006 | 0.002 | 0.030 | 0.030 | 0.070 |
| Example 178 | Balance | 0.002 | 0.006 | 0.002 | 0.030 | 0.030 | 0.070 |
| Example 179 | Balance | 0.002 | 0.006 | 0.002 | 0.030 | 0.030 | 0.070 |
| Example 180 | Balance | 0.002 | 0.006 | 0.002 | 0.030 | 0.030 | 0.070 |
| Example 181 | Balance | 0.002 | 0.006 | 0.002 | 0.030 | 0.030 | 0.070 |
| Example 182 | Balance | 0.002 | 0.006 | 0.002 | 0.030 | 0.030 | 0.070 |
| Example 183 | Balance | 0.002 | 0.006 | 0.002 | 0.030 | 0.030 | 0.070 |
| Example 184 | Balance | 0.002 | 0.006 | 0.002 | 0.030 | 0.030 | 0.070 |
| Example 185 | Balance | 0.002 | 0.006 | 0.002 | 0.030 | 0.030 | 0.070 |
| Example 186 | Balance | 0.002 | 0.006 | 0.002 | 0.030 | 0.030 | 0.070 |
| Example 187 | Balance | 0.002 | 0.006 | 0.002 | 0.030 | 0.030 | 0.070 |
| Example 188 | Balance | 0.002 | 0.006 | 0.002 | 0.030 | 0.030 | 0.070 |
| Example 189 | Balance | 0.002 | 0.006 | 0.002 | 0.030 | 0.030 | 0.070 |
| Example 190 | Balance | 0.002 | 0.006 | 0.002 | 0.030 | 0.030 | 0.070 |
| Example 191 | Balance | 0.002 | 0.006 | 0.002 | 0.030 | 0.030 | 0.070 |
| Example 192 | Balance | 0.002 | 0.006 | 0.002 | 0.030 | 0.030 | 0.070 |
| Example 193 | Balance | 0.002 | 0.006 | 0.002 | 0.030 | 0.030 | 0.070 |
| Example 194 | Balance | 0.002 | 0.006 | 0.002 | 0.030 | 0.030 | 0.070 |
| Example 195 | Balance | 0.002 | 0.006 | 0.002 | 0.030 | 0.030 | 0.070 |

TABLE 60

Components of chemical liquid for pre-wetting

| | Impurity metal Content of impurity metal as particles (mass ppt) | | | | | | Organic impurity Specific organic compound | |
|---|---|---|---|---|---|---|---|---|
| | | | | | | | Boiling-point: equal to or higher than 250° C. Number of carbon atoms: equal to or | Boiling-point: equal to or higher than 250° C. Number of carbon atoms: equal to or |
| Table 1-5-8 | Fe | Cr | Ni | Pb | Others | Total | greater than 8 | greater than 12 |
| Example 156 | 0.002 | 0.001 | 0.003 | 0.001 | 0.016 | 0.023 | A | A |
| Example 160 | 0.002 | 0.001 | 0.003 | 0.001 | 0.016 | 0.023 | A | A |
| Example 161 | 0.001 | 0.001 | 0.003 | 0.001 | 0.019 | 0.025 | A | A |
| Example 162 | 0.003 | 0.001 | 0.004 | 0.001 | 0.018 | 0.027 | A | A |
| Example 163 | 0.040 | 0.002 | 0.001 | 0.003 | 0.019 | 0.065 | A | A |
| Example 164 | 0.040 | 0.002 | 0.001 | 0.003 | 0.019 | 0.065 | A | A |
| Example 165 | 0.040 | 0.002 | 0.001 | 0.003 | 0.019 | 0.065 | A | A |
| Example 166 | 0.040 | 0.002 | 0.001 | 0.003 | 0.019 | 0.065 | A | A |
| Example 167 | 0.040 | 0.002 | 0.001 | 0.003 | 0.019 | 0.065 | A | A |
| Example 168 | 0.040 | 0.002 | 0.001 | 0.003 | 0.019 | 0.065 | A | A |
| Example 169 | 0.040 | 0.002 | 0.001 | 0.003 | 0.019 | 0.065 | A | A |
| Example 170 | 0.040 | 0.002 | 0.001 | 0.003 | 0.019 | 0.065 | A | A |
| Example 171 | 0.040 | 0.002 | 0.001 | 0.003 | 0.019 | 0.065 | A | A |
| Example 172 | 0.040 | 0.002 | 0.001 | 0.003 | 0.019 | 0.065 | A | A |
| Example 173 | 0.040 | 0.002 | 0.001 | 0.003 | 0.019 | 0.065 | A | A |
| Example 174 | 0.040 | 0.002 | 0.001 | 0.003 | 0.019 | 0.065 | A | A |
| Example 175 | 0.040 | 0.002 | 0.001 | 0.003 | 0.019 | 0.065 | A | A |
| Example 176 | 0.040 | 0.002 | 0.001 | 0.003 | 0.019 | 0.065 | A | A |
| Example 177 | 0.040 | 0.002 | 0.001 | 0.003 | 0.019 | 0.065 | A | A |
| Example 178 | 0.040 | 0.002 | 0.001 | 0.003 | 0.019 | 0.065 | A | A |
| Example 179 | 0.040 | 0.002 | 0.001 | 0.003 | 0.019 | 0.065 | A | A |
| Example 180 | 0.040 | 0.002 | 0.001 | 0.003 | 0.019 | 0.065 | A | A |
| Example 181 | 0.040 | 0.002 | 0.001 | 0.003 | 0.019 | 0.065 | A | A |
| Example 182 | 0.040 | 0.002 | 0.001 | 0.003 | 0.019 | 0.065 | A | A |
| Example 183 | 0.040 | 0.002 | 0.001 | 0.003 | 0.019 | 0.065 | A | A |
| Example 184 | 0.040 | 0.002 | 0.001 | 0.003 | 0.019 | 0.065 | A | A |
| Example 185 | 0.040 | 0.002 | 0.001 | 0.003 | 0.019 | 0.065 | A | A |
| Example 186 | 0.040 | 0.002 | 0.001 | 0.003 | 0.019 | 0.065 | A | A |
| Example 187 | 0.040 | 0.002 | 0.001 | 0.003 | 0.019 | 0.065 | A | A |
| Example 188 | 0.040 | 0.002 | 0.001 | 0.003 | 0.019 | 0.065 | A | A |
| Example 189 | 0.040 | 0.002 | 0.001 | 0.003 | 0.019 | 0.065 | A | A |
| Example 190 | 0.040 | 0.002 | 0.001 | 0.003 | 0.019 | 0.065 | A | A |
| Example 191 | 0.040 | 0.002 | 0.001 | 0.003 | 0.019 | 0.065 | A | A |
| Example 192 | 0.040 | 0.002 | 0.001 | 0.003 | 0.019 | 0.065 | A | A |
| Example 193 | 0.040 | 0.002 | 0.001 | 0.003 | 0.019 | 0.065 | A | A |
| Example 194 | 0.040 | 0.002 | 0.001 | 0.003 | 0.019 | 0.065 | A | A |
| Example 195 | 0.040 | 0.002 | 0.001 | 0.003 | 0.019 | 0.065 | A | A |

TABLE 61

| | Components of chemical liquid for pre-wetting | | | | | Physical properties of chemical liquid for pre-wetting | |
|---|---|---|---|---|---|---|---|
| | Organic impurity Content of organic impurity | | | | | | |
| Table 1-5-9 | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | Number of coarse particles (Number of objects to be counted) (Number/mL) | Evaluation Defect inhibition performance |
| Example 156 | 2,500 | 1 | 0.5 | 500 | 1.50% | 6 | B |
| Example 160 | 2,500 | 40 | 35 | 35,000 | 0.10% | 8 | B |
| Example 161 | 2,500 | 1 | 0.5 | 500 | 0.10% | 6 | B |
| Example 162 | 2,500 | 1 | 0.5 | 500 | 0.10% | 6 | B |
| Example 163 | 2,500 | 1 | 0.5 | 500 | 0.10% | 6 | AA |
| Example 164 | 2,500 | 1 | 0.5 | 500 | 0.10% | 6 | AA |
| Example 165 | 2,500 | 1 | 0.5 | 500 | 0.10% | 6 | AA |
| Example 166 | 2,500 | 1 | 0.5 | 500 | 0.10% | 6 | AA |
| Example 167 | 2,500 | 1 | 0.5 | 500 | 0.10% | 6 | AA |
| Example 168 | 2,500 | 1 | 0.5 | 500 | 0.10% | 6 | AA |
| Example 169 | 2,500 | 1 | 0.5 | 500 | 0.10% | 6 | AA |
| Example 170 | 2,500 | 1 | 0.5 | 500 | 0.10% | 6 | AA |

TABLE 61-continued

| Table 1-5-9 | Components of chemical liquid for pre-wetting | | | | | Physical properties of chemical liquid for pre-wetting | |
|---|---|---|---|---|---|---|---|
| | Organic impurity Content of organic impurity | | | | | | |
| | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | Number of coarse particles (Number of objects to be counted) (Number/mL) | Evaluation Defect inhibition performance |
| Example 171 | 2,500 | 1 | 0.5 | 500 | 0.10% | 6 | AA |
| Example 172 | 2,500 | 1 | 0.5 | 500 | 0.10% | 6 | AA |
| Example 173 | 2,500 | 1 | 0.5 | 500 | 0.10% | 6 | AA |
| Example 174 | 2,500 | 1 | 0.5 | 500 | 0.10% | 6 | AA |
| Example 175 | 2,500 | 1 | 0.5 | 500 | 0.10% | 6 | AA |
| Example 176 | 2,500 | 1 | 0.5 | 500 | 0.10% | 6 | AA |
| Example 177 | 2,500 | 1 | 0.5 | 500 | 0.10% | 6 | AA |
| Example 178 | 2,500 | 1 | 0.5 | 500 | 0.10% | 6 | AA |
| Example 179 | 2,500 | 1 | 0.5 | 500 | 0.10% | 6 | AA |
| Example 180 | 2,500 | 1 | 0.5 | 500 | 0.10% | 6 | AA |
| Example 181 | 2,500 | 1 | 0.5 | 500 | 0.10% | 6 | AA |
| Example 182 | 2,500 | 1 | 0.5 | 500 | 0.10% | 6 | AA |
| Example 183 | 2,500 | 1 | 0.5 | 500 | 0.10% | 6 | AA |
| Example 184 | 2,500 | 1 | 0.5 | 500 | 0.10% | 6 | AA |
| Example 185 | 2,500 | 1 | 0.5 | 500 | 0.10% | 6 | AA |
| Example 186 | 2,500 | 1 | 0.5 | 500 | 0.10% | 6 | AA |
| Example 187 | 2,500 | 1 | 0.5 | 500 | 0.10% | 6 | AA |
| Example 188 | 2,500 | 1 | 0.5 | 500 | 0.10% | 6 | AA |
| Example 189 | 2,500 | 1 | 0.5 | 500 | 0.10% | 6 | AA |
| Example 190 | 2,500 | 1 | 0.5 | 500 | 0.10% | 6 | AA |
| Example 191 | 2,500 | 1 | 0.5 | 500 | 0.10% | 6 | AA |
| Example 192 | 2,500 | 1 | 0.5 | 500 | 0.10% | 6 | AA |
| Example 193 | 2,500 | 1 | 0.5 | 500 | 0.10% | 6 | AA |
| Example 194 | 2,500 | 1 | 0.5 | 500 | 0.10% | 6 | AA |
| Example 195 | 2,500 | 1 | 0.5 | 500 | 0.10% | 6 | AA |

TABLE 62

| Table 1-5-10 | Evaluation | | | | | | | | |
|---|---|---|---|---|---|---|---|---|---|
| | Type of resist composition | | | | | Type of resist composition | | | |
| | | Affinity | | Resist saving properties | | | Affinity | | Resist saving properties |
| | | | | Uniformity | Film thickness controllability | | | | Uniformity | Film thickness controllability |
| | Rsq1 | SRsq | Uniformity | controllability | | Rsq1 | SRsq | Uniformity | controllability |
| Example 156 | 1 | A | A | AA | A | 2 | A | A | AA | A |
| Example 160 | 1 | A | A | AA | A | 2 | A | A | AA | A |
| Example 161 | 1 | A | A | AA | A | 2 | A | A | A | A |
| Example 162 | 1 | A | A | AA | A | 2 | A | A | A | A |
| Example 163 | 1 | A | A | AA | A | 2 | A | A | A | A |
| Example 164 | 1 | A | A | AA | A | 2 | A | A | A | A |
| Example 165 | 1 | A | A | AA | A | 2 | A | A | A | A |
| Example 166 | 1 | A | A | AA | A | 2 | A | A | A | A |
| Example 167 | 1 | A | A | AA | A | 2 | A | A | A | A |
| Example 168 | 1 | A | A | AA | A | 2 | A | A | A | A |
| Example 169 | 1 | A | A | AA | A | 2 | A | A | A | A |
| Example 170 | 1 | A | A | AA | A | 2 | A | A | A | A |
| Example 171 | 1 | A | A | AA | A | 2 | A | A | A | A |
| Example 172 | 1 | A | A | AA | A | 2 | A | A | A | A |
| Example 173 | 1 | A | A | AA | A | 2 | A | A | A | A |
| Example 174 | 1 | A | A | AA | A | 2 | A | A | A | A |
| Example 175 | 1 | A | A | AA | A | 2 | A | A | A | A |
| Example 176 | 1 | A | A | AA | A | 2 | A | A | A | A |
| Example 177 | 1 | A | A | AA | A | 2 | A | A | A | A |
| Example 178 | 1 | A | A | AA | A | 2 | A | A | A | A |
| Example 179 | 1 | A | A | AA | A | 2 | A | A | A | A |
| Example 180 | 1 | A | A | AA | A | 2 | A | A | A | A |
| Example 181 | 1 | A | A | AA | A | 2 | A | A | A | A |
| Example 182 | 1 | A | A | AA | A | 2 | A | A | A | A |
| Example 183 | 1 | A | A | AA | A | 2 | A | A | A | A |
| Example 184 | 1 | A | A | AA | A | 2 | A | A | A | A |

TABLE 62-continued

| Table 1-5-10 | | Evaluation | | | | | | | | |
|---|---|---|---|---|---|---|---|---|---|---|
| | | Type of resist composition | | | | Type of resist composition | | | | |
| | | Affinity | | | Resist saving properties | | Affinity | | | Resist saving properties |
| | | Rsq1 | SRsq | Uniformity | Film thickness controllability | | Rsq1 | SRsq | Uniformity | Film thickness controllability |
| Example 185 | 1 | A | A | AA | A | 2 | A | A | A | A |
| Example 186 | 1 | A | A | AA | A | 2 | A | A | A | A |
| Example 187 | 1 | A | A | AA | A | 2 | A | A | A | A |
| Example 188 | 1 | A | A | AA | A | 2 | A | A | A | A |
| Example 189 | 1 | A | A | AA | A | 2 | A | A | A | A |
| Example 190 | 1 | A | A | AA | A | 2 | A | A | A | A |
| Example 191 | 1 | A | A | AA | A | 2 | A | A | A | A |
| Example 192 | 1 | A | A | AA | A | 2 | A | A | A | A |
| Example 193 | 1 | A | A | AA | A | 2 | A | A | A | A |
| Example 194 | 1 | A | A | AA | A | 2 | A | A | A | A |
| Example 195 | 1 | A | A | AA | A | 2 | A | A | A | A |

TABLE 63

| Table 1-5-11 | | Evaluation | | | | | | | | |
|---|---|---|---|---|---|---|---|---|---|---|
| | | Type of resist composition | | | | Type of resist composition | | | | |
| | | Affinity | | | Resist saving properties | | Affinity | | | Resist saving properties |
| | | Rsq1 | SRsq | Uniformity | Film thickness controllability | | Rsq1 | SRsq | Uniformity | Film thickness controllability |
| Example 156 | 3 | A | A | AA | A | 4 | A | A | AA | A |
| Example 160 | 3 | A | A | AA | A | 4 | A | A | AA | A |
| Example 161 | 3 | A | A | AA | A | 4 | A | A | AA | A |
| Example 162 | 3 | A | A | AA | A | 4 | A | A | AA | A |
| Example 163 | 3 | A | A | AA | A | 4 | A | A | AA | A |
| Example 164 | 3 | A | A | AA | A | 4 | A | A | AA | A |
| Example 165 | 3 | A | A | AA | A | 4 | A | A | AA | A |
| Example 166 | 3 | A | A | AA | A | 4 | A | A | AA | A |
| Example 167 | 3 | A | A | AA | A | 4 | A | A | AA | A |
| Example 168 | 3 | A | A | AA | A | 4 | A | A | AA | A |
| Example 169 | 3 | A | A | AA | A | 4 | A | A | AA | A |
| Example 170 | 3 | A | A | AA | A | 4 | A | A | AA | A |
| Example 171 | 3 | A | A | AA | A | 4 | A | A | AA | A |
| Example 172 | 3 | A | A | AA | A | 4 | A | A | AA | A |
| Example 173 | 3 | A | A | AA | A | 4 | A | A | AA | A |
| Example 174 | 3 | A | A | AA | A | 4 | A | A | AA | A |
| Example 175 | 3 | A | A | AA | A | 4 | A | A | AA | A |
| Example 176 | 3 | A | A | AA | A | 4 | A | A | AA | A |
| Example 177 | 3 | A | A | AA | A | 4 | A | A | AA | A |
| Example 178 | 3 | A | A | AA | A | 4 | A | A | AA | A |
| Example 179 | 3 | A | A | AA | A | 4 | A | A | AA | A |
| Example 180 | 3 | A | A | AA | A | 4 | A | A | AA | A |
| Example 181 | 3 | A | A | AA | A | 4 | A | A | AA | A |
| Example 182 | 3 | A | A | AA | A | 4 | A | A | AA | A |
| Example 183 | 3 | A | A | AA | A | 4 | A | A | AA | A |
| Example 184 | 3 | A | A | AA | A | 4 | A | A | AA | A |
| Example 185 | 3 | A | A | AA | A | 4 | A | A | AA | A |
| Example 186 | 3 | A | A | AA | A | 4 | A | A | AA | A |
| Example 187 | 3 | A | A | AA | A | 4 | A | A | AA | A |
| Example 188 | 3 | A | A | AA | A | 4 | A | A | AA | A |
| Example 189 | 3 | A | A | AA | A | 4 | A | A | AA | A |
| Example 190 | 3 | A | A | AA | A | 4 | A | A | AA | A |
| Example 191 | 3 | A | A | AA | A | 4 | A | A | AA | A |
| Example 192 | 3 | A | A | AA | A | 4 | A | A | AA | A |
| Example 193 | 3 | A | A | AA | A | 4 | A | A | AA | A |
| Example 194 | 3 | A | A | AA | A | 4 | A | A | AA | A |
| Example 195 | 3 | A | A | AA | A | 4 | A | A | AA | A |

TABLE 64

| Table 1-5-12 | Type of resist composition | | | | | Type of resist composition | | | | |
|---|---|---|---|---|---|---|---|---|---|---|
| | | Affinity | | | Resist saving properties | | Affinity | | | Resist saving properties |
| | | Rsq1 | SRsq | Uniformity | Film thickness controllability | | Rsq1 | SRsq | Uniformity | Film thickness controllability |
| Example 156 | 5 | A | A | AA | A | 6 | A | A | AA | A |
| Example 160 | 5 | A | A | AA | A | 6 | A | A | AA | A |
| Example 161 | 5 | A | A | AA | A | 6 | A | A | AA | A |
| Example 162 | 5 | A | A | AA | A | 6 | A | A | AA | A |
| Example 163 | 5 | A | A | AA | A | 6 | A | A | AA | A |
| Example 164 | 5 | A | A | AA | A | 6 | A | A | AA | A |
| Example 165 | 5 | A | A | AA | A | 6 | A | A | AA | A |
| Example 166 | 5 | A | A | AA | A | 6 | A | A | AA | A |
| Example 167 | 5 | A | A | AA | A | 6 | A | A | AA | A |
| Example 168 | 5 | A | A | AA | A | 6 | A | A | AA | A |
| Example 169 | 5 | A | A | AA | A | 6 | A | A | AA | A |
| Example 170 | 5 | A | A | AA | A | 6 | A | A | AA | A |
| Example 171 | 5 | A | A | AA | A | 6 | A | A | AA | A |
| Example 172 | 5 | A | A | AA | A | 6 | A | A | AA | A |
| Example 173 | 5 | A | A | AA | A | 6 | A | A | AA | A |
| Example 174 | 5 | A | A | AA | A | 6 | A | A | AA | A |
| Example 175 | 5 | A | A | AA | A | 6 | A | A | AA | A |
| Example 176 | 5 | A | A | AA | A | 6 | A | A | AA | A |
| Example 177 | 5 | A | A | AA | A | 6 | A | A | AA | A |
| Example 178 | 5 | A | A | AA | A | 6 | A | A | AA | A |
| Example 179 | 5 | A | A | AA | A | 6 | A | A | AA | A |
| Example 180 | 5 | A | A | AA | A | 6 | A | A | AA | A |
| Example 181 | 5 | A | A | AA | A | 6 | A | A | AA | A |
| Example 182 | 5 | A | A | AA | A | 6 | A | A | AA | A |
| Example 183 | 5 | A | A | AA | A | 6 | A | A | AA | A |
| Example 184 | 5 | A | A | AA | A | 6 | A | A | AA | A |
| Example 185 | 5 | A | A | AA | A | 6 | A | A | AA | A |
| Example 186 | 5 | A | A | AA | A | 6 | A | A | AA | A |
| Example 187 | 5 | A | A | AA | A | 6 | A | A | AA | A |
| Example 188 | 5 | A | A | AA | A | 6 | A | A | AA | A |
| Example 189 | 5 | A | A | AA | A | 6 | A | A | AA | A |
| Example 190 | 5 | A | A | AA | A | 6 | A | A | AA | A |
| Example 191 | 5 | A | A | AA | A | 6 | A | A | AA | A |
| Example 192 | 5 | A | A | AA | A | 6 | A | A | AA | A |
| Example 193 | 5 | A | A | AA | A | 6 | A | A | AA | A |
| Example 194 | 5 | A | A | AA | A | 6 | A | A | AA | A |
| Example 195 | 5 | A | A | AA | A | 6 | A | A | AA | A |

TABLE 65

| Table 1-5-13 | Type of resist composition | | | | | Table 1-5-13 | Type of resist composition | | | |
|---|---|---|---|---|---|---|---|---|---|---|
| | | Affinity | | | Resist saving properties | | | Affinity | | Resist saving properties |
| | | Rsq1 | SRsq | Uniformity | Film thickness controllability | | | Rsq1 | SRsq | Uniformity | Film thickness controllability |
| Example 156 | 7 | A | A | AA | A | Example 175 | 7 | A | A | AA | A |
| Example 160 | 7 | A | A | AA | A | Example 176 | 7 | A | A | AA | A |
| Example 161 | 7 | A | A | AA | A | Example 177 | 7 | A | A | AA | A |
| Example 162 | 7 | A | A | AA | A | Example 178 | 7 | A | A | AA | A |
| Example 163 | 7 | A | A | AA | A | Example 179 | 7 | A | A | AA | A |
| Example 164 | 7 | A | A | AA | A | Example 180 | 7 | A | A | AA | A |
| Example 165 | 7 | A | A | AA | A | Example 181 | 7 | A | A | AA | A |
| Example 166 | 7 | A | A | AA | A | Example 182 | 7 | A | A | AA | A |
| Example 167 | 7 | A | A | AA | A | Example 183 | 7 | A | A | AA | A |
| Example 168 | 7 | A | A | AA | A | Example 184 | 7 | A | A | AA | A |
| Example 169 | 7 | A | A | AA | A | Example 185 | 7 | A | A | AA | A |
| Example 170 | 7 | A | A | AA | A | Example 186 | 7 | A | A | AA | A |
| Example 171 | 7 | A | A | AA | A | Example 187 | 7 | A | A | AA | A |
| Example 172 | 7 | A | A | AA | A | Example 188 | 7 | A | A | AA | A |
| Example 173 | 7 | A | A | AA | A | Example 189 | 7 | A | A | AA | A |
| Example 174 | 7 | A | A | AA | A | Example 190 | 7 | A | A | AA | A |

TABLE 65-continued

| Table 1-5-13 | Evaluation Type of resist composition | | | |
|---|---|---|---|---|
| | Affinity | | Resist saving properties | |
| | Rsq1 | SRsq | Uniformity | Film thickness controllability |
| Example 191 | 7 | A | A | AA | A |
| Example 192 | 7 | A | A | AA | A |
| Example 193 | 7 | A | A | AA | A |
| Example 194 | 7 | A | A | AA | A |
| Example 195 | 7 | A | A | AA | A |

TABLE 66

| Table 1-6-1 | Components of chemical liquid for pre-wetting Mixture of organic solvents First organic solvent | | | | | | |
|---|---|---|---|---|---|---|---|
| | Type | Content (% by mass) | Molar mass (g/mol) | Vapor pressure (Pa) | Surface tension (mN/m) | δh $(MPa)^{0.5}$ | δd $(MPa)^{0.5}$ |
| Example 196 | CyPn | 80 | 84.1 | 1,520 | 33.8 | 60.0 | 21.8 |
| Example 197 | nBA | 80 | 116.16 | 1,200 | 24.8 | 60.5 | 17.2 |
| Example 198 | nBA | 80 | 116.16 | 1,200 | 24.8 | 60.5 | 17.2 |
| Example 199 | nBA | 80 | 116.16 | 1,200 | 24.8 | 60.5 | 17.2 |
| Example 200 | nBA | 80 | 116.16 | 1,200 | 24.8 | 60.5 | 17.2 |
| Example 201 | nBA | 80 | 116.16 | 1,200 | 24.8 | 60.5 | 17.2 |
| Example 202 | nBA | 80 | 116.16 | 1,200 | 24.8 | 60.5 | 17.2 |
| Example 203 | nBA | 80 | 116.16 | 1,200 | 24.8 | 60.5 | 17.2 |
| Example 204 | nBA | 80 | 116.16 | 1,200 | 24.8 | 60.5 | 17.2 |
| Example 205 | nBA | 80 | 116.16 | 1,200 | 24.8 | 60.5 | 17.2 |
| Example 206 | nBA | 80 | 116.16 | 1,200 | 24.8 | 60.5 | 17.2 |
| Example 207 | nBA | 80 | 116.16 | 1,200 | 24.8 | 60.5 | 17.2 |
| Example 208 | nBA | 80 | 116.16 | 1,200 | 24.8 | 60.5 | 17.2 |
| Example 209 | nBA | 80 | 116.16 | 1,200 | 24.8 | 60.5 | 17.2 |
| Example 210 | nBA | 80 | 116.16 | 1,200 | 24.8 | 60.5 | 17.2 |
| Example 211 | nBA | 80 | 116.16 | 1,200 | 24.8 | 60.5 | 17.2 |
| Example 212 | nBA | 80 | 116.16 | 1,200 | 24.8 | 60.5 | 17.2 |
| Example 213 | nBA | 80 | 116.16 | 1,200 | 24.8 | 60.5 | 17.2 |
| Example 214 | | | | | | | |
| Example 215 | | | | | | | |
| Example 216 | | | | | | | |
| Example 217 | | | | | | | |
| Example 218 | | | | | | | |
| Example 219 | | | | | | | |
| Example 220 | | | | | | | |
| Example 221 | | | | | | | |
| Example 222 | | | | | | | |
| Example 223 | | | | | | | |
| Example 224 | | | | | | | |
| Example 225 | | | | | | | |
| Example 226 | | | | | | | |
| Example 227 | | | | | | | |
| Example 228 | | | | | | | |
| Example 229 | | | | | | | |
| Example 230 | | | | | | | |
| Example 231 | | | | | | | |
| Example 232 | | | | | | | |
| Example 233 | | | | | | | |
| Example 234 | | | | | | | |
| Example 235 | | | | | | | |

TABLE 67

Components of chemical liquid for pre-wetting
Mixture of organic solvents
Second organic solvent

| Table 1-6-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 196 | | | | | | | |
| Example 197 | | | | | | | |
| Example 198 | | | | | | | |
| Example 199 | | | | | | | |
| Example 200 | | | | | | | |
| Example 201 | | | | | | | |
| Example 202 | | | | | | | |
| Example 203 | | | | | | | |
| Example 204 | | | | | | | |
| Example 205 | | | | | | | |
| Example 206 | | | | | | | |
| Example 207 | | | | | | | |
| Example 208 | | | | | | | |
| Example 209 | | | | | | | |
| Example 210 | | | | | | | |
| Example 211 | | | | | | | |
| Example 212 | | | | | | | |
| Example 213 | | | | | | | |
| Example 214 | PGMEA | 75 | 132.16 | 493 | 27.9 | 56.5 | 19.8 |
| Example 215 | PGMEA | 75 | 132.16 | 493 | 27.9 | 56.5 | 19.8 |
| Example 216 | PGMEA | 75 | 132.16 | 493 | 27.9 | 56.5 | 19.8 |
| Example 217 | PGMEA | 75 | 132.16 | 493 | 27.9 | 56.5 | 19.8 |
| Example 218 | PGMEA | 75 | 132.16 | 493 | 27.9 | 56.5 | 19.8 |
| Example 219 | PGMEA | 75 | 132.16 | 493 | 27.9 | 56.5 | 19.8 |
| Example 220 | PGMEA | 75 | 132.16 | 493 | 27.9 | 56.5 | 19.8 |
| Example 221 | PGMEA | 75 | 132.16 | 493 | 27.9 | 56.5 | 19.8 |
| Example 222 | PGMEA | 75 | 132.16 | 493 | 27.9 | 56.5 | 19.8 |
| Example 223 | PGMEA | 75 | 132.16 | 493 | 27.9 | 56.5 | 19.8 |
| Example 224 | PGMEA | 75 | 132.16 | 493 | 27.9 | 56.5 | 19.8 |
| Example 225 | PGMEA | 75 | 132.16 | 493 | 27.9 | 56.5 | 19.8 |
| Example 226 | PGMEA | 75 | 132.16 | 493 | 27.9 | 56.5 | 19.8 |
| Example 227 | PGMEA | 75 | 132.16 | 493 | 27.9 | 56.5 | 19.8 |
| Example 228 | PGMEA | 75 | 132.16 | 493 | 27.9 | 56.5 | 19.8 |
| Example 229 | PGMEA | 75 | 132.16 | 493 | 27.9 | 56.5 | 19.8 |
| Example 230 | PGMEA | 75 | 132.16 | 493 | 27.9 | 56.5 | 19.8 |
| Example 231 | CyHx | 75 | 98.14 | 507 | 34.1 | 61.0 | 21.6 |
| Example 232 | CyHx | 75 | 98.14 | 507 | 34.1 | 61.0 | 21.6 |
| Example 233 | CyHx | 75 | 98.14 | 507 | 34.1 | 61.0 | 21.6 |
| Example 234 | CyHx | 75 | 98.14 | 507 | 34.1 | 61.0 | 21.6 |
| Example 235 | CyHx | 75 | 98.14 | 507 | 34.1 | 61.0 | 21.6 |

TABLE 68

Components of chemical liquid for pre-wetting
Mixture of organic solvents
Third organic solvent

| Table 1-6-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 196 | | | | | | | |
| Example 197 | | | | | | | |
| Example 198 | | | | | | | |
| Example 199 | | | | | | | |
| Example 200 | | | | | | | |
| Example 201 | | | | | | | |
| Example 202 | | | | | | | |
| Example 203 | | | | | | | |
| Example 204 | | | | | | | |
| Example 205 | | | | | | | |
| Example 206 | | | | | | | |
| Example 207 | | | | | | | |
| Example 208 | | | | | | | |
| Example 209 | | | | | | | |
| Example 210 | | | | | | | |
| Example 211 | | | | | | | |
| Example 212 | | | | | | | |

TABLE 68-continued

Components of chemical liquid for pre-wetting
Mixture of organic solvents
Third organic solvent

| Table 1-6-3 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 213 | | | | | | | |
| Example 214 | | | | | | | |
| Example 215 | | | | | | | |
| Example 216 | | | | | | | |
| Example 217 | | | | | | | |
| Example 218 | | | | | | | |
| Example 219 | | | | | | | |
| Example 220 | | | | | | | |
| Example 221 | | | | | | | |
| Example 222 | | | | | | | |
| Example 223 | | | | | | | |
| Example 224 | | | | | | | |
| Example 225 | | | | | | | |
| Example 226 | | | | | | | |
| Example 227 | | | | | | | |
| Example 228 | | | | | | | |
| Example 229 | | | | | | | |
| Example 230 | | | | | | | |
| Example 231 | | | | | | | |
| Example 232 | | | | | | | |
| Example 233 | | | | | | | |
| Example 234 | | | | | | | |
| Example 235 | | | | | | | |

TABLE 69

Components of chemical liquid for pre-wetting
Mixture of organic solvents
Fourth organic solvent

| Table 1-6-4 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 196 | Phenetole | 20 | 122.17 | 1 | 31.0 | 66.3 | 16.3 |
| Example 197 | DEGME | 20 | 120.15 | 13 | 28.0 | 44.3 | 20.8 |
| Example 198 | DME | 20 | 90.12 | 693 | 29.0 | 55.9 | 22.8 |
| Example 199 | DEE | 20 | 118.18 | 627 | 29.0 | 62.2 | 19.9 |
| Example 200 | DEGIBE | 20 | 162.23 | 133 | 29.0 | 61.9 | 18.7 |
| Example 201 | DEGDME | 20 | 134.18 | 520 | 28.0 | 56.9 | 21.0 |
| Example 202 | DEGDEE | 20 | 162.23 | 253 | 29.0 | 60.4 | 19.6 |
| Example 203 | TriEGDME | 20 | 178.23 | 13 | 28.0 | 56.4 | 20.9 |
| Example 204 | TetraEGDME | 20 | 222.28 | 13 | 27.0 | 55.6 | 21.1 |
| Example 205 | TEGMBE | 20 | 220.31 | 13 | 28.0 | 48.5 | 18.7 |
| Example 206 | DEGMBE | 20 | 162.23 | 117 | 29.0 | 59.4 | 18.1 |
| Example 207 | Anisole | 20 | 108.14 | 63 | 30.0 | 64.3 | 17.0 |
| Example 208 | 14-DMB | 20 | 138.17 | 1 | 30.0 | 59.0 | 20.6 |
| Example 209 | 12-DMB | 20 | 138.17 | 1 | 30.0 | 60.6 | 20.2 |
| Example 210 | 13-DMB | 20 | 138.17 | 1 | 30.0 | 61.6 | 19.9 |
| Example 211 | 14-Diphenoxybenzene | 20 | 262.31 | 1 | 33.0 | 63.3 | 18.5 |
| Example 212 | 4-Methoxytoluene | 20 | 122.17 | 1 | 32.0 | 64.8 | 17.4 |
| Example 213 | Phenetole | 20 | 122.17 | 1 | 31.0 | 66.3 | 16.3 |
| Example 214 | DEGME | 25 | 120.15 | 13 | 28.0 | 44.3 | 20.8 |
| Example 215 | DME | 25 | 90.12 | 693 | 29.0 | 55.9 | 22.8 |
| Example 216 | DEE | 25 | 118.18 | 627 | 29.0 | 62.2 | 19.9 |
| Example 217 | DEGIBE | 25 | 162.23 | 133 | 29.0 | 61.9 | 18.7 |
| Example 218 | DEGDME | 25 | 134.18 | 520 | 28.0 | 56.9 | 21.0 |
| Example 219 | DEGDEE | 25 | 162.23 | 253 | 29.0 | 60.4 | 19.6 |
| Example 220 | TriEGDME | 25 | 178.23 | 13 | 28.0 | 56.4 | 20.9 |
| Example 221 | TetraEGDME | 25 | 222.28 | 13 | 27.0 | 55.6 | 21.1 |
| Example 222 | TEGMBE | 25 | 220.31 | 13 | 28.0 | 48.5 | 18.7 |
| Example 223 | DEGMBE | 25 | 162.23 | 117 | 29.0 | 59.4 | 18.1 |
| Example 224 | Anisole | 25 | 108.14 | 63 | 30.0 | 64.3 | 17.0 |
| Example 225 | 14-DMB | 25 | 138.17 | 1 | 30.0 | 59.0 | 20.6 |
| Example 226 | 12-DMB | 25 | 138.17 | 1 | 30.0 | 60.6 | 20.2 |
| Example 227 | 13-DMB | 25 | 138.17 | 1 | 30.0 | 61.6 | 19.9 |
| Example 228 | 14-Diphenoxybenzene | 25 | 262.31 | 1 | 33.0 | 63.3 | 18.5 |
| Example 229 | 4-Methoxytoluene | 25 | 122.17 | 1 | 32.0 | 64.8 | 17.4 |

TABLE 69-continued

Components of chemical liquid for pre-wetting
Mixture of organic solvents
Fourth organic solvent

| Table 1-6-4 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 230 | Phenetole | 25 | 122.17 | 1 | 31.0 | 66.3 | 16.3 |
| Example 231 | DEGME | 25 | 120.15 | 13 | 28.0 | 44.3 | 20.8 |
| Example 232 | DME | 25 | 90.12 | 693 | 29.0 | 55.9 | 22.8 |
| Example 233 | DEE | 25 | 118.18 | 627 | 29.0 | 62.2 | 19.9 |
| Example 234 | DEGIBE | 25 | 162.23 | 133 | 29.0 | 61.9 | 18.7 |
| Example 235 | DEGDME | 25 | 134.18 | 520 | 28.0 | 56.9 | 21.0 |

15

TABLE 70

Components of chemical liquid for pre-wetting
Mixture of organic solvents
Fourth organic solvent

| Table 1-6-5 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 196 | | | | | | | |
| Example 197 | | | | | | | |
| Example 198 | | | | | | | |
| Example 199 | | | | | | | |
| Example 200 | | | | | | | |
| Example 201 | | | | | | | |
| Example 202 | | | | | | | |
| Example 203 | | | | | | | |
| Example 204 | | | | | | | |
| Example 205 | | | | | | | |
| Example 206 | | | | | | | |
| Example 207 | | | | | | | |
| Example 208 | | | | | | | |
| Example 209 | | | | | | | |
| Example 210 | | | | | | | |
| Example 211 | | | | | | | |
| Example 212 | | | | | | | |
| Example 213 | | | | | | | |
| Example 214 | | | | | | | |
| Example 215 | | | | | | | |
| Example 216 | | | | | | | |
| Example 217 | | | | | | | |
| Example 218 | | | | | | | |
| Example 219 | | | | | | | |
| Example 220 | | | | | | | |
| Example 221 | | | | | | | |
| Example 222 | | | | | | | |
| Example 223 | | | | | | | |
| Example 224 | | | | | | | |
| Example 225 | | | | | | | |
| Example 226 | | | | | | | |
| Example 227 | | | | | | | |
| Example 228 | | | | | | | |
| Example 229 | | | | | | | |
| Example 230 | | | | | | | |
| Example 231 | | | | | | | |
| Example 232 | | | | | | | |
| Example 233 | | | | | | | |
| Example 234 | | | | | | | |
| Example 235 | | | | | | | |

TABLE 71

| Table 1-6-6 | Components of chemical liquid for pre-wetting Mixture of organic solvents | | | | | | | |
|---|---|---|---|---|---|---|---|---|
| | Fifth organic solvent | | | | | | | |
| | Type | Content (% by mass) | Molar mass (g/mol) | Vapor pressure (Pa) | Surface tension (mN/m) | δh (MPa)$^{0.5}$ | δd (MPa)$^{0.5}$ | Vapor pressure (Pa) | Surface tension (mN/m) |
| Example 196 | | | | | | | | 1,297 | 33.4 |
| Example 197 | | | | | | | | 969 | 25.4 |
| Example 198 | | | | | | | | 1,076 | 25.8 |
| Example 199 | | | | | | | | 1,087 | 25.6 |
| Example 200 | | | | | | | | 1,038 | 25.4 |
| Example 201 | | | | | | | | 1,079 | 25.4 |
| Example 202 | | | | | | | | 1,056 | 25.4 |
| Example 203 | | | | | | | | 1,034 | 25.2 |
| Example 204 | | | | | | | | 1,063 | 25.1 |
| Example 205 | | | | | | | | 1,062 | 25.2 |
| Example 206 | | | | | | | | 1,036 | 25.4 |
| Example 207 | | | | | | | | 959 | 25.9 |
| Example 208 | | | | | | | | 992 | 25.7 |
| Example 209 | | | | | | | | 992 | 25.7 |
| Example 210 | | | | | | | | 992 | 25.7 |
| Example 211 | | | | | | | | 1,080 | 25.6 |
| Example 212 | | | | | | | | 970 | 26.2 |
| Example 213 | | | | | | | | 970 | 26.0 |
| Example 214 | | | | | | | | 365 | 27.9 |
| Example 215 | | | | | | | | 559 | 28.3 |
| Example 216 | | | | | | | | 529 | 28.2 |
| Example 217 | | | | | | | | 416 | 28.1 |
| Example 218 | | | | | | | | 500 | 27.9 |
| Example 219 | | | | | | | | 442 | 28.1 |
| Example 220 | | | | | | | | 398 | 27.9 |
| Example 221 | | | | | | | | 414 | 27.8 |
| Example 222 | | | | | | | | 413 | 27.9 |
| Example 223 | | | | | | | | 413 | 28.1 |
| Example 224 | | | | | | | | 369 | 28.5 |
| Example 225 | | | | | | | | 374 | 28.4 |
| Example 226 | | | | | | | | 374 | 28.4 |
| Example 227 | | | | | | | | 374 | 28.4 |
| Example 228 | | | | | | | | 423 | 28.6 |
| Example 229 | | | | | | | | 363 | 29.0 |
| Example 230 | | | | | | | | 363 | 28.7 |
| Example 231 | | | | | | | | 401 | 32.8 |
| Example 232 | | | | | | | | 556 | 32.7 |
| Example 233 | | | | | | | | 533 | 33.0 |
| Example 234 | | | | | | | | 444 | 33.2 |
| Example 235 | | | | | | | | 509 | 32.9 |

TABLE 72

| Table 1-6-7 | Components of chemical liquid for pre-wetting | | | | | | |
|---|---|---|---|---|---|---|---|
| | Mixture of organic solvents Content of mixture in chemical liquid (% by mass) | Impurity metal Total content of impurity metal (mass ppt) | | | | | |
| | | Fe | Cr | Ni | Pb | Others | Total |
| Example 196 | Balance | 0.002 | 0.006 | 0.002 | 0.030 | 0.030 | 0.070 |
| Example 197 | Balance | 0.002 | 0.006 | 0.002 | 0.030 | 0.030 | 0.070 |
| Example 198 | Balance | 0.002 | 0.006 | 0.002 | 0.030 | 0.030 | 0.070 |
| Example 199 | Balance | 0.002 | 0.006 | 0.002 | 0.030 | 0.030 | 0.070 |
| Example 200 | Balance | 0.002 | 0.006 | 0.002 | 0.030 | 0.030 | 0.070 |
| Example 201 | Balance | 0.002 | 0.006 | 0.002 | 0.030 | 0.030 | 0.070 |
| Example 202 | Balance | 0.002 | 0.006 | 0.002 | 0.030 | 0.030 | 0.070 |
| Example 203 | Balance | 0.002 | 0.006 | 0.002 | 0.030 | 0.030 | 0.070 |
| Example 204 | Balance | 0.002 | 0.006 | 0.002 | 0.030 | 0.030 | 0.070 |
| Example 205 | Balance | 0.002 | 0.006 | 0.002 | 0.030 | 0.030 | 0.070 |
| Example 206 | Balance | 0.002 | 0.006 | 0.002 | 0.030 | 0.030 | 0.070 |
| Example 207 | Balance | 0.002 | 0.006 | 0.002 | 0.030 | 0.030 | 0.070 |
| Example 208 | Balance | 0.002 | 0.006 | 0.002 | 0.030 | 0.030 | 0.070 |
| Example 209 | Balance | 0.002 | 0.006 | 0.002 | 0.030 | 0.030 | 0.070 |
| Example 210 | Balance | 0.002 | 0.006 | 0.002 | 0.030 | 0.030 | 0.070 |

TABLE 72-continued

Components of chemical liquid for pre-wetting

| Table 1-6-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 211 | Balance | 0.002 | 0.006 | 0.002 | 0.030 | 0.030 | 0.070 |
| Example 212 | Balance | 0.002 | 0.006 | 0.002 | 0.030 | 0.030 | 0.070 |
| Example 213 | Balance | 0.002 | 0.006 | 0.002 | 0.030 | 0.030 | 0.070 |
| Example 214 | Balance | 0.002 | 0.006 | 0.002 | 0.030 | 0.030 | 0.070 |
| Example 215 | Balance | 0.002 | 0.006 | 0.002 | 0.030 | 0.030 | 0.070 |
| Example 216 | Balance | 0.002 | 0.006 | 0.002 | 0.030 | 0.030 | 0.070 |
| Example 217 | Balance | 0.002 | 0.006 | 0.002 | 0.030 | 0.030 | 0.070 |
| Example 218 | Balance | 0.002 | 0.006 | 0.002 | 0.030 | 0.030 | 0.070 |
| Example 219 | Balance | 0.002 | 0.006 | 0.002 | 0.030 | 0.030 | 0.070 |
| Example 220 | Balance | 0.002 | 0.006 | 0.002 | 0.030 | 0.030 | 0.070 |
| Example 221 | Balance | 0.002 | 0.006 | 0.002 | 0.030 | 0.030 | 0.070 |
| Example 222 | Balance | 0.002 | 0.006 | 0.002 | 0.030 | 0.030 | 0.070 |
| Example 223 | Balance | 0.002 | 0.006 | 0.002 | 0.030 | 0.030 | 0.070 |
| Example 224 | Balance | 0.002 | 0.006 | 0.002 | 0.030 | 0.030 | 0.070 |
| Example 225 | Balance | 0.002 | 0.006 | 0.002 | 0.030 | 0.030 | 0.070 |
| Example 226 | Balance | 0.002 | 0.006 | 0.002 | 0.030 | 0.030 | 0.070 |
| Example 227 | Balance | 0.002 | 0.006 | 0.002 | 0.030 | 0.030 | 0.070 |
| Example 228 | Balance | 0.002 | 0.006 | 0.002 | 0.030 | 0.030 | 0.070 |
| Example 229 | Balance | 0.002 | 0.006 | 0.002 | 0.030 | 0.030 | 0.070 |
| Example 230 | Balance | 0.002 | 0.006 | 0.002 | 0.030 | 0.030 | 0.070 |
| Example 231 | Balance | 0.002 | 0.006 | 0.002 | 0.030 | 0.030 | 0.070 |
| Example 232 | Balance | 0.002 | 0.006 | 0.002 | 0.030 | 0.030 | 0.070 |
| Example 233 | Balance | 0.002 | 0.006 | 0.002 | 0.030 | 0.030 | 0.070 |
| Example 234 | Balance | 0.002 | 0.006 | 0.002 | 0.030 | 0.030 | 0.070 |
| Example 235 | Balance | 0.002 | 0.006 | 0.002 | 0.030 | 0.030 | 0.070 |

TABLE 73

Components of chemical liquid for pre-wetting

| Table 1-6-8 | Impurity metal Content of impurity metal as particle (mass ppt) | | | | | | Organic impurity Specific organic compound | |
|---|---|---|---|---|---|---|---|---|
| | Fe | Cr | Ni | Pb | Others | Total | Boiling point: equal to or higher than 250° C. Number of carbon atoms: equal to or greater than 8 | Boiling point: equal to or higher than 250° C. Number of carbon atoms: equal to or greater than 12 |
| Example 196 | 0.040 | 0.002 | 0.001 | 0.003 | 0.019 | 0.065 | A | A |
| Example 197 | 0.040 | 0.002 | 0.001 | 0.003 | 0.019 | 0.065 | A | A |
| Example 198 | 0.040 | 0.002 | 0.001 | 0.003 | 0.019 | 0.065 | A | A |
| Example 199 | 0.040 | 0.002 | 0.001 | 0.003 | 0.019 | 0.065 | A | A |
| Example 200 | 0.040 | 0.002 | 0.001 | 0.003 | 0.019 | 0.065 | A | A |
| Example 201 | 0.040 | 0.002 | 0.001 | 0.003 | 0.019 | 0.065 | A | A |
| Example 202 | 0.040 | 0.002 | 0.001 | 0.003 | 0.019 | 0.065 | A | A |
| Example 203 | 0.040 | 0.002 | 0.001 | 0.003 | 0.019 | 0.065 | A | A |
| Example 204 | 0.040 | 0.002 | 0.001 | 0.003 | 0.019 | 0.065 | A | A |
| Example 205 | 0.040 | 0.002 | 0.001 | 0.003 | 0.019 | 0.065 | A | A |
| Example 206 | 0.040 | 0.002 | 0.001 | 0.003 | 0.019 | 0.065 | A | A |
| Example 207 | 0.040 | 0.002 | 0.001 | 0.003 | 0.019 | 0.065 | A | A |
| Example 208 | 0.040 | 0.002 | 0.001 | 0.003 | 0.019 | 0.065 | A | A |
| Example 209 | 0.040 | 0.002 | 0.001 | 0.003 | 0.019 | 0.065 | A | A |
| Example 210 | 0.040 | 0.002 | 0.001 | 0.003 | 0.019 | 0.065 | A | A |
| Example 211 | 0.040 | 0.002 | 0.001 | 0.003 | 0.019 | 0.065 | A | A |
| Example 212 | 0.040 | 0.002 | 0.001 | 0.003 | 0.019 | 0.065 | A | A |
| Example 213 | 0.040 | 0.002 | 0.001 | 0.003 | 0.019 | 0.065 | A | A |
| Example 214 | 0.040 | 0.002 | 0.001 | 0.003 | 0.019 | 0.065 | A | A |
| Example 215 | 0.040 | 0.002 | 0.001 | 0.003 | 0.019 | 0.065 | A | A |
| Example 216 | 0.040 | 0.002 | 0.001 | 0.003 | 0.019 | 0.065 | A | A |
| Example 217 | 0.040 | 0.002 | 0.001 | 0.003 | 0.019 | 0.065 | A | A |
| Example 218 | 0.040 | 0.002 | 0.001 | 0.003 | 0.019 | 0.065 | A | A |
| Example 219 | 0.040 | 0.002 | 0.001 | 0.003 | 0.019 | 0.065 | A | A |
| Example 220 | 0.040 | 0.002 | 0.001 | 0.003 | 0.019 | 0.065 | A | A |
| Example 221 | 0.040 | 0.002 | 0.001 | 0.003 | 0.019 | 0.065 | A | A |

TABLE 73-continued

Components of chemical liquid for pre-wetting

| | Impurity metal Content of impurity metal as particle (mass ppt) | | | | | | Organic impurity Specific organic compound | |
|---|---|---|---|---|---|---|---|---|
| | | | | | | | Boiling point: equal to or higher than 250° C. Number of carbon atoms: equal to or | Boiling point: equal to or higher than 250° C. Number of carbon atoms: equal to or |
| Table 1-6-8 | Fe | Cr | Ni | Pb | Others | Total | greater than 8 | greater than 12 |
| Example 222 | 0.040 | 0.002 | 0.001 | 0.003 | 0.019 | 0.065 | A | A |
| Example 223 | 0.040 | 0.002 | 0.001 | 0.003 | 0.019 | 0.065 | A | A |
| Example 224 | 0.040 | 0.002 | 0.001 | 0.003 | 0.019 | 0.065 | A | A |
| Example 225 | 0.040 | 0.002 | 0.001 | 0.003 | 0.019 | 0.065 | A | A |
| Example 226 | 0.040 | 0.002 | 0.001 | 0.003 | 0.019 | 0.065 | A | A |
| Example 227 | 0.040 | 0.002 | 0.001 | 0.003 | 0.019 | 0.065 | A | A |
| Example 228 | 0.040 | 0.002 | 0.001 | 0.003 | 0.019 | 0.065 | A | A |
| Example 229 | 0.040 | 0.002 | 0.001 | 0.003 | 0.019 | 0.065 | A | A |
| Example 230 | 0.040 | 0.002 | 0.001 | 0.003 | 0.019 | 0.065 | A | A |
| Example 231 | 0.040 | 0.002 | 0.001 | 0.003 | 0.019 | 0.065 | A | A |
| Example 232 | 0.040 | 0.002 | 0.001 | 0.003 | 0.019 | 0.065 | A | A |
| Example 233 | 0.040 | 0.002 | 0.001 | 0.003 | 0.019 | 0.065 | A | A |
| Example 234 | 0.040 | 0.002 | 0.001 | 0.003 | 0.019 | 0.065 | A | A |
| Example 235 | 0.040 | 0.002 | 0.001 | 0.003 | 0.019 | 0.065 | A | A |

TABLE 74

Components of chemical liquid for pre-wetting

| | Organic impurity Content of organic impurity | | | | | Physical properties of chemical liquid | |
|---|---|---|---|---|---|---|---|
| Table 1-6-9 | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | for pre-wetting Number of coarse particles (Number of objects to be counted) (Number/mL) | Evaluation Defect inhibition performance |
| Example 196 | 2,500 | 1 | 0.5 | 500 | 0.10% | 6 | AA |
| Example 197 | 2,500 | 1 | 0.5 | 500 | 0.10% | 6 | AA |
| Example 198 | 2,500 | 1 | 0.5 | 500 | 0.10% | 6 | AA |
| Example 199 | 2,500 | 1 | 0.5 | 500 | 0.10% | 6 | AA |
| Example 200 | 2,500 | 1 | 0.5 | 500 | 0.10% | 6 | AA |
| Example 201 | 2,500 | 1 | 0.5 | 500 | 0.10% | 6 | AA |
| Example 202 | 2,500 | 1 | 0.5 | 500 | 0.10% | 6 | AA |
| Example 203 | 2,500 | 1 | 0.5 | 500 | 0.10% | 6 | AA |
| Example 204 | 2,500 | 1 | 0.5 | 500 | 0.10% | 6 | AA |
| Example 205 | 2,500 | 1 | 0.5 | 500 | 0.10% | 6 | AA |
| Example 206 | 2,500 | 1 | 0.5 | 500 | 0.10% | 6 | AA |
| Example 207 | 2,500 | 1 | 0.5 | 500 | 0.10% | 6 | AA |
| Example 208 | 2,500 | 1 | 0.5 | 500 | 0.10% | 6 | AA |
| Example 209 | 2,500 | 1 | 0.5 | 500 | 0.10% | 6 | AA |
| Example 210 | 2,500 | 1 | 0.5 | 500 | 0.10% | 6 | AA |
| Example 211 | 2,500 | 1 | 0.5 | 500 | 0.10% | 6 | AA |
| Example 212 | 2,500 | 1 | 0.5 | 500 | 0.10% | 6 | AA |
| Example 213 | 2,500 | 1 | 0.5 | 500 | 0.10% | 6 | AA |
| Example 214 | 2,500 | 1 | 0.5 | 500 | 0.10% | 6 | AA |
| Example 215 | 2,500 | 1 | 0.5 | 500 | 0.10% | 6 | AA |
| Example 216 | 2,500 | 1 | 0.5 | 500 | 0.10% | 6 | AA |
| Example 217 | 2,500 | 1 | 0.5 | 500 | 0.10% | 6 | AA |
| Example 218 | 2,500 | 1 | 0.5 | 500 | 0.10% | 6 | AA |
| Example 219 | 2,500 | 1 | 0.5 | 500 | 0.10% | 6 | AA |
| Example 220 | 2,500 | 1 | 0.5 | 500 | 0.10% | 6 | AA |
| Example 221 | 2,500 | 1 | 0.5 | 500 | 0.10% | 6 | AA |
| Example 222 | 2,500 | 1 | 0.5 | 500 | 0.10% | 6 | AA |
| Example 223 | 2,500 | 1 | 0.5 | 500 | 0.10% | 6 | AA |
| Example 224 | 2,500 | 1 | 0.5 | 500 | 0.10% | 6 | AA |
| Example 225 | 2,500 | 1 | 0.5 | 500 | 0.10% | 6 | AA |
| Example 226 | 2,500 | 1 | 0.5 | 500 | 0.10% | 6 | AA |
| Example 227 | 2,500 | 1 | 0.5 | 500 | 0.10% | 6 | AA |
| Example 228 | 2,500 | 1 | 0.5 | 500 | 0.10% | 6 | AA |
| Example 229 | 2,500 | 1 | 0.5 | 500 | 0.10% | 6 | AA |
| Example 230 | 2,500 | 1 | 0.5 | 500 | 0.10% | 6 | AA |

TABLE 74-continued

| | | Components of chemical liquid for pre-wetting | | | | Physical properties of chemical liquid for pre-wetting | |
|---|---|---|---|---|---|---|---|
| | | Organic impurity Content of organic impurity | | | | | Evaluation |
| Table 1-6-9 | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | Number of coarse particles (Number of objects to be counted) (Number/mL) | Defect inhibition performance |
| Example 231 | 2,500 | 1 | 0.5 | 500 | 0.10% | 6 | AA |
| Example 232 | 2,500 | 1 | 0.5 | 500 | 0.10% | 6 | AA |
| Example 233 | 2,500 | 1 | 0.5 | 500 | 0.10% | 6 | AA |
| Example 234 | 2,500 | 1 | 0.5 | 500 | 0.10% | 6 | AA |
| Example 235 | 2,500 | 1 | 0.5 | 500 | 0.10% | 6 | AA |

TABLE 75

| | Evaluation | | | | | | | | |
|---|---|---|---|---|---|---|---|---|---|
| | Type of resist composition | | | | Type of resist composition | | | | |
| | | Resist saving properties | | | | Resist saving properties | | | |
| | | Affinity | | | Film thickness | | Affinity | | Film thickness |
| Table 1-6-10 | | Rsq1 | SRsq | Uniformity | controllability | | Rsq1 | SRsq | Uniformity | controllability |
| Example 196 | 1 | A | A | AA | A | 2 | A | A | A | A |
| Example 197 | 1 | A | A | AA | A | 2 | A | A | A | A |
| Example 198 | 1 | A | A | AA | A | 2 | A | A | A | A |
| Example 199 | 1 | A | A | AA | A | 2 | A | A | A | A |
| Example 200 | 1 | A | A | AA | A | 2 | A | A | A | A |
| Example 201 | 1 | A | A | AA | A | 2 | A | A | A | A |
| Example 202 | 1 | A | A | AA | A | 2 | A | A | A | A |
| Example 203 | 1 | A | A | AA | A | 2 | A | A | A | A |
| Example 204 | 1 | A | A | AA | A | 2 | A | A | A | A |
| Example 205 | 1 | A | A | AA | A | 2 | A | A | A | A |
| Example 206 | 1 | A | A | AA | A | 2 | A | A | A | A |
| Example 207 | 1 | A | A | AA | A | 2 | A | A | A | A |
| Example 208 | 1 | A | A | AA | A | 2 | A | A | A | A |
| Example 209 | 1 | A | A | AA | A | 2 | A | A | A | A |
| Example 210 | 1 | A | A | AA | A | 2 | A | A | A | A |
| Example 211 | 1 | A | A | AA | A | 2 | A | A | A | A |
| Example 212 | 1 | A | A | AA | A | 2 | A | A | A | A |
| Example 213 | 1 | A | A | AA | A | 2 | A | A | A | A |
| Example 214 | 1 | A | A | AA | A | 2 | A | A | A | A |
| Example 215 | 1 | A | A | AA | A | 2 | A | A | A | A |
| Example 216 | 1 | A | A | AA | A | 2 | A | A | A | A |
| Example 217 | 1 | A | A | AA | A | 2 | A | A | A | A |
| Example 218 | 1 | A | A | AA | A | 2 | A | A | A | A |
| Example 219 | 1 | A | A | AA | A | 2 | A | A | A | A |
| Example 220 | 1 | A | A | AA | A | 2 | A | A | A | A |
| Example 221 | 1 | A | A | AA | A | 2 | A | A | A | A |
| Example 222 | 1 | A | A | AA | A | 2 | A | A | A | A |
| Example 223 | 1 | A | A | AA | A | 2 | A | A | A | A |
| Example 224 | 1 | A | A | AA | A | 2 | A | A | A | A |
| Example 225 | 1 | A | A | AA | A | 2 | A | A | A | A |
| Example 226 | 1 | A | A | AA | A | 2 | A | A | A | A |
| Example 227 | 1 | A | A | AA | A | 2 | A | A | A | A |
| Example 228 | 1 | A | A | AA | A | 2 | A | A | A | A |
| Example 229 | 1 | A | A | AA | A | 2 | A | A | A | A |
| Example 230 | 1 | A | A | AA | A | 2 | A | A | A | A |
| Example 231 | 1 | A | A | AA | A | 2 | A | A | A | A |
| Example 232 | 1 | A | A | AA | A | 2 | A | A | A | A |
| Example 233 | 1 | A | A | AA | A | 2 | A | A | A | A |
| Example 234 | 1 | A | A | AA | A | 2 | A | A | A | A |
| Example 235 | 1 | A | A | AA | A | 2 | A | A | A | A |

TABLE 76

| Table 1-6-11 | Type of resist composition | Evaluation Affinity Rsq1 | SRsq | Resist saving properties Uniformity | Film thickness controllability | Type of resist composition | Affinity Rsq1 | SRsq | Resist saving properties Uniformity | Film thickness controllability |
|---|---|---|---|---|---|---|---|---|---|---|
| Example 196 | 3 | A | A | AA | A | 4 | A | A | AA | A |
| Example 197 | 3 | A | A | AA | A | 4 | A | A | AA | A |
| Example 198 | 3 | A | A | AA | A | 4 | A | A | AA | A |
| Example 199 | 3 | A | A | AA | A | 4 | A | A | AA | A |
| Example 200 | 3 | A | A | AA | A | 4 | A | A | AA | A |
| Example 201 | 3 | A | A | AA | A | 4 | A | A | AA | A |
| Example 202 | 3 | A | A | AA | A | 4 | A | A | AA | A |
| Example 203 | 3 | A | A | AA | A | 4 | A | A | AA | A |
| Example 204 | 3 | A | A | AA | A | 4 | A | A | AA | A |
| Example 205 | 3 | A | A | AA | A | 4 | A | A | AA | A |
| Example 206 | 3 | A | A | AA | A | 4 | A | A | AA | A |
| Example 207 | 3 | A | A | AA | A | 4 | A | A | AA | A |
| Example 208 | 3 | A | A | AA | A | 4 | A | A | AA | A |
| Example 209 | 3 | A | A | AA | A | 4 | A | A | AA | A |
| Example 210 | 3 | A | A | AA | A | 4 | A | A | AA | A |
| Example 211 | 3 | A | A | AA | A | 4 | A | A | AA | A |
| Example 212 | 3 | A | A | AA | A | 4 | A | A | AA | A |
| Example 213 | 3 | A | A | AA | A | 4 | A | A | AA | A |
| Example 214 | 3 | A | A | AA | A | 4 | A | A | AA | A |
| Example 215 | 3 | A | A | AA | A | 4 | A | A | AA | A |
| Example 216 | 3 | A | A | AA | A | 4 | A | A | AA | A |
| Example 217 | 3 | A | A | AA | A | 4 | A | A | AA | A |
| Example 218 | 3 | A | A | AA | A | 4 | A | A | AA | A |
| Example 219 | 3 | A | A | AA | A | 4 | A | A | AA | A |
| Example 220 | 3 | A | A | AA | A | 4 | A | A | AA | A |
| Example 221 | 3 | A | A | AA | A | 4 | A | A | AA | A |
| Example 222 | 3 | A | A | AA | A | 4 | A | A | AA | A |
| Example 223 | 3 | A | A | AA | A | 4 | A | A | AA | A |
| Example 224 | 3 | A | A | AA | A | 4 | A | A | AA | A |
| Example 225 | 3 | A | A | AA | A | 4 | A | A | AA | A |
| Example 226 | 3 | A | A | AA | A | 4 | A | A | AA | A |
| Example 227 | 3 | A | A | AA | A | 4 | A | A | AA | A |
| Example 228 | 3 | A | A | AA | A | 4 | A | A | AA | A |
| Example 229 | 3 | A | A | AA | A | 4 | A | A | AA | A |
| Example 230 | 3 | A | A | AA | A | 4 | A | A | AA | A |
| Example 231 | 3 | A | A | AA | A | 4 | A | A | AA | A |
| Example 232 | 3 | A | A | AA | A | 4 | A | A | AA | A |
| Example 233 | 3 | A | A | AA | A | 4 | A | A | AA | A |
| Example 234 | 3 | A | A | AA | A | 4 | A | A | AA | A |
| Example 235 | 3 | A | A | AA | A | 4 | A | A | AA | A |

TABLE 77

| Table 1-6-12 | Type of resist composition | Evaluation Affinity Rsq1 | SRsq | Resist saving properties Uniformity | Film thickness controllability | Type of resist composition | Affinity Rsq1 | SRsq | Resist saving properties Uniformity | Film thickness controllability |
|---|---|---|---|---|---|---|---|---|---|---|
| Example 196 | 5 | A | A | AA | A | 6 | A | A | AA | A |
| Example 197 | 5 | A | A | AA | A | 6 | A | A | AA | A |
| Example 198 | 5 | A | A | AA | A | 6 | A | A | AA | A |
| Example 199 | 5 | A | A | AA | A | 6 | A | A | AA | A |
| Example 200 | 5 | A | A | AA | A | 6 | A | A | AA | A |
| Example 201 | 5 | A | A | AA | A | 6 | A | A | AA | A |
| Example 202 | 5 | A | A | AA | A | 6 | A | A | AA | A |
| Example 203 | 5 | A | A | AA | A | 6 | A | A | AA | A |
| Example 204 | 5 | A | A | AA | A | 6 | A | A | AA | A |
| Example 205 | 5 | A | A | AA | A | 6 | A | A | AA | A |
| Example 206 | 5 | A | A | AA | A | 6 | A | A | AA | A |

TABLE 77-continued

| Table 1-6-12 | | Evaluation Type of resist composition | | | | | Evaluation Type of resist composition | | | |
|---|---|---|---|---|---|---|---|---|---|---|
| | | Affinity | | | Resist saving properties | | Affinity | | | Resist saving properties |
| | | Rsq1 | SRsq | Uniformity | Film thickness controllability | | Rsq1 | SRsq | Uniformity | Film thickness controllability |
| Example 207 | 5 | A | A | AA | A | 6 | A | A | AA | A |
| Example 208 | 5 | A | A | AA | A | 6 | A | A | AA | A |
| Example 209 | 5 | A | A | AA | A | 6 | A | A | AA | A |
| Example 210 | 5 | A | A | AA | A | 6 | A | A | AA | A |
| Example 211 | 5 | A | A | AA | A | 6 | A | A | AA | A |
| Example 212 | 5 | A | A | AA | A | 6 | A | A | AA | A |
| Example 213 | 5 | A | A | AA | A | 6 | A | A | AA | A |
| Example 214 | 5 | A | A | AA | A | 6 | A | A | AA | A |
| Example 215 | 5 | A | A | AA | A | 6 | A | A | AA | A |
| Example 216 | 5 | A | A | AA | A | 6 | A | A | AA | A |
| Example 217 | 5 | A | A | AA | A | 6 | A | A | AA | A |
| Example 218 | 5 | A | A | AA | A | 6 | A | A | AA | A |
| Example 219 | 5 | A | A | AA | A | 6 | A | A | AA | A |
| Example 220 | 5 | A | A | AA | A | 6 | A | A | AA | A |
| Example 221 | 5 | A | A | AA | A | 6 | A | A | AA | A |
| Example 222 | 5 | A | A | AA | A | 6 | A | A | AA | A |
| Example 223 | 5 | A | A | AA | A | 6 | A | A | AA | A |
| Example 224 | 5 | A | A | AA | A | 6 | A | A | AA | A |
| Example 225 | 5 | A | A | AA | A | 6 | A | A | AA | A |
| Example 226 | 5 | A | A | AA | A | 6 | A | A | AA | A |
| Example 227 | 5 | A | A | AA | A | 6 | A | A | AA | A |
| Example 228 | 5 | A | A | AA | A | 6 | A | A | AA | A |
| Example 229 | 5 | A | A | AA | A | 6 | A | A | AA | A |
| Example 230 | 5 | A | A | AA | A | 6 | A | A | AA | A |
| Example 231 | 5 | A | A | AA | A | 6 | A | A | AA | A |
| Example 232 | 5 | A | A | AA | A | 6 | A | A | AA | A |
| Example 233 | 5 | A | A | AA | A | 6 | A | A | AA | A |
| Example 234 | 5 | A | A | AA | A | 6 | A | A | AA | A |
| Example 235 | 5 | A | A | AA | A | 6 | A | A | AA | A |

TABLE 78

| Table 1-6-13 | | Evaluation Type of resist composition | | | |
|---|---|---|---|---|---|
| | | Affinity | | | Resist saving properties |
| | | Rsq1 | SRsq | Uniformity | Film thickness controllability |
| Example 196 | 7 | A | A | AA | A |
| Example 197 | 7 | A | A | AA | A |
| Example 198 | 7 | A | A | AA | A |
| Example 199 | 7 | A | A | AA | A |
| Example 200 | 7 | A | A | AA | A |
| Example 201 | 7 | A | A | AA | A |
| Example 202 | 7 | A | A | AA | A |
| Example 203 | 7 | A | A | AA | A |
| Example 204 | 7 | A | A | AA | A |
| Example 205 | 7 | A | A | AA | A |
| Example 206 | 7 | A | A | AA | A |
| Example 207 | 7 | A | A | AA | A |
| Example 208 | 7 | A | A | AA | A |
| Example 209 | 7 | A | A | AA | A |
| Example 210 | 7 | A | A | AA | A |
| Example 211 | 7 | A | A | AA | A |
| Example 212 | 7 | A | A | AA | A |
| Example 213 | 7 | A | A | AA | A |
| Example 214 | 7 | A | A | AA | A |
| Example 215 | 7 | A | A | AA | A |
| Example 216 | 7 | A | A | AA | A |
| Example 217 | 7 | A | A | AA | A |
| Example 218 | 7 | A | A | AA | A |
| Example 219 | 7 | A | A | AA | A |
| Example 220 | 7 | A | A | AA | A |
| Example 221 | 7 | A | A | AA | A |
| Example 222 | 7 | A | A | AA | A |
| Example 223 | 7 | A | A | AA | A |
| Example 224 | 7 | A | A | AA | A |
| Example 225 | 7 | A | A | AA | A |
| Example 226 | 7 | A | A | AA | A |
| Example 227 | 7 | A | A | AA | A |
| Example 228 | 7 | A | A | AA | A |
| Example 229 | 7 | A | A | AA | A |
| Example 230 | 7 | A | A | AA | A |
| Example 231 | 7 | A | A | AA | A |
| Example 232 | 7 | A | A | AA | A |
| Example 233 | 7 | A | A | AA | A |
| Example 234 | 7 | A | A | AA | A |
| Example 235 | 7 | A | A | AA | A |

TABLE 79

Components of chemical liquid for pre-wetting
Mixture of organic solvents
First organic solvent

| Table 1-7-1 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 236 | | | | | | | |
| Example 237 | | | | | | | |
| Example 238 | | | | | | | |
| Example 239 | | | | | | | |
| Example 240 | | | | | | | |
| Example 241 | | | | | | | |
| Example 242 | | | | | | | |
| Example 243 | | | | | | | |
| Example 244 | | | | | | | |
| Example 245 | | | | | | | |
| Example 246 | | | | | | | |
| Example 247 | | | | | | | |
| Example 248 | | | | | | | |
| Example 249 | | | | | | | |
| Example 250 | | | | | | | |
| Example 251 | | | | | | | |
| Example 252 | | | | | | | |
| Example 253 | | | | | | | |
| Example 254 | | | | | | | |
| Example 255 | | | | | | | |
| Example 256 | | | | | | | |
| Example 257 | | | | | | | |
| Example 258 | | | | | | | |
| Example 259 | | | | | | | |
| Example 260 | | | | | | | |
| Example 261 | | | | | | | |
| Example 262 | | | | | | | |
| Example 263 | | | | | | | |
| Example 264 | | | | | | | |
| Example 265 | | | | | | | |
| Example 266 | | | | | | | |
| Example 267 | | | | | | | |
| Example 268 | | | | | | | |
| Example 269 | | | | | | | |
| Example 270 | | | | | | | |
| Example 271 | | | | | | | |
| Example 272 | | | | | | | |
| Example 273 | | | | | | | |
| Example 274 | | | | | | | |
| Example 275 | | | | | | | |

TABLE 80

Components of chemical liquid for pre-wetting
Mixture of organic solvents
Second organic solvent

| Table 1-7-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 236 | CyHx | 75 | 98.14 | 507 | 34.1 | 61.0 | 21.6 |
| Example 237 | CyHx | 75 | 98.14 | 507 | 34.1 | 61.0 | 21.6 |
| Example 238 | CyHx | 75 | 98.14 | 507 | 34.1 | 61.0 | 21.6 |
| Example 239 | CyHx | 75 | 98.14 | 507 | 34.1 | 61.0 | 21.6 |
| Example 240 | CyHx | 75 | 98.14 | 507 | 34.1 | 61.0 | 21.6 |
| Example 241 | CyHx | 75 | 98.14 | 507 | 34.1 | 61.0 | 21.6 |
| Example 242 | CyHx | 75 | 98.14 | 507 | 34.1 | 61.0 | 21.6 |
| Example 243 | CyHx | 75 | 98.14 | 507 | 34.1 | 61.0 | 21.6 |
| Example 244 | CyHx | 75 | 98.14 | 507 | 34.1 | 61.0 | 21.6 |
| Example 245 | CyHx | 75 | 98.14 | 507 | 34.1 | 61.0 | 21.6 |
| Example 246 | CyHx | 75 | 98.14 | 507 | 34.1 | 61.0 | 21.6 |
| Example 247 | CyHx | 75 | 98.14 | 507 | 34.1 | 61.0 | 21.6 |
| Example 248 | EL | 75 | 118.13 | 187 | 29.8 | 55.5 | 19.8 |
| Example 249 | EL | 75 | 118.13 | 187 | 29.8 | 55.5 | 19.8 |
| Example 250 | EL | 75 | 118.13 | 187 | 29.8 | 55.5 | 19.8 |
| Example 251 | EL | 75 | 118.13 | 187 | 29.8 | 55.5 | 19.8 |
| Example 252 | EL | 75 | 118.13 | 187 | 29.8 | 55.5 | 19.8 |

TABLE 80-continued

Components of chemical liquid for pre-wetting
Mixture of organic solvents
Second organic solvent

| Table 1-7-2 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 253 | EL | 75 | 118.13 | 187 | 29.8 | 55.5 | 19.8 |
| Example 254 | EL | 75 | 118.13 | 187 | 29.8 | 55.5 | 19.8 |
| Example 255 | EL | 75 | 118.13 | 187 | 29.8 | 55.5 | 19.8 |
| Example 256 | EL | 75 | 118.13 | 187 | 29.8 | 55.5 | 19.8 |
| Example 257 | EL | 75 | 118.13 | 187 | 29.8 | 55.5 | 19.8 |
| Example 258 | EL | 75 | 118.13 | 187 | 29.8 | 55.5 | 19.8 |
| Example 259 | EL | 75 | 118.13 | 187 | 29.8 | 55.5 | 19.8 |
| Example 260 | EL | 75 | 118.13 | 187 | 29.8 | 55.5 | 19.8 |
| Example 261 | EL | 75 | 118.13 | 187 | 29.8 | 55.5 | 19.8 |
| Example 262 | EL | 75 | 118.13 | 187 | 29.8 | 55.5 | 19.8 |
| Example 263 | EL | 75 | 118.13 | 187 | 29.8 | 55.5 | 19.8 |
| Example 264 | EL | 75 | 118.13 | 187 | 29.8 | 55.5 | 19.8 |
| Example 265 | HBM | 75 | 118.13 | 267 | 29.1 | 46.0 | 20.1 |
| Example 266 | HBM | 75 | 118.13 | 267 | 29.1 | 46.0 | 20.1 |
| Example 267 | HBM | 75 | 118.13 | 267 | 29.1 | 46.0 | 20.1 |
| Example 268 | HBM | 75 | 118.13 | 267 | 29.1 | 46.0 | 20.1 |
| Example 269 | HBM | 75 | 118.13 | 267 | 29.1 | 46.0 | 20.1 |
| Example 270 | HBM | 75 | 118.13 | 267 | 29.1 | 46.0 | 20.1 |
| Example 271 | HBM | 75 | 118.13 | 267 | 29.1 | 46.0 | 20.1 |
| Example 272 | HBM | 75 | 118.13 | 267 | 29.1 | 46.0 | 20.1 |
| Example 273 | HBM | 75 | 118.13 | 267 | 29.1 | 46.0 | 20.1 |
| Example 274 | HBM | 75 | 118.13 | 267 | 29.1 | 46.0 | 20.1 |
| Example 275 | HBM | 75 | 118.13 | 267 | 29.1 | 46.0 | 20.1 |

TABLE 81

Components of chemical liquid for pre-wetting
Mixture of organic solvents
Third organic solvent

| Table 1-7-3 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 236 | | | | | | | |
| Example 237 | | | | | | | |
| Example 238 | | | | | | | |
| Example 239 | | | | | | | |
| Example 240 | | | | | | | |
| Example 241 | | | | | | | |
| Example 242 | | | | | | | |
| Example 243 | | | | | | | |
| Example 244 | | | | | | | |
| Example 245 | | | | | | | |
| Example 246 | | | | | | | |
| Example 247 | | | | | | | |
| Example 248 | | | | | | | |
| Example 249 | | | | | | | |
| Example 250 | | | | | | | |
| Example 251 | | | | | | | |
| Example 252 | | | | | | | |
| Example 253 | | | | | | | |
| Example 254 | | | | | | | |
| Example 255 | | | | | | | |
| Example 256 | | | | | | | |
| Example 257 | | | | | | | |
| Example 258 | | | | | | | |
| Example 259 | | | | | | | |
| Example 260 | | | | | | | |
| Example 261 | | | | | | | |
| Example 262 | | | | | | | |
| Example 263 | | | | | | | |
| Example 264 | | | | | | | |
| Example 265 | | | | | | | |
| Example 266 | | | | | | | |
| Example 267 | | | | | | | |
| Example 268 | | | | | | | |
| Example 269 | | | | | | | |

TABLE 81-continued

Components of chemical liquid for pre-wetting
Mixture of organic solvents
Third organic solvent

| Table 1-7-3 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 270 | | | | | | | |
| Example 271 | | | | | | | |
| Example 272 | | | | | | | |
| Example 273 | | | | | | | |
| Example 274 | | | | | | | |
| Example 275 | | | | | | | |

15

TABLE 82

Components of chemical liquid for pre-wetting
Mixture of organic solvents
Fourth organic solvent

| Table 1-7-4 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 236 | DEGDEE | 25 | 162.23 | 253 | 29.0 | 60.4 | 19.6 |
| Example 237 | TriEGDME | 25 | 178.23 | 13 | 28.0 | 56.4 | 20.9 |
| Example 238 | TetraEGDME | 25 | 222.28 | 13 | 27.0 | 55.6 | 21.1 |
| Example 239 | TEGMBE | 25 | 220.31 | 13 | 28.0 | 48.5 | 18.7 |
| Example 240 | DEGMBE | 25 | 162.23 | 117 | 29.0 | 59.4 | 18.1 |
| Example 241 | Anisole | 25 | 108.14 | 63 | 30.0 | 64.3 | 17.0 |
| Example 242 | 14-DMB | 25 | 138.17 | 1 | 30.0 | 59.0 | 20.6 |
| Example 243 | 12-DMB | 25 | 138.17 | 1 | 30.0 | 60.6 | 20.2 |
| Example 244 | 13-DMB | 25 | 138.17 | 1 | 30.0 | 61.6 | 19.9 |
| Example 245 | 14-Diphenoxybenzene | 25 | 262.31 | 1 | 33.0 | 63.3 | 18.5 |
| Example 246 | 4-Methoxytoluene | 25 | 122.17 | 1 | 32.0 | 64.8 | 17.4 |
| Example 247 | Phenetole | 25 | 122.17 | 1 | 31.0 | 66.3 | 16.3 |
| Example 248 | DEGME | 25 | 120.15 | 13 | 28.0 | 44.3 | 20.8 |
| Example 249 | DME | 25 | 90.12 | 693 | 29.0 | 55.9 | 22.8 |
| Example 250 | DEE | 25 | 118.18 | 627 | 29.0 | 62.2 | 19.9 |
| Example 251 | DEGIBE | 25 | 162.23 | 133 | 29.0 | 61.9 | 18.7 |
| Example 252 | DEGDME | 25 | 134.18 | 520 | 28.0 | 56.9 | 21.0 |
| Example 253 | DEGDEE | 25 | 162.23 | 253 | 29.0 | 60.4 | 19.6 |
| Example 254 | TriEGDME | 25 | 178.23 | 13 | 28.0 | 56.4 | 20.9 |
| Example 255 | TetraEGDME | 25 | 222.28 | 13 | 27.0 | 55.6 | 21.1 |
| Example 256 | TEGMBE | 25 | 220.31 | 13 | 28.0 | 48.5 | 18.7 |
| Example 257 | DEGMBE | 25 | 162.23 | 117 | 29.0 | 59.4 | 18.1 |
| Example 258 | Anisole | 25 | 108.14 | 63 | 30.0 | 64.3 | 17.0 |
| Example 259 | 14-DMB | 25 | 138.17 | 1 | 30.0 | 59.0 | 20.6 |
| Example 260 | 12-DMB | 25 | 138.17 | 1 | 30.0 | 60.6 | 20.2 |
| Example 261 | 13-DMB | 25 | 138.17 | 1 | 30.0 | 61.6 | 19.9 |
| Example 262 | 14-Diphenoxybenzene | 25 | 262.31 | 1 | 33.0 | 63.3 | 18.5 |
| Example 263 | 4-Methoxytoluene | 25 | 122.17 | 1 | 32.0 | 64.8 | 17.4 |
| Example 264 | Phenetole | 25 | 122.17 | 1 | 31.0 | 66.3 | 16.3 |
| Example 265 | DEGME | 25 | 120.15 | 13 | 28.0 | 44.3 | 20.8 |
| Example 266 | DME | 25 | 90.12 | 693 | 29.0 | 55.9 | 22.8 |
| Example 267 | DEE | 25 | 118.18 | 627 | 29.0 | 62.2 | 19.9 |
| Example 268 | DEGIBE | 25 | 162.23 | 133 | 29.0 | 61.9 | 18.7 |
| Example 269 | DEGDME | 25 | 134.18 | 520 | 28.0 | 56.9 | 21.0 |
| Example 270 | DEGDEE | 25 | 162.23 | 253 | 29.0 | 60.4 | 19.6 |
| Example 271 | TriEGDME | 25 | 178.23 | 13 | 28.0 | 56.4 | 20.9 |
| Example 272 | TetraEGDME | 25 | 222.28 | 13 | 27.0 | 55.6 | 21.1 |
| Example 273 | TEGMBE | 25 | 220.31 | 13 | 28.0 | 48.5 | 18.7 |
| Example 274 | DEGMBE | 25 | 162.23 | 117 | 29.0 | 59.4 | 18.1 |
| Example 275 | Anisole | 25 | 108.14 | 63 | 30.0 | 64.3 | 17.0 |

TABLE 83

Components of chemical liquid for pre-wetting
Mixture of organic solvents
Fourth organic solvent

| Table 1-7-5 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 236 | | | | | | | |
| Example 237 | | | | | | | |
| Example 238 | | | | | | | |
| Example 239 | | | | | | | |
| Example 240 | | | | | | | |
| Example 241 | | | | | | | |
| Example 242 | | | | | | | |
| Example 243 | | | | | | | |
| Example 244 | | | | | | | |
| Example 245 | | | | | | | |
| Example 246 | | | | | | | |
| Example 247 | | | | | | | |
| Example 248 | | | | | | | |
| Example 249 | | | | | | | |
| Example 250 | | | | | | | |
| Example 251 | | | | | | | |
| Example 252 | | | | | | | |
| Example 253 | | | | | | | |
| Example 254 | | | | | | | |
| Example 255 | | | | | | | |
| Example 256 | | | | | | | |
| Example 257 | | | | | | | |
| Example 258 | | | | | | | |
| Example 259 | | | | | | | |
| Example 260 | | | | | | | |
| Example 261 | | | | | | | |
| Example 262 | | | | | | | |
| Example 263 | | | | | | | |
| Example 264 | | | | | | | |
| Example 265 | | | | | | | |
| Example 266 | | | | | | | |
| Example 267 | | | | | | | |
| Example 268 | | | | | | | |
| Example 269 | | | | | | | |
| Example 270 | | | | | | | |
| Example 271 | | | | | | | |
| Example 272 | | | | | | | |
| Example 273 | | | | | | | |
| Example 274 | | | | | | | |
| Example 275 | | | | | | | |

TABLE 84

Components of chemical liquid for pre-wetting
Mixture of organic solvents
Fifth organic solvent

| Table 1-7-6 | Type | Content (% by mass) | Molar mass (g/mol) | Vapor pressure (Pa) | Surface tension (mN/m) | δh (MPa)$^{0.5}$ | δd (MPa)$^{0.5}$ | Vapor pressure (Pa) | Surface tension (mN/m) |
|---|---|---|---|---|---|---|---|---|---|
| Example 236 | | | | | | | | 464 | 33.2 |
| Example 237 | | | | | | | | 430 | 33.2 |
| Example 238 | | | | | | | | 443 | 33.2 |
| Example 239 | | | | | | | | 443 | 33.3 |
| Example 240 | | | | | | | | 441 | 33.2 |
| Example 241 | | | | | | | | 404 | 33.1 |
| Example 242 | | | | | | | | 410 | 33.3 |
| Example 243 | | | | | | | | 410 | 33.3 |
| Example 244 | | | | | | | | 410 | 33.3 |
| Example 245 | | | | | | | | 451 | 34.0 |
| Example 246 | | | | | | | | 400 | 33.7 |
| Example 247 | | | | | | | | 400 | 33.4 |
| Example 248 | | | | | | | | 144 | 29.4 |
| Example 249 | | | | | | | | 341 | 29.6 |
| Example 250 | | | | | | | | 297 | 29.6 |
| Example 251 | | | | | | | | 176 | 29.6 |

TABLE 84-continued

Components of chemical liquid for pre-wetting
Mixture of organic solvents

| Table 1-7-6 | Type | Content (% by mass) | Molar mass (g/mol) | Fifth organic solvent Vapor pressure (Pa) | Surface tension (mN/m) | δh (MPa)$^{0.5}$ | δd (MPa)$^{0.5}$ | Vapor pressure (Pa) | Surface tension (mN/m) |
|---|---|---|---|---|---|---|---|---|---|
| Example 252 | | | | | | | | 262 | 29.4 |
| Example 253 | | | | | | | | 200 | 29.6 |
| Example 254 | | | | | | | | 155 | 29.5 |
| Example 255 | | | | | | | | 161 | 29.4 |
| Example 256 | | | | | | | | 160 | 29.5 |
| Example 257 | | | | | | | | 173 | 29.6 |
| Example 258 | | | | | | | | 154 | 29.9 |
| Example 259 | | | | | | | | 146 | 29.8 |
| Example 260 | | | | | | | | 146 | 29.8 |
| Example 261 | | | | | | | | 146 | 29.8 |
| Example 262 | | | | | | | | 162 | 30.2 |
| Example 263 | | | | | | | | 141 | 30.3 |
| Example 264 | | | | | | | | 141 | 30.1 |
| Example 265 | | | | | | | | 204 | 28.8 |
| Example 266 | | | | | | | | 396 | 29.1 |
| Example 267 | | | | | | | | 357 | 29.1 |
| Example 268 | | | | | | | | 241 | 29.1 |
| Example 269 | | | | | | | | 324 | 28.9 |
| Example 270 | | | | | | | | 264 | 29.1 |
| Example 271 | | | | | | | | 221 | 28.9 |
| Example 272 | | | | | | | | 229 | 28.8 |
| Example 273 | | | | | | | | 228 | 28.9 |
| Example 274 | | | | | | | | 237 | 29.1 |
| Example 275 | | | | | | | | 212 | 29.3 |

TABLE 85

Components of chemical liquid for pre-wetting

| Table 1-7-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 236 | Balance | 0.002 | 0.006 | 0.002 | 0.030 | 0.030 | 0.070 |
| Example 237 | Balance | 0.002 | 0.006 | 0.002 | 0.030 | 0.030 | 0.070 |
| Example 238 | Balance | 0.002 | 0.006 | 0.002 | 0.030 | 0.030 | 0.070 |
| Example 239 | Balance | 0.002 | 0.006 | 0.002 | 0.030 | 0.030 | 0.070 |
| Example 240 | Balance | 0.002 | 0.006 | 0.002 | 0.030 | 0.030 | 0.070 |
| Example 241 | Balance | 0.002 | 0.006 | 0.002 | 0.030 | 0.030 | 0.070 |
| Example 242 | Balance | 0.002 | 0.006 | 0.002 | 0.030 | 0.030 | 0.070 |
| Example 243 | Balance | 0.002 | 0.006 | 0.002 | 0.030 | 0.030 | 0.070 |
| Example 244 | Balance | 0.002 | 0.006 | 0.002 | 0.030 | 0.030 | 0.070 |
| Example 245 | Balance | 0.002 | 0.006 | 0.002 | 0.030 | 0.030 | 0.070 |
| Example 246 | Balance | 0.002 | 0.006 | 0.002 | 0.030 | 0.030 | 0.070 |
| Example 247 | Balance | 0.002 | 0.006 | 0.002 | 0.030 | 0.030 | 0.070 |
| Example 248 | Balance | 0.002 | 0.006 | 0.002 | 0.030 | 0.030 | 0.070 |
| Example 249 | Balance | 0.002 | 0.006 | 0.002 | 0.030 | 0.030 | 0.070 |
| Example 250 | Balance | 0.002 | 0.006 | 0.002 | 0.030 | 0.030 | 0.070 |
| Example 251 | Balance | 0.002 | 0.006 | 0.002 | 0.030 | 0.030 | 0.070 |
| Example 252 | Balance | 0.002 | 0.006 | 0.002 | 0.030 | 0.030 | 0.070 |
| Example 253 | Balance | 0.002 | 0.006 | 0.002 | 0.030 | 0.030 | 0.070 |
| Example 254 | Balance | 0.002 | 0.006 | 0.002 | 0.030 | 0.030 | 0.070 |
| Example 255 | Balance | 0.002 | 0.006 | 0.002 | 0.030 | 0.030 | 0.070 |
| Example 256 | Balance | 0.002 | 0.006 | 0.002 | 0.030 | 0.030 | 0.070 |
| Example 257 | Balance | 0.002 | 0.006 | 0.002 | 0.030 | 0.030 | 0.070 |
| Example 258 | Balance | 0.002 | 0.006 | 0.002 | 0.030 | 0.030 | 0.070 |
| Example 259 | Balance | 0.002 | 0.006 | 0.002 | 0.030 | 0.030 | 0.070 |
| Example 260 | Balance | 0.002 | 0.006 | 0.002 | 0.030 | 0.030 | 0.070 |
| Example 261 | Balance | 0.002 | 0.006 | 0.002 | 0.030 | 0.030 | 0.070 |
| Example 262 | Balance | 0.002 | 0.006 | 0.002 | 0.030 | 0.030 | 0.070 |
| Example 263 | Balance | 0.002 | 0.006 | 0.002 | 0.030 | 0.030 | 0.070 |
| Example 264 | Balance | 0.002 | 0.006 | 0.002 | 0.030 | 0.030 | 0.070 |
| Example 265 | Balance | 0.002 | 0.006 | 0.002 | 0.030 | 0.030 | 0.070 |
| Example 266 | Balance | 0.002 | 0.006 | 0.002 | 0.030 | 0.030 | 0.070 |
| Example 267 | Balance | 0.002 | 0.006 | 0.002 | 0.030 | 0.030 | 0.070 |
| Example 268 | Balance | 0.002 | 0.006 | 0.002 | 0.030 | 0.030 | 0.070 |
| Example 269 | Balance | 0.002 | 0.006 | 0.002 | 0.030 | 0.030 | 0.070 |
| Example 270 | Balance | 0.002 | 0.006 | 0.002 | 0.030 | 0.030 | 0.070 |
| Example 271 | Balance | 0.002 | 0.006 | 0.002 | 0.030 | 0.030 | 0.070 |
| Example 272 | Balance | 0.002 | 0.006 | 0.002 | 0.030 | 0.030 | 0.070 |
| Example 273 | Balance | 0.002 | 0.006 | 0.002 | 0.030 | 0.030 | 0.070 |
| Example 274 | Balance | 0.002 | 0.006 | 0.002 | 0.030 | 0.030 | 0.070 |
| Example 275 | Balance | 0.002 | 0.006 | 0.002 | 0.030 | 0.030 | 0.070 |

TABLE 86

Components of chemical liquid for pre-wetting

|  | Impurity metal Content of impurity metal as particles (mass ppt) | | | | | | Organic impurity Specific organic compound | |
|---|---|---|---|---|---|---|---|---|
| | | | | | | | Boiling point: equal to or higher than 250° C. Number of carbon atoms: equal to or | Boiling point: equal to or higher than 250° C. Number of carbon atoms: equal to or |
| Table 1-7-8 | Fe | Cr | Ni | Pb | Others | Total | greater than 8 | greater than 12 |
| Example 236 | 0.040 | 0.002 | 0.001 | 0.003 | 0.019 | 0.065 | A | A |
| Example 237 | 0.040 | 0.002 | 0.001 | 0.003 | 0.019 | 0.065 | A | A |
| Example 238 | 0.040 | 0.002 | 0.001 | 0.003 | 0.019 | 0.065 | A | A |
| Example 239 | 0.040 | 0.002 | 0.001 | 0.003 | 0.019 | 0.065 | A | A |
| Example 240 | 0.040 | 0.002 | 0.001 | 0.003 | 0.019 | 0.065 | A | A |
| Example 241 | 0.040 | 0.002 | 0.001 | 0.003 | 0.019 | 0.065 | A | A |
| Example 242 | 0.040 | 0.002 | 0.001 | 0.003 | 0.019 | 0.065 | A | A |
| Example 243 | 0.040 | 0.002 | 0.001 | 0.003 | 0.019 | 0.065 | A | A |
| Example 244 | 0.040 | 0.002 | 0.001 | 0.003 | 0.019 | 0.065 | A | A |
| Example 245 | 0.040 | 0.002 | 0.001 | 0.003 | 0.019 | 0.065 | A | A |
| Example 246 | 0.040 | 0.002 | 0.001 | 0.003 | 0.019 | 0.065 | A | A |
| Example 247 | 0.040 | 0.002 | 0.001 | 0.003 | 0.019 | 0.065 | A | A |
| Example 248 | 0.040 | 0.002 | 0.001 | 0.003 | 0.019 | 0.065 | A | A |
| Example 249 | 0.040 | 0.002 | 0.001 | 0.003 | 0.019 | 0.065 | A | A |
| Example 250 | 0.040 | 0.002 | 0.001 | 0.003 | 0.019 | 0.065 | A | A |
| Example 251 | 0.040 | 0.002 | 0.001 | 0.003 | 0.019 | 0.065 | A | A |
| Example 252 | 0.040 | 0.002 | 0.001 | 0.003 | 0.019 | 0.065 | A | A |
| Example 253 | 0.040 | 0.002 | 0.001 | 0.003 | 0.019 | 0.065 | A | A |
| Example 254 | 0.040 | 0.002 | 0.001 | 0.003 | 0.019 | 0.065 | A | A |
| Example 255 | 0.040 | 0.002 | 0.001 | 0.003 | 0.019 | 0.065 | A | A |
| Example 256 | 0.040 | 0.002 | 0.001 | 0.003 | 0.019 | 0.065 | A | A |
| Example 257 | 0.040 | 0.002 | 0.001 | 0.003 | 0.019 | 0.065 | A | A |
| Example 258 | 0.040 | 0.002 | 0.001 | 0.003 | 0.019 | 0.065 | A | A |
| Example 259 | 0.040 | 0.002 | 0.001 | 0.003 | 0.019 | 0.065 | A | A |
| Example 260 | 0.040 | 0.002 | 0.001 | 0.003 | 0.019 | 0.065 | A | A |
| Example 261 | 0.040 | 0.002 | 0.001 | 0.003 | 0.019 | 0.065 | A | A |
| Example 262 | 0.040 | 0.002 | 0.001 | 0.003 | 0.019 | 0.065 | A | A |
| Example 263 | 0.040 | 0.002 | 0.001 | 0.003 | 0.019 | 0.065 | A | A |
| Example 264 | 0.040 | 0.002 | 0.001 | 0.003 | 0.019 | 0.065 | A | A |
| Example 265 | 0.040 | 0.002 | 0.001 | 0.003 | 0.019 | 0.065 | A | A |
| Example 266 | 0.040 | 0.002 | 0.001 | 0.003 | 0.019 | 0.065 | A | A |
| Example 267 | 0.040 | 0.002 | 0.001 | 0.003 | 0.019 | 0.065 | A | A |
| Example 268 | 0.040 | 0.002 | 0.001 | 0.003 | 0.019 | 0.065 | A | A |
| Example 269 | 0.040 | 0.002 | 0.001 | 0.003 | 0.019 | 0.065 | A | A |
| Example 270 | 0.040 | 0.002 | 0.001 | 0.003 | 0.019 | 0.065 | A | A |
| Example 271 | 0.040 | 0.002 | 0.001 | 0.003 | 0.019 | 0.065 | A | A |
| Example 272 | 0.040 | 0.002 | 0.001 | 0.003 | 0.019 | 0.065 | A | A |
| Example 273 | 0.040 | 0.002 | 0.001 | 0.003 | 0.019 | 0.065 | A | A |
| Example 274 | 0.040 | 0.002 | 0.001 | 0.003 | 0.019 | 0.065 | A | A |
| Example 275 | 0.040 | 0.002 | 0.001 | 0.003 | 0.019 | 0.065 | A | A |

TABLE 87

| | Components of chemical liquid for pre-wetting | | | | | Physical properties of chemical liquid for pre-wetting | |
|---|---|---|---|---|---|---|---|
| | | Organic impurity Content of organic impurity | | | | | |
| Table 1-7-9 | Total (mass ppm) | Content of high-boiling-point component (mass ppm) | Conetnt of ultrahigh-boiling-point component (mass ppm) | Content of compound having CLogP value higher than 6.5 (mass ppm) | Water Content (% by mass) | Number of coarse particles (Number of objects to be counted) (Number/mL) | Evaluation Defect inhibition performance |
| Example 236 | 2,500 | 1 | 0.5 | 500 | 0.10% | 6 | AA |
| Example 237 | 2,500 | 1 | 0.5 | 500 | 0.10% | 6 | AA |
| Example 238 | 2,500 | 1 | 0.5 | 500 | 0.10% | 6 | AA |
| Example 239 | 2,500 | 1 | 0.5 | 500 | 0.10% | 6 | AA |
| Example 240 | 2,500 | 1 | 0.5 | 500 | 0.10% | 6 | AA |
| Example 241 | 2,500 | 1 | 0.5 | 500 | 0.10% | 6 | AA |
| Example 242 | 2,500 | 1 | 0.5 | 500 | 0.10% | 6 | AA |
| Example 243 | 2,500 | 1 | 0.5 | 500 | 0.10% | 6 | AA |
| Example 244 | 2,500 | 1 | 0.5 | 500 | 0.10% | 6 | AA |
| Example 245 | 2,500 | 1 | 0.5 | 500 | 0.10% | 6 | AA |

TABLE 87-continued

| Table 1-7-9 | Components of chemical liquid for pre-wetting | | | | | Physical properties of chemical liquid for pre-wetting | |
|---|---|---|---|---|---|---|---|
| | | Organic impurity | | | | | |
| | | Content of organic impurity | | | | | |
| | Total (mass ppm) | Content of high-boiling-point component (mass ppm) | Conetnt of ultrahigh-boiling-point component (mass ppm) | Content of compound having CLogP value higher than 6.5 (mass ppm) | Water Content (% by mass) | Number of coarse particles (Number of objects to be counted) (Number/mL) | Evaluation Defect inhibition performance |
| Example 246 | 2,500 | 1 | 0.5 | 500 | 0.10% | 6 | AA |
| Example 247 | 2,500 | 1 | 0.5 | 500 | 0.10% | 6 | AA |
| Example 248 | 2,500 | 1 | 0.5 | 500 | 0.10% | 6 | AA |
| Example 249 | 2,500 | 1 | 0.5 | 500 | 0.10% | 6 | AA |
| Example 250 | 2,500 | 1 | 0.5 | 500 | 0.10% | 6 | AA |
| Example 251 | 2,500 | 1 | 0.5 | 500 | 0.10% | 6 | AA |
| Example 252 | 2,500 | 1 | 0.5 | 500 | 0.10% | 6 | AA |
| Example 253 | 2,500 | 1 | 0.5 | 500 | 0.10% | 6 | AA |
| Example 254 | 2,500 | 1 | 0.5 | 500 | 0.10% | 6 | AA |
| Example 255 | 2,500 | 1 | 0.5 | 500 | 0.10% | 6 | AA |
| Example 256 | 2,500 | 1 | 0.5 | 500 | 0.10% | 6 | AA |
| Example 257 | 2,500 | 1 | 0.5 | 500 | 0.10% | 6 | AA |
| Example 258 | 2,500 | 1 | 0.5 | 500 | 0.10% | 6 | AA |
| Example 259 | 2,500 | 1 | 0.5 | 500 | 0.10% | 6 | AA |
| Example 260 | 2,500 | 1 | 0.5 | 500 | 0.10% | 6 | AA |
| Example 261 | 2,500 | 1 | 0.5 | 500 | 0.10% | 6 | AA |
| Example 262 | 2,500 | 1 | 0.5 | 500 | 0.10% | 6 | AA |
| Example 263 | 2,500 | 1 | 0.5 | 500 | 0.10% | 6 | AA |
| Example 264 | 2,500 | 1 | 0.5 | 500 | 0.10% | 6 | AA |
| Example 265 | 2,500 | 1 | 0.5 | 500 | 0.10% | 6 | AA |
| Example 266 | 2,500 | 1 | 0.5 | 500 | 0.10% | 6 | AA |
| Example 267 | 2,500 | 1 | 0.5 | 500 | 0.10% | 6 | AA |
| Example 268 | 2,500 | 1 | 0.5 | 500 | 0.10% | 6 | AA |
| Example 269 | 2,500 | 1 | 0.5 | 500 | 0.10% | 6 | AA |
| Example 270 | 2,500 | 1 | 0.5 | 500 | 0.10% | 6 | AA |
| Example 271 | 2,500 | 1 | 0.5 | 500 | 0.10% | 6 | AA |
| Example 272 | 2,500 | 1 | 0.5 | 500 | 0.10% | 6 | AA |
| Example 273 | 2,500 | 1 | 0.5 | 500 | 0.10% | 6 | AA |
| Example 274 | 2,500 | 1 | 0.5 | 500 | 0.10% | 6 | AA |
| Example 275 | 2,500 | 1 | 0.5 | 500 | 0.10% | 6 | AA |

TABLE 88

| Table 1-7-10 | Evaluation | | | | | | | | |
|---|---|---|---|---|---|---|---|---|---|
| | Type of resist composition | | | | Type of resist composition | | | | |
| | | Resist saving properties | | | | | Resist saving properties | | |
| | | Affinity | | | Film thickness controllability | | Affinity | | Film thickness controllability |
| | | Rsq1 | SRsq | Uniformity | | | Rsq1 | SRsq | Uniformity | |
| Example 236 | 1 | A | A | AA | A | 2 | A | A | A | A |
| Example 237 | 1 | A | A | AA | A | 2 | A | A | A | A |
| Example 238 | 1 | A | A | AA | A | 2 | A | A | A | A |
| Example 239 | 1 | A | A | AA | A | 2 | A | A | A | A |
| Example 240 | 1 | A | A | AA | A | 2 | A | A | A | A |
| Example 241 | 1 | A | A | AA | A | 2 | A | A | A | A |
| Example 242 | 1 | A | A | AA | A | 2 | A | A | A | A |
| Example 243 | 1 | A | A | AA | A | 2 | A | A | A | A |
| Example 244 | 1 | A | A | AA | A | 2 | A | A | A | A |
| Example 245 | 1 | A | A | AA | A | 2 | A | A | A | A |
| Example 246 | 1 | A | A | AA | A | 2 | A | A | A | A |
| Example 247 | 1 | A | A | AA | A | 2 | A | A | A | A |
| Example 248 | 1 | A | A | AA | A | 2 | A | A | A | A |
| Example 249 | 1 | A | A | AA | A | 2 | A | A | A | A |
| Example 250 | 1 | A | A | AA | A | 2 | A | A | A | A |
| Example 251 | 1 | A | A | AA | A | 2 | A | A | A | A |
| Example 252 | 1 | A | A | AA | A | 2 | A | A | A | A |
| Example 253 | 1 | A | A | AA | A | 2 | A | A | A | A |
| Example 254 | 1 | A | A | AA | A | 2 | A | A | A | A |
| Example 255 | 1 | A | A | AA | A | 2 | A | A | A | A |

TABLE 88-continued

| Table 1-7-10 | | Evaluation | | | | | | | | |
|---|---|---|---|---|---|---|---|---|---|---|
| | | Type of resist composition | | | | Type of resist composition | | | | |
| | | | Resist saving properties | | | | | Resist saving properties | | |
| | | Affinity | | | Film thickness | | Affinity | | | Film thickness |
| | | Rsq1 | SRsq | Uniformity | controllability | | Rsq1 | SRsq | Uniformity | controllability |
| Example 256 | 1 | A | A | AA | A | 2 | A | A | A | A |
| Example 257 | 1 | A | A | AA | A | 2 | A | A | A | A |
| Example 258 | 1 | A | A | AA | A | 2 | A | A | A | A |
| Example 259 | 1 | A | A | AA | A | 2 | A | A | A | A |
| Example 260 | 1 | A | A | AA | A | 2 | A | A | A | A |
| Example 261 | 1 | A | A | AA | A | 2 | A | A | A | A |
| Example 262 | 1 | A | A | AA | A | 2 | A | A | A | A |
| Example 263 | 1 | A | A | AA | A | 2 | A | A | A | A |
| Example 264 | 1 | A | A | AA | A | 2 | A | A | A | A |
| Example 265 | 1 | A | A | AA | A | 2 | A | A | A | A |
| Example 266 | 1 | A | A | AA | A | 2 | A | A | A | A |
| Example 267 | 1 | A | A | AA | A | 2 | A | A | A | A |
| Example 268 | 1 | A | A | AA | A | 2 | A | A | A | A |
| Example 269 | 1 | A | A | AA | A | 2 | A | A | A | A |
| Example 270 | 1 | A | A | AA | A | 2 | A | A | A | A |
| Example 271 | 1 | A | A | AA | A | 2 | A | A | A | A |
| Example 272 | 1 | A | A | AA | A | 2 | A | A | A | A |
| Example 273 | 1 | A | A | AA | A | 2 | A | A | A | A |
| Example 274 | 1 | A | A | AA | A | 2 | A | A | A | A |
| Example 275 | 1 | A | A | AA | A | 2 | A | A | A | A |

TABLE 89

| Table 1-7-11 | | Evaluation | | | | | | | | |
|---|---|---|---|---|---|---|---|---|---|---|
| | | Type of resist composition | | | | Type of resist composition | | | | |
| | | | Resist saving properties | | | | | Resist saving properties | | |
| | | Affinity | | | Film thickness | | Affinity | | | Film thickness |
| | | Rsq1 | SRsq | Uniformity | controllability | | Rsq1 | SRsq | Uniformity | controllability |
| Example 236 | 3 | A | A | AA | A | 4 | A | A | AA | A |
| Example 237 | 3 | A | A | AA | A | 4 | A | A | AA | A |
| Example 238 | 3 | A | A | AA | A | 4 | A | A | AA | A |
| Example 239 | 3 | A | A | AA | A | 4 | A | A | AA | A |
| Example 240 | 3 | A | A | AA | A | 4 | A | A | AA | A |
| Example 241 | 3 | A | A | AA | A | 4 | A | A | AA | A |
| Example 242 | 3 | A | A | AA | A | 4 | A | A | AA | A |
| Example 243 | 3 | A | A | AA | A | 4 | A | A | AA | A |
| Example 244 | 3 | A | A | AA | A | 4 | A | A | AA | A |
| Example 245 | 3 | A | A | AA | A | 4 | A | A | AA | A |
| Example 246 | 3 | A | A | AA | A | 4 | A | A | AA | A |
| Example 247 | 3 | A | A | AA | A | 4 | A | A | AA | A |
| Example 248 | 3 | A | A | AA | A | 4 | A | A | AA | A |
| Example 249 | 3 | A | A | AA | A | 4 | A | A | AA | A |
| Example 250 | 3 | A | A | AA | A | 4 | A | A | AA | A |
| Example 251 | 3 | A | A | AA | A | 4 | A | A | AA | A |
| Example 252 | 3 | A | A | AA | A | 4 | A | A | AA | A |
| Example 253 | 3 | A | A | AA | A | 4 | A | A | AA | A |
| Example 254 | 3 | A | A | AA | A | 4 | A | A | AA | A |
| Example 255 | 3 | A | A | AA | A | 4 | A | A | AA | A |
| Example 256 | 3 | A | A | AA | A | 4 | A | A | AA | A |
| Example 257 | 3 | A | A | AA | A | 4 | A | A | AA | A |
| Example 258 | 3 | A | A | AA | A | 4 | A | A | AA | A |
| Example 259 | 3 | A | A | AA | A | 4 | A | A | AA | A |
| Example 260 | 3 | A | A | AA | A | 4 | A | A | AA | A |
| Example 261 | 3 | A | A | AA | A | 4 | A | A | AA | A |
| Example 262 | 3 | A | A | AA | A | 4 | A | A | AA | A |
| Example 263 | 3 | A | A | AA | A | 4 | A | A | AA | A |
| Example 264 | 3 | A | A | AA | A | 4 | A | A | AA | A |
| Example 265 | 3 | A | A | AA | A | 4 | A | A | AA | A |

TABLE 89-continued

| Table 1-7-11 | | Evaluation | | | | | | | | |
|---|---|---|---|---|---|---|---|---|---|---|
| | | Type of resist composition | | | | Type of resist composition | | | | |
| | | | | Resist saving properties | | | | Resist saving properties | | |
| | | Affinity | | | Film thickness | | Affinity | | | Film thickness |
| | | Rsq1 | SRsq | Uniformity | controllability | | Rsq1 | SRsq | Uniformity | controllability |
| Example 266 | 3 | A | A | AA | A | 4 | A | A | AA | A |
| Example 267 | 3 | A | A | AA | A | 4 | A | A | AA | A |
| Example 268 | 3 | A | A | AA | A | 4 | A | A | AA | A |
| Example 269 | 3 | A | A | AA | A | 4 | A | A | AA | A |
| Example 270 | 3 | A | A | AA | A | 4 | A | A | AA | A |
| Example 271 | 3 | A | A | AA | A | 4 | A | A | AA | A |
| Example 272 | 3 | A | A | AA | A | 4 | A | A | AA | A |
| Example 273 | 3 | A | A | AA | A | 4 | A | A | AA | A |
| Example 274 | 3 | A | A | AA | A | 4 | A | A | AA | A |
| Example 275 | 3 | A | A | AA | A | 4 | A | A | AA | A |

TABLE 90

| Table 1-7-12 | | Evaluation | | | | | | | | |
|---|---|---|---|---|---|---|---|---|---|---|
| | | Type of resist composition | | | | Type of resist composition | | | | |
| | | | | Resist saving properties | | | | Resist saving properties | | |
| | | Affinity | | | Film thickness | | Affinity | | | Film thickness |
| | | Rsq1 | SRsq | Uniformity | controllability | | Rsq1 | SRsq | Uniformity | controllability |
| Example 236 | 5 | A | A | AA | A | 6 | A | A | AA | A |
| Example 237 | 5 | A | A | AA | A | 6 | A | A | AA | A |
| Example 238 | 5 | A | A | AA | A | 6 | A | A | AA | A |
| Example 239 | 5 | A | A | AA | A | 6 | A | A | AA | A |
| Example 240 | 5 | A | A | AA | A | 6 | A | A | AA | A |
| Example 241 | 5 | A | A | AA | A | 6 | A | A | AA | A |
| Example 242 | 5 | A | A | AA | A | 6 | A | A | AA | A |
| Example 243 | 5 | A | A | AA | A | 6 | A | A | AA | A |
| Example 244 | 5 | A | A | AA | A | 6 | A | A | AA | A |
| Example 245 | 5 | A | A | AA | A | 6 | A | A | AA | A |
| Example 246 | 5 | A | A | AA | A | 6 | A | A | AA | A |
| Example 247 | 5 | A | A | AA | A | 6 | A | A | AA | A |
| Example 248 | 5 | A | A | AA | A | 6 | A | A | AA | A |
| Example 249 | 5 | A | A | AA | A | 6 | A | A | AA | A |
| Example 250 | 5 | A | A | AA | A | 6 | A | A | AA | A |
| Example 251 | 5 | A | A | AA | A | 6 | A | A | AA | A |
| Example 252 | 5 | A | A | AA | A | 6 | A | A | AA | A |
| Example 253 | 5 | A | A | AA | A | 6 | A | A | AA | A |
| Example 254 | 5 | A | A | AA | A | 6 | A | A | AA | A |
| Example 255 | 5 | A | A | AA | A | 6 | A | A | AA | A |
| Example 256 | 5 | A | A | AA | A | 6 | A | A | AA | A |
| Example 257 | 5 | A | A | AA | A | 6 | A | A | AA | A |
| Example 258 | 5 | A | A | AA | A | 6 | A | A | AA | A |
| Example 259 | 5 | A | A | AA | A | 6 | A | A | AA | A |
| Example 260 | 5 | A | A | AA | A | 6 | A | A | AA | A |
| Example 261 | 5 | A | A | AA | A | 6 | A | A | AA | A |
| Example 262 | 5 | A | A | AA | A | 6 | A | A | AA | A |
| Example 263 | 5 | A | A | AA | A | 6 | A | A | AA | A |
| Example 264 | 5 | A | A | AA | A | 6 | A | A | AA | A |
| Example 265 | 5 | A | A | AA | A | 6 | A | A | AA | A |
| Example 266 | 5 | A | A | AA | A | 6 | A | A | AA | A |
| Example 267 | 5 | A | A | AA | A | 6 | A | A | AA | A |
| Example 268 | 5 | A | A | AA | A | 6 | A | A | AA | A |
| Example 269 | 5 | A | A | AA | A | 6 | A | A | AA | A |
| Example 270 | 5 | A | A | AA | A | 6 | A | A | AA | A |
| Example 271 | 5 | A | A | AA | A | 6 | A | A | AA | A |
| Example 272 | 5 | A | A | AA | A | 6 | A | A | AA | A |
| Example 273 | 5 | A | A | AA | A | 6 | A | A | AA | A |
| Example 274 | 5 | A | A | AA | A | 6 | A | A | AA | A |
| Example 275 | 5 | A | A | AA | A | 6 | A | A | AA | A |

TABLE 91

| Table 1-7-13 | Type of resist composition | Evaluation Affinity Rsq1 | SRsq | Resist saving properties Uniformity | Film thickness controllability |
|---|---|---|---|---|---|
| Example 236 | 7 | A | A | AA | A |
| Example 237 | 7 | A | A | AA | A |
| Example 238 | 7 | A | A | AA | A |
| Example 239 | 7 | A | A | AA | A |
| Example 240 | 7 | A | A | AA | A |
| Example 241 | 7 | A | A | AA | A |
| Example 242 | 7 | A | A | AA | A |
| Example 243 | 7 | A | A | AA | A |
| Example 244 | 7 | A | A | AA | A |
| Example 245 | 7 | A | A | AA | A |
| Example 246 | 7 | A | A | AA | A |
| Example 247 | 7 | A | A | AA | A |
| Example 248 | 7 | A | A | AA | A |
| Example 249 | 7 | A | A | AA | A |
| Example 250 | 7 | A | A | AA | A |
| Example 251 | 7 | A | A | AA | A |
| Example 252 | 7 | A | A | AA | A |
| Example 253 | 7 | A | A | AA | A |
| Example 254 | 7 | A | A | AA | A |
| Example 255 | 7 | A | A | AA | A |
| Example 256 | 7 | A | A | AA | A |

TABLE 91-continued

| Table 1-7-13 | Type of resist composition | Evaluation Affinity Rsq1 | SRsq | Resist saving properties Uniformity | Film thickness controllability |
|---|---|---|---|---|---|
| Example 257 | 7 | A | A | AA | A |
| Example 258 | 7 | A | A | AA | A |
| Example 259 | 7 | A | A | AA | A |
| Example 260 | 7 | A | A | AA | A |
| Example 261 | 7 | A | A | AA | A |
| Example 262 | 7 | A | A | AA | A |
| Example 263 | 7 | A | A | AA | A |
| Example 264 | 7 | A | A | AA | A |
| Example 265 | 7 | A | A | AA | A |
| Example 266 | 7 | A | A | AA | A |
| Example 267 | 7 | A | A | AA | A |
| Example 268 | 7 | A | A | AA | A |
| Example 269 | 7 | A | A | AA | A |
| Example 270 | 7 | A | A | AA | A |
| Example 271 | 7 | A | A | AA | A |
| Example 272 | 7 | A | A | AA | A |
| Example 273 | 7 | A | A | AA | A |
| Example 274 | 7 | A | A | AA | A |
| Example 275 | 7 | A | A | AA | A |

TABLE 92

Components of chemical liquid for pre-wetting
Mixture of organic solvents
First organic solvent

| Table 1-8-1 | Type | Content (% by mass) | Molar mass (g/mol) | Vapor pressure (Pa) | Surface tension (mN/m) | $\delta h$ $(MPa)^{0.5}$ | $\delta d$ $(MPa)^{0.5}$ |
|---|---|---|---|---|---|---|---|
| Example 276 | | | | | | | |
| Example 277 | | | | | | | |
| Example 278 | | | | | | | |
| Example 279 | | | | | | | |
| Example 280 | | | | | | | |
| Example 281 | | | | | | | |
| Example 282 | | | | | | | |
| Example 283 | | | | | | | |
| Example 284 | | | | | | | |
| Example 285 | | | | | | | |
| Example 286 | | | | | | | |
| Example 287 | | | | | | | |
| Example 288 | | | | | | | |
| Example 289 | | | | | | | |
| Example 290 | | | | | | | |
| Example 291 | | | | | | | |
| Example 292 | | | | | | | |
| Example 293 | | | | | | | |
| Example 294 | | | | | | | |
| Example 295 | | | | | | | |
| Example 296 | | | | | | | |
| Example 297 | | | | | | | |
| Example 298 | | | | | | | |
| Example 299 | | | | | | | |
| Example 300 | | | | | | | |
| Example 301 | | | | | | | |
| Example 302 | | | | | | | |
| Example 303 | | | | | | | |
| Example 304 | | | | | | | |
| Example 305 | | | | | | | |
| Example 306 | | | | | | | |
| Example 307 | | | | | | | |
| Example 308 | | | | | | | |
| Example 309 | | | | | | | |
| Example 310 | | | | | | | |
| Example 311 | | | | | | | |

TABLE 92-continued

Components of chemical liquid for pre-wetting
Mixture of organic solvents
First organic solvent

| Table 1-8-1 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 312 | | | | | | | |
| Example 313 | | | | | | | |
| Example 314 | | | | | | | |
| Example 315 | | | | | | | |

TABLE 93

Components of chemical liquid for pre-wetting
Mixture of organic solvents
Second organic solvent

| Table 1-8-2 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 276 | HBM | 75 | 118.13 | 267 | 29.1 | 46.0 | 20.1 |
| Example 277 | HBM | 75 | 118.13 | 267 | 29.1 | 46.0 | 20.1 |
| Example 278 | HBM | 75 | 118.13 | 267 | 29.1 | 46.0 | 20.1 |
| Example 279 | HBM | 75 | 118.13 | 267 | 29.1 | 46.0 | 20.1 |
| Example 280 | HBM | 75 | 118.13 | 267 | 29.1 | 46.0 | 20.1 |
| Example 281 | HBM | 75 | 118.13 | 267 | 29.1 | 46.0 | 20.1 |
| Example 282 | DBCPN | 75 | 130.18 | 400 | 30.2 | 65.4 | 18.1 |
| Example 283 | DBCPN | 75 | 130.18 | 400 | 30.2 | 65.4 | 18.1 |
| Example 284 | DBCPN | 75 | 130.18 | 400 | 30.2 | 65.4 | 18.1 |
| Example 285 | DBCPN | 75 | 130.18 | 400 | 30.2 | 65.4 | 18.1 |
| Example 286 | DBCPN | 75 | 130.18 | 400 | 30.2 | 65.4 | 18.1 |
| Example 287 | DBCPN | 75 | 130.18 | 400 | 30.2 | 65.4 | 18.1 |
| Example 288 | DBCPN | 75 | 130.18 | 400 | 30.2 | 65.4 | 18.1 |
| Example 289 | DBCPN | 75 | 130.18 | 400 | 30.2 | 65.4 | 18.1 |
| Example 290 | DBCPN | 75 | 130.18 | 400 | 30.2 | 65.4 | 18.1 |
| Example 291 | DBCPN | 75 | 130.18 | 400 | 30.2 | 65.4 | 18.1 |
| Example 292 | DBCPN | 75 | 130.18 | 400 | 30.2 | 65.4 | 18.1 |
| Example 293 | DBCPN | 75 | 130.18 | 400 | 30.2 | 65.4 | 18.1 |
| Example 294 | DBCPN | 75 | 130.18 | 400 | 30.2 | 65.4 | 18.1 |
| Example 295 | DBCPN | 75 | 130.18 | 400 | 30.2 | 65.4 | 18.1 |
| Example 296 | DBCPN | 75 | 130.18 | 400 | 30.2 | 65.4 | 18.1 |
| Example 297 | DBCPN | 75 | 130.18 | 400 | 30.2 | 65.4 | 18.1 |
| Example 298 | DBCPN | 75 | 130.18 | 400 | 30.2 | 65.4 | 18.1 |
| Example 299 | PGMEA | 30 | 132.16 | 493 | 27.9 | 56.5 | 19.8 |
| Example 300 | PGMEA | 30 | 132.16 | 493 | 27.9 | 56.5 | 19.8 |
| Example 301 | PGMEA | 30 | 132.16 | 493 | 27.9 | 56.5 | 19.8 |
| Example 302 | PGMEA | 30 | 132.16 | 493 | 27.9 | 56.5 | 19.8 |
| Example 303 | PGMEA | 30 | 132.16 | 493 | 27.9 | 56.5 | 19.8 |
| Example 304 | PGMEA | 30 | 132.16 | 493 | 27.9 | 56.5 | 19.8 |
| Example 305 | PGMEA | 30 | 132.16 | 493 | 27.9 | 56.5 | 19.8 |
| Example 306 | PGMEA | 30 | 132.16 | 493 | 27.9 | 56.5 | 19.8 |
| Example 307 | PGMEA | 30 | 132.16 | 493 | 27.9 | 56.5 | 19.8 |
| Example 308 | PGMEA | 30 | 132.16 | 493 | 27.9 | 56.5 | 19.8 |
| Example 309 | PGMEA | 30 | 132.16 | 493 | 27.9 | 56.5 | 19.8 |
| Example 310 | PGMEA | 30 | 132.16 | 493 | 27.9 | 56.5 | 19.8 |
| Example 311 | PGMEA | 30 | 132.16 | 493 | 27.9 | 56.5 | 19.8 |
| Example 312 | PGMEA | 30 | 132.16 | 493 | 27.9 | 56.5 | 19.8 |
| Example 313 | PGMEA | 30 | 132.16 | 493 | 27.9 | 56.5 | 19.8 |
| Example 314 | PGMEA | 30 | 132.16 | 493 | 27.9 | 56.5 | 19.8 |
| Example 315 | PGMEA | 30 | 132.16 | 493 | 27.9 | 56.5 | 19.8 |

TABLE 94

Components of chemical liquid for pre-wetting
Mixture of organic solvents
Third organic solvent

| Table 1-8-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 276 | | | | | | | |
| Example 277 | | | | | | | |
| Example 278 | | | | | | | |
| Example 279 | | | | | | | |
| Example 280 | | | | | | | |
| Example 281 | | | | | | | |
| Example 282 | | | | | | | |
| Example 283 | | | | | | | |
| Example 284 | | | | | | | |
| Example 285 | | | | | | | |
| Example 286 | | | | | | | |
| Example 287 | | | | | | | |
| Example 288 | | | | | | | |
| Example 289 | | | | | | | |
| Example 290 | | | | | | | |
| Example 291 | | | | | | | |
| Example 292 | | | | | | | |
| Example 293 | | | | | | | |
| Example 294 | | | | | | | |
| Example 295 | | | | | | | |
| Example 296 | | | | | | | |
| Example 297 | | | | | | | |
| Example 298 | | | | | | | |
| Example 299 | GBL | 20 | 86.08 | 147 | 44.1 | 42.9 | 39.5 |
| Example 300 | GBL | 20 | 86.08 | 147 | 44.1 | 42.9 | 39.5 |
| Example 301 | GBL | 20 | 86.08 | 147 | 44.1 | 42.9 | 39.5 |
| Example 302 | GBL | 20 | 86.08 | 147 | 44.1 | 42.9 | 39.5 |
| Example 303 | GBL | 20 | 86.08 | 147 | 44.1 | 42.9 | 39.5 |
| Example 304 | GBL | 20 | 86.08 | 147 | 44.1 | 42.9 | 39.5 |
| Example 305 | GBL | 20 | 86.08 | 147 | 44.1 | 42.9 | 39.5 |
| Example 306 | GBL | 20 | 86.08 | 147 | 44.1 | 42.9 | 39.5 |
| Example 307 | GBL | 20 | 86.08 | 147 | 44.1 | 42.9 | 39.5 |
| Example 308 | GBL | 20 | 86.08 | 147 | 44.1 | 42.9 | 39.5 |
| Example 309 | GBL | 20 | 86.08 | 147 | 44.1 | 42.9 | 39.5 |
| Example 310 | GBL | 20 | 86.08 | 147 | 44.1 | 42.9 | 39.5 |
| Example 311 | GBL | 20 | 86.08 | 147 | 44.1 | 42.9 | 39.5 |
| Example 312 | GBL | 20 | 86.08 | 147 | 44.1 | 42.9 | 39.5 |
| Example 313 | GBL | 20 | 86.08 | 147 | 44.1 | 42.9 | 39.5 |
| Example 314 | GBL | 20 | 86.08 | 147 | 44.1 | 42.9 | 39.5 |
| Example 315 | GBL | 20 | 86.08 | 147 | 44.1 | 42.9 | 39.5 |

TABLE 95

Components of chemical liquid for pre-wetting
Mixture of organic solvents
Fourth organic solvent

| Table 1-8-4 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 276 | 14-DMB | 25 | 138.17 | 1 | 30.0 | 59.0 | 20.6 |
| Example 277 | 12-DMB | 25 | 138.17 | 1 | 30.0 | 60.6 | 20.2 |
| Example 278 | 13-DMB | 25 | 138.17 | 1 | 30.0 | 61.6 | 19.9 |
| Example 279 | 14-Diphenoxybenzene | 25 | 262.31 | 1 | 33.0 | 63.3 | 18.5 |
| Example 280 | 4-Methoxytoluene | 25 | 122.17 | 1 | 32.0 | 64.8 | 17.4 |
| Example 281 | Phenetole | 25 | 122.17 | 1 | 31.0 | 66.3 | 16.3 |
| Example 282 | DEGME | 25 | 120.15 | 13 | 28.0 | 44.3 | 20.8 |
| Example 283 | DME | 25 | 90.12 | 693 | 29.0 | 55.9 | 22.8 |
| Example 284 | DEE | 25 | 118.18 | 627 | 29.0 | 62.2 | 19.9 |
| Example 285 | DEGIBE | 25 | 162.23 | 133 | 29.0 | 61.9 | 18.7 |
| Example 286 | DEGDME | 25 | 134.18 | 520 | 28.0 | 56.9 | 21.0 |
| Example 287 | DEGDEE | 25 | 162.23 | 253 | 29.0 | 60.4 | 19.6 |
| Example 288 | TriEGDME | 25 | 178.23 | 13 | 28.0 | 56.4 | 20.9 |
| Example 289 | TetraEGDME | 25 | 222.28 | 13 | 27.0 | 55.6 | 21.1 |
| Example 290 | TEGMBE | 25 | 220.31 | 13 | 28.0 | 48.5 | 18.7 |
| Example 291 | DEGMBE | 25 | 162.23 | 117 | 29.0 | 59.4 | 18.1 |
| Example 292 | Anisole | 25 | 108.14 | 63 | 30.0 | 64.3 | 17.0 |

TABLE 95-continued

Components of chemical liquid for pre-wetting
Mixture of organic solvents
Fourth organic solvent

| Table 1-8-4 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 293 | 14-DMB | 25 | 138.17 | 1 | 30.0 | 59.0 | 20.6 |
| Example 294 | 12-DMB | 25 | 138.17 | 1 | 30.0 | 60.6 | 20.2 |
| Example 295 | 13-DMB | 25 | 138.17 | 1 | 30.0 | 61.6 | 19.9 |
| Example 296 | 14-Diphenoxybenzene | 25 | 262.31 | 1 | 33.0 | 63.3 | 18.5 |
| Example 297 | 4-Methoxytoluene | 25 | 122.17 | 1 | 32.0 | 64.8 | 17.4 |
| Example 298 | Phenetole | 25 | 122.17 | 1 | 31.0 | 66.3 | 16.3 |
| Example 299 | DEGME | 50 | 120.15 | 13 | 28.0 | 44.3 | 20.8 |
| Example 300 | DME | 50 | 90.12 | 693 | 29.0 | 55.9 | 22.8 |
| Example 301 | DEE | 50 | 118.18 | 627 | 29.0 | 62.2 | 19.9 |
| Example 302 | DEGIBE | 50 | 162.23 | 133 | 29.0 | 61.9 | 18.7 |
| Example 303 | DEGDME | 50 | 134.18 | 520 | 28.0 | 56.9 | 21.0 |
| Example 304 | DEGDEE | 50 | 162.23 | 253 | 29.0 | 60.4 | 19.6 |
| Example 305 | TriEGDME | 50 | 178.23 | 13 | 28.0 | 56.4 | 20.9 |
| Example 306 | TetraEGDME | 50 | 222.28 | 13 | 27.0 | 55.6 | 21.1 |
| Example 307 | TEGMBE | 50 | 220.31 | 13 | 28.0 | 48.5 | 18.7 |
| Example 308 | DEGMBE | 50 | 162.23 | 117 | 29.0 | 59.4 | 18.1 |
| Example 309 | Anisole | 50 | 108.14 | 63 | 30.0 | 64.3 | 17.0 |
| Example 310 | 14-DMB | 50 | 138.17 | 1 | 30.0 | 59.0 | 20.6 |
| Example 311 | 12-DMB | 50 | 138.17 | 1 | 30.0 | 60.6 | 20.2 |
| Example 312 | 13-DMB | 50 | 138.17 | 1 | 30.0 | 61.6 | 19.9 |
| Example 313 | 14-Diphenoxybenzene | 50 | 262.31 | 1 | 33.0 | 63.3 | 18.5 |
| Example 314 | 4-Methoxytoluene | 50 | 122.17 | 1 | 32.0 | 64.8 | 17.4 |
| Example 315 | Phenetole | 50 | 122.17 | 1 | 31.0 | 66.3 | 16.3 |

TABLE 96

Components of chemical liquid for pre-wetting
Mixture of organic solvents
Fourth organic solvent

| Table 1-8-5 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 276 | | | | | | | |
| Example 277 | | | | | | | |
| Example 278 | | | | | | | |
| Example 279 | | | | | | | |
| Example 280 | | | | | | | |
| Example 281 | | | | | | | |
| Example 282 | | | | | | | |
| Example 283 | | | | | | | |
| Example 284 | | | | | | | |
| Example 285 | | | | | | | |
| Example 286 | | | | | | | |
| Example 287 | | | | | | | |
| Example 288 | | | | | | | |
| Example 289 | | | | | | | |
| Example 290 | | | | | | | |
| Example 291 | | | | | | | |
| Example 292 | | | | | | | |
| Example 293 | | | | | | | |
| Example 294 | | | | | | | |
| Example 295 | | | | | | | |
| Example 296 | | | | | | | |
| Example 297 | | | | | | | |
| Example 298 | | | | | | | |
| Example 299 | | | | | | | |
| Example 300 | | | | | | | |
| Example 301 | | | | | | | |
| Example 302 | | | | | | | |
| Example 303 | | | | | | | |
| Example 304 | | | | | | | |
| Example 305 | | | | | | | |
| Example 306 | | | | | | | |
| Example 307 | | | | | | | |
| Example 308 | | | | | | | |
| Example 309 | | | | | | | |

TABLE 96-continued

Components of chemical liquid for pre-wetting
Mixture of organic solvents
Fourth organic solvent

| Table 1-8-5 | Type | Content (% by mass) | Molar mass (g/mol) | Vapor pressure (Pa) | Surface tension (mN/m) | $\delta h$ $(MPa)^{0.5}$ | $\delta d$ $(MPa)^{0.5}$ |
|---|---|---|---|---|---|---|---|
| Example 310 | | | | | | | |
| Example 311 | | | | | | | |
| Example 312 | | | | | | | |
| Example 313 | | | | | | | |
| Example 314 | | | | | | | |
| Example 315 | | | | | | | |

15

TABLE 97

Components of chemical liquid for pre-wetting
Mixture of organic solvents

| Table 1-8-6 | Type | Content (% by mass) | Molar mass (g/mol) | Fifth organic solvent Vapor pressure (Pa) | Surface tension (mN/m) | $\delta h$ $(MPa)^{0.5}$ | $\delta d$ $(MPa)^{0.5}$ | Vapor pressure (Pa) | Surface tension (mN/m) |
|---|---|---|---|---|---|---|---|---|---|
| Example 276 | | | | | | | | 208 | 29.3 |
| Example 277 | | | | | | | | 208 | 29.3 |
| Example 278 | | | | | | | | 208 | 29.3 |
| Example 279 | | | | | | | | 232 | 29.6 |
| Example 280 | | | | | | | | 202 | 29.8 |
| Example 281 | | | | | | | | 202 | 29.6 |
| Example 282 | | | | | | | | 297 | 29.6 |
| Example 283 | | | | | | | | 495 | 29.8 |
| Example 284 | | | | | | | | 461 | 29.9 |
| Example 285 | | | | | | | | 344 | 29.9 |
| Example 286 | | | | | | | | 429 | 29.7 |
| Example 287 | | | | | | | | 369 | 29.9 |
| Example 288 | | | | | | | | 324 | 29.8 |
| Example 289 | | | | | | | | 337 | 29.7 |
| Example 290 | | | | | | | | 336 | 29.8 |
| Example 291 | | | | | | | | 340 | 29.9 |
| Example 292 | | | | | | | | 303 | 30.1 |
| Example 293 | | | | | | | | 305 | 30.2 |
| Example 294 | | | | | | | | 305 | 30.2 |
| Example 295 | | | | | | | | 305 | 30.2 |
| Example 296 | | | | | | | | 343 | 30.6 |
| Example 297 | | | | | | | | 295 | 30.7 |
| Example 298 | | | | | | | | 295 | 30.4 |
| Example 299 | | | | | | | | 173 | 32.2 |
| Example 300 | | | | | | | | 523 | 32.2 |
| Example 301 | | | | | | | | 466 | 32.7 |
| Example 302 | | | | | | | | 244 | 33.2 |
| Example 303 | | | | | | | | 408 | 32.5 |
| Example 304 | | | | | | | | 292 | 33.2 |
| Example 305 | | | | | | | | 202 | 33.0 |
| Example 306 | | | | | | | | 218 | 33.1 |
| Example 307 | | | | | | | | 217 | 33.4 |
| Example 308 | | | | | | | | 237 | 33.2 |
| Example 309 | | | | | | | | 190 | 33.0 |
| Example 310 | | | | | | | | 178 | 33.4 |
| Example 311 | | | | | | | | 178 | 33.4 |
| Example 312 | | | | | | | | 178 | 33.4 |
| Example 313 | | | | | | | | 225 | 35.2 |
| Example 314 | | | | | | | | 169 | 34.2 |
| Example 315 | | | | | | | | 169 | 33.7 |

TABLE 98

Components of chemical liquid for pre-wetting

| Table 1-8-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 276 | Balance | 0.002 | 0.006 | 0.002 | 0.030 | 0.030 | 0.070 |
| Example 277 | Balance | 0.002 | 0.006 | 0.002 | 0.030 | 0.030 | 0.070 |
| Example 278 | Balance | 0.002 | 0.006 | 0.002 | 0.030 | 0.030 | 0.070 |
| Example 279 | Balance | 0.002 | 0.006 | 0.002 | 0.030 | 0.030 | 0.070 |
| Example 280 | Balance | 0.002 | 0.006 | 0.002 | 0.030 | 0.030 | 0.070 |
| Example 281 | Balance | 0.002 | 0.006 | 0.002 | 0.030 | 0.030 | 0.070 |
| Example 282 | Balance | 0.002 | 0.006 | 0.002 | 0.030 | 0.030 | 0.070 |
| Example 283 | Balance | 0.002 | 0.006 | 0.002 | 0.030 | 0.030 | 0.070 |
| Example 284 | Balance | 0.002 | 0.006 | 0.002 | 0.030 | 0.030 | 0.070 |
| Example 285 | Balance | 0.002 | 0.006 | 0.002 | 0.030 | 0.030 | 0.070 |
| Example 286 | Balance | 0.002 | 0.006 | 0.002 | 0.030 | 0.030 | 0.070 |
| Example 287 | Balance | 0.002 | 0.006 | 0.002 | 0.030 | 0.030 | 0.070 |
| Example 288 | Balance | 0.002 | 0.006 | 0.002 | 0.030 | 0.030 | 0.070 |
| Example 289 | Balance | 0.002 | 0.006 | 0.002 | 0.030 | 0.030 | 0.070 |
| Example 290 | Balance | 0.002 | 0.006 | 0.002 | 0.030 | 0.030 | 0.070 |
| Example 291 | Balance | 0.002 | 0.006 | 0.002 | 0.030 | 0.030 | 0.070 |
| Example 292 | Balance | 0.002 | 0.006 | 0.002 | 0.030 | 0.030 | 0.070 |
| Example 293 | Balance | 0.002 | 0.006 | 0.002 | 0.030 | 0.030 | 0.070 |
| Example 294 | Balance | 0.002 | 0.006 | 0.002 | 0.030 | 0.030 | 0.070 |
| Example 295 | Balance | 0.002 | 0.006 | 0.002 | 0.030 | 0.030 | 0.070 |
| Example 296 | Balance | 0.002 | 0.006 | 0.002 | 0.030 | 0.030 | 0.070 |
| Example 297 | Balance | 0.002 | 0.006 | 0.002 | 0.030 | 0.030 | 0.070 |
| Example 298 | Balance | 0.002 | 0.006 | 0.002 | 0.030 | 0.030 | 0.070 |
| Example 299 | Balance | 0.002 | 0.006 | 0.002 | 0.030 | 0.030 | 0.070 |
| Example 300 | Balance | 0.002 | 0.006 | 0.002 | 0.030 | 0.030 | 0.070 |
| Example 301 | Balance | 0.002 | 0.006 | 0.002 | 0.030 | 0.030 | 0.070 |
| Example 302 | Balance | 0.002 | 0.006 | 0.002 | 0.030 | 0.030 | 0.070 |
| Example 303 | Balance | 0.002 | 0.006 | 0.002 | 0.030 | 0.030 | 0.070 |
| Example 304 | Balance | 0.002 | 0.006 | 0.002 | 0.030 | 0.030 | 0.070 |
| Example 305 | Balance | 0.002 | 0.006 | 0.002 | 0.030 | 0.030 | 0.070 |
| Example 306 | Balance | 0.002 | 0.006 | 0.002 | 0.030 | 0.030 | 0.070 |
| Example 307 | Balance | 0.002 | 0.006 | 0.002 | 0.030 | 0.030 | 0.070 |
| Example 308 | Balance | 0.002 | 0.006 | 0.002 | 0.030 | 0.030 | 0.070 |
| Example 309 | Balance | 0.002 | 0.006 | 0.002 | 0.030 | 0.030 | 0.070 |
| Example 310 | Balance | 0.002 | 0.006 | 0.002 | 0.030 | 0.030 | 0.070 |
| Example 311 | Balance | 0.002 | 0.006 | 0.002 | 0.030 | 0.030 | 0.070 |
| Example 312 | Balance | 0.002 | 0.006 | 0.002 | 0.030 | 0.030 | 0.070 |
| Example 313 | Balance | 0.002 | 0.006 | 0.002 | 0.030 | 0.030 | 0.070 |
| Example 314 | Balance | 0.002 | 0.006 | 0.002 | 0.030 | 0.030 | 0.070 |
| Example 315 | Balance | 0.002 | 0.006 | 0.002 | 0.030 | 0.030 | 0.070 |

TABLE 99

Components of chemical liquid for pre-wetting

| Table 1-8-8 | Impurity metal Content of impurity metal as particles (mass ppt) | | | | | | Organic impurity Specific organic compound | |
|---|---|---|---|---|---|---|---|---|
| | Fe | Cr | Ni | Pb | Others | Total | Boiling point: equal to or higher than 250° C. Number of carbon atoms: equal to or greater than 8 | Boiling point: equal to or higher than 250° C. Number of carbon atoms: equal to or greater than 12 |
| Example 276 | 0.040 | 0.002 | 0.001 | 0.003 | 0.019 | 0.065 | A | A |
| Example 277 | 0.040 | 0.002 | 0.001 | 0.003 | 0.019 | 0.065 | A | A |
| Example 278 | 0.040 | 0.002 | 0.001 | 0.003 | 0.019 | 0.065 | A | A |
| Example 279 | 0.040 | 0.002 | 0.001 | 0.003 | 0.019 | 0.065 | A | A |
| Example 280 | 0.040 | 0.002 | 0.001 | 0.003 | 0.019 | 0.065 | A | A |
| Example 281 | 0.040 | 0.002 | 0.001 | 0.003 | 0.019 | 0.065 | A | A |
| Example 282 | 0.040 | 0.002 | 0.001 | 0.003 | 0.019 | 0.065 | A | A |
| Example 283 | 0.040 | 0.002 | 0.001 | 0.003 | 0.019 | 0.065 | A | A |
| Example 284 | 0.040 | 0.002 | 0.001 | 0.003 | 0.019 | 0.065 | A | A |
| Example 285 | 0.040 | 0.002 | 0.001 | 0.003 | 0.019 | 0.065 | A | A |
| Example 286 | 0.040 | 0.002 | 0.001 | 0.003 | 0.019 | 0.065 | A | A |

TABLE 99-continued

Components of chemical liquid for pre-wetting

| | Impurity metal Content of impurity metal as particles (mass ppt) | | | | | | Organic impurity Specific organic compound | |
|---|---|---|---|---|---|---|---|---|
| | | | | | | | Boiling point: equal to or higher than 250° C. Number of carbon atoms: equal to or | Boiling point: equal to or higher than 250° C. Number of carbon atoms: equal to or |
| Table 1-8-8 | Fe | Cr | Ni | Pb | Others | Total | greater than 8 | greater than 12 |
| Example 287 | 0.040 | 0.002 | 0.001 | 0.003 | 0.019 | 0.065 | A | A |
| Example 288 | 0.040 | 0.002 | 0.001 | 0.003 | 0.019 | 0.065 | A | A |
| Example 289 | 0.040 | 0.002 | 0.001 | 0.003 | 0.019 | 0.065 | A | A |
| Example 290 | 0.040 | 0.002 | 0.001 | 0.003 | 0.019 | 0.065 | A | A |
| Example 291 | 0.040 | 0.002 | 0.001 | 0.003 | 0.019 | 0.065 | A | A |
| Example 292 | 0.040 | 0.002 | 0.001 | 0.003 | 0.019 | 0.065 | A | A |
| Example 293 | 0.040 | 0.002 | 0.001 | 0.003 | 0.019 | 0.065 | A | A |
| Example 294 | 0.040 | 0.002 | 0.001 | 0.003 | 0.019 | 0.065 | A | A |
| Example 295 | 0.040 | 0.002 | 0.001 | 0.003 | 0.019 | 0.065 | A | A |
| Example 296 | 0.040 | 0.002 | 0.001 | 0.003 | 0.019 | 0.065 | A | A |
| Example 297 | 0.040 | 0.002 | 0.001 | 0.003 | 0.019 | 0.065 | A | A |
| Example 298 | 0.040 | 0.002 | 0.001 | 0.003 | 0.019 | 0.065 | A | A |
| Example 299 | 0.040 | 0.002 | 0.001 | 0.003 | 0.019 | 0.065 | A | A |
| Example 300 | 0.040 | 0.002 | 0.001 | 0.003 | 0.019 | 0.065 | A | A |
| Example 301 | 0.040 | 0.002 | 0.001 | 0.003 | 0.019 | 0.065 | A | A |
| Example 302 | 0.040 | 0.002 | 0.001 | 0.003 | 0.019 | 0.065 | A | A |
| Example 303 | 0.040 | 0.002 | 0.001 | 0.003 | 0.019 | 0.065 | A | A |
| Example 304 | 0.040 | 0.002 | 0.001 | 0.003 | 0.019 | 0.065 | A | A |
| Example 305 | 0.040 | 0.002 | 0.001 | 0.003 | 0.019 | 0.065 | A | A |
| Example 306 | 0.040 | 0.002 | 0.001 | 0.003 | 0.019 | 0.065 | A | A |
| Example 307 | 0.040 | 0.002 | 0.001 | 0.003 | 0.019 | 0.065 | A | A |
| Example 308 | 0.040 | 0.002 | 0.001 | 0.003 | 0.019 | 0.065 | A | A |
| Example 309 | 0.040 | 0.002 | 0.001 | 0.003 | 0.019 | 0.065 | A | A |
| Example 310 | 0.040 | 0.002 | 0.001 | 0.003 | 0.019 | 0.065 | A | A |
| Example 311 | 0.040 | 0.002 | 0.001 | 0.003 | 0.019 | 0.065 | A | A |
| Example 312 | 0.040 | 0.002 | 0.001 | 0.003 | 0.019 | 0.065 | A | A |
| Example 313 | 0.040 | 0.002 | 0.001 | 0.003 | 0.019 | 0.065 | A | A |
| Example 314 | 0.040 | 0.002 | 0.001 | 0.003 | 0.019 | 0.065 | A | A |
| Example 315 | 0.040 | 0.002 | 0.001 | 0.003 | 0.019 | 0.065 | A | A |

TABLE 100

Components of chemical liquid for pre-wetting

| | Organic impurity Content of organic impurity | | | | | Physical properties of chemical liquid | |
|---|---|---|---|---|---|---|---|
| Table 1-8-9 | Total (mass ppm) | Conetnt of high-boiling-point component (mass ppm) | Content of ultrahigh-boiling-point component (mass ppm) | Content of compound having CLogP value higher than 6.5 (mass ppt) | Water Content (% by mass) | for pre-wetting Number of coarse particles (Number of objects to be counted) (Number/mL) | Evaluation Defect inhibition performance |
| Example 276 | 2,500 | 1 | 0.5 | 500 | 0.10% | 6 | AA |
| Example 277 | 2,500 | 1 | 0.5 | 500 | 0.10% | 6 | AA |
| Example 278 | 2,500 | 1 | 0.5 | 500 | 0.10% | 6 | AA |
| Example 279 | 2,500 | 1 | 0.5 | 500 | 0.10% | 6 | AA |
| Example 280 | 2,500 | 1 | 0.5 | 500 | 0.10% | 6 | AA |
| Example 281 | 2,500 | 1 | 0.5 | 500 | 0.10% | 6 | AA |
| Example 282 | 2,500 | 1 | 0.5 | 500 | 0.10% | 6 | AA |
| Example 283 | 2,500 | 1 | 0.5 | 500 | 0.10% | 6 | AA |
| Example 284 | 2,500 | 1 | 0.5 | 500 | 0.10% | 6 | AA |
| Example 285 | 2,500 | 1 | 0.5 | 500 | 0.10% | 6 | AA |
| Example 286 | 2,500 | 1 | 0.5 | 500 | 0.10% | 6 | AA |
| Example 287 | 2,500 | 1 | 0.5 | 500 | 0.10% | 6 | AA |
| Example 288 | 2,500 | 1 | 0.5 | 500 | 0.10% | 6 | AA |
| Example 289 | 2,500 | 1 | 0.5 | 500 | 0.10% | 6 | AA |
| Example 290 | 2,500 | 1 | 0.5 | 500 | 0.10% | 6 | AA |
| Example 291 | 2,500 | 1 | 0.5 | 500 | 0.10% | 6 | AA |
| Example 292 | 2,500 | 1 | 0.5 | 500 | 0.10% | 6 | AA |
| Example 293 | 2,500 | 1 | 0.5 | 500 | 0.10% | 6 | AA |
| Example 294 | 2,500 | 1 | 0.5 | 500 | 0.10% | 6 | AA |
| Example 295 | 2,500 | 1 | 0.5 | 500 | 0.10% | 6 | AA |

TABLE 100-continued

| | Components of chemical liquid for pre-wetting | | | | | Physical properties of chemical liquid for pre-wetting | |
|---|---|---|---|---|---|---|---|
| | | Organic impurity Content of organic impurity | | | | | |
| Table 1-8-9 | Total (mass ppm) | Conetnt of high-boiling-point component (mass ppm) | Content of ultrahigh-boiling-point component (mass ppm) | Content of compound having CLogP value higher than 6.5 (mass ppt) | Water Content (% by mass) | Number of coarse particles (Number of objects to be counted) (Number/mL) | Evaluation Defect inhibition performance |
| Example 296 | 2,500 | 1 | 0.5 | 500 | 0.10% | 6 | AA |
| Example 297 | 2,500 | 1 | 0.5 | 500 | 0.10% | 6 | AA |
| Example 298 | 2,500 | 1 | 0.5 | 500 | 0.10% | 6 | AA |
| Example 299 | 2,500 | 1 | 0.5 | 500 | 0.10% | 6 | AA |
| Example 300 | 2,500 | 1 | 0.5 | 500 | 0.10% | 6 | AA |
| Example 301 | 2,500 | 1 | 0.5 | 500 | 0.10% | 6 | AA |
| Example 302 | 2,500 | 1 | 0.5 | 500 | 0.10% | 6 | AA |
| Example 303 | 2,500 | 1 | 0.5 | 500 | 0.10% | 6 | AA |
| Example 304 | 2,500 | 1 | 0.5 | 500 | 0.10% | 6 | AA |
| Example 305 | 2,500 | 1 | 0.5 | 500 | 0.10% | 6 | AA |
| Example 306 | 2,500 | 1 | 0.5 | 500 | 0.10% | 6 | AA |
| Example 307 | 2,500 | 1 | 0.5 | 500 | 0.10% | 6 | AA |
| Example 308 | 2,500 | 1 | 0.5 | 500 | 0.10% | 6 | AA |
| Example 309 | 2,500 | 1 | 0.5 | 500 | 0.10% | 6 | AA |
| Example 310 | 2,500 | 1 | 0.5 | 500 | 0.10% | 6 | AA |
| Example 311 | 2,500 | 1 | 0.5 | 500 | 0.10% | 6 | AA |
| Example 312 | 2,500 | 1 | 0.5 | 500 | 0.10% | 6 | AA |
| Example 313 | 2,500 | 1 | 0.5 | 500 | 0.10% | 6 | AA |
| Example 314 | 2,500 | 1 | 0.5 | 500 | 0.10% | 6 | AA |
| Example 315 | 2,500 | 1 | 0.5 | 500 | 0.10% | 6 | AA |

TABLE 101

| | Evaluation | | | | | | | | | |
|---|---|---|---|---|---|---|---|---|---|---|
| | Type of resist composition | | | | | Type of resist composition | | | | |
| | | | | Resist saving properties | | | | | Resist saving properties | |
| | | Affinity | | | Film thickness | | Affinity | | | Film thickness |
| Table 1-8-10 | | Rsq1 | SRsq | Uniformity | controllability | | Rsq1 | SRsq | Uniformity | controllability |
| Example 276 | 1 | A | A | AA | A | 2 | A | A | A | A |
| Example 277 | 1 | A | A | AA | A | 2 | A | A | A | A |
| Example 278 | 1 | A | A | AA | A | 2 | A | A | A | A |
| Example 279 | 1 | A | A | AA | A | 2 | A | A | A | A |
| Example 280 | 1 | A | A | AA | A | 2 | A | A | A | A |
| Example 281 | 1 | A | A | AA | A | 2 | A | A | A | A |
| Example 282 | 1 | A | A | AA | A | 2 | A | A | A | A |
| Example 283 | 1 | A | A | AA | A | 2 | A | A | A | A |
| Example 284 | 1 | A | A | AA | A | 2 | A | A | A | A |
| Example 285 | 1 | A | A | AA | A | 2 | A | A | A | A |
| Example 286 | 1 | A | A | AA | A | 2 | A | A | A | A |
| Example 287 | 1 | A | A | AA | A | 2 | A | A | A | A |
| Example 288 | 1 | A | A | AA | A | 2 | A | A | A | A |
| Example 289 | 1 | A | A | AA | A | 2 | A | A | A | A |
| Example 290 | 1 | A | A | AA | A | 2 | A | A | A | A |
| Example 291 | 1 | A | A | AA | A | 2 | A | A | A | A |
| Example 292 | 1 | A | A | AA | A | 2 | A | A | A | A |
| Example 293 | 1 | A | A | AA | A | 2 | A | A | A | A |
| Example 294 | 1 | A | A | AA | A | 2 | A | A | A | A |
| Example 295 | 1 | A | A | AA | A | 2 | A | A | A | A |
| Example 296 | 1 | A | A | AA | A | 2 | A | A | A | A |
| Example 297 | 1 | A | A | AA | A | 2 | A | A | A | A |
| Example 298 | 1 | A | A | AA | A | 2 | A | A | A | A |
| Example 299 | 1 | A | A | AA | A | 2 | A | A | A | A |
| Example 300 | 1 | A | A | AA | A | 2 | A | A | A | A |
| Example 301 | 1 | A | A | AA | A | 2 | A | A | A | A |
| Example 302 | 1 | A | A | AA | A | 2 | A | A | A | A |
| Example 303 | 1 | A | A | AA | A | 2 | A | A | A | A |
| Example 304 | 1 | A | A | AA | A | 2 | A | A | A | A |
| Example 305 | 1 | A | A | AA | A | 2 | A | A | A | A |
| Example 306 | 1 | A | A | AA | A | 2 | A | A | A | A |

TABLE 101-continued

| Table 1-8-10 | | Type of resist composition | | | | | Type of resist composition | | | |
|---|---|---|---|---|---|---|---|---|---|---|
| | | Affinity | | | Resist saving properties | | Affinity | | | Resist saving properties |
| | | Rsq1 | SRsq | Uniformity | Film thickness controllability | | Rsq1 | SRsq | Uniformity | Film thickness controllability |
| Example 307 | 1 | A | A | AA | A | 2 | A | A | A | A |
| Example 308 | 1 | A | A | AA | A | 2 | A | A | A | A |
| Example 309 | 1 | A | A | AA | A | 2 | A | A | A | A |
| Example 310 | 1 | A | A | AA | A | 2 | A | A | A | A |
| Example 311 | 1 | A | A | AA | A | 2 | A | A | A | A |
| Example 312 | 1 | A | A | AA | A | 2 | A | A | A | A |
| Example 313 | 1 | A | A | AA | A | 2 | A | A | A | A |
| Example 314 | 1 | A | A | AA | A | 2 | A | A | A | A |
| Example 315 | 1 | A | A | AA | A | 2 | A | A | A | A |

TABLE 102

| Table 1-8-11 | | Type of resist composition | | | | | Type of resist composition | | | |
|---|---|---|---|---|---|---|---|---|---|---|
| | | Affinity | | | Resist saving properties | | Affinity | | | Resist saving properties |
| | | Rsq1 | SRsq | Uniformity | Film thickness controllability | | Rsq1 | SRsq | Uniformity | Film thickness controllability |
| Example 276 | 3 | A | A | AA | A | 4 | A | A | AA | A |
| Example 277 | 3 | A | A | AA | A | 4 | A | A | AA | A |
| Example 278 | 3 | A | A | AA | A | 4 | A | A | AA | A |
| Example 279 | 3 | A | A | AA | A | 4 | A | A | AA | A |
| Example 280 | 3 | A | A | AA | A | 4 | A | A | AA | A |
| Example 281 | 3 | A | A | AA | A | 4 | A | A | AA | A |
| Example 282 | 3 | A | A | AA | A | 4 | A | A | AA | A |
| Example 283 | 3 | A | A | AA | A | 4 | A | A | AA | A |
| Example 284 | 3 | A | A | AA | A | 4 | A | A | AA | A |
| Example 285 | 3 | A | A | AA | A | 4 | A | A | AA | A |
| Example 286 | 3 | A | A | AA | A | 4 | A | A | AA | A |
| Example 287 | 3 | A | A | AA | A | 4 | A | A | AA | A |
| Example 288 | 3 | A | A | AA | A | 4 | A | A | AA | A |
| Example 289 | 3 | A | A | AA | A | 4 | A | A | AA | A |
| Example 290 | 3 | A | A | AA | A | 4 | A | A | AA | A |
| Example 291 | 3 | A | A | AA | A | 4 | A | A | AA | A |
| Example 292 | 3 | A | A | AA | A | 4 | A | A | AA | A |
| Example 293 | 3 | A | A | AA | A | 4 | A | A | AA | A |
| Example 294 | 3 | A | A | AA | A | 4 | A | A | AA | A |
| Example 295 | 3 | A | A | AA | A | 4 | A | A | AA | A |
| Example 296 | 3 | A | A | AA | A | 4 | A | A | AA | A |
| Example 297 | 3 | A | A | AA | A | 4 | A | A | AA | A |
| Example 298 | 3 | A | A | AA | A | 4 | A | A | AA | A |
| Example 299 | 3 | A | A | AA | A | 4 | A | A | AA | A |
| Example 300 | 3 | A | A | AA | A | 4 | A | A | AA | A |
| Example 301 | 3 | A | A | AA | A | 4 | A | A | AA | A |
| Example 302 | 3 | A | A | AA | A | 4 | A | A | AA | A |
| Example 303 | 3 | A | A | AA | A | 4 | A | A | AA | A |
| Example 304 | 3 | A | A | AA | A | 4 | A | A | AA | A |
| Example 305 | 3 | A | A | AA | A | 4 | A | A | AA | A |
| Example 306 | 3 | A | A | AA | A | 4 | A | A | AA | A |
| Example 307 | 3 | A | A | AA | A | 4 | A | A | AA | A |
| Example 308 | 3 | A | A | AA | A | 4 | A | A | AA | A |
| Example 309 | 3 | A | A | AA | A | 4 | A | A | AA | A |
| Example 310 | 3 | A | A | AA | A | 4 | A | A | AA | A |
| Example 311 | 3 | A | A | AA | A | 4 | A | A | AA | A |
| Example 312 | 3 | A | A | AA | A | 4 | A | A | AA | A |
| Example 313 | 3 | A | A | AA | A | 4 | A | A | AA | A |
| Example 314 | 3 | A | A | AA | A | 4 | A | A | AA | A |
| Example 315 | 3 | A | A | AA | A | 4 | A | A | AA | A |

TABLE 103

| Table 1-8-12 | Evaluation Type of resist composition | | | | | | | | |
|---|---|---|---|---|---|---|---|---|---|
| | Resist saving properties | | | | Resist saving properties | | | | |
| | Affinity | | | Film thickness | Affinity | | | Film thickness |
| | Rsq1 | SRsq | Uniformity | controllability | Rsq1 | SRsq | Uniformity | controllability |
| Example 276 | 5 | A | A | AA | A | 6 | A | A | AA | A |
| Example 277 | 5 | A | A | AA | A | 6 | A | A | AA | A |
| Example 278 | 5 | A | A | AA | A | 6 | A | A | AA | A |
| Example 279 | 5 | A | A | AA | A | 6 | A | A | AA | A |
| Example 280 | 5 | A | A | AA | A | 6 | A | A | AA | A |
| Example 281 | 5 | A | A | AA | A | 6 | A | A | AA | A |
| Example 282 | 5 | A | A | AA | A | 6 | A | A | AA | A |
| Example 283 | 5 | A | A | AA | A | 6 | A | A | AA | A |
| Example 284 | 5 | A | A | AA | A | 6 | A | A | AA | A |
| Example 285 | 5 | A | A | AA | A | 6 | A | A | AA | A |
| Example 286 | 5 | A | A | AA | A | 6 | A | A | AA | A |
| Example 287 | 5 | A | A | AA | A | 6 | A | A | AA | A |
| Example 288 | 5 | A | A | AA | A | 6 | A | A | AA | A |
| Example 289 | 5 | A | A | AA | A | 6 | A | A | AA | A |
| Example 290 | 5 | A | A | AA | A | 6 | A | A | AA | A |
| Example 291 | 5 | A | A | AA | A | 6 | A | A | AA | A |
| Example 292 | 5 | A | A | AA | A | 6 | A | A | AA | A |
| Example 293 | 5 | A | A | AA | A | 6 | A | A | AA | A |
| Example 294 | 5 | A | A | AA | A | 6 | A | A | AA | A |
| Example 295 | 5 | A | A | AA | A | 6 | A | A | AA | A |
| Example 296 | 5 | A | A | AA | A | 6 | A | A | AA | A |
| Example 297 | 5 | A | A | AA | A | 6 | A | A | AA | A |
| Example 298 | 5 | A | A | AA | A | 6 | A | A | AA | A |
| Example 299 | 5 | A | A | AA | A | 6 | A | A | AA | A |
| Example 300 | 5 | A | A | AA | A | 6 | A | A | AA | A |
| Example 301 | 5 | A | A | AA | A | 6 | A | A | AA | A |
| Example 302 | 5 | A | A | AA | A | 6 | A | A | AA | A |
| Example 303 | 5 | A | A | AA | A | 6 | A | A | AA | A |
| Example 304 | 5 | A | A | AA | A | 6 | A | A | AA | A |
| Example 305 | 5 | A | A | AA | A | 6 | A | A | AA | A |
| Example 306 | 5 | A | A | AA | A | 6 | A | A | AA | A |
| Example 307 | 5 | A | A | AA | A | 6 | A | A | AA | A |
| Example 308 | 5 | A | A | AA | A | 6 | A | A | AA | A |
| Example 309 | 5 | A | A | AA | A | 6 | A | A | AA | A |
| Example 310 | 5 | A | A | AA | A | 6 | A | A | AA | A |
| Example 311 | 5 | A | A | AA | A | 6 | A | A | AA | A |
| Example 312 | 5 | A | A | AA | A | 6 | A | A | AA | A |
| Example 313 | 5 | A | A | AA | A | 6 | A | A | AA | A |
| Example 314 | 5 | A | A | AA | A | 6 | A | A | AA | A |
| Example 315 | 5 | A | A | AA | A | 6 | A | A | AA | A |

TABLE 104

| Table 1-8-13 | Evaluation Type of resist composition | | | | |
|---|---|---|---|---|---|
| | Resist saving properties | | | | |
| | Affinity | | | Film thickness |
| | Rsq1 | SRsq | Uniformity | controllability |
| Example 276 | 7 | A | A | AA | A |
| Example 277 | 7 | A | A | AA | A |
| Example 278 | 7 | A | A | AA | A |
| Example 279 | 7 | A | A | AA | A |
| Example 280 | 7 | A | A | AA | A |
| Example 281 | 7 | A | A | AA | A |
| Example 282 | 7 | A | A | AA | A |
| Example 283 | 7 | A | A | AA | A |
| Example 284 | 7 | A | A | AA | A |
| Example 285 | 7 | A | A | AA | A |
| Example 286 | 7 | A | A | AA | A |
| Example 287 | 7 | A | A | AA | A |
| Example 288 | 7 | A | A | AA | A |
| Example 289 | 7 | A | A | AA | A |
| Example 290 | 7 | A | A | AA | A |
| Example 291 | 7 | A | A | AA | A |
| Example 292 | 7 | A | A | AA | A |
| Example 293 | 7 | A | A | AA | A |
| Example 294 | 7 | A | A | AA | A |
| Example 295 | 7 | A | A | AA | A |
| Example 296 | 7 | A | A | AA | A |
| Example 297 | 7 | A | A | AA | A |
| Example 298 | 7 | A | A | AA | A |
| Example 299 | 7 | A | A | AA | A |

TABLE 104-continued

Evaluation
Type of resist composition

| Table 1-8-13 | | Affinity | | Resist saving properties | |
|---|---|---|---|---|---|
| | | Rsq1 | SRsq | Uniformity | Film thickness controllability |
| Example 300 | 7 | A | A | AA | A |
| Example 301 | 7 | A | A | AA | A |
| Example 302 | 7 | A | A | AA | A |
| Example 303 | 7 | A | A | AA | A |
| Example 304 | 7 | A | A | AA | A |
| Example 305 | 7 | A | A | AA | A |
| Example 306 | 7 | A | A | AA | A |
| Example 307 | 7 | A | A | AA | A |
| Example 308 | 7 | A | A | AA | A |
| Example 309 | 7 | A | A | AA | A |
| Example 310 | 7 | A | A | AA | A |
| Example 311 | 7 | A | A | AA | A |
| Example 312 | 7 | A | A | AA | A |
| Example 313 | 7 | A | A | AA | A |
| Example 314 | 7 | A | A | AA | A |
| Example 315 | 7 | A | A | AA | A |

TABLE 105

Components of chemical liquid for pre-wetting
Mixture of organic solvents
First organic solvent

| Table 1-9-1 | Type | Content (% by mass) | Molar mass (g/mol) | Vapor pressure (Pa) | Surface tension (mN/m) | $\delta h$ $(MPa)^{0.5}$ | $\delta d$ $(MPa)^{0.5}$ |
|---|---|---|---|---|---|---|---|
| Example 316 | | | | | | | |
| Example 317 | | | | | | | |
| Example 318 | | | | | | | |
| Example 319 | | | | | | | |
| Example 320 | | | | | | | |
| Example 321 | | | | | | | |
| Example 322 | | | | | | | |
| Example 323 | | | | | | | |
| Example 324 | | | | | | | |
| Example 325 | | | | | | | |
| Example 326 | | | | | | | |
| Example 327 | | | | | | | |
| Example 328 | | | | | | | |
| Example 329 | | | | | | | |
| Example 330 | | | | | | | |
| Example 331 | | | | | | | |
| Example 332 | | | | | | | |
| Example 336 | | | | | | | |
| Example 337 | | | | | | | |
| Example 338 | | | | | | | |
| Example 339 | | | | | | | |
| Example 340 | | | | | | | |
| Example 341 | | | | | | | |
| Example 342 | | | | | | | |
| Example 343 | | | | | | | |
| Example 344 | | | | | | | |
| Example 345 | | | | | | | |
| Example 346 | | | | | | | |
| Example 347 | | | | | | | |
| Example 348 | | | | | | | |
| Example 349 | | | | | | | |
| Example 350 | | | | | | | |
| Example 351 | | | | | | | |
| Example 352 | | | | | | | |
| Example 353 | | | | | | | |
| Example 354 | | | | | | | |
| Example 355 | | | | | | | |

TABLE 106

Components of chemical liquid for pre-wetting
Mixture of organic solvents
Second organic solvent

| Table 1-9-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 316 | PGMEA | 30 | 132.16 | 493 | 27.9 | 56.5 | 19.8 |
| Example 317 | PGMEA | 30 | 132.16 | 493 | 27.9 | 56.5 | 19.8 |
| Example 318 | PGMEA | 30 | 132.16 | 493 | 27.9 | 56.5 | 19.8 |
| Example 319 | PGMEA | 30 | 132.16 | 493 | 27.9 | 56.5 | 19.8 |
| Example 320 | PGMEA | 30 | 132.16 | 493 | 27.9 | 56.5 | 19.8 |
| Example 321 | PGMEA | 30 | 132.16 | 493 | 27.9 | 56.5 | 19.8 |
| Example 322 | PGMEA | 30 | 132.16 | 493 | 27.9 | 56.5 | 19.8 |
| Example 323 | PGMEA | 30 | 132.16 | 493 | 27.9 | 56.5 | 19.8 |
| Example 324 | PGMEA | 30 | 132.16 | 493 | 27.9 | 56.5 | 19.8 |
| Example 325 | PGMEA | 30 | 132.16 | 493 | 27.9 | 56.5 | 19.8 |
| Example 326 | PGMEA | 30 | 132.16 | 493 | 27.9 | 56.5 | 19.8 |
| Example 327 | PGMEA | 30 | 132.16 | 493 | 27.9 | 56.5 | 19.8 |
| Example 328 | PGMEA | 30 | 132.16 | 493 | 27.9 | 56.5 | 19.8 |
| Example 329 | PGMEA | 30 | 132.16 | 493 | 27.9 | 56.5 | 19.8 |
| Example 330 | PGMEA | 30 | 132.16 | 493 | 27.9 | 56.5 | 19.8 |
| Example 331 | PGMEA | 30 | 132.16 | 493 | 27.9 | 56.5 | 19.8 |
| Example 332 | PGMEA | 30 | 132.16 | 493 | 27.9 | 56.5 | 19.8 |
| Example 336 | PGMEA | 30 | 132.16 | 493 | 27.9 | 56.5 | 19.8 |
| Example 337 | PGMEA | 30 | 132.16 | 493 | 27.9 | 56.5 | 19.8 |
| Example 338 | PGMEA | 30 | 132.16 | 493 | 27.9 | 56.5 | 19.8 |
| Example 339 | PGMEA | 30 | 132.16 | 493 | 27.9 | 56.5 | 19.8 |
| Example 340 | PGMEA | 30 | 132.16 | 493 | 27.9 | 56.5 | 19.8 |
| Example 341 | PGMEA | 30 | 132.16 | 493 | 27.9 | 56.5 | 19.8 |
| Example 342 | PGMEA | 30 | 132.16 | 493 | 27.9 | 56.5 | 19.8 |
| Example 343 | PGMEA | 30 | 132.16 | 493 | 27.9 | 56.5 | 19.8 |
| Example 344 | PGMEA | 30 | 132.16 | 493 | 27.9 | 56.5 | 19.8 |
| Example 345 | PGMEA | 30 | 132.16 | 493 | 27.9 | 56.5 | 19.8 |
| Example 346 | PGMEA | 30 | 132.16 | 493 | 27.9 | 56.5 | 19.8 |
| Example 347 | PGMEA | 30 | 132.16 | 493 | 27.9 | 56.5 | 19.8 |
| Example 348 | PGMEA | 30 | 132.16 | 493 | 27.9 | 56.5 | 19.8 |
| Example 349 | PGMEA | 30 | 132.16 | 493 | 27.9 | 56.5 | 19.8 |
| Example 350 | PGMEA | 30 | 132.16 | 493 | 27.9 | 56.5 | 19.8 |
| Example 351 | PGMEA | 30 | 132.16 | 493 | 27.9 | 56.5 | 19.8 |
| Example 352 | PGMEA | 30 | 132.16 | 493 | 27.9 | 56.5 | 19.8 |
| Example 353 | PGMEA | 30 | 132.16 | 493 | 27.9 | 56.5 | 19.8 |
| Example 354 | PGMEA | 30 | 132.16 | 493 | 27.9 | 56.5 | 19.8 |
| Example 355 | PGMEA | 30 | 132.16 | 493 | 27.9 | 56.5 | 19.8 |

TABLE 107

Components of chemical liquid for pre-wetting
Mixture of organic solvents
Third organic solvent

| Table 1-9-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 316 | DMSO | 20 | 78.13 | 13 | 43.6 | 40.9 | 36.4 |
| Example 317 | DMSO | 20 | 78.13 | 13 | 43.6 | 40.9 | 36.4 |
| Example 318 | DMSO | 20 | 78.13 | 13 | 43.6 | 40.9 | 36.4 |
| Example 319 | DMSO | 20 | 78.13 | 13 | 43.6 | 40.9 | 36.4 |
| Example 320 | DMSO | 20 | 78.13 | 13 | 43.6 | 40.9 | 36.4 |
| Example 321 | DMSO | 20 | 78.13 | 13 | 43.6 | 40.9 | 36.4 |
| Example 322 | DMSO | 20 | 78.13 | 13 | 43.6 | 40.9 | 36.4 |
| Example 323 | DMSO | 20 | 78.13 | 13 | 43.6 | 40.9 | 36.4 |
| Example 324 | DMSO | 20 | 78.13 | 13 | 43.6 | 40.9 | 36.4 |
| Example 325 | DMSO | 20 | 78.13 | 13 | 43.6 | 40.9 | 36.4 |
| Example 326 | DMSO | 20 | 78.13 | 13 | 43.6 | 40.9 | 36.4 |
| Example 327 | DMSO | 20 | 78.13 | 13 | 43.6 | 40.9 | 36.4 |
| Example 328 | DMSO | 20 | 78.13 | 13 | 43.6 | 40.9 | 36.4 |
| Example 329 | DMSO | 20 | 78.13 | 13 | 43.6 | 40.9 | 36.4 |
| Example 330 | DMSO | 20 | 78.13 | 13 | 43.6 | 40.9 | 36.4 |
| Example 331 | DMSO | 20 | 78.13 | 13 | 43.6 | 40.9 | 36.4 |
| Example 332 | DMSO | 20 | 78.13 | 13 | 43.6 | 40.9 | 36.4 |
| Example 336 | EC | 60 | 88.06 | 67 | 41.5 | 42.0 | 47.0 |
| Example 337 | EC | 60 | 88.06 | 67 | 41.5 | 42.0 | 47.0 |
| Example 338 | EC | 60 | 88.06 | 67 | 41.5 | 42.0 | 47.0 |

TABLE 107-continued

Components of chemical liquid for pre-wetting
Mixture of organic solvents
Third organic solvent

| Table 1-9-3 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 339 | EC | 60 | 88.06 | 67 | 41.5 | 42.0 | 47.0 |
| Example 340 | EC | 60 | 88.06 | 67 | 41.5 | 42.0 | 47.0 |
| Example 341 | EC | 60 | 88.06 | 67 | 41.5 | 42.0 | 47.0 |
| Example 342 | EC | 60 | 88.06 | 67 | 41.5 | 42.0 | 47.0 |
| Example 343 | EC | 60 | 88.06 | 67 | 41.5 | 42.0 | 47.0 |
| Example 344 | EC | 60 | 88.06 | 67 | 41.5 | 42.0 | 47.0 |
| Example 345 | EC | 60 | 88.06 | 67 | 41.5 | 42.0 | 47.0 |
| Example 346 | EC | 60 | 88.06 | 67 | 41.5 | 42.0 | 47.0 |
| Example 347 | EC | 60 | 88.06 | 67 | 41.5 | 42.0 | 47.0 |
| Example 348 | EC | 60 | 88.06 | 67 | 41.5 | 42.0 | 47.0 |
| Example 349 | EC | 60 | 88.06 | 67 | 41.5 | 42.0 | 47.0 |
| Example 350 | PC | 60 | 102.09 | 53 | 40.9 | 47.5 | 42.8 |
| Example 351 | PC | 60 | 102.09 | 53 | 40.9 | 47.5 | 42.8 |
| Example 352 | PC | 60 | 102.09 | 53 | 40.9 | 47.5 | 42.8 |
| Example 353 | PC | 60 | 102.09 | 53 | 40.9 | 47.5 | 42.8 |
| Example 354 | PC | 60 | 102.09 | 53 | 40.9 | 47.5 | 42.8 |
| Example 355 | PC | 60 | 102.09 | 53 | 40.9 | 47.5 | 42.8 |

TABLE 108

Components of chemical liquid for pre-wetting
Mixture of organic solvents
Fourth organic solvent

| Table 1-9-4 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 316 | DEGME | 50 | 120.15 | 13 | 28.0 | 44.3 | 20.8 |
| Example 317 | DME | 50 | 90.12 | 693 | 29.0 | 55.9 | 22.8 |
| Example 318 | DEE | 50 | 118.18 | 627 | 29.0 | 62.2 | 19.9 |
| Example 319 | DEGIBE | 50 | 162.23 | 133 | 29.0 | 61.9 | 18.7 |
| Example 320 | DEGDME | 50 | 134.18 | 520 | 28.0 | 56.9 | 21.0 |
| Example 321 | DEGDEE | 50 | 162.23 | 253 | 29.0 | 60.4 | 19.6 |
| Example 322 | TriEGDME | 50 | 178.23 | 13 | 28.0 | 56.4 | 20.9 |
| Example 323 | TetraEGDME | 50 | 222.28 | 13 | 27.0 | 55.6 | 21.1 |
| Example 324 | TEGMBE | 50 | 220.31 | 13 | 28.0 | 48.5 | 18.7 |
| Example 325 | DEGMBE | 50 | 162.23 | 117 | 29.0 | 59.4 | 18.1 |
| Example 326 | Anisole | 50 | 108.14 | 63 | 30.0 | 64.3 | 17.0 |
| Example 327 | 14-DMB | 50 | 138.17 | 1 | 30.0 | 59.0 | 20.6 |
| Example 328 | 12-DMB | 50 | 138.17 | 1 | 30.0 | 60.6 | 20.2 |
| Example 329 | 13-DMB | 50 | 138.17 | 1 | 30.0 | 61.6 | 19.9 |
| Example 330 | 14-Diphenoxybenzene | 50 | 262.31 | 1 | 33.0 | 63.3 | 18.5 |
| Example 331 | 4-Methoxytoluene | 50 | 122.17 | 1 | 32.0 | 64.8 | 17.4 |
| Example 332 | Phenetole | 50 | 122.17 | 1 | 31.0 | 66.3 | 16.3 |
| Example 336 | DEGIBE | 10 | 162.23 | 133 | 29.0 | 61.9 | 18.7 |
| Example 337 | DEGDME | 10 | 134.18 | 520 | 28.0 | 56.9 | 21.0 |
| Example 338 | DEGDEE | 10 | 162.23 | 253 | 29.0 | 60.4 | 19.6 |
| Example 339 | TriEGDME | 10 | 178.23 | 13 | 28.0 | 56.4 | 20.9 |
| Example 340 | TetraEGDME | 10 | 222.28 | 13 | 27.0 | 55.6 | 21.1 |
| Example 341 | TEGMBE | 10 | 220.31 | 13 | 28.0 | 48.5 | 18.7 |
| Example 342 | DEGMBE | 10 | 162.23 | 117 | 29.0 | 59.4 | 18.1 |
| Example 343 | Anisole | 10 | 108.14 | 63 | 30.0 | 64.3 | 17.0 |
| Example 344 | 14-DMB | 10 | 138.17 | 1 | 30.0 | 59.0 | 20.6 |
| Example 345 | 12-DMB | 10 | 138.17 | 1 | 30.0 | 60.6 | 20.2 |
| Example 346 | 13-DMB | 10 | 138.17 | 1 | 30.0 | 61.6 | 19.9 |
| Example 347 | 14-Diphenoxybenzene | 10 | 262.31 | 1 | 33.0 | 63.3 | 18.5 |
| Example 348 | 4-Methoxytoluene | 10 | 122.17 | 1 | 32.0 | 64.8 | 17.4 |
| Example 349 | Phenetole | 10 | 122.17 | 1 | 31.0 | 66.3 | 16.3 |
| Example 350 | DEGME | 10 | 120.15 | 13 | 28.0 | 44.3 | 20.8 |
| Example 351 | DME | 10 | 90.12 | 693 | 29.0 | 55.9 | 22.8 |
| Example 352 | DEE | 10 | 118.18 | 627 | 29.0 | 62.2 | 19.9 |
| Example 353 | DEGIBE | 10 | 162.23 | 133 | 29.0 | 61.9 | 18.7 |
| Example 354 | DEGDME | 10 | 134.18 | 520 | 28.0 | 56.9 | 21.0 |
| Example 355 | DEGDEE | 10 | 162.23 | 253 | 29.0 | 60.4 | 19.6 |

TABLE 109

Components of chemical liquid for pre-wetting
Mixture of organic solvents
Fourth organic solvent

| Table 1-9-5 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 316 | | | | | | | |
| Example 317 | | | | | | | |
| Example 318 | | | | | | | |
| Example 319 | | | | | | | |
| Example 320 | | | | | | | |
| Example 321 | | | | | | | |
| Example 322 | | | | | | | |
| Example 323 | | | | | | | |
| Example 324 | | | | | | | |
| Example 325 | | | | | | | |
| Example 326 | | | | | | | |
| Example 327 | | | | | | | |
| Example 328 | | | | | | | |
| Example 329 | | | | | | | |
| Example 330 | | | | | | | |
| Example 331 | | | | | | | |
| Example 332 | | | | | | | |
| Example 336 | | | | | | | |
| Example 337 | | | | | | | |
| Example 338 | | | | | | | |
| Example 339 | | | | | | | |
| Example 340 | | | | | | | |
| Example 341 | | | | | | | |
| Example 342 | | | | | | | |
| Example 343 | | | | | | | |
| Example 344 | | | | | | | |
| Example 345 | | | | | | | |
| Example 346 | | | | | | | |
| Example 347 | | | | | | | |
| Example 348 | | | | | | | |
| Example 349 | | | | | | | |
| Example 350 | | | | | | | |
| Example 351 | | | | | | | |
| Example 352 | | | | | | | |
| Example 353 | | | | | | | |
| Example 354 | | | | | | | |
| Example 355 | | | | | | | |

40

TABLE 110

Components of chemical liquid for pre-wetting
Mixture of organic solvents

Fifth organic solvent

| Table 1-9-6 | Type | Content (% by mass) | Molar mass (g/mol) | Vapor pressure (Pa) | Surface tension (mN/m) | δh (MPa)$^{0.5}$ | δd (MPa)$^{0.5}$ | Vapor pressure (Pa) | Surface tension (mN/m) |
|---|---|---|---|---|---|---|---|---|---|
| Example 316 | | | | | | | | 135 | 32.4 |
| Example 317 | | | | | | | | 482 | 32.4 |
| Example 318 | | | | | | | | 420 | 32.8 |
| Example 319 | | | | | | | | 198 | 33.4 |
| Example 320 | | | | | | | | 361 | 32.6 |
| Example 321 | | | | | | | | 245 | 33.4 |
| Example 322 | | | | | | | | 156 | 33.2 |
| Example 323 | | | | | | | | 167 | 33.3 |
| Example 324 | | | | | | | | 167 | 33.6 |
| Example 325 | | | | | | | | 192 | 33.4 |
| Example 326 | | | | | | | | 153 | 33.2 |
| Example 327 | | | | | | | | 137 | 33.6 |

TABLE 110-continued

Components of chemical liquid for pre-wetting
Mixture of organic solvents

Fifth organic solvent

| Table 1-9-6 | Type | Content (% by mass) | Molar mass (g/mol) | Vapor pressure (Pa) | Surface tension (mN/m) | δh $(MPa)^{0.5}$ | δd $(MPa)^{0.5}$ | Vapor pressure (Pa) | Surface tension (mN/m) |
|---|---|---|---|---|---|---|---|---|---|
| Example 328 | | | | | | | | 137 | 33.6 |
| Example 329 | | | | | | | | 137 | 33.6 |
| Example 330 | | | | | | | | 172 | 35.3 |
| Example 331 | | | | | | | | 130 | 34.3 |
| Example 332 | | | | | | | | 130 | 33.8 |
| Example 336 | | | | | | | | 171 | 37.5 |
| Example 337 | | | | | | | | 200 | 37.3 |
| Example 338 | | | | | | | | 178 | 37.5 |
| Example 339 | | | | | | | | 164 | 37.5 |
| Example 340 | | | | | | | | 166 | 37.6 |
| Example 341 | | | | | | | | 166 | 37.6 |
| Example 342 | | | | | | | | 170 | 37.5 |
| Example 343 | | | | | | | | 163 | 37.4 |
| Example 344 | | | | | | | | 161 | 37.5 |
| Example 345 | | | | | | | | 161 | 37.5 |
| Example 346 | | | | | | | | 161 | 37.5 |
| Example 347 | | | | | | | | 166 | 37.9 |
| Example 348 | | | | | | | | 159 | 37.6 |
| Example 349 | | | | | | | | 159 | 37.5 |
| Example 350 | | | | | | | | 161 | 36.4 |
| Example 351 | | | | | | | | 238 | 36.3 |
| Example 352 | | | | | | | | 218 | 36.5 |
| Example 353 | | | | | | | | 173 | 36.7 |
| Example 354 | | | | | | | | 205 | 36.5 |
| Example 355 | | | | | | | | 181 | 36.7 |

TABLE 111

Components of chemical liquid for pre-wetting

| Table 1-9-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 316 | Balance | 0.002 | 0.006 | 0.002 | 0.030 | 0.030 | 0.070 |
| Example 317 | Balance | 0.002 | 0.006 | 0.002 | 0.030 | 0.030 | 0.070 |
| Example 318 | Balance | 0.002 | 0.006 | 0.002 | 0.030 | 0.030 | 0.070 |
| Example 319 | Balance | 0.002 | 0.006 | 0.002 | 0.030 | 0.030 | 0.070 |
| Example 320 | Balance | 0.002 | 0.006 | 0.002 | 0.030 | 0.030 | 0.070 |
| Example 321 | Balance | 0.002 | 0.006 | 0.002 | 0.030 | 0.030 | 0.070 |
| Example 322 | Balance | 0.002 | 0.006 | 0.002 | 0.030 | 0.030 | 0.070 |
| Example 323 | Balance | 0.002 | 0.006 | 0.002 | 0.030 | 0.030 | 0.070 |
| Example 324 | Balance | 0.002 | 0.006 | 0.002 | 0.030 | 0.030 | 0.070 |
| Example 325 | Balance | 0.002 | 0.006 | 0.002 | 0.030 | 0.030 | 0.070 |
| Example 326 | Balance | 0.002 | 0.006 | 0.002 | 0.030 | 0.030 | 0.070 |
| Example 327 | Balance | 0.002 | 0.006 | 0.002 | 0.030 | 0.030 | 0.070 |
| Example 328 | Balance | 0.002 | 0.006 | 0.002 | 0.030 | 0.030 | 0.070 |
| Example 329 | Balance | 0.002 | 0.006 | 0.002 | 0.030 | 0.030 | 0.070 |
| Example 330 | Balance | 0.002 | 0.006 | 0.002 | 0.030 | 0.030 | 0.070 |
| Example 331 | Balance | 0.002 | 0.006 | 0.002 | 0.030 | 0.030 | 0.070 |
| Example 332 | Balance | 0.002 | 0.006 | 0.002 | 0.030 | 0.030 | 0.070 |
| Example 336 | Balance | 0.002 | 0.006 | 0.002 | 0.030 | 0.030 | 0.070 |
| Example 337 | Balance | 0.002 | 0.006 | 0.002 | 0.030 | 0.030 | 0.070 |
| Example 338 | Balance | 0.002 | 0.006 | 0.002 | 0.030 | 0.030 | 0.070 |
| Example 339 | Balance | 0.002 | 0.006 | 0.002 | 0.030 | 0.030 | 0.070 |
| Example 340 | Balance | 0.002 | 0.006 | 0.002 | 0.030 | 0.030 | 0.070 |
| Example 341 | Balance | 0.002 | 0.006 | 0.002 | 0.030 | 0.030 | 0.070 |
| Example 342 | Balance | 0.002 | 0.006 | 0.002 | 0.030 | 0.030 | 0.070 |
| Example 343 | Balance | 0.002 | 0.006 | 0.002 | 0.030 | 0.030 | 0.070 |
| Example 344 | Balance | 0.002 | 0.006 | 0.002 | 0.030 | 0.030 | 0.070 |
| Example 345 | Balance | 0.002 | 0.006 | 0.002 | 0.030 | 0.030 | 0.070 |
| Example 346 | Balance | 0.002 | 0.006 | 0.002 | 0.030 | 0.030 | 0.070 |
| Example 347 | Balance | 0.002 | 0.006 | 0.002 | 0.030 | 0.030 | 0.070 |
| Example 348 | Balance | 0.002 | 0.006 | 0.002 | 0.030 | 0.030 | 0.070 |
| Example 349 | Balance | 0.002 | 0.006 | 0.002 | 0.030 | 0.030 | 0.070 |
| Example 350 | Balance | 0.002 | 0.006 | 0.002 | 0.030 | 0.030 | 0.070 |
| Example 351 | Balance | 0.002 | 0.006 | 0.002 | 0.030 | 0.030 | 0.070 |
| Example 352 | Balance | 0.002 | 0.006 | 0.002 | 0.030 | 0.030 | 0.070 |
| Example 353 | Balance | 0.002 | 0.006 | 0.002 | 0.030 | 0.030 | 0.070 |
| Example 354 | Balance | 0.002 | 0.006 | 0.002 | 0.030 | 0.030 | 0.070 |
| Example 355 | Balance | 0.002 | 0.006 | 0.002 | 0.030 | 0.030 | 0.070 |

TABLE 112

Components of chemical liquid for pre-wetting

| Table 1-9-8 | Impurity metal Content of impurity metal as particles (mass ppt) | | | | | | Organic impurity Specific organic compound | |
|---|---|---|---|---|---|---|---|---|
| | | | | | | | Boiling point: equal to or higher than 250° C. Number of carbon atoms: equal to or greater than 8 | Boiling point: equal to or higher than 250° C. Number of carbon atoms: equal to or greater than 12 |
| | Fe | Cr | Ni | Pb | Others | Total | | |
| Example 316 | 0.040 | 0.002 | 0.001 | 0.003 | 0.019 | 0.065 | A | A |
| Example 317 | 0.040 | 0.002 | 0.001 | 0.003 | 0.019 | 0.065 | A | A |
| Example 318 | 0.040 | 0.002 | 0.001 | 0.003 | 0.019 | 0.065 | A | A |
| Example 319 | 0.040 | 0.002 | 0.001 | 0.003 | 0.019 | 0.065 | A | A |
| Example 320 | 0.040 | 0.002 | 0.001 | 0.003 | 0.019 | 0.065 | A | A |
| Example 321 | 0.040 | 0.002 | 0.001 | 0.003 | 0.019 | 0.065 | A | A |
| Example 322 | 0.040 | 0.002 | 0.001 | 0.003 | 0.019 | 0.065 | A | A |
| Example 323 | 0.040 | 0.002 | 0.001 | 0.003 | 0.019 | 0.065 | A | A |
| Example 324 | 0.040 | 0.002 | 0.001 | 0.003 | 0.019 | 0.065 | A | A |
| Example 325 | 0.040 | 0.002 | 0.001 | 0.003 | 0.019 | 0.065 | A | A |
| Example 326 | 0.040 | 0.002 | 0.001 | 0.003 | 0.019 | 0.065 | A | A |
| Example 327 | 0.040 | 0.002 | 0.001 | 0.003 | 0.019 | 0.065 | A | A |
| Example 328 | 0.040 | 0.002 | 0.001 | 0.003 | 0.019 | 0.065 | A | A |
| Example 329 | 0.040 | 0.002 | 0.001 | 0.003 | 0.019 | 0.065 | A | A |
| Example 330 | 0.040 | 0.002 | 0.001 | 0.003 | 0.019 | 0.065 | A | A |
| Example 331 | 0.040 | 0.002 | 0.001 | 0.003 | 0.019 | 0.065 | A | A |
| Example 332 | 0.040 | 0.002 | 0.001 | 0.003 | 0.019 | 0.065 | A | A |
| Example 336 | 0.040 | 0.002 | 0.001 | 0.003 | 0.019 | 0.065 | A | A |
| Example 337 | 0.040 | 0.002 | 0.001 | 0.003 | 0.019 | 0.065 | A | A |
| Example 338 | 0.040 | 0.002 | 0.001 | 0.003 | 0.019 | 0.065 | A | A |
| Example 339 | 0.040 | 0.002 | 0.001 | 0.003 | 0.019 | 0.065 | A | A |
| Example 340 | 0.040 | 0.002 | 0.001 | 0.003 | 0.019 | 0.065 | A | A |
| Example 341 | 0.040 | 0.002 | 0.001 | 0.003 | 0.019 | 0.065 | A | A |
| Example 342 | 0.040 | 0.002 | 0.001 | 0.003 | 0.019 | 0.065 | A | A |
| Example 343 | 0.040 | 0.002 | 0.001 | 0.003 | 0.019 | 0.065 | A | A |
| Example 344 | 0.040 | 0.002 | 0.001 | 0.003 | 0.019 | 0.065 | A | A |
| Example 345 | 0.040 | 0.002 | 0.001 | 0.003 | 0.019 | 0.065 | A | A |
| Example 346 | 0.040 | 0.002 | 0.001 | 0.003 | 0.019 | 0.065 | A | A |
| Example 347 | 0.040 | 0.002 | 0.001 | 0.003 | 0.019 | 0.065 | A | A |
| Example 348 | 0.040 | 0.002 | 0.001 | 0.003 | 0.019 | 0.065 | A | A |
| Example 349 | 0.040 | 0.002 | 0.001 | 0.003 | 0.019 | 0.065 | A | A |
| Example 350 | 0.040 | 0.002 | 0.001 | 0.003 | 0.019 | 0.065 | A | A |
| Example 351 | 0.040 | 0.002 | 0.001 | 0.003 | 0.019 | 0.065 | A | A |
| Example 352 | 0.040 | 0.002 | 0.001 | 0.003 | 0.019 | 0.065 | A | A |
| Example 353 | 0.040 | 0.002 | 0.001 | 0.003 | 0.019 | 0.065 | A | A |
| Example 354 | 0.040 | 0.002 | 0.001 | 0.003 | 0.019 | 0.065 | A | A |
| Example 355 | 0.040 | 0.002 | 0.001 | 0.003 | 0.019 | 0.065 | A | A |

TABLE 113

| Table 1-9-9 | Components of chemical liquid for pre-wetting | | | | | Physical properties of chemical liquid for pre-wetting | |
|---|---|---|---|---|---|---|---|
| | Organic impurity Content of organic impurity | | | | | Number of coarse particles (Number of objects to be counted) (Number/mL) | Evaluation Defect inhibition performance |
| | Total (mass ppm) | Content of high-boiling-point component (mass ppm) | Content of ultrahigh-boiling-point component (mass ppm) | Content of Compound having CLogP value higher than 6.5 (mass ppt) | Water Content (% by mass) | | |
| Example 316 | 2,500 | 1 | 0.5 | 500 | 0.10% | 6 | AA |
| Example 317 | 2,500 | 1 | 0.5 | 500 | 0.10% | 6 | AA |
| Example 318 | 2,500 | 1 | 0.5 | 500 | 0.10% | 6 | AA |
| Example 319 | 2,500 | 1 | 0.5 | 500 | 0.10% | 6 | AA |
| Example 320 | 2,500 | 1 | 0.5 | 500 | 0.10% | 6 | AA |
| Example 321 | 2,500 | 1 | 0.5 | 500 | 0.10% | 6 | AA |
| Example 322 | 2,500 | 1 | 0.5 | 500 | 0.10% | 6 | AA |
| Example 323 | 2,500 | 1 | 0.5 | 500 | 0.10% | 6 | AA |
| Example 324 | 2,500 | 1 | 0.5 | 500 | 0.10% | 6 | AA |

TABLE 113-continued

| Table 1-9-9 | Components of chemical liquid for pre-wetting | | | | | Physical properties of chemical liquid for pre-wetting | |
|---|---|---|---|---|---|---|---|
| | Organic impurity Content of organic impurity | | | | | Number of coarse particles | |
| | Total (mass ppm) | Content of high-boiling-point component (mass ppm) | Content of ultrahigh-boiling-point component (mass ppm) | Content of Compound having CLogP value higher than 6.5 (mass ppt) | Water Content (% by mass) | (Number of objects to be counted) (Number/mL) | Evaluation Defect inhibition performance |
| Example 325 | 2,500 | 1 | 0.5 | 500 | 0.10% | 6 | AA |
| Example 326 | 2,500 | 1 | 0.5 | 500 | 0.10% | 6 | AA |
| Example 327 | 2,500 | 1 | 0.5 | 500 | 0.10% | 6 | AA |
| Example 328 | 2,500 | 1 | 0.5 | 500 | 0.10% | 6 | AA |
| Example 329 | 2,500 | 1 | 0.5 | 500 | 0.10% | 6 | AA |
| Example 330 | 2,500 | 1 | 0.5 | 500 | 0.10% | 6 | AA |
| Example 331 | 2,500 | 1 | 0.5 | 500 | 0.10% | 6 | AA |
| Example 332 | 2,500 | 1 | 0.5 | 500 | 0.10% | 6 | AA |
| Example 336 | 2,500 | 1 | 0.5 | 500 | 0.10% | 6 | AA |
| Example 337 | 2,500 | 1 | 0.5 | 500 | 0.10% | 6 | AA |
| Example 338 | 2,500 | 1 | 0.5 | 500 | 0.10% | 6 | AA |
| Example 339 | 2,500 | 1 | 0.5 | 500 | 0.10% | 6 | AA |
| Example 340 | 2,500 | 1 | 0.5 | 500 | 0.10% | 6 | AA |
| Example 341 | 2,500 | 1 | 0.5 | 500 | 0.10% | 6 | AA |
| Example 342 | 2,500 | 1 | 0.5 | 500 | 0.10% | 6 | AA |
| Example 343 | 2,500 | 1 | 0.5 | 500 | 0.10% | 6 | AA |
| Example 344 | 2,500 | 1 | 0.5 | 500 | 0.10% | 6 | AA |
| Example 345 | 2,500 | 1 | 0.5 | 500 | 0.10% | 6 | AA |
| Example 346 | 2,500 | 1 | 0.5 | 500 | 0.10% | 6 | AA |
| Example 347 | 2,500 | 1 | 0.5 | 500 | 0.10% | 6 | AA |
| Example 348 | 2,500 | 1 | 0.5 | 500 | 0.10% | 6 | AA |
| Example 349 | 2,500 | 1 | 0.5 | 500 | 0.10% | 6 | AA |
| Example 350 | 2,500 | 1 | 0.5 | 500 | 0.10% | 6 | AA |
| Example 351 | 2,500 | 1 | 0.5 | 500 | 0.10% | 6 | AA |
| Example 352 | 2,500 | 1 | 0.5 | 500 | 0.10% | 6 | AA |
| Example 353 | 2,500 | 1 | 0.5 | 500 | 0.10% | 6 | AA |
| Example 354 | 2,500 | 1 | 0.5 | 500 | 0.10% | 6 | AA |
| Example 355 | 2,500 | 1 | 0.5 | 500 | 0.10% | 6 | AA |

TABLE 114

| Table 1-9-10 | Evaluation | | | | | | | | |
|---|---|---|---|---|---|---|---|---|---|
| | Type of resist composition | | | | Type of resist composition | | | | |
| | | Resist saving properties | | | | Resist saving properties | | | |
| | | Affinity | | Uniformity | Film thickness controllability | | Affinity | | Uniformity | Film thickness controllability |
| | | Rsq1 | SRsq | | | | Rsq1 | SRsq | | |
| Example 316 | 1 | A | A | AA | A | 2 | A | A | A | A |
| Example 317 | 1 | A | A | AA | A | 2 | A | A | A | A |
| Example 318 | 1 | A | A | AA | A | 2 | A | A | A | A |
| Example 319 | 1 | A | A | AA | A | 2 | A | A | A | A |
| Example 320 | 1 | A | A | AA | A | 2 | A | A | A | A |
| Example 321 | 1 | A | A | AA | A | 2 | A | A | A | A |
| Example 322 | 1 | A | A | AA | A | 2 | A | A | A | A |
| Example 323 | 1 | A | A | AA | A | 2 | A | A | A | A |
| Example 324 | 1 | A | A | AA | A | 2 | A | A | A | A |
| Example 325 | 1 | A | A | AA | A | 2 | A | A | A | A |
| Example 326 | 1 | A | A | AA | A | 2 | A | A | A | A |
| Example 327 | 1 | A | A | AA | A | 2 | A | A | A | A |
| Example 328 | 1 | A | A | AA | A | 2 | A | A | A | A |
| Example 329 | 1 | A | A | AA | A | 2 | A | A | A | A |
| Example 330 | 1 | A | A | AA | A | 2 | A | A | A | A |
| Example 331 | 1 | A | A | AA | A | 2 | A | A | A | A |
| Example 332 | 1 | A | A | AA | A | 2 | A | A | A | A |
| Example 336 | 1 | A | A | AA | A | 2 | A | A | A | A |
| Example 337 | 1 | A | A | AA | A | 2 | A | A | A | A |
| Example 338 | 1 | A | A | AA | A | 2 | A | A | A | A |

TABLE 114-continued

| Table 1-9-10 | | Type of resist composition | | | | | Type of resist composition | | | |
|---|---|---|---|---|---|---|---|---|---|---|
| | | Evaluation | | | | | | | | |
| | | | | Resist saving properties | | | | | Resist saving properties | |
| | | Affinity | | | Film thickness | | Affinity | | | Film thickness |
| | | Rsq1 | SRsq | Uniformity | controllability | | Rsq1 | SRsq | Uniformity | controllability |
| Example 339 | 1 | A | A | AA | A | 2 | A | A | A | A |
| Example 340 | 1 | A | A | AA | A | 2 | A | A | A | A |
| Example 341 | 1 | A | A | AA | A | 2 | A | A | A | A |
| Example 342 | 1 | A | A | AA | A | 2 | A | A | A | A |
| Example 343 | 1 | A | A | AA | A | 2 | A | A | A | A |
| Example 344 | 1 | A | A | AA | A | 2 | A | A | A | A |
| Example 345 | 1 | A | A | AA | A | 2 | A | A | A | A |
| Example 346 | 1 | A | A | AA | A | 2 | A | A | A | A |
| Example 347 | 1 | A | A | AA | A | 2 | A | A | A | A |
| Example 348 | 1 | A | A | AA | A | 2 | A | A | A | A |
| Example 349 | 1 | A | A | AA | A | 2 | A | A | A | A |
| Example 350 | 1 | A | A | AA | A | 2 | A | A | A | A |
| Example 351 | 1 | A | A | AA | A | 2 | A | A | A | A |
| Example 352 | 1 | A | A | AA | A | 2 | A | A | A | A |
| Example 353 | 1 | A | A | AA | A | 2 | A | A | A | A |
| Example 354 | 1 | A | A | AA | A | 2 | A | A | A | A |
| Example 355 | 1 | A | A | AA | A | 2 | A | A | A | A |

TABLE 115

| Table 1-9-11 | | Type of resist composition | | | | | Type of resist composition | | | |
|---|---|---|---|---|---|---|---|---|---|---|
| | | Evaluation | | | | | | | | |
| | | | | Resist saving properties | | | | | Resist saving properties | |
| | | Affinity | | | Film thickness | | Affinity | | | Film thickness |
| | | Rsq1 | SRsq | Uniformity | controllability | | Rsq1 | SRsq | Uniformity | controllability |
| Example 316 | 3 | A | A | AA | A | 4 | A | A | AA | A |
| Example 317 | 3 | A | A | AA | A | 4 | A | A | AA | A |
| Example 318 | 3 | A | A | AA | A | 4 | A | A | AA | A |
| Example 319 | 3 | A | A | AA | A | 4 | A | A | AA | A |
| Example 320 | 3 | A | A | AA | A | 4 | A | A | AA | A |
| Example 321 | 3 | A | A | AA | A | 4 | A | A | AA | A |
| Example 322 | 3 | A | A | AA | A | 4 | A | A | AA | A |
| Example 323 | 3 | A | A | AA | A | 4 | A | A | AA | A |
| Example 324 | 3 | A | A | AA | A | 4 | A | A | AA | A |
| Example 325 | 3 | A | A | AA | A | 4 | A | A | AA | A |
| Example 326 | 3 | A | A | AA | A | 4 | A | A | AA | A |
| Example 327 | 3 | A | A | AA | A | 4 | A | A | AA | A |
| Example 328 | 3 | A | A | AA | A | 4 | A | A | AA | A |
| Example 329 | 3 | A | A | AA | A | 4 | A | A | AA | A |
| Example 330 | 3 | A | A | AA | A | 4 | A | A | AA | A |
| Example 331 | 3 | A | A | AA | A | 4 | A | A | AA | A |
| Example 332 | 3 | A | A | AA | A | 4 | A | A | AA | A |
| Example 336 | 3 | A | A | AA | A | 4 | A | A | AA | A |
| Example 337 | 3 | A | A | AA | A | 4 | A | A | AA | A |
| Example 338 | 3 | A | A | AA | A | 4 | A | A | AA | A |
| Example 339 | 3 | A | A | AA | A | 4 | A | A | AA | A |
| Example 340 | 3 | A | A | AA | A | 4 | A | A | AA | A |
| Example 341 | 3 | A | A | AA | A | 4 | A | A | AA | A |
| Example 342 | 3 | A | A | AA | A | 4 | A | A | AA | A |
| Example 343 | 3 | A | A | AA | A | 4 | A | A | AA | A |
| Example 344 | 3 | A | A | AA | A | 4 | A | A | AA | A |
| Example 345 | 3 | A | A | AA | A | 4 | A | A | AA | A |
| Example 346 | 3 | A | A | AA | A | 4 | A | A | AA | A |
| Example 347 | 3 | A | A | AA | A | 4 | A | A | AA | A |
| Example 348 | 3 | A | A | AA | A | 4 | A | A | AA | A |
| Example 349 | 3 | A | A | AA | A | 4 | A | A | AA | A |
| Example 350 | 3 | A | A | AA | A | 4 | A | A | AA | A |
| Example 351 | 3 | A | A | AA | A | 4 | A | A | AA | A |
| Example 352 | 3 | A | A | AA | A | 4 | A | A | AA | A |

TABLE 115-continued

| Table 1-9-11 | Evaluation | | | | | | | | | |
|---|---|---|---|---|---|---|---|---|---|---|
| | Type of resist composition | | | | | Type of resist composition | | | | |
| | | | | Resist saving properties | | | | | Resist saving properties | |
| | Affinity | | | Film thickness | | Affinity | | | Film thickness | |
| | Rsq1 | SRsq | Uniformity | controllability | | Rsq1 | SRsq | Uniformity | controllability | |
| Example 353 | 3 | A | A | AA | A | 4 | A | A | AA | A |
| Example 354 | 3 | A | A | AA | A | 4 | A | A | AA | A |
| Example 355 | 3 | A | A | AA | A | 4 | A | A | AA | A |

TABLE 116

| Table 1-9-12 | Evaluation | | | | | | | | | |
|---|---|---|---|---|---|---|---|---|---|---|
| | Type of resist composition | | | | | Type of resist composition | | | | |
| | | | | Resist saving properties | | | | | Resist saving properties | |
| | Affinity | | | Film thickness | | Affinity | | | Film thickness | |
| | Rsq1 | SRsq | Uniformity | controllability | | Rsq1 | SRsq | Uniformity | controllability | |
| Example 316 | 5 | A | A | AA | A | 6 | A | A | AA | A |
| Example 317 | 5 | A | A | AA | A | 6 | A | A | AA | A |
| Example 318 | 5 | A | A | AA | A | 6 | A | A | AA | A |
| Example 319 | 5 | A | A | AA | A | 6 | A | A | AA | A |
| Example 320 | 5 | A | A | AA | A | 6 | A | A | AA | A |
| Example 321 | 5 | A | A | AA | A | 6 | A | A | AA | A |
| Example 322 | 5 | A | A | AA | A | 6 | A | A | AA | A |
| Example 323 | 5 | A | A | AA | A | 6 | A | A | AA | A |
| Example 324 | 5 | A | A | AA | A | 6 | A | A | AA | A |
| Example 325 | 5 | A | A | AA | A | 6 | A | A | AA | A |
| Example 326 | 5 | A | A | AA | A | 6 | A | A | AA | A |
| Example 327 | 5 | A | A | AA | A | 6 | A | A | AA | A |
| Example 328 | 5 | A | A | AA | A | 6 | A | A | AA | A |
| Example 329 | 5 | A | A | AA | A | 6 | A | A | AA | A |
| Example 330 | 5 | A | A | AA | A | 6 | A | A | AA | A |
| Example 331 | 5 | A | A | AA | A | 6 | A | A | AA | A |
| Example 332 | 5 | A | A | AA | A | 6 | A | A | AA | A |
| Example 336 | 5 | A | A | AA | A | 6 | A | A | AA | A |
| Example 337 | 5 | A | A | AA | A | 6 | A | A | AA | A |
| Example 338 | 5 | A | A | AA | A | 6 | A | A | AA | A |
| Example 339 | 5 | A | A | AA | A | 6 | A | A | AA | A |
| Example 340 | 5 | A | A | AA | A | 6 | A | A | AA | A |
| Example 341 | 5 | A | A | AA | A | 6 | A | A | AA | A |
| Example 342 | 5 | A | A | AA | A | 6 | A | A | AA | A |
| Example 343 | 5 | A | A | AA | A | 6 | A | A | AA | A |
| Example 344 | 5 | A | A | AA | A | 6 | A | A | AA | A |
| Example 345 | 5 | A | A | AA | A | 6 | A | A | AA | A |
| Example 346 | 5 | A | A | AA | A | 6 | A | A | AA | A |
| Example 347 | 5 | A | A | AA | A | 6 | A | A | AA | A |
| Example 348 | 5 | A | A | AA | A | 6 | A | A | AA | A |
| Example 349 | 5 | A | A | AA | A | 6 | A | A | AA | A |
| Example 350 | 5 | A | A | AA | A | 6 | A | A | AA | A |
| Example 351 | 5 | A | A | AA | A | 6 | A | A | AA | A |
| Example 352 | 5 | A | A | AA | A | 6 | A | A | AA | A |
| Example 353 | 5 | A | A | AA | A | 6 | A | A | AA | A |
| Example 354 | 5 | A | A | AA | A | 6 | A | A | AA | A |
| Example 355 | 5 | A | A | AA | A | 6 | A | A | AA | A |

TABLE 117

| Table 1-9-13 | Type of resist composition | Affinity Rsq1 | SRsq | Resist saving properties Uniformity | Film thickness controllability |
|---|---|---|---|---|---|
| Example 316 | 7 | A | A | AA | A |
| Example 317 | 7 | A | A | AA | A |
| Example 318 | 7 | A | A | AA | A |
| Example 319 | 7 | A | A | AA | A |
| Example 320 | 7 | A | A | AA | A |
| Example 321 | 7 | A | A | AA | A |
| Example 322 | 7 | A | A | AA | A |
| Example 323 | 7 | A | A | AA | A |
| Example 324 | 7 | A | A | AA | A |
| Example 325 | 7 | A | A | AA | A |
| Example 326 | 7 | A | A | AA | A |
| Example 327 | 7 | A | A | AA | A |
| Example 328 | 7 | A | A | AA | A |
| Example 329 | 7 | A | A | AA | A |
| Example 330 | 7 | A | A | AA | A |
| Example 331 | 7 | A | A | AA | A |
| Example 332 | 7 | A | A | AA | A |
| Example 336 | 7 | A | A | AA | A |
| Example 337 | 7 | A | A | AA | A |
| Example 338 | 7 | A | A | AA | A |
| Example 339 | 7 | A | A | AA | A |
| Example 340 | 7 | A | A | AA | A |
| Example 341 | 7 | A | A | AA | A |
| Example 342 | 7 | A | A | AA | A |
| Example 343 | 7 | A | A | AA | A |
| Example 344 | 7 | A | A | AA | A |
| Example 345 | 7 | A | A | AA | A |
| Example 346 | 7 | A | A | AA | A |
| Example 347 | 7 | A | A | AA | A |
| Example 348 | 7 | A | A | AA | A |
| Example 349 | 7 | A | A | AA | A |
| Example 350 | 7 | A | A | AA | A |
| Example 351 | 7 | A | A | AA | A |
| Example 352 | 7 | A | A | AA | A |
| Example 353 | 7 | A | A | AA | A |
| Example 354 | 7 | A | A | AA | A |
| Example 355 | 7 | A | A | AA | A |

TABLE 118

Components of chemical liquid for pre-wetting
Mixture of organic solvents
First organic solvent

| Table 1-10-1 | Type | Content (% by mass) | Molar mass (g/mol) | Vapor pressure (Pa) | Surface tension (mN/m) | $\delta h$ $(MPa)^{0.5}$ | $\delta d$ $(MPa)^{0.5}$ |
|---|---|---|---|---|---|---|---|
| Example 356 | | | | | | | |
| Example 357 | | | | | | | |
| Example 358 | | | | | | | |
| Example 359 | | | | | | | |
| Example 360 | | | | | | | |
| Example 361 | | | | | | | |
| Example 362 | | | | | | | |
| Example 363 | | | | | | | |
| Example 364 | | | | | | | |
| Example 365 | | | | | | | |
| Example 366 | | | | | | | |
| Example 367 | | | | | | | |
| Example 368 | | | | | | | |
| Example 369 | | | | | | | |
| Example 370 | | | | | | | |
| Example 371 | | | | | | | |
| Example 372 | | | | | | | |
| Example 373 | | | | | | | |
| Example 374 | | | | | | | |
| Example 375 | | | | | | | |
| Example 376 | | | | | | | |
| Example 377 | | | | | | | |
| Example 378 | | | | | | | |
| Example 379 | | | | | | | |
| Example 380 | | | | | | | |
| Example 381 | | | | | | | |
| Example 382 | | | | | | | |
| Example 383 | | | | | | | |
| Example 384 | nBA | 80 | 116.16 | 1,200 | 24.8 | 60.5 | 17.2 |
| Example 385 | nBA | 80 | 116.16 | 1,200 | 24.8 | 60.5 | 17.2 |
| Example 386 | nBA | 80 | 116.16 | 1,200 | 24.8 | 60.5 | 17.2 |
| Example 387 | nBA | 80 | 116.16 | 1,200 | 24.8 | 60.5 | 17.2 |
| Example 388 | nBA | 80 | 116.16 | 1,200 | 24.8 | 60.5 | 17.2 |
| Example 389 | nBA | 80 | 116.16 | 1,200 | 24.8 | 60.5 | 17.2 |
| Example 390 | nBA | 80 | 116.16 | 1,200 | 24.8 | 60.5 | 17.2 |
| Example 391 | nBA | 80 | 116.16 | 1,200 | 24.8 | 60.5 | 17.2 |
| Example 392 | nBA | 80 | 116.16 | 1,200 | 24.8 | 60.5 | 17.2 |
| Example 393 | nBA | 80 | 116.16 | 1,200 | 24.8 | 60.5 | 17.2 |

TABLE 118-continued

Components of chemical liquid for pre-wetting
Mixture of organic solvents
First organic solvent

| Table 1-10-1 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 394 | nBA | 80 | 116.16 | 1,200 | 24.8 | 60.5 | 17.2 |
| Example 395 | nBA | 80 | 116.16 | 1,200 | 24.8 | 60.5 | 17.2 |

TABLE 119

Components of chemical liquid for pre-wetting
Mixture of organic solvents
Second organic solvent

| Table 1-10-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 356 | PGMEA | 30 | 132.16 | 493 | 27.9 | 56.5 | 19.8 |
| Example 357 | PGMEA | 30 | 132.16 | 493 | 27.9 | 56.5 | 19.8 |
| Example 358 | PGMEA | 30 | 132.16 | 493 | 27.9 | 56.5 | 19.8 |
| Example 359 | PGMEA | 30 | 132.16 | 493 | 27.9 | 56.5 | 19.8 |
| Example 360 | PGMEA | 30 | 132.16 | 493 | 27.9 | 56.5 | 19.8 |
| Example 361 | PGMEA | 30 | 132.16 | 493 | 27.9 | 56.5 | 19.8 |
| Example 362 | PGMEA | 30 | 132.16 | 493 | 27.9 | 56.5 | 19.8 |
| Example 363 | PGMEA | 30 | 132.16 | 493 | 27.9 | 56.5 | 19.8 |
| Example 364 | PGMEA | 30 | 132.16 | 493 | 27.9 | 56.5 | 19.8 |
| Example 365 | PGMEA | 30 | 132.16 | 493 | 27.9 | 56.5 | 19.8 |
| Example 366 | PGMEA | 30 | 132.16 | 493 | 27.9 | 56.5 | 19.8 |
| Example 367 | PGMEA | 30 | 132.16 | 493 | 27.9 | 56.5 | 19.8 |
| Example 368 | PGMEA | 30 | 132.16 | 493 | 27.9 | 56.5 | 19.8 |
| Example 369 | PGMEA | 30 | 132.16 | 493 | 27.9 | 56.5 | 19.8 |
| Example 370 | PGMEA | 30 | 132.16 | 493 | 27.9 | 56.5 | 19.8 |
| Example 371 | PGMEA | 30 | 132.16 | 493 | 27.9 | 56.5 | 19.8 |
| Example 372 | PGMEA | 30 | 132.16 | 493 | 27.9 | 56.5 | 19.8 |
| Example 373 | PGMEA | 30 | 132.16 | 493 | 27.9 | 56.5 | 19.8 |
| Example 374 | PGMEA | 30 | 132.16 | 493 | 27.9 | 56.5 | 19.8 |
| Example 375 | PGMEA | 30 | 132.16 | 493 | 27.9 | 56.5 | 19.8 |
| Example 376 | PGMEA | 30 | 132.16 | 493 | 27.9 | 56.5 | 19.8 |
| Example 377 | PGMEA | 30 | 132.16 | 493 | 27.9 | 56.5 | 19.8 |
| Example 378 | PGMEA | 30 | 132.16 | 493 | 27.9 | 56.5 | 19.8 |
| Example 379 | PGMEA | 30 | 132.16 | 493 | 27.9 | 56.5 | 19.8 |
| Example 380 | PGMEA | 30 | 132.16 | 493 | 27.9 | 56.5 | 19.8 |
| Example 381 | PGMEA | 30 | 132.16 | 493 | 27.9 | 56.5 | 19.8 |
| Example 382 | PGMEA | 30 | 132.16 | 493 | 27.9 | 56.5 | 19.8 |
| Example 383 | PGMEA | 30 | 132.16 | 493 | 27.9 | 56.5 | 19.8 |
| Example 384 | | | | | | | |
| Example 385 | | | | | | | |
| Example 386 | | | | | | | |
| Example 387 | | | | | | | |
| Example 388 | | | | | | | |
| Example 389 | | | | | | | |
| Example 390 | | | | | | | |
| Example 391 | | | | | | | |
| Example 392 | | | | | | | |
| Example 393 | | | | | | | |
| Example 394 | | | | | | | |
| Example 395 | | | | | | | |

TABLE 120

Components of chemical liquid for pre-wetting
Mixture of organic solvents
Third organic solvent

| Table 1-10-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 356 | PC | 60 | 102.09 | 53 | 40.9 | 47.5 | 42.8 |
| Example 357 | PC | 60 | 102.09 | 53 | 40.9 | 47.5 | 42.8 |
| Example 358 | PC | 60 | 102.09 | 53 | 40.9 | 47.5 | 42.8 |
| Example 359 | PC | 60 | 102.09 | 53 | 40.9 | 47.5 | 42.8 |
| Example 360 | PC | 60 | 102.09 | 53 | 40.9 | 47.5 | 42.8 |
| Example 361 | PC | 60 | 102.09 | 53 | 40.9 | 47.5 | 42.8 |
| Example 362 | PC | 60 | 102.09 | 53 | 40.9 | 47.5 | 42.8 |
| Example 363 | PC | 60 | 102.09 | 53 | 40.9 | 47.5 | 42.8 |
| Example 364 | PC | 60 | 102.09 | 53 | 40.9 | 47.5 | 42.8 |
| Example 365 | PC | 60 | 102.09 | 53 | 40.9 | 47.5 | 42.8 |
| Example 366 | PC | 60 | 102.09 | 53 | 40.9 | 47.5 | 42.8 |
| Example 367 | NMP | 60 | 99.13 | 40 | 41.3 | 48.0 | 32.8 |
| Example 368 | NMP | 60 | 99.13 | 40 | 41.3 | 48.0 | 32.8 |
| Example 369 | NMP | 60 | 99.13 | 40 | 41.3 | 48.0 | 32.8 |
| Example 370 | NMP | 60 | 99.13 | 40 | 41.3 | 48.0 | 32.8 |
| Example 371 | NMP | 60 | 99.13 | 40 | 41.3 | 48.0 | 32.8 |
| Example 372 | NMP | 60 | 99.13 | 40 | 41.3 | 48.0 | 32.8 |
| Example 373 | NMP | 60 | 99.13 | 40 | 41.3 | 48.0 | 32.8 |
| Example 374 | NMP | 60 | 99.13 | 40 | 41.3 | 48.0 | 32.8 |
| Example 375 | NMP | 60 | 99.13 | 40 | 41.3 | 48.0 | 32.8 |
| Example 376 | NMP | 60 | 99.13 | 40 | 41.3 | 48.0 | 32.8 |
| Example 377 | NMP | 60 | 99.13 | 40 | 41.3 | 48.0 | 32.8 |
| Example 378 | NMP | 60 | 99.13 | 40 | 41.3 | 48.0 | 32.8 |
| Example 379 | NMP | 60 | 99.13 | 40 | 41.3 | 48.0 | 32.8 |
| Example 380 | NMP | 60 | 99.13 | 40 | 41.3 | 48.0 | 32.8 |
| Example 381 | NMP | 60 | 99.13 | 40 | 41.3 | 48.0 | 32.8 |
| Example 382 | NMP | 60 | 99.13 | 40 | 41.3 | 48.0 | 32.8 |
| Example 383 | NMP | 60 | 99.13 | 40 | 41.3 | 48.0 | 32.8 |
| Example 384 | | | | | | | |
| Example 385 | | | | | | | |
| Example 386 | | | | | | | |
| Example 387 | | | | | | | |
| Example 388 | | | | | | | |
| Example 389 | | | | | | | |
| Example 390 | | | | | | | |
| Example 391 | | | | | | | |
| Example 392 | | | | | | | |
| Example 393 | | | | | | | |
| Example 394 | | | | | | | |
| Example 395 | | | | | | | |

TABLE 121

Components of chemical liquid for pre-wetting
Mixture of organic solvents
Fourth organic solvent

| Table 1-10-4 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 356 | TriEGDME | 10 | 178.23 | 13 | 28.0 | 56.4 | 20.9 |
| Example 357 | TetraEGDME | 10 | 222.28 | 13 | 27.0 | 55.6 | 21.1 |
| Example 358 | TEGMBE | 10 | 220.31 | 13 | 28.0 | 48.5 | 18.7 |
| Example 359 | DEGMBE | 10 | 162.23 | 117 | 29.0 | 59.4 | 18.1 |
| Example 360 | Anisole | 10 | 108.14 | 63 | 30.0 | 64.3 | 17.0 |
| Example 361 | 14-DMB | 10 | 138.17 | 1 | 30.0 | 59.0 | 20.6 |
| Example 362 | 12-DMB | 10 | 138.17 | 1 | 30.0 | 60.6 | 20.2 |
| Example 363 | 13-DMB | 10 | 138.17 | 1 | 30.0 | 61.6 | 19.9 |
| Example 364 | 14-Diphenoxybenzene | 10 | 262.31 | 1 | 33.0 | 63.3 | 18.5 |
| Example 365 | 4-Methoxytoluene | 10 | 122.17 | 1 | 32.0 | 64.8 | 17.4 |
| Example 366 | Phenetole | 10 | 122.17 | 1 | 31.0 | 66.3 | 16.3 |
| Example 367 | DEGME | 10 | 120.15 | 13 | 28.0 | 44.3 | 20.8 |
| Example 368 | DME | 10 | 90.12 | 693 | 29.0 | 55.9 | 22.8 |
| Example 369 | DEE | 10 | 118.18 | 627 | 29.0 | 62.2 | 19.9 |
| Example 370 | DEGIBE | 10 | 162.23 | 133 | 29.0 | 61.9 | 18.7 |
| Example 371 | DEGDME | 10 | 134.18 | 520 | 28.0 | 56.9 | 21.0 |
| Example 372 | DEGDEE | 10 | 162.23 | 253 | 29.0 | 60.4 | 19.6 |

TABLE 121-continued

Components of chemical liquid for pre-wetting
Mixture of organic solvents
Fourth organic solvent

| Table 1-10-4 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 373 | TriEGDME | 10 | 178.23 | 13 | 28.0 | 56.4 | 20.9 |
| Example 374 | TetraEGDME | 10 | 222.28 | 13 | 27.0 | 55.6 | 21.1 |
| Example 375 | TEGMBE | 10 | 220.31 | 13 | 28.0 | 48.5 | 18.7 |
| Example 376 | DEGMBE | 10 | 162.23 | 117 | 29.0 | 59.4 | 18.1 |
| Example 377 | Anisole | 10 | 108.14 | 63 | 30.0 | 64.3 | 17.0 |
| Example 378 | 14-DMB | 10 | 138.17 | 1 | 30.0 | 59.0 | 20.6 |
| Example 379 | 12-DMB | 10 | 138.17 | 1 | 30.0 | 60.6 | 20.2 |
| Example 380 | 13-DMB | 10 | 138.17 | 1 | 30.0 | 61.6 | 19.9 |
| Example 381 | 14-Diphenoxybenzene | 10 | 262.31 | 1 | 33.0 | 63.3 | 18.5 |
| Example 382 | 4-Methoxytoluene | 10 | 122.17 | 1 | 32.0 | 64.8 | 17.4 |
| Example 383 | Phenetole | 10 | 122.17 | 1 | 31.0 | 66.3 | 16.3 |
| Example 384 | DEGME | 10 | 120.15 | 13 | 28.0 | 44 | 21 |
| Example 385 | DME | 10 | 90.12 | 693 | 29.0 | 56 | 23 |
| Example 386 | DEE | 10 | 118.18 | 627 | 29.0 | 62 | 20 |
| Example 387 | DEGIBE | 10 | 162.23 | 133 | 29.0 | 62 | 19 |
| Example 388 | DEGDME | 10 | 134.18 | 520 | 28.0 | 57 | 21 |
| Example 389 | DEGDEE | 10 | 162.23 | 253 | 29.0 | 60 | 20 |
| Example 390 | TriEGDME | 10 | 178.23 | 13 | 28.0 | 56 | 21 |
| Example 391 | TetraEGDME | 10 | 222.28 | 13 | 27.0 | 56 | 21 |
| Example 392 | TEGMBE | 10 | 220.31 | 13 | 28.0 | 48 | 19 |
| Example 393 | DEGMBE | 10 | 162.23 | 117 | 29.0 | 59 | 18 |
| Example 394 | DEGME | 10 | 120.15 | 13 | 28.0 | 44.3 | 20.8 |
| Example 395 | DME | 10 | 90.12 | 693 | 29.0 | 55.9 | 22.8 |

TABLE 122

Components of chemical liquid for pre-wetting
Mixture of organic solvents
Fourth organic solvent

| Table 1-10-5 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 356 | | | | | | | |
| Example 357 | | | | | | | |
| Example 358 | | | | | | | |
| Example 359 | | | | | | | |
| Example 360 | | | | | | | |
| Example 361 | | | | | | | |
| Example 362 | | | | | | | |
| Example 363 | | | | | | | |
| Example 364 | | | | | | | |
| Example 365 | | | | | | | |
| Example 366 | | | | | | | |
| Example 367 | | | | | | | |
| Example 368 | | | | | | | |
| Example 369 | | | | | | | |
| Example 370 | | | | | | | |
| Example 371 | | | | | | | |
| Example 372 | | | | | | | |
| Example 373 | | | | | | | |
| Example 374 | | | | | | | |
| Example 375 | | | | | | | |
| Example 376 | | | | | | | |
| Example 377 | | | | | | | |
| Example 378 | | | | | | | |
| Example 379 | | | | | | | |
| Example 380 | | | | | | | |
| Example 381 | | | | | | | |
| Example 382 | | | | | | | |
| Example 383 | | | | | | | |
| Example 384 | Anisole | 10 | 108.14 | 63 | 30.0 | 64.3 | 17.0 |
| Example 385 | Anisole | 10 | 108.14 | 63 | 30.0 | 64.3 | 17.0 |
| Example 386 | Anisole | 10 | 108.14 | 63 | 30.0 | 64.3 | 17.0 |
| Example 387 | Anisole | 10 | 108.14 | 63 | 30.0 | 64.3 | 17.0 |
| Example 388 | Anisole | 10 | 108.14 | 63 | 30.0 | 64.3 | 17.0 |
| Example 389 | Anisole | 10 | 108.14 | 63 | 30.0 | 64.3 | 17.0 |

TABLE 122-continued

Components of chemical liquid for pre-wetting
Mixture of organic solvents
Fourth organic solvent

| Table 1-10-5 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 390 | Anisole | 10 | 108.14 | 63 | 30.0 | 64.3 | 17.0 |
| Example 391 | Anisole | 10 | 108.14 | 63 | 30.0 | 64.3 | 17.0 |
| Example 392 | Anisole | 10 | 108.14 | 63 | 30.0 | 64.3 | 17.0 |
| Example 393 | Anisole | 10 | 108.14 | 63 | 30.0 | 64.3 | 17.0 |
| Example 394 | 14-DMB | 10 | 138.17 | 1 | 30.0 | 59.0 | 20.6 |
| Example 395 | 14-DMB | 10 | 138.17 | 1 | 30.0 | 59.0 | 20.6 |

TABLE 123

Components of chemical liquid for pre-wetting
Mixture of organic solvents

| | | | | Fifth organic solvent | | | | | |
|---|---|---|---|---|---|---|---|---|---|
| Table 1-10-6 | Type | Content (% by mass) | Molar mass (g/mol) | Vapor pressure (Pa) | Surface tension (mN/m) | δh (MPa)$^{0.5}$ | δd (MPa)$^{0.5}$ | Vapor pressure (Pa) | Surface tension (mN/m) |
| Example 356 | | | | | | | | 165 | 36.7 |
| Example 357 | | | | | | | | 167 | 36.7 |
| Example 358 | | | | | | | | 167 | 36.8 |
| Example 359 | | | | | | | | 172 | 36.7 |
| Example 360 | | | | | | | | 164 | 36.5 |
| Example 361 | | | | | | | | 162 | 36.7 |
| Example 362 | | | | | | | | 162 | 36.7 |
| Example 363 | | | | | | | | 162 | 36.7 |
| Example 364 | | | | | | | | 168 | 37.1 |
| Example 365 | | | | | | | | 160 | 36.8 |
| Example 366 | | | | | | | | 160 | 36.7 |
| Example 367 | | | | | | | | 150 | 36.8 |
| Example 368 | | | | | | | | 226 | 36.6 |
| Example 369 | | | | | | | | 206 | 36.8 |
| Example 370 | | | | | | | | 162 | 37.0 |
| Example 371 | | | | | | | | 193 | 36.9 |
| Example 372 | | | | | | | | 170 | 37.0 |
| Example 373 | | | | | | | | 154 | 37.0 |
| Example 374 | | | | | | | | 156 | 37.1 |
| Example 375 | | | | | | | | 156 | 37.1 |
| Example 376 | | | | | | | | 160 | 37.0 |
| Example 377 | | | | | | | | 154 | 36.9 |
| Example 378 | | | | | | | | 151 | 37.0 |
| Example 379 | | | | | | | | 151 | 37.0 |
| Example 380 | | | | | | | | 151 | 37.0 |
| Example 381 | | | | | | | | 157 | 37.4 |
| Example 382 | | | | | | | | 149 | 37.1 |
| Example 383 | | | | | | | | 149 | 37.1 |
| Example 384 | | | | | | | | 964 | 25.7 |
| Example 385 | | | | | | | | 1,019 | 25.9 |
| Example 386 | | | | | | | | 1022 | 25.8 |
| Example 387 | | | | | | | | 997 | 25.7 |
| Example 388 | | | | | | | | 1,018 | 25.6 |
| Example 389 | | | | | | | | 1,006 | 25.7 |
| Example 390 | | | | | | | | 995 | 25.6 |
| Example 391 | | | | | | | | 1,008 | 25.5 |
| Example 392 | | | | | | | | 1,008 | 25.6 |
| Example 393 | | | | | | | | 996 | 25.7 |
| Example 394 | | | | | | | | 980 | 25.6 |
| Example 395 | | | | | | | | 1,036 | 25.8 |

TABLE 124

Components of chemical liquid for pre-wetting

| Table 1-10-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 356 | Balance | 0.002 | 0.006 | 0.002 | 0.030 | 0.030 | 0.070 |
| Example 357 | Balance | 0.002 | 0.006 | 0.002 | 0.030 | 0.030 | 0.070 |
| Example 358 | Balance | 0.002 | 0.006 | 0.002 | 0.030 | 0.030 | 0.070 |
| Example 359 | Balance | 0.002 | 0.006 | 0.002 | 0.030 | 0.030 | 0.070 |
| Example 360 | Balance | 0.002 | 0.006 | 0.002 | 0.030 | 0.030 | 0.070 |
| Example 361 | Balance | 0.002 | 0.006 | 0.002 | 0.030 | 0.030 | 0.070 |
| Example 362 | Balance | 0.002 | 0.006 | 0.002 | 0.030 | 0.030 | 0.070 |
| Example 363 | Balance | 0.002 | 0.006 | 0.002 | 0.030 | 0.030 | 0.070 |
| Example 364 | Balance | 0.002 | 0.006 | 0.002 | 0.030 | 0.030 | 0.070 |
| Example 365 | Balance | 0.002 | 0.006 | 0.002 | 0.030 | 0.030 | 0.070 |
| Example 366 | Balance | 0.002 | 0.006 | 0.002 | 0.030 | 0.030 | 0.070 |
| Example 367 | Balance | 0.002 | 0.006 | 0.002 | 0.030 | 0.030 | 0.070 |
| Example 368 | Balance | 0.002 | 0.006 | 0.002 | 0.030 | 0.030 | 0.070 |
| Example 369 | Balance | 0.002 | 0.006 | 0.002 | 0.030 | 0.030 | 0.070 |
| Example 370 | Balance | 0.002 | 0.006 | 0.002 | 0.030 | 0.030 | 0.070 |
| Example 371 | Balance | 0.002 | 0.006 | 0.002 | 0.030 | 0.030 | 0.070 |
| Example 372 | Balance | 0.002 | 0.006 | 0.002 | 0.030 | 0.030 | 0.070 |
| Example 373 | Balance | 0.002 | 0.006 | 0.002 | 0.030 | 0.030 | 0.070 |
| Example 374 | Balance | 0.002 | 0.006 | 0.002 | 0.030 | 0.030 | 0.070 |
| Example 375 | Balance | 0.002 | 0.006 | 0.002 | 0.030 | 0.030 | 0.070 |
| Example 376 | Balance | 0.002 | 0.006 | 0.002 | 0.030 | 0.030 | 0.070 |
| Example 377 | Balance | 0.002 | 0.006 | 0.002 | 0.030 | 0.030 | 0.070 |
| Example 378 | Balance | 0.002 | 0.006 | 0.002 | 0.030 | 0.030 | 0.070 |
| Example 379 | Balance | 0.002 | 0.006 | 0.002 | 0.030 | 0.030 | 0.070 |
| Example 380 | Balance | 0.002 | 0.006 | 0.002 | 0.030 | 0.030 | 0.070 |
| Example 381 | Balance | 0.002 | 0.006 | 0.002 | 0.030 | 0.030 | 0.070 |
| Example 382 | Balance | 0.002 | 0.006 | 0.002 | 0.030 | 0.030 | 0.070 |
| Example 383 | Balance | 0.002 | 0.006 | 0.002 | 0.030 | 0.030 | 0.070 |
| Example 384 | Balance | 0.002 | 0.006 | 0.002 | 0.030 | 0.030 | 0.070 |
| Example 385 | Balance | 0.002 | 0.006 | 0.002 | 0.030 | 0.030 | 0.070 |
| Example 386 | Balance | 0.002 | 0.006 | 0.002 | 0.030 | 0.030 | 0.070 |
| Example 387 | Balance | 0.002 | 0.006 | 0.002 | 0.030 | 0.030 | 0.070 |
| Example 388 | Balance | 0.002 | 0.006 | 0.002 | 0.030 | 0.030 | 0.070 |
| Example 389 | Balance | 0.002 | 0.006 | 0.002 | 0.030 | 0.030 | 0.070 |
| Example 390 | Balance | 0.002 | 0.006 | 0.002 | 0.030 | 0.030 | 0.070 |
| Example 391 | Balance | 0.002 | 0.006 | 0.002 | 0.030 | 0.030 | 0.070 |
| Example 392 | Balance | 0.002 | 0.006 | 0.002 | 0.030 | 0.030 | 0.070 |
| Example 393 | Balance | 0.002 | 0.006 | 0.002 | 0.030 | 0.030 | 0.070 |
| Example 394 | Balance | 0.002 | 0.006 | 0.002 | 0.030 | 0.030 | 0.070 |
| Example 395 | Balance | 0.002 | 0.006 | 0.002 | 0.030 | 0.030 | 0.070 |

TABLE 125

Components of chemical liquid for pre-wetting

| Table 1-10-8 | Impurity metal Content of impurity metal as particles (mass ppt) | | | | | | Organic impurity Specific organic compound | |
|---|---|---|---|---|---|---|---|---|
| | | | | | | | Boiling point: equal to or higher than 250° C. Number of carbon atoms: equal to or greater than 8 | Boiling point: equal to or higher than 250° C. Number of carbon atoms: equal to or greater than 12 |
| | Fe | Cr | Ni | Pb | Others | Total | | |
| Example 356 | 0.040 | 0.002 | 0.001 | 0.003 | 0.019 | 0.065 | A | A |
| Example 357 | 0.040 | 0.002 | 0.001 | 0.003 | 0.019 | 0.065 | A | A |
| Example 358 | 0.040 | 0.002 | 0.001 | 0.003 | 0.019 | 0.065 | A | A |
| Example 359 | 0.040 | 0.002 | 0.001 | 0.003 | 0.019 | 0.065 | A | A |
| Example 360 | 0.040 | 0.002 | 0.001 | 0.003 | 0.019 | 0.065 | A | A |
| Example 361 | 0.040 | 0.002 | 0.001 | 0.003 | 0.019 | 0.065 | A | A |
| Example 362 | 0.040 | 0.002 | 0.001 | 0.003 | 0.019 | 0.065 | A | A |
| Example 363 | 0.040 | 0.002 | 0.001 | 0.003 | 0.019 | 0.065 | A | A |
| Example 364 | 0.040 | 0.002 | 0.001 | 0.003 | 0.019 | 0.065 | A | A |
| Example 365 | 0.040 | 0.002 | 0.001 | 0.003 | 0.019 | 0.065 | A | A |
| Example 366 | 0.040 | 0.002 | 0.001 | 0.003 | 0.019 | 0.065 | A | A |

TABLE 125-continued

Components of chemical liquid for pre-wetting

| Table 1-10-8 | Impurity metal Content of impurity metal as particles (mass ppt) | | | | | | Organic impurity Specific organic compound | |
|---|---|---|---|---|---|---|---|---|
| | Fe | Cr | Ni | Pb | Others | Total | Boiling point: equal to or higher than 250° C. Number of carbon atoms: equal to or greater than 8 | Boiling point: equal to or higher than 250° C. Number of carbon atoms: equal to or greater than 12 |
| Example 367 | 0.040 | 0.002 | 0.001 | 0.003 | 0.019 | 0.065 | A | A |
| Example 368 | 0.040 | 0.002 | 0.001 | 0.003 | 0.019 | 0.065 | A | A |
| Example 369 | 0.040 | 0.002 | 0.001 | 0.003 | 0.019 | 0.065 | A | A |
| Example 370 | 0.040 | 0.002 | 0.001 | 0.003 | 0.019 | 0.065 | A | A |
| Example 371 | 0.040 | 0.002 | 0.001 | 0.003 | 0.019 | 0.065 | A | A |
| Example 372 | 0.040 | 0.002 | 0.001 | 0.003 | 0.019 | 0.065 | A | A |
| Example 373 | 0.040 | 0.002 | 0.001 | 0.003 | 0.019 | 0.065 | A | A |
| Example 374 | 0.040 | 0.002 | 0.001 | 0.003 | 0.019 | 0.065 | A | A |
| Example 375 | 0.040 | 0.002 | 0.001 | 0.003 | 0.019 | 0.065 | A | A |
| Example 376 | 0.040 | 0.002 | 0.001 | 0.003 | 0.019 | 0.065 | A | A |
| Example 377 | 0.040 | 0.002 | 0.001 | 0.003 | 0.019 | 0.065 | A | A |
| Example 378 | 0.040 | 0.002 | 0.001 | 0.003 | 0.019 | 0.065 | A | A |
| Example 379 | 0.040 | 0.002 | 0.001 | 0.003 | 0.019 | 0.065 | A | A |
| Example 380 | 0.040 | 0.002 | 0.001 | 0.003 | 0.019 | 0.065 | A | A |
| Example 381 | 0.040 | 0.002 | 0.001 | 0.003 | 0.019 | 0.065 | A | A |
| Example 382 | 0.040 | 0.002 | 0.001 | 0.003 | 0.019 | 0.065 | A | A |
| Example 383 | 0.040 | 0.002 | 0.001 | 0.003 | 0.019 | 0.065 | A | A |
| Example 384 | 0.040 | 0.002 | 0.001 | 0.003 | 0.019 | 0.065 | A | A |
| Example 385 | 0.040 | 0.002 | 0.001 | 0.003 | 0.019 | 0.065 | A | A |
| Example 386 | 0.040 | 0.002 | 0.001 | 0.003 | 0.019 | 0.065 | A | A |
| Example 387 | 0.040 | 0.002 | 0.001 | 0.003 | 0.019 | 0.065 | A | A |
| Example 388 | 0.040 | 0.002 | 0.001 | 0.003 | 0.019 | 0.065 | A | A |
| Example 389 | 0.040 | 0.002 | 0.001 | 0.003 | 0.019 | 0.065 | A | A |
| Example 390 | 0.040 | 0.002 | 0.001 | 0.003 | 0.019 | 0.065 | A | A |
| Example 391 | 0.040 | 0.002 | 0.001 | 0.003 | 0.019 | 0.065 | A | A |
| Example 392 | 0.040 | 0.002 | 0.001 | 0.003 | 0.019 | 0.065 | A | A |
| Example 393 | 0.040 | 0.002 | 0.001 | 0.003 | 0.019 | 0.065 | A | A |
| Example 394 | 0.040 | 0.002 | 0.001 | 0.003 | 0.019 | 0.065 | A | A |
| Example 395 | 0.040 | 0.002 | 0.001 | 0.003 | 0.019 | 0.065 | A | A |

TABLE 126

Components of chemical liquid for pre-wetting

| Table 1-10-9 | Organic impurity Content of organic impurity | | | | | Physical properties of chemical liquid for pre-wetting | |
|---|---|---|---|---|---|---|---|
| | Total (mass ppm) | Content of high-boiling-point component (mass ppm) | Content of ultrahigh-boiling-point component (mass ppm) | Content of compound having CLogP value higher than 6.5 (mass ppt) | Water Total (% by mass) | Number of coarse particles (Number of objects to be counted) (Number/mL) | Evaluation Defect inhibition performance |
| Example 356 | 2,500 | 1 | 0.5 | 500 | 0.10% | 6 | AA |
| Example 357 | 2,500 | 1 | 0.5 | 500 | 0.10% | 6 | AA |
| Example 358 | 2,500 | 1 | 0.5 | 500 | 0.10% | 6 | AA |
| Example 359 | 2,500 | 1 | 0.5 | 500 | 0.10% | 6 | AA |
| Example 360 | 2,500 | 1 | 0.5 | 500 | 0.10% | 6 | AA |
| Example 361 | 2,500 | 1 | 0.5 | 500 | 0.10% | 6 | AA |
| Example 362 | 2,500 | 1 | 0.5 | 500 | 0.10% | 6 | AA |
| Example 363 | 2,500 | 1 | 0.5 | 500 | 0.10% | 6 | AA |
| Example 364 | 2,500 | 1 | 0.5 | 500 | 0.10% | 6 | AA |
| Example 365 | 2,500 | 1 | 0.5 | 500 | 0.10% | 6 | AA |
| Example 366 | 2,500 | 1 | 0.5 | 500 | 0.10% | 6 | AA |
| Example 367 | 2,500 | 1 | 0.5 | 500 | 0.10% | 6 | AA |
| Example 368 | 2,500 | 1 | 0.5 | 500 | 0.10% | 6 | AA |
| Example 369 | 2,500 | 1 | 0.5 | 500 | 0.10% | 6 | AA |
| Example 370 | 2,500 | 1 | 0.5 | 500 | 0.10% | 6 | AA |
| Example 371 | 2,500 | 1 | 0.5 | 500 | 0.10% | 6 | AA |
| Example 372 | 2,500 | 1 | 0.5 | 500 | 0.10% | 6 | AA |
| Example 373 | 2,500 | 1 | 0.5 | 500 | 0.10% | 6 | AA |
| Example 374 | 2,500 | 1 | 0.5 | 500 | 0.10% | 6 | AA |
| Example 375 | 2,500 | 1 | 0.5 | 500 | 0.10% | 6 | AA |

TABLE 126-continued

| | Components of chemical liquid for pre-wetting | | | | | Physical properties of chemical liquid for pre-wetting | |
|---|---|---|---|---|---|---|---|
| | Organic impurity Content of organic impurity | | | | | | |
| Table 1-10-9 | Total (mass ppm) | Content of high-boiling-point component (mass ppm) | Content of ultrahigh-boiling-point component (mass ppm) | Content of compound having CLogP value higher than 6.5 (mass ppt) | Water Total (% by mass) | Number of coarse particles (Number of objects to be counted) (Number/mL) | Evaluation Defect inhibition performance |
| Example 376 | 2,500 | 1 | 0.5 | 500 | 0.10% | 6 | AA |
| Example 377 | 2,500 | 1 | 0.5 | 500 | 0.10% | 6 | AA |
| Example 378 | 2,500 | 1 | 0.5 | 500 | 0.10% | 6 | AA |
| Example 379 | 2,500 | 1 | 0.5 | 500 | 0.10% | 6 | AA |
| Example 380 | 2,500 | 1 | 0.5 | 500 | 0.10% | 6 | AA |
| Example 381 | 2,500 | 1 | 0.5 | 500 | 0.10% | 6 | AA |
| Example 382 | 2,500 | 1 | 0.5 | 500 | 0.10% | 6 | AA |
| Example 383 | 2,500 | 1 | 0.5 | 500 | 0.10% | 6 | AA |
| Example 384 | 2,500 | 1 | 0.5 | 500 | 0.10% | 6 | AA |
| Example 385 | 2,500 | 1 | 0.5 | 500 | 0.10% | 6 | AA |
| Example 386 | 2,500 | 1 | 0.5 | 500 | 0.10% | 6 | AA |
| Example 387 | 2,500 | 1 | 0.5 | 500 | 0.10% | 6 | AA |
| Example 388 | 2,500 | 1 | 0.5 | 500 | 0.10% | 6 | AA |
| Example 389 | 2,500 | 1 | 0.5 | 500 | 0.10% | 6 | AA |
| Example 390 | 2,500 | 1 | 0.5 | 500 | 0.10% | 6 | AA |
| Example 391 | 2,500 | 1 | 0.5 | 500 | 0.10% | 6 | AA |
| Example 392 | 2,500 | 1 | 0.5 | 500 | 0.10% | 6 | AA |
| Example 393 | 2,500 | 1 | 0.5 | 500 | 0.10% | 6 | AA |
| Example 394 | 2,500 | 1 | 0.5 | 500 | 0.10% | 6 | AA |
| Example 395 | 2,500 | 1 | 0.5 | 500 | 0.10% | 6 | AA |

TABLE 127

| | Evaluation | | | | | | | | |
|---|---|---|---|---|---|---|---|---|---|
| | Type of resist composition | | | | | Type of resist composition | | | |
| | Resist saving properties | | | | | Resist saving properties | | | |
| | Affinity | | | Film thickness | | Affinity | | | Film thickness |
| Table 1-10-10 | Rsql | SRsq | Uniformity | controllability | | Rsql | SRsq | Uniformity | controllability |
| Example 356 | 1 | A | A | AA | A | 2 | A | A | A | A |
| Example 357 | 1 | A | A | AA | A | 2 | A | A | A | A |
| Example 358 | 1 | A | A | AA | A | 2 | A | A | A | A |
| Example 359 | 1 | A | A | AA | A | 2 | A | A | A | A |
| Example 360 | 1 | A | A | AA | A | 2 | A | A | A | A |
| Example 361 | 1 | A | A | AA | A | 2 | A | A | A | A |
| Example 362 | 1 | A | A | AA | A | 2 | A | A | A | A |
| Example 363 | 1 | A | A | AA | A | 2 | A | A | A | A |
| Example 364 | 1 | A | A | AA | A | 2 | A | A | A | A |
| Example 365 | 1 | A | A | AA | A | 2 | A | A | A | A |
| Example 366 | 1 | A | A | AA | A | 2 | A | A | A | A |
| Example 367 | 1 | A | A | AA | A | 2 | A | A | A | A |
| Example 368 | 1 | A | A | AA | A | 2 | A | A | A | A |
| Example 369 | 1 | A | A | AA | A | 2 | A | A | A | A |
| Example 370 | 1 | A | A | AA | A | 2 | A | A | A | A |
| Example 371 | 1 | A | A | AA | A | 2 | A | A | A | A |
| Example 372 | 1 | A | A | AA | A | 2 | A | A | A | A |
| Example 373 | 1 | A | A | AA | A | 2 | A | A | A | A |
| Example 374 | 1 | A | A | AA | A | 2 | A | A | A | A |
| Example 375 | 1 | A | A | AA | A | 2 | A | A | A | A |
| Example 376 | 1 | A | A | AA | A | 2 | A | A | A | A |
| Example 377 | 1 | A | A | AA | A | 2 | A | A | A | A |
| Example 378 | 1 | A | A | AA | A | 2 | A | A | A | A |
| Example 379 | 1 | A | A | AA | A | 2 | A | A | A | A |
| Example 380 | 1 | A | A | AA | A | 2 | A | A | A | A |
| Example 381 | 1 | A | A | AA | A | 2 | A | A | A | A |
| Example 382 | 1 | A | A | AA | A | 2 | A | A | A | A |
| Example 383 | 1 | A | A | AA | A | 2 | A | A | A | A |
| Example 384 | 1 | A | A | AA | A | 2 | A | A | A | A |
| Example 385 | 1 | A | A | AA | A | 2 | A | A | A | A |
| Example 386 | 1 | A | A | AA | A | 2 | A | A | A | A |

TABLE 127-continued

| Table 1-10-10 | | Type of resist composition | | | | | Type of resist composition | | | |
|---|---|---|---|---|---|---|---|---|---|---|
| | | | | | Resist saving properties | | | | | Resist saving properties |
| | | Affinity | | | Film thickness | | Affinity | | | Film thickness |
| | | Rsql | SRsq | Uniformity | controllability | | Rsql | SRsq | Uniformity | controllability |
| Example 387 | 1 | A | A | AA | A | 2 | A | A | A | A |
| Example 388 | 1 | A | A | AA | A | 2 | A | A | A | A |
| Example 389 | 1 | A | A | AA | A | 2 | A | A | A | A |
| Example 390 | 1 | A | A | AA | A | 2 | A | A | A | A |
| Example 391 | 1 | A | A | AA | A | 2 | A | A | A | A |
| Example 392 | 1 | A | A | AA | A | 2 | A | A | A | A |
| Example 393 | 1 | A | A | AA | A | 2 | A | A | A | A |
| Example 394 | 1 | A | A | AA | A | 2 | A | A | A | A |
| Example 395 | 1 | A | A | AA | A | 2 | A | A | A | A |

TABLE 128

| Table 1-10-11 | | Type of resist composition | | | | | Type of resist composition | | | |
|---|---|---|---|---|---|---|---|---|---|---|
| | | | | | Resist saving properties | | | | | Resist saving properties |
| | | Affinity | | | Film thickness | | Affinity | | | Film thickness |
| | | Rsql | SRsq | Uniformity | controllability | | Rsql | SRsq | Uniformity | controllability |
| Example 356 | 3 | A | A | AA | A | 4 | A | A | AA | A |
| Example 357 | 3 | A | A | AA | A | 4 | A | A | AA | A |
| Example 358 | 3 | A | A | AA | A | 4 | A | A | AA | A |
| Example 359 | 3 | A | A | AA | A | 4 | A | A | AA | A |
| Example 360 | 3 | A | A | AA | A | 4 | A | A | AA | A |
| Example 361 | 3 | A | A | AA | A | 4 | A | A | AA | A |
| Example 362 | 3 | A | A | AA | A | 4 | A | A | AA | A |
| Example 363 | 3 | A | A | AA | A | 4 | A | A | AA | A |
| Example 364 | 3 | A | A | AA | A | 4 | A | A | AA | A |
| Example 365 | 3 | A | A | AA | A | 4 | A | A | AA | A |
| Example 366 | 3 | A | A | AA | A | 4 | A | A | AA | A |
| Example 367 | 3 | A | A | AA | A | 4 | A | A | AA | A |
| Example 368 | 3 | A | A | AA | A | 4 | A | A | AA | A |
| Example 369 | 3 | A | A | AA | A | 4 | A | A | AA | A |
| Example 370 | 3 | A | A | AA | A | 4 | A | A | AA | A |
| Example 371 | 3 | A | A | AA | A | 4 | A | A | AA | A |
| Example 372 | 3 | A | A | AA | A | 4 | A | A | AA | A |
| Example 373 | 3 | A | A | AA | A | 4 | A | A | AA | A |
| Example 374 | 3 | A | A | AA | A | 4 | A | A | AA | A |
| Example 375 | 3 | A | A | AA | A | 4 | A | A | AA | A |
| Example 376 | 3 | A | A | AA | A | 4 | A | A | AA | A |
| Example 377 | 3 | A | A | AA | A | 4 | A | A | AA | A |
| Example 378 | 3 | A | A | AA | A | 4 | A | A | AA | A |
| Example 379 | 3 | A | A | AA | A | 4 | A | A | AA | A |
| Example 380 | 3 | A | A | AA | A | 4 | A | A | AA | A |
| Example 381 | 3 | A | A | AA | A | 4 | A | A | AA | A |
| Example 382 | 3 | A | A | AA | A | 4 | A | A | AA | A |
| Example 383 | 3 | A | A | AA | A | 4 | A | A | AA | A |
| Example 384 | 3 | A | A | AA | A | 4 | A | A | AA | A |
| Example 385 | 3 | A | A | AA | A | 4 | A | A | AA | A |
| Example 386 | 3 | A | A | AA | A | 4 | A | A | AA | A |
| Example 387 | 3 | A | A | AA | A | 4 | A | A | AA | A |
| Example 388 | 3 | A | A | AA | A | 4 | A | A | AA | A |
| Example 389 | 3 | A | A | AA | A | 4 | A | A | AA | A |
| Example 390 | 3 | A | A | AA | A | 4 | A | A | AA | A |
| Example 391 | 3 | A | A | AA | A | 4 | A | A | AA | A |
| Example 392 | 3 | A | A | AA | A | 4 | A | A | AA | A |
| Example 393 | 3 | A | A | AA | A | 4 | A | A | AA | A |
| Example 394 | 3 | A | A | AA | A | 4 | A | A | AA | A |
| Example 395 | 3 | A | A | AA | A | 4 | A | A | AA | A |

TABLE 129

| Table 1-10-12 | | | | Evaluation Type of resist composition | | | | | Evaluation Type of resist composition | |
|---|---|---|---|---|---|---|---|---|---|---|
| | | | | Resist saving properties | | | | | Resist saving properties | |
| | | Affinity | | | Film thickness | | Affinity | | | Film thickness |
| | | Rsq1 | SRsq | Uniformity | controllability | | Rsq1 | SRsq | Uniformity | controllability |
| Example 356 | 5 | A | A | AA | A | 6 | A | A | AA | A |
| Example 357 | 5 | A | A | AA | A | 6 | A | A | AA | A |
| Example 358 | 5 | A | A | AA | A | 6 | A | A | AA | A |
| Example 359 | 5 | A | A | AA | A | 6 | A | A | AA | A |
| Example 360 | 5 | A | A | AA | A | 6 | A | A | AA | A |
| Example 361 | 5 | A | A | AA | A | 6 | A | A | AA | A |
| Example 362 | 5 | A | A | AA | A | 6 | A | A | AA | A |
| Example 363 | 5 | A | A | AA | A | 6 | A | A | AA | A |
| Example 364 | 5 | A | A | AA | A | 6 | A | A | AA | A |
| Example 365 | 5 | A | A | AA | A | 6 | A | A | AA | A |
| Example 366 | 5 | A | A | AA | A | 6 | A | A | AA | A |
| Example 367 | 5 | A | A | AA | A | 6 | A | A | AA | A |
| Example 368 | 5 | A | A | AA | A | 6 | A | A | AA | A |
| Example 369 | 5 | A | A | AA | A | 6 | A | A | AA | A |
| Example 370 | 5 | A | A | AA | A | 6 | A | A | AA | A |
| Example 371 | 5 | A | A | AA | A | 6 | A | A | AA | A |
| Example 372 | 5 | A | A | AA | A | 6 | A | A | AA | A |
| Example 373 | 5 | A | A | AA | A | 6 | A | A | AA | A |
| Example 374 | 5 | A | A | AA | A | 6 | A | A | AA | A |
| Example 375 | 5 | A | A | AA | A | 6 | A | A | AA | A |
| Example 376 | 5 | A | A | AA | A | 6 | A | A | AA | A |
| Example 377 | 5 | A | A | AA | A | 6 | A | A | AA | A |
| Example 378 | 5 | A | A | AA | A | 6 | A | A | AA | A |
| Example 379 | 5 | A | A | AA | A | 6 | A | A | AA | A |
| Example 380 | 5 | A | A | AA | A | 6 | A | A | AA | A |
| Example 381 | 5 | A | A | AA | A | 6 | A | A | AA | A |
| Example 382 | 5 | A | A | AA | A | 6 | A | A | AA | A |
| Example 383 | 5 | A | A | AA | A | 6 | A | A | AA | A |
| Example 384 | 5 | A | A | AA | A | 6 | A | A | AA | A |
| Example 385 | 5 | A | A | AA | A | 6 | A | A | AA | A |
| Example 386 | 5 | A | A | AA | A | 6 | A | A | AA | A |
| Example 387 | 5 | A | A | AA | A | 6 | A | A | AA | A |
| Example 388 | 5 | A | A | AA | A | 6 | A | A | AA | A |
| Example 389 | 5 | A | A | AA | A | 6 | A | A | AA | A |
| Example 390 | 5 | A | A | AA | A | 6 | A | A | AA | A |
| Example 391 | 5 | A | A | AA | A | 6 | A | A | AA | A |
| Example 392 | 5 | A | A | AA | A | 6 | A | A | AA | A |
| Example 393 | 5 | A | A | AA | A | 6 | A | A | AA | A |
| Example 394 | 5 | A | A | AA | A | 6 | A | A | AA | A |
| Example 395 | 5 | A | A | AA | A | 6 | A | A | AA | A |

TABLE 130

| Table 1-10-13 | | Evaluation Type of resist composition | | | |
|---|---|---|---|---|---|
| | | Resist saving properties | | | |
| | | Affinity | | | Film thickness |
| | | Rsq1 | SRsq | Uniformity | controllability |
| Example 356 | 7 | A | A | AA | A |
| Example 357 | 7 | A | A | AA | A |
| Example 358 | 7 | A | A | AA | A |
| Example 359 | 7 | A | A | AA | A |
| Example 360 | 7 | A | A | AA | A |
| Example 361 | 7 | A | A | AA | A |
| Example 362 | 7 | A | A | AA | A |
| Example 363 | 7 | A | A | AA | A |
| Example 364 | 7 | A | A | AA | A |
| Example 365 | 7 | A | A | AA | A |
| Example 366 | 7 | A | A | AA | A |
| Example 367 | 7 | A | A | AA | A |
| Example 368 | 7 | A | A | AA | A |
| Example 369 | 7 | A | A | AA | A |
| Example 370 | 7 | A | A | AA | A |
| Example 371 | 7 | A | A | AA | A |
| Example 372 | 7 | A | A | AA | A |
| Example 373 | 7 | A | A | AA | A |
| Example 374 | 7 | A | A | AA | A |
| Example 375 | 7 | A | A | AA | A |
| Example 376 | 7 | A | A | AA | A |
| Example 377 | 7 | A | A | AA | A |
| Example 378 | 7 | A | A | AA | A |
| Example 379 | 7 | A | A | AA | A |

TABLE 130-continued

| Table 1-10-13 | Type of resist composition | Affinity Rsq1 | SRsq | Uniformity | Film thickness controllability |
|---|---|---|---|---|---|
| | | | | Resist saving properties | |
| Example 380 | 7 | A | A | AA | A |
| Example 381 | 7 | A | A | AA | A |
| Example 382 | 7 | A | A | AA | A |
| Example 383 | 7 | A | A | AA | A |
| Example 384 | 7 | A | A | AA | A |
| Example 385 | 7 | A | A | AA | A |
| Example 386 | 7 | A | A | AA | A |
| Example 387 | 7 | A | A | AA | A |
| Example 388 | 7 | A | A | AA | A |
| Example 389 | 7 | A | A | AA | A |
| Example 390 | 7 | A | A | AA | A |
| Example 391 | 7 | A | A | AA | A |
| Example 392 | 7 | A | A | AA | A |
| Example 393 | 7 | A | A | AA | A |
| Example 394 | 7 | A | A | AA | A |
| Example 395 | 7 | A | A | AA | A |

TABLE 131

Components of chemical liquid for pre-wetting
Mixture of organic solvents
First organic solvent

| Table 1-11-1 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 396 | nBA | 80 | 116.16 | 1,200 | 24.8 | 60.5 | 17.2 |
| Example 397 | nBA | 80 | 116.16 | 1,200 | 24.8 | 60.5 | 17.2 |
| Example 398 | nBA | 80 | 116.16 | 1,200 | 24.8 | 60.5 | 17.2 |
| Example 399 | nBA | 80 | 116.16 | 1,200 | 24.8 | 60.5 | 17.2 |
| Example 400 | nBA | 80 | 116.16 | 1,200 | 24.8 | 60.5 | 17.2 |
| Example 401 | nBA | 80 | 116.16 | 1,200 | 24.8 | 60.5 | 17.2 |
| Example 402 | nBA | 80 | 116.16 | 1,200 | 24.8 | 60.5 | 17.2 |
| Example 403 | nBA | 80 | 116.16 | 1,200 | 24.8 | 60.5 | 17.2 |
| Example 404 | nBA | 80 | 116.16 | 1,200 | 24.8 | 60.5 | 17.2 |
| Example 405 | nBA | 80 | 116.16 | 1,200 | 24.8 | 60.5 | 17.2 |
| Example 406 | nBA | 80 | 116.16 | 1,200 | 24.8 | 60.5 | 17.2 |
| Example 407 | nBA | 80 | 116.16 | 1,200 | 24.8 | 60.5 | 17.2 |
| Example 408 | nBA | 80 | 116.16 | 1,200 | 24.8 | 60.5 | 17.2 |
| Example 409 | nBA | 80 | 116.16 | 1,200 | 24.8 | 60.5 | 17.2 |
| Example 410 | nBA | 80 | 116.16 | 1,200 | 24.8 | 60.5 | 17.2 |
| Example 411 | nBA | 80 | 116.16 | 1,200 | 24.8 | 60.5 | 17.2 |
| Example 412 | nBA | 80 | 116.16 | 1,200 | 24.8 | 60.5 | 17.2 |
| Example 413 | nBA | 80 | 116.16 | 1,200 | 24.8 | 60.5 | 17.2 |
| Example 414 | nBA | 80 | 116.16 | 1,200 | 24.8 | 60.5 | 17.2 |
| Example 415 | nBA | 80 | 116.16 | 1,200 | 24.8 | 60.5 | 17.2 |
| Example 416 | nBA | 80 | 116.16 | 1,200 | 24.8 | 60.5 | 17.2 |
| Example 417 | nBA | 80 | 116.16 | 1,200 | 24.8 | 60.5 | 17.2 |
| Example 418 | nBA | 80 | 116.16 | 1,200 | 24.8 | 60.5 | 17.2 |
| Example 419 | nBA | 80 | 116.16 | 1,200 | 24.8 | 60.5 | 17.2 |
| Example 420 | nBA | 80 | 116.16 | 1,200 | 24.8 | 60.5 | 17.2 |
| Example 421 | nBA | 80 | 116.16 | 1,200 | 24.8 | 60.5 | 17.2 |
| Example 422 | nBA | 80 | 116.16 | 1,200 | 24.8 | 60.5 | 17.2 |
| Example 423 | nBA | 80 | 116.16 | 1,200 | 24.8 | 60.5 | 17.2 |
| Example 424 | nBA | 80 | 116.16 | 1,200 | 24.8 | 60.5 | 17.2 |
| Example 425 | nBA | 80 | 116.16 | 1,200 | 24.8 | 60.5 | 17.2 |
| Example 426 | nBA | 80 | 116.16 | 1,200 | 24.8 | 60.5 | 17.2 |
| Example 427 | nBA | 80 | 116.16 | 1,200 | 24.8 | 60.5 | 17.2 |
| Example 428 | nBA | 80 | 116.16 | 1,200 | 24.8 | 60.5 | 17.2 |
| Example 429 | nBA | 80 | 116.16 | 1,200 | 24.8 | 60.5 | 17.2 |
| Example 430 | nBA | 80 | 116.16 | 1,200 | 24.8 | 60.5 | 17.2 |
| Example 431 | nBA | 80 | 116.16 | 1,200 | 24.8 | 60.5 | 17.2 |
| Example 432 | nBA | 80 | 116.16 | 1,200 | 24.8 | 60.5 | 17.2 |
| Example 433 | nBA | 80 | 116.16 | 1,200 | 24.8 | 60.5 | 17.2 |
| Example 434 | nBA | 80 | 116.16 | 1,200 | 24.8 | 60.5 | 17.2 |
| Example 435 | nBA | 80 | 116.16 | 1,200 | 24.8 | 60.5 | 17.2 |

TABLE 132

Components of chemical liquid for pre-wetting
Mixture of organic solvents
Second organic solvent

| Table 1-11-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 396 | | | | | | | |
| Example 397 | | | | | | | |
| Example 398 | | | | | | | |
| Example 399 | | | | | | | |
| Example 400 | | | | | | | |
| Example 401 | | | | | | | |
| Example 402 | | | | | | | |
| Example 403 | | | | | | | |
| Example 404 | | | | | | | |
| Example 405 | | | | | | | |
| Example 406 | | | | | | | |
| Example 407 | | | | | | | |
| Example 408 | | | | | | | |
| Example 409 | | | | | | | |
| Example 410 | | | | | | | |
| Example 411 | | | | | | | |
| Example 412 | | | | | | | |
| Example 413 | | | | | | | |
| Example 414 | | | | | | | |
| Example 415 | | | | | | | |
| Example 416 | | | | | | | |
| Example 417 | | | | | | | |
| Example 418 | | | | | | | |
| Example 419 | | | | | | | |
| Example 420 | | | | | | | |
| Example 421 | | | | | | | |
| Example 422 | | | | | | | |
| Example 423 | | | | | | | |
| Example 424 | | | | | | | |
| Example 425 | | | | | | | |
| Example 426 | | | | | | | |
| Example 427 | | | | | | | |
| Example 428 | | | | | | | |
| Example 429 | | | | | | | |
| Example 430 | | | | | | | |
| Example 431 | | | | | | | |
| Example 432 | | | | | | | |
| Example 433 | | | | | | | |
| Example 434 | | | | | | | |
| Example 435 | | | | | | | |

TABLE 133

Components of chemical liquid for pre-wetting
Mixture of organic solvents
Third organic solvent

| Table 1-11-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 396 | | | | | | | |
| Example 397 | | | | | | | |
| Example 398 | | | | | | | |
| Example 399 | | | | | | | |
| Example 400 | | | | | | | |
| Example 401 | | | | | | | |
| Example 402 | | | | | | | |
| Example 403 | | | | | | | |
| Example 404 | | | | | | | |
| Example 405 | | | | | | | |
| Example 406 | | | | | | | |
| Example 407 | | | | | | | |
| Example 408 | | | | | | | |
| Example 409 | | | | | | | |
| Example 410 | | | | | | | |
| Example 411 | | | | | | | |
| Example 412 | | | | | | | |

TABLE 133-continued

Components of chemical liquid for pre-wetting
Mixture of organic solvents
Third organic solvent

| Table 1-11-3 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 413 | | | | | | | |
| Example 414 | | | | | | | |
| Example 415 | | | | | | | |
| Example 416 | | | | | | | |
| Example 417 | | | | | | | |
| Example 418 | | | | | | | |
| Example 419 | | | | | | | |
| Example 420 | | | | | | | |
| Example 421 | | | | | | | |
| Example 422 | | | | | | | |
| Example 423 | | | | | | | |
| Example 424 | | | | | | | |
| Example 425 | | | | | | | |
| Example 426 | | | | | | | |
| Example 427 | | | | | | | |
| Example 428 | | | | | | | |
| Example 429 | | | | | | | |
| Example 430 | | | | | | | |
| Example 431 | | | | | | | |
| Example 432 | | | | | | | |
| Example 433 | | | | | | | |
| Example 434 | | | | | | | |
| Example 435 | | | | | | | |

TABLE 134

Components of chemical liquid for pre-wetting
Mixture of organic solvents
Fourth organic solvent

| Table 1-11-4 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 396 | DEE | 10 | 118.18 | 627 | 29.0 | 62.2 | 19.9 |
| Example 397 | DEGIBE | 10 | 162.23 | 133 | 29.0 | 61.9 | 18.7 |
| Example 398 | DEGDME | 10 | 134.18 | 520 | 28.0 | 56.9 | 21.0 |
| Example 399 | DEGDEE | 10 | 162.23 | 253 | 29.0 | 60.4 | 19.6 |
| Example 400 | TriEGDME | 10 | 178.23 | 13 | 28.0 | 56.4 | 20.9 |
| Example 401 | TetraEGDME | 10 | 222.28 | 13 | 27.0 | 55.6 | 21.1 |
| Example 402 | TEGMBE | 10 | 220.31 | 13 | 28.0 | 48.5 | 18.7 |
| Example 403 | DEGMBE | 10 | 162.23 | 117 | 29.0 | 59.4 | 18.1 |
| Example 404 | DEGME | 10 | 120.15 | 13 | 28.0 | 44.3 | 20.8 |
| Example 405 | DME | 10 | 90.12 | 693 | 29.0 | 55.9 | 22.8 |
| Example 406 | DEE | 10 | 118.18 | 627 | 29.0 | 62.2 | 19.9 |
| Example 407 | DEGIBE | 10 | 162.23 | 133 | 29.0 | 61.9 | 18.7 |
| Example 408 | DEGDME | 10 | 134.18 | 520 | 28.0 | 56.9 | 21.0 |
| Example 409 | DEGDEE | 10 | 162.23 | 253 | 29.0 | 60.4 | 19.6 |
| Example 410 | TriEGDME | 10 | 178.23 | 13 | 28.0 | 56.4 | 20.9 |
| Example 411 | TetraEGDME | 10 | 222.28 | 13 | 27.0 | 55.6 | 21.1 |
| Example 412 | TEGMBE | 10 | 220.31 | 13 | 28.0 | 48.5 | 18.7 |
| Example 413 | DEGMBE | 10 | 162.23 | 117 | 29.0 | 59.4 | 18.1 |
| Example 414 | DEGME | 10 | 120.15 | 13 | 28.0 | 44.3 | 20.8 |
| Example 415 | DME | 10 | 90.12 | 693 | 29.0 | 55.9 | 22.8 |
| Example 416 | DEE | 10 | 118.18 | 627 | 29.0 | 62.2 | 19.9 |
| Example 417 | DEGIBE | 10 | 162.23 | 133 | 29.0 | 61.9 | 18.7 |
| Example 418 | DEGDME | 10 | 134.18 | 520 | 28.0 | 56.9 | 21.0 |
| Example 419 | DEGDEE | 10 | 162.23 | 253 | 29.0 | 60.4 | 19.6 |
| Example 420 | TriEGDME | 10 | 178.23 | 13 | 28.0 | 56.4 | 20.9 |
| Example 421 | TetraEGDME | 10 | 222.28 | 13 | 27.0 | 55.6 | 21.1 |
| Example 422 | TEGMBE | 10 | 220.31 | 13 | 28.0 | 48.5 | 18.7 |
| Example 423 | DEGMBE | 10 | 162.23 | 117 | 29.0 | 59.4 | 18.1 |
| Example 424 | DEGME | 10 | 222.28 | 13 | 27.0 | 44.3 | 20.8 |
| Example 425 | DME | 10 | 220.31 | 13 | 28.0 | 55.9 | 22.8 |
| Example 426 | DEE | 10 | 176.21 | 117 | 29.0 | 62.2 | 19.9 |
| Example 427 | DEGIBE | 10 | 120.15 | 13 | 28.0 | 61.9 | 18.7 |
| Example 428 | DEGDME | 10 | 118.18 | 627 | 29.0 | 56.9 | 21.0 |
| Example 429 | DEGDEE | 10 | 162.23 | 133 | 29.0 | 60.4 | 19.6 |

TABLE 134-continued

Components of chemical liquid for pre-wetting
Mixture of organic solvents
Fourth organic solvent

| Table 1-11-4 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 430 | TriEGDME | 10 | 148.2 | 280 | 28.0 | 56.4 | 20.9 |
| Example 431 | TetraEGDME | 10 | 134.18 | 520 | 28.0 | 55.6 | 21.1 |
| Example 432 | TEGMBE | 10 | 162.23 | 253 | 29.0 | 48.5 | 18.7 |
| Example 433 | DEGMBE | 10 | 162.23 | 13 | 28.0 | 59.4 | 18.1 |
| Example 434 | DEGME | 10 | 222.28 | 13 | 27.0 | 44.3 | 20.8 |
| Example 435 | DME | 10 | 220.31 | 13 | 28.0 | 55.9 | 22.8 |

TABLE 135

Components of chemical liquid for pre-wetting
Mixture of organic solvents
Fourth organic solvent

| Table 1-11-5 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 396 | 14-DMB | 10 | 138.17 | 1 | 30.0 | 59.0 | 20.6 |
| Example 397 | 14-DMB | 10 | 138.17 | 1 | 30.0 | 59.0 | 20.6 |
| Example 398 | 14-DMB | 10 | 138.17 | 1 | 30.0 | 59.0 | 20.6 |
| Example 399 | 14-DMB | 10 | 138.17 | 1 | 30.0 | 59.0 | 20.6 |
| Example 400 | 14-DMB | 10 | 138.17 | 1 | 30.0 | 59.0 | 20.6 |
| Example 401 | 14-DMB | 10 | 138.17 | 1 | 30.0 | 59.0 | 20.6 |
| Example 402 | 14-DMB | 10 | 138.17 | 1 | 30.0 | 59.0 | 20.6 |
| Example 403 | 14-DMB | 10 | 138.17 | 1 | 30.0 | 59.0 | 20.6 |
| Example 404 | 12-DMB | 10 | 138.17 | 1 | 30.0 | 60.6 | 20.2 |
| Example 405 | 12-DMB | 10 | 138.17 | 1 | 30.0 | 60.6 | 20.2 |
| Example 406 | 12-DMB | 10 | 138.17 | 1 | 30.0 | 60.6 | 20.2 |
| Example 407 | 12-DMB | 10 | 138.17 | 1 | 30.0 | 60.6 | 20.2 |
| Example 408 | 12-DMB | 10 | 138.17 | 1 | 30.0 | 60.6 | 20.2 |
| Example 409 | 12-DMB | 10 | 138.17 | 1 | 30.0 | 60.6 | 20.2 |
| Example 410 | 12-DMB | 10 | 138.17 | 1 | 30.0 | 60.6 | 20.2 |
| Example 411 | 12-DMB | 10 | 138.17 | 1 | 30.0 | 60.6 | 20.2 |
| Example 412 | 12-DMB | 10 | 138.17 | 1 | 30.0 | 60.6 | 20.2 |
| Example 413 | 12-DMB | 10 | 138.17 | 1 | 30.0 | 60.6 | 20.2 |
| Example 414 | 13-DMB | 10 | 138.17 | 1 | 30.0 | 61.6 | 19.9 |
| Example 415 | 13-DMB | 10 | 138.17 | 1 | 30.0 | 61.6 | 19.9 |
| Example 416 | 13-DMB | 10 | 138.17 | 1 | 30.0 | 61.6 | 19.9 |
| Example 417 | 13-DMB | 10 | 138.17 | 1 | 30.0 | 61.6 | 19.9 |
| Example 418 | 13-DMB | 10 | 138.17 | 1 | 30.0 | 61.6 | 19.9 |
| Example 419 | 13-DMB | 10 | 138.17 | 1 | 30.0 | 61.6 | 19.9 |
| Example 420 | 13-DMB | 10 | 138.17 | 1 | 30.0 | 61.6 | 19.9 |
| Example 421 | 13-DMB | 10 | 138.17 | I | 30.0 | 61.6 | 19.9 |
| Example 422 | 13-DMB | 10 | 138.17 | 1 | 30.0 | 61.6 | 19.9 |
| Example 423 | 13-DMB | 10 | 138.17 | 1 | 30.0 | 61.6 | 19.9 |
| Example 424 | 14-Diphenoxybenzene | 10 | 262.31 | 1 | 33.0 | 63.3 | 18.5 |
| Example 425 | 14-Diphenoxybenzene | 10 | 262.31 | 1 | 33.0 | 63.3 | 18.5 |
| Example 426 | 14-Diphenoxybenzene | 10 | 262.31 | 1 | 33.0 | 63.3 | 18.5 |
| Example 427 | 14-Diphenoxybenzene | 10 | 262.31 | 1 | 33.0 | 63.3 | 18.5 |
| Example 428 | 14-Diphenoxybenzene | 10 | 262.31 | 1 | 33.0 | 63.3 | 18.5 |
| Example 429 | 14-Diphenoxybenzene | 10 | 262.31 | 1 | 33.0 | 63.3 | 18.5 |
| Example 430 | 14-Diphenoxybenzene | 10 | 262.31 | 1 | 33.0 | 63.3 | 18.5 |
| Example 431 | 14-Diphenoxybenzene | 10 | 262.31 | 1 | 33.0 | 63.3 | 18.5 |
| Example 432 | 14-Diphenoxybenzene | 10 | 262.31 | 1 | 33.0 | 63.3 | 18.5 |
| Example 433 | 14-Diphenoxybenzene | 10 | 262.31 | 1 | 33.0 | 63.3 | 18.5 |
| Example 434 | 4-Methoxytoluene | 10 | 122.17 | 1 | 32.0 | 64.8 | 17.4 |
| Example 435 | 4-Methoxytoluene | 10 | 122.17 | 1 | 32.0 | 64.8 | 17.4 |

TABLE 136

Components of chemical liquid for pre-wetting
Mixture of organic solvents

Fifth organic solvent

| Table 1-11-6 | Type | Content (% by mass) | Molar mass (g/mol) | Vapor pressure (Pa) | Surface tension (mN/m) | δh (MPa)^0.5 | δd (MPa)^0.5 | Vapor pressure (Pa) | Surface tension (mN/m) |
|---|---|---|---|---|---|---|---|---|---|
| Example 396 | | | | | | | | 1,040 | 25.7 |
| Example 397 | | | | | | | | 1,015 | 25.6 |
| Example 398 | | | | | | | | 1,035 | 25.5 |
| Example 399 | | | | | | | | 1,024 | 25.6 |
| Example 400 | | | | | | | | 1,012 | 25.5 |
| Example 401 | | | | | | | | 1,026 | 25.4 |
| Example 402 | | | | | | | | 1,026 | 25.4 |
| Example 403 | | | | | | | | 1,013 | 25.6 |
| Example 404 | | | | | | | | 980 | 25.6 |
| Example 405 | | | | | | | | 1,036 | 25.8 |
| Example 406 | | | | | | | | 1,040 | 25.7 |
| Example 407 | | | | | | | | 1,015 | 25.6 |
| Example 408 | | | | | | | | 1,035 | 25.5 |
| Example 409 | | | | | | | | 1,024 | 25.6 |
| Example 410 | | | | | | | | 1,012 | 25.5 |
| Example 411 | | | | | | | | 1,026 | 25.4 |
| Example 412 | | | | | | | | 1,026 | 25.4 |
| Example 413 | | | | | | | | 1,013 | 25.6 |
| Example 414 | | | | | | | | 980 | 25.6 |
| Example 415 | | | | | | | | 1,036 | 25.8 |
| Example 416 | | | | | | | | 1,040 | 25.7 |
| Example 417 | | | | | | | | 1,015 | 25.6 |
| Example 418 | | | | | | | | 1,035 | 25.5 |
| Example 419 | | | | | | | | 1,024 | 25.6 |
| Example 420 | | | | | | | | 1,012 | 25.5 |
| Example 421 | | | | | | | | 1,026 | 25.4 |
| Example 422 | | | | | | | | 1,026 | 25.4 |
| Example 423 | | | | | | | | 1,013 | 25.6 |
| Example 424 | | | | | | | | 1,072 | 25.3 |
| Example 425 | | | | | | | | 1,071 | 25.4 |
| Example 426 | | | | | | | | 1,063 | 25.5 |
| Example 427 | | | | | | | | 1,022 | 25.5 |
| Example 428 | | | | | | | | 1,084 | 25.6 |
| Example 429 | | | | | | | | 1,059 | 25.5 |
| Example 430 | | | | | | | | 1,064 | 25.5 |
| Example 431 | | | | | | | | 1,080 | 25.5 |
| Example 432 | | | | | | | | 1,068 | 25.5 |
| Example 433 | | | | | | | | 1,049 | 25.4 |
| Example 434 | | | | | | | | 1,014 | 25.6 |
| Example 435 | | | | | | | | 1,014 | 25.7 |

TABLE 137

Components of chemical liquid for pre-wetting

| Table 1-11-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 396 | Balance | 0.002 | 0.006 | 0.002 | 0.030 | 0.030 | 0.070 |
| Example 397 | Balance | 0.002 | 0.006 | 0.002 | 0.030 | 0.030 | 0.070 |
| Example 398 | Balance | 0.002 | 0.006 | 0.002 | 0.030 | 0.030 | 0.070 |
| Example 399 | Balance | 0.002 | 0.006 | 0.002 | 0.030 | 0.030 | 0.070 |
| Example 400 | Balance | 0.002 | 0.006 | 0.002 | 0.030 | 0.030 | 0.070 |
| Example 401 | Balance | 0.002 | 0.006 | 0.002 | 0.030 | 0.030 | 0.070 |
| Example 402 | Balance | 0.002 | 0.006 | 0.002 | 0.030 | 0.030 | 0.070 |
| Example 403 | Balance | 0.002 | 0.006 | 0.002 | 0.030 | 0.030 | 0.070 |
| Example 404 | Balance | 0.002 | 0.006 | 0.002 | 0.030 | 0.030 | 0.070 |
| Example 405 | Balance | 0.002 | 0.006 | 0.002 | 0.030 | 0.030 | 0.070 |
| Example 406 | Balance | 0.002 | 0.006 | 0.002 | 0.030 | 0.030 | 0.070 |
| Example 407 | Balance | 0.002 | 0.006 | 0.002 | 0.030 | 0.030 | 0.070 |
| Example 408 | Balance | 0.002 | 0.006 | 0.002 | 0.030 | 0.030 | 0.070 |
| Example 409 | Balance | 0.002 | 0.006 | 0.002 | 0.030 | 0.030 | 0.070 |
| Example 410 | Balance | 0.002 | 0.006 | 0.002 | 0.030 | 0.030 | 0.070 |

TABLE 137-continued

Components of chemical liquid for pre-wetting

| Table 1-11-7 | Mixture of organic solvents Content of mixture in chemical liquid (% by mass) | Impurity metal Total content of impurity metal (mass ppt) | | | | | |
|---|---|---|---|---|---|---|---|
| | | Fe | Cr | Ni | Pb | Others | Total |
| Example 411 | Balance | 0.002 | 0.006 | 0.002 | 0.030 | 0.030 | 0.070 |
| Example 412 | Balance | 0.002 | 0.006 | 0.002 | 0.030 | 0.030 | 0.070 |
| Example 413 | Balance | 0.002 | 0.006 | 0.002 | 0.030 | 0.030 | 0.070 |
| Example 414 | Balance | 0.002 | 0.006 | 0.002 | 0.030 | 0.030 | 0.070 |
| Example 415 | Balance | 0.002 | 0.006 | 0.002 | 0.030 | 0.030 | 0.070 |
| Example 416 | Balance | 0.002 | 0.006 | 0.002 | 0.030 | 0.030 | 0.070 |
| Example 417 | Balance | 0.002 | 0.006 | 0.002 | 0.030 | 0.030 | 0.070 |
| Example 418 | Balance | 0.002 | 0.006 | 0.002 | 0.030 | 0.030 | 0.070 |
| Example 419 | Balance | 0.002 | 0.006 | 0.002 | 0.030 | 0.030 | 0.070 |
| Example 420 | Balance | 0.002 | 0.006 | 0.002 | 0.030 | 0.030 | 0.070 |
| Example 421 | Balance | 0.002 | 0.006 | 0.002 | 0.030 | 0.030 | 0.070 |
| Example 422 | Balance | 0.002 | 0.006 | 0.002 | 0.030 | 0.030 | 0.070 |
| Example 423 | Balance | 0.002 | 0.006 | 0.002 | 0.030 | 0.030 | 0.070 |
| Example 424 | Balance | 0.002 | 0.006 | 0.002 | 0.030 | 0.030 | 0.070 |
| Example 425 | Balance | 0.002 | 0.006 | 0.002 | 0.030 | 0.030 | 0.070 |
| Example 426 | Balance | 0.002 | 0.006 | 0.002 | 0.030 | 0.030 | 0.070 |
| Example 427 | Balance | 0.002 | 0.006 | 0.002 | 0.030 | 0.030 | 0.070 |
| Example 428 | Balance | 0.002 | 0.006 | 0.002 | 0.030 | 0.030 | 0.070 |
| Example 429 | Balance | 0.002 | 0.006 | 0.002 | 0.030 | 0.030 | 0.070 |
| Example 430 | Balance | 0.002 | 0.006 | 0.002 | 0.030 | 0.030 | 0.070 |
| Example 431 | Balance | 0.002 | 0.006 | 0.002 | 0.030 | 0.030 | 0.070 |
| Example 432 | Balance | 0.002 | 0.006 | 0.002 | 0.030 | 0.030 | 0.070 |
| Example 433 | Balance | 0.002 | 0.006 | 0.002 | 0.030 | 0.030 | 0.070 |
| Example 434 | Balance | 0.002 | 0.006 | 0.002 | 0.030 | 0.030 | 0.070 |
| Example 435 | Balance | 0.002 | 0.006 | 0.002 | 0.030 | 0.030 | 0.070 |

TABLE 138

Components of chemical liquid for pre-wetting

| | Impurity metal Content of impurity metal as particles (mass ppt) | | | | | | Organic impurity Specific organic compound | |
|---|---|---|---|---|---|---|---|---|
| | | | | | | | Boiling point: equal to or higher than 250° C. Number of carbon atoms: equal to or | Boiling point: equal to or nigher than 250° C. Number of carbon atoms: equal to or |
| Table 1-11-8 | Fe | Cr | Ni | Pb | Others | Total | greater than 8 | greater than 12 |
| Example 396 | 0.040 | 0.002 | 0.001 | 0.003 | 0.019 | 0.065 | A | A |
| Example 397 | 0.040 | 0.002 | 0.001 | 0.003 | 0.019 | 0.065 | A | A |
| Example 398 | 0.040 | 0.002 | 0.001 | 0.003 | 0.019 | 0.065 | A | A |
| Example 399 | 0.040 | 0.002 | 0.001 | 0.003 | 0.019 | 0.065 | A | A |
| Example 400 | 0.040 | 0.002 | 0.001 | 0.003 | 0.019 | 0.065 | A | A |
| Example 401 | 0.040 | 0.002 | 0.001 | 0.003 | 0.019 | 0.065 | A | A |
| Example 402 | 0.040 | 0.002 | 0.001 | 0.003 | 0.019 | 0.065 | A | A |
| Example 403 | 0.040 | 0.002 | 0.001 | 0.003 | 0.019 | 0.065 | A | A |
| Example 404 | 0.040 | 0.002 | 0.001 | 0.003 | 0.019 | 0.065 | A | A |
| Example 405 | 0.040 | 0.002 | 0.001 | 0.003 | 0.019 | 0.065 | A | A |
| Example 406 | 0.040 | 0.002 | 0.001 | 0.003 | 0.019 | 0.065 | A | A |
| Example 407 | 0.040 | 0.002 | 0.001 | 0.003 | 0.019 | 0.065 | A | A |
| Example 408 | 0.040 | 0.002 | 0.001 | 0.003 | 0.019 | 0.065 | A | A |
| Example 409 | 0.040 | 0.002 | 0.001 | 0.003 | 0.019 | 0.065 | A | A |
| Example 410 | 0.040 | 0.002 | 0.001 | 0.003 | 0.019 | 0.065 | A | A |
| Example 411 | 0.040 | 0.002 | 0.001 | 0.003 | 0.019 | 0.065 | A | A |
| Example 412 | 0.040 | 0.002 | 0.001 | 0.003 | 0.019 | 0.065 | A | A |
| Example 413 | 0.040 | 0.002 | 0.001 | 0.003 | 0.019 | 0.065 | A | A |
| Example 414 | 0.040 | 0.002 | 0.001 | 0.003 | 0.019 | 0.065 | A | A |
| Example 415 | 0.040 | 0.002 | 0.001 | 0.003 | 0.019 | 0.065 | A | A |
| Example 416 | 0.040 | 0.002 | 0.001 | 0.003 | 0.019 | 0.065 | A | A |
| Example 417 | 0.040 | 0.002 | 0.001 | 0.003 | 0.019 | 0.065 | A | A |
| Example 418 | 0.040 | 0.002 | 0.001 | 0.003 | 0.019 | 0.065 | A | A |
| Example 419 | 0.040 | 0.002 | 0.001 | 0.003 | 0.019 | 0.065 | A | A |
| Example 420 | 0.040 | 0.002 | 0.001 | 0.003 | 0.019 | 0.065 | A | A |
| Example 421 | 0.040 | 0.002 | 0.001 | 0.003 | 0.019 | 0.065 | A | A |

TABLE 138-continued

Components of chemical liquid for pre-wetting

| | Impurity metal Content of impurity metal as particles (mass ppt) | | | | | | Organic impurity Specific organic compound | |
|---|---|---|---|---|---|---|---|---|
| | | | | | | | Boiling point: equal to or higher than 250° C. Number of carbon atoms: equal to or | Boiling point: equal to or higher than 250° C. Number of carbon atoms: equal to or |
| Table 1-11-8 | Fe | Cr | Ni | Pb | Others | Total | greater than 8 | greater than 12 |
| Example 422 | 0.040 | 0.002 | 0.001 | 0.003 | 0.019 | 0.065 | A | A |
| Example 423 | 0.040 | 0.002 | 0.001 | 0.003 | 0.019 | 0.065 | A | A |
| Example 424 | 0.040 | 0.002 | 0.001 | 0.003 | 0.019 | 0.065 | A | A |
| Example 425 | 0.040 | 0.002 | 0.001 | 0.003 | 0.019 | 0.065 | A | A |
| Example 426 | 0.040 | 0.002 | 0.001 | 0.003 | 0.019 | 0.065 | A | A |
| Example 427 | 0.040 | 0.002 | 0.001 | 0.003 | 0.019 | 0.065 | A | A |
| Example 428 | 0.040 | 0.002 | 0.001 | 0.003 | 0.019 | 0.065 | A | A |
| Example 429 | 0.040 | 0.002 | 0.001 | 0.003 | 0.019 | 0.065 | A | A |
| Example 430 | 0.040 | 0.002 | 0.001 | 0.003 | 0.019 | 0.065 | A | A |
| Example 431 | 0.040 | 0.002 | 0.001 | 0.003 | 0.019 | 0.065 | A | A |
| Example 432 | 0.040 | 0.002 | 0.001 | 0.003 | 0.019 | 0.065 | A | A |
| Example 433 | 0.040 | 0.002 | 0.001 | 0.003 | 0.019 | 0.065 | A | A |
| Example 434 | 0.040 | 0.002 | 0.001 | 0.003 | 0.019 | 0.065 | A | A |
| Example 435 | 0.040 | 0.002 | 0.001 | 0.003 | 0.019 | 0.065 | A | A |

TABLE 139

Components of chemical liquid for pre-wetting

| | | Organic impurity Content of organic impurity | | | | Physical properties of chemical liquid | |
|---|---|---|---|---|---|---|---|
| Table 1-11-9 | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | for pre-wetting Number of coarse particles (Number of objects to be counted) (Number/mL) | Evaluation Defect inhibition performance |
| Example 396 | 2,500 | 1 | 0.5 | 500 | 0.10% | 6 | AA |
| Example 397 | 2,500 | 1 | 0.5 | 500 | 0.10% | 6 | AA |
| Example 398 | 2,500 | 1 | 0.5 | 500 | 0.10% | 6 | AA |
| Example 399 | 2,500 | I | 0.5 | 500 | 0.10% | 6 | AA |
| Example 400 | 2,500 | 1 | 0.5 | 500 | 0.10% | 6 | AA |
| Example 401 | 2,500 | 1 | 0.5 | 500 | 0.10% | 6 | AA |
| Example 402 | 2,500 | 1 | 0.5 | 500 | 0.10% | 6 | AA |
| Example 403 | 2,500 | 1 | 0.5 | 500 | 0.10% | 6 | AA |
| Example 404 | 2,500 | 1 | 0.5 | 500 | 0.10% | 6 | AA |
| Example 405 | 2,500 | 1 | 0.5 | 500 | 0.10% | 6 | AA |
| Example 406 | 2,500 | 1 | 0.5 | 500 | 0.10% | 6 | AA |
| Example 407 | 2,500 | 1 | 0.5 | 500 | 0.10% | 6 | AA |
| Example 408 | 2,500 | 1 | 0.5 | 500 | 0.10% | 6 | AA |
| Example 409 | 2,500 | 1 | 0.5 | 500 | 0.10% | 6 | AA |
| Example 410 | 2,500 | 1 | 0.5 | 500 | 0.10% | 6 | AA |
| Example 411 | 2,500 | 1 | 0.5 | 500 | 0.10% | 6 | AA |
| Example 412 | 2,500 | 1 | 0.5 | 500 | 0.10% | 6 | AA |
| Example 413 | 2,500 | 1 | 0.5 | 500 | 0.10% | 6 | AA |
| Example 414 | 2,500 | 1 | 0.5 | 500 | 0.10% | 6 | AA |
| Example 415 | 2,500 | 1 | 0.5 | 500 | 0.10% | 6 | AA |
| Example 416 | 2,500 | 1 | 0.5 | 500 | 0.10% | 6 | AA |
| Example 417 | 2,500 | 1 | 0.5 | 500 | 0.10% | 6 | AA |
| Example 418 | 2,500 | 1 | 0.5 | 500 | 0.10% | 6 | AA |
| Example 419 | 2,500 | 1 | 0.5 | 500 | 0.10% | 6 | AA |
| Example 420 | 2,500 | 1 | 0.5 | 500 | 0.10% | 6 | AA |
| Example 421 | 2,500 | 1 | 0.5 | 500 | 0.10% | 6 | AA |
| Example 422 | 2,500 | 1 | 0.5 | 500 | 0.10% | 6 | AA |
| Example 423 | 2,500 | 1 | 0.5 | 500 | 0.10% | 6 | AA |
| Example 424 | 2,500 | 1 | 0.5 | 500 | 0.10% | 6 | AA |
| Example 425 | 2,500 | 1 | 0.5 | 500 | 0.10% | 6 | AA |
| Example 426 | 2,500 | 1 | 0.5 | 500 | 0.10% | 6 | AA |
| Example 427 | 2,500 | 1 | 0.5 | 500 | 0.10% | 6 | AA |
| Example 428 | 2,500 | 1 | 0.5 | 500 | 0.10% | 6 | AA |
| Example 429 | 2,500 | 1 | 0.5 | 500 | 0.10% | 6 | AA |
| Example 430 | 2,500 | 1 | 0.5 | 500 | 0.10% | 6 | AA |

TABLE 139-continued

| | Components of chemical liquid for pre-wetting | | | | | Physical properties of chemical liquid for pre-wetting | |
|---|---|---|---|---|---|---|---|
| | | Organic impurity Content of organic impurity | | | | | |
| Table 1-11-9 | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | Number of coarse particles (Number of objects to be counted) (Number/mL) | Evaluation Defect inhibition performance |
| Example 431 | 2,500 | 1 | 0.5 | 500 | 0.10% | 6 | AA |
| Example 432 | 2,500 | 1 | 0.5 | 500 | 0.10% | 6 | AA |
| Example 433 | 2,500 | 1 | 0.5 | 500 | 0.10% | 6 | AA |
| Example 434 | 2,500 | 1 | 0.5 | 500 | 0.10% | 6 | AA |
| Example 435 | 2,500 | 1 | 0.5 | 500 | 0.10% | 6 | AA |

TABLE 140

| | Evaluation | | | | | | | | | |
|---|---|---|---|---|---|---|---|---|---|---|
| | Type of resist composition | | | | | Type of resist composition | | | | |
| | | Resist saving properties | | | | | Resist saving properties | | | |
| | | Affinity | | | Film thickness | | Affinity | | | Film thickness |
| Table 1-11-10 | | Rsq1 | SRsq | Uniformity | controllability | | Rsq1 | SRsq | Uniformity | controllability |
| Example 396 | 1 | A | A | AA | A | 2 | A | A | A | A |
| Example 397 | 1 | A | A | AA | A | 2 | A | A | A | A |
| Example 398 | 1 | A | A | AA | A | 2 | A | A | A | A |
| Example 399 | 1 | A | A | AA | A | 2 | A | A | A | A |
| Example 400 | 1 | A | A | AA | A | 2 | A | A | A | A |
| Example 401 | 1 | A | A | AA | A | 2 | A | A | A | A |
| Example 402 | 1 | A | A | AA | A | 2 | A | A | A | A |
| Example 403 | 1 | A | A | AA | A | 2 | A | A | A | A |
| Example 404 | 1 | A | A | AA | A | 2 | A | A | A | A |
| Example 405 | 1 | A | A | AA | A | 2 | A | A | A | A |
| Example 406 | 1 | A | A | AA | A | 2 | A | A | A | A |
| Example 407 | 1 | A | A | AA | A | 2 | A | A | A | A |
| Example 408 | 1 | A | A | AA | A | 2 | A | A | A | A |
| Example 409 | 1 | A | A | AA | A | 2 | A | A | A | A |
| Example 410 | 1 | A | A | AA | A | 2 | A | A | A | A |
| Example 411 | 1 | A | A | AA | A | 2 | A | A | A | A |
| Example 412 | 1 | A | A | AA | A | 2 | A | A | A | A |
| Example 413 | 1 | A | A | AA | A | 2 | A | A | A | A |
| Example 414 | 1 | A | A | AA | A | 2 | A | A | A | A |
| Example 415 | 1 | A | A | AA | A | 2 | A | A | A | A |
| Example 416 | 1 | A | A | AA | A | 2 | A | A | A | A |
| Example 417 | 1 | A | A | AA | A | 2 | A | A | A | A |
| Example 418 | 1 | A | A | AA | A | 2 | A | A | A | A |
| Example 419 | 1 | A | A | AA | A | 2 | A | A | A | A |
| Example 420 | 1 | A | A | AA | A | 2 | A | A | A | A |
| Example 421 | 1 | A | A | AA | A | 2 | A | A | A | A |
| Example 422 | 1 | A | A | AA | A | 2 | A | A | A | A |
| Example 423 | 1 | A | A | AA | A | 2 | A | A | A | A |
| Example 424 | 1 | A | A | AA | A | 2 | A | A | A | A |
| Example 425 | 1 | A | A | AA | A | 2 | A | A | A | A |
| Example 426 | 1 | A | A | AA | A | 2 | A | A | A | A |
| Example 427 | 1 | A | A | AA | A | 2 | A | A | A | A |
| Example 428 | 1 | A | A | AA | A | 2 | A | A | A | A |
| Example 429 | 1 | A | A | AA | A | 2 | A | A | A | A |
| Example 430 | 1 | A | A | AA | A | 2 | A | A | A | A |
| Example 431 | 1 | A | A | AA | A | 2 | A | A | A | A |
| Example 432 | 1 | A | A | AA | A | 2 | A | A | A | A |
| Example 433 | 1 | A | A | AA | A | 2 | A | A | A | A |
| Example 434 | 1 | A | A | AA | A | 2 | A | A | A | A |
| Example 435 | 1 | A | A | AA | A | 2 | A | A | A | A |

TABLE 141

| Table 1-11-11 | | Evaluation | | | | | | | | |
|---|---|---|---|---|---|---|---|---|---|---|
| | | Type of resist composition | | | | | Type of resist composition | | | |
| | | | Resist saving properties | | | | | Resist saving properties | | |
| | | | Affinity | | | Film thickness | | Affinity | | Film thickness |
| | | Rsq1 | SRsq | Uniformity | controllability | | Rsq1 | SRsq | Uniformity | controllability |
| Example 396 | 3 | A | A | AA | A | 4 | A | A | AA | A |
| Example 397 | 3 | A | A | AA | A | 4 | A | A | AA | A |
| Example 398 | 3 | A | A | AA | A | 4 | A | A | AA | A |
| Example 399 | 3 | A | A | AA | A | 4 | A | A | AA | A |
| Example 400 | 3 | A | A | AA | A | 4 | A | A | AA | A |
| Example 401 | 3 | A | A | AA | A | 4 | A | A | AA | A |
| Example 402 | 3 | A | A | AA | A | 4 | A | A | AA | A |
| Example 403 | 3 | A | A | AA | A | 4 | A | A | AA | A |
| Example 404 | 3 | A | A | AA | A | 4 | A | A | AA | A |
| Example 405 | 3 | A | A | AA | A | 4 | A | A | AA | A |
| Example 406 | 3 | A | A | AA | A | 4 | A | A | AA | A |
| Example 407 | 3 | A | A | AA | A | 4 | A | A | AA | A |
| Example 408 | 3 | A | A | AA | A | 4 | A | A | AA | A |
| Example 409 | 3 | A | A | AA | A | 4 | A | A | AA | A |
| Example 410 | 3 | A | A | AA | A | 4 | A | A | AA | A |
| Example 411 | 3 | A | A | AA | A | 4 | A | A | AA | A |
| Example 412 | 3 | A | A | AA | A | 4 | A | A | AA | A |
| Example 413 | 3 | A | A | AA | A | 4 | A | A | AA | A |
| Example 414 | 3 | A | A | AA | A | 4 | A | A | AA | A |
| Example 415 | 3 | A | A | AA | A | 4 | A | A | AA | A |
| Example 416 | 3 | A | A | AA | A | 4 | A | A | AA | A |
| Example 417 | 3 | A | A | AA | A | 4 | A | A | AA | A |
| Example 418 | 3 | A | A | AA | A | 4 | A | A | AA | A |
| Example 419 | 3 | A | A | AA | A | 4 | A | A | AA | A |
| Example 420 | 3 | A | A | AA | A | 4 | A | A | AA | A |
| Example 421 | 3 | A | A | AA | A | 4 | A | A | AA | A |
| Example 422 | 3 | A | A | AA | A | 4 | A | A | AA | A |
| Example 423 | 3 | A | A | AA | A | 4 | A | A | AA | A |
| Example 424 | 3 | A | A | AA | A | 4 | A | A | AA | A |
| Example 425 | 3 | A | A | AA | A | 4 | A | A | AA | A |
| Example 426 | 3 | A | A | AA | A | 4 | A | A | AA | A |
| Example 427 | 3 | A | A | AA | A | 4 | A | A | AA | A |
| Example 428 | 3 | A | A | AA | A | 4 | A | A | AA | A |
| Example 429 | 3 | A | A | AA | A | 4 | A | A | AA | A |
| Example 430 | 3 | A | A | AA | A | 4 | A | A | AA | A |
| Example 431 | 3 | A | A | AA | A | 4 | A | A | AA | A |
| Example 432 | 3 | A | A | AA | A | 4 | A | A | AA | A |
| Example 433 | 3 | A | A | AA | A | 4 | A | A | AA | A |
| Example 434 | 3 | A | A | AA | A | 4 | A | A | AA | A |
| Example 435 | 3 | A | A | AA | A | 4 | A | A | AA | A |

TABLE 142

| Table 1-11-12 | | Evaluation | | | | | | | | |
|---|---|---|---|---|---|---|---|---|---|---|
| | | Type of resist composition | | | | | Type of resist composition | | | |
| | | | Resist saving properties | | | | | Resist saving properties | | |
| | | | Affinity | | | Film thickness | | Affinity | | Film thickness |
| | | Rsq1 | SRsq | Uniformity | controllability | | Rsq1 | SRsq | Uniformity | controllability |
| Example 396 | 5 | A | A | AA | A | 6 | A | A | AA | A |
| Example 397 | 5 | A | A | AA | A | 6 | A | A | AA | A |
| Example 398 | 5 | A | A | AA | A | 6 | A | A | AA | A |
| Example 399 | 5 | A | A | AA | A | 6 | A | A | AA | A |
| Example 400 | 5 | A | A | AA | A | 6 | A | A | AA | A |
| Example 401 | 5 | A | A | AA | A | 6 | A | A | AA | A |
| Example 402 | 5 | A | A | AA | A | 6 | A | A | AA | A |
| Example 403 | 5 | A | A | AA | A | 6 | A | A | AA | A |
| Example 404 | 5 | A | A | AA | A | 6 | A | A | AA | A |
| Example 405 | 5 | A | A | AA | A | 6 | A | A | AA | A |
| Example 406 | 5 | A | A | AA | A | 6 | A | A | AA | A |

TABLE 142-continued

| Table 1-11-12 | | Evaluation Type of resist composition | | | | | Evaluation Type of resist composition | | | |
|---|---|---|---|---|---|---|---|---|---|---|
| | | | | Resist saving properties | | | | | Resist saving properties | |
| | | Affinity | | | Film thickness | | Affinity | | | Film thickness |
| | Rsq1 | SRsq | Uniformity | controllability | | Rsq1 | SRsq | Uniformity | controllability |
| Example 407 | 5 | A | A | AA | A | 6 | A | A | AA | A |
| Example 408 | 5 | A | A | AA | A | 6 | A | A | AA | A |
| Example 409 | 5 | A | A | AA | A | 6 | A | A | AA | A |
| Example 410 | 5 | A | A | AA | A | 6 | A | A | AA | A |
| Example 411 | 5 | A | A | AA | A | 6 | A | A | AA | A |
| Example 412 | 5 | A | A | AA | A | 6 | A | A | AA | A |
| Example 413 | 5 | A | A | AA | A | 6 | A | A | AA | A |
| Example 414 | 5 | A | A | AA | A | 6 | A | A | AA | A |
| Example 415 | 5 | A | A | AA | A | 6 | A | A | AA | A |
| Example 416 | 5 | A | A | AA | A | 6 | A | A | AA | A |
| Example 417 | 5 | A | A | AA | A | 6 | A | A | AA | A |
| Example 418 | 5 | A | A | AA | A | 6 | A | A | AA | A |
| Example 419 | 5 | A | A | AA | A | 6 | A | A | AA | A |
| Example 420 | 5 | A | A | AA | A | 6 | A | A | AA | A |
| Example 421 | 5 | A | A | AA | A | 6 | A | A | AA | A |
| Example 422 | 5 | A | A | AA | A | 6 | A | A | AA | A |
| Example 423 | 5 | A | A | AA | A | 6 | A | A | AA | A |
| Example 424 | 5 | A | A | AA | A | 6 | A | A | AA | A |
| Example 425 | 5 | A | A | AA | A | 6 | A | A | AA | A |
| Example 426 | 5 | A | A | AA | A | 6 | A | A | AA | A |
| Example 427 | 5 | A | A | AA | A | 6 | A | A | AA | A |
| Example 428 | 5 | A | A | AA | A | 6 | A | A | AA | A |
| Example 429 | 5 | A | A | AA | A | 6 | A | A | AA | A |
| Example 430 | 5 | A | A | AA | A | 6 | A | A | AA | A |
| Example 431 | 5 | A | A | AA | A | 6 | A | A | AA | A |
| Example 432 | 5 | A | A | AA | A | 6 | A | A | AA | A |
| Example 433 | 5 | A | A | AA | A | 6 | A | A | AA | A |
| Example 434 | 5 | A | A | AA | A | 6 | A | A | AA | A |
| Example 435 | 5 | A | A | AA | A | 6 | A | A | AA | A |

TABLE 143

| Table 1-11-13 | | Evaluation Type of resist composition | | | |
|---|---|---|---|---|---|
| | | | | Resist saving properties | |
| | | Affinity | | | Film thickness |
| | Rsq1 | SRsq | Uniformity | controllability |
| Example 396 | 7 | A | A | AA | A |
| Example 397 | 7 | A | A | AA | A |
| Example 398 | 7 | A | A | AA | A |
| Example 399 | 7 | A | A | AA | A |
| Example 400 | 7 | A | A | AA | A |
| Example 401 | 7 | A | A | AA | A |
| Example 402 | 7 | A | A | AA | A |
| Example 403 | 7 | A | A | AA | A |
| Example 404 | 7 | A | A | AA | A |
| Example 405 | 7 | A | A | AA | A |
| Example 406 | 7 | A | A | AA | A |
| Example 407 | 7 | A | A | AA | A |
| Example 408 | 7 | A | A | AA | A |
| Example 409 | 7 | A | A | AA | A |
| Example 410 | 7 | A | A | AA | A |
| Example 411 | 7 | A | A | AA | A |
| Example 412 | 7 | A | A | AA | A |
| Example 413 | 7 | A | A | AA | A |
| Example 414 | 7 | A | A | AA | A |
| Example 415 | 7 | A | A | AA | A |
| Example 416 | 7 | A | A | AA | A |
| Example 417 | 7 | A | A | AA | A |
| Example 418 | 7 | A | A | AA | A |
| Example 419 | 7 | A | A | AA | A |
| Example 420 | 7 | A | A | AA | A |
| Example 421 | 7 | A | A | AA | A |
| Example 422 | 7 | A | A | AA | A |
| Example 423 | 7 | A | A | AA | A |
| Example 424 | 7 | A | A | AA | A |
| Example 425 | 7 | A | A | AA | A |
| Example 426 | 7 | A | A | AA | A |
| Example 427 | 7 | A | A | AA | A |
| Example 428 | 7 | A | A | AA | A |
| Example 429 | 7 | A | A | AA | A |
| Example 430 | 7 | A | A | AA | A |
| Example 431 | 7 | A | A | AA | A |
| Example 432 | 7 | A | A | AA | A |
| Example 433 | 7 | A | A | AA | A |
| Example 434 | 7 | A | A | AA | A |
| Example 435 | 7 | A | A | AA | A |

TABLE 144

Components of chemical liquid for pre-wetting
Mixture of organic solvents
First organic solvent

| Table 1-12-1 | Type | Content (% by mass) | Molar mass (g/mol) | Vapor pressure (Pa) | Surface tension (mN/m) | $\delta h$ $(MPa)^{0.5}$ | $\delta d$ $(MPa)^{0.5}$ |
|---|---|---|---|---|---|---|---|
| Example 436 | nBA | 80 | 116.16 | 1,200 | 24.8 | 60.5 | 17.2 |
| Example 437 | nBA | 80 | 116.16 | 1,200 | 24.8 | 60.5 | 17.2 |
| Example 438 | nBA | 80 | 116.16 | 1,200 | 24.8 | 60.5 | 17.2 |
| Example 439 | nBA | 80 | 116.16 | 1,200 | 24.8 | 60.5 | 17.2 |
| Example 440 | nBA | 80 | 116.16 | 1,200 | 24.8 | 60.5 | 17.2 |
| Example 441 | nBA | 80 | 116.16 | 1,200 | 24.8 | 60.5 | 17.2 |
| Example 442 | nBA | 80 | 116.16 | 1,200 | 24.8 | 60.5 | 17.2 |
| Example 443 | nBA | 80 | 116.16 | 1,200 | 24.8 | 60.5 | 17.2 |
| Example 444 | nBA | 80 | 116.16 | 1,200 | 24.8 | 60.5 | 17.2 |
| Example 445 | nBA | 80 | 116.16 | 1,200 | 24.8 | 60.5 | 17.2 |
| Example 446 | nBA | 80 | 116.16 | 1,200 | 24.8 | 60.5 | 17.2 |
| Example 447 | nBA | 80 | 116.16 | 1,200 | 24.8 | 60.5 | 17.2 |
| Example 448 | nBA | 80 | 116.16 | 1,200 | 24.8 | 60.5 | 17.2 |
| Example 449 | nBA | 80 | 116.16 | 1,200 | 24.8 | 60.5 | 17.2 |
| Example 450 | nBA | 80 | 116.16 | 1,200 | 24.8 | 60.5 | 17.2 |
| Example 451 | nBA | 80 | 116.16 | 1,200 | 24.8 | 60.5 | 17.2 |
| Example 452 | nBA | 80 | 116.16 | 1,200 | 24.8 | 60.5 | 17.2 |
| Example 453 | nBA | 80 | 116.16 | 1,200 | 24.8 | 60.5 | 17.2 |
| Example 454 | PGME | 90 | 90.12 | 1,453 | 27.6 | 43.2 | 28.8 |
| Example 455 | nBA | 90 | 116.16 | 1,200 | 24.8 | 60.5 | 17.2 |
| Example 456 | | | | | | | |
| Example 457 | | | | | | | |
| Example 458 | | | | | | | |
| Example 459 | | | | | | | |
| Example 460 | | | | | | | |
| Example 461 | PGME | 30 | 90.1 | 1,453 | 27.6 | 5.2 | 17.1 |
| Example 462 | PGME | 30 | 90.1 | 1,453 | 27.6 | 5.2 | 17.1 |
| Example 463 | PGME | 30 | 90.1 | 1,453 | 27.6 | 5.2 | 17.1 |
| Example 464 | PGME | 30 | 90.1 | 1,453 | 27.6 | 5.2 | 17.1 |
| Example 465 | PGME | 30 | 90.1 | 1,453 | 27.6 | 5.2 | 17.1 |

TABLE 145

Components of chemical liquid for pre-wetting
Mixture of organic solvents
Second organic solvent

| Table 1-12-2 | Type | Content (% by mass) | Molar mass (g/mol) | Vapor pressure (Pa) | Surface tension (mN/m) | $\delta h$ $(MPa)^{0.5}$ | $\delta d$ $(MPa)^{0.5}$ |
|---|---|---|---|---|---|---|---|
| Example 436 | | | | | | | |
| Example 437 | | | | | | | |
| Example 438 | | | | | | | |
| Example 439 | | | | | | | |
| Example 440 | | | | | | | |
| Example 441 | | | | | | | |
| Example 442 | | | | | | | |
| Example 443 | | | | | | | |
| Example 444 | | | | | | | |
| Example 445 | | | | | | | |
| Example 446 | | | | | | | |
| Example 447 | | | | | | | |
| Example 448 | | | | | | | |
| Example 449 | | | | | | | |
| Example 450 | | | | | | | |
| Example 451 | | | | | | | |
| Example 452 | | | | | | | |
| Example 453 | | | | | | | |
| Example 454 | | | | | | | |
| Example 455 | | | | | | | |
| Example 456 | PGMEA | 90 | 132.16 | 493 | 27.9 | 56.5 | 19.8 |
| Example 457 | EL | 90 | 118.13 | 187 | 29.8 | 55.5 | 19.8 |
| Example 458 | | | | | | | |
| Example 459 | | | | | | | |
| Example 460 | | | | | | | |
| Example 461 | PGMEA | 70 | 132.16 | 493 | 27.9 | 9.8 | 15.6 |
| Example 462 | PGMEA | 70 | 132.16 | 493 | 27.9 | 9.8 | 15.6 |

TABLE 145-continued

Components of chemical liquid for pre-wetting
Mixture of organic solvents
Second organic solvent

| Table 1-12-2 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 463 | PGMEA | 70 | 132.16 | 493 | 27.9 | 9.8 | 15.6 |
| Example 464 | PGMEA | 70 | 132.16 | 493 | 27.9 | 9.8 | 15.6 |
| Example 465 | PGMEA | 70 | 132.16 | 493 | 27.9 | 9.8 | 15.6 |

TABLE 146

Components of chemical liquid for pre-wetting
Mixture of organic solvents
Third organic solvent

| Table 1-12-3 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 436 | | | | | | | |
| Example 437 | | | | | | | |
| Example 438 | | | | | | | |
| Example 439 | | | | | | | |
| Example 440 | | | | | | | |
| Example 441 | | | | | | | |
| Example 442 | | | | | | | |
| Example 443 | | | | | | | |
| Example 444 | | | | | | | |
| Example 445 | | | | | | | |
| Example 446 | | | | | | | |
| Example 447 | | | | | | | |
| Example 448 | | | | | | | |
| Example 449 | | | | | | | |
| Example 450 | | | | | | | |
| Example 451 | | | | | | | |
| Example 452 | | | | | | | |
| Example 453 | | | | | | | |
| Example 454 | | | | | | | |
| Example 455 | | | | | | | |
| Example 456 | | | | | | | |
| Example 457 | | | | | | | |
| Example 458 | GBL | 20 | 86.08 | 147 | 44.1 | 42.9 | 39.5 |
| Example 459 | DMSO | 10 | 78.13 | 13 | 43.6 | 40.9 | 36.4 |
| Example 460 | PC | 20 | 102.09 | 53 | 40.9 | 47.5 | 42.8 |
| Example 461 | | | | | | | |
| Example 462 | | | | | | | |
| Example 463 | | | | | | | |
| Example 464 | | | | | | | |
| Example 465 | | | | | | | |

TABLE 147

Components of chemical liquid for pre-wetting
Mixture of organic solvents
Fourth organic solvent

| Table 1-12-4 | Type | Content (% by mass) | Molar mass (g/mol) | Vapor pressure (Pa) | Surface tension (mN/m) | δh $(MPa)^{0.5}$ | δd $(MPa)^{0.5}$ |
|---|---|---|---|---|---|---|---|
| Example 436 | DEE | 10 | 176.21 | 117 | 29.0 | 62.2 | 19.9 |
| Example 437 | DEGIBE | 10 | 120.15 | 13 | 28.0 | 61.9 | 18.7 |
| Example 438 | DEGDME | 10 | 118.18 | 627 | 29.0 | 56.9 | 21.0 |
| Example 439 | DEGDEE | 10 | 162.23 | 133 | 29.0 | 60.4 | 19.6 |
| Example 440 | TriEGDME | 10 | 148.2 | 280 | 28.0 | 56.4 | 20.9 |
| Example 441 | TetraEGDME | 10 | 134.18 | 520 | 28.0 | 55.6 | 21.1 |
| Example 442 | TEGMBE | 10 | 162.23 | 253 | 29.0 | 48.5 | 18.7 |
| Example 443 | DEGMBE | 10 | 162.23 | 13 | 28.0 | 59.4 | 18.1 |

TABLE 147-continued

Components of chemical liquid for pre-wetting
Mixture of organic solvents
Fourth organic solvent

| Table 1-12-4 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 444 | DEGME | 10 | 222.28 | 13 | 27.0 | 44.3 | 20.8 |
| Example 445 | DME | 10 | 220.31 | 13 | 28.0 | 55.9 | 22.8 |
| Example 446 | DEE | 10 | 176.21 | 117 | 29.0 | 62.2 | 19.9 |
| Example 447 | DEGIBE | 10 | 120.15 | 13 | 28.0 | 61.9 | 18.7 |
| Example 448 | DEGDME | 10 | 118.18 | 627 | 29.0 | 56.9 | 21.0 |
| Example 449 | DEGDEE | 10 | 162.23 | 133 | 29.0 | 60.4 | 19.6 |
| Example 450 | TriEGDME | 10 | 148.2 | 280 | 28.0 | 56.4 | 20.9 |
| Example 451 | TetraEGDME | 10 | 134.18 | 520 | 28.0 | 55.6 | 21.1 |
| Example 452 | TEGMBE | 10 | 162.23 | 253 | 29.0 | 48.5 | 18.7 |
| Example 453 | DEGMBE | 10 | 162.23 | 13 | 28.0 | 59.4 | 18.1 |
| Example 454 | | | | | | | |
| Example 455 | | | | | | | |
| Example 456 | | | | | | | |
| Example 457 | | | | | | | |
| Example 458 | | | | | | | |
| Example 459 | | | | | | | |
| Example 460 | | | | | | | |
| Example 461 | | | | | | | |
| Example 462 | | | | | | | |
| Example 463 | | | | | | | |
| Example 464 | | | | | | | |
| Example 465 | | | | | | | |

TABLE 148

Components of chemical liquid for pre-wetting
Mixture of organic solvents
Fourth organic solvent

| Table 1-12-5 | Type | Content (% by mass) | Molar mass (g/mol) | Vapor pressure (Pa) | Surface tension (mN/m) | δh (MPa)$^{0.5}$ | δd (MPa)$^{0.5}$ |
|---|---|---|---|---|---|---|---|
| Example 436 | 4-Methoxytoluene | 10 | 122.17 | 1 | 32.0 | 64.8 | 17.4 |
| Example 437 | 4-Methoxytoluene | 10 | 122.17 | 1 | 32.0 | 64.8 | 17.4 |
| Example 438 | 4-Methoxytoluene | 10 | 122.17 | 1 | 32.0 | 64.8 | 17.4 |
| Example 439 | 4-Methoxytoluene | 10 | 122.17 | 1 | 32.0 | 64.8 | 17.4 |
| Example 440 | 4-Methoxytoluene | 10 | 122.17 | 1 | 32.0 | 64.8 | 17.4 |
| Example 441 | 4-Methoxytoluene | 10 | 122.17 | 1 | 32.0 | 64.8 | 17.4 |
| Example 442 | 4-Methoxytoluene | 10 | 122.17 | 1 | 32.0 | 64.8 | 17.4 |
| Example 443 | 4-Methoxytoluene | 10 | 122.17 | 1 | 32.0 | 64.8 | 17.4 |
| Example 444 | Phenetole | 10 | 122.17 | 1 | 31.0 | 66.3 | 16.3 |
| Example 445 | Phenetole | 10 | 122.17 | 1 | 31.0 | 66.3 | 16.3 |
| Example 446 | Phenetole | 10 | 122.17 | 1 | 31.0 | 66.3 | 16.3 |
| Example 447 | Phenetole | 10 | 122.17 | 1 | 31.0 | 66.3 | 16.3 |
| Example 448 | Phenetole | 10 | 122.17 | 1 | 31.0 | 66.3 | 16.3 |
| Example 449 | Phenetole | 10 | 122.17 | 1 | 31.0 | 66.3 | 16.3 |
| Example 450 | Phenetole | 10 | 122.17 | 1 | 31.0 | 66.3 | 16.3 |
| Example 451 | Phenetole | 10 | 122.17 | 1 | 31.0 | 66.3 | 16.3 |
| Example 452 | Phenetole | 10 | 122.17 | 1 | 31.0 | 66.3 | 16.3 |
| Example 453 | Phenetole | 10 | 122.17 | 1 | 31.0 | 66.3 | 16.3 |
| Example 454 | | | | | | | |
| Example 455 | | | | | | | |
| Example 456 | | | | | | | |
| Example 457 | | | | | | | |
| Example 458 | | | | | | | |
| Example 459 | | | | | | | |
| Example 460 | | | | | | | |
| Example 461 | | | | | | | |
| Example 462 | | | | | | | |
| Example 463 | | | | | | | |
| Example 464 | | | | | | | |
| Example 465 | | | | | | | |

TABLE 149

Components of chemical liquid for pre-wetting
Mixture of organic solvents

Fifth organic solvent

| Table 1-12-6 | Type | Content (% by mass) | Molar mass (g/mol) | Vapor pressure (Pa) | Surface tension (mN/m) | δh $(MPa)^{0.5}$ | δd $(MPa)^{0.5}$ | Vapor pressure (Pa) | Surface tension (mN/m) |
|---|---|---|---|---|---|---|---|---|---|
| Example 436 | | | | | | | | 1,007 | 25.8 |
| Example 437 | | | | | | | | 969 | 25.8 |
| Example 438 | | | | | | | | 1,028 | 25.9 |
| Example 439 | | | | | | | | 1,003 | 25.8 |
| Example 440 | | | | | | | | 1,009 | 25.8 |
| Example 441 | | | | | | | | 1,024 | 25.8 |
| Example 442 | | | | | | | | 1,012 | 25.8 |
| Example 443 | | | | | | | | 994 | 25.7 |
| Example 444 | | | | | | | | 1,014 | 25.5 |
| Example 445 | | | | | | | | 1,014 | 25.6 |
| Example 446 | | | | | | | | 1,007 | 25.7 |
| Example 447 | | | | | | | | 969 | 25.7 |
| Example 448 | | | | | | | | 1,028 | 25.8 |
| Example 449 | | | | | | | | 1,003 | 25.7 |
| Example 450 | | | | | | | | 1,009 | 25.7 |
| Example 451 | | | | | | | | 1,024 | 25.7 |
| Example 452 | | | | | | | | 1,012 | 25.7 |
| Example 453 | | | | | | | | 994 | 25.6 |
| Example 454 | MMP | 10 | 118.13 | 320 | 33.6 | 53.0 | 22.0 | 1,365 | 28.1 |
| Example 455 | MMP | 10 | 118.13 | 320 | 33.6 | 53.0 | 22.0 | 1,113 | 25.7 |
| Example 456 | MMP | 10 | 118.13 | 320 | 33.6 | 53.0 | 22.0 | 474 | 28.5 |
| Example 457 | MMP | 10 | 118.13 | 320 | 33.6 | 53.0 | 22.0 | 200 | 30.2 |
| Example 458 | MMP | 80 | 118.13 | 320 | 33.6 | 53.0 | 22.0 | 276 | 36.3 |
| Example 459 | MMP | 90 | 118.13 | 320 | 33.6 | 53.0 | 22.0 | 276 | 35.0 |
| Example 460 | MMP | 80 | 118.13 | 320 | 33.6 | 53.0 | 22.0 | 260 | 35.2 |
| Example 461 | | | | | | | | 864 | 27.8 |
| Example 462 | | | | | | | | 864 | 27.8 |
| Example 463 | | | | | | | | 864 | 27.8 |
| Example 464 | | | | | | | | 864 | 27.8 |
| Example 465 | | | | | | | | 864 | 27.8 |

TABLE 150

Components of chemical liquid for pre-wetting

| Table 1-12-7 | Content of mixture in chemical liquid (% by mass) | Mixture of organic solvents Impurity metal Total content of impurity metal (mass ppt) | | | | | |
|---|---|---|---|---|---|---|---|
| | | Fe | Cr | Ni | Pb | Others | Total |
| Example 436 | Balance | 0.002 | 0.006 | 0.002 | 0.030 | 0.030 | 0.070 |
| Example 437 | Balance | 0.002 | 0.006 | 0.002 | 0.030 | 0.030 | 0.070 |
| Example 438 | Balance | 0.002 | 0.006 | 0.002 | 0.030 | 0.030 | 0.070 |
| Example 439 | Balance | 0.002 | 0.006 | 0.002 | 0.030 | 0.030 | 0.070 |
| Example 440 | Balance | 0.002 | 0.006 | 0.002 | 0.030 | 0.030 | 0.070 |
| Example 441 | Balance | 0.002 | 0.006 | 0.002 | 0.030 | 0.030 | 0.070 |
| Example 442 | Balance | 0.002 | 0.006 | 0.002 | 0.030 | 0.030 | 0.070 |
| Example 443 | Balance | 0.002 | 0.006 | 0.002 | 0.030 | 0.030 | 0.070 |
| Example 444 | Balance | 0.002 | 0.006 | 0.002 | 0.030 | 0.030 | 0.070 |
| Example 445 | Balance | 0.002 | 0.006 | 0.002 | 0.030 | 0.030 | 0.070 |
| Example 446 | Balance | 0.002 | 0.006 | 0.002 | 0.030 | 0.030 | 0.070 |
| Example 447 | Balance | 0.002 | 0.006 | 0.002 | 0.030 | 0.030 | 0.070 |
| Example 448 | Balance | 0.002 | 0.006 | 0.002 | 0.030 | 0.030 | 0.070 |
| Example 449 | Balance | 0.002 | 0.006 | 0.002 | 0.030 | 0.030 | 0.070 |
| Example 450 | Balance | 0.002 | 0.006 | 0.002 | 0.030 | 0.030 | 0.070 |
| Example 451 | Balance | 0.002 | 0.006 | 0.002 | 0.030 | 0.030 | 0.070 |
| Example 452 | Balance | 0.002 | 0.006 | 0.002 | 0.030 | 0.030 | 0.070 |
| Example 453 | Balance | 0.002 | 0.006 | 0.002 | 0.030 | 0.030 | 0.070 |
| Example 454 | Balance | 0.006 | 0.002 | 0.006 | 0.004 | 0.030 | 0.048 |
| Example 455 | Balance | 0.006 | 0.002 | 0.006 | 0.004 | 0.030 | 0.048 |
| Example 456 | Balance | 0.006 | 0.002 | 0.006 | 0.004 | 0.030 | 0.048 |
| Example 457 | Balance | 0.006 | 0.002 | 0.006 | 0.004 | 0.030 | 0.048 |
| Example 458 | Balance | 0.006 | 0.002 | 0.006 | 0.004 | 0.030 | 0.048 |
| Example 459 | Balance | 0.006 | 0.002 | 0.006 | 0.004 | 0.030 | 0.048 |
| Example 460 | Balance | 0.006 | 0.002 | 0.006 | 0.004 | 0.030 | 0.048 |
| Example 461 | Balance | 0.104 | 0.064 | 0.090 | 0.052 | 0.330 | 0.640 |
| Example 462 | Balance | 0.104 | 0.064 | 0.090 | 0.052 | 0.330 | 0.640 |
| Example 463 | Balance | 0.104 | 0.064 | 0.090 | 0.052 | 0.330 | 0.640 |
| Example 464 | Balance | 0.104 | 0.064 | 0.090 | 0.052 | 0.330 | 0.640 |
| Example 465 | Balance | 0.104 | 0.064 | 0.090 | 0.052 | 0.330 | 0.640 |

TABLE 151

Components of chemical liquid for pre-wetting

| Table 1-12-8 | Impurity metal Content of impurity metal as particles (mass ppt) | | | | | | Organic impurity Specific organic compound | |
|---|---|---|---|---|---|---|---|---|
| | Fe | Cr | Ni | Pb | Others | Total | Boiling point: equal to or higher than 250° C. Number of carbon atoms: equal to or greater than 8 | Boiling point: equal to or higher than 250° C. Number of carbon atoms: equal to or greater than 12 |
| Example 436 | 0.040 | 0.002 | 0.001 | 0.003 | 0.019 | 0.065 | A | A |
| Example 437 | 0.040 | 0.002 | 0.001 | 0.003 | 0.019 | 0.065 | A | A |
| Example 438 | 0.040 | 0.002 | 0.001 | 0.003 | 0.019 | 0.065 | A | A |
| Example 439 | 0.040 | 0.002 | 0.001 | 0.003 | 0.019 | 0.065 | A | A |
| Example 440 | 0.040 | 0.002 | 0.001 | 0.003 | 0.019 | 0.065 | A | A |
| Example 441 | 0.040 | 0.002 | 0.001 | 0.003 | 0.019 | 0.065 | A | A |
| Example 442 | 0.040 | 0.002 | 0.001 | 0.003 | 0.019 | 0.065 | A | A |
| Example 443 | 0.040 | 0.002 | 0.001 | 0.003 | 0.019 | 0.065 | A | A |
| Example 444 | 0.040 | 0.002 | 0.001 | 0.003 | 0.019 | 0.065 | A | A |
| Example 445 | 0.040 | 0.002 | 0.001 | 0.003 | 0.019 | 0.065 | A | A |
| Example 446 | 0.040 | 0.002 | 0.001 | 0.003 | 0.019 | 0.065 | A | A |
| Example 447 | 0.040 | 0.002 | 0.001 | 0.003 | 0.019 | 0.065 | A | A |
| Example 448 | 0.040 | 0.002 | 0.001 | 0.003 | 0.019 | 0.065 | A | A |
| Example 449 | 0.040 | 0.002 | 0.001 | 0.003 | 0.019 | 0.065 | A | A |
| Example 450 | 0.040 | 0.002 | 0.001 | 0.003 | 0.019 | 0.065 | A | A |
| Example 451 | 0.040 | 0.002 | 0.001 | 0.003 | 0.019 | 0.065 | A | A |
| Example 452 | 0.040 | 0.002 | 0.001 | 0.003 | 0.019 | 0.065 | A | A |
| Example 453 | 0.040 | 0.002 | 0.001 | 0.003 | 0.019 | 0.065 | A | A |
| Example 454 | 0.032 | 0.050 | 0.003 | 0.001 | 0.019 | 0.105 | A | A |
| Example 455 | 0.032 | 0.050 | 0.003 | 0.001 | 0.019 | 0.105 | A | A |
| Example 456 | 0.032 | 0.050 | 0.003 | 0.001 | 0.019 | 0.105 | A | A |
| Example 457 | 0.032 | 0.050 | 0.003 | 0.001 | 0.019 | 0.105 | A | A |
| Example 458 | 0.032 | 0.050 | 0.003 | 0.001 | 0.019 | 0.105 | A | A |
| Example 459 | 0.032 | 0.050 | 0.003 | 0.001 | 0.019 | 0.105 | A | A |
| Example 460 | 0.032 | 0.050 | 0.003 | 0.001 | 0.019 | 0.105 | A | A |
| Example 461 | 0.052 | 0.032 | 0.045 | 0.026 | 0.165 | 0.320 | A | A |
| Example 462 | 0.052 | 0.032 | 0.045 | 0.026 | 0.165 | 0.320 | A | A |
| Example 463 | 0.052 | 0.032 | 0.045 | 0.026 | 0.165 | 0.320 | A | A |
| Example 464 | 0.052 | 0.032 | 0.045 | 0.026 | 0.165 | 0.320 | A | A |
| Example 465 | 0.052 | 0.032 | 0.045 | 0.026 | 0.165 | 0.320 | A | A |

TABLE 152

| Table 1-12-9 | Components of chemical liquid for pre-wetting | | | | | Physical properties of chemical liquid for pre-wetting | |
|---|---|---|---|---|---|---|---|
| | Organic impurity Content of organic impurity | | | | | Number of coarse particles | |
| | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | (Number of objects to be counted) (Number/mL) | Evaluation Defect inhibition Preformance |
| Example 436 | 2,500 | 1 | 0.5 | 500 | 0.10% | 6 | AA |
| Example 437 | 2,500 | 1 | 0.5 | 500 | 0.10% | 6 | AA |
| Example 438 | 2,500 | 1 | 0.5 | 500 | 0.10% | 6 | AA |
| Example 439 | 2,500 | 1 | 0.5 | 500 | 0.10% | 6 | AA |
| Example 440 | 2,500 | 1 | 0.5 | 500 | 0.10% | 6 | AA |
| Example 441 | 2,500 | 1 | 0.5 | 500 | 0.10% | 6 | AA |
| Example 442 | 2,500 | 1 | 0.5 | 500 | 0.10% | 6 | AA |
| Example 443 | 2,500 | 1 | 0.5 | 500 | 0.10% | 6 | AA |
| Example 444 | 2,500 | 1 | 0.5 | 500 | 0.10% | 6 | AA |
| Example 445 | 2,500 | 1 | 0.5 | 500 | 0.10% | 6 | AA |
| Example 446 | 2,500 | 1 | 0.5 | 500 | 0.10% | 6 | AA |
| Example 447 | 2,500 | 1 | 0.5 | 500 | 0.10% | 6 | AA |
| Example 448 | 2,500 | 1 | 0.5 | 500 | 0.10% | 6 | AA |
| Example 449 | 2,500 | 1 | 0.5 | 500 | 0.10% | 6 | AA |
| Example 450 | 2,500 | 1 | 0.5 | 500 | 0.10% | 6 | AA |
| Example 451 | 2,500 | 1 | 0.5 | 500 | 0.10% | 6 | AA |
| Example 452 | 2,500 | 1 | 0.5 | 500 | 0.10% | 6 | AA |

TABLE 152-continued

| Table 1-12-9 | Components of chemical liquid for pre-wetting | | | | | Physical properties of chemical liquid for pre-wetting | |
|---|---|---|---|---|---|---|---|
| | Organic impurity Content of organic impurity | | | | | Number of coarse particles | |
| | Total (mass ppm) | Content of high-boiling-point component (mass ppm) | Content of ultrahigh-boiling-point component (mass ppm) | Content of compound having CLogP value higher than 6.5 (mass ppt) | Water Content (% by mass) | (Number of objects to be counted) (Number/mL) | Evaluation Defect inhibition Preformance |
| Example 453 | 2,500 | 1 | 0.5 | 500 | 0.10% | 6 | AA |
| Example 454 | 2,500 | 1 | 0.5 | 500 | 0.10% | 6 | AA |
| Example 455 | 2,500 | 1 | 0.5 | 500 | 0.10% | 6 | AA |
| Example 456 | 2,500 | 1 | 0.5 | 500 | 0.10% | 6 | AA |
| Example 457 | 2,500 | 1 | 0.5 | 500 | 0.10% | 6 | AA |
| Example 458 | 2,500 | 1 | 0.5 | 500 | 0.10% | 6 | AA |
| Example 459 | 2,500 | 1 | 0.5 | 500 | 0.10% | 6 | AA |
| Example 460 | 2,500 | 1 | 0.5 | 500 | 0.10% | 6 | AA |
| Example 461 | 0.2 | 0.1 | 0.05 | 50 | 0.10% | 6 | AA |
| Example 462 | 8 mass ppb | 0.1 mass ppb | 0.05 mass ppb | 0.01 | 0.10% | 6 | AAA |
| Example 463 | 9 mass ppb | 10 mass ppt | 5 mass ppt | 0.01 | 0.10% | 6 | AAA |
| Example 464 | 1 mass ppb | 1 mass ppt | 0.5 mass ppt | 0.01 | 0.10% | 6 | AAA |
| Example 465 | 0.3 mass ppb | 0.1 mass ppt | 0.05 mass ppt | 0.01 | 0.10% | 6 | AAA |

TABLE 153

| Table 1-12-10 | Evaluation | | | | | | | | |
|---|---|---|---|---|---|---|---|---|---|
| | Type of resist composition | | | | Type of resist composition | | | | |
| | | Resist saving properties | | | | Resist saving properties | | | |
| | | Affinity | | | Film thickness | | Affinity | | Film thickness |
| | Rsq1 | SRsq | Uniformity | controllability | | Rsq1 | SRsq | Uniformity | controllability |
| Example 436 | 1 | A | A | AA | A | 2 | A | A | A | A |
| Example 437 | 1 | A | A | AA | A | 2 | A | A | A | A |
| Example 438 | 1 | A | A | AA | A | 2 | A | A | A | A |
| Example 439 | 1 | A | A | AA | A | 2 | A | A | A | A |
| Example 440 | 1 | A | A | AA | A | 2 | A | A | A | A |
| Example 441 | 1 | A | A | AA | A | 2 | A | A | A | A |
| Example 442 | 1 | A | A | AA | A | 2 | A | A | A | A |
| Example 443 | 1 | A | A | AA | A | 2 | A | A | A | A |
| Example 444 | 1 | A | A | AA | A | 2 | A | A | A | A |
| Example 445 | 1 | A | A | AA | A | 2 | A | A | A | A |
| Example 446 | 1 | A | A | AA | A | 2 | A | A | A | A |
| Example 447 | 1 | A | A | AA | A | 2 | A | A | A | A |
| Example 448 | 1 | A | A | AA | A | 2 | A | A | A | A |
| Example 449 | 1 | A | A | AA | A | 2 | A | A | A | A |
| Example 450 | 1 | A | A | AA | A | 2 | A | A | A | A |
| Example 451 | 1 | A | A | AA | A | 2 | A | A | A | A |
| Example 452 | 1 | A | A | AA | A | 2 | A | A | A | A |
| Example 453 | 1 | A | A | AA | A | 2 | A | A | A | A |
| Example 454 | 1 | A | A | AA | A | 2 | A | A | A | A |
| Example 455 | 1 | A | A | AA | A | 2 | A | A | A | A |
| Example 456 | 1 | A | A | AA | A | 2 | A | A | A | A |
| Example 457 | 1 | A | A | AA | A | 2 | A | A | A | A |
| Example 458 | 1 | A | A | AA | A | 2 | A | A | A | A |
| Example 459 | 1 | A | A | AA | A | 2 | A | A | A | A |
| Example 460 | 1 | A | A | AA | A | 2 | A | A | A | A |
| Example 461 | 1 | A | A | A | A | 2 | A | A | A | A |
| Example 462 | 1 | A | A | AA | AA | 2 | A | A | AA | AA |
| Example 463 | 1 | A | A | AA | AA | 2 | A | A | AA | AA |
| Example 464 | 1 | A | A | AA | AA | 2 | A | A | AA | AA |
| Example 465 | 1 | A | A | AA | AA | 2 | A | A | AA | AA |

TABLE 154

| Table 1-12-11 | | Rsq1 | SRsq | Affinity Uniformity | Film thickness controllability | | Rsq1 | SRsq | Affinity Uniformity | Film thickness controllability |
|---|---|---|---|---|---|---|---|---|---|---|
| Example 436 | 3 | A | A | AA | A | 4 | A | A | AA | A |
| Example 437 | 3 | A | A | AA | A | 4 | A | A | AA | A |
| Example 438 | 3 | A | A | AA | A | 4 | A | A | AA | A |
| Example 439 | 3 | A | A | AA | A | 4 | A | A | AA | A |
| Example 440 | 3 | A | A | AA | A | 4 | A | A | AA | A |
| Example 441 | 3 | A | A | AA | A | 4 | A | A | AA | A |
| Example 442 | 3 | A | A | AA | A | 4 | A | A | AA | A |
| Example 443 | 3 | A | A | AA | A | 4 | A | A | AA | A |
| Example 444 | 3 | A | A | AA | A | 4 | A | A | AA | A |
| Example 445 | 3 | A | A | AA | A | 4 | A | A | AA | A |
| Example 446 | 3 | A | A | AA | A | 4 | A | A | AA | A |
| Example 447 | 3 | A | A | AA | A | 4 | A | A | AA | A |
| Example 448 | 3 | A | A | AA | A | 4 | A | A | AA | A |
| Example 449 | 3 | A | A | AA | A | 4 | A | A | AA | A |
| Example 450 | 3 | A | A | AA | A | 4 | A | A | AA | A |
| Example 451 | 3 | A | A | AA | A | 4 | A | A | AA | A |
| Example 452 | 3 | A | A | AA | A | 4 | A | A | AA | A |
| Example 453 | 3 | A | A | AA | A | 4 | A | A | AA | A |
| Example 454 | 3 | A | A | AA | A | 4 | A | A | AA | A |
| Example 455 | 3 | A | A | AA | A | 4 | A | A | AA | A |
| Example 456 | 3 | A | A | AA | A | 4 | A | A | AA | A |
| Example 457 | 3 | A | A | AA | A | 4 | A | A | AA | A |
| Example 458 | 3 | A | A | AA | A | 4 | A | A | AA | A |
| Example 459 | 3 | A | A | AA | A | 4 | A | A | AA | A |
| Example 460 | 3 | A | A | AA | A | 4 | A | A | AA | A |
| Example 461 | 3 | A | A | A | A | 4 | A | A | A | A |
| Example 462 | 3 | A | A | AA | AA | 4 | A | A | AA | AA |
| Example 463 | 3 | A | A | AA | AA | 4 | A | A | AA | AA |
| Example 464 | 3 | A | A | AA | AA | 4 | A | A | AA | AA |
| Example 465 | 3 | A | A | AA | AA | 4 | A | A | AA | AA |

TABLE 155

| Table 1-12-12 | | Rsq1 | SRsq | Affinity Uniformity | Film thickness controllability | | Rsq1 | SRsq | Affinity Uniformity | Film thickness controllability |
|---|---|---|---|---|---|---|---|---|---|---|
| Example 436 | 5 | A | A | AA | A | 6 | A | A | AA | A |
| Example 437 | 5 | A | A | AA | A | 6 | A | A | AA | A |
| Example 438 | 5 | A | A | AA | A | 6 | A | A | AA | A |
| Example 439 | 5 | A | A | AA | A | 6 | A | A | AA | A |
| Example 440 | 5 | A | A | AA | A | 6 | A | A | AA | A |
| Example 441 | 5 | A | A | AA | A | 6 | A | A | AA | A |
| Example 442 | 5 | A | A | AA | A | 6 | A | A | AA | A |
| Example 443 | 5 | A | A | AA | A | 6 | A | A | AA | A |
| Example 444 | 5 | A | A | AA | A | 6 | A | A | AA | A |
| Example 445 | 5 | A | A | AA | A | 6 | A | A | AA | A |
| Example 446 | 5 | A | A | AA | A | 6 | A | A | AA | A |
| Example 447 | 5 | A | A | AA | A | 6 | A | A | AA | A |
| Example 448 | 5 | A | A | AA | A | 6 | A | A | AA | A |
| Example 449 | 5 | A | A | AA | A | 6 | A | A | AA | A |
| Example 450 | 5 | A | A | AA | A | 6 | A | A | AA | A |
| Example 451 | 5 | A | A | AA | A | 6 | A | A | AA | A |
| Example 452 | 5 | A | A | AA | A | 6 | A | A | AA | A |
| Example 453 | 5 | A | A | AA | A | 6 | A | A | AA | A |
| Example 454 | 5 | A | A | AA | A | 6 | A | A | AA | A |
| Example 455 | 5 | A | A | AA | A | 6 | A | A | AA | A |
| Example 456 | 5 | A | A | AA | A | 6 | A | A | AA | A |

TABLE 155-continued

| Table 1-12-12 | | Evaluation | | | | | | | | |
|---|---|---|---|---|---|---|---|---|---|---|
| | | Type of resist composition | | | | | Type of resist composition | | | |
| | | | | Resist saving properties | | | | | Resist saving properties | |
| | | Affinity | | | Film thickness | | Affinity | | | Film thickness |
| | | Rsq1 | SRsq | Uniformity | controllability | | Rsq1 | SRsq | Uniformity | controllability |
| Example 457 | 5 | A | A | AA | A | 6 | A | A | AA | A |
| Example 458 | 5 | A | A | AA | A | 6 | A | A | AA | A |
| Example 459 | 5 | A | A | AA | A | 6 | A | A | AA | A |
| Example 460 | 5 | A | A | AA | A | 6 | A | A | AA | A |
| Example 461 | 5 | A | A | A | A | 6 | A | A | A | A |
| Example 462 | 5 | A | A | AA | AA | 6 | A | A | AA | AA |
| Example 463 | 5 | A | AA | AA | AA | 6 | A | AA | AA | AA |
| Example 464 | 5 | AA | AA | AA | AA | 6 | AA | AA | AA | AA |
| Example 465 | 5 | AA | AA | AA | AA | 6 | AA | AA | AA | AA |

TABLE 156

| Table 1-12-13 | | Evaluation | | | |
|---|---|---|---|---|---|
| | | Type of resist composition | | | |
| | | | | Resist saving properties | |
| | | Affinity | | | Film thickness |
| | | Rsq1 | SRsq | Uniformity | controllability |
| Example 436 | 7 | A | A | AA | A |
| Example 437 | 7 | A | A | AA | A |
| Example 438 | 7 | A | A | AA | A |
| Example 439 | 7 | A | A | AA | A |
| Example 440 | 7 | A | A | AA | A |
| Example 441 | 7 | A | A | AA | A |
| Example 442 | 7 | A | A | AA | A |
| Example 443 | 7 | A | A | AA | A |
| Example 444 | 7 | A | A | AA | A |
| Example 445 | 7 | A | A | AA | A |
| Example 446 | 7 | A | A | AA | A |
| Example 447 | 7 | A | A | AA | A |
| Example 448 | 7 | A | A | AA | A |
| Example 449 | 7 | A | A | AA | A |
| Example 450 | 7 | A | A | AA | A |
| Example 451 | 7 | A | A | AA | A |
| Example 452 | 7 | A | A | AA | A |
| Example 453 | 7 | A | A | AA | A |
| Example 454 | 7 | A | A | AA | A |
| Example 455 | 7 | A | A | AA | A |
| Example 456 | 7 | A | A | AA | A |
| Example 457 | 7 | A | A | AA | A |
| Example 458 | 7 | A | A | AA | A |
| Example 459 | 7 | A | A | AA | A |
| Example 460 | 7 | A | A | AA | A |
| Example 461 | 7 | A | A | A | A |
| Example 462 | 7 | A | A | AA | AA |
| Example 463 | 7 | A | AA | AA | AA |
| Example 464 | 7 | AA | AA | AA | AA |
| Example 465 | 7 | AA | AA | AA | AA |

The chemical liquid of Example 155 contained phenol at 6,000 mass ppm and γ-butyrolactone at 9,000 mass ppm as organic impurities. As described above, in the present specification, an organic compound whose content is equal to or smaller than 10,000 mass ppm with respect to the total mass of the chemical liquid corresponds to an organic impurity but does not correspond to an organic solvent.

In Table 1, the components and the evaluation results of the chemical liquid of Example 1 are described in the respective lines of Table 1-1-1 to Table 1-1-13. Likewise, the components and the evaluation results of the chemical liquid of Example 41 are described in the respective lines in Table 1-2-1 to Table 1-2-13. The same shall be applied to other examples and comparative examples.

More specifically, the chemical liquid of Example 81 is described in Table 1-3-1 to Table 1-3-13. The chemical liquid of Example 81 contained CyPn as a first organic solvent in an amount of 20% by mass with respect to the total mass of the mixture of organic solvents, PGMEA as a second organic solvent in an amount of 60% by mass with respect to the total mass of the mixture of organic solvents, and GBL as a third organic solvent in an amount of 20% by mass with respect to the total mass of the mixture of organic solvents, and did not contain a fourth organic solvent and a fifth organic solvent. In the chemical liquid of Example 81, the vapor pressure of the mixture of organic solvents is 670 Pa, the surface tension of the mixture of organic solvents is 33.5 mN/m. The chemical liquid of Example 81 contained, as impurity metals, Fe in an amount of 0.006 mass ppt with respect to the total mass of the chemical liquid, Cr in an amount of 0.004 mass ppt with respect to the total mass of the chemical liquid, Ni in an amount of 0.004 mass ppt with respect to the total mass of the chemical liquid, Pb in an amount of 0.002 mass ppt with respect to the total mass of the chemical liquid, and others in an amount of 0.034 mass ppt with respect to the total mass of the chemical liquid. The total content of the impurity metals in the chemical liquid of Example 81 is 0.050 mass ppt. In the chemical liquid of Example 81, the content of the impurity metal Fe as particles with respect to the total mass of the chemical liquid is 0.003 mass ppt, the content of the impurity metal Cr as particles with respect to the total mass of the chemical liquid is 0.002 mass ppt, the content of the impurity metal Ni as particles with respect to the total mass of the chemical liquid is 0.002 mass ppt, the content of the impurity metal Pb as particles with respect to the total mass of the chemical liquid is 0.001 mass ppt, and other impurity metals as particles with respect to the total mass of the chemical liquid is 0.017 mass ppt. The total content of the impurity metals as particles in the chemical liquid of Example 81 is 0.025 mass ppt. The chemical liquid of Example 81 contains an organic compound which had a boiling point equal to or higher than 250° C. and contains 8 or more carbon atoms and an organic compound which had a boiling point equal to or higher than 250° C. and contains 12 or more carbon atoms. The total content of organic impurities contained in the chemical liquid of Example 81 with respect to the total mass of the chemical liquid is 2,500 mass ppm. In the chemical liquid of Example 81, the content of a high-boiling-point component is 1 mass ppm, the content of an ultrahigh-boiling-point component is 0.5 mass ppm, the content of a compound having a C log P value higher than 6.5 is 500 mass ppt, the content of water with respect to the total mass of the chemical liquid is 0.10% by mass, and the number of coarse particles was 6/mL. The chemical liquid of Example 81 was evaluated as AA in terms of defect inhibition performance. Both of Rsq1 and SPsq showing the affinity of the chemical liquid of Example 81 with the resist composition 1 were evaluated as A, the uniformity brought about by the chemical liquid of Example 81 used for the resist composition 1 was evaluated as AA, and the film thickness controllability brought about by the chemical liquid of Example 81 used for the resist composition 1 was evaluated as A. Both of Rsq1 and SPsq showing the affinity of the chemical liquid of Example 81 with the resist composition 2 were evaluated as A, the uniformity brought about by the chemical liquid of Example 81 used for the resist composition 2 was evaluated as AA, and the film thickness controllability brought about by the chemical liquid of Example 81 used for the resist composition 2 was evaluated as A. Both of Rsq1 and SPsq showing the affinity of the chemical liquid of Example 81 with the resist composition 3 were evaluated as A, the uniformity brought about by the chemical liquid of Example 81 used for the resist composition 3 was evaluated as AA, and the film thickness controllability brought about by the chemical liquid of Example 81 used for the resist composition 3 was evaluated as A. Both of Rsq1 and SPsq showing the affinity of the chemical liquid of Example 81 with the resist composition 4 were evaluated as A, the uniformity brought about by the chemical liquid of Example 81 used for the resist composition 4 was evaluated as AA, and the film thickness controllability brought about by the chemical liquid of Example 81 used for the resist composition 4 was evaluated as A. Both of Rsq1 and SPsq showing the affinity of the chemical liquid of Example 81 with the resist composition 5 were evaluated as A, the uniformity brought about by the chemical liquid of Example 81 used for the resist composition 5 was evaluated as AA, and the film thickness controllability brought about by the chemical liquid of Example 81 used for the resist composition 5 was evaluated as A. Both of Rsq1 and SPsq showing the affinity of the chemical liquid of Example 81 with the resist composition 6 were evaluated as A, the uniformity brought about by the chemical liquid of Example 81 used for the resist composition 6 was evaluated as AA, and the film thickness controllability brought about by the chemical liquid of Example 81 used for the resist composition 6 was evaluated as A. Both of Rsq1 and SPsq showing the affinity of the chemical liquid of Example 81 with the resist composition 7 were evaluated as A, the uniformity brought about by the chemical liquid of Example 81 used for the resist composition 7 was evaluated as AA, and the film thickness controllability brought about by the chemical liquid of Example 81 used for the resist composition 7 was evaluated as A.

In Table 1, "Content" of each organic solvent represents the content of each organic solvent in the mixture contained in the chemical liquid.

From the results described in Table 1, it was understood that the chemical liquid of each of the examples had the effects of the present invention. In contrast, it was understood that the chemical liquid of each of the comparative examples did not have the effects of the present invention.

The chemical liquid of Example 1, which contained impurity metals as particles and in which the content of particles of each of the impurity metals was within a range of 0.001 to 30 mass ppt, demonstrated defect inhibition performance better than that of the chemical liquid of Example 151.

The chemical liquid of Example 1, in which the mixture contained an organic solvent having a Hansen solubility parameter higher than 10 $(MPa)^{0.5}$ in terms of a hydrogen bond element or having a Hansen solubility parameter higher than 16.5 $(MPa)^{0.5}$ in terms of a dispersion element, demonstrated defect inhibition performance better than that of the chemical liquid of Example 21.

The chemical liquid of Example 1, in which the number of objects to be counted having a size equal to or greater than 100 nm that were counted by a light scattering-type liquid-borne particle counter was 1 to 100/mL, demonstrated defect inhibition performance better than that of the chemical liquid of Example 137.

The chemical liquid of Example 1, which contained water and in which the content of the water was within a range of 0.010% to 1.0% by mass, demonstrated defect inhibition performance better than that of the chemical liquid of Example 135.

Compared to other resist compositions, the resist composition 3 benefited more by the chemical liquids of the examples in the resist saving properties.

The chemical liquid of Example 462, in which the total content of the organic impurity was 0.01 mass ppt to 10 mass ppb, had higher resist saving properties while maintaining higher defect inhibition performance compared to the chemical liquid of Example 1.

Furthermore, the chemical liquid of Example 462, in which the content of the ultrahigh-boiling-point component of the organic impurity was 0.01 mass ppt to 10 mass ppb, had higher resist saving properties while maintaining higher defect inhibition performance compared to the chemical liquid of Example 1.

In addition, the chemical liquid of Example 462, in which the content of the compound having a C log P value higher than 6.5 was 0.01 mass ppt to 10 mass ppb, had higher resist saving properties while maintaining higher defect inhibition performance compared to the chemical liquid of Example 145.

[Preparation of Resist Composition]

<Resin>

Synthesis Example 1: Synthesis of Resin (A-1)

Cyclohexanone (600 g) was put into a 2 L flask, and nitrogen purging was performed for 1 hour at a flow rate of 100 mL/min. Then, 4.60 g (0.02 mol) of a polymerization initiator V-601 (manufactured by Wako Pure Chemical Industries, Ltd.) was added thereto, and the flask was heated such until the internal temperature thereof became 80° C. Thereafter, the following monomers and 4.60 g (0.02 mol) of a polymerization initiator V-601 (manufactured by Wako Pure Chemical Industries, Ltd.) were dissolved in 200 g of cyclohexanone, thereby preparing a monomer solution. The monomer solution was added dropwise for 6 hours to the flask heated to 80° C. After the dropwise addition ended, the reaction was further performed for 2 hours at 80° C.

4-Acetoxystyrene: 48.66 g (0.3 mol)

1-Ethylcyclopentyl methacrylate: 109.4 g (0.6 mol)

Monomer 1: 22.2 g (0.1 mol)

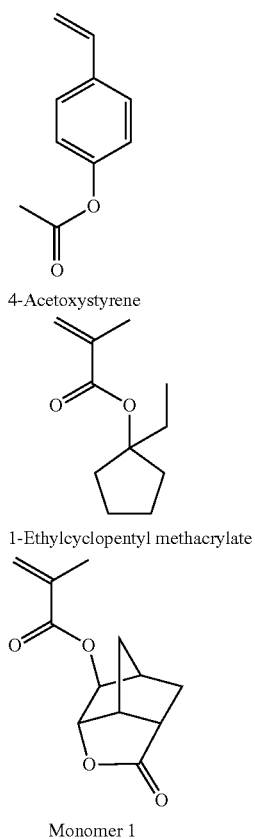

4-Acetoxystyrene

1-Ethylcyclopentyl methacrylate

Monomer 1

The reaction solution was cooled to room temperature and added dropwise to 3 L of hexane such that polymers were precipitated. The filtered solids were dissolved in 500 mL of acetone, added dropwise again to 3 L of hexanone, and the filtered solids were dried under reduced pressure, thereby obtaining 160 g of a 4-acetoxystyrene/1-ethylcyclopentyl methacrylate/monomer 1 copolymer (A-1a).

The obtained polymer (A-1a) (10 g), 40 mL of methanol, 200 mL of 1-methoxy-2-propanol, and 1.5 mL of concentrated hydrochloric acid were added to a reaction container, heated at 80° C., and stirred for 5 hours. The reaction solution was left to cool to room temperature and added dropwise to 3 L of distilled water. The filtered solids were dissolved in 200 mL of acetone, added dropwise again to 3 L of distilled water, and the filtered solids were dried under reduced pressure, thereby obtaining a resin (A-1) (8.5 g). The resin had a weight-average molecular weight (Mw) of 11,200, which was measured by gel permeation chromatography (GPC) (solvent: tetrahydrofuran (THF)) and expressed in terms of standard polystyrene, and a molecular weight dispersity (Mw/Mn) of 1.45.

Resins (A-2) to (A-19) having the structures shown in Table 2 were synthesized by the same method as that in Synthesis Example 1, except that the used monomers were changed.

In Tables 5 to 7, the compositional ratio (molar ratio) of the resin was calculated by a nuclear magnetic resonance ($^1$H-NMR) technique. The weight-average molecular weight (Mw: expressed in terms of polystyrene) and the dispersity (Mw/Mn) of the resin were calculated by a GPC (solvent: THF) technique. The weight-average molecular weight and the dispersity of other resins shown in Examples were measured by the same method.

TABLE 2

| Table 2 | Structure | Compositional ratio (molar ratio) From left to right | Mw | Mw/Mn |
|---|---|---|---|---|
| Resin A-1 | 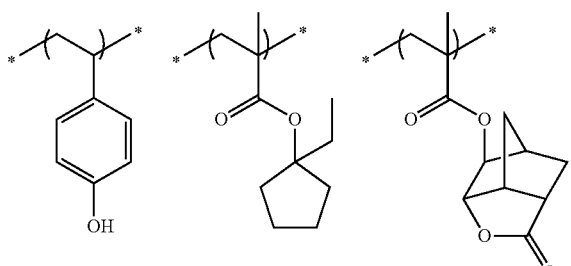 | 30/60/10 | 11,200 | 1.45 |
| Resin A-2 | 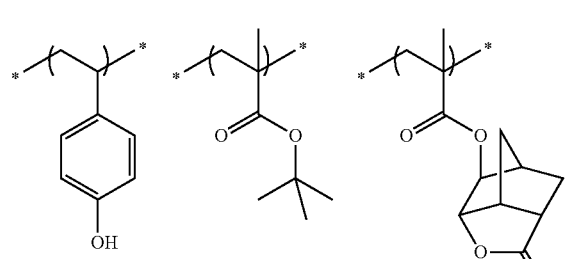 | 30/60/10 | 12,300 | 1.51 |

TABLE 2-continued

| Table 2 | Structure | Compositional ratio (molar ratio) From left to right | Mw | Mw/Mn |
|---|---|---|---|---|
| Resin A-3 | | 40/20/40 | 9,200 | 1.68 |
| Resin A-4 | | 30/60/10 | 12,300 | 1.51 |
| Resin A-5 | | 20/80 | 12,500 | 1.52 |
| Resin A-6 | | 50/50 | 13,000 | 1.56 |
| Resin A-7 | | 70/30 | 12,500 | 1.43 |

TABLE 2-continued
| Table 2 | Structure | Compositional ratio (molar ratio) From left to right | Mw | Mw/Mn |
|---|---|---|---|---|
| Resin A-8 | 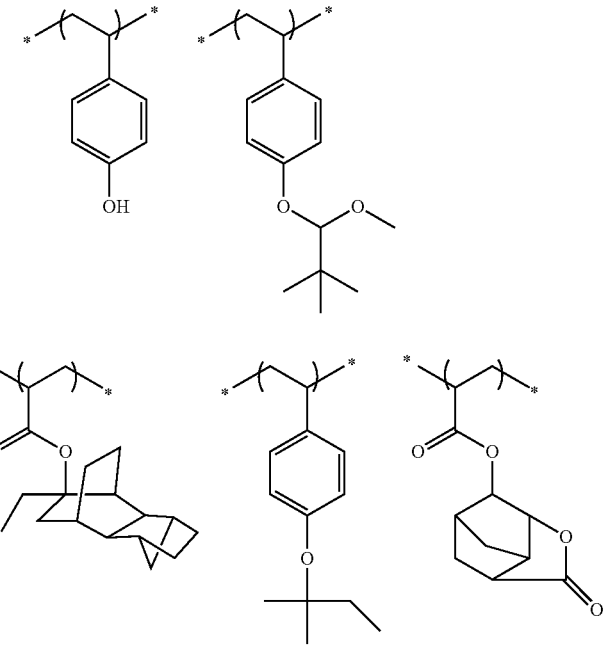 | 20/80 | 18,000 | 1.12 |
| Resin A-9 | 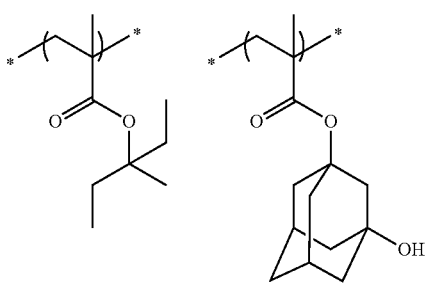 | 5/15/30/50 | 11,000 | 1.56 |
| Resin A-10 | 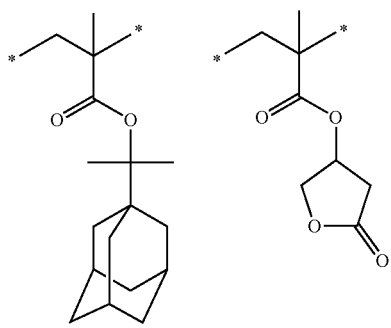 [SMILES: CCC(C)(C)C(=O)OC(C)(C)C12CC3CC(CC(C3)C1)C2 ; CCC(C)(C)C(=O)OC1COC(=O)C1] | 50/50 | 11,000 | 1.45 |
| Resin A-11 | 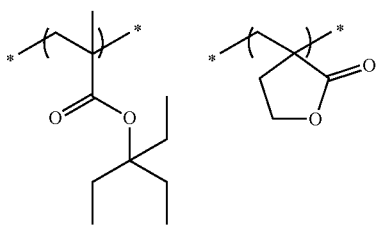 | 35/65 | 12,300 | 1.51 |
| Resin A-12 | | 60/40 | 12,500 | 1.68 |

TABLE 2-continued

| Table 2 | Structure | Compositional ratio (molar ratio) From left to right | Mw | Mw/Mn |
|---|---|---|---|---|
| Resin A-13 | (structures) | 70/30 | 13,000 | 1.51 |
| Resin A-14 | (structures) | 20/40/40 | 11,000 | 1.45 |
| Resin A-15 | (structures) | 30/70 | 12,300 | 1.51 |
| Resin A-16 | (structures) | 50/20/30 | 14,500 | 1.68 |
| Resin A-17 | (structures) | 30/50/10/10 | 12,100 | 1.53 |

TABLE 2-continued

| Table 2 | Structure | Compositional ratio (molar ratio) From left to right | Mw | Mw/Mn |
|---|---|---|---|---|
| Resin A-18 | | 50/35/15 | 11,100 | 1.61 |
| Resin A-19 | | 30/45/15/10 | 11,500 | 1.49 |

<Hydrophobic Resin>

The following resins were used as hydrophobic resins.

TABLE 160

| Table 3 | Compositional ratio (molar ratio) | | | | Mw | Mw/Mn |
|---|---|---|---|---|---|---|
| Resin (1b) | 50 | 45 | 5 | — | 7,000 | 1.30 |
| Resin (2b) | 40 | 40 | 20 | — | 18,600 | 1.57 |
| Resin (3b) | 50 | 50 | — | — | 25,400 | 1.63 |
| Resin (4b) | 30 | 65 | 5 | — | 28,000 | 1.70 |
| Resin (5b) | 10 | 10 | 30 | 50 | 12,500 | 1.65 |

Specific structural formulae of hydrophobic resins (1b) to (5b) described in the table are shown below.

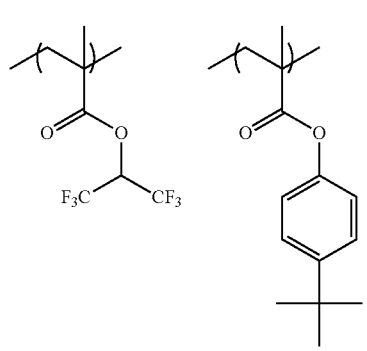
(1b)

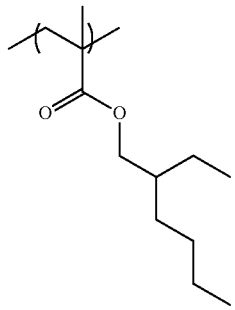

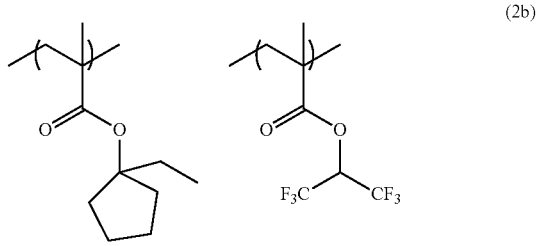
(2b)

-continued
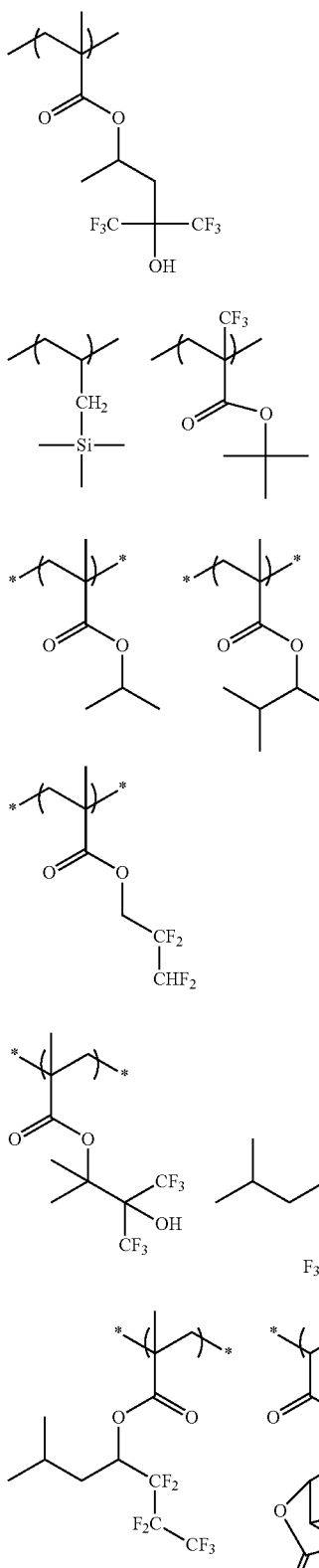
(3b)
(4b)
(5b)
<Photoacid Generator (B)>
The following compounds were used as photoacid generators.
(B-1)
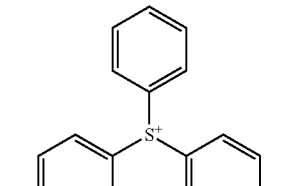
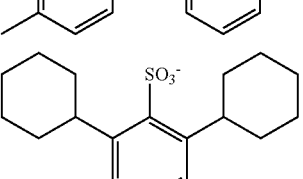
(B-2)
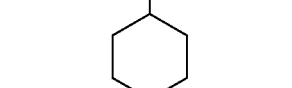
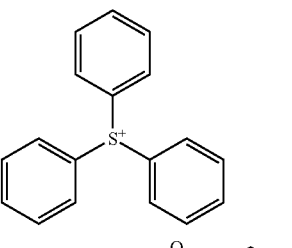
(B-3)
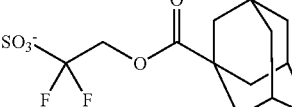
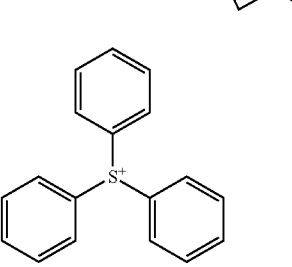
(B-4)
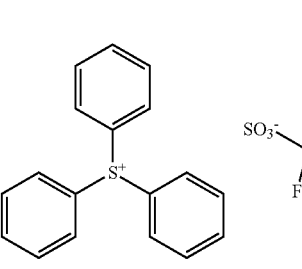

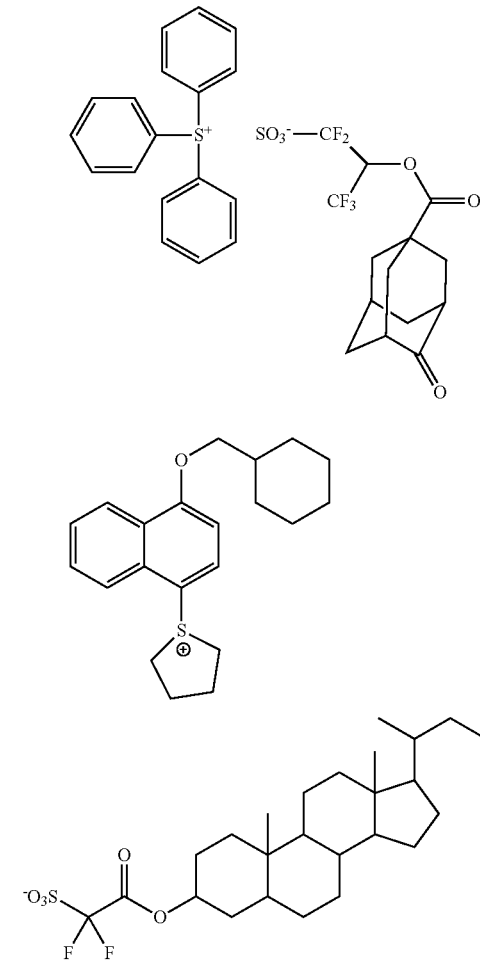
(B-5)
(B-6)
(B-7)
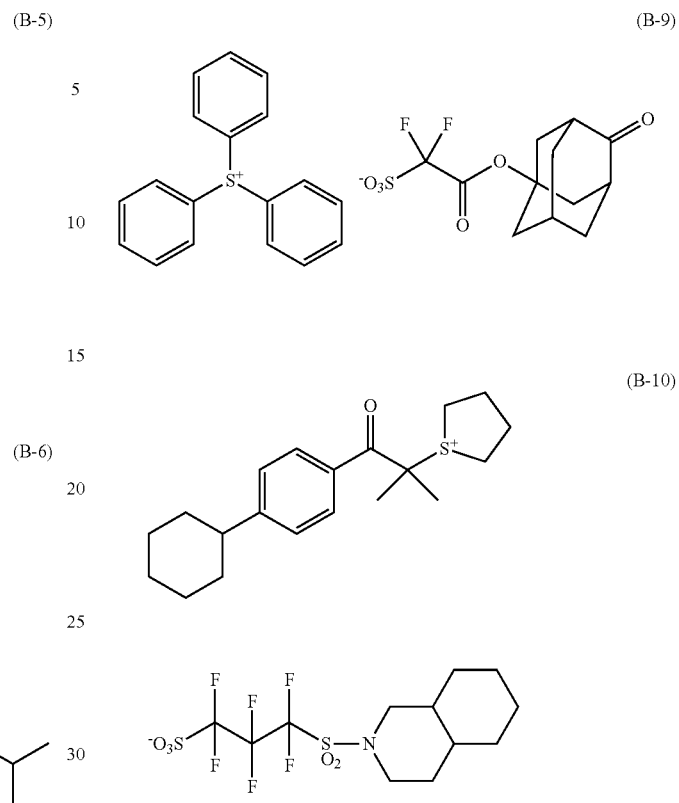
(B-9)
(B-10)
<Basic Compound (E)>
The following compounds were used as basic compounds (corresponding to quenchers).
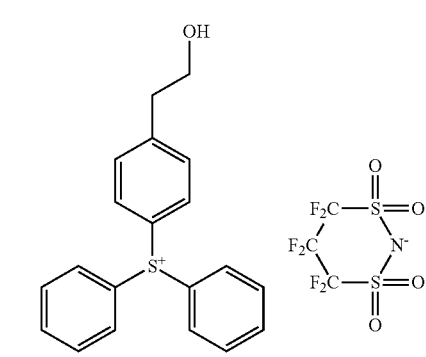
(B-7)
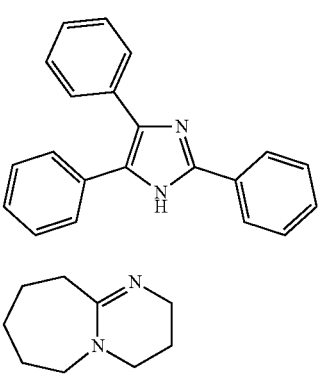
(E-1)
(E-2)
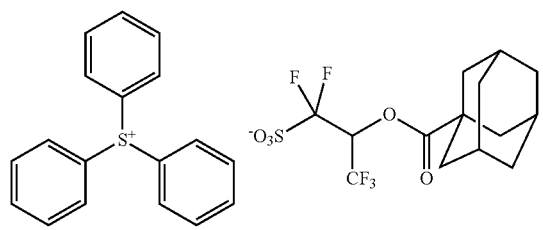
(B-8)
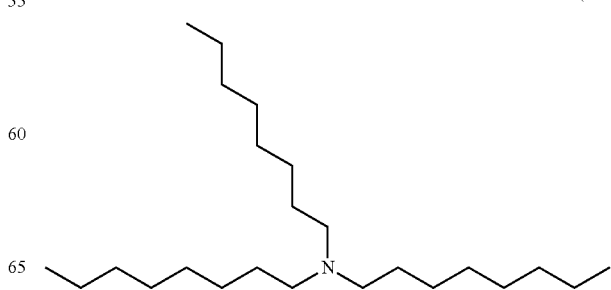
(E-3)

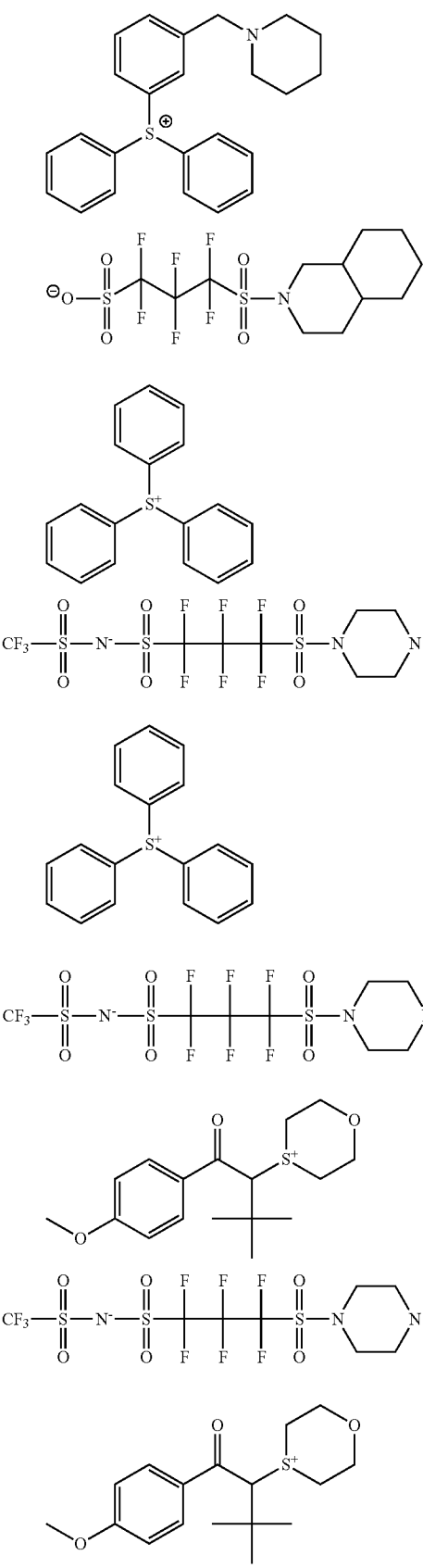
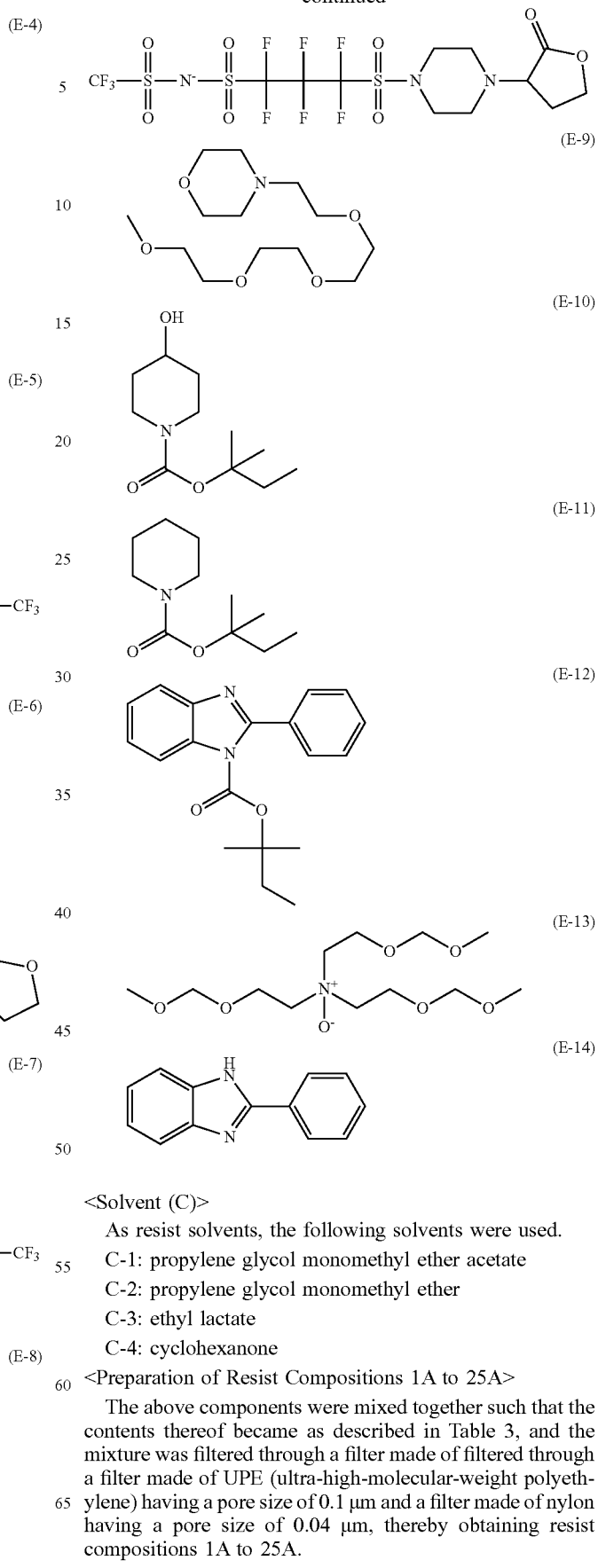

<Solvent (C)>

As resist solvents, the following solvents were used.

C-1: propylene glycol monomethyl ether acetate
C-2: propylene glycol monomethyl ether
C-3: ethyl lactate
C-4: cyclohexanone <Preparation of Resist Compositions 1A to 25A>

The above components were mixed together such that the contents thereof became as described in Table 3, and the mixture was filtered through a filter made of filtered through a filter made of UPE (ultra-high-molecular-weight polyethylene) having a pore size of 0.1 μm and a filter made of nylon having a pore size of 0.04 μm, thereby obtaining resist compositions 1A to 25A.

TABLE 161

| Table 3 | Resin (A) | Photoacid generator (B) | Basic compound (E) | Solvent (C) | | Hydrophobic resin (A') | |
|---|---|---|---|---|---|---|---|
| Resist composition 1A | A-1<br>0.77 g | B-1<br>0.2 g | E-3<br>0.03 g | C-1<br>67.5 g | C-3<br>7.5 g | — | — |
| Resist composition 2A | A-2<br>0.79 g | B-2<br>0.18 g | E-1<br>0.03 g | C-1<br>45 g | C-2<br>30 g | — | — |
| Resist composition 3A | A-3<br>0.79 g | B-2<br>0.18 g | E-1<br>0.03 g | C-1<br>45 g | C-2<br>30 g | — | — |
| Resist composition 4A | A-4<br>0.79 g | B-2<br>0.18 g | E-1<br>0.03 g | C-1<br>60 g | C-3<br>15 g | — | — |
| Resist composition 5A | A-5<br>0.78 g | B-3<br>0.19 g | E-3<br>0.03 g | C-1<br>67.5 g | C-3<br>7.5 g | — | — |
| Resist composition 6A | A-6<br>0.79 g | B-2<br>0.18 g | E-1<br>0.03 g | C-1<br>67.5 g | C-3<br>7.5 g | — | — |
| Resist composition 7A | A-6/A-7<br>0.395 g/0.395 g | B-4<br>0.2 g | E-4<br>0.01 g | C-1<br>45 g | C-4<br>30 g | — | — |
| Resist composition 8A | A-8<br>0.79 g | B-1<br>0.18 g | E-1<br>0.03 g | C-1<br>45 g | C-2<br>30 g | — | — |
| Resist composition 9A | A-1/A-2<br>0.395 g/0.395 g | B-2<br>0.18 g | E-1/E-5<br>0.015 g/0.015 g | C-1<br>45 g | C-2<br>30 g | — | — |
| Resist composition 10A | A-2<br>0.79 g | B-2<br>0.18 g | E-6<br>0.03 g | C-1<br>45 g | C-2<br>30 g | — | — |
| Resist composition 11A | A-2<br>0.79 g | B-2<br>0.18 g | E-7<br>0.03 g | C-1<br>45 g | C-2<br>30 g | — | — |
| Resist composition 12A | A-2<br>0.79 g | B-2<br>0.18 g | E-8<br>0.03 g | C-1<br>45 g | C-2<br>30 g | — | — |
| Resist composition 13A | A-9<br>0.76 g | B-5<br>0.18 g | E-9<br>0.03 g | C-1<br>45 g | C-2<br>15 g | C-4<br>15 g | 5b<br>0.03 g |
| Resist composition 14A | A-7<br>0.787 g | B-5<br>0.18 g | E-9<br>0.03 g | C-1<br>45 g | C-2<br>15 g | C-4<br>15 g | 4b<br>0.003 g |
| Resist composition 15A | A-6<br>0.785 g | B-4<br>0.18 g | E-10<br>0.03 g | C-1<br>45 g | C-2<br>15 g | C-4<br>15 g | 3b<br>0.005 g |
| Resist composition 16A | A-10<br>0.78 g | B-3<br>0.18 g | E-11<br>0.03 g | C-1<br>45 g | C-2<br>15 g | C-4<br>15 g | 2b<br>0.01 g |
| Resist composition 17A | A-11<br>0.72 g | B-6/E-2<br>0.15 g/0.09 g | E-12<br>0.03 g | C-1<br>45 g | C-2<br>15 g | C-4<br>15 g | 1b<br>0.01 g |
| Resist composition 18A | A-12<br>0.76 g | B-7<br>0.18 g | E-13<br>0.03 g | C-1<br>45 g | C-2<br>30 g | — | 5b<br>0.03 g |
| Resist composition 19A | A-13<br>0.787 g | B-8<br>0.18 g | E-14<br>0.03 g | C-1<br>30 g | C-2<br>45 g | — | 4b<br>0.003 g |
| Resist composition 20A | A-14<br>0.785 g | B-9<br>0.18 g | E-2<br>0.03 g | C-1<br>45 g | C-4<br>30 g | — | 3b<br>0.005 g |
| Resist composition 21A | A-15<br>0.78 g | B-10/B-2<br>0.09 g/0.09 g | E-13<br>0.03 g | C-1<br>30 g | C-4<br>45 g | — | 2b<br>0.01 g |
| Resist composition 22A | A-16<br>0.71 g | B-6<br>0.25 g | E-14<br>0.03 g | C-1<br>50 g | C-4<br>10 g | — | 1b<br>0.01 g |
| Resist composition 23A | A-17<br>0.79 g | B-2<br>0.18 g | E-1<br>0.03 g | C-1<br>60 g | C-3<br>15 g | — | — |
| Resist composition 24A | A-18<br>0.79 g | B-2<br>0.18 g | E-1<br>0.03 g | C-1<br>60 g | C-3<br>15 g | — | — |
| Resist composition 25A | A-19<br>0.79 g | B-2<br>0.18 g | E-1<br>0.03 g | C-1<br>60 g | C-3<br>15 g | — | — |

[Affinity Between Chemical Liquid and Resin]

The affinity between the chemical liquid described in Example 462 and the resin contained in each of the resist compositions 1A to 25A was measured by the same method as described above. Consequently, the same results as those obtained from the resist composition 1 were obtained.

[Resist Saving Properties of Resist Composition]

The resist saving properties of the resist compositions 1A to 25A after the coating of the chemical liquid of Example 462 were measured by the same method as described above. Consequently, for both the uniformity and film thickness controllability, the same results as those obtained from the resist composition 1 were obtained.

What is claimed is:

1. A pattern forming method comprising:
a pre-wetting step of coating a substrate with a chemical liquid so as to obtain a pre-wetted substrate;
a resist film forming step of forming a resist film on the pre-wetted substrate by using an actinic ray-sensitive or radiation-sensitive resin composition;
an exposure step of exposing the resist film; and
a development step of developing the exposed resist film by using a developer,
wherein the chemical liquid comprises:
a mixture of two or more kinds of organic solvents; and
an impurity metal containing one kind of metal selected from the group consisting of Fe, Cr, Ni, and Pb,
wherein a vapor pressure of the mixture is 50 to 1,420 Pa at 25° C.,
in a case where the chemical liquid contains one kind of the impurity metal, a content of the impurity metal in the chemical liquid is 0.001 to 100 mass ppt, and
in a case where the chemical liquid contains two or more kinds of the impurity metals, a content of each of the impurity metals in the chemical liquid is 0.001 to 100 mass ppt,
wherein the actinic ray-sensitive or radiation-sensitive resin composition comprises a resin having a repeating unit represented by Formula (AI), and the resin contains a repeating unit represented by General Formula (I),

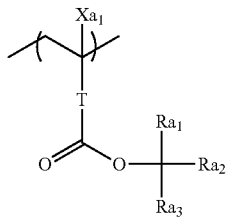
(AI)

in Formula (AI), $Xa_1$ represents a hydrogen atom or an alkyl group which may have a substituent, T represents a single bond or a divalent linking group, $Ra_1$ to $Ra_3$ each independently represent an alkyl group or a cycloalkyl group, and two out of $Ra_1$ to $Ra_3$ may form a cycloalkyl group by being bonded to each other,

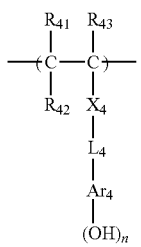
(I)

in General Formula (I), $R_{41}$, $R_{42}$, and $R_{43}$ each independently represent a hydrogen atom, an alkyl group, a halogen atom, a cyano group, or an alkoxycarbonyl group, but in a case where $R_{42}$ and $Ar_4$ may form a ring by being bonded to each other, $R_{42}$ represents a single bond or an alkylene group, $X_4$ represents a single bond, —COO—, or —$CONR_{64}$—, $R_{64}$ represents a hydrogen atom or an alkyl group, $L_4$ represents a single bond or an alkylene group, $Ar_4$ represents a benzene ring group, and n represents an integer of 1 to 5.

2. The pattern forming method according to claim 1, further comprising:
a filtering step of filtering the actinic ray-sensitive or radiation-sensitive resin composition.

3. The pattern forming method according to claim 2, wherein the resin further contains a repeating unit having a lactone structure.

4. The pattern forming method according to claim 2, wherein the actinic ray-sensitive or radiation-sensitive resin composition further comprises:
a hydrophobic resin.

5. The pattern forming method according to claim 1, wherein the resin further contains a repeating unit having a lactone structure.

6. The pattern forming method according to claim 1, wherein the actinic ray-sensitive or radiation-sensitive resin composition further comprises:
a hydrophobic resin.

7. A kit comprising:
a chemical liquid; and
an actinic ray-sensitive or radiation-sensitive resin composition,
wherein the chemical liquid comprises:
a mixture of two or more kinds of organic solvents; and
an impurity metal containing one kind of metal selected from the group consisting of Fe, Cr, Ni, and Pb,
wherein a vapor pressure of the mixture is 50 to 1,420 Pa at 25° C.,
in a case where the chemical liquid contains one kind of the impurity metal, a content of the impurity metal in the chemical liquid is 0.001 to 100 mass ppt, and
in a case where the chemical liquid contains two or more kinds of the impurity metals, a content of each of the impurity metals in the chemical liquid is 0.001 to 100 mass ppt,
wherein the actinic ray-sensitive or radiation-sensitive resin composition comprises a resin having a repeating unit represented by Formula (AI), and the resin contains a repeating unit represented by General Formula (I),

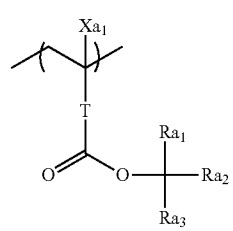
(AI)

in Formula (AI), $Xa_1$ represents a hydrogen atom or an alkyl group which may have a substituent, T represents a single bond or a divalent linking group, $Ra_1$ to $Ra_3$ each independently represent an alkyl group or a cycloalkyl group, and two out of $Ra_1$ to $Ra_3$ may form a cycloalkyl group by being bonded to each other,

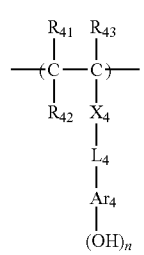
(I)

in General Formula (I), $R_{41}$, $R_{42}$, and $R_{43}$ each independently represent a hydrogen atom, an alkyl group, a halogen atom, a cyano group, or an alkoxycarbonyl group, but in a case where $R_{42}$ and $Ar_4$ may form a ring by being bonded to each other, $R_{42}$ represents a single bond or an alkylene group, $X_4$ represents a single bond, —COO—, or —$CONR_{64}$—, $R_{64}$ represents a hydrogen atom or an alkyl group, $L_4$ represents a single bond or an alkylene group, $Ar_4$ represents a benzene ring group, and n represents an integer of 1 to 5.

8. The kit according to claim 7, wherein the resin further contains a repeating unit having a lactone structure.

9. The kit according to claim 7,
wherein the actinic ray-sensitive or radiation-sensitive resin composition further comprises:
a hydrophobic resin.

10. A resist composition comprising:
a mixture of two or more kinds of organic solvents;
a resin having a repeating unit represented by Formula (AI); and
an impurity metal containing one kind of metal selected from the group consisting of Fe, Cr, Ni, and Pb,
wherein a vapor pressure of the mixture is 50 to 1,420 Pa at 25° C.,
in a case where the resist composition contains one kind of the impurity metal, a content of the impurity metal in the resist composition is 0.001 to 100 mass ppt, and
in a case where the resist composition contains two or more kinds of the impurity metals, a content of each of the impurity metals in the resist composition is 0.001 to 100 mass ppt,
wherein the resin contains a repeating unit having a lactone structure and a repeating unit represented by General Formula (I),

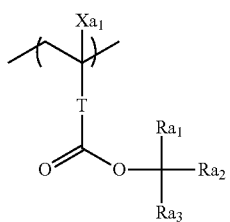
(AI)

in Formula (AI), $Xa_1$ represents a hydrogen atom or an alkyl group which may have a substituent,
T represents a single bond or a divalent linking group,
$Ra_1$ to $Ra_3$ each independently represent an alkyl group or a cycloalkyl group, and
two out of $Ra_1$ to $Ra_3$ may form a cycloalkyl group by being bonded to each other,

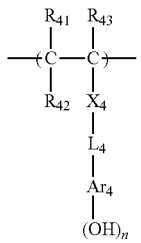
(I)

in General Formula (I), $R_{41}$, $R_{42}$, and $R_{43}$ each independently represent a hydrogen atom, an alkyl group, a halogen atom, a cyano group, or an alkoxycarbonyl group, but in a case where $R_{42}$ and $Ar_4$ may form a ring by being bonded to each other, $R_{42}$ represents a single bond or an alkylene group,
$X_4$ represents a single bond, —COO—, or —CONR$_{64}$—,
$R_{64}$ represents a hydrogen atom or an alkyl group,
$L_4$ represents a single bond or an alkylene group,
$Ar_4$ represents a benzene ring group, and
n represents an integer of 1 to 5.

11. The resist composition according to claim 10,
wherein the resist composition further comprises:
a hydrophobic resin.

12. The resist composition according to claim 10,
wherein the impurity metal contained in the resist composition is particles,
in a case where the resist composition contains one kind of the particles, a content of the particles in the resist composition is 0.001 to 30 mass ppt, and
in a case where the resist composition contains two or more kinds of the particles, a content of each kind of the particles in the resist composition is 0.001 to 30 mass ppt.

13. A resist composition comprising:
a mixture of two or more kinds of organic solvents;
a resin having a repeating unit represented by Formula (AI); and
an impurity metal containing one kind of metal selected from the group consisting of Fe, Cr, Ni, and Pb,
wherein in a case where the resist composition contains one kind of the impurity metal, a content of the impurity metal in the resist composition is 0.001 to 100 mass ppt,
in a case where the resist composition contains two or more kinds of the impurity metals, a content of each of the impurity metals in the resist composition is 0.001 to 100 mass ppt, and
the resist composition satisfies at least any one of the following conditions 1 to 7,
condition 1: the mixture contains at least one kind of organic solvent selected from the following first organic solvents and at least one kind of organic solvent selected from the following second organic solvents,
condition 2: the mixture contains at least one kind of organic solvent selected from the following first organic solvents and at least one kind of organic solvent selected from the following third organic solvents,
condition 3: the mixture contains at least one kind of organic solvent selected from the following second organic solvents and at least one kind of organic solvent selected from the following third organic solvents,
condition 4: the mixture contains at least one kind of organic solvent selected from the following first organic solvents, at least one kind of organic solvent selected from the following second organic solvents, and at least one kind of organic solvent selected from the following third organic solvents,
condition 5: the mixture contains at least one kind of organic solvent selected from the following first organic solvents, the following second organic solvents, and the following third organic solvents and at least one kind of organic solvent selected from the following fourth organic solvents,
condition 6: the mixture contains two or more kinds of organic solvents selected from the following fourth organic solvents,
condition 7: the mixture contains at least one kind of organic solvent selected from the following first organic solvents, the following second organic solvents, and the following third organic solvents and the following fifth organic solvent,
first organic solvents: propylene glycol monomethyl ether, cyclopentanone, and butyl acetate,
second organic solvents: propylene glycol monomethyl ether acetate, cyclohexanone, ethyl lactate, 2-hydroxymethyl isobutyrate, and cyclopentanone dimethyl acetal, third organic solvents: y-butyrolactone, dimethyl sulfoxide, ethylene carbonate, propylene carbonate, and 1-methyl-2-pyrrolidone, fourth organic solvents: isoamyl acetate, methyl isobutyl carbinol, diethylene glycol monomethyl ether, dimethyl ether, diethyl ether, diethylene glycol monoisobutyl ether, diglyme, diethylene glycol diethyl ether, triethylene glycol dimethyl ether, tetraethylene glycol dimethyl ether, triethylene glycol butyl methyl ether, diethylene glycol monobutyl ether, anisole, 1,4-dimethoxybenzene, 1,2-dimethoxybenzene, 1,3-dimethoxybenzene, 1,4-diphenoxybenzene, 4-methoxytoluene, and phenetole, fifth organic solvent: 3-methoxymethyl propionate, the resin contains a repeating unit represented by General Formula (I),

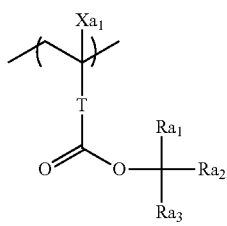

(AI)

in Formula (AI), $Xa_1$ represents a hydrogen atom or an alkyl group which may have a substituent, T represents a single bond or a divalent linking group, $Ra_1$ to $Ra_3$ each independently represent an alkyl group or a cycloalkyl group, and two out of $Ra_1$ to $Ra_3$ may form a cycloalkyl group by being bonded to each other,

(I)

in General Formula (I), $R_{41}$, $R_{42}$, and $R_{43}$ each independently represent a hydrogen atom, an alkyl group, a halogen atom, a cyano group, or an alkoxycarbonyl group, but in a case where $R_{42}$ and $Ar_4$ may form a ring by being bonded to each other, $R_{42}$ represents a single bond or an alkylene group, $X_4$ represents a single bond, —COO—, or —$CONR_{64}$—, $R_{64}$ represents a hydrogen atom or an alkyl group, $L_4$ represents a single bond or an alkylene group, $Ar_4$ represents a benzene ring group, and n represents an integer of 1 to 5.

* * * * *